US006908516B2

(12) United States Patent
Hehmann et al.

(10) Patent No.: US 6,908,516 B2
(45) Date of Patent: *Jun. 21, 2005

(54) SELECTED PROCESSING FOR NON-EQUILIBRIUM LIGHT ALLOYS AND PRODUCTS

(75) Inventors: Franz Hehmann, Iburger Strasse 151, D-49082 Osnabrueck (DE); Michael Weidemann, Isernhagen (DE)

(73) Assignee: Franz Hehmann, Osnabrueck (DE)

( * ) Notice: Subject to any disclaimer, the term of this patent is extended or adjusted under 35 U.S.C. 154(b) by 135 days.

This patent is subject to a terminal disclaimer.

(21) Appl. No.: 10/265,467

(22) Filed: Oct. 7, 2002

(65) Prior Publication Data

US 2003/0183306 A1 Oct. 2, 2003

Related U.S. Application Data

(62) Division of application No. 08/776,382, filed as application No. PCT/EP95/02882 on Jul. 19, 1995, now Pat. No. 6,544,357.

(30) Foreign Application Priority Data

Aug. 1, 1994 (EP) .......................................... 94111991

(51) Int. Cl.$^7$ ............................................. C22C 23/00
(52) U.S. Cl. ........................ 148/406; 148/420; 420/402
(58) Field of Search ................................ 148/406, 420; 420/402–417

(56) References Cited

U.S. PATENT DOCUMENTS

| 4,395,440 A | 7/1983 | Abe et al. |
| 4,613,386 A | 9/1986 | Yates et al. |

(Continued)

FOREIGN PATENT DOCUMENTS

| EP | 0 414 620 A | 2/1991 |
| GB | 2 174 509 A | 11/1986 |

(Continued)

OTHER PUBLICATIONS

Dodd et al., "Atom by Atom Vapour Condensation Applied to the Development of Novel Magnesium Titanium Alloys for Enhanced Corrosion Resistance", Proc. Int. Conf., Euromat V, Federation of European Materials Societies (fems), Padua, Sep. 25 to 29, 1995, vol. D, E, pp. 141–146.

(Continued)

Primary Examiner—George Wyszomierski
(74) Attorney, Agent, or Firm—Foley & Lardner LLP

(57) ABSTRACT

A new class of light or reactive elements and monophase α'-matrix magnesium- and aluminum-based alloys with superior engineering properties, for the latter being based on a homogeneous solute distribution or a corrosion-resistant and metallic shiny surface withstanding aqueous and saline environments and resulting from the control during synthesis of atomic structure over microstructure to net shape of the final product, said α'-matrix being retained upon conversion into a cast or wrought form. The manufacture of the materials relies on the control of deposition temperature and in-vacuum consolidation during vapor deposition, on maximized heat transfer or casting pressure during all-liquid processing and on controlled friction and shock power during solid state alloying using a mechanical milling technique. The alloy synthesis is followed by extrusion, rolling, forging, drawing and superplastic forming for which the conditions of mechanical working, thermal exposure and time to transfer corresponding metastable α'-matrix phases and microstructure into product form depend on thermal stability and transformation behavior at higher temperatures of said light alloy as well as on the defects inherent to a specific alloy synthesis employed. Alloying additions to the resulting α'-monophase matrix include 0.1 to 40 wt. % metalloids or light rare earth or early transition or simple or heavy rare earth metals or a combination thereof. The eventually more complex light alloys are designed to retain the low density and to improve damage tolerance of corresponding base metals and may include an artificial aging upon thermomechanical processing with or without solid solution heat and quench and annealing treatment for a controlled volume fraction and size of solid state precipitates to reinforce alloy film, layer or bulk and resulting surface qualities. Novel processes are employed to spur production and productivity for the new materials.

13 Claims, 144 Drawing Sheets

U.S. PATENT DOCUMENTS

| | | | | |
|---|---|---|---|---|
| 4,997,622 | A | * 3/1991 | Regazzoni et al. | 420/407 |
| 5,073,207 | A | * 12/1991 | Faure et al. | 148/667 |
| 5,087,304 | A | 2/1992 | Changes et al. | |
| 5,221,376 | A | 6/1993 | Masumoto et al. | |
| 5,304,260 | A | 4/1994 | Aikawa et al. | |
| 6,139,651 | A | * 10/2000 | Bronfin et al. | 148/420 |
| 6,248,399 | B1 | 6/2001 | Hehmann | |
| 6,544,357 | B1 | * 4/2003 | Hehmann et al. | 148/420 |

FOREIGN PATENT DOCUMENTS

| | | |
|---|---|---|
| GB | 2 262 539 A | 6/1993 |
| JP | 03287731 | 12/1991 |
| JP | 5070880 | 3/1993 |
| JP | 5078775 | 3/1993 |
| WO | WO 93/12262 A1 | 6/1993 |

OTHER PUBLICATIONS

Miller et al., Assessing the Corrosion Resistance of Non-Equilibrium Magnesium–Yttrium Alloys, *Corr. Sci.*, 51, (12), 1995, pp. 922–931.

Hirota et al., "The Corrosion Behavior of Sputter–Deposited Magnesium–Valve Metal Alloys", *Sci.*, Rep. Ritu, A–vol. 38, No. 1, Mar. 1993, pp. 53–62.

Shaw et al., "Inhibiting Corrosion in Gr/Al and Gr/Mg Metal Matrix Composites Using Non–Equilibrium Alloying Techniques" Penn State, Apr. 1991–Mar. 1992, pp. 1–90.

Froes et al., "Rapid Solidification of Al, Mg, and Ti", *Journal of Metals*, Aug. 1987, pp. 14–20.

Shaw et al., "Inhibiting Corrosion in Gr/Al and Gr/Mg Metal Matrix Composites Using Non Equilibrium Alloying Techniques", *Annual Report AD–A 253 923 Office of Naval Research*, Arlington, VA/USA, Jun. 1992, pp. 23–32.

Krishnamurthy et al., "Magnesium–Neodymium Alloys Produced by Rapid Solidification" *Processing of Structural Metals by Rapid Solidification: ASM Symposium*, Orlando/USA, Oct. 1986, pp. 399–408.

Subramanian et al., "Laser Cladding of Zirconium on Magnesium for Improved Corrosion Properties", *Journal of Materials Science*, London/GB, 1991, vol. 26, pp. 951–956.

Hagena et al., "Magnesium Cluster–Beam Deposition on Glass and Si(111)", *Journal of Vacuum Science and Technology: Part A*, New York/USA, Mar. 1994, vol. 12, No. 2, pp. 282–298.

Database WPI May 20, 1987, Derwent Publications Ltd., London/GB, AN 87–13405B "Evaporator for Printed Circuit Boards Manufacture . . . " & SU, A, 440 428 (KIEV POLY), Sep. 15, 2986.

Lee et al., Preparation of Al–Mg Thin Films with Forced Solid Solution by Ion–Plating, *Int. Conf. Process Mates. Prop*, $1^{st}$ 1993, pp. 1141–1144.

Abrukina, Kinetics of Aging and Structural Transformations in Decomposition of Supersaturated Mg–Sm–Y Solid Solutions Magnievge Slavy Sovren Tekh, [Mater. Vses. Soveshch Issled., Razrab. Primen. Magrievykh Slavov Nas. Khuz.], $2^{nd}$ 1992, pp. 82–86.

Arnell et al., "The Deposition of Highly Supersaturated Metastable Aluminum–Magnesium Alloys by Unbalanced Magnetron Sputtering from . . . ", 1992, 43 (1–3), pp. 105–109.

Drits et al., Relation Between Mechanical Properties and Composition of Binary Magnesium Alloy, *Deposited Doc.*, 1974, VINITI pp. 103–174, 21 pp.

Drits et al., Effect of Alloying on the Damping Capacity of Magnesium and Its Alloys, Struct., Svoistva Legl. Splavov, 1971, pp. 35–39.

Bray et al., Vapor Deposited Magnesium—Manganese and Magnesium—Chromium Alloys, *Magnesium Alloys Theis App.*, Prop. DGM Conf. 3, 1992, pp. 159–166.

Miller et al., "Improving Corrosion Resistance of Magnesium by Non Equilibrium Alloying with Yttsium", *Corrosion*, (Houston(1993), vol. 49, No. 12, pp. 947950.

Klyamkin et al., "Hydriding of Magnesium in Presence of Rare Earth Metal Hydrides", *Izv. Akad. Nauk, SSSR, Met*, 1989, vol. 2, pp. 122–127.

Anderson et al., "Microstructural Evaluation of RSR Processed Magnesium Alloys", *ProC. Int. Conf. PM Aerosp. Mater.* 1988, Meeting Date 1987, 36–1–36–14, An 110 43002.

Hehmann et al., "Extension of Solid Solubility of Yttrium and Rare Earth Metals in Magnesium by Rapid Solidification ", *Process Struct. Met. Rapid Solidif.*, Proc. Seven Sess. Symp. Enhanced Prop. Struct. Met. Rapid Solidif. (1987), Meeting, 1956, pp. 323–328.

Drits et al., "Mechanical Properties of Binary Magnesium–Samarium Alloys", *Metallored, Term, Obrab, Met.*, 1985, vol. 7, p. 278.

Ogawa et al., "Hydrogen Absorption and Electronic Structure of Magnesium–based Yttrium and Scandium Dilute Alloys", *J. Less–Common Met.* (1982). vol. 88, No. 2, pp. 283–288.

Rokhlin, "Study of the Decomposition of a Supersaturated Solid Solution In Magnesium–Samarium Alloys", *Ftz. Met, Metallored*, 1982, vol. 54 No. 2, pp. 315–319.

Drits et al., "Solidification of Magnesium–Yttrium–Zinc–Cadmium Alloys", *Izv. Akad. Nauk, SSSR, Met*, 1981, vol. 5, pp. 224–227.

* cited by examiner

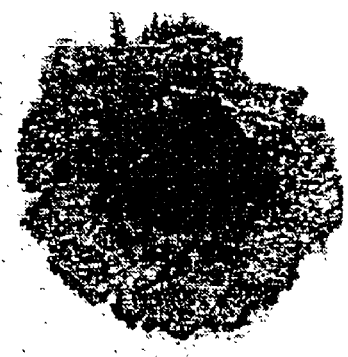
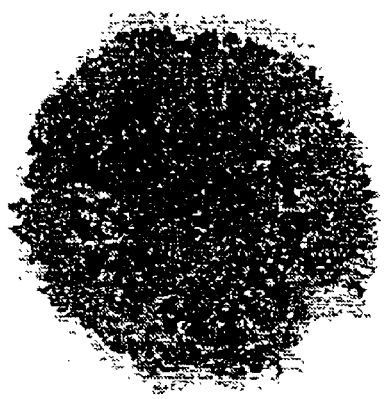
FIG. 2

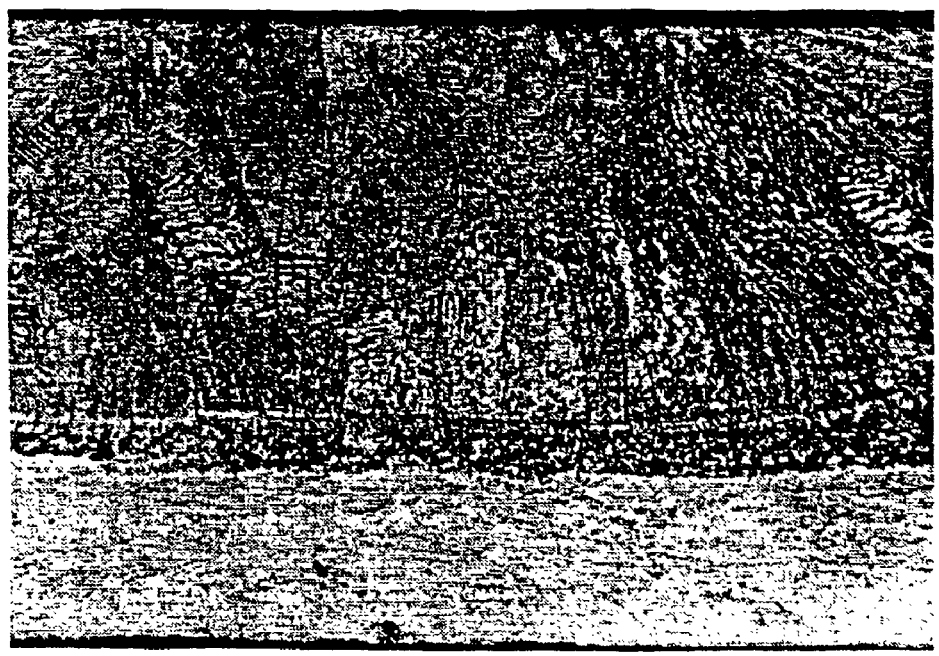
a)
b)
FIG. 8

a)
b)
FIG. 13 a)
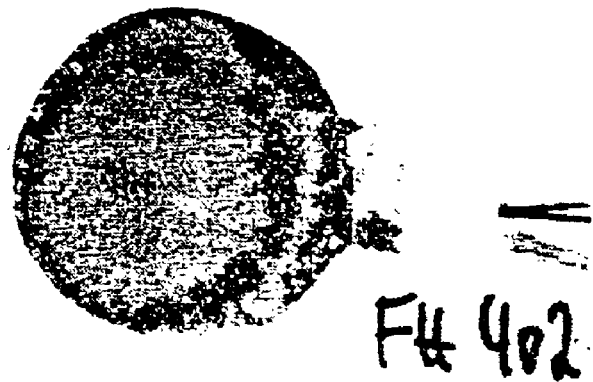
b)
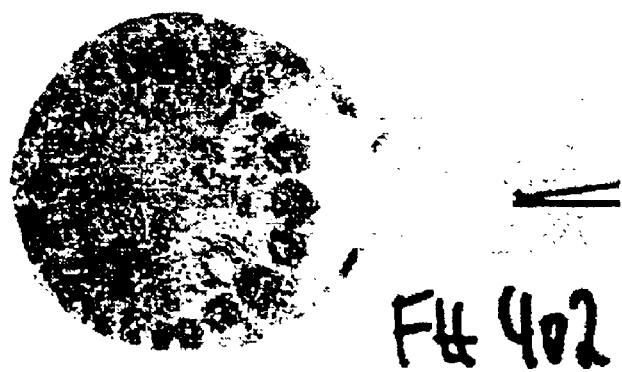
FIG. 16

FIG. 19

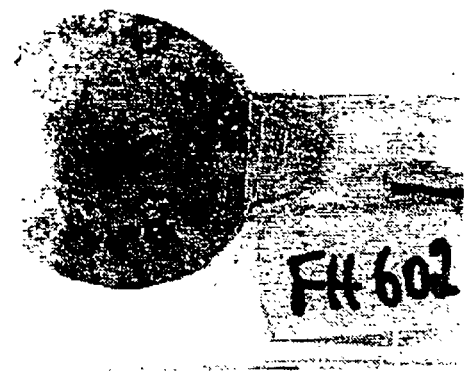
a)
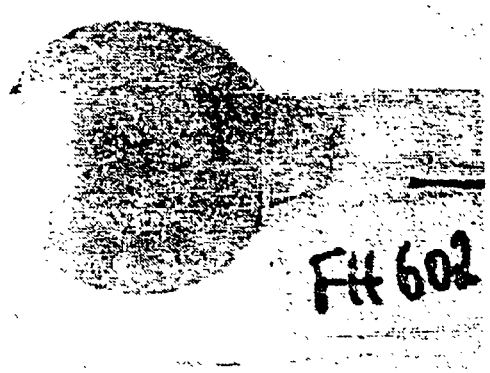
b)
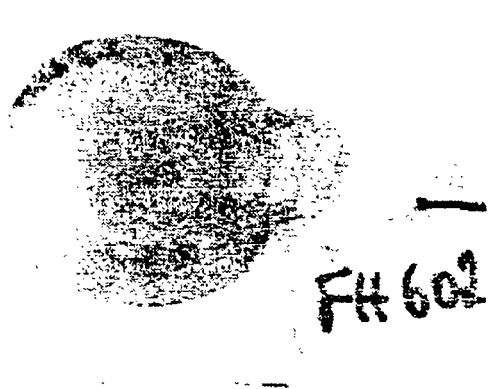
c)
d)
FIG. 24

FIG. 25

FIG. 28

FIG. 32

FIG. 34

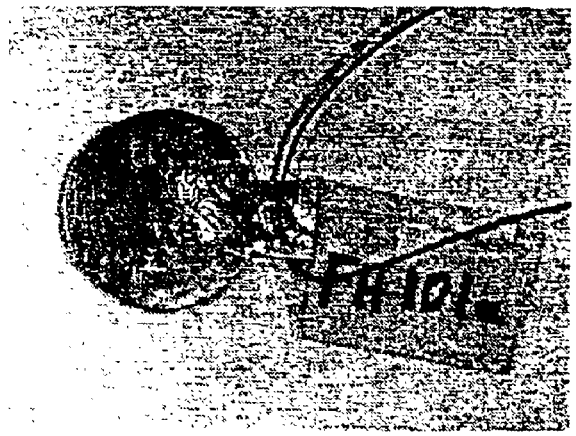
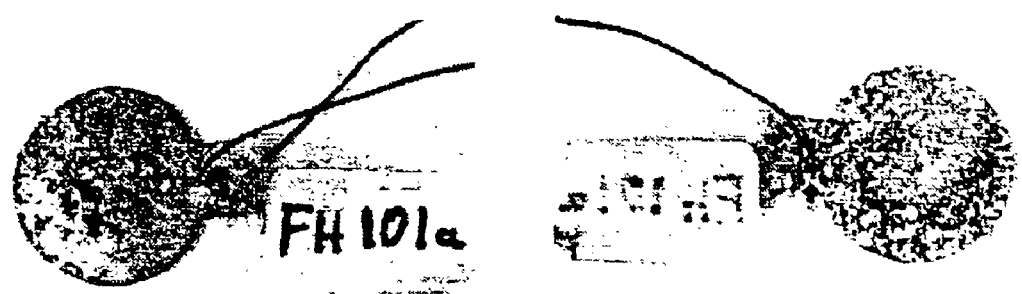
FIG. 43

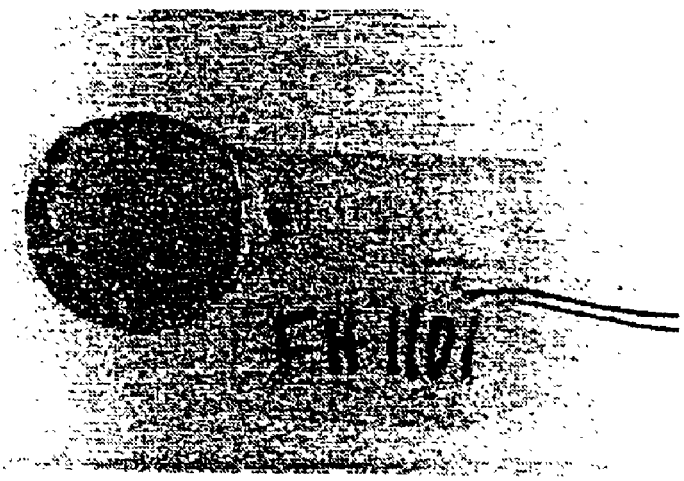
FIG. 45

| AZ 91 | VD Mg – 4 Ti | VD Mg – 7 Ce |
|---|---|---|
| 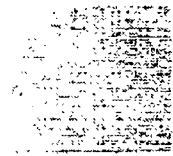 |  |  |
Prior to immersion
| AZ 91 | VD Mg – 4 Ti | VD Mg – 7 Ce |
|---|---|---|
|  |  |  |
After immersion for 0.5 h
FIG. 47

FIG. 48

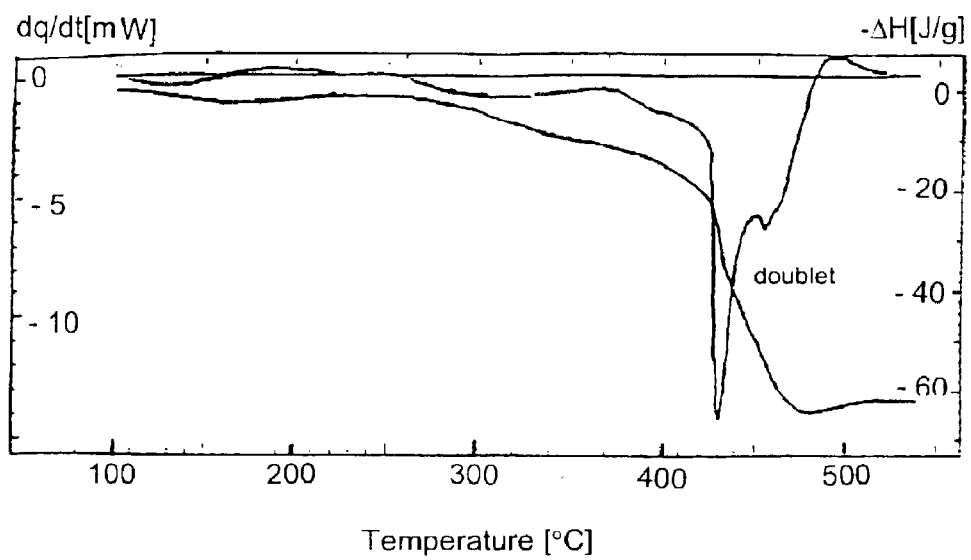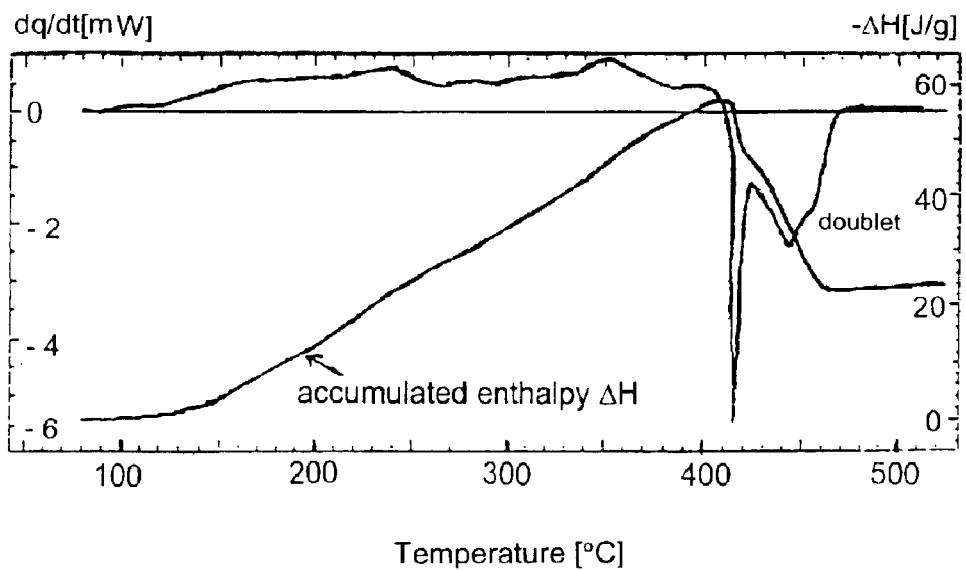
FIG. 57

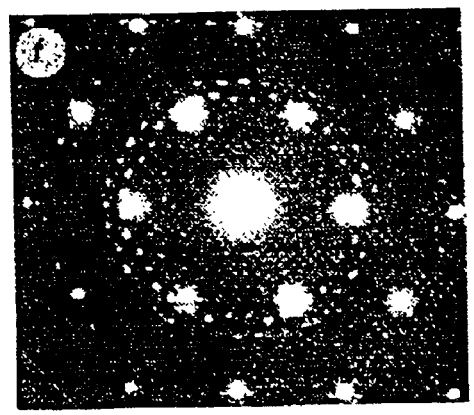
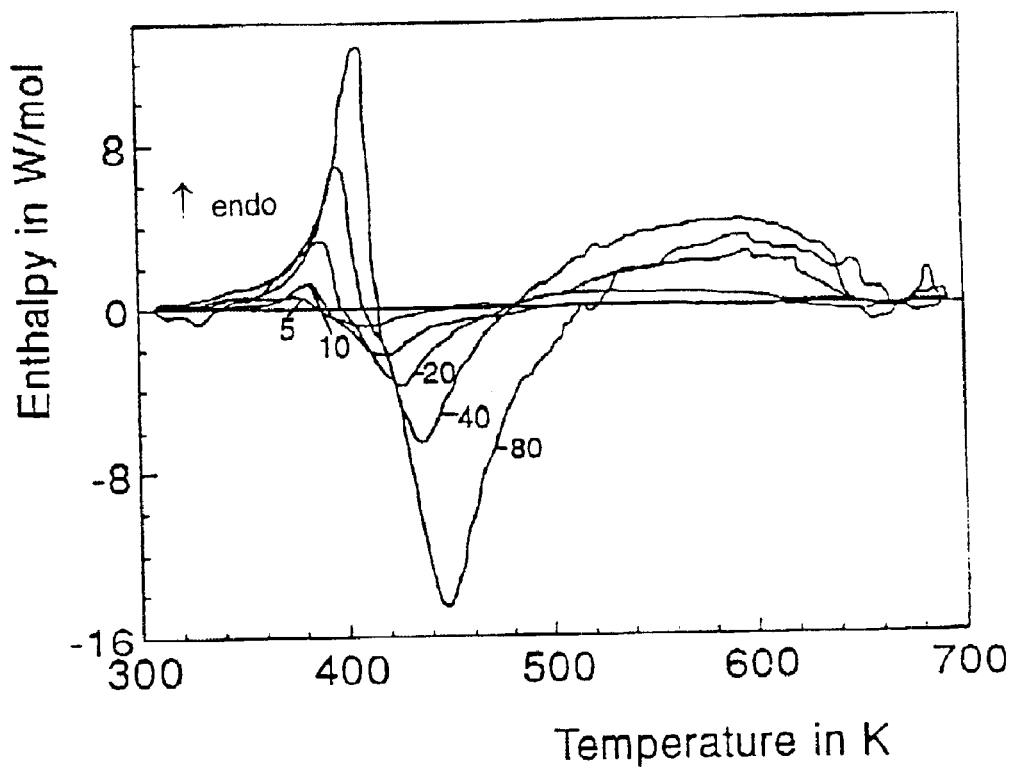
FIG. 63

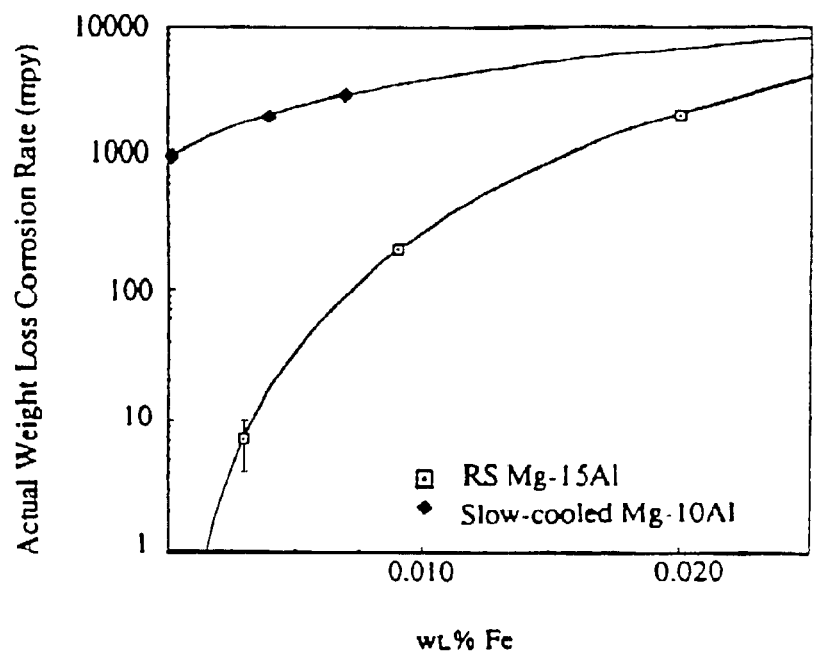
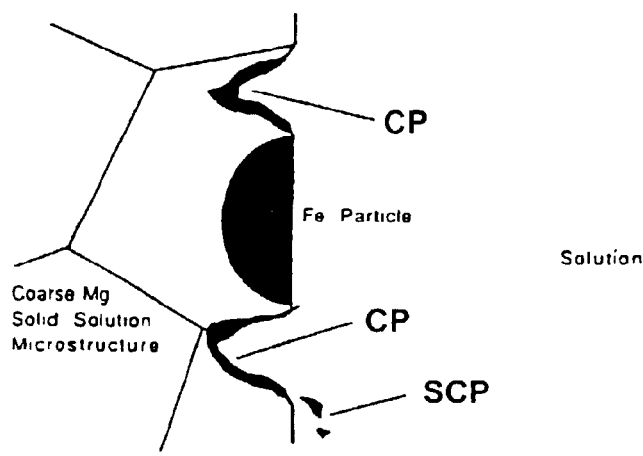
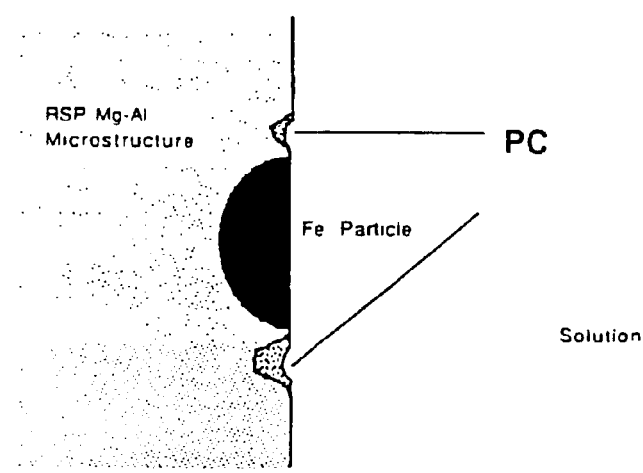
FIG. 68

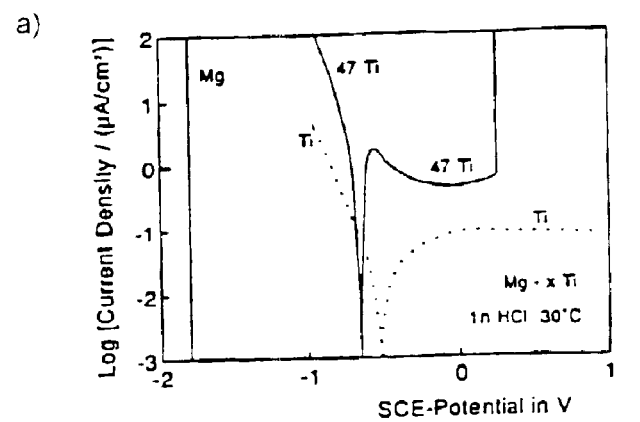
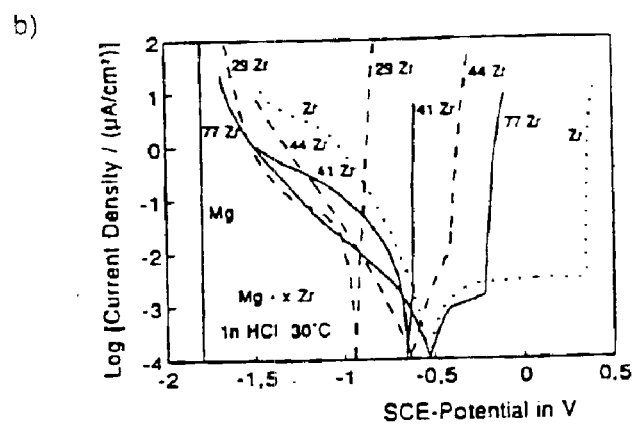
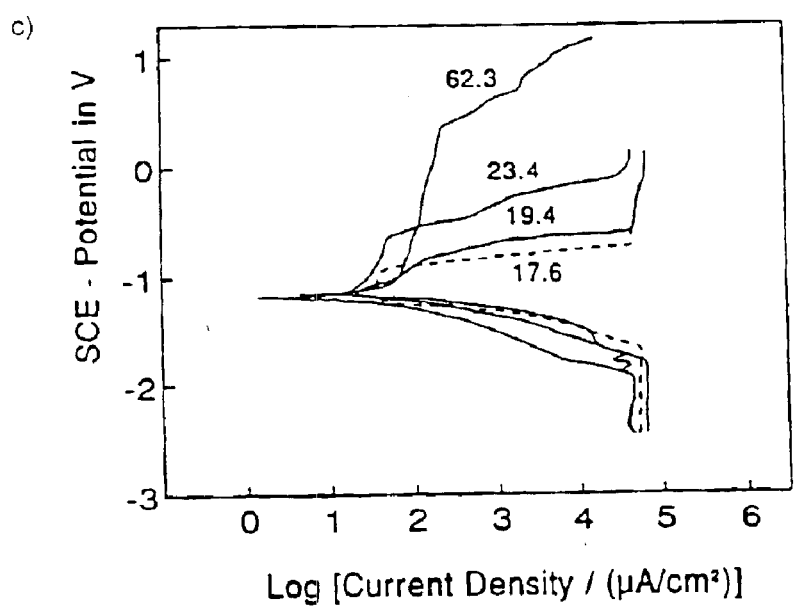
FIG. 74

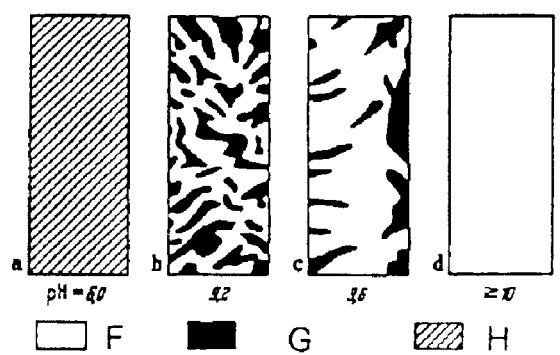
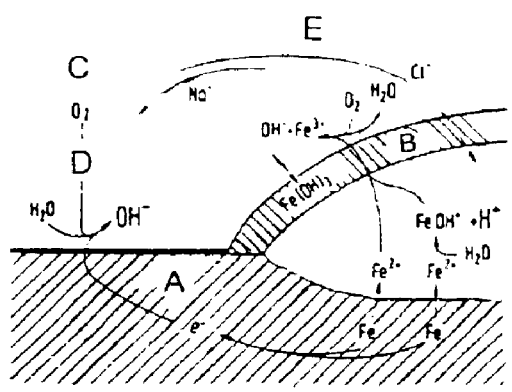
FIG. 79

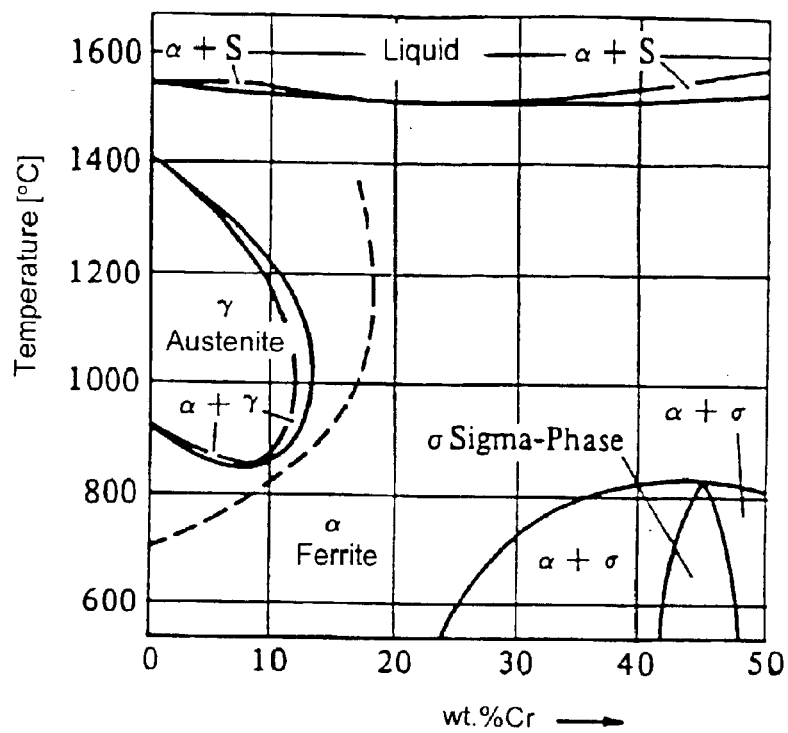
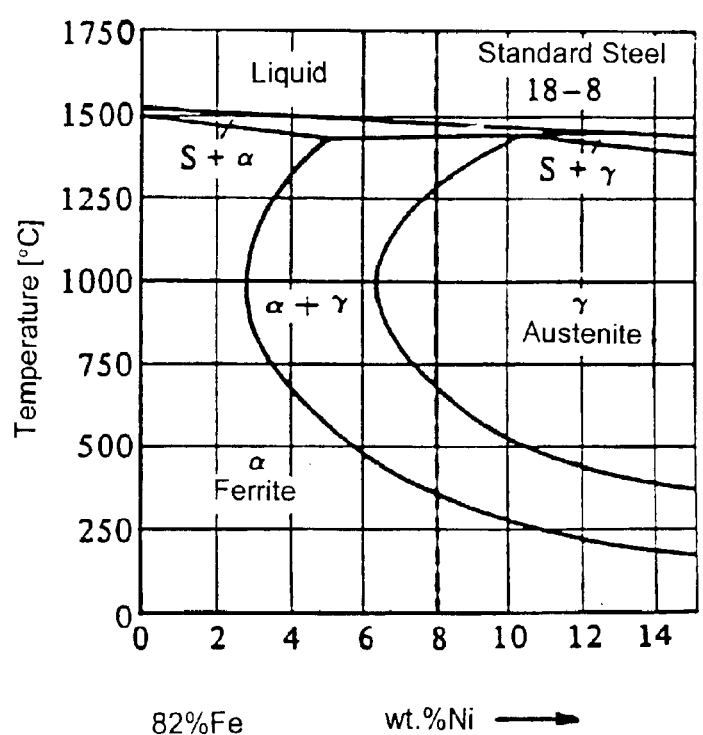
FIG. 82 a) n-conductance in MgO-based surface film:
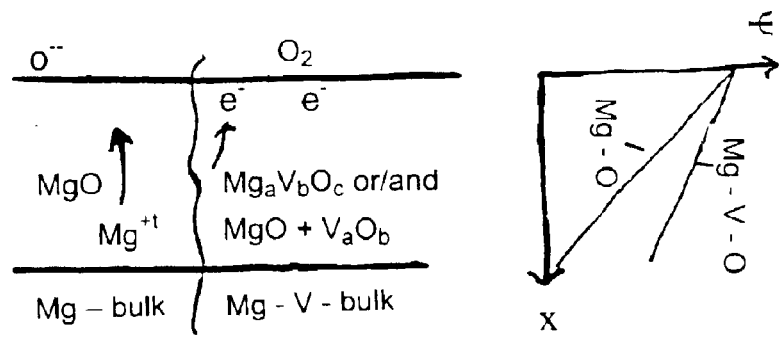
b) resulting field gradient $\Delta\Psi/\Delta x$ for different Pilling-Bedworth ratios:
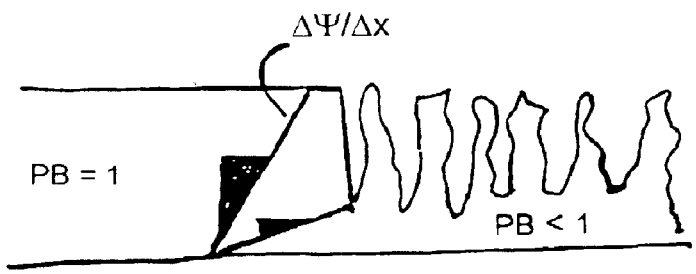
FIG. 84

Control elements for turbulent and laminar flow

Series resistor to vapour flow

Combinations of Principle Solutions $m_1 = m_2$

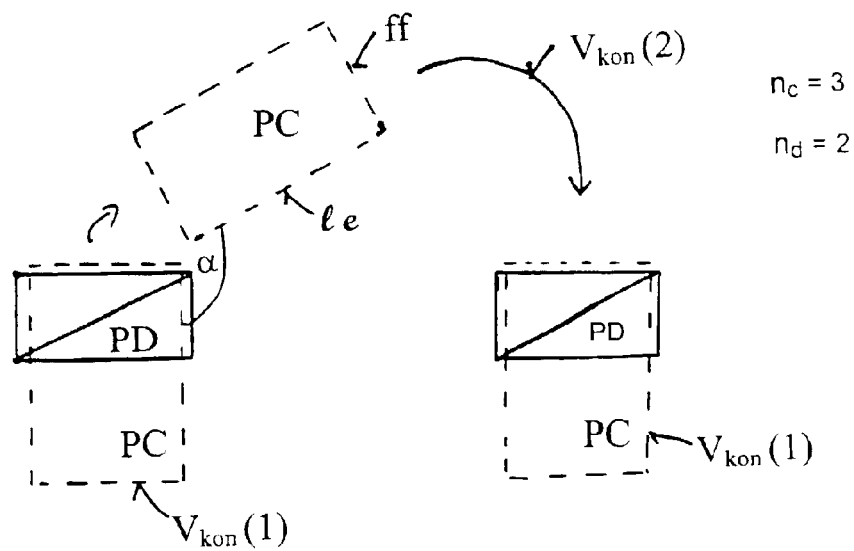
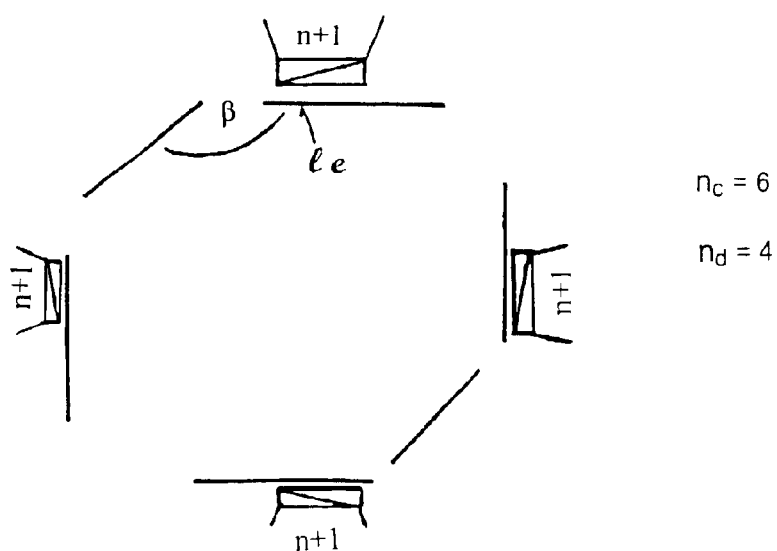
FIG. 98

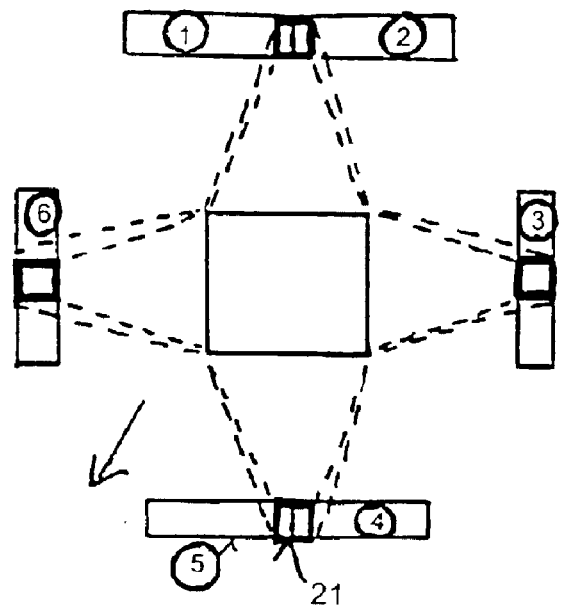
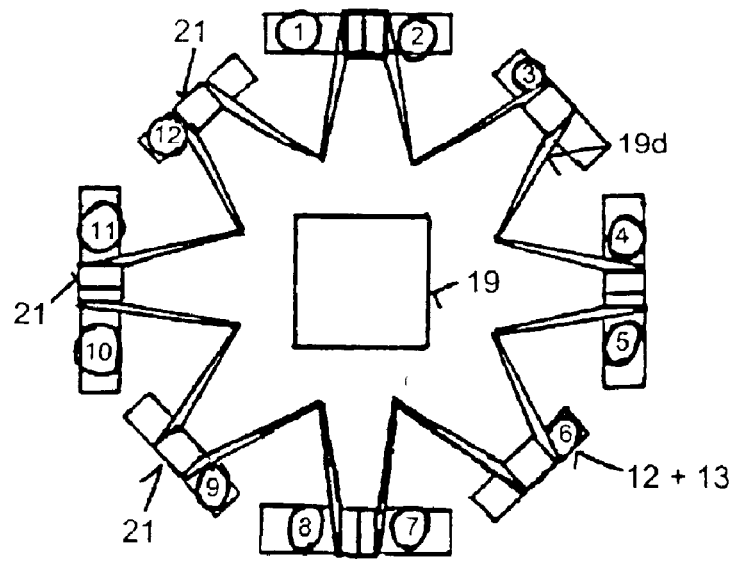
FIG. 100

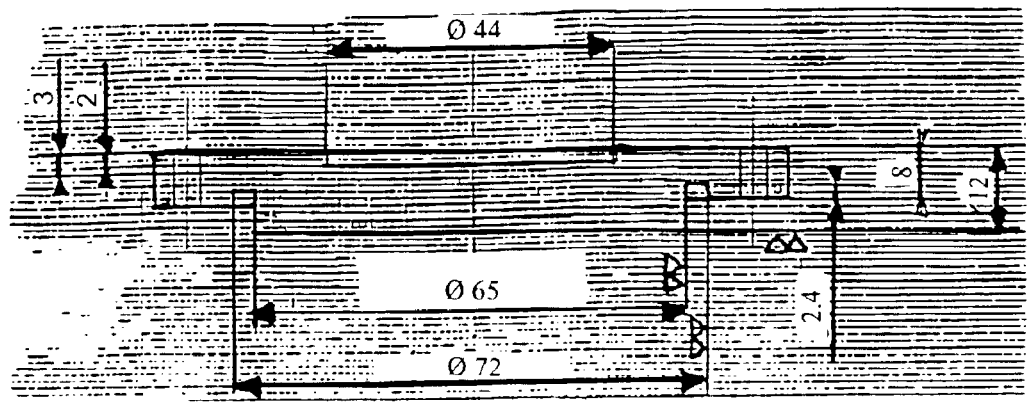
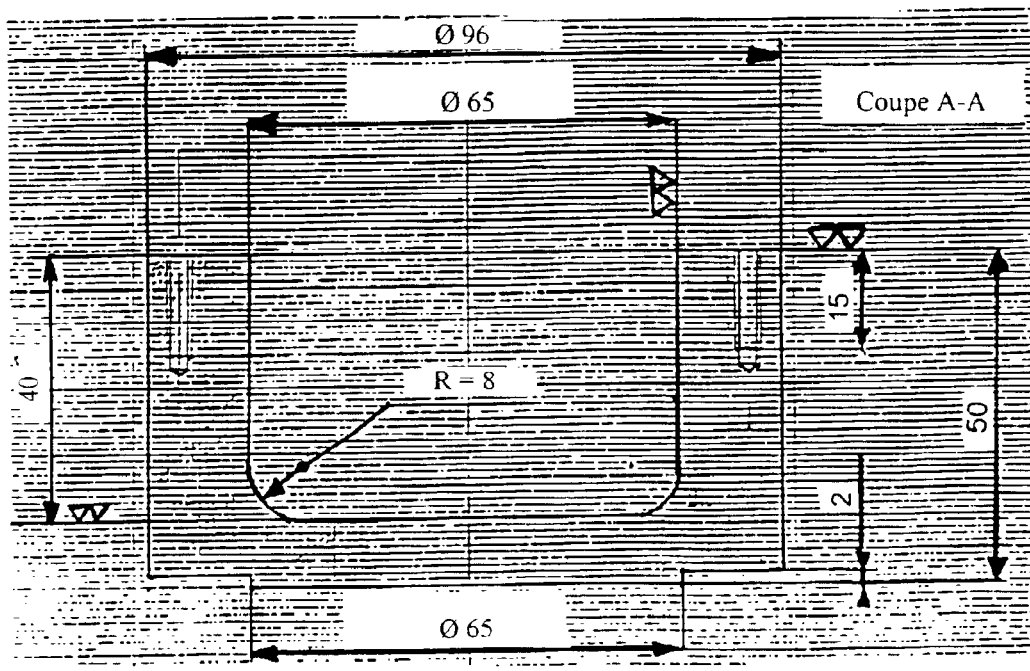
FIG. 107

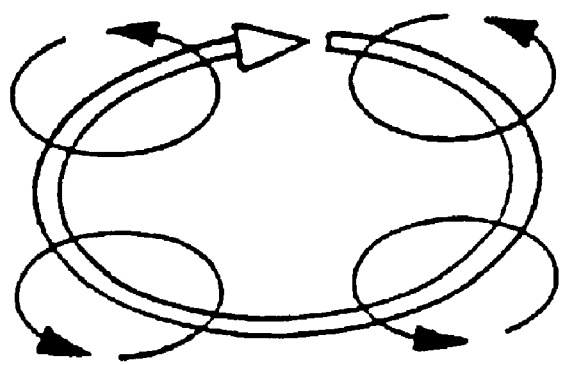
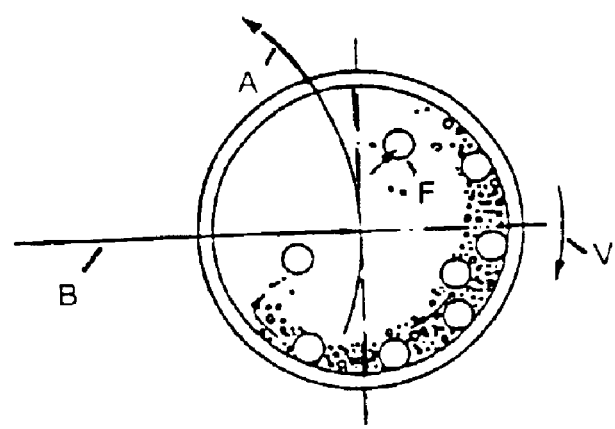
FIG. 109

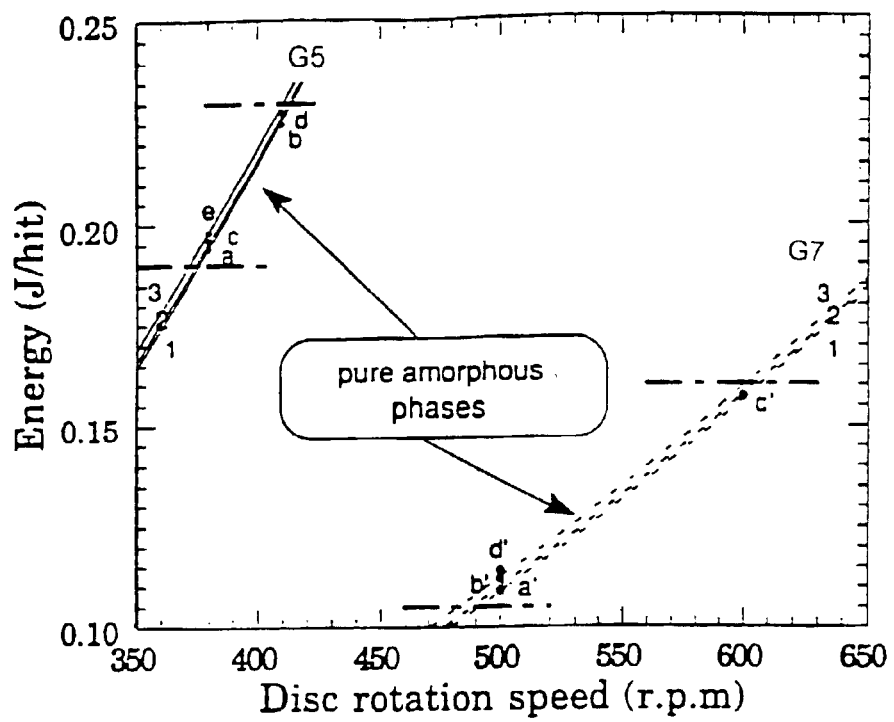
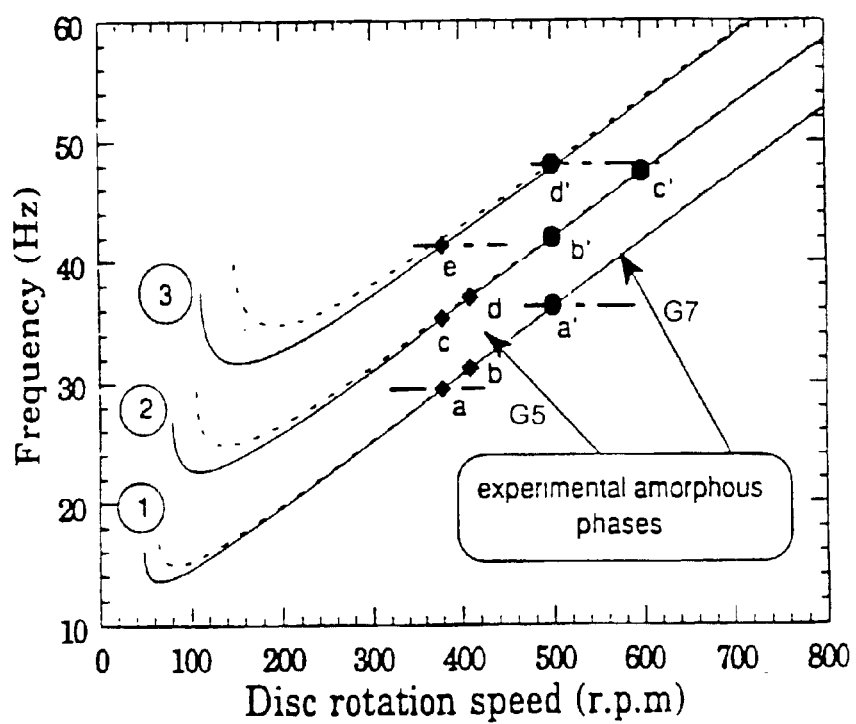
FIG. 123

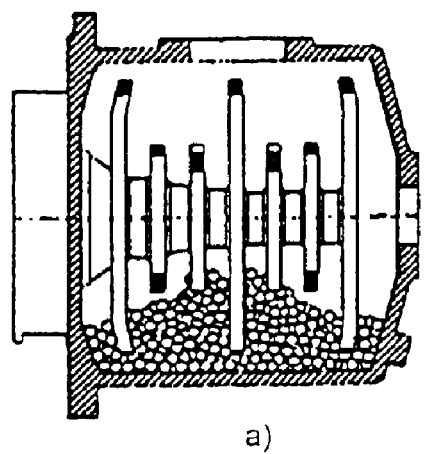
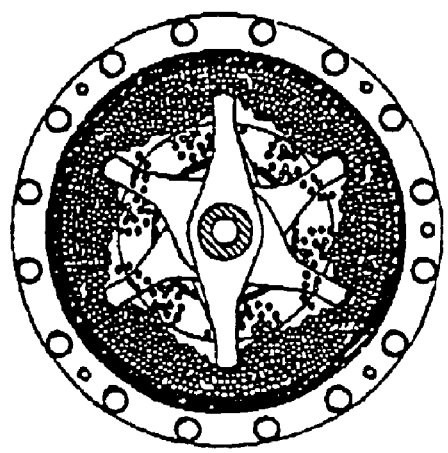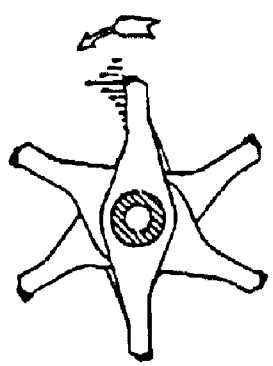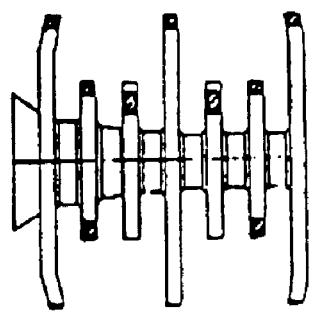
FIG. 125

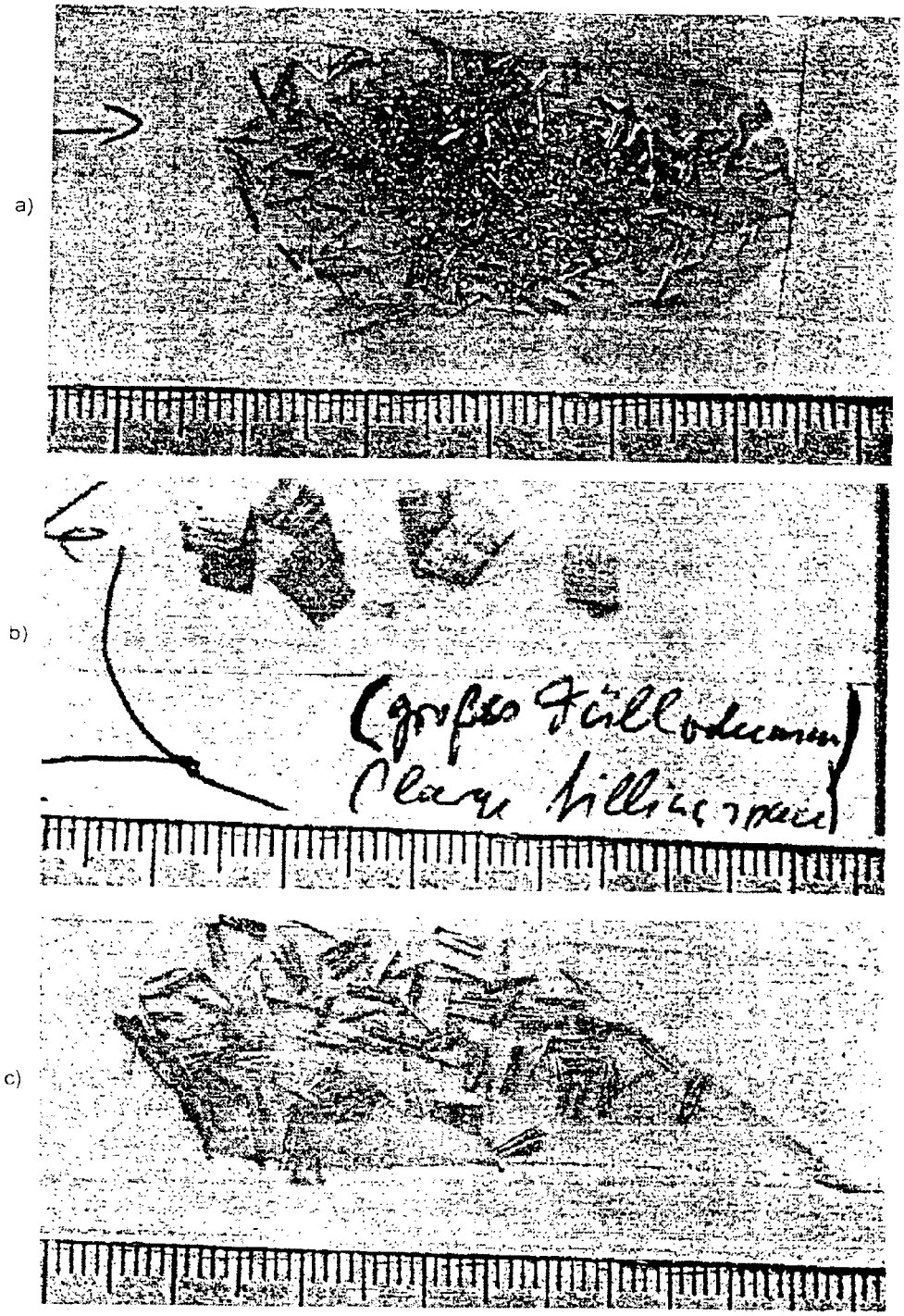
FIG. 130 a) - c)

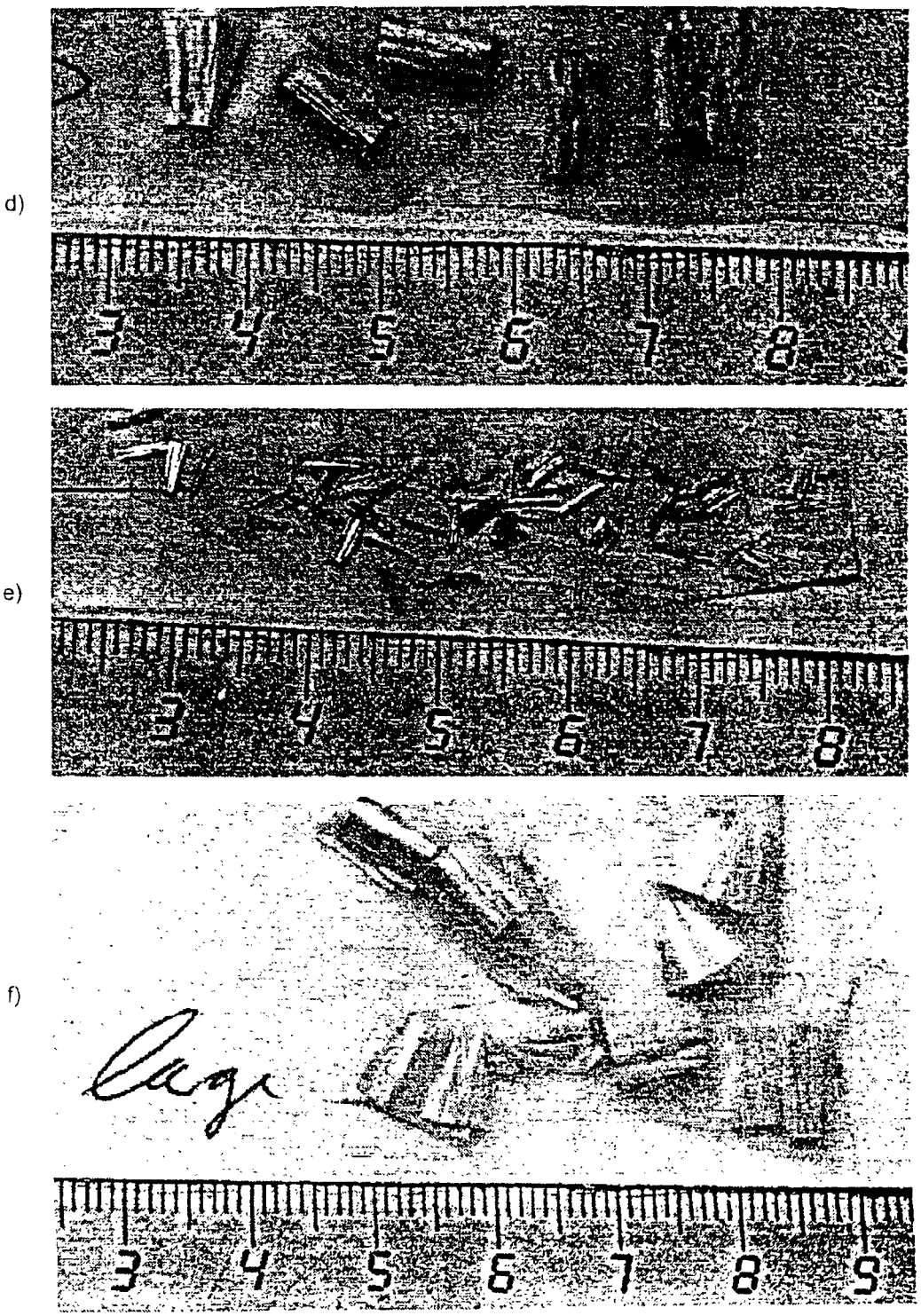
FIG. 130 continued d) – f)

Table 2  Properties of starting materials used in study of alloying kinetics.

| Alloy Property | 0 A | 0 B | 1 A | 1 B | 2 A | 2 B | 3 A | 3 B | 4 A | 4 B |
|---|---|---|---|---|---|---|---|---|---|---|
| Tensile strength (MPa) | 275 | 580 | 306 | 550 | 336 | 519 | 367 | 489 | 397 | 458 |
| Fracture strain | 0.37 | 0.48 | 0.38 | 0.47 | 0.39 | 0.46 | 0.40 | 0.45 | 0.41 | 0.44 |
| $K_{Ic}$ (MN/m$^{3/2}$) | 85 | 95 | 86 | 94 | 87 | 93 | 88 | 92 | 89 | 91 |
| $H_{vo}$ (KG$_f$/mm$^2$) | 54 | 153 | 64 | 143 | 74 | 133 | 84 | 123 | 94 | 113 |
| $K$ (MPa) | 275 | 140 | 262 | 154 | 248 | 167 | 235 | 181 | 221 | 194 |
| $n$ | 0.42 | 0.50 | 0.43 | 0.49 | 0.43 | 0.48 | 0.45 | 0.47 | 0.45 | 0.46 |

Notes: Simulation done for CR=10. Material "A" had modulus of 170 GPa; Material B had modulus of 200 GPa. $K$ and $n$ are constitutive equation parameters.

SELECTED PROCESSING FOR NON-EQUILIBRIUM LIGHT ALLOYS AND PRODUCTS

CROSS-REFERENCES TO RELATED APPLICATIONS

This application is application Ser. No. 08/776,382 filed on Jan. 31, 1997 now U.S. Pat. 6,544,357 (with preliminary amendments filed on Jan. 31, 1997), the disclosure of which is incorporated by reference herein in its entirety without as-filed claims. Reference is made to and priority is claimed in respect of EP Application 94111991.9 of Aug. 1, 1994.

BACKGROUND OF THE INVENTION

1. Field of the Invention

This invention relates to new magnesium and aluminum alloy articles consisting of a non-equilibrium matrix phase of essentially early, i.e. light rare earth and/or transition metals and/or metalloids made by non-equilibrium methods such as rapid solidification from the melt and from the vapor phase and by solid state synthesis with an essentially homogeneous distribution of the major part of the alloying elements on an atomic length scale of the eventually purified alloy matrix. More particularly, it relates to economically viable wrought magnesium and aluminum alloy articles made by selected processing routes and useful as extruded, forged or rolled products for space, ballistic, airframe and other aeronautical as well as for terrestrial applications such as in trains and automobiles, the products thereby achieved by novel methods to control the alloy synthesis, alloy conversion and alloy joining.

2. Description of the Related Art

Corrosion resistant commercial magnesium alloy such as the new high purity version of the Mg—Al base AZ91 alloy, i.e. AZ91E (8.3–9.7 Al, 0.35–1.0 Zn, <0.15 Mn, <0.1 Si, balance Mg) or the new Mg—Y base WE43-alloy (3.7–4.3 Y, 2.4–4.4 Nd and heavy rare earth misch-metal, 0.4–1.0 Zr, <0.2 Zn, balance Mg) are comparable with the corrosion rates of pure magnesium, of aluminum alloys A357 and A206 (all with corrosion rates of the order of 0.25–0.51 mm/year (10–20 mils per year [mpy]) in a salt fog test after ASTM B117) and they are about two orders of magnitude better then previous magnesium alloy families (cf. J. F. King, New advanced magnesium alloys, *Advanced materials technology int.*, 1990, pp. 12–19). Another new magnesium alloy showing about 0.25 mm/year (10 mpy) in standardized test conditions is the rapidly solidified magnesium alloy EA55RS (5.1 Al, 4.9 Zn, 5.0 Nd, balance Mg) which has been made available quite recently as a wrought alloy product in extruded, rolled and forged form and which allows due to the fine grain structure for superplasticity and an alloy forming operation at about 150° C. lower temperatures than conventionally cast magnesium alloys so retaining the refined microstructure and the resultant improvement of engineering properties in the final product (S. K. Das, C. F. Chang and D. Raybould, *PM in Aerospace and Defense Technologies*, edt. F. H. Froes, MPIF, Princeton, N.J. 08540, 1989, pp. 63–66). On the aluminum side, many new alloy compositions with superior properties have been developed, but the methods to synthesize them from the vapor and solid state are not mature and controllable as is required by (pilot) production scale.

Aerospace applications require metallic materials with self-healing surface films to protect the interior, i.e. the bulk material when exposed to air (including rain independent on environmental particulars). None of the existing magnesium engineering alloys exhibit a surface passivation upon exposure to normal atmospheres containing saline species as it is known for titanium and aluminum alloys. For iron it is the allotropy which allows for passivation by equilibrium alloying austenitic and ferritic iron with chromium, for example. The absence of allotropy for aluminum, for example, results in deterioration of corrosion behavior of aluminum upon equilibrium alloying and this applies more seriously to magnesium alloys. Magnesium alloys yet represent the worst case among structural metals for aeronautical applications, since magnesium has not only no allotropy as titanium and iron, but Magnesium does also not develop a passive surface film on exposure to normal atmospheres as is evident for pure titanium and pure aluminum. None of the existing conventional magnesium alloys have yet shown pronounced passivation behavior by alloying as—by definition—becomes evident upon a significant decrease in corrosion rates compared to the pure metal. Hehmann et al. have shown (F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1), however, that significant passivation is possible by alloying the αMg solid solution with at least 17 wt. % Al in the supersaturated state. This type of passivation, however, was not obtainable unless very extreme conditions of rapid solidification from the melt were applied and it was therefore restricted to thin cross-sections and not obtainable by conventional ingot metallurgy. An engineering solution to this problem would provide the driving force to resolve many of the obstacles for the introduction of advanced light alloys, but the solution to this problem has not been recognized as a combined problem of the development of non-equilibrium new and/or established light alloys as well as of corresponding processes.

As long as 75 years ago, Tammann (G. Tammann, *Die chemischen und galvanischen Eigenschaften von Mischkristallen und ihre Atomverteilung*, Leipzig, 1919) and later Gerischer et al., (cf. R. P. Tischer and H. Gerischer, *Z. Electrochem.* 62, 1958, p. 50.) reported increasing pitting potentials and decreasing anodic current densities of the equilibrium Cu—Au and Ag—Au solid solutions with increasing levels of gold representing the more noble and passivating constituent. The majority of the equilibrium phase diagrams of binary Mg-alloys shows, however, a very restricted solubility range in the cph-Mg solid solution due to the formation of strong compounds suppressing equilibrium solubility in cph-Mg (L. A. Carapella, Fundamental Alloying Nature of Magnesium, *Met. Progress* 48, August 1947, pp. 297–307). Only the so-called "yttrics" exhibit relatively large equilibrium solid solubilities in cph-Mg. This group consists of yttrium and the heavy rare earth metals Gd, Tb, Dy, etc. as well as scandium which, due to their physical commonalties, are found in nature as a mixture, the so-called (heavy) rare earth (HRE) mischmetals and which have led to the most heat resistant Mg-based alloys on record. Heavy rare earth metals and scandium are relatively expensive alloying additions to magnesium. Sm and Gd represent the most economically viable individual heavy rare earth alloying additions with relatively large equilibrium solid solubility in cph-Mg. If Sm and Gd are employed via a cheaper misch-metal, they may co-exist with a considerable amount of yttrium.

Yttirium, however, was reported (F. Hehmann, R. G. J. Edyvean, H. Jones and F. Sommer, *Effect of Rapid Solidification Processing on Corrodability of Magnesium Alloys*, Conf. Proc. PM Aerospace Materials '87, eds. B. Williams and G. Dowson, Met. Powder Report Publishing Services, Shrewsbury, England, p. 46/1; F. Hehmann, Rasch Erstarrte Magnesium-Mischkristalle und Ihr Umwandlungs-und Korrosionsverhalten, *Doctoral Thesis, University of Stuttgart*, published in Fortschrittsberichte VDI', Reihe 5, No 155: Grund-und Werkstoffe', VDI-Verlag, Düsseldorf, F. R. G., January 1989) not to result in the required improvement of corrosion behavior when dissolved in cph-Mg compared to pure magnesium. Mg-HRE alloys require also relatively laborious solution and aging treatments when made by conventional casting methods (cf. M. E. Drits, L. L. Rohklin and N. P. Abrukina, *Metallovedenie i Termicheskaya Obrabotka Metallov* 17, 1985, 27–28; S. Kamado, Y. Kojima, Y. Negishi and S. Iwasawa, R. Ninomiya, *Light Metals Processing and Applications*, Quebec City, Quebec Canada, 29 Aug.–1 Sep. 1993, Canadian Institute of Mining, Metallurgy and Petroleum, Montreal, Quebec H3Z 3B8, Canada, 1993, pp. 849–858).

In 1987, Hehmann and co-workers found (F. Hehmann, R. G. J. Edyvean, H. Jones and F. Sommer, *Effect of Rapid Solidification Processing on Corrodability of Magnesium Alloys*, Conf. Proc. PM Aerospace Materials '87, eds. B. Williams and G. Dowson, Met. Powder Report Publishing Services, Shrewsbury, England, p. 46/1; F. Hehmann, Rasch Erstarrte Magnesium-Mischkristalle und Ihr Umwandlungs-und Korrosionsverhalten, *Doctoral Thesis, University of Stuttgart*, published in Fortschrittsberichte VDI', Reihe 5, No 155: Grund-und Werkstoffe', VDI-Verlag, Düsseldorf, F. R. G., January 1989) that the rapidly solidified (RS) solid solutions of La and Ce in the as-quenched supersaturated cph-Mg were very effective in order to passivate magnesium and to reduce corrosion rates compared to the pure metal. Only very small levels of La and Ce, i.e. 0.4 at. % La or Ce (2.2 wt. % La or Ce) in cph-Mg were required to arrive at uniform corrosion rates as low as 0.04 mils/yr (1 $\mu$m/year) compared to 15–20 mils/yr (350–500 $\mu$m/year) for pure magnesium by using a 1 mmol aerated NaCl aqueous solution of $P_H$=4.9 (F. Hehmann, R. G. J. Edyvean, H. Jones and F. Sommer, Effect of Rapid Solidification Processing on Corrodability of Magnesium Alloys, *Conf. Proc. PM Aerospace Materials* '87, eds. B. Williams and G. Dowson, Met. Powder Report Publishing Services, Shrewsbury, England, p. 46/1; F. Hehmann, Rasch Erstarrte Magnesium-Mischkristalle und Ihr Umwandlungs-und Korrosionsverhalten, *Doctoral Thesis, University of Stuttgart*, published in Fortschrittsberichte VDI', Reihe 5, No 155: Grund-und Werkstoffe', VDI-Verlag, Düsseldorf, F. R. G., January 1989). Similar effects were observed before during the polarization of 7075 aluminum alloy in an electrolyte that was doped with La- and Ce-salts (B. R. W. Hinton, N. E. Ryan, D. R. Arnott, P. N. Trathen, L. Wilson and B. E. Williams, *Corrosion Australasia* 10, vol. 3, 1985, pp. 12–17). By contrast, the passivation of an cph-Mg-base solid solution containing Al required an Al-level of more than 16 wt. % in the supersaturated cph-Mg-state in order to arrive at 7 mils/yr (200 $\mu$m/yr) (F. Hehmann, H. Jones, F. Sommer and R. G. J. Edyvean, Corrosion Inhibition in Magnesium-Aluminium Based Alloys Induced by Rapid Solidification Processing, *J. Mater. Sci.* 24, 1989, pp. 2369–2379) and corresponding solid solutions were thermally very unstable (F. Hehmann, Metastable Phase Transformation in Rapidly Solidified Magnesium-Base Mg—Al Alloys, *Acta Met. Mater.* 38, 1990, pp. 979–992). Light RE-metals are not only cheaper than heavy RE-metals. They also showed a better performance compared to the passivation effects obtainable by heavy RE elements in cph-Mg via conventional casting methods (cf. F. Hehmann, R. G. J. Edyvean, H. Jones and F. Sommer, Effect of Rapid Solidification Processing on Corrodability of Magnesium Alloys, *Conf. Proc. PM Aerospace Materials* '87, eds. B. Williams and G. Dowson, Met. Powder Report Publishing Services, Shrewsbury, England, p. 46/1. vs. L. A. Carapella, Fundamental Alloying Nature of Magnesium, *Met. Progress* 48, August 1947, pp. 297–307; S. Kamado, Y. Kojima, Y. Negishi and S. Iwasawa, R. Ninomiya, *Light Metals Processing and Applications*, Quebec City, Quebec Canada, 29 Aug.–1 Sep. 1993, Canadian Institute of Mining, Metallurgy and Petroleum, Montreal, Quebec H3Z 3B8, Canada, 1993, pp. 849–858). Alloying of the cph-Mg based solid solution with light RE elements seems to provide a very effective alternative to passivate magnesium metal used as a matrix material.

For passivation of magnesium, the details of the microstructure appeared to be crucial in addition to the solute selected for solid solution alloying with cph-Mg and to the concentration range of corresponding solid solution. The reduction in corrosion current by several orders of magnitude compared to corresponding ingot castings and prior-art Mg engineering alloys was considered (cf. F. Hehmann, R. G. J. Edyvean, H. Jones and F. Sommer, Effect of Rapid Solidification Processing on Corrodability of Magnesium Alloys, Conf. Proc. PM Aerospace Materials '87, eds. B. Williams and G. Dowson, Met. Powder Report Publishing Services, Shrewsbury, England, p. 46/1; F. Hehmann, 'Rasch Erstarrte Magnesium-Mischkristalle und Ihr Umwandlungs-und Korrosionsverhalten', *Doctoral Thesis, University of Stuttgart*, published in Fortschrittberichte VDI', Reihe 5, No 155: Grund-und Werkstoffe', VDI-Verlag, Düsseldorf, F. R. G., January 1989) to originate in the complete absence of second phases, i.e. when the volume fraction of equilibrium dispersoids separated from the melt upon solidification was virtually 0.0 and the RE elements virtually completely held in the cph-Mg solid solution. However, relatively early pitting corrosion was also observed despite significant reduction in the more uniform corrosion rate. A precise correlation between the various non-equilibrium microstructures of these alloys and their response to corrosive attack has yet not been forwarded. Moreover, the corrosion behavior of theses microstructures upon exposure to test conditions which are accepted by industry has also not yet been presented.

A similar behavior was observed with Al—Cr—Fe alloys made by vapor deposition. These alloys do not know any larger volume fraction of second phases as would apply to the equilibrium state of corresponding compositions (M. C. McConnell and P. G. Partridge, *Processing of Structural Metals by Rapid Solidification*, eds. F. H. Froes and S. J. Savage, American Society for Metals, Metals Park, Ohio, 1987, pp. 143–153; R. L. Bickerdike, D. Clark, G. Hughes, M. C. McConnell, W. N. Mair, P. G. Partridge and B. W. Viney, *Int. Conf. Rapidly Solidified Materials*, San Diego, ASM Metals Park, 1986, pp. 145–151; P. G. Partridge, *Processing of Structural Metals by Rapid Solidification*, eds. F. H. Froes and S. J. Savage, American Society for Metals, Metals Park, Ohio, 1987, pp. 155–162) While (all) Al-alloys show deterioration of the corrosion resistance relative to (commercially and/or high and/or ultra-) pure aluminum due to the microgalvanic effect(s) at the alloy surface, the PVD-Al—Cr—Fe alloys showed threefold improved corrosion resistance over pure aluminum.

The extension of equilibrium solid solubility of light rare earth elements in cph-Mg require high front velocities to suppress microsegregations upon solidification of the melt due to low partition coefficients $k_o(T)$. $k_o(T)$ is defined as the ratio $C_S/C_L$ at a given temperature T, where $C_s$=solidus concentration and $C_L$=liquidus concentration of an initial alloy concentration $c_o$. Corresponding values range from 0.05 for Mg–Eu to 0.1 for Mg—Sm (cf. F. Hehmann, F. Sommer and H. Jones, Extension of Solid Solubility of Yttrium and Rare Earth Metals in Magnesium by Rapid Solidification, *Processing of Structural Metals by Rapid Solidification*, eds. F. H. Froes and S. J. Savage, American Society for Metals, Metals Park, Ohio, 1987, pp. 379–398; F. Hehmann, F. Sommer and B. Predel, Extension of Solid Solubility in Magnesium by Rapid Solidification, *Mat. Sci. Engng. A*125 (2), 1990, pp. 249–265). Hypoeutectic Mg—Sr alloys with coefficients $k_o$ of 0.005 were shown to require front velocities of 2 to 4 m/s corresponding to laser withdrawal velocities of 3 to 6 m/s in order to achieve solidification without microsegregations (F. Hehmann and P. Tsakiropoulos, Microstructural Modelling of Lazer Glazing, Gas-Atomization and Spray Forming for the Development of Magnesium Alloys, Conf. Proc. *Magnesium Alloys and Their Applications*, DGM, Oberursel, FRG, 1992). The conditions to extend the equilibrium solid solubility of light RE metals in cph-Mg by liquid quenching methods are therefore not readily available.

Corresponding one phase as-solidified microstructure was observed in a surface chill zone of width 20–30 µm of piston-and-anvil (PA) splats of overall thickness 150 µm (F. Hehmann, R. G. J. Edyvean, H. Jones and F. Sommer, Effect of Rapid Solidification Processing on Corrodability of Magnesium Alloys, Conf. Proc. *PM Aerospace Materials '87*, eds. B. Williams and G. Dowson, Met. Powder Report Publishing Services, Shrewsbury, England, p. 46/1; F. Hehmann, Rasch Erstarrte Magnesium-Mischkristalle und Ihr Umwandlungs-und Korrosionsverhalten, *Doctoral Thesis, University of Stuttgart*, published in Fortschrittsberichte VDI', Reihe 5, No 155: Grund-und Werkstoffe', VDI-Verlag, Düsseldorf, F. R. G., January 1989). The reminding cross-section of dendritic growth of equilibrium phases was a result of the recalescence triggered by internal release of latent heat that occurs when the solidification front traverses the cross-section of the volume flattened by "splatting". PA-splat cooling is a discontinuous method to produce small volumes of material. In order to achieve a surface chill zone of width 20–30 µm in a sample of size 50 mg, pressures up to 5 bar for pneumatic acceleration of the piston were required (cf. H. Gronert, *Dipl. Thesis, University of Duisburg*, 1984). Due to the variety of microstructures accrued to the high pressure available, PA-splat cooling is a very useful method to evaluate the departure from microstructural and structural equilibrium required for the economically viable production of passive magnesium alloys by using continuous RS-manufacturing methods. However, the high quality of these microstructural portions were instrumental for the present invention.

One RS-processing method that could continuously produce metastable phases and microstructures is vapor deposition. Bray et al. reported (D. J. Bray, R. W. Gardiner, B. W. Viney and H. M. Flower, Conf. Proc. *Magnesium Alloys and Their Applications*, DGM, Oberursel, FRG, 1992, pp. 159–166; D. J. Bray, R. W. Gardiner and B. W. Viney, GB-Patent 2,262,539 A, 23 Jun. 1993) on extension of prior-art by the effect of titanium in extended solid solution of cph-Mg made by thermal evaporation on to a collector which was temperature-controlled at between 100°–150° C. The Mg—Ti system was identified (D. J. Bray, R. W. Gardiner and B. W. Viney, GB-Patent 2,262,539 A, 23 Jun. 1993) to develop annual corrosion rates between 330 µm/yr for Mg-2.0 wt. % Ti over 30 µm/yr for Mg-22 wt. % Ti and 5 µm/yr for Mg-47 wt. % Ti compared to 490 µm/yr for evaporated pure magnesium and 420 µm/yr for WE43, for example, as was derived from weight loss experiments after immersion for 7 days in 0.6 mol NaCl aqueous solution. The disadvantages of vapor deposition of Mg—Ti base alloys appeared to include 1. a thermally relatively unstable solid solution of at least a substantial part of Ti in cph-Mg, i.e. not much higher than 200° C., 2. that significant passivation required Ti-levels as high as 22 wt. % where the density of the overall alloy had already exceeded a value of 2.0 g/cm³ and 3. that Ti is very different from magnesium in that it provides a much higher vapor pressure so evaporating not as easily to provide an economically viable major alloying addition to cph-Mg. Ti is a representative for early transition metals to produce new and corrosion resistant magnesium base alloys showing the importance to develop relevant vapor deposition processes.

The non-equilibrium microstructures offered by the umbrella of rapid solidification processing (RSP) have yet not been explored systematically in order to develop magnesium alloys and applications with significantly improved surface passivity. The alloy compositions and the possibilities for conversion of non-equilibrium Mg-alloys into products of which corrosion resistance, mechanical properties, the stability and the transformation behavior of the metastable non-equilibrium state are of prime concern, have also not been explored to date. This concerns wrought products with a fine grain size inside the bulk material and which are suitable for low and elevated temperature applications as well as for weathered applications.

BRIEF SUMMARY OF THE INVENTION/PART 1

It is the object of the inventions disclosed herein to take the above limitations systematically into account in order to provide magnesium and aluminum alloys with superior corrosion behavior and modulus of elasticity due to a non-equilibrium alloy surface and/or—depending on the employed RSP-method—due to a non-equilibrium alloy bulk for superior mechanical properties compared to the available commercial magnesium alloys by using economically feasible production methods combined with an alloy conversion procedure which have yet not been applied for such alloys. In order to achieve such improvements it is important to reduce the susceptibility to weight loss in saline and other corrosive environments and to retain corresponding microstructures in final product form. The challenges in order to surpass in prior-art magnesium alloys include:

1. the reproducibility of the reported results for the extended solid solutions of rare earth elements in cph-Mg by employing test conditions accepted by industry;
2. the discrimination of the effect of second phases resulting from microsegregations and artificial averaging in order to identify precisely the passivation effect obtained by microstructural departure from equilibrium;
3. the methods and conditions to reproduce the required non-equilibrium microstructure by using continuous production methods; and
4. the identification of the conditions (e.g. temperature) of alloy conversion (i.e. extrusion, forging, rolling, isostatic pressing) and the degree of affordable aging and/or microsegregations to retain the effect of the non-equilibrium microstructure in the final product.

The inventions claimed herein are magnesium and aluminum alloys synthezised and produced by rapid solidification from the melt including melt-spinning, planar flow casting or laser beam surface melting and from the vapor phase including vapor deposition by using diaphragms to control productivity and yield of elemental and alloyed vapor throughputs synthesized by thermal evaporation methods and/or by plasma and magnetron sputtering methods as well as by solid state synthezising techniques now controllable by the operator independent on the milling technique employed. While the non-equilibrium alloy development is demonstrated along selected experiments, alloy compositions and established and critically reviewed selection criteria towards superior properties, the controlling variables and engineering solutions to continuously produce such alloys are shown in the last part of the invention and coupled with the hierarchy for more effective realization including rapid prototyping alloys, alloy products and corresponding processes if not yet available. The alloys contain 0.1 or 0.2 wt. % up to 30 or 40 wt. % La, Ce, Pr, Nd, Sm, Ti, V, Cr, Mn, Zr, Nb, Mo, Hf, Ta, W, Al, Ga, Si, B, Be, Ge, Sb all evidencing similar and/or complementary oxidation and passivation characteristics or a combination of these alloying additions with up to 35 wt. % such as available via selected (light rare earth) misch-metals and also via commercially available alloys WE43, AE42, QE22, and ZE41, for example and/or via a commercial misch-metal including (heavy) rare metals, yttrium and/or transition metals, within which either individual alloying additions or a combination of them is substantially held in solid solution of cph-Mg or another non-equilibrium (ne) phase after solidification and solid state synthesis then followed by conversion of these alloys into semi-finished or final wrought products by including microstructural transformation and hardening processes upon shaping and deliberate annealing treatments.

BRIEF DESCRIPTION OF THE SEVERAL VIEWS OF THE DRAWINGS

The nature, advantages and various additional features of the invention will appear more fully upon consideration of the illustrative embodiments to be described further below in connection with the accompanying drawings wherein:

FIG. 2 Piston-and-anvil (PA) Mg-4.7 wt. % Gd splats, here side with segregation-free chill zone, after eight years exposure to an aerated inland atmosphere.

FIG. 8 Transverse cross-section of PA Mg-4.2 wt. % La splats with featureless surface chill zones representing the extended solid solution of La in cph-Mg.

FIG. 13 PA Mg-4.2 wt. % La splat heat treated for 1 h at 400° C. and then immersed for 2 h in 5% (0.3 $H_2O_2$)–1% NaCl aqueous solution as to the modified Machu-test.

FIG. 16 As-solidified PA Mg-6.0 wt. % Ce splat a) after HF-activation prior to immersion and b) after immersion for 3 h in 5% (0.3 $H_2O_2$)–1% NaCl aqueous solution.

FIG. 19 As-solidified PA Mg-15 and 20 wt. % yttrium splats, a) prior to immersion for 15 Y and b) and c) immersed for 3 h in 5% (0.3$H_2O_2$)–1% NaCl aqueous solution.

FIG. 24 PA Mg-8.61 wt. % Sm splat in as-solidified condition a) prior to and b) after 0.5, c) 1 and d) 3 hours immersion in 5 wt. % (0.3 $H_2O_2$)–1 wt. % NaCl aqueous solution, here side of featureless chill-zone microstructure.

FIG. 25 (Top) PA Mg-6.99 wt. % Nd splat and (bottom) PA Mg-8.61 wt. Sm splat heat-treated for 1 h at 400° C. then immersed for 3 h in 5 wt. % (0.3 $H_2O_2$)–1 wt. % NaCl aqueous solution on side of chill-off zone of dendritic microstructure.

FIG. 28 PA Mg-6.0 wt. % Mn splat, here made from high purity Mg-feedstock (i.e. <50 ppm Fe) with featureless chill-zone microstructure after (top) 0.5 h, (center) 1.0 h and (bottom) 3.0 h immersion in 5 wt. % (0.3 $H_2O_2$)–1 wt. % NaCl aqueous solution.

FIG. 28).

FIG. 32 As for FIG. 31, here after 0.5 h immersion in 5 wt. % (0.3 $H_2O_2$)–1 wt. % NaCl aqueous solution.

FIG. 34 As for FIG. 33, here after 3 h immersion in 5 wt. % (0.3 $H_2O_2$)–1 wt. % NaCl aqueous solution.

FIG. 43 PA Mg-1.5 wt. % Sr splat, as-solidified condition, (top) prior to and (bottom) after 2 h immersion in 5 wt. % (0.3 $H_2O_2$)–1 wt. % NaCl aqueous solution for (bottom left) featureless chill-zone microstructure and (bottom right) dendritic chill-off zone.

FIG. 45 PA Mg-3.91 wt. % Au splat in as-solidified condition at featureless chill-zone (top) prior to and (bottom) after 3 h immersion in 5 wt. % (0.3 $H_2O_2$)–1 wt. % NaCl aqueous solution.

FIG. 47 Test coupons of AZ91 and of vapor deposited Mg4 wt. % Ti and Mg-7 wt. % Ce made at 60° C. prior to (top) and after (bottom) 0.5 h immersion in 5% (0.3 $H_2O_2$) –1% NaCl aqueous solution.

FIG. 48 Optical microstructure of transverse section of vapor deposited (top, 1000:1) and chill cast (bottom, 200:1) Mg-8 wt. % Ce alloy.

FIG. 57 As for FIG. 56 (top), here using a) another sample to employ a heating rate of 40 K/min (top) and b) to employ a heating rate of 20 K/min (bottom).

FIG. 63 (Top) TEM-diffraction pattern and (bottom) DSC-analysis using various heating rates as shown in [K/s] for melt-spun Mg-23.4 wt. % Al ribbon after 12 months exposure to ambient temperatures.

FIGS. 56–58).

FIG. 68 (Top) Effect of Fe-content on corrosion rate of rapidly solidified alloy Mg-15 wt. % Al and of conventionally cast Mg-10 wt. % Al and (bottom) proposed mechanism of corrosion pit for a) conventionally cast Mg—Al alloy assuming large $Mg_{17}Al_{12}$ particles (not included here) and b) rapidly solidified microstructure with fine $Mg_{17}Al_{12}$-dispersion.

FIG. 78a) in front of the interface metal/electrolyte resulting in an increase in b) corrosion potential ($\epsilon_k)_R$ due to corresponding shift of the cathodic partial reaction from $a_z$ to $k_z$ (cf. FIG. 78b) and FIG. 78c potential profile (solid lines) and current density lines (hatched lines) for a Zn-plate immersed in 1 N NaCl aqueous solution and a topologically coherent iron oxide surface film (FIG. 78d) transforming locally into pits (P) surrounded by $Fe_2O_3$ or other corrosion products (cf. CP).

FIG. 79 (Top) Transformation of topologically coherent iron oxide film (A) into pitting and surrounding corrosion product $Fe(OH)_3$ (B: rust) building up around pit as a result of oxygen gradient in aeration cell.

FIG. 82 Showing equilibrium phase diagrams of a) binary system Fe—Cr including the effect of 0.6 wt. % carbon on γ-phase field extension (dotted line) and b) ternary T-xNi-cut for Fe-18 Cr alloys (cf. a)).

FIG. 84 Optical microstructure of melt-spun Mg-17.3 wt. % Ce ribbon showing columnar grains.

FIG. 98 Principle of continuous batch process using flat plank-collectors (PC): (top) showing "planar"-type of continuous process tilting (lateral) edge-on (le) and process principle $n_c^{min}=3/2\ n_d$ and (bottom) showing "spatial"-type of continuous process with condensers tilting (front) face-on (ff).

FIG. 100 "Top"-view projection of "planar" condenser level from evaporation part of process following principle $n_c^{min}=3/2\ n_d$ with (top) $n_c^{min}=6$ and (bottom) $n_c^{min}=12$ (numbers in circles).

FIG. 107 Vial and vial dimensions employed in the invention by using Fritsch's Pulverisette $5^R$.

FIG. 109 Showing principal of planetary ball milling for (top) four vials rotating counter-clockwise while corresponding holder disc (large arrow circle) rotates clockwise and (bottom) horizontal cut of vial moving clockwise (V) with eight milling balls.

Figure 119:
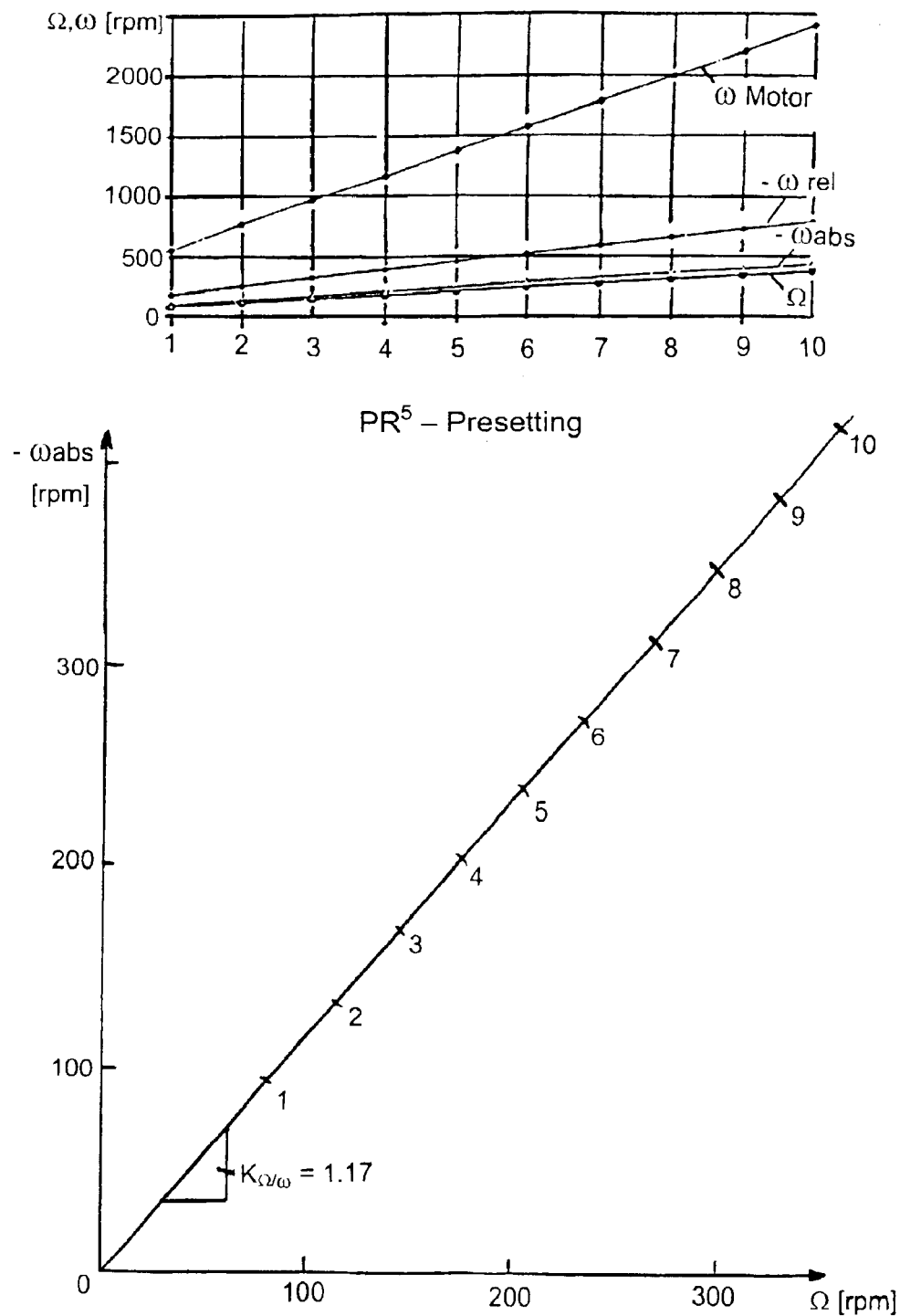

FIG. 119 Showing rotation velocity (top) as a function of presetting of Pulverisette $5^R$ of motor, holder disc (Ω) and vial(s) (absolute and relative to Ω) and (bottom) resulting coupling factor $k_{W/w}$=1.17 for $\omega_{abs}$=fn(Ω).

Figure 111:
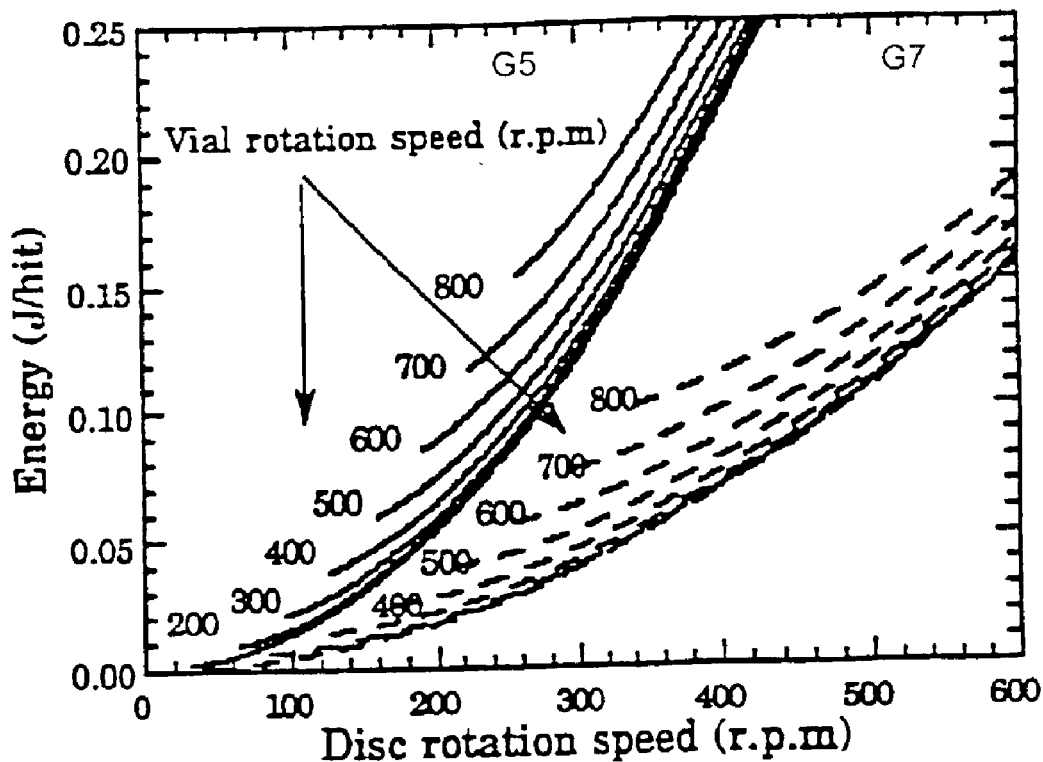
FIG. 111 Impact energy for mass of milling ball, $m_b$=14 g, as a function of disc rotation velocities Ω at various vial rotation velocities co as indicated for two planetary ball mills with R=13 (G5) and 7.5 cm (G7).
Figure 113:
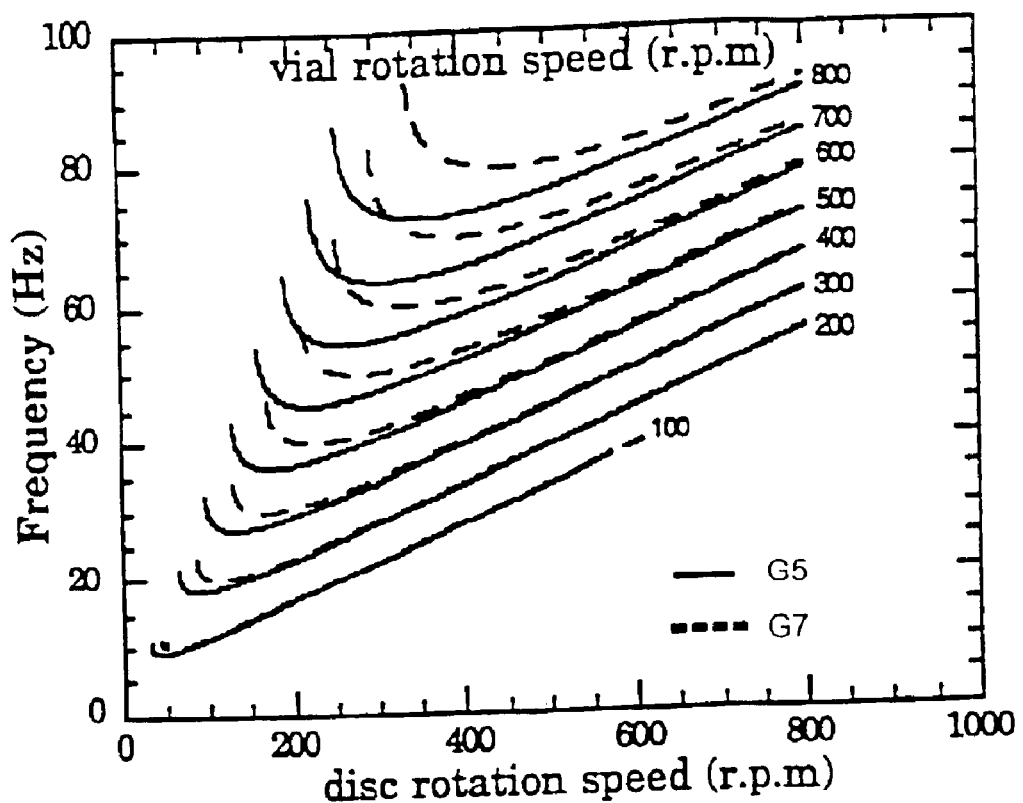
FIG. 113 Impact frequency of five milling balls as a function of disc rotation speed Ω at various vial rotation velocities ω as indicated for planetary ball mills with R=7.5 (G7) and 13 cm (G5).
Figure 114:
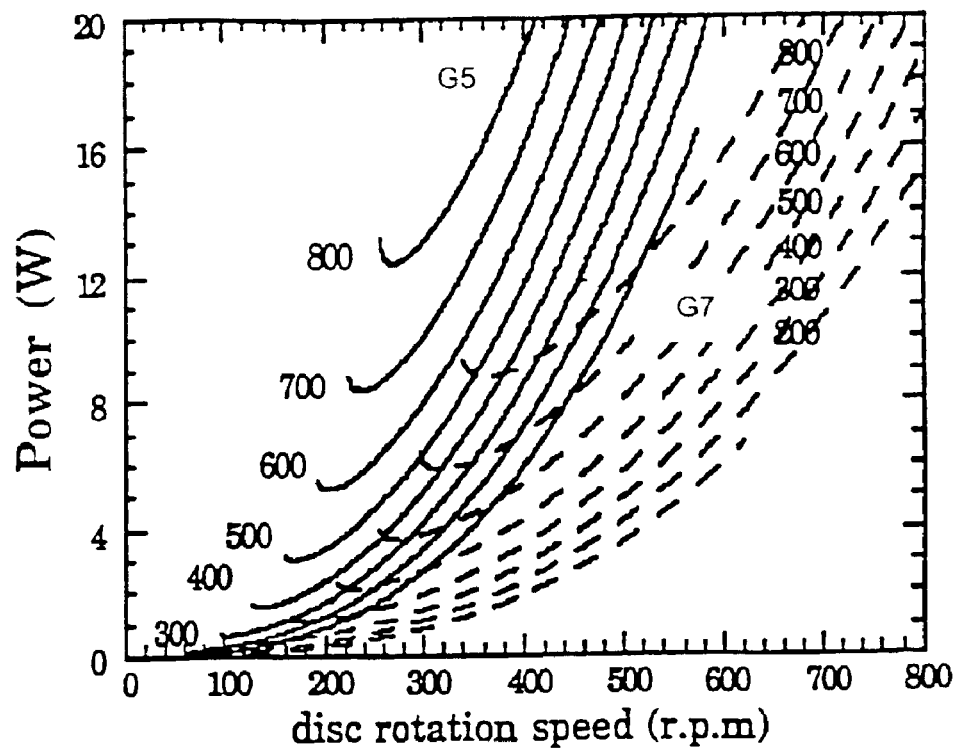
FIG. 114 As for FIG. 113, here impact power as a function of disc rotation velocity Ω for planetary ball mills with R=13 (G5) and 7.5 (G7) cm.
Figure 120:
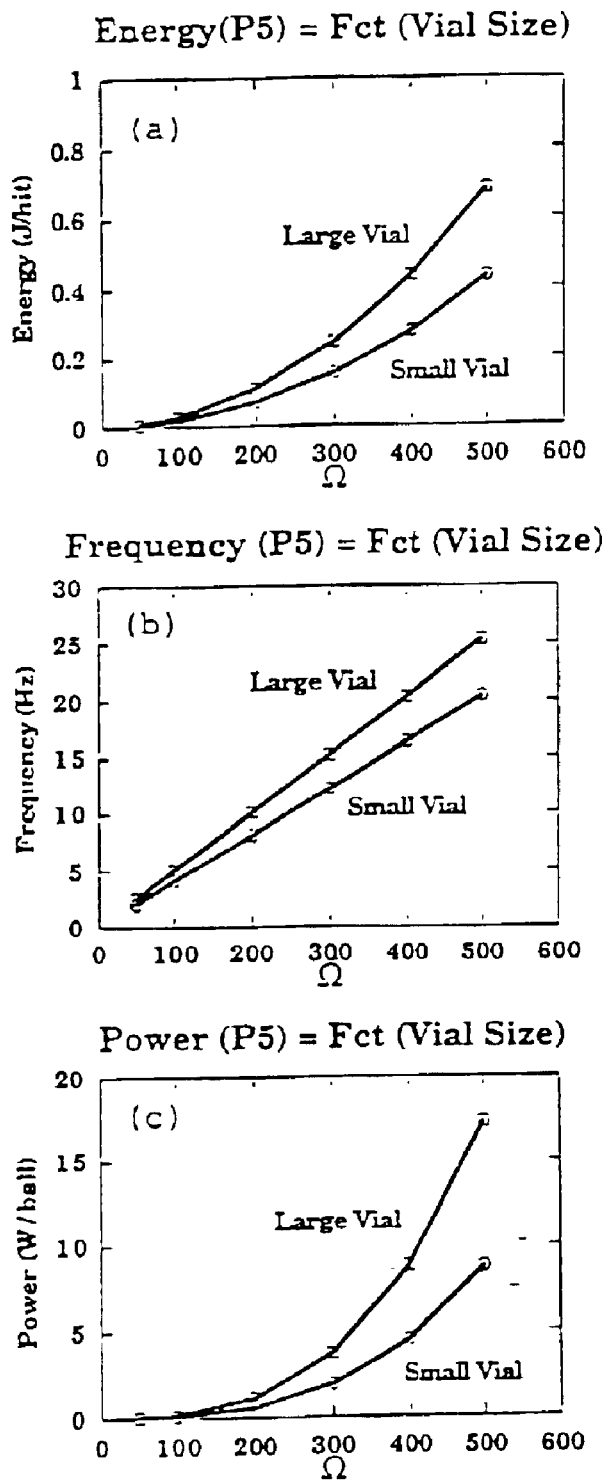

FIG. 120 As for FIGS. 111, 113 and 114, here for Pulverisette $5^R$, showing that for PBM, type II, the relationships shrink down to one graph (line) as a result of the coupling factor $k_{\Omega/\omega}$(here −1.15).

Figure 121:
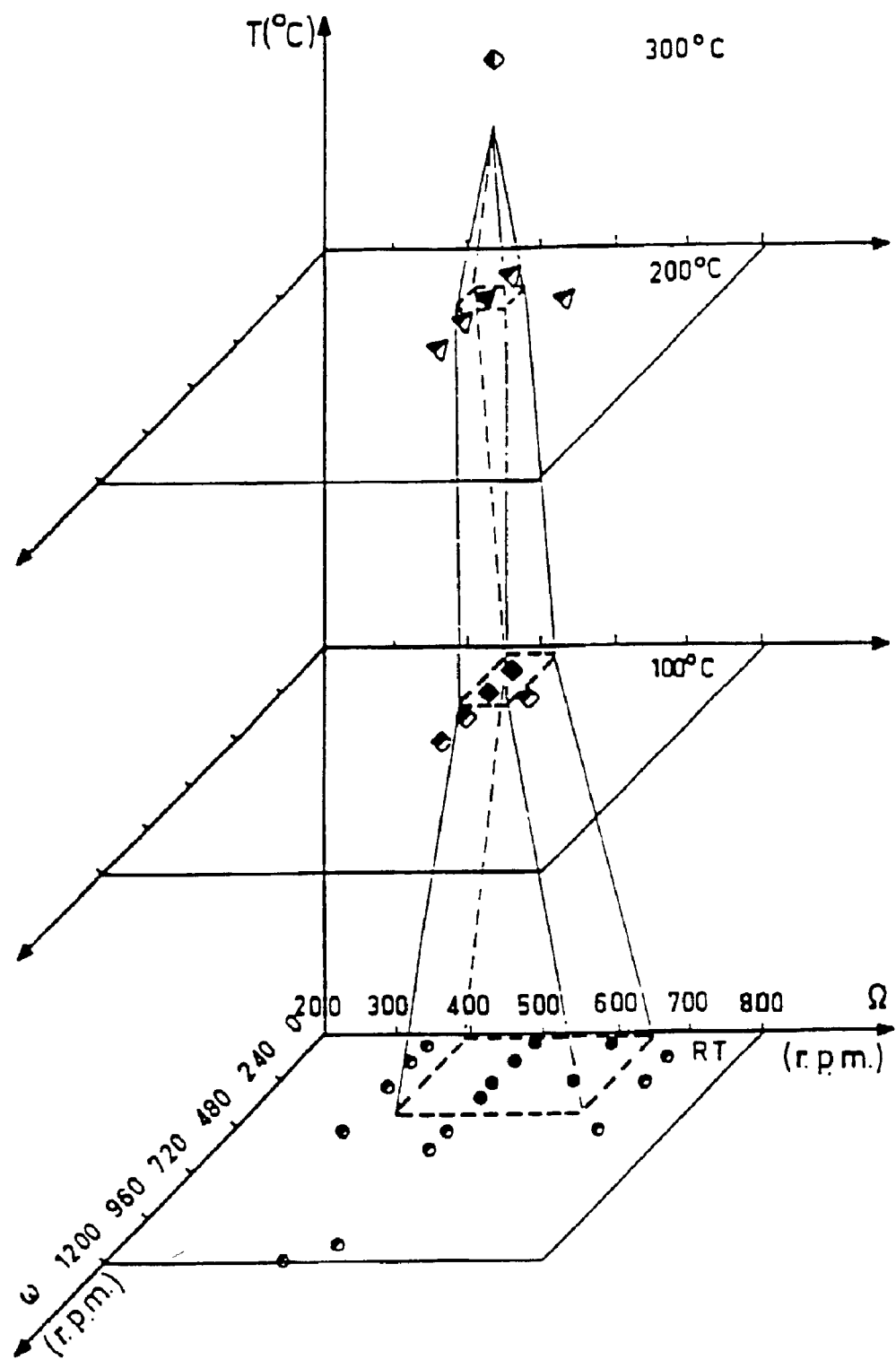

FIGS. 121 Ω-ω-T window for amorphous $Ni_{10}Zr_7$ by planetary ball milling with R=17.5 cm of crystalline $Ni_{10\ Zr7}$ intermetallic phase.

Figure 122:
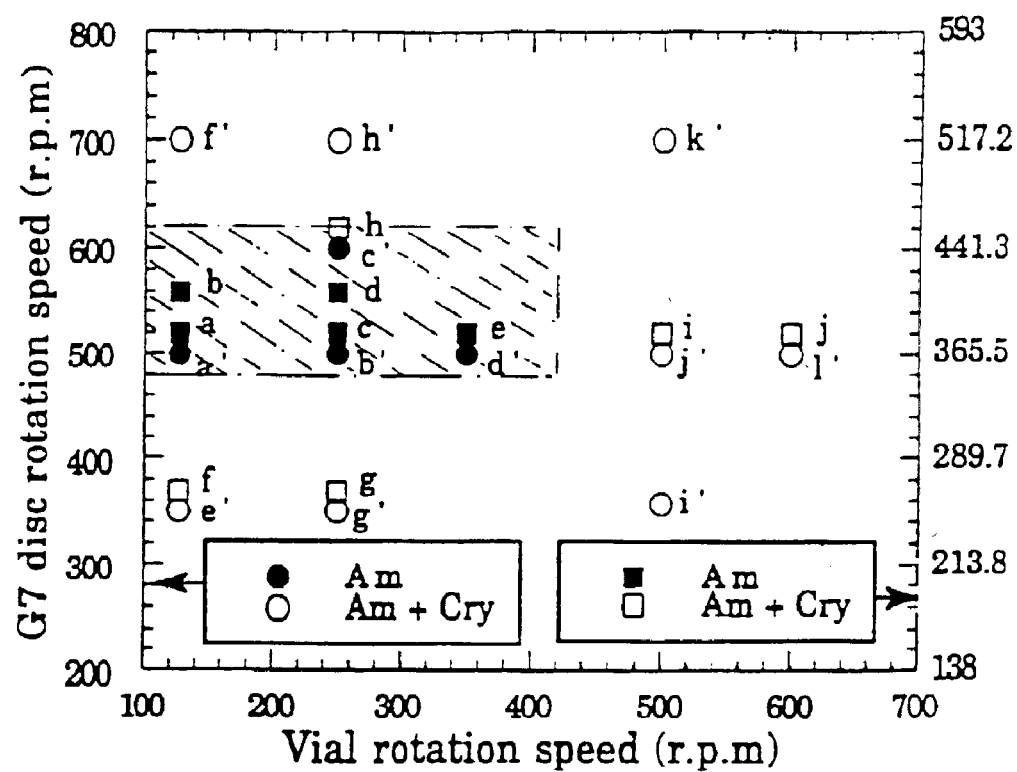

FIG. 122 As for FIG. 121, here including data from planetary ball mill with R=13 cm, all at ambient temperature.

FIG. 123 Kinetic impact energy and impact frequency, the latter per five milling balls, as a function of disc velocity $\Omega$ for vial rotation 150 (1), 250 (2) and 350 (3) rpm of planetary ball mills with R=7.5 (G7) and 13 cm (G5).

Figure 124:
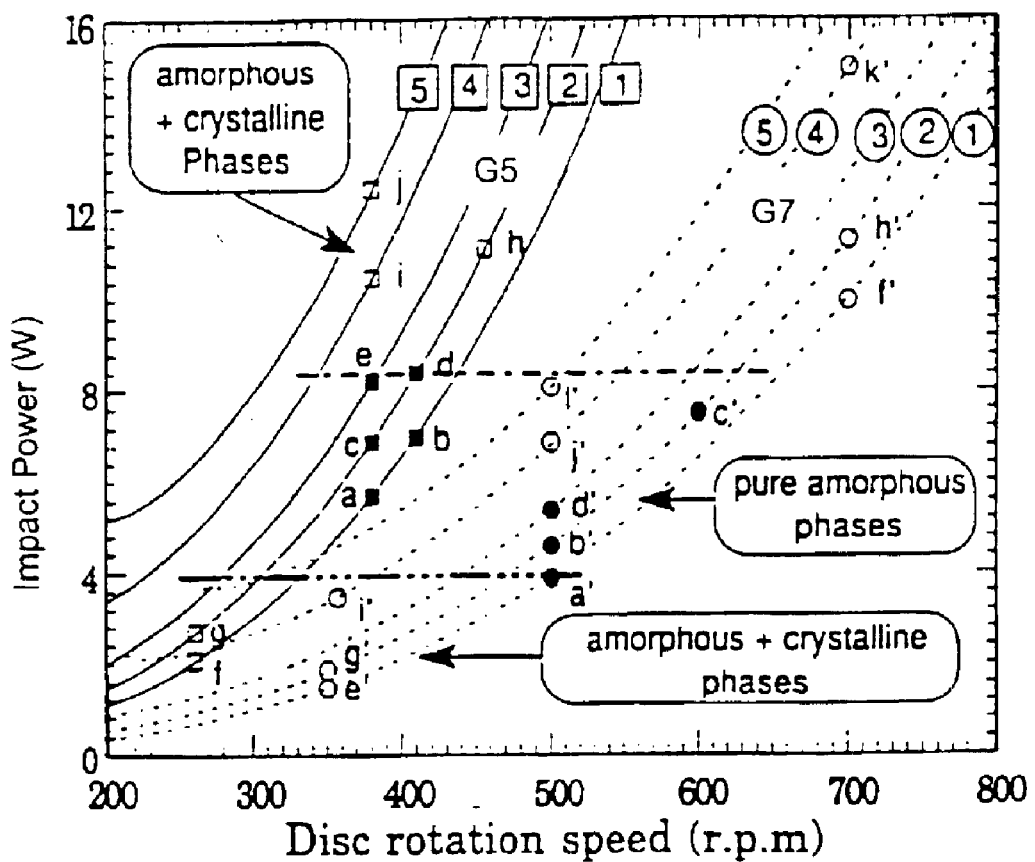

FIG. 124 Impact power as a function of disc velocity $\Omega$ for vial velocities ranging from 150 (1) over 250 (2), 350 (3), 500 (4) and 600 rpm (5) of planetary ball mills with R=13 (G5) and 7.5 cm (G7).

FIG. 125 a), d) side- and b), c) front-view of horizontal attritor technique with a) low and b) high filling fraction of corresponding milling container and c), d) corresponding rotor alone.

Figure 126:
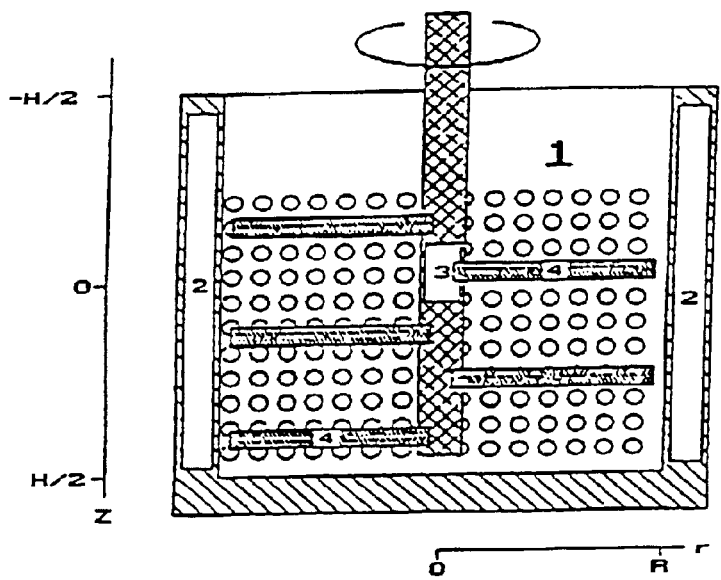

FIG. 126 Schematic of vertical attritor ball mill.

Figure 127:
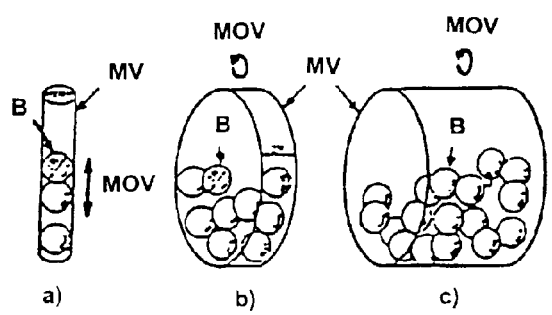

FIG. 127 Schematic of three principal vibrating ball mills with a) 1-dim, b) 2-dim and c) 3-dim model.

Figure 128:
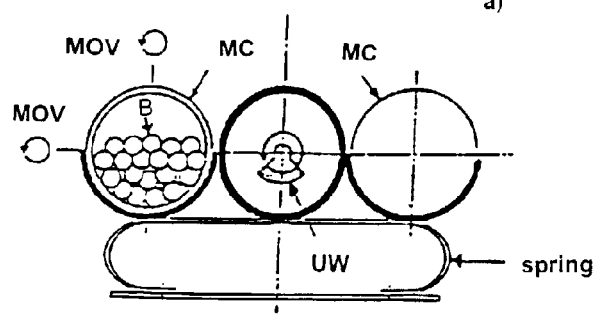

FIG. 128 Schematic of industrial vibrating ball mills.

Figure 129:
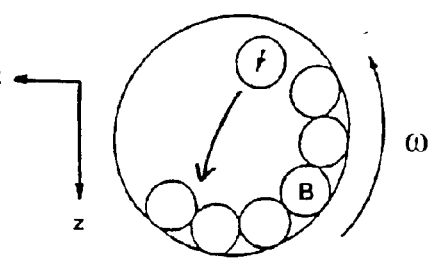

FIG. 129 Schematic of horizontal ball mills.

FIG. 130 Machined WE54-chips and turnings directly employed upon ball milling with $Al_2O_3$, SiC, BN and $Al_3Ti$.

Figure 131:
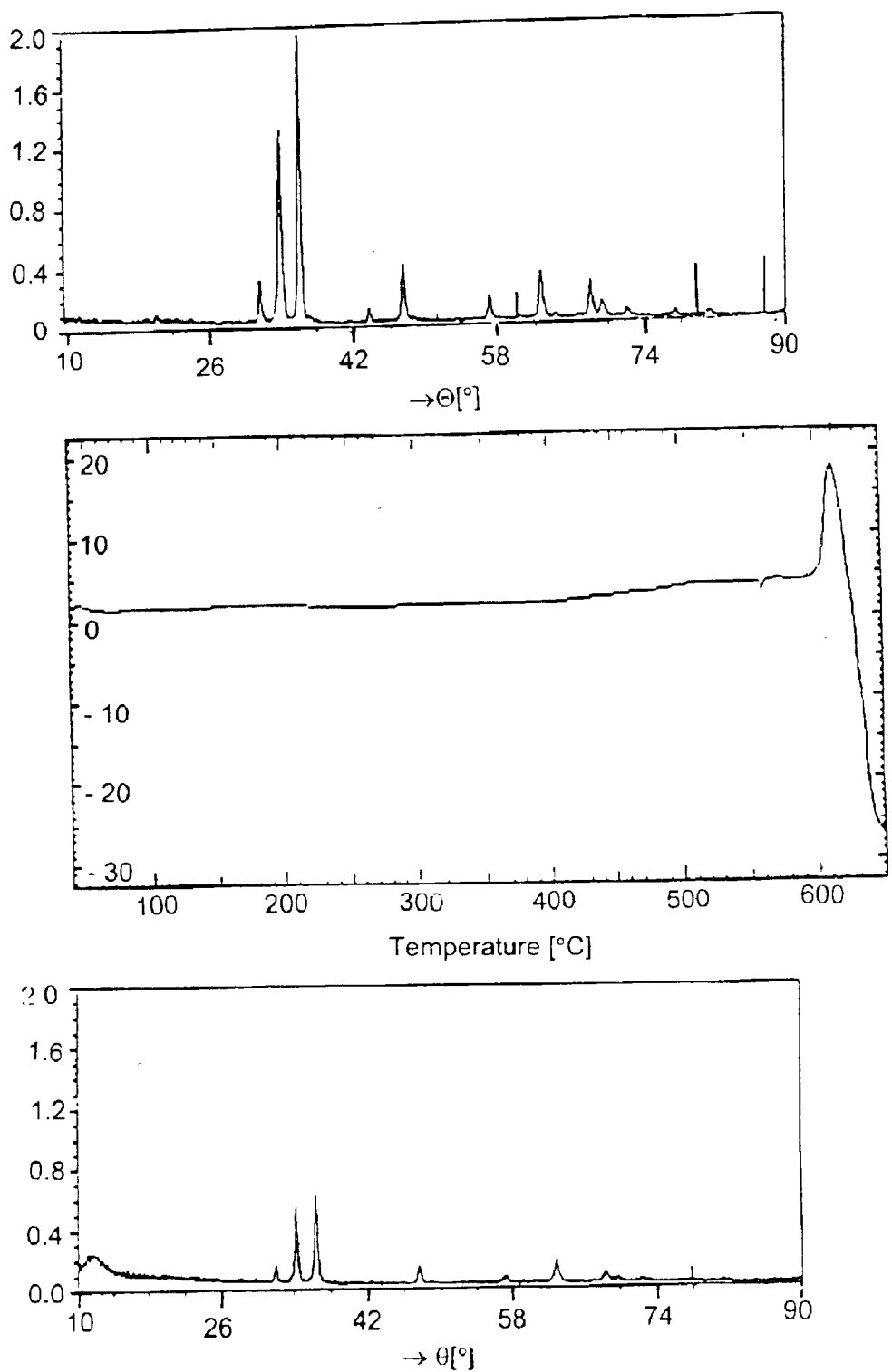

FIG. 131 Showing (top) X-ray diffraction of as-received Mg-alloy WE54 (ingot) and (center) DSC-analysis with transformation peak at 613° C. and (bottom) corresponding X-ray diffraction of (WE54+2.5 wt. % $Al_2O_3$) ball-milled for 2 h at 20° to 70° C. without lubricant (i.e. "dry").

Figure 132:
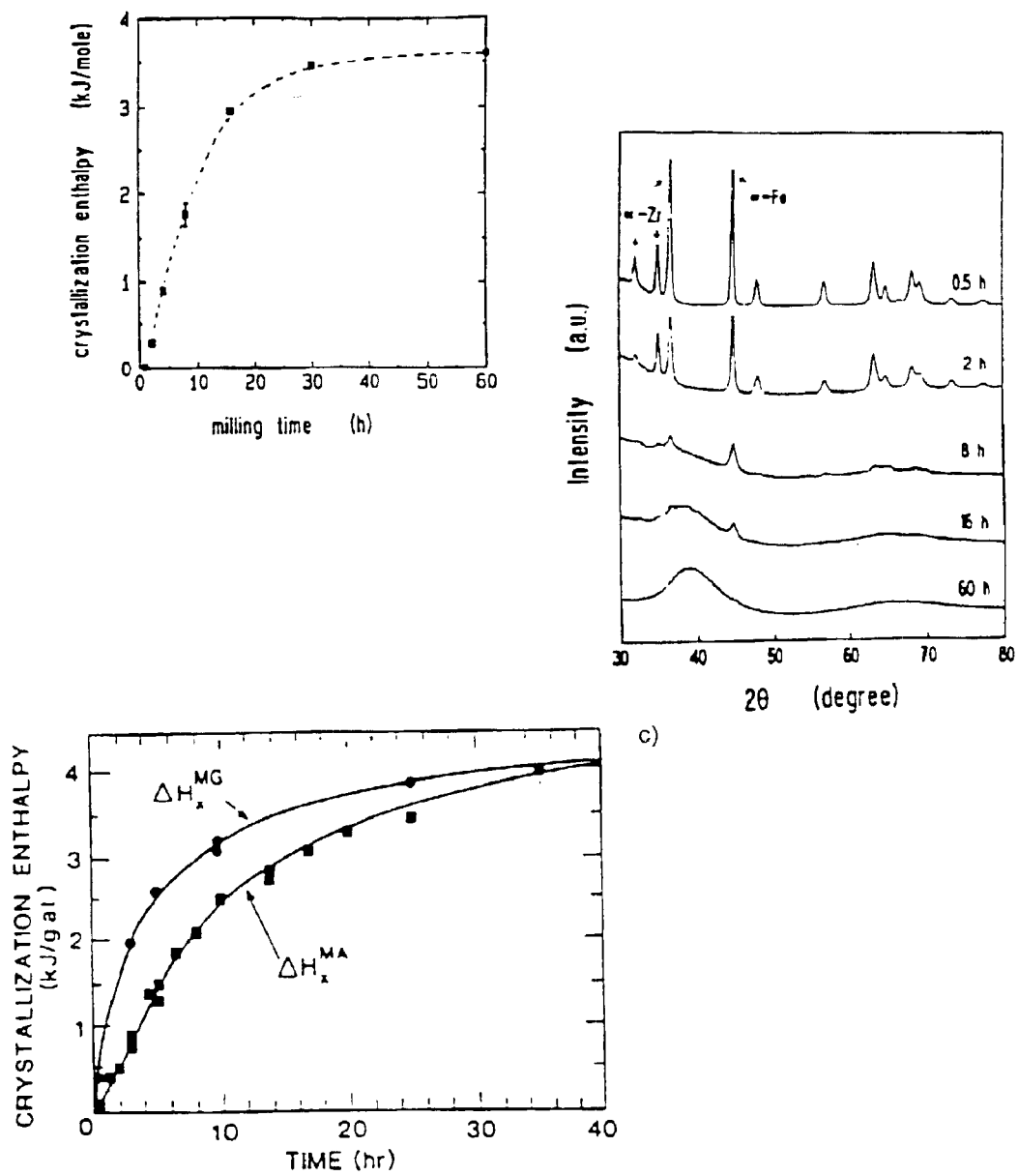

FIG. 132 Non-linear structural evolution with time as shown by a), c) enthalpy of transformation (crystallization) of a) amorphous $Zr_{80}Fe_{20}$, c) amorphous $NiTi_2$ and b) X-ray intensities of amorphous $Zr_{50}Fe_{50}$ after different ball milling times.

Figure 133:
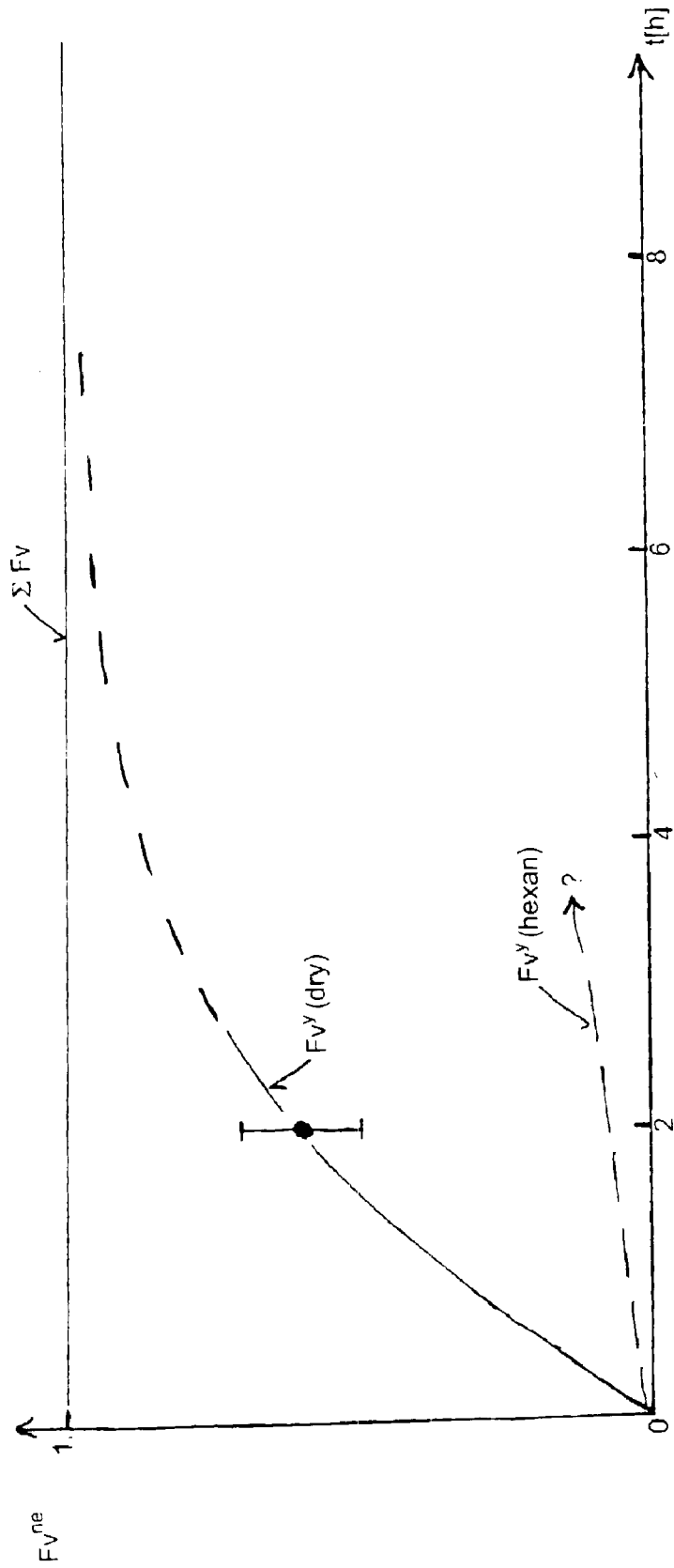

FIG. 133 Evolution of volume fraction $f_v^{ne}$ non-equilibrium (WE54–2.5 wt. % $Al_2O_3$) phase as a function of ball milling time employed for low yield ($f_v^{ne}<0.5$) at dry milling conditions (upper curve) and high yield ($f_v^y$ about 1), but low fine (bottom curve).

Figure 134:
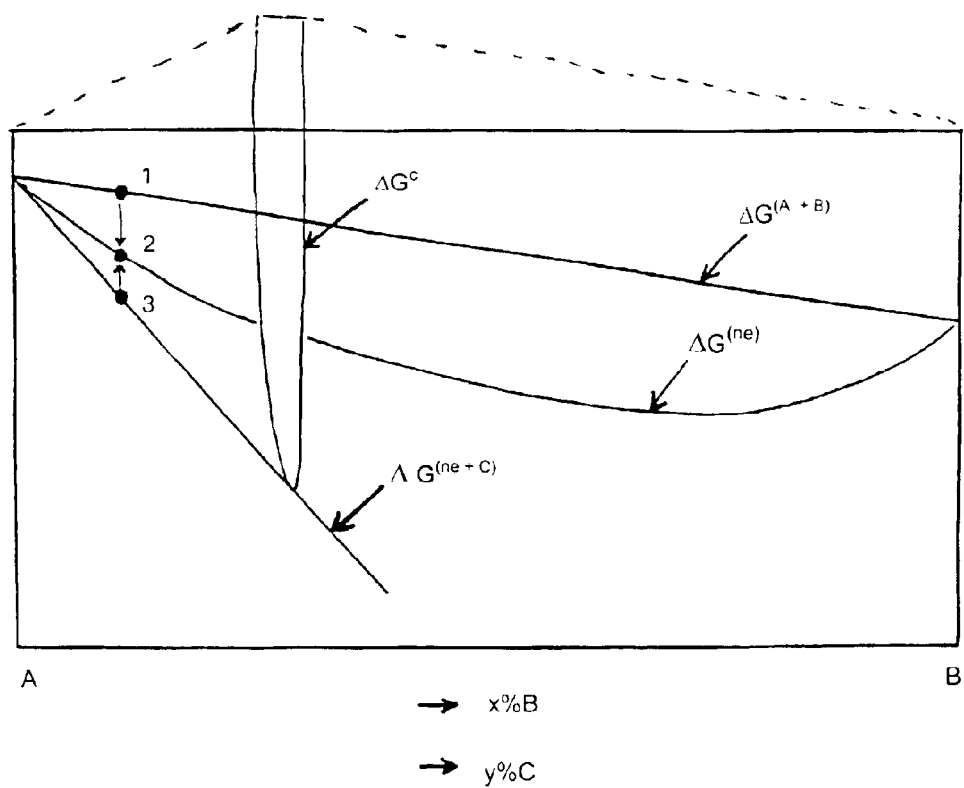

FIG. 134 Schematic free energy diagram with elemental components A (e.g. Mg) and B (e.g. TM, met, RE) and an intermetallic or ceramic compound C.

Figure 135:
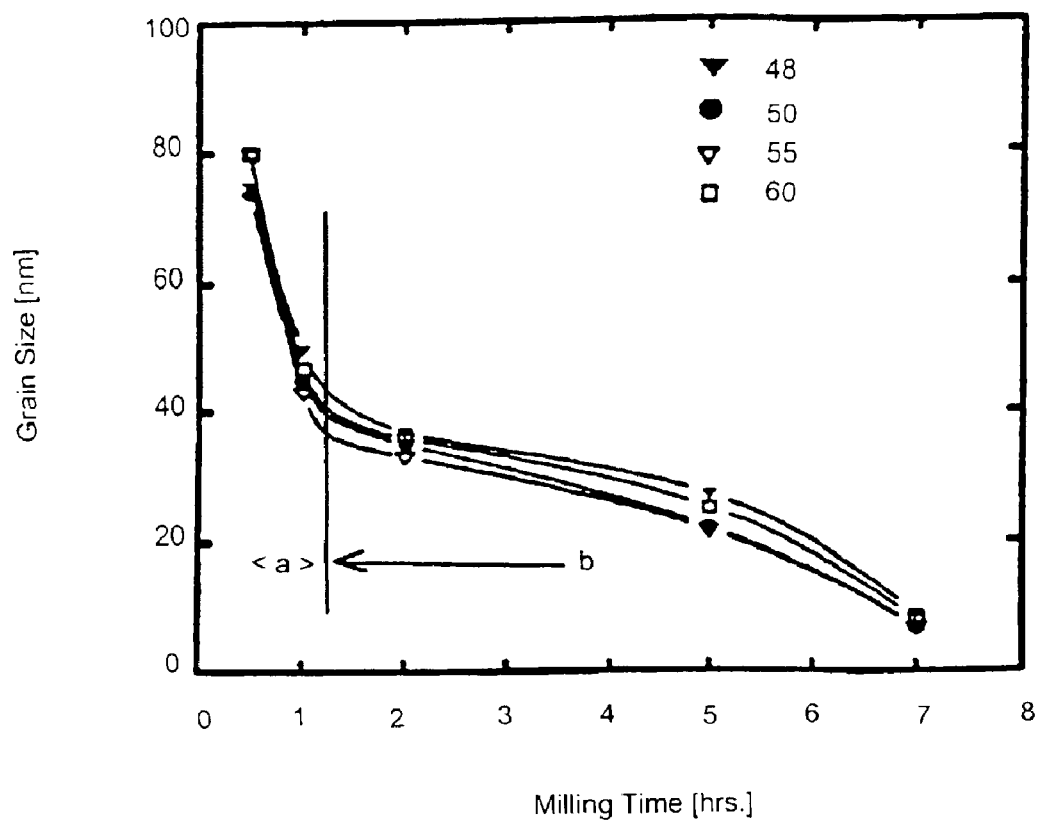

FIG. 135 Variation of grain size as a function of milling time in mechanically alloyed γ-TiAl alloys (Al-content in [at. %]).

Figure 136:
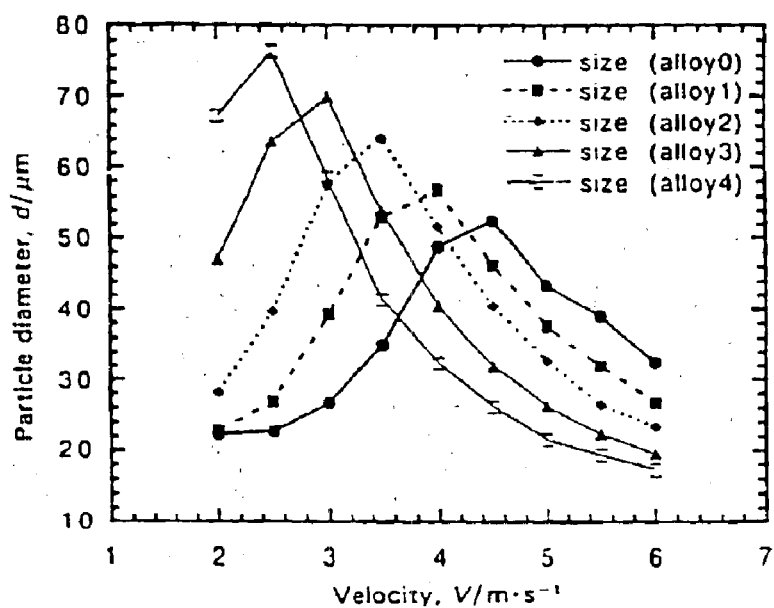

FIG. 136 Powder particle size after eight effective impacts as a function of impact velocity of the alloys shown in the Table on top.

Figure 137:
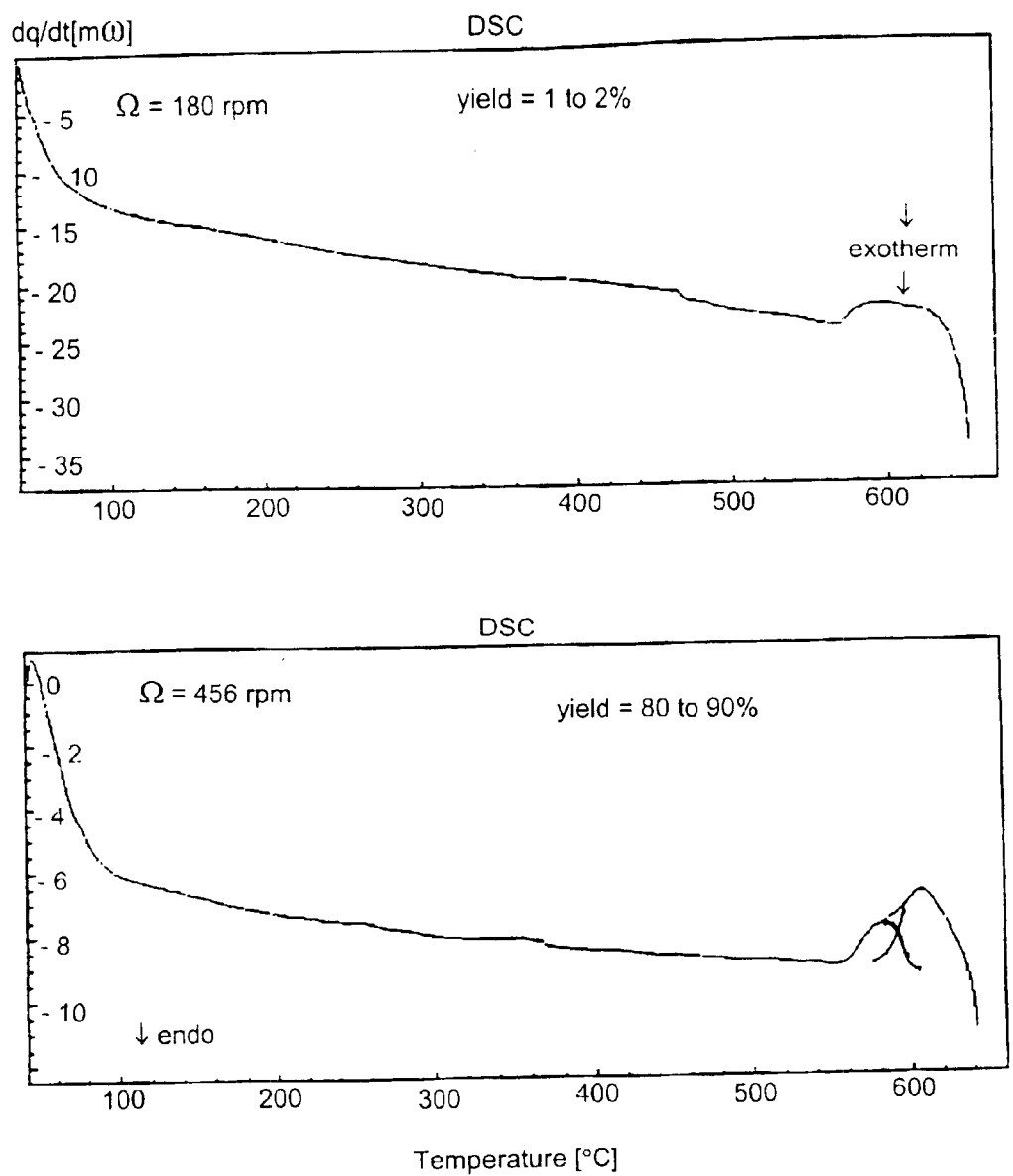

FIG. 137 Evolution of non-equilibrium phase and yield of ball-milled Mg-10Ti-5B [wt. %] with increasing (ratio of) shock power (-to-friction) as controlled by increasing disc holder rotation $\Omega$, here from 180 to 456 rpm.

Figure 138:
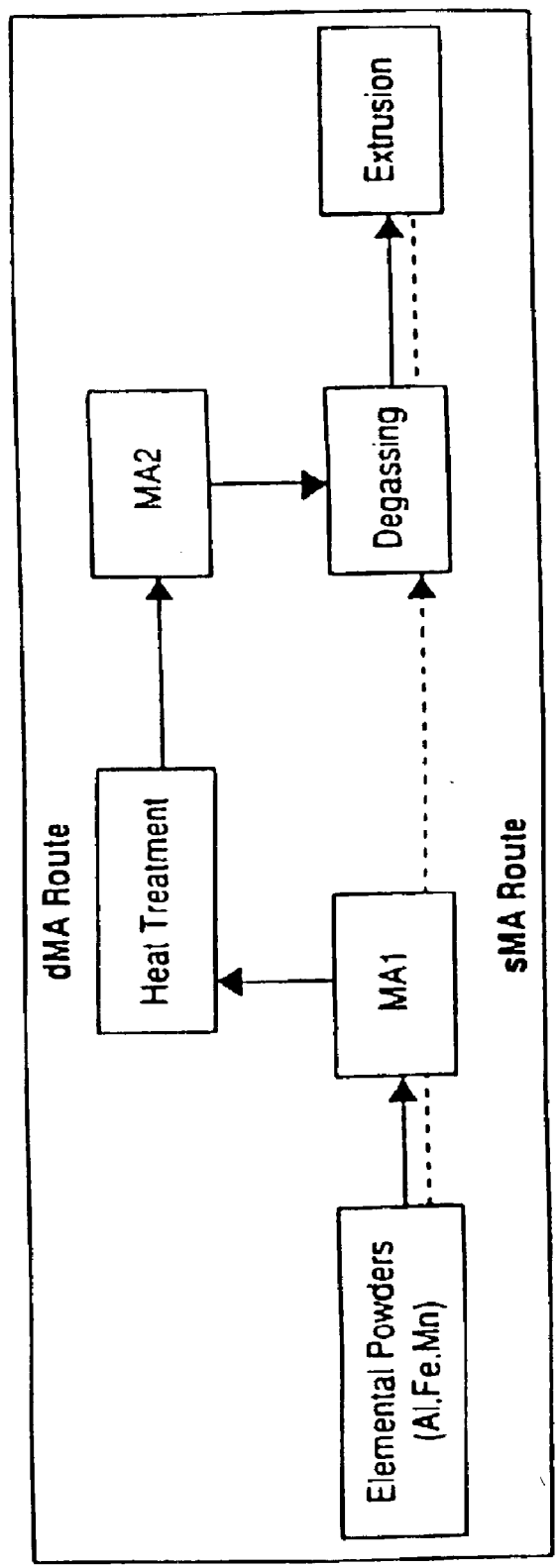

FIG. 138 Flow chart showing single (sMA) and double (dMA) mechanical alloying route, the latter including two distinct milling cycles before and after an heat treatment.

Figure 139:
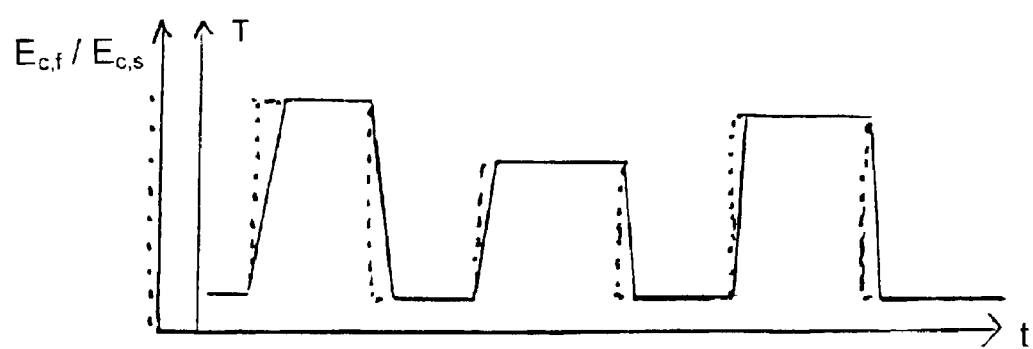

FIG. 139 Showing in-situ annealing cycle achieved by employing increased friction-to-shock and an in-situ cooling system of a planetary type 1—of ball mill with milling time including hysteresis (-----) stemming from corresponding heat flow.

Figure 140:
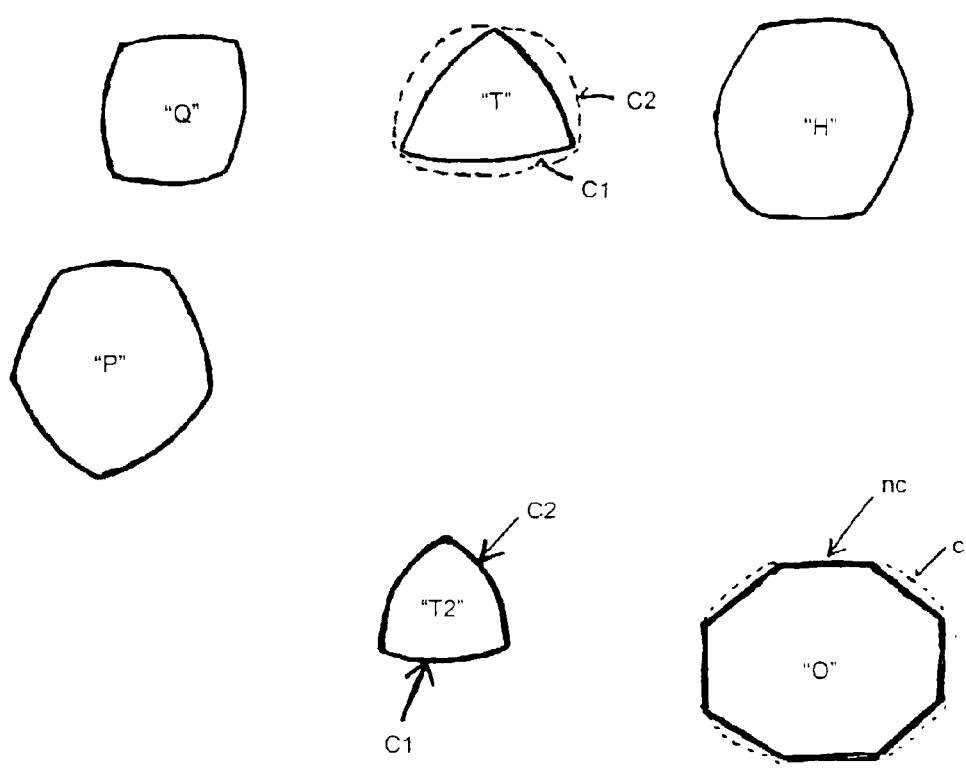

FIG. 140 Cross-sections of projectiles for "ball"-milling in the present invention with configurations providing particular effective impact energy transfer from projectile to the milled precursor and/or powder material.

Figure 141:
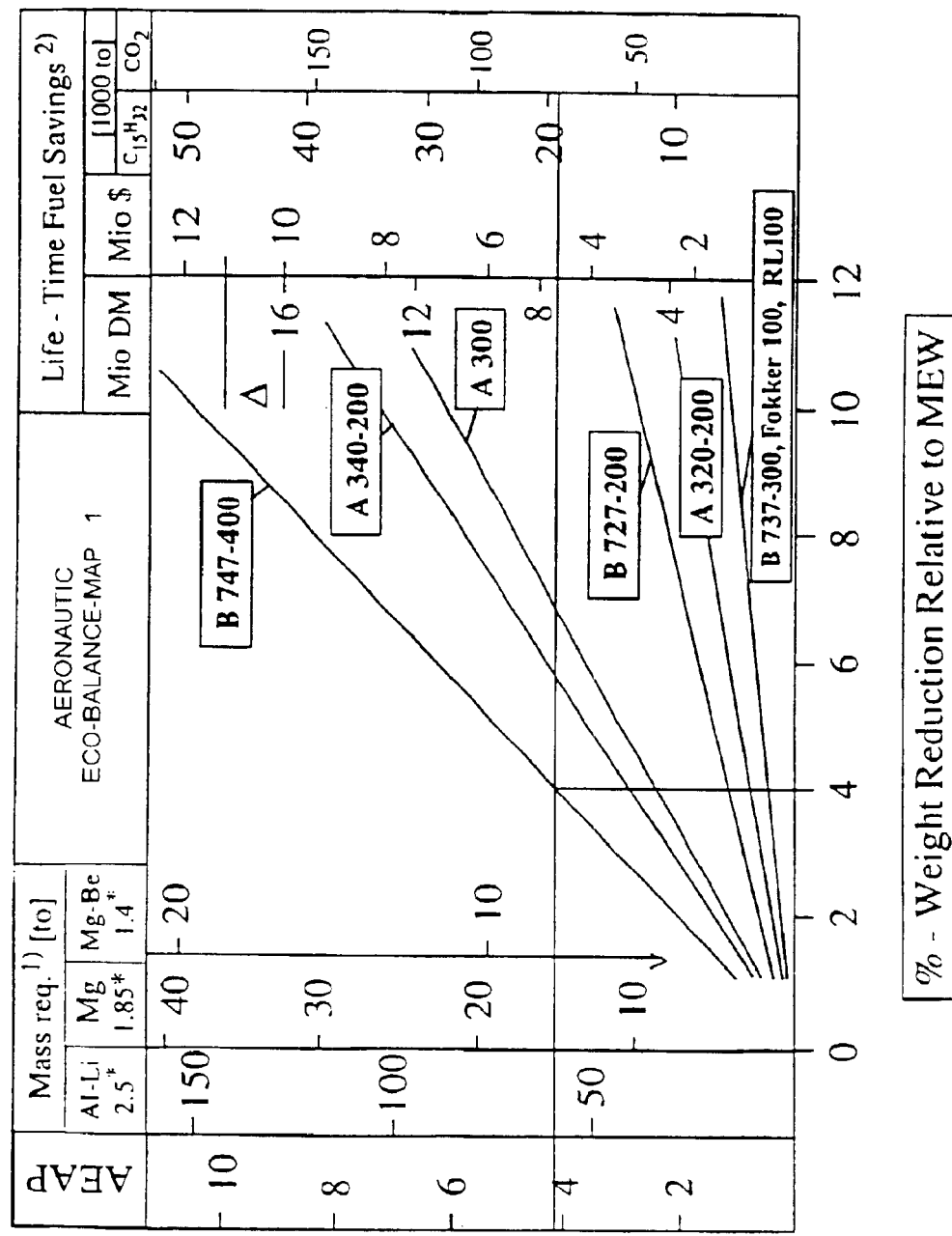

FIG. 141 Universal diagram to employ economical and ecological balances on investments in advanced magnesium and Al–Ll alloys (densities as indicated in [g/cm³]) to replace high strength conventional Al-7000 type of alloy in civil aeronautic applications. MEW: maximum empty ("dry") weight (i.e. aircraft weight without payload).

Figure 142:
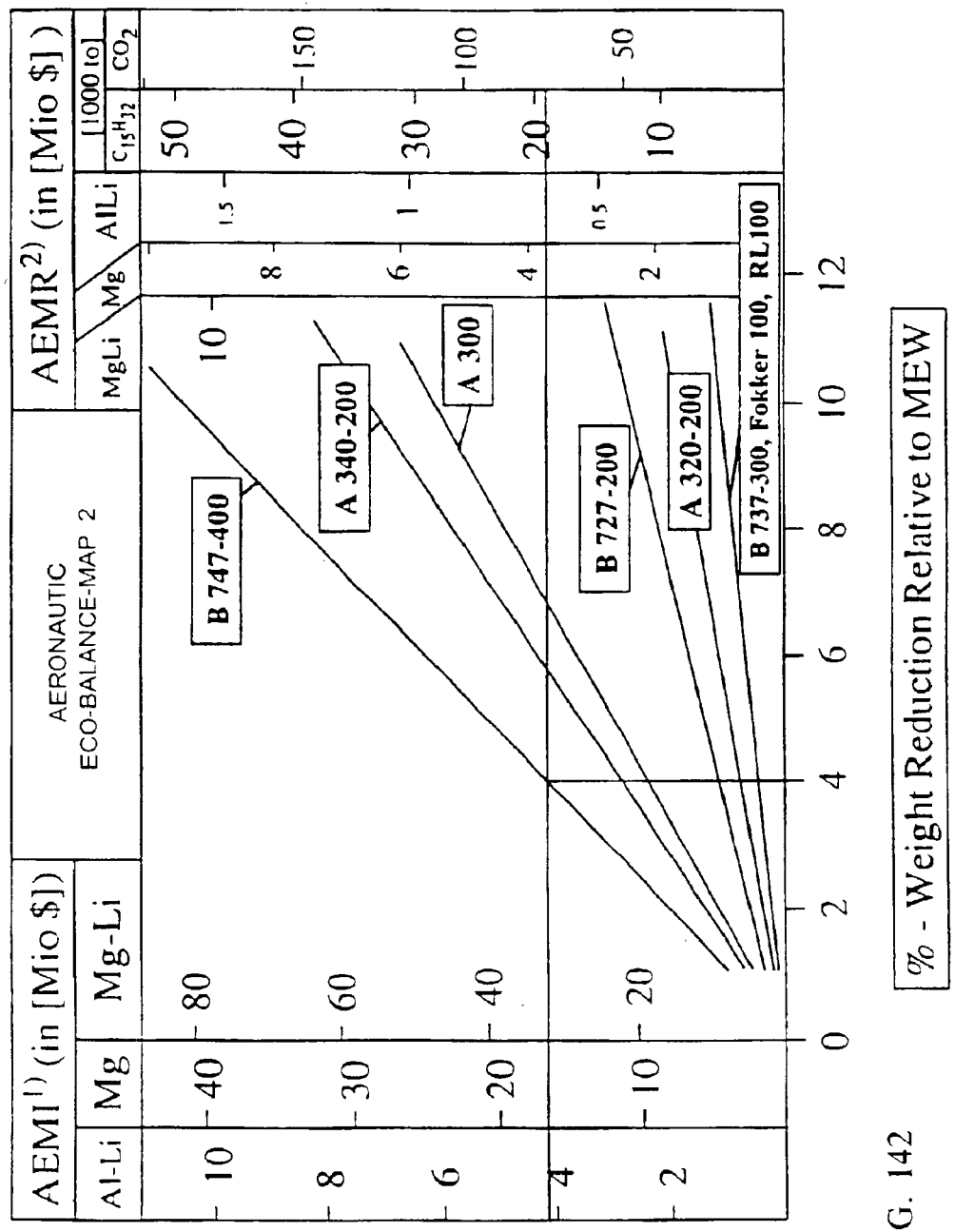

FIG. 142 Universal diagram to employ economical and ecological balances on investments in advanced magnesium and Al—Ll alloys to replace high-strength conventional Al-7000 type of alloy in aeronautical applications.

Figure 143:
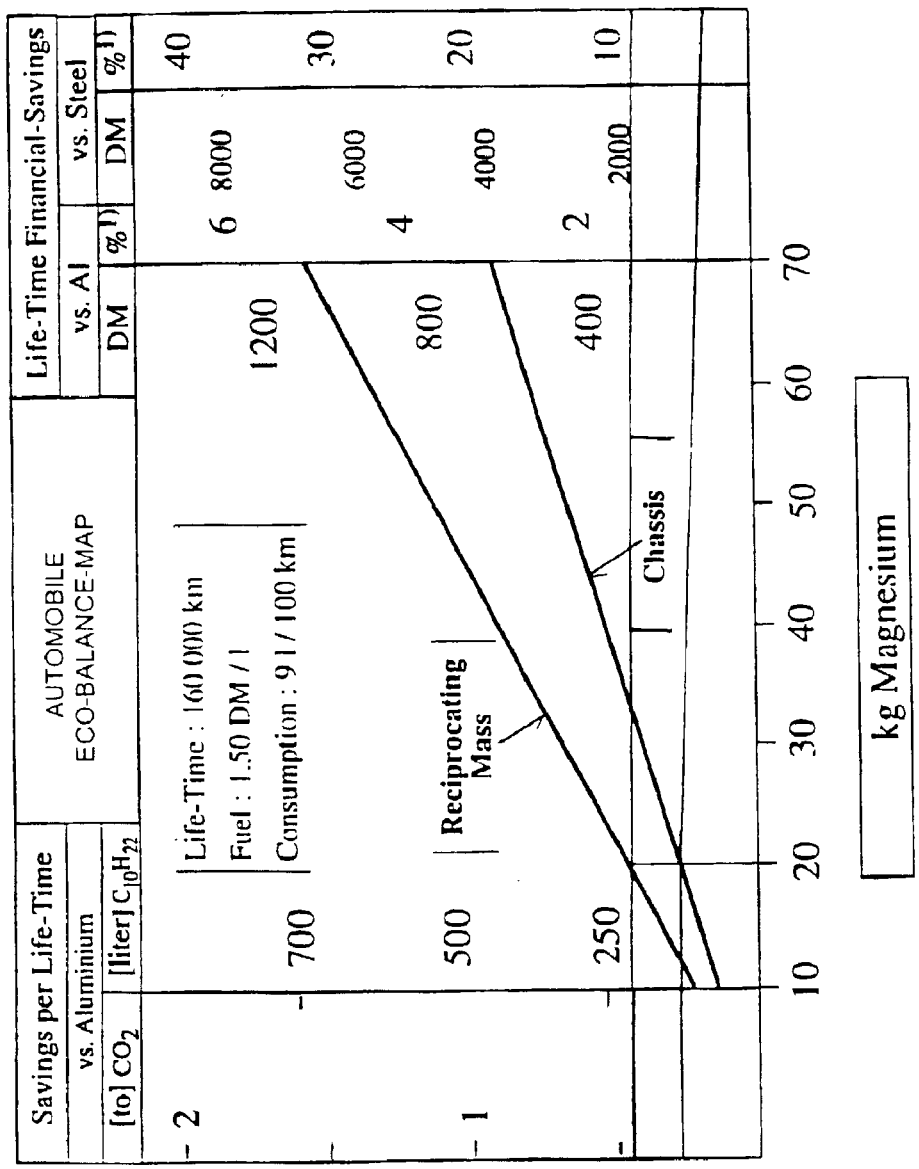

FIG. 143 Effect of magnesium on life time fuel savings and resultant reduction of fuel costs and $CO_2$-emission.

Figure 144:
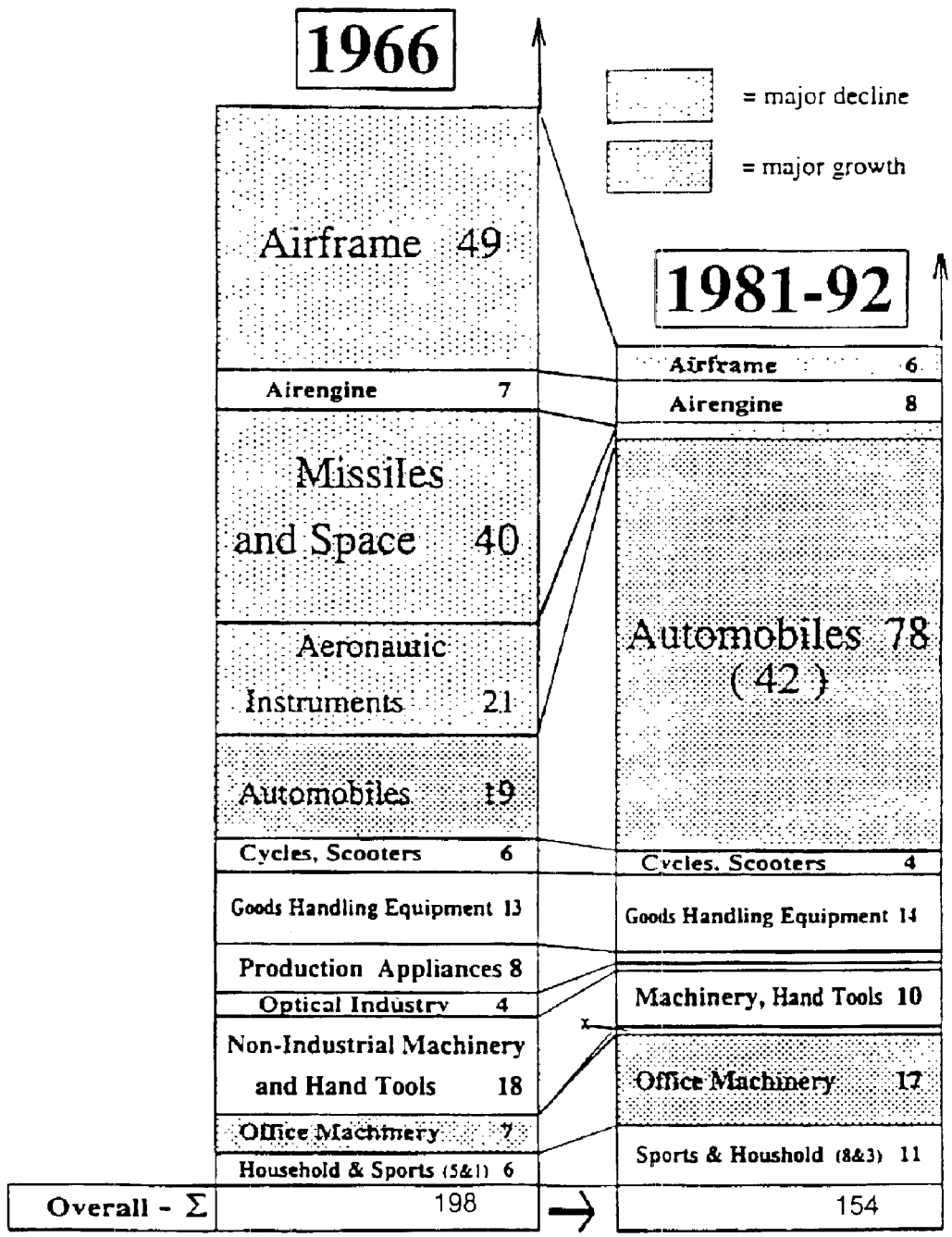

FIG. 144 Different structural magnesium based products reported in 1966 (left column) and in the period from 1981–1992 (right).

DETAILED DESCRIPTION

Part I of the Invention: Alloy Structure and Composition and Processing Thereof

1. Corrosion Behavior upon Immersion in Aqueous Solutions of the Extended Solid Solution (TSSE) of Light Rare Earth and of Transition and Simple Metals and of Metalloids in cph-Mg A marked improvement in corrosion resistance of these alloys was obtained in comparison to prior art magnesium alloys containing alloying elements such as aluminum, yttrium, other transition metals such as manganese and simple metals such as zinc by using standardized test conditions and in comparison to experimental alloys containing corresponding equilibrium microstructures consisting of dendritic growth with relatively large volume fractions of microsegregations delineating corresponding cell or grain boundaries.

A first series of the claimed alloys was made by piston-and-anvil (PA) splat cooling in an argon atmosphere using a pressure of 5 bar to pneumatically accelerate the moving piston (cf. H. Gronert, *Dipl. Thesis*, University of Duisburg, 1984). A number of advantages are offered by PA-splat cooling compared to continuous production methods currently available for the development of passive magnesium alloys. Unlike for non-consolidated vapor deposited solid solutions made by low temperature thermal evaporation (cf. D. J. Bray, R. W. Gardiner, B. W. Viney and H. M. Flower, Conf. Proc. *Magnesium Alloys and Their Applications*, DGM, Oberursel, FRG, 1992 (i.e. as for as-filed ref 14 instead 11), pp. 159–166; D. J. Bray, R. W. Gardiner and B. W. Viney, GB-Patent 2,262,539 A, 23 Jun., 1993) and sputtering, PA-splats have the advantage to represent fully dense material without the porosity entrapped upon vapor deposition (see below) or conventional casting due to the high impact pressure of the moving piston(s) (hammer) providing conditions which render this technique superior to pressure die-casting in order to assess small quantities on a short time scale basis. Another advantage of PA-splats is to provide sufficient equidistant 2-dimensional length scale in order to prepare standard samples of 20 mm*20 mm or of diameter about 30 mm which is not readily available by melt-spinning, for example. An equidistant 2-dim length scale is important to avoid non-reproducible gradients in surface potential (D. Remppel, *Doctoral Thesis, Fachbereich Chemie, University of Stuttgart*, FRG, 1987). The feathered rim of PA-splats (cf. FIGS. 1–5) was cut off to assure reproducibility.

Figure 1:
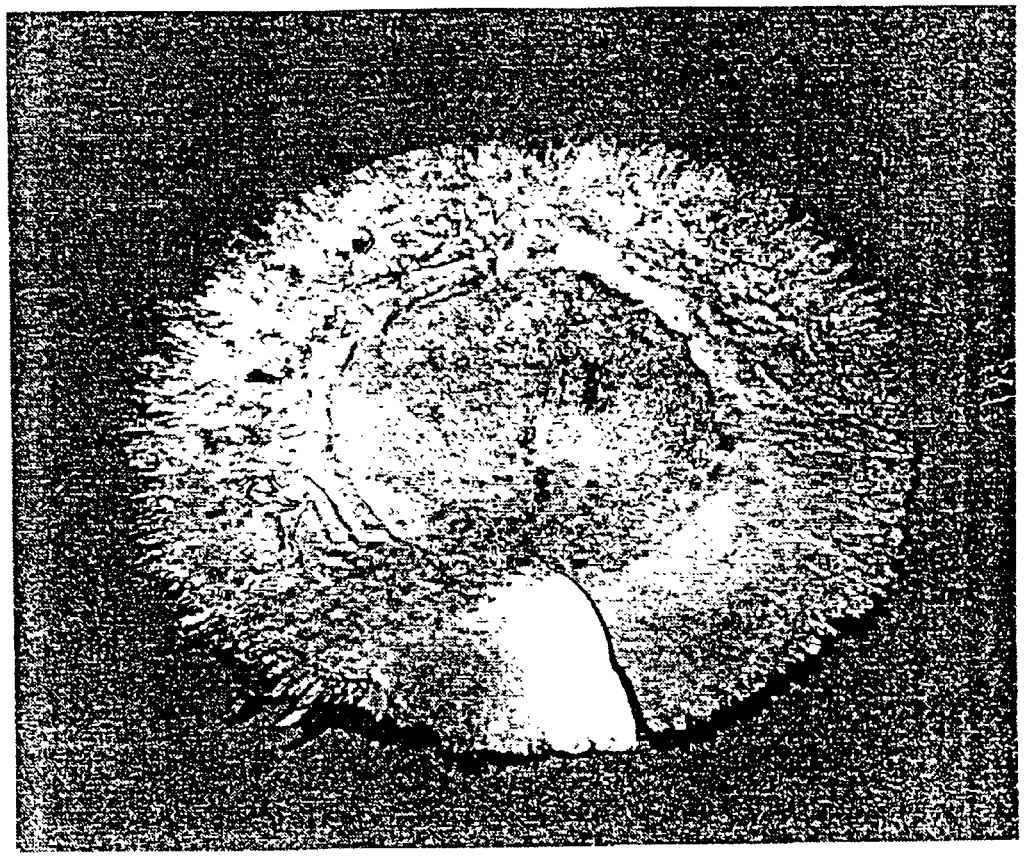
FIG. 1 (Color photograph) Piston-and-anvil (PA) Mg-5 wt. % Si splat after eight years exposure to inland atmosphere.
Figure 3:
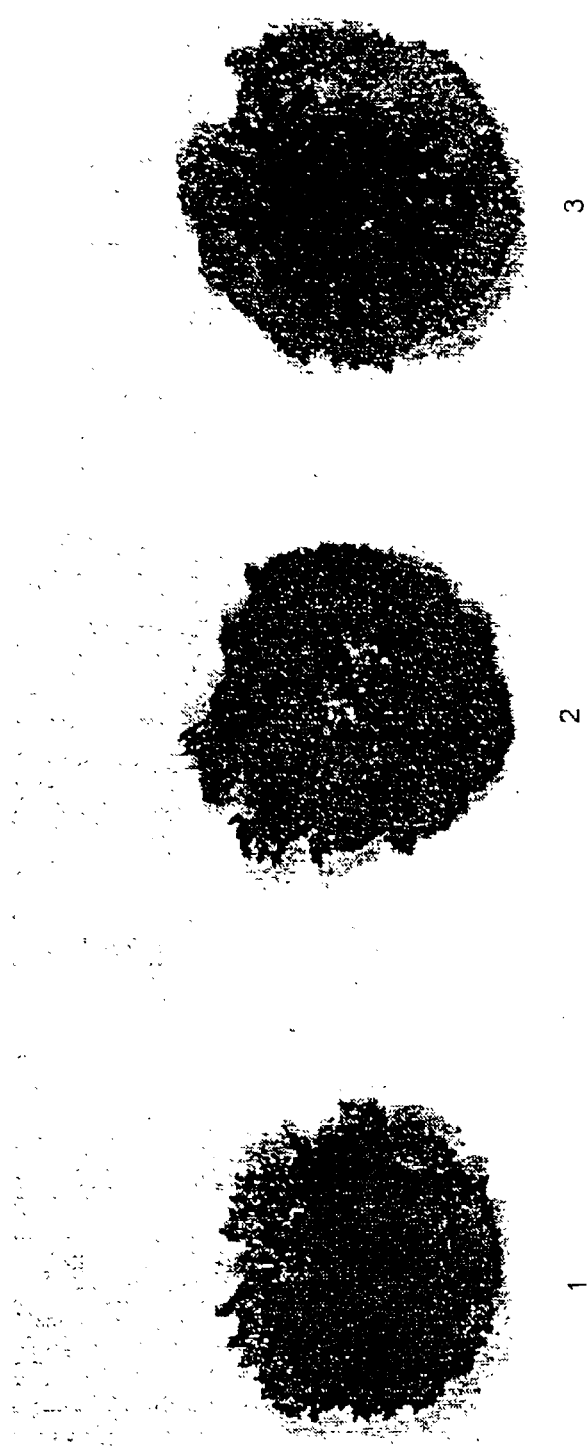
FIG. 3 Piston-and-anvil (PA) Mg-4.7 wt. % Gd splats, here side with segregated dendritic zone, after eight years exposure to an aerated inland atmosphere.
Figure 4:
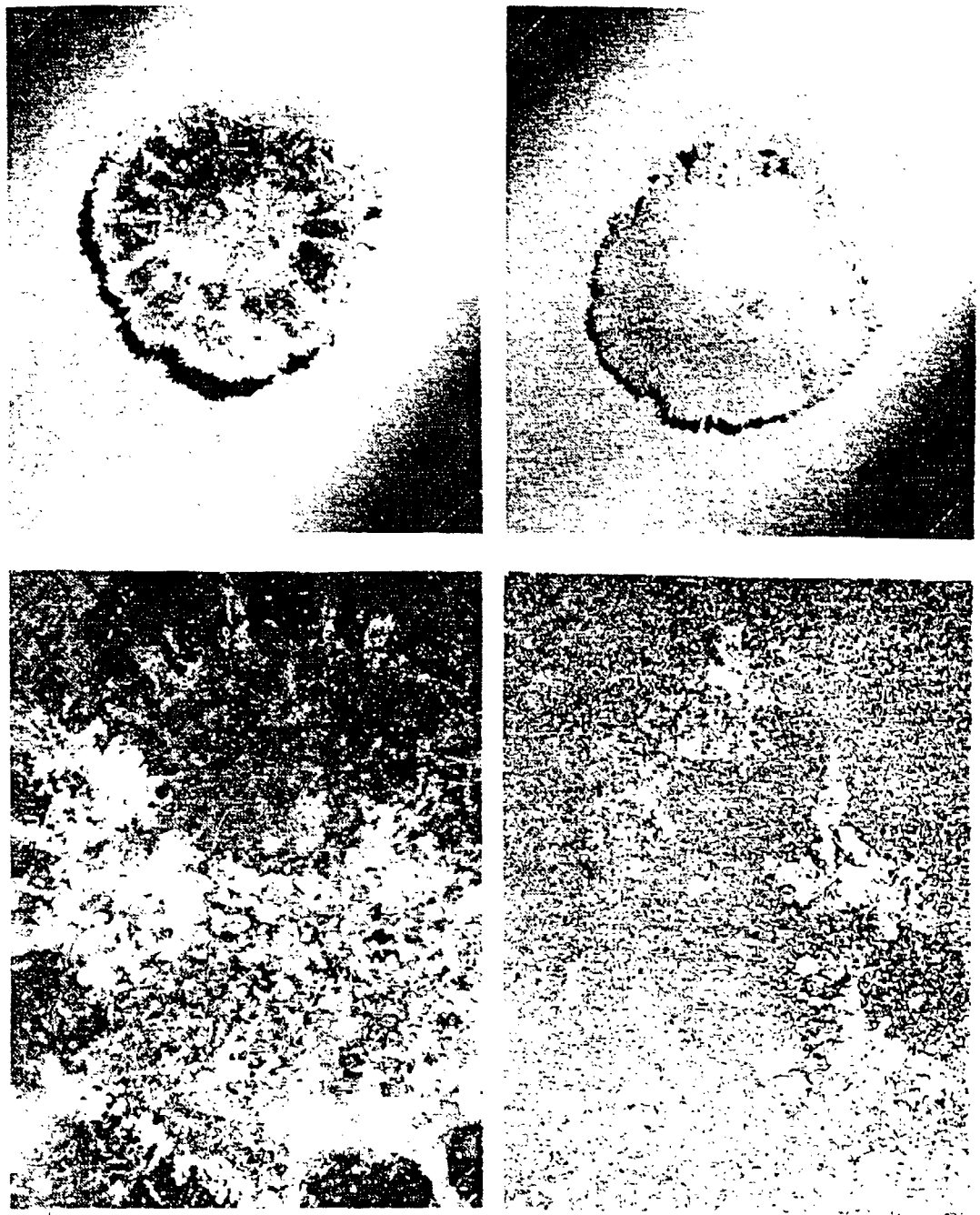
FIG. 4 Piston-and-anvil (PA) Mg-4.7 wt. % Gd splats after eight years exposure to an aerated inland atmosphere with virtually no degradation of the metallic surface film and (right hand side) with uniform corrosive attack for the dendritic zone.
Figure 5:
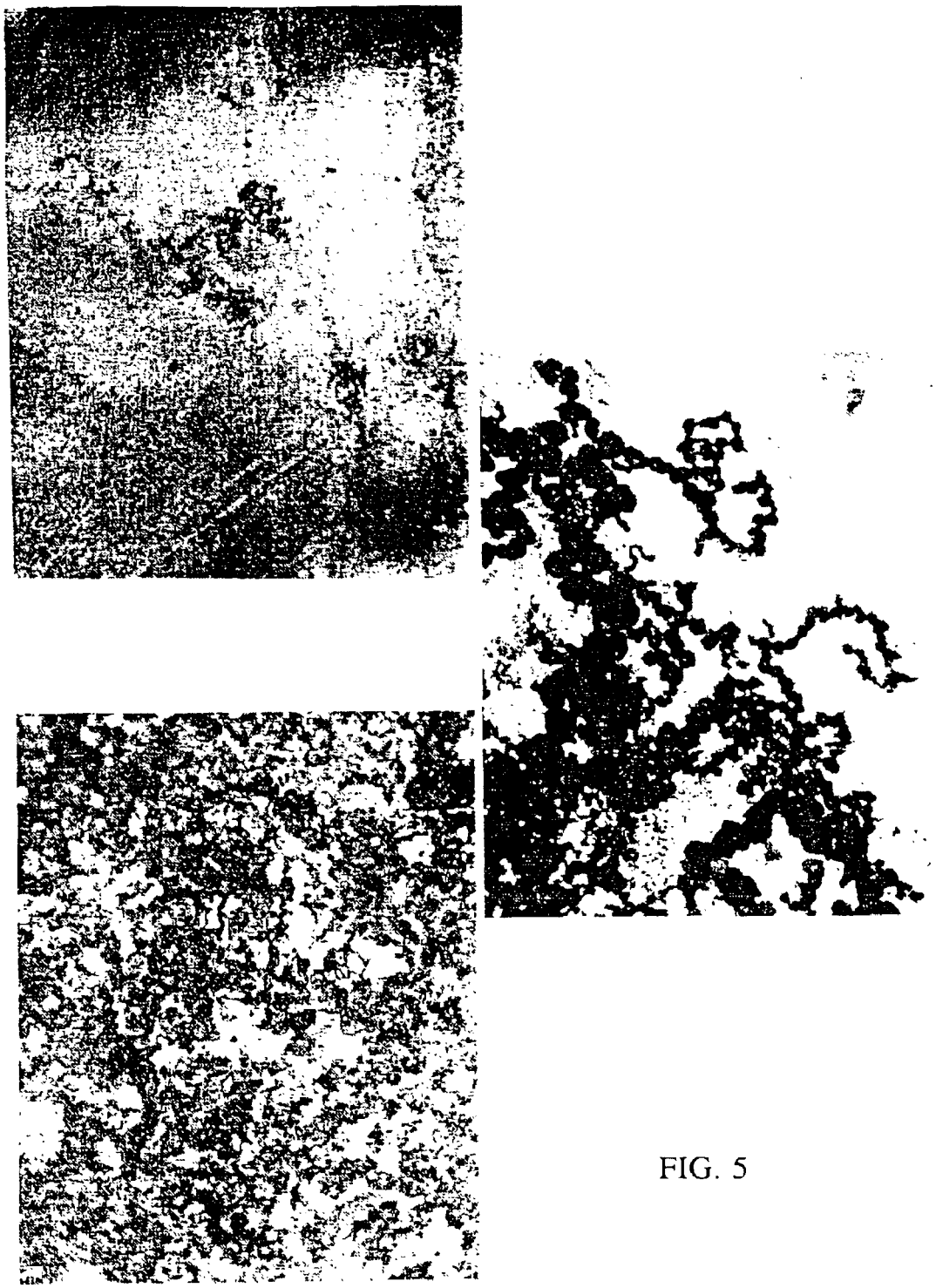
FIG. 5 Non-attacked supersaturated zone (top, left hand side), and an attack resulting from uncontrolled fluid flow (center, right) and uniform attack for dendritic growth (bottom, left).

FIG. 1 is a color photograph at a magnification of 1.5:1 and shows a piston-and-anvil (PA) Mg-5 wt. % Si splat after eight years exposure to inland atmosphere with a metallic shiny, pinkish-to-bluish surface film at bottom representing the (nearly) partitionless surface zone of corresponding extended solid solution of 5 wt. % Si in cph-Mg. Worse contact between molten alloy droplet and chill has resulted in microsegregations and resulting silver-to-dark surface as is represented by the remainder of the splat surface. Note that the feathered rim of this PA-type of splats was removed prior to immersion tests of which the results are shown in the following figures. FIG. 2 shows a piston-and-anvil (PA) Mg-4.7 wt. % Gd splats after eight years exposure to an aerated inland atmosphere, here an essentially supersaturated solid solution as indicated by silver shiny metallic glamour coexisting with corroded interior (splat no 2) and corroded circumference (splat no 1-3). FIG. 3 exhibits a piston-and-anvil (PA) Mg-4.7 wt. % Gd splats after eight years exposure to an aerated inland atmosphere, here the side with essentially the segregated dendritic zone resulting from uncontrolled fluid flow as indicated by the corrosive attack of splats no 1 and 2. For splat no 3 corresponding segregation-free supersaturated zone (see FIG. 2) traverses the entire cross-section. FIG. 4 shows a piston-and-anvil (PA) Mg-4.7 wt. % Gd splats after eight years exposure to an aerated inland atmosphere, here with a more close look-up of the surface of the columnar featureless zone of the microstructure (left hand side) with virtually no degradation of the metallic surface film and of the dendritic segregated zone of the microstructure (right hand side) with uniform distribution of corrosive attack. Magnification is 2:1 (top) and 5:1 (bottom). FIG. 5 is as for FIG. 4, here showing non-attacked supersaturated zone (top, left hand side), and an attack due to segregation inside the supersaturated zone resulting from uncontrolled fluid flow (center, right) and uniform attack in segregated zone where dendritic growth occurred due to recalescence (bottom, left). All magnifications: 37.5:1.

Figure 9:
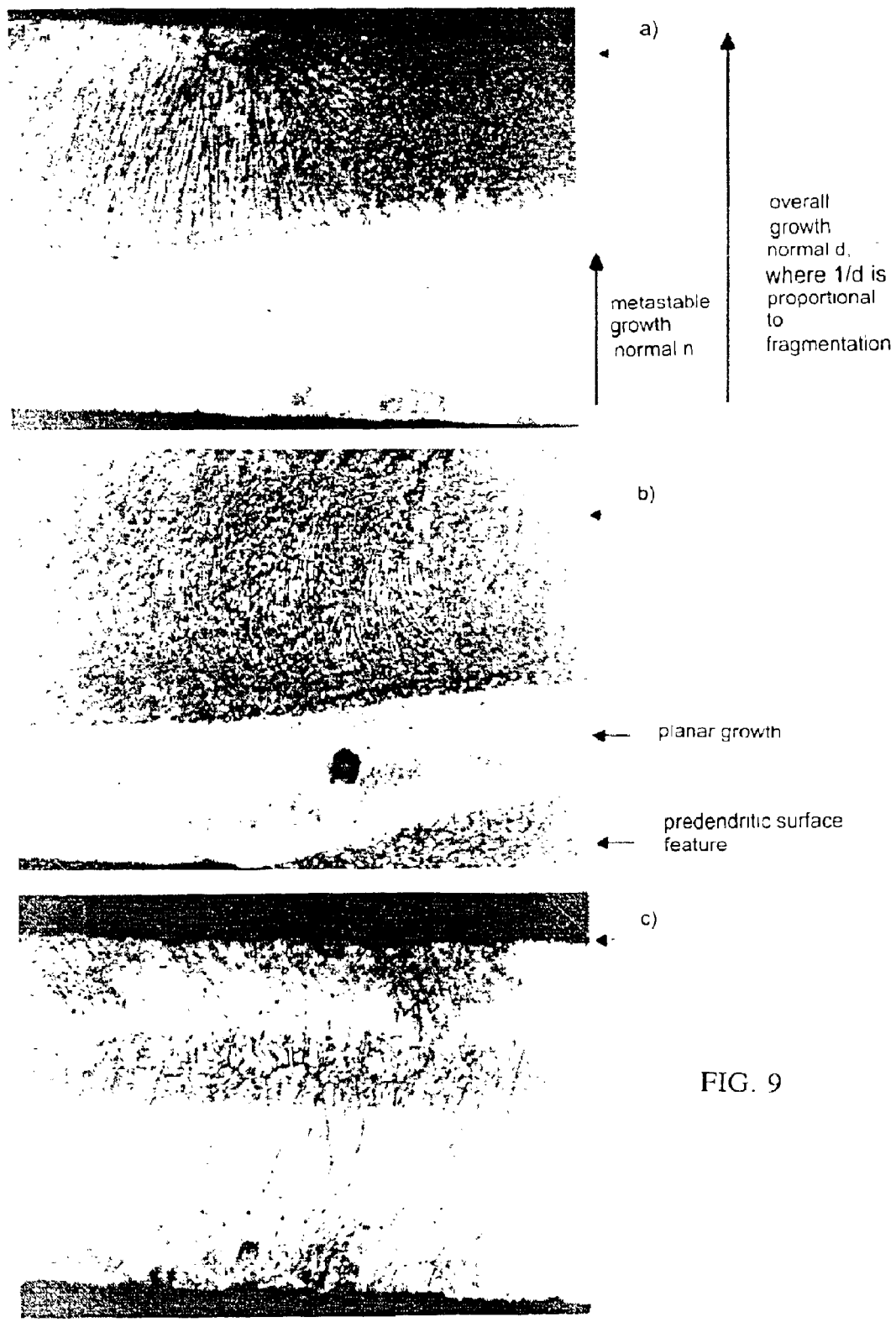
FIG. 9 Transverse cross-section of PA Mg-2.2 wt. % Ce splats.
Figure 10:
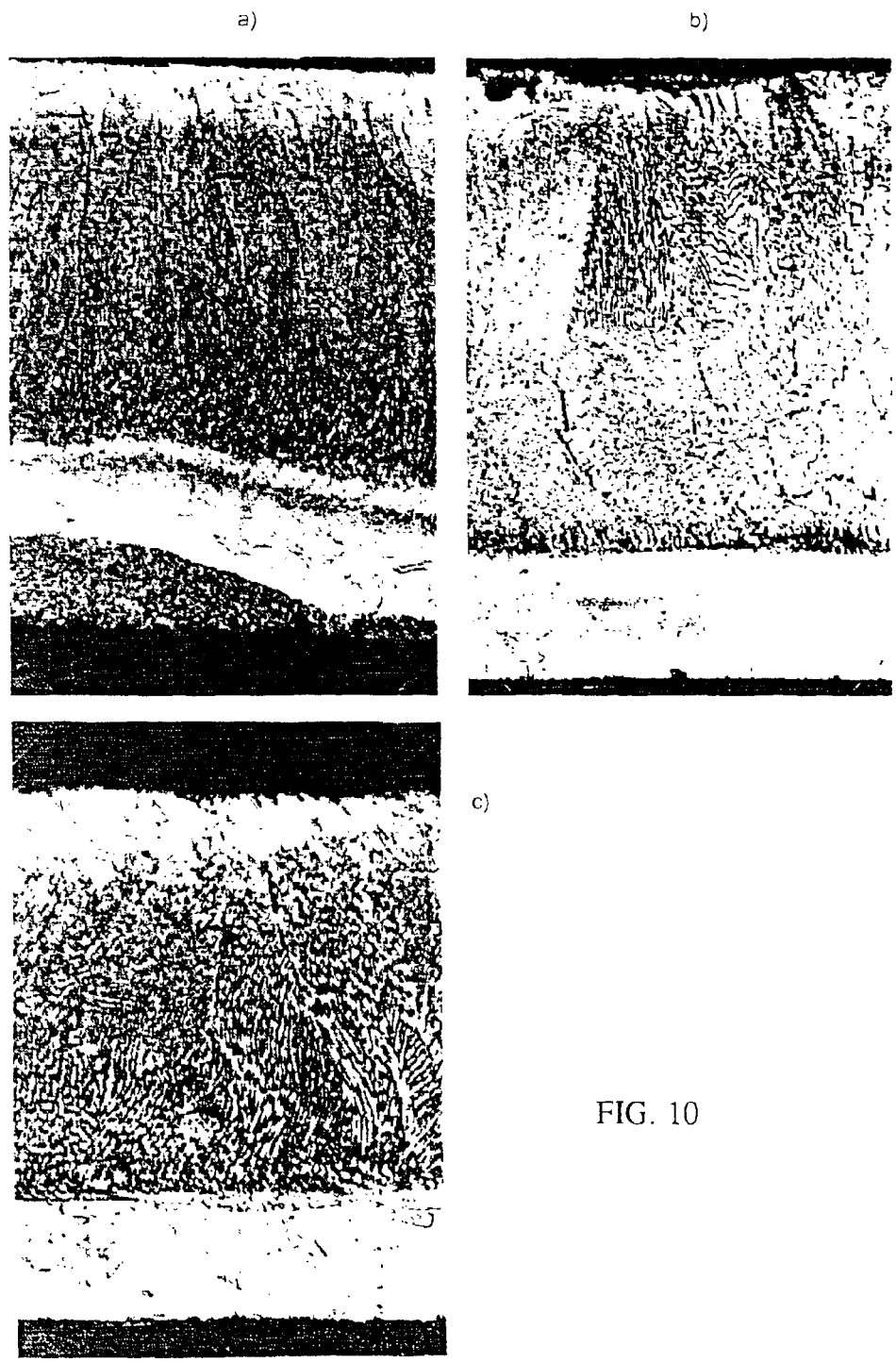
FIG. 10 As for FIG. 9, here with a) 4.2 wt. % Ce, b) 6.2 wt. % Ce, c) 9.0 wt. % Nd.

Examples of the microstructure of the transverse cross-section of such splats mounted edge-on are shown in FIGS. 8–10. Typical for the resulting PA-splats is a two-zone microstructure with a strikingly sharp transition from featureless or nearly featureless planar or nearly featureless columnar growth to a zone of segregated dendritic or cellular growth (FIGS. 8–10). FIG. 8 shows (at a magnification of 500:1) the transverse cross-section of PA Mg-4.2 wt. % La splats with featureless surface chill zones representing the extended solid solution of La in cph-Mg and which exhibits inertness upon exposure to corrosive attack by the Machu-test. In FIG. 8a this surface chill zone coexists with a columnar dendritic microstructure at the chill-off side, while in FIG. 8b on the left hand side with an equiaxed dendritic microstructure being trapped by two featureless surface chill zones. The transverse cross-section of PA Mg-2.2 wt. % Ce splats in FIG. 9 shows (all at a magnification of 500:1) a), b) featureless growth coexisting with predendrites and columnar dendritic chill-off zone and c featureless columnar growth of which the grain boundaries are decorated with some microsegregation and trapping equiaxed central zone with large proportion of microsegregations. FIG. 10 is as for FIG. 9 (magnification 500:1), here with higher levels of light rare earth metals, i.e. a) 4.2 wt. % Ce, b) 6.2 wt. % Ce, c) 9.0 wt. % Nd in PA Mg-splats.

Figure 6:
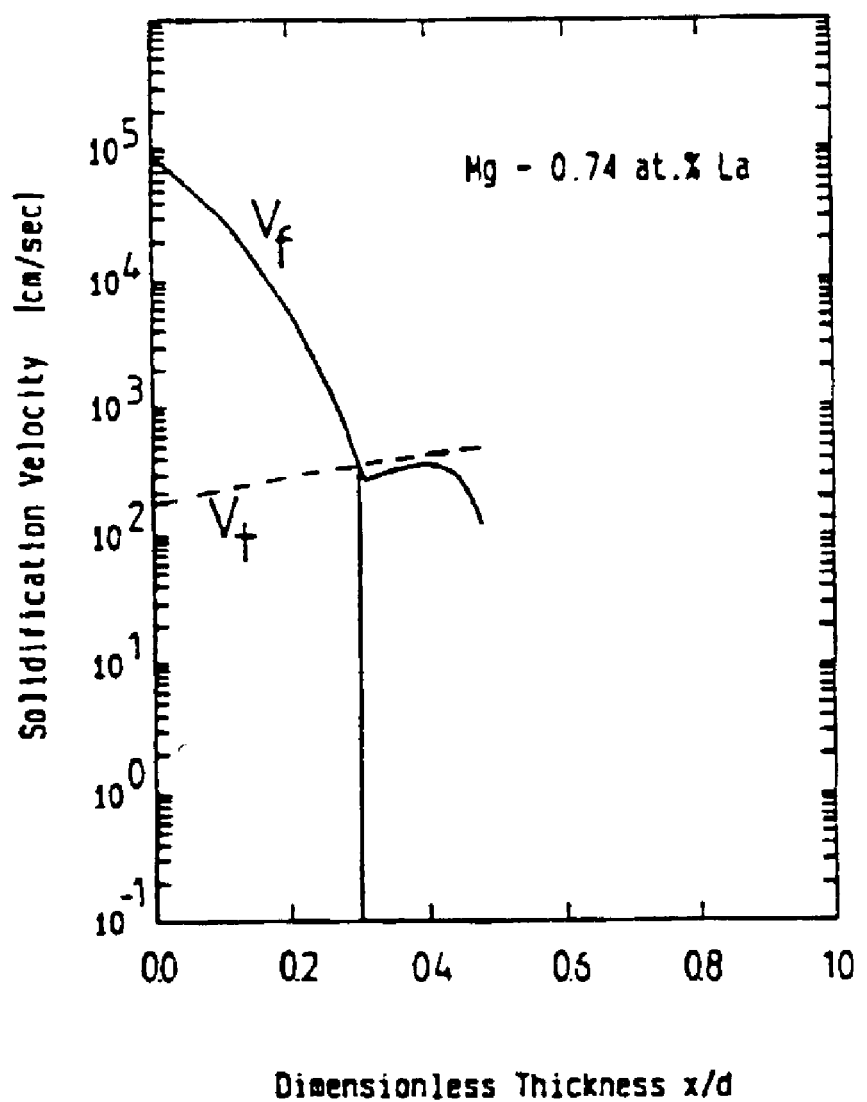
FIG. 6 Recalesced growth front after an initial undercooling of 150 K for Mg-0.74 at. % La-alloy.

Two zone microstructures without columnar growth in the chill zone, but with a planar and sharp transition to a dendritic zone manifest a negative temperature gradient there. The planar growth was therefore controlled by solute trapping (FIG. 6 showing recalesced growth front advancing with $V_f$ after an initial undercooling of 150 K for Mg-0.74 at. % La alloy under adiabatic conditions. The resulting velocity required for solute trapping (i.e. as a function of increasing bath temperature after the onset of growth) is shown by the dashed curve resulting in free dendritic growth for dimensionless cross-sections >0.3 (cf. FIG. 9); N.B. absolute stability would require a positive temperature gradient and would appear as featureless columnar growth in the chill zone). As a result, the featureless chill zones represent a microstructure with a random and entirely homogeneous distribution of the alloying atoms on an atomic length scale as is otherwise only possible by vapor deposition techniques allowing for fragmentation on the level of a single atom (FIG. 7 and below), but in our case here certainly without any porosity similar as upon pressure die casting. All results on the response on natural and artificial aging in the present invention do confirm the homogeneous distribution of alloying elements on an atomic length scale. The two zone microstructure is only available in the center of the PA-splats where the contact between piston (hammer) and melt is best, while reduced thickness toward the rim of the splat results in reduced contact so reduced/less efficient heat transfer and increased microsegregations there.

Figure 7:
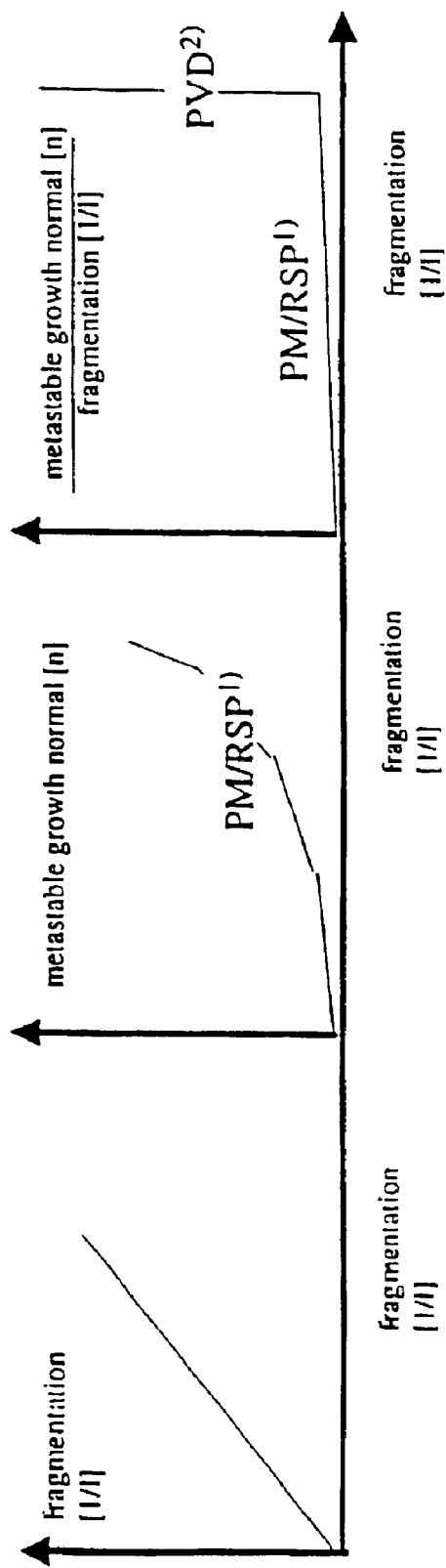
FIG. 7 Schematic on efficiency of rapid solidification showing a drastic increase in efficiency for critical fragmentation.

FIG. 7 is a schematic on the efficiency of rapid solidification showing a drastic increase in the efficiency of rapid solidification processing in the range of critical fragmentation. PM/RSP[21]: property-sensitive fragmentation range limiting efficiency of advanced processing by the choice of materials, i.e. properties are very sensitive to chemical composition, process control etc. on a basis of a productivity which is usually very lousy. PVD[21]: productivity-sensitive fragmentation range which is immediately sensitive to productivity and quality of process on the basis of inherently best materials properties, where the efficiency of RSP-processing is primarily a question of design and performance of the PVD-process itself. Subsequent in-situ consolidation provides protection against contamination of the otherwise relatively unlimited surface area of the deposit and evaporated powder, respectively, by oxidization, inclusions due to processing etc. Therefore, any evaporation process for reactive and/or light metals and/or for pure, high performance aerospace applications requires vapor deposition by using a continuously chilled collector unit changing the materials property issue of advanced processing into a productivity-quality issue. Predendritic surface features coexisting with the featureless zone were also observed (cf. FIGS. 9c and 10a). They can result from uncontrolled fluid flow upon "splatting" resulting in less stringent heat extraction and forming a circle of circular islands of microsegregations on solidification which are finer than the microsegregations in the dendritic chill-off zone as indicated by optically not resolvable dendritic interspacings. Predenritic features became macroscopically evident by etching the PA-splat surface with hydroflouric (HF) and phosphate ($H_3PO_4$) acids resulting in dark discs of diameter 1–2 mm around the central PA-splat portion, i.e. corresponding surface oxide appeared optically dark compared to the metallic shiny solid solution (cf. FIG. 11a). These islands may have resulted in early pitting upon potentiodynamic polarization despite the up to 3 orders of magnitude lower corrosion rates of the featureless zone of PA Mg—La and PA Mg—Ce splats compared to prior art alloys and corresponding segregated zones (cf. FIGS. 8–10; N.B. PA-splat fragments of size 10 mm*10 mm were used in F. Hehmann, R. G. J. Edyvean, H. Jones and F. Sommer, Effect of Rapid Solidification Processing on Corrodability of Magnesium Alloys, *Conf Proc. PM Aerospace Materials '87*, eds. B. Williams and G. Dowson, Met. Powder Report Publishing Services, Shrewsbury, England, p. 46/1; F. Hehmann, 'Rasch Erstarrte Magnesium-Mischkristalle und Ihr Umwandlungs-und Korrosionsverhalten', *Doctoral Thesis*, University of Stuttgart, published in Fortschrittberichte VDI', Reihe 5, No 155: Grund-und Werkstoffe', VDI-Verlag, Düsseldorf, F. R. G., January 1989). However, even after 8 years of exposure to inland atmosphere (Paris) the segregation-free chill-zones did not show any sign of corrosion, though the neighboring segregated and/or dendritic microstructures showed white, gray and black corrosion products as was expected for pure magnesium after such a long time exposure to air (cf. FIGS. 1 to 5 and R. S. Busk, *Magnesium Product Design*, Marcel Dekker, Inc. N.Y. and Basel, 1987). Industrial test conditions for quantification of the earlier observations by Hehmann et al. (F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1; F. Hehmann, H. Jones, F. Sommer and R. G. J. Edyvean, Corrosion Inhibition in Magnesium-Aluminium Based Alloys Induced by Rapid Solidification Processing, *J. Mater. Sci.* 24, 1989, pp. 2369–2379) have to refer to macroscopic corrosion tests, since electrochemical methods overrun quite easily passivation due to the effect of microstructural artefacts resulting in pitting despite improved uniform resistance to corrosion. Initial tests were performed by employing an immersion test developed by Machu (*Angewandte Oberflächentechnik für metallische Werkstoffe*, eds. Harald Simon and Martin Thoma, Carl Hanser Verlag, 1985, p. 302). The test simulates the conditions of a salt spray test (5% NaCl at 35° C.) by reducing the required time interval from 300 hrs of the spray test down to 16 hrs for the immersion test by employing a solution of 5 wt. % sodium-chloride (NaCl) together with the addition of 1 wt. % hydrogen-peroxide ($H_2O_2$) solution (30 wt. %) added to this solution at 23° C. One modification of this immersion test is the DIN 50947 test developed for Al-based alloys. Another modification was developed by AHC Oberflächentechnik (see AHC-Oberfläche, AHC-brochure for corrosion tests, AHC-Oberflächentechnik, Friebe & Reininghaus GmbH, Kerpen, FRG, p. 111, priv. communication, March 1986.) which employs 5% of the $H_2O_2$-solution (30 wt. %) and 1 wt. % NaCl. The test provides a relatively aggressive medium and is used (see *Angewandte Oberflächentechnik für metallische Werkstoffe*, eds. Harald Simon and Martin Thoma, Carl Hanser Verlag, 1985, p. 302) to reduce the standardized interval of 16 hrs time to an interval of 2 hrs time. The test is particularly useful to simulate the corrosion behavior on long-term salt spray tests such as after ASTM B 117 which uses only the NaCl-addition. The test is applicable to Mg-based alloys and was used for the piston-and-anvil splats of the claimed alloys and on reference casting alloy AZ91.

Macroscopic surface attack was recorded optically after 0.5, 1, 2 and 3 hours immersion into a solution n of 5% $H_2O_2$ (30 wt. %) and 1 wt. % NaCl. Supersaturation of the metallic shiny surface zone was confirmed by X-ray diffraction showing a pair of each (hkl)-reflection corresponding to either the equilibrium cph-Mg solid solution or to corresponding supersaturated solid solution (cf. F. Hehmann, Rasch Erstarrte Magnesium-Mischkristalle und Ihr Umwandlungs-und Korrosionsverhalten, *Doctoral Thesis*, University of Stuttgart, published in Fortschrittberichte VDI', Reihe 5, No 155: Grund-und Werkstoffe', VDI-Verlag, Düsseldorf, F. R. G., January 1989; F. Hehmann, F. Sommer and H. Jones, Extension of Solid Solubility of Yttrium and Rare Earth Metals in Magnesium by Rapid Solidification, *Processing of Structural Metals by Rapid Solidification*, eds. F. H. Froes and S. J. Savage, American Society for Metals, Metals Park, Ohio, 1987, pp. 379–398; F. Hehmann, F. Sommer and B. Predel, Extension of Solid Solubility in Magnesium by Rapid Solidification, Mat. Sci. Engng. A125 (2), 1990, pp. 249–265). Results of the AHC-modified immersion test are shown in FIGS. 11–19 and they are summarized graphically in FIGS. 20–22.

Figure 11:
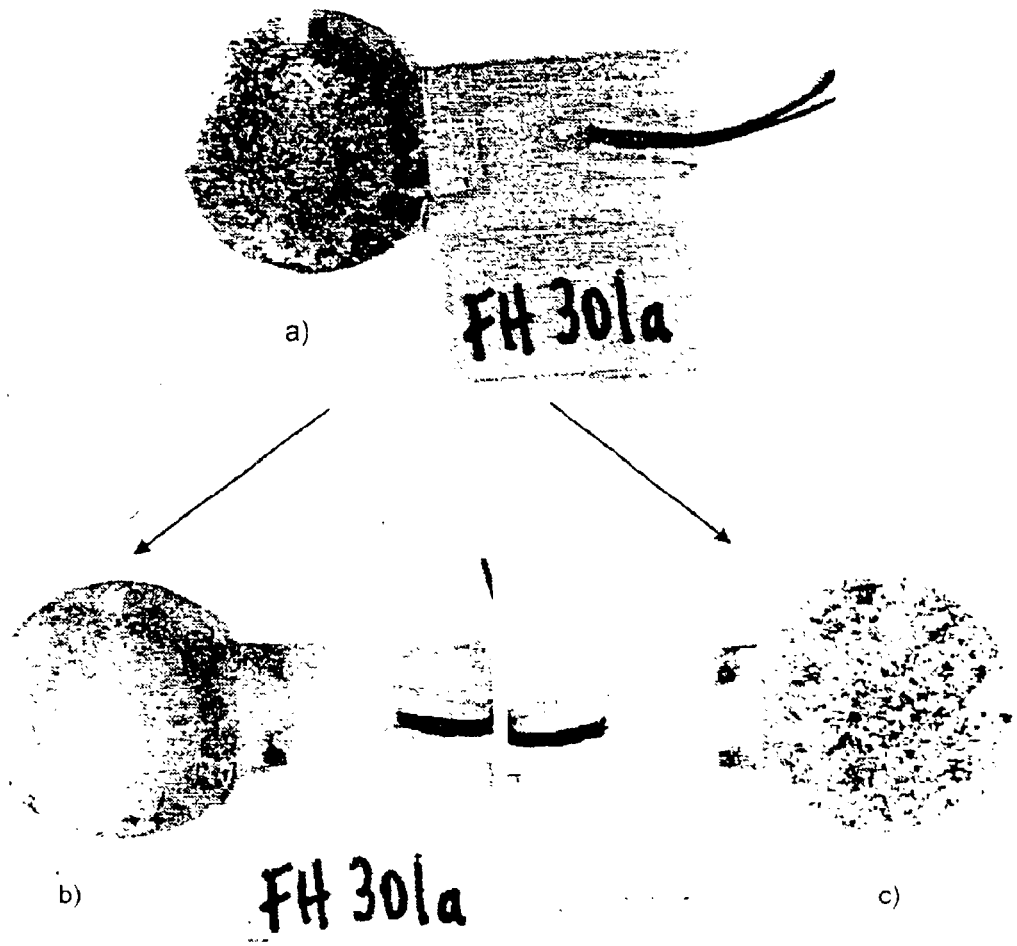
FIG. 11 PA Mg-4.2 wt. % La a) prior to and b), c) after 2 h immersion in 5% (0.3 $H_2O_2$)–1% NaCl aqueous solution.
Figure 12:
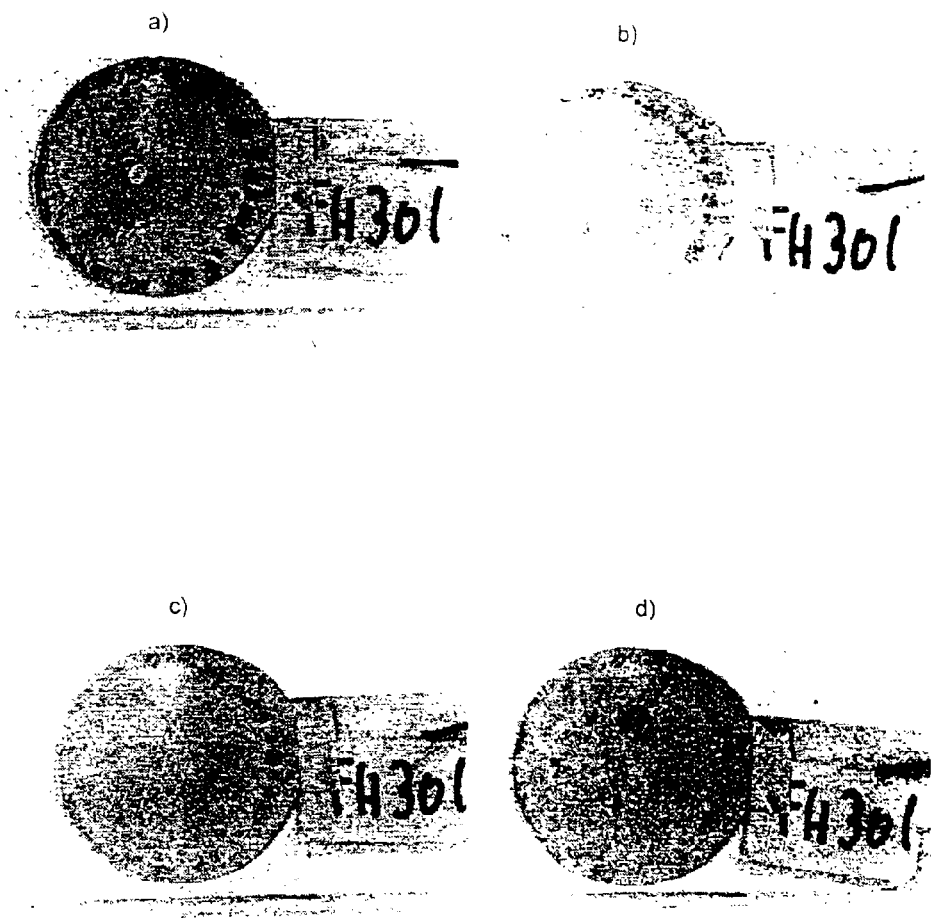
FIG. 12 PA Mg-2.2 wt. % La splat a) after HF-activation, but prior to the Machu-test and after b) 0.5 h, c) 1 h and d) after 3 h immersion in 5% (0.3 $H_2O_2$)–1% NaCl aqueous solution.

The supersaturated featureless surface (cf. FIGS. 8–10) of as-solidified PA Mg-splats with 2.2 and 4.2 wt. % La showed less than 5% of attacked surface area (FIGS. 11 and 12 with FIG. 11 showing PA Mg-4.2 wt. % La a) prior to and b), c) after 2 h immersion in 5% (0.3 $H_2O_2$)–1% NaCl aqueous solution as to the modified Machu-test with a) and b) the side of the featureless surface chill zone. While this side remained silver shiny after 2 h, the dendritic chill-off zone was entirely obscured by a powder-like corrosion product (see c)). The feathered rim of the splat (cf. FIGS. 1 to 3) was removed prior to immersion; and FIG. 12 showing a PA Mg-2.2 wt. % La splat a) after HF-activation, but prior to the Machu-test and after b) 0.5 h, c) 1 h and d) after 3 h immersion in 5% (0.3 $H_2O_2$)–1% NaCl aqueous solution as to the modified Machu-test, here with the side of the featureless surface chill zone remaining silver shiny after 1 h and virtually non-attacked after 3 h immersion. Corrosive attack started at rim and at 4 small sites in the central portion of the PA-splat. This was a smaller surface area fraction than the surface area of predendritic surface islands (about 15%) coexisting with the featureless surface zone. The surface glamour of the featureless chill-zone was hardly attacked after the modified Machu-test employed). By contrast, the surface of the microsegregated dendritic chill-off side of PA-Mg splats with 2.2 to 6.9 wt. % La showed vigorous corrosive attack for 100% of the surface after 2 hrs immersion (FIGS. 11 and 12). By contrast, predendritic features did not show corrosive attack indicating that the size, composition and/or structure of these microsegregations had not passed the critical conditions to trigger corrosion under the above conditions.

Figure 14:
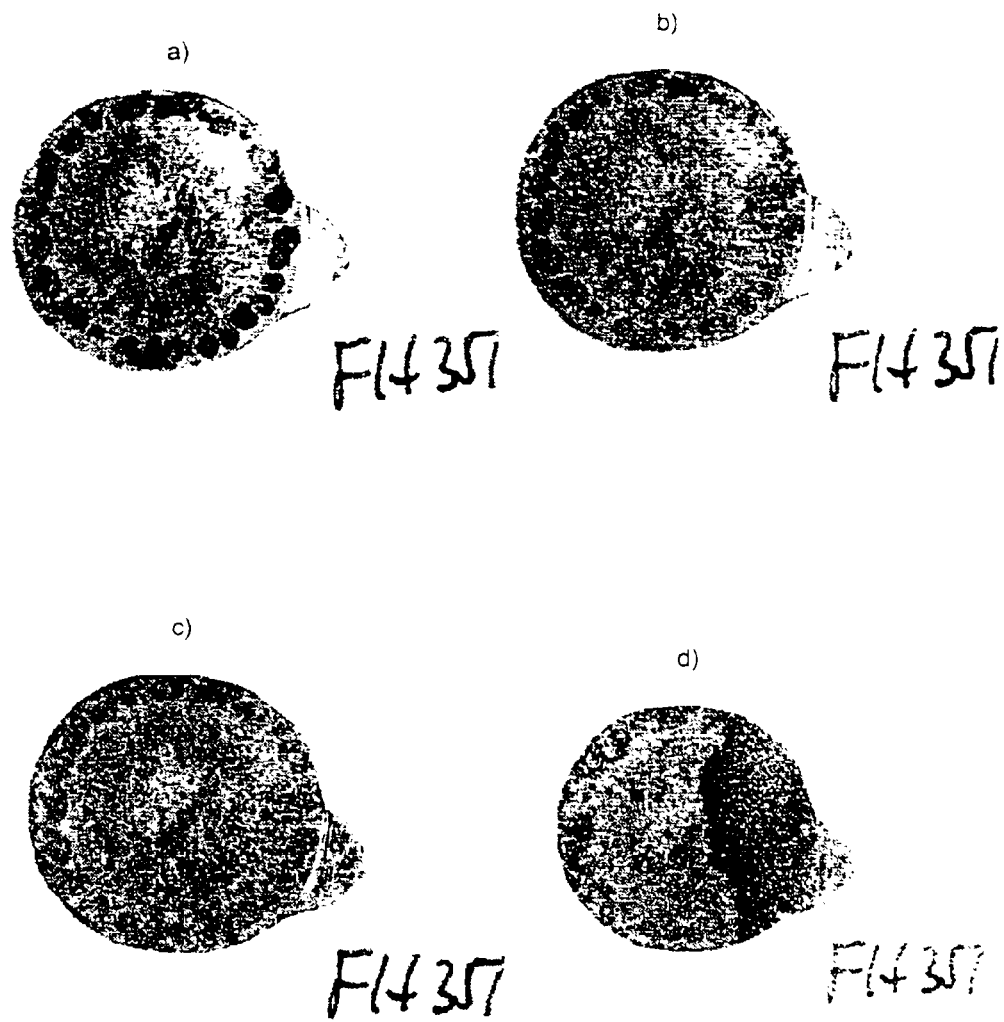
FIG. 14 PA Mg-2.2 wt. % La splat heat treated for 1 h at 400° C. and then a) HF activated and prior to immersion and b) immersed for 0.5, c) for 1 and d) for 3 h in 5% (0.3 $H_2O_2$)–1% NaCl aqueous solution.

A heat treatment for 1 h at 400° C. ensured the nucleation of La-containing precipitates from the supersaturated solid solution of La in αMg without resulting in excessive growth and/or coarsening of this particular type of precipitation (cf. DSC-part below). This heat treatment increased the observable attack of the primarily featureless surface zone from <5% to about 35%, while the heat treatment was not observed to affect the corrosion behavior of the dendritic zone (cf. FIGS. 13 and 14, showing in FIG. 13 a PA Mg-4.2 wt. % La splat heat treated for 1 h at 400° C. and then immersed for 2 h in 5% (0.3 $H_2O_2$)–1% NaCl aqueous solution as to the modified Machu-test with a) the side of the featureless surface chill zone and b) the side of the dendritic chill-off zone. While the attack in a) was limited to about 20% of the exposed surface area starting off at rim of the splat there, corrosive attack obscured nearly 100% of the chill-off dendritic zone. FIG. 14 shows a PA Mg-2.2 wt. % La splat heat treated for 1 h at 400° C. and a) then HF-activated prior to immersion and b) immersed for 0.5, c) for 1 and d) for 3 h in 5% (0.3 $H_2O_2$)–1% NaCl aqueous solution as to the modified Machu-test, here showing the side of the featureless surface chill zone for which the corrosive attack was triggered at rim of the splat and not by the predendritic surface islands shown in FIG. 14*a*). The corrosive attack was limited to about 30–35 % of the exposed surface area at this side of the splat. The corrosive attack on the heat-treated featureless surface was triggered by the edges of the rim where surface contact was between the supersaturated chill zone and the segregated chill-off zone due to the cut (see above) through the cross-section. Predendritic surface features did not appear to have triggered the surface attack observed on supersaturated featureless surfaces of heat-treated PA Mg—La splats.

Figure 15:
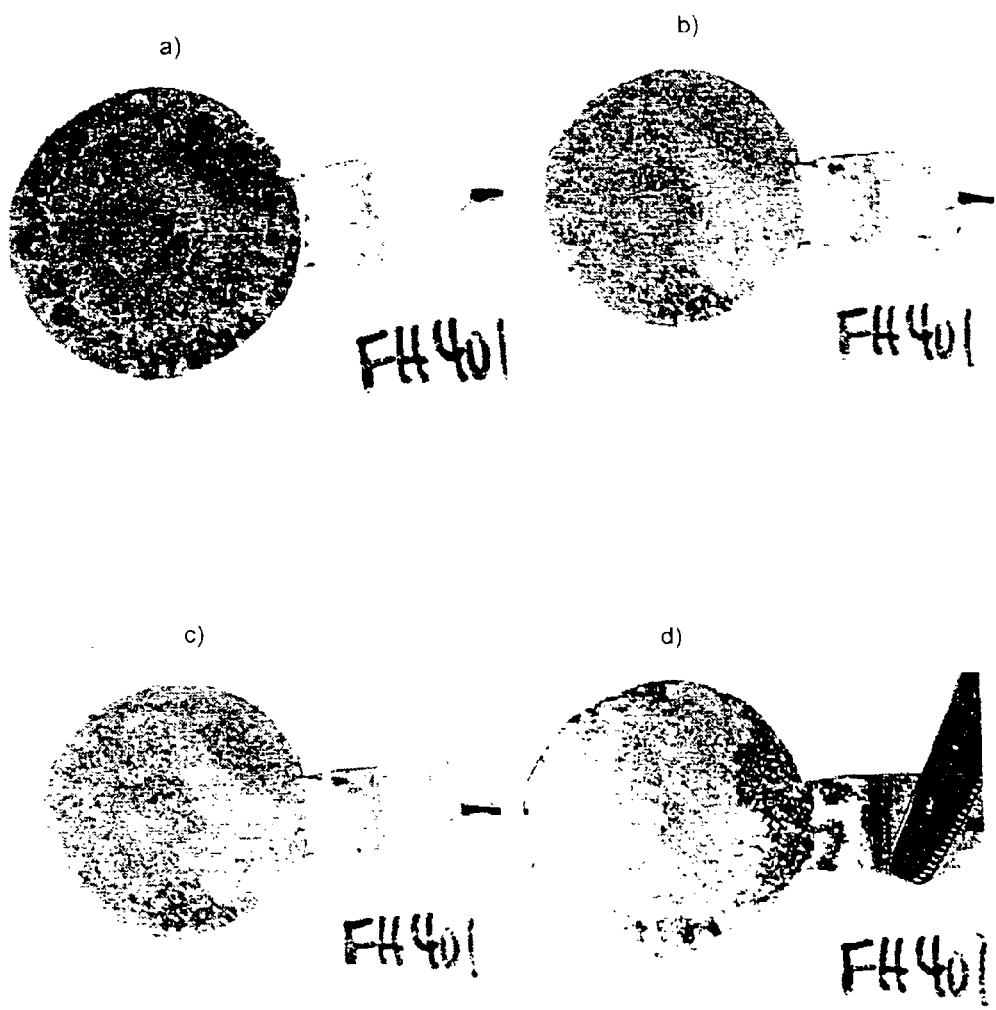
FIG. 15 As-solidified PA Mg-2.2 wt. % Ce splat h after a) HF-activation, but prior to immersion and b) immersed for 0.5, c) for 1 and d) for 3 h in 5% (0.3 $H_2O_2$)–1% NaCl aqueous solution.

The employed PA Mg—Ce splats showed an area fraction of about 20% predendritic surface islands coexisting with corresponding featureless surface zone (FIG. 15 showing as-solidified PA Mg-2.2 wt. % Ce splat h after a) HF-activation, but prior to immersion and b) immersed for 0.5, c) for 1 and d) for 3 h in 5% (0.3 $H_2O_2$)–1% NaCl aqueous solution as to the modified Machu-test, here the side of the featureless surface chill zone with weak corrosive attack starting at rim of the splat and without exceeding 15% of the exposed surface area (cf. FIG. 15a)). The corrosive attack on the supersaturated featureless surface of as-solidified Mg–Ce splats was observed to start off from corresponding rim of the PA-splats (FIGS. 15 and 16). The splats did not show any corrosive attack on the side of the supersaturated featureless chill zone including coexisting predendritic features after 2 hours immersion in the aqueous solution containing 5% $H_2O_2$ (30 wt. %) and 1 wt. % NaCl. If corrosion was not triggered by other regions, the side of as-solidified PA Mg-splats with 2.2 and 6.0 wt. % Ce dominated by featureless growth remained non-attacked (FIGS. 15 and 16, the latter showing as-solidified PA Mg-6.0 wt. % Ce splat a) after HF-activation prior to immersion as and b) after immersion for 3 h in 5% (0.3 $H_2O_2$)–1% NaCl aqueous solution as to the modified Machu-test, here with effect on the side of the featureless surface chill zone for which the corrosive attack was triggered at rim of the splat as well as by the predendritic surface islands coexisting with the featureless chill zone (cf. FIGS. 9a and 9b). The corrosive attack was limited to about 15% of the exposed surface area at this side of the splat). They retained their metallic glamour there even after 3 hours immersion (FIG. 15d). After 3 hrs immersion the attacked overall surface area of the chill side did not exceed 15%. This was more than 5% smaller than the area of the coexisting predendritic features.

Figure 17:
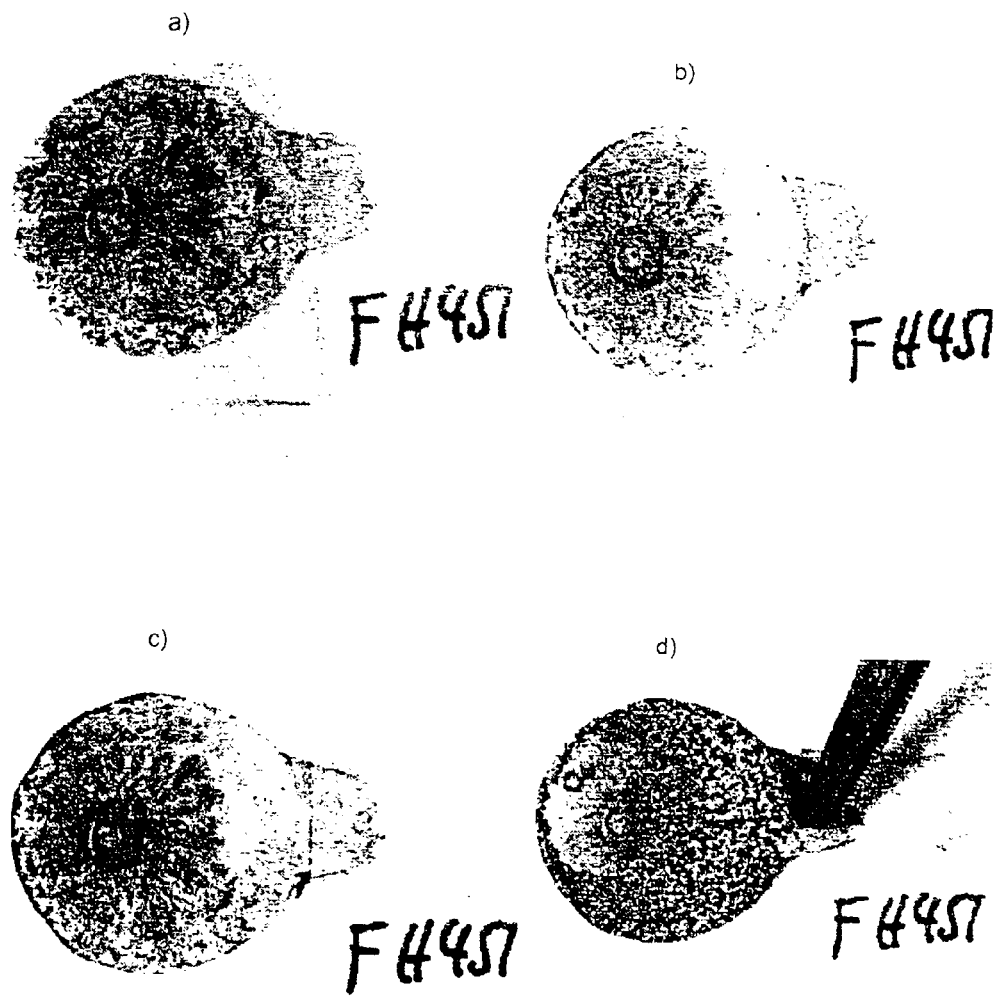
FIG. 17 PA Mg-2.2 wt. % Ce splat heat treated for 1 h at 400° C. and then a) HF-activated and prior to immersion and b) immersed for 0.5, c) for 1 and d) for 3 h in 5% (0.3 $H_2O_2$)–1% NaCl aqueous solution.
Figure 18:
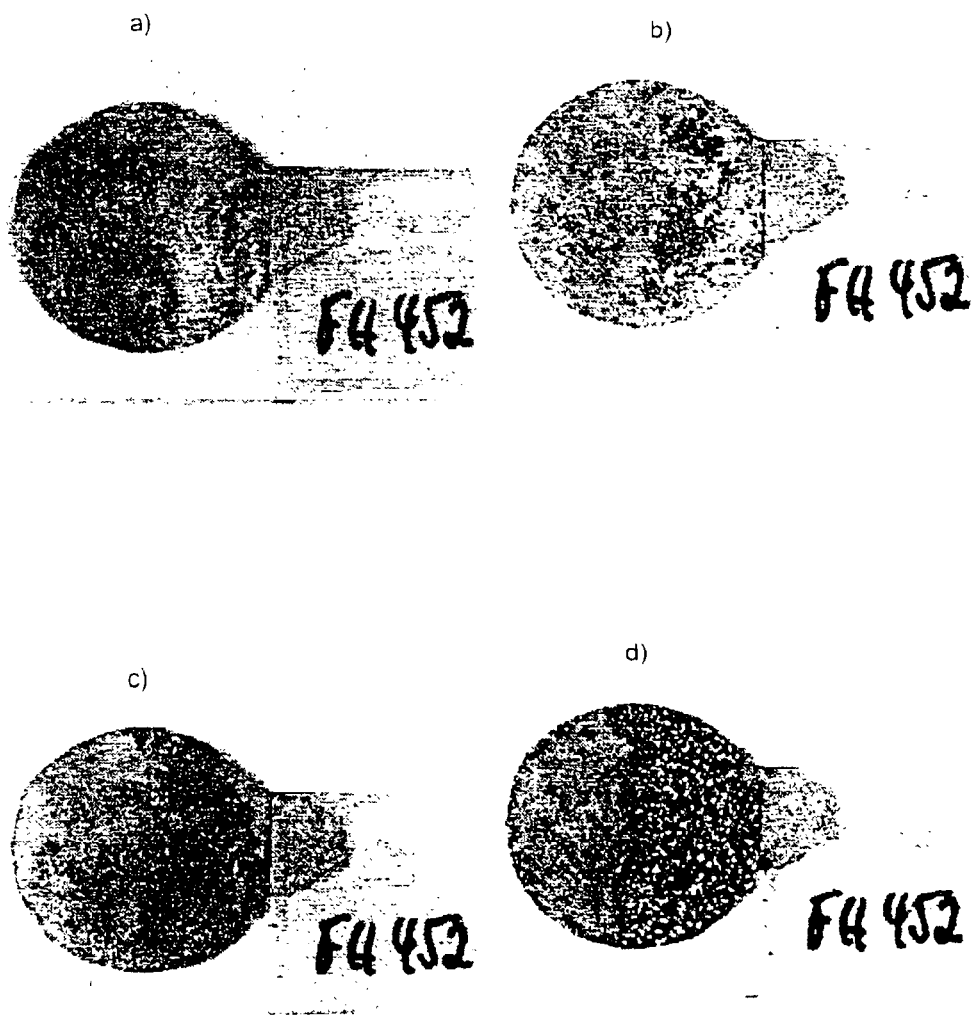
FIG. 18 PA Mg-6.0 wt. % Ce splat heat treated for 1 h at 400° C. and then a) HF-activated and prior to immersion and b) immersed for 0.5, c) for 1 and d) for 3 h in 5% (0.3 $H_2O_2$)–1% NaCl aqueous solution.

After heat treatment for 1 h at 400° C., initiation of corrosive attack on the featureless surface zone of PA Mg—Ce splats could not be traced back to a specific microstructural site coexisting with that zone (FIGS. 17 and 18 showing in FIG. 17 PA Mg-2.2 wt. % Ce splat heat treated for 1 h at 400° C. and then a) HF-activated and prior to immersion and b) immersed for 0.5, c) for 1 and d) for 3 h in 5% (0.3 $H_2O_2$)–1% NaCl aqueous solution as to the modified Machu-test, here with the side of the featureless surface chill zone for which the corrosive attack was triggered at rim of the splat after immersion for 1 h (FIG. 17c) then followed by rapidly progressing attack from the rim to the central portion of the heat treated splat (FIG. 17d) resulting in corrosive attack of about 65% of corresponding exposed surface area and showing in FIG. 18 a PA Mg-6.0 wt. % Ce splat heat treated for 1 h at 400° C. and then a) HF-activated and prior to immersion and b) immersed for 0.5, c) for 1 and d) for 3 h in 5% (0.3 $H_2O_2$)–1% NaCl aqueous solution as to the modified Machu-test, here with a side which contained a relatively large surface area with microsegregations coexisting with the featureless surface chill zone and triggering corrosive attack at arbitrary surface sites. The attack was limited to about 40% of the exposed surface area at this side of the splat). That is: artificial aging has resulted in the formation of precipitates of a size (i.e. above an atomic length scale) which was sufficient to render the material susceptible to corrosion. After 1 h exposure to the Machu-immersion test modified by AHC, a large scatter of 4 to 40% in attacked surface area of the featureless surface zone was observed. After 3 hours immersion the attacked area of the side of primarily featureless growth was observed to increase from <15% before heat treatment to 40 to 60% after heat treatment. Both the large scatter and the relatively large increase in corrosive attack indicated that microstructural inhomogeneities were responsible for the observed degradation of corrosion resistance after heat treatment. The observed microstructural inhomogeneities at the splat alloy surface result from microsegregations delineating columnar growth (cf. FIG. 9c) or from predendritic features due to uncontrolled fluid flow (ditto).

Figure 20:
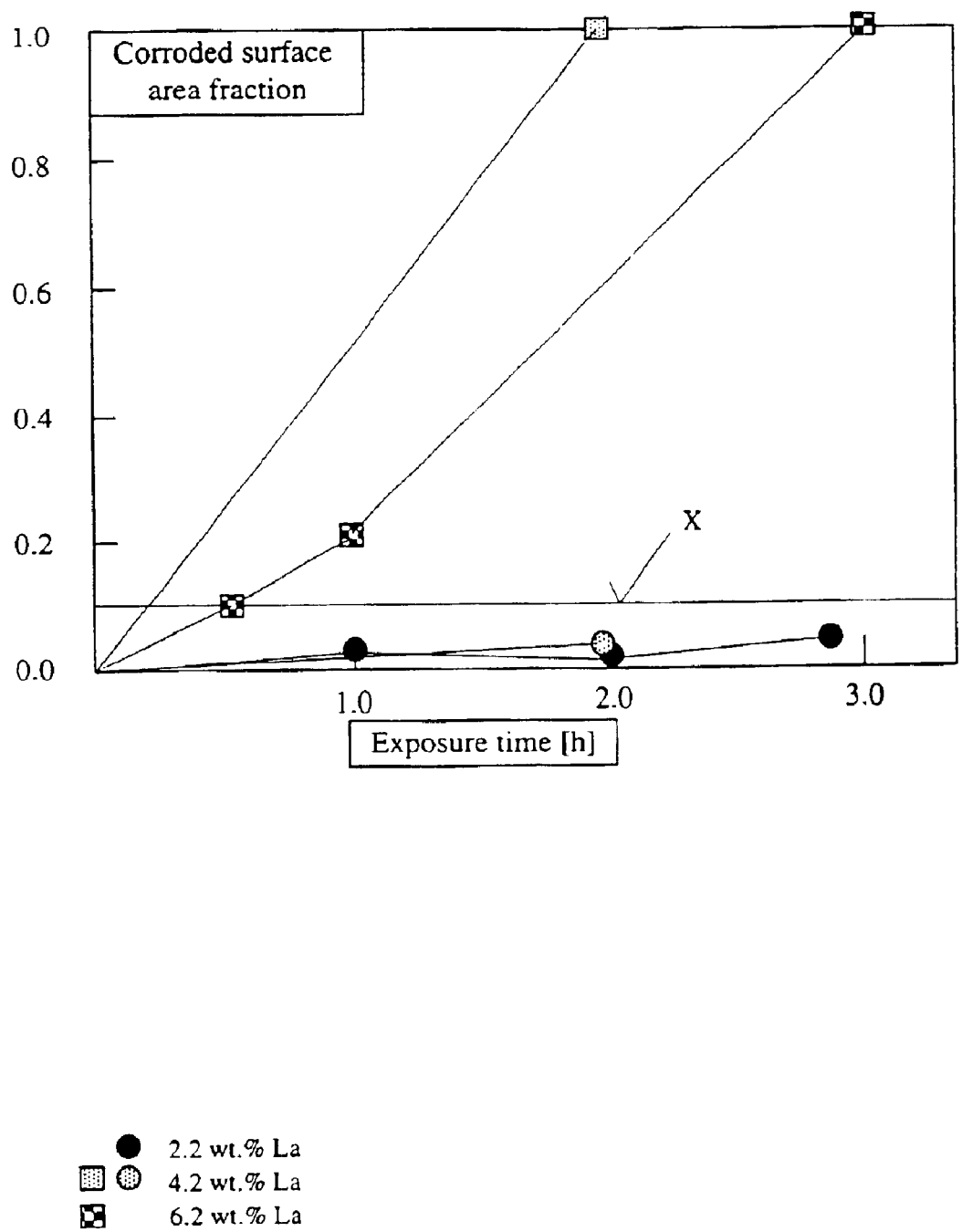
FIG. 20 Evolution of corrosive attack on the surface of as-solidified PA Mg-La splats exposed to 5% (0.3 $H_2O_2$) –1% NaCl aqueous solution.
Figure 21:
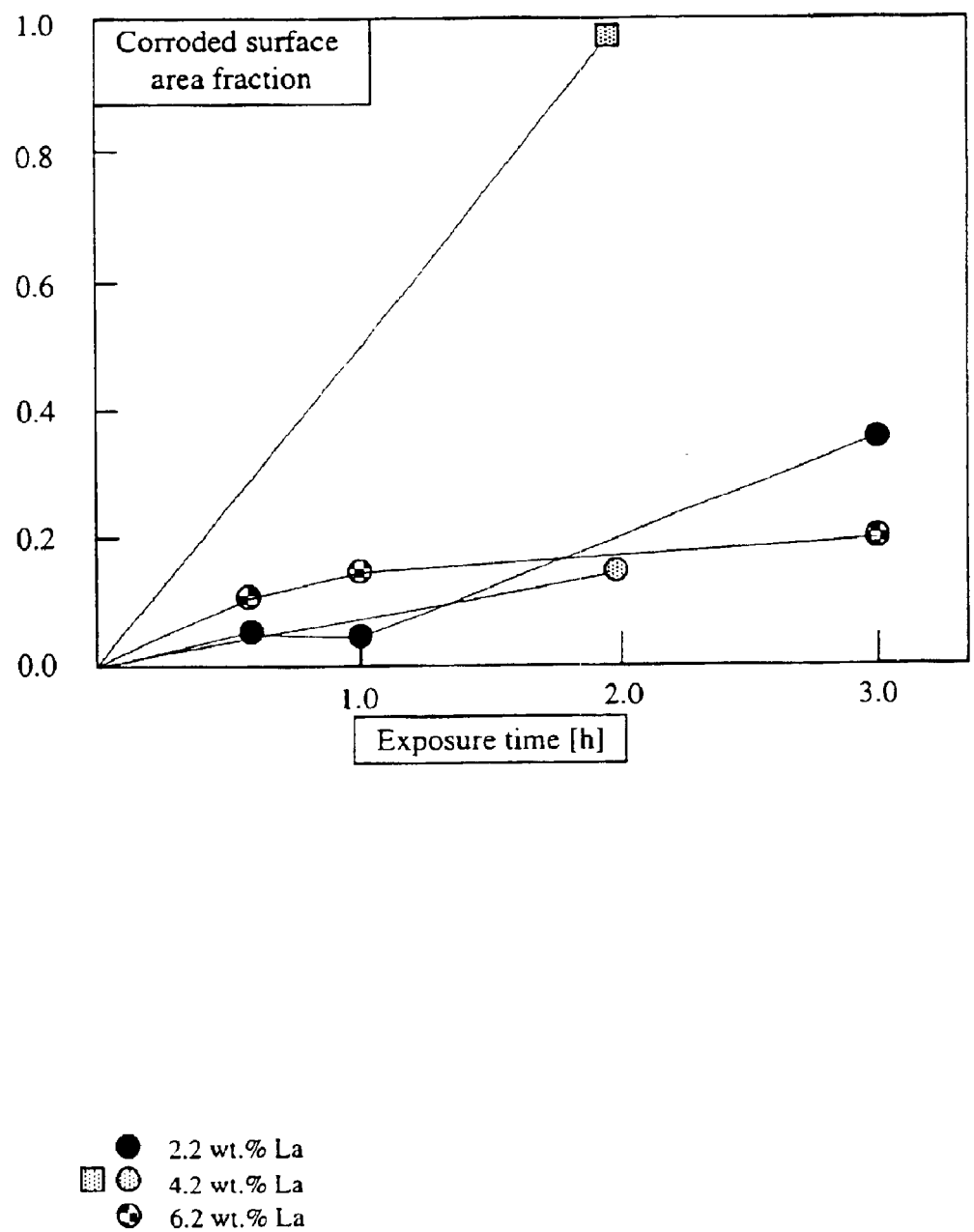
FIG. 21 PA Mg-La splats heat-treated for 1 h at 400° C. after exposure as for FIG. 20.
Figure 22:
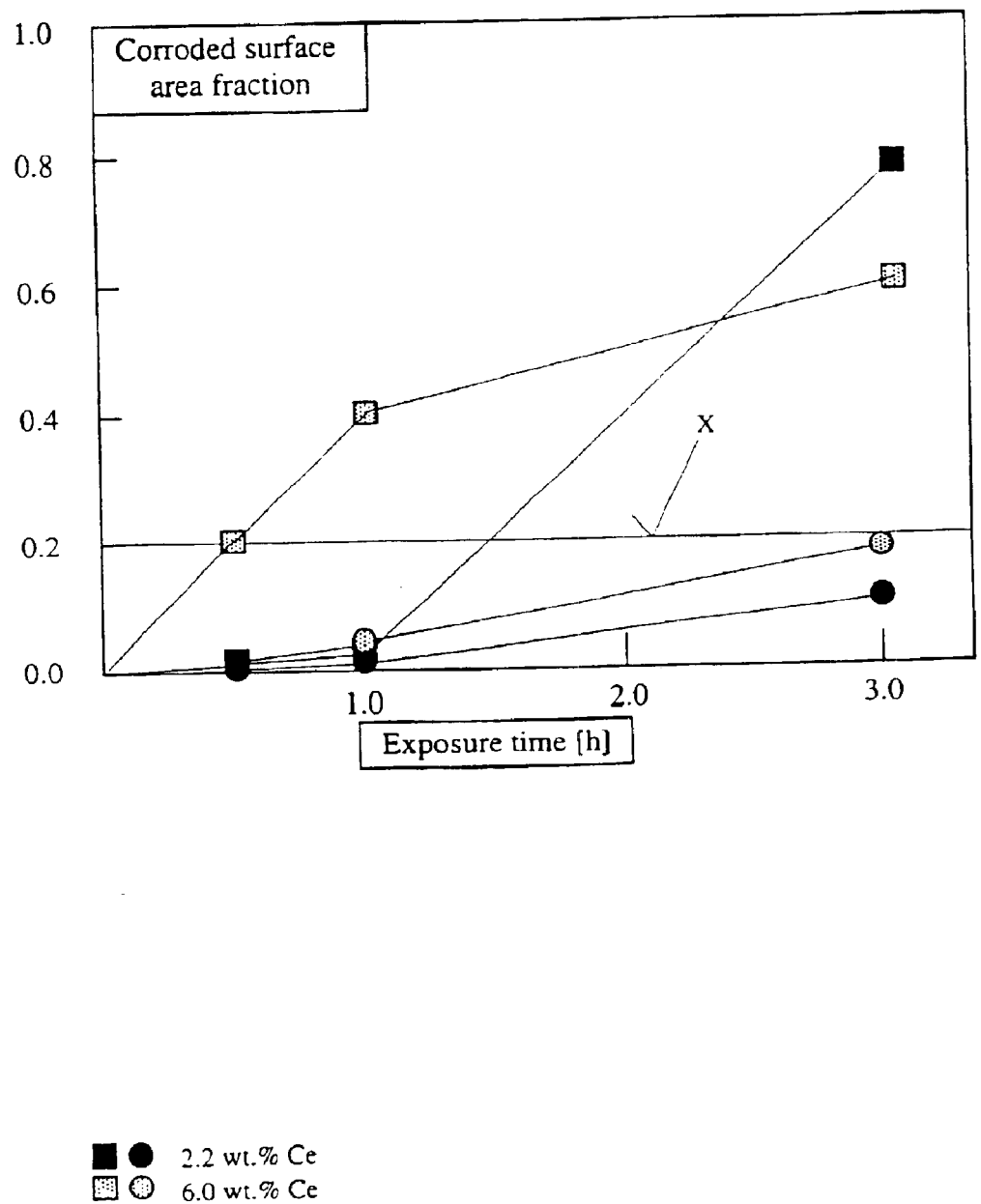
FIG. 22 Evolution of corrosive attack on surface of the featureless chill zone of PA Mg—Ce splats (i.e. the extended solid solution of Ce, in cph-Mg) in the as-solidified state (discs) and after heat treatment for 1 h at 400° C. as for FIG. 20.

FIG. 20 shows the evolution of corrosive attack on the surface of as-solidified PA Mg—La splats exposed to 5% (0.3 $H_2O_2$)—1% NaCl aqueous solution of the modified Machu-test (*Angewandte Oberflächentechnik für metallische Werkstoffe*, eds. Harald Simon and Martin Thoma, Carl Hanser Verlag, 1985, p. 302; AHC-Oberfläche, *AHC-brochure for corrosion tests*, AHC-Oberflächentechnik, Friebe & Reininghaus GmbH, Kerpen, FRG, p. 111, priv. communication, March 1986), where discs representing the extended solid solution of La in cph-Mg and squares representing the dendritic chill-off zone with equilibrium or nearly equilibrium volume fraction of microsegregations. X (straight bar): approximate volume fraction of predendrites coexisting with featureless chill-zone. FIG. 21 is as for FIG. 20, here with PA Mg—La splats heat-treated for 1 h at 400° C. FIG. 22 shows the evolution of corrosive attack on the surface of the featureless chill zone of PA Mg—Ce splats (i.e. the extended solid solution of Ce in cph-Mg) in the as-solidified state (discs) and after heat treatment for 1 h at 400° C. (squares) during exposure to 5% (0.3 $H_2O_2$)–1% NaCl aqueous solution of the modified Machu-test (X, i.e. the straight bar is as for FIG. 20).

The comparison of the response to macroscopic corrosive attack of the featureless relative to the microsegregated zone shown in FIGS. 20–22 appears as a conservative estimation of what can be obtained by segregation-free alloying the (extended) solid solution of cph-Mg or any other non-equilibrium Mg-base matrix phase. Microsegregations have evidently exaggerated pitting and the surface area of the featureless chill zone attacked by corrosion. The response of pre-dendritic features and heat treatment to the employed immersion test indicates that a certain size and nature of second phases and a certain degree of aging can be afforded without triggering corrosive attack. By contrast, overaging as employed for high strength 7000 Al-alloys for aerospace applications undermined the improved resistance to corrosion obtained by the extended solid solution of La and Ce in cph-Mg.

Figure 23:
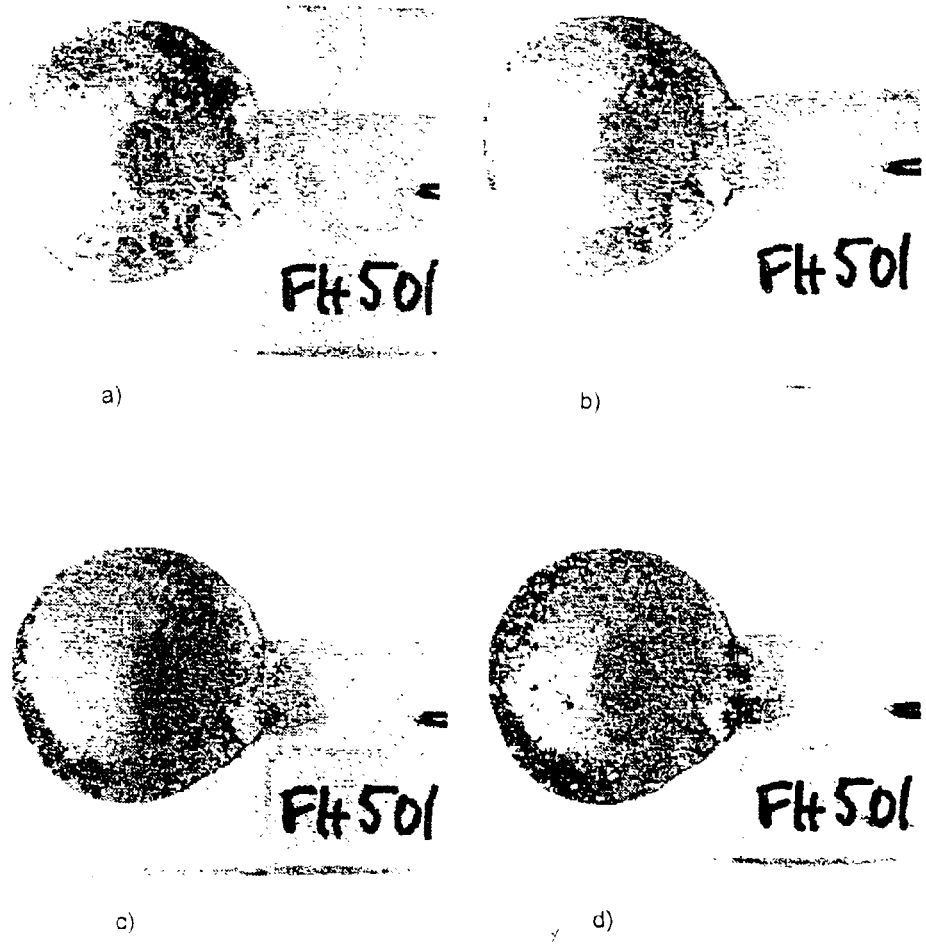
FIG. 23 PA Mg-2.33 wt. % Nd splat with side of featureless chill-zone microstructure a) prior to and b) after 0.5, c) 1 and d) 3 hours immersion in 5 wt. % (0.3 $H_2O_2$)–1 wt. % NaCl aqueous solution.
Figure 26:
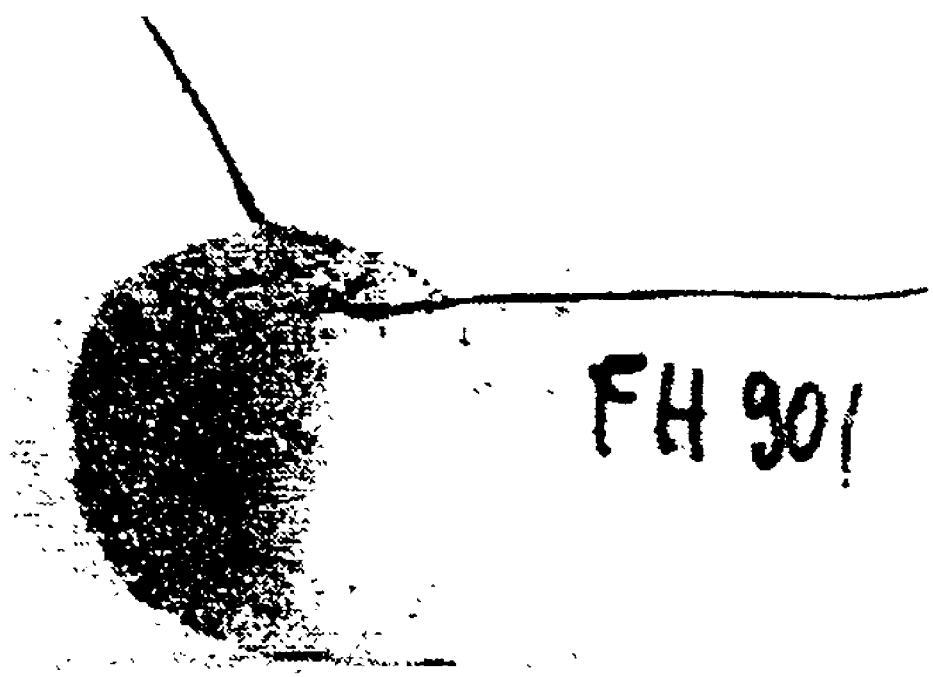
FIG. 26 PA Mg-4.0 wt. % Mn splat prior to immersion in 5 wt. % (0.3 $H_2O_2$)–1 wt. % NaCl aqueous solution.
Figure 27:
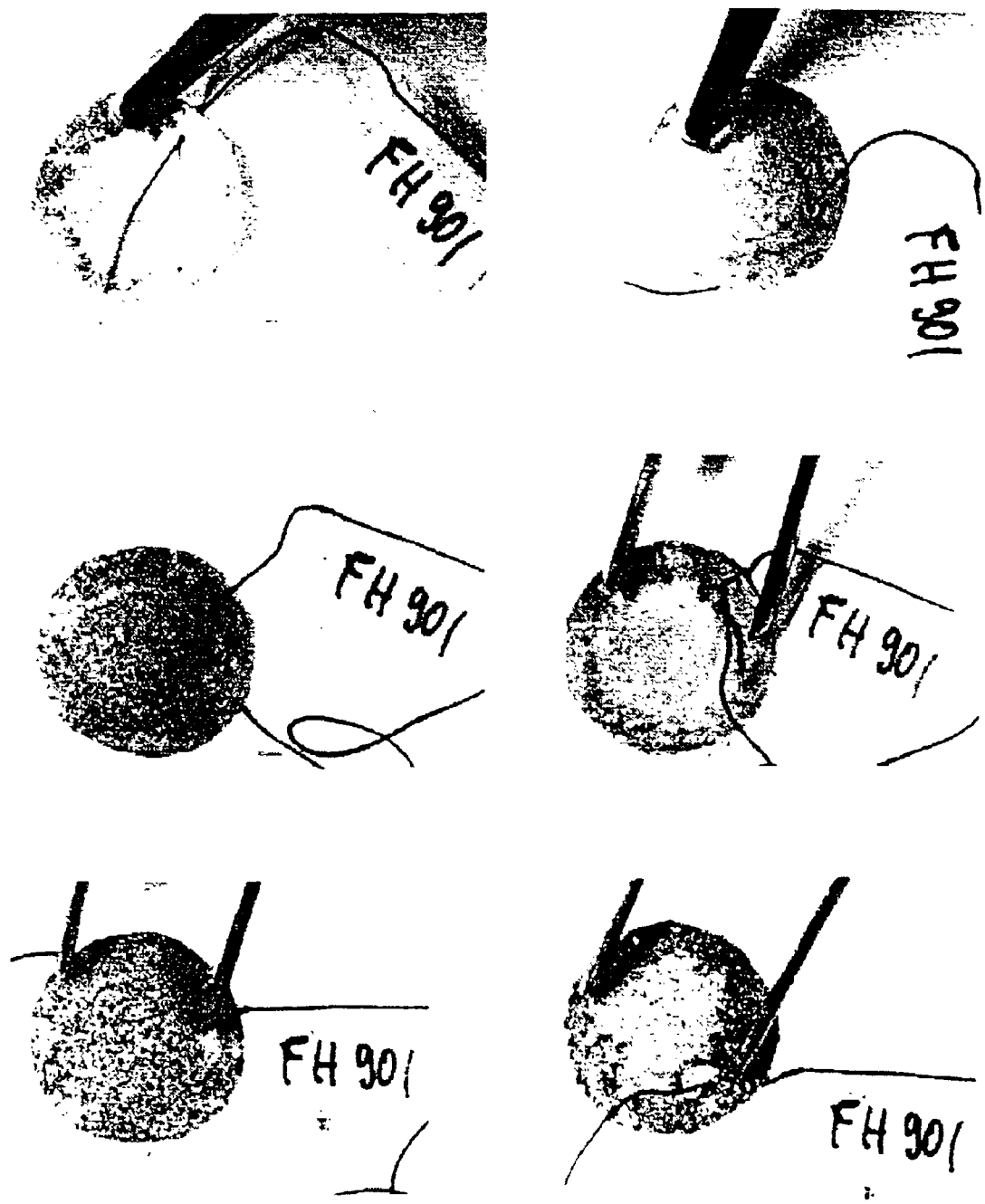
FIG. 27 PA Mg-4.0 wt. % Mn splat with (left row) chill-off and (right row) chill-zone after (top) 0.5 h, (center) 1.0 h and (bottom) 3.0 h immersion in 5 wt. % (0.3 $H_2O_2$)–1 wt. % NaCl aqueous solution.
Figure 29:
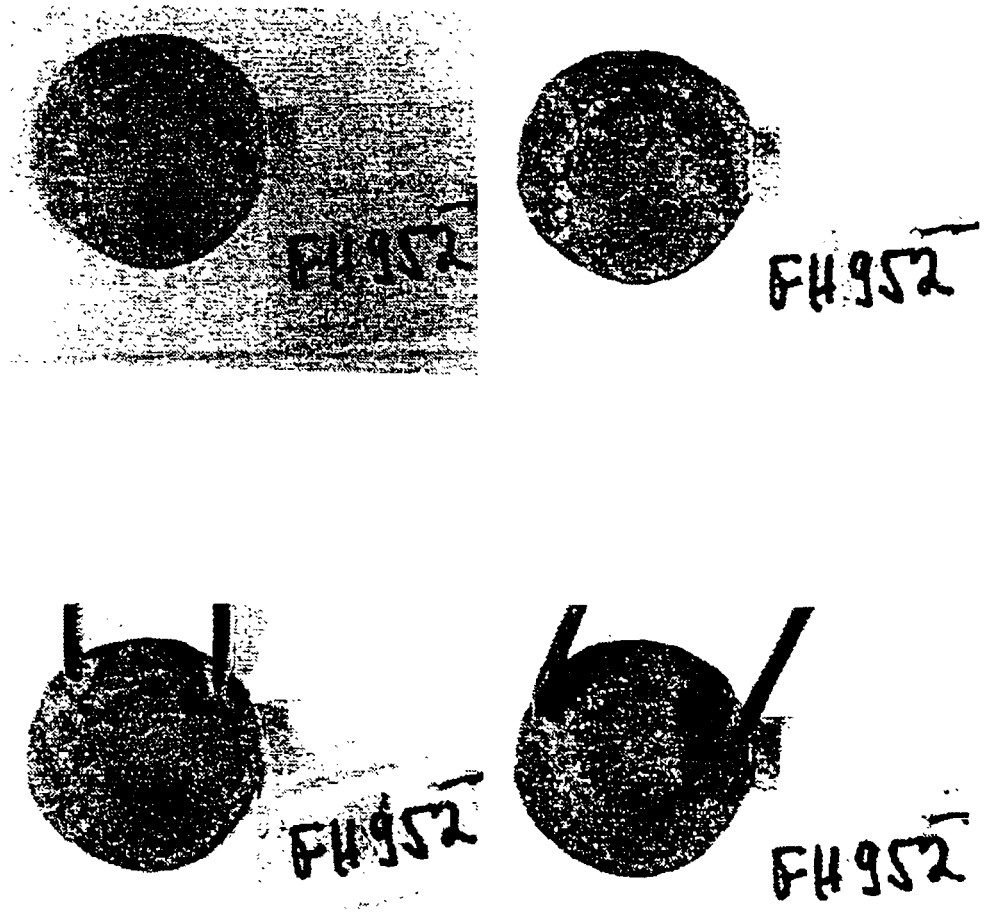
FIG. 29 PA Mg-6.0 wt. % Mn splat, here made from high purity Mg-feedstock, after heat treatment for 4 hours at 350° C. and a) 0, b) 0.5, c) 1 and d) 3 h immersion (cf.
Figure 30:
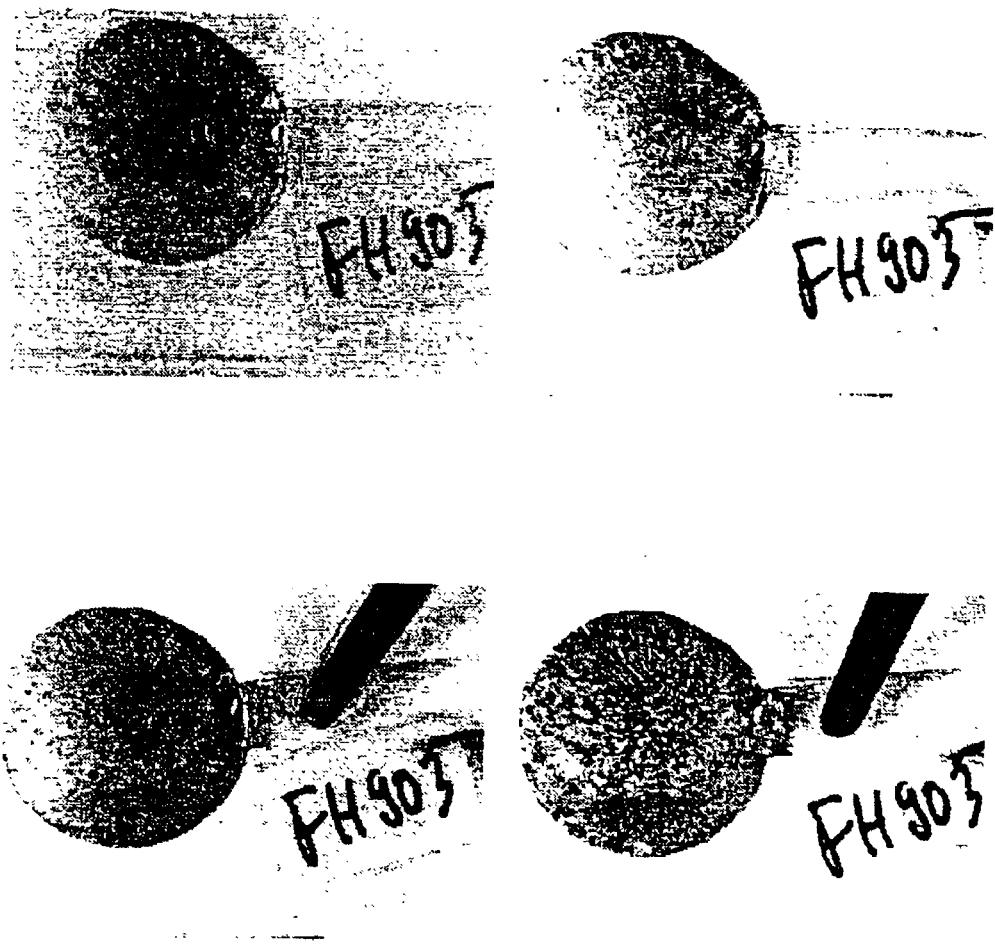
FIG. 30 PA Mg-8.0 wt. % Mn splat in a) as-solidified condition and after b) 0.5, c) 1 and d) 3 h immersion (see above).
Figure 31:
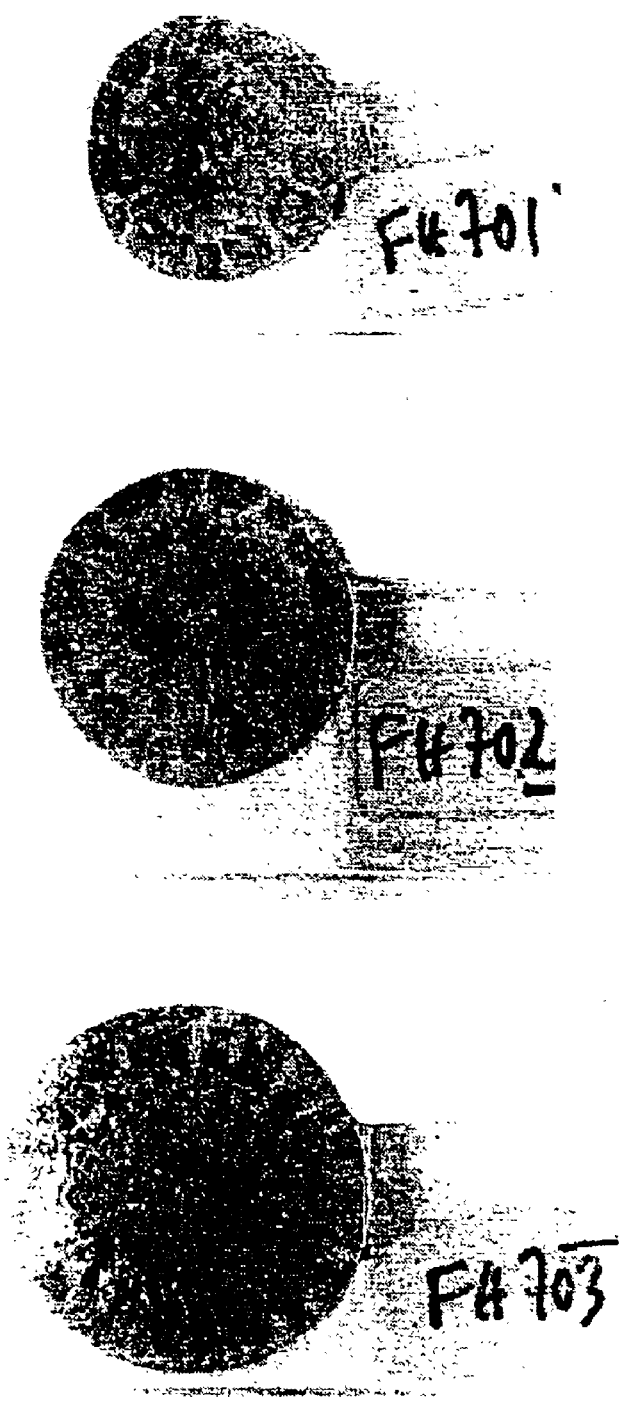
FIG. 31 PA Mg-splats with (top) 0.5 wt. % Si, (center) 1.0 wt. % Si and (bottom) 5.0 wt. % Si prior to immersion.
Figure 33:
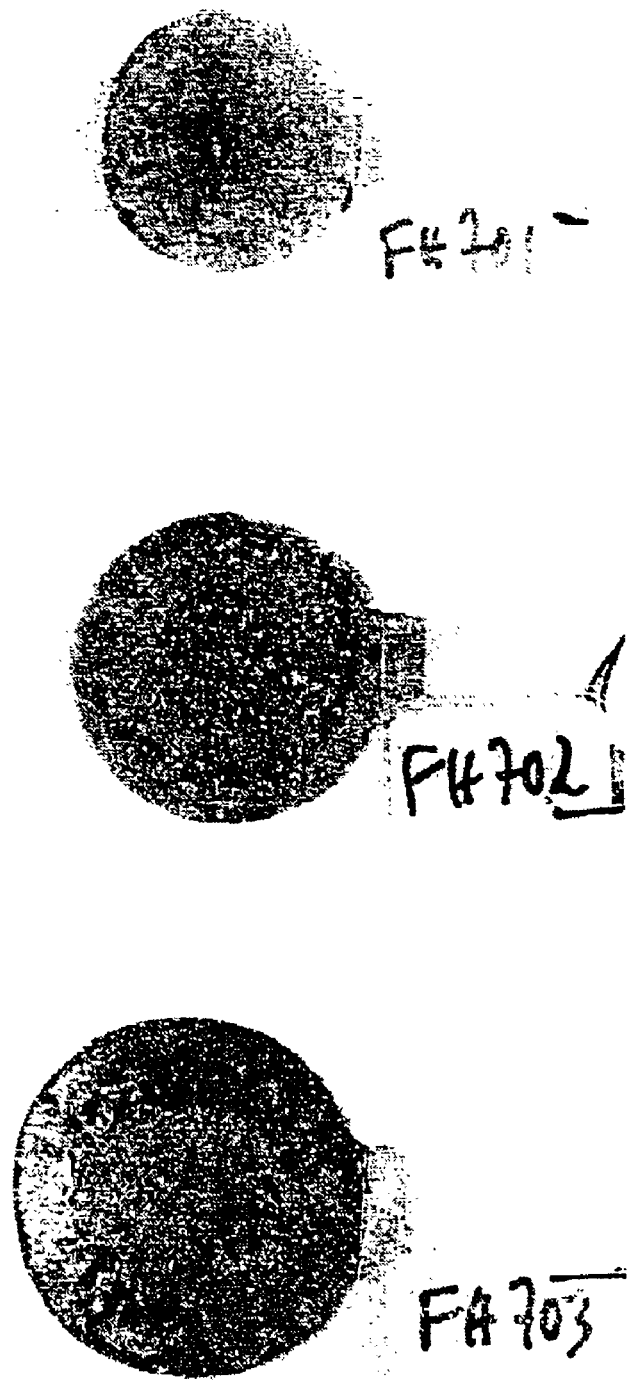
FIG. 33 As for FIG. 32, here after 1 h immersion in 5 wt. % (0.3 $H_2O_2$)–1 wt. % NaCl aqueous solution.
Figure 35:
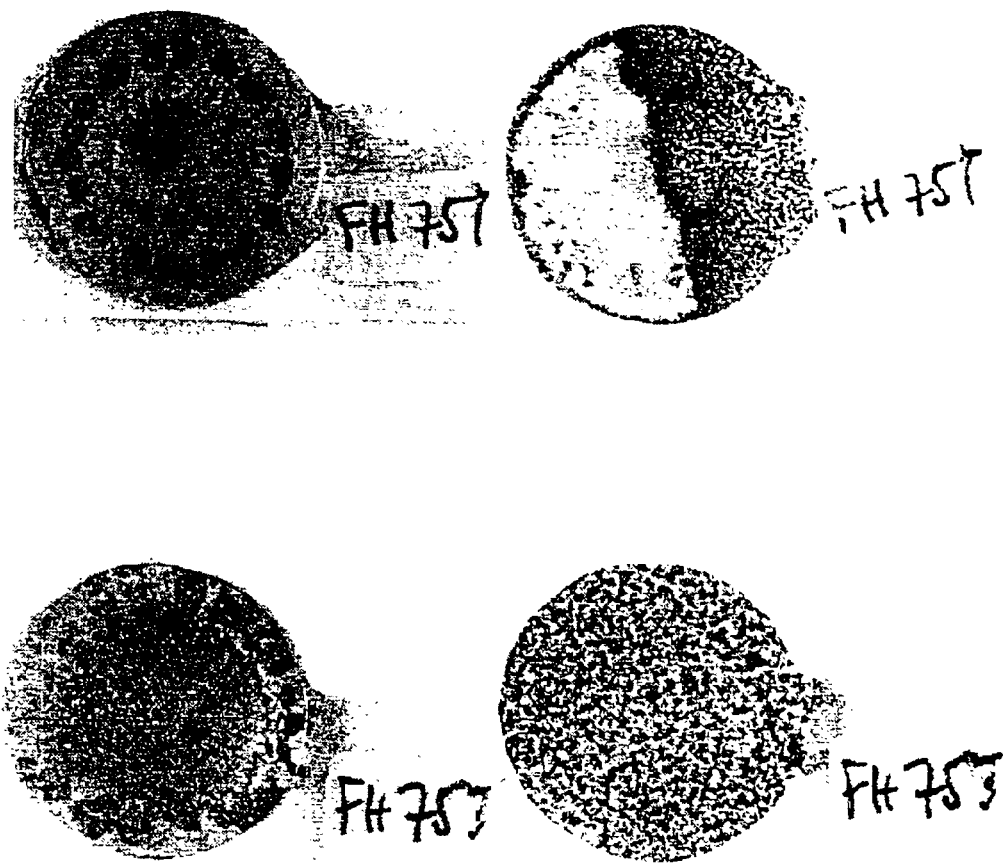
FIG. 35 PA Mg-splat with 0.5 wt. % Si (top) and 5.0 wt. % Si (bottom) after heat treatment for 1 h at 400° C. and (left row) prior to and (right row) after 3 h immersion.
Figure 36:
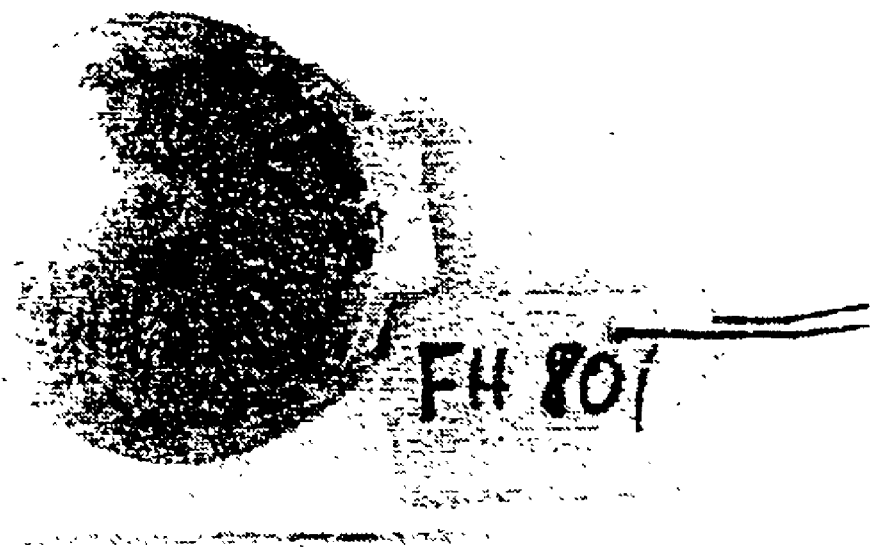
FIG. 36 PA Mg-2.46 wt. % Sb splat in as-solidified condition prior to immersion.
Figure 37:
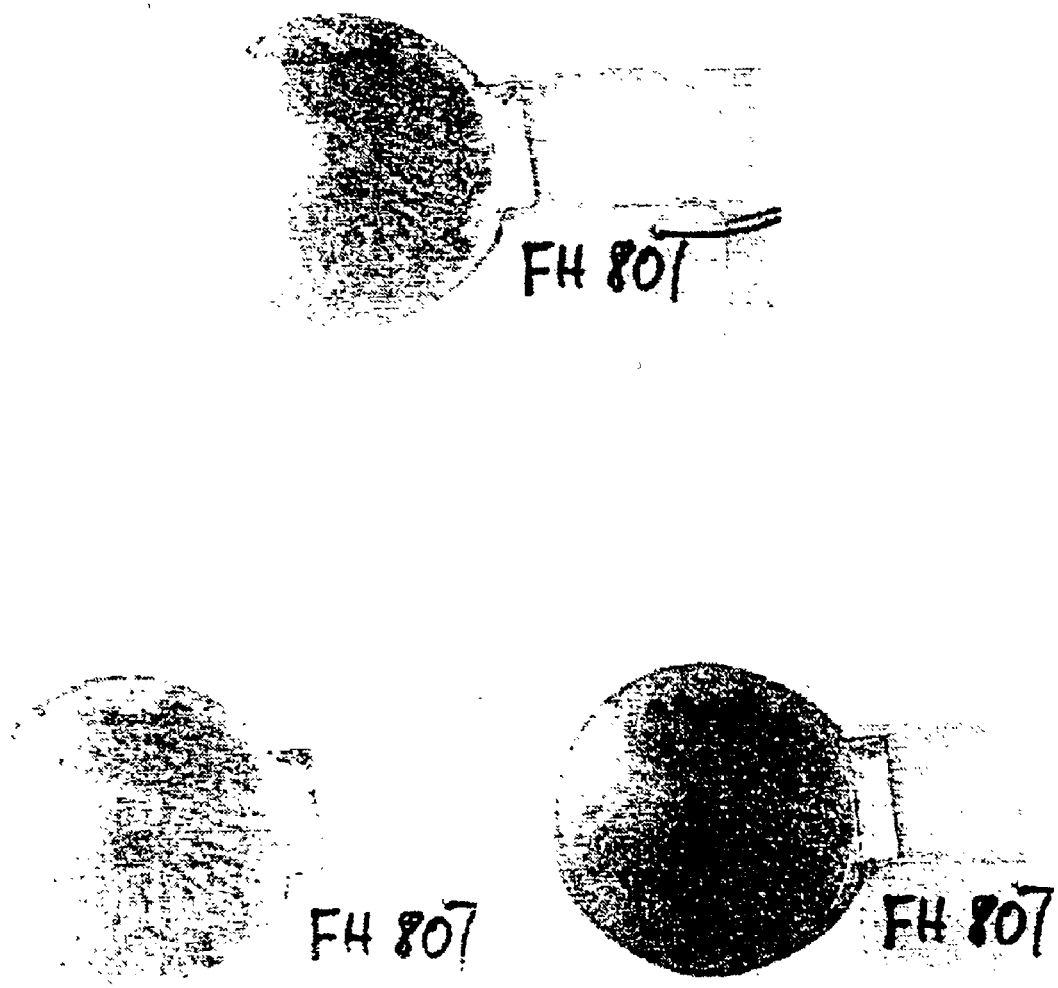
FIG. 37 As-solidified PA Mg-2.46 wt. % Sb splat after (top) 0.5, (bottom left) 1.0 and (bottom right) 3.0 h immersion in 5 wt. % (0.3 $H_2O_2$)–1 wt. % NaCl aqueous solution.
Figure 38:
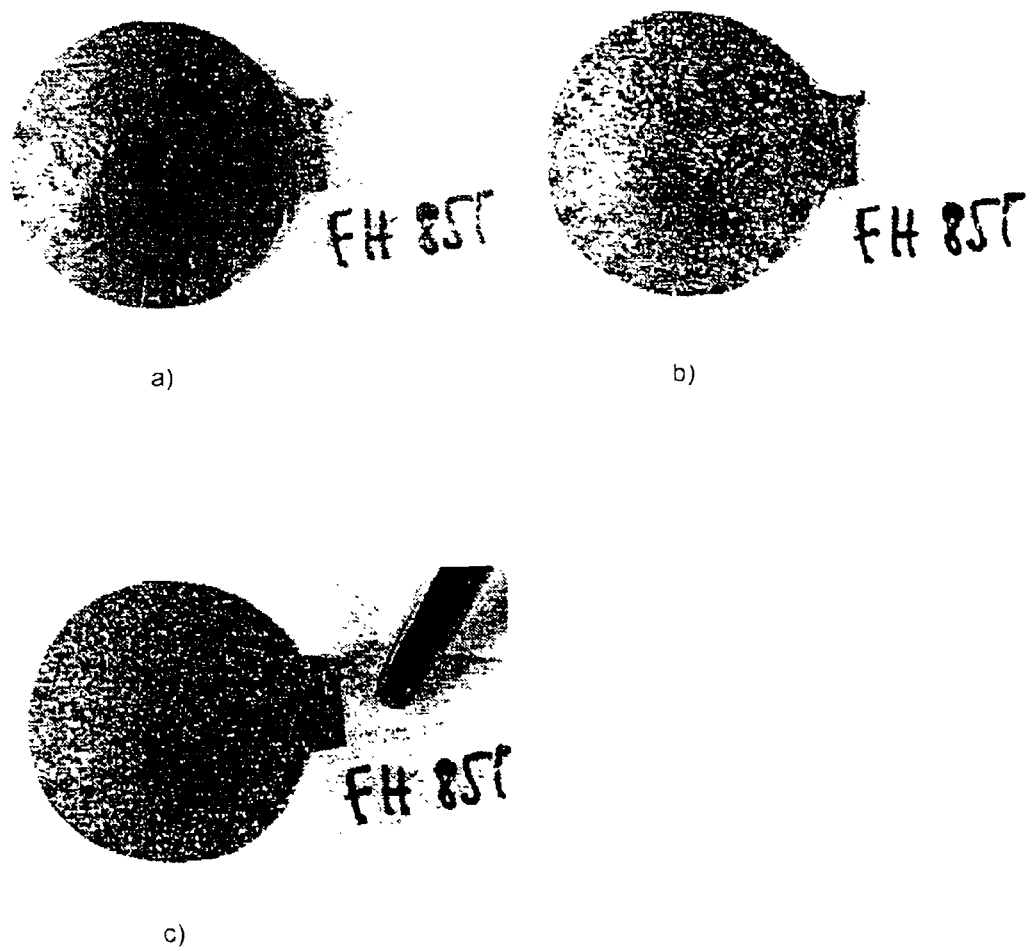
FIG. 38 PA Mg-2.46 wt. % Sb splat, heat treated for 1 h at 400° C. a) prior to and b) after 0.5, c) 1.0 and d) 3.0 h immersion in 5 wt. % (0.3 $H_2O_2$)–1 wt. % NaCl aqueous solution.
Figure 39:
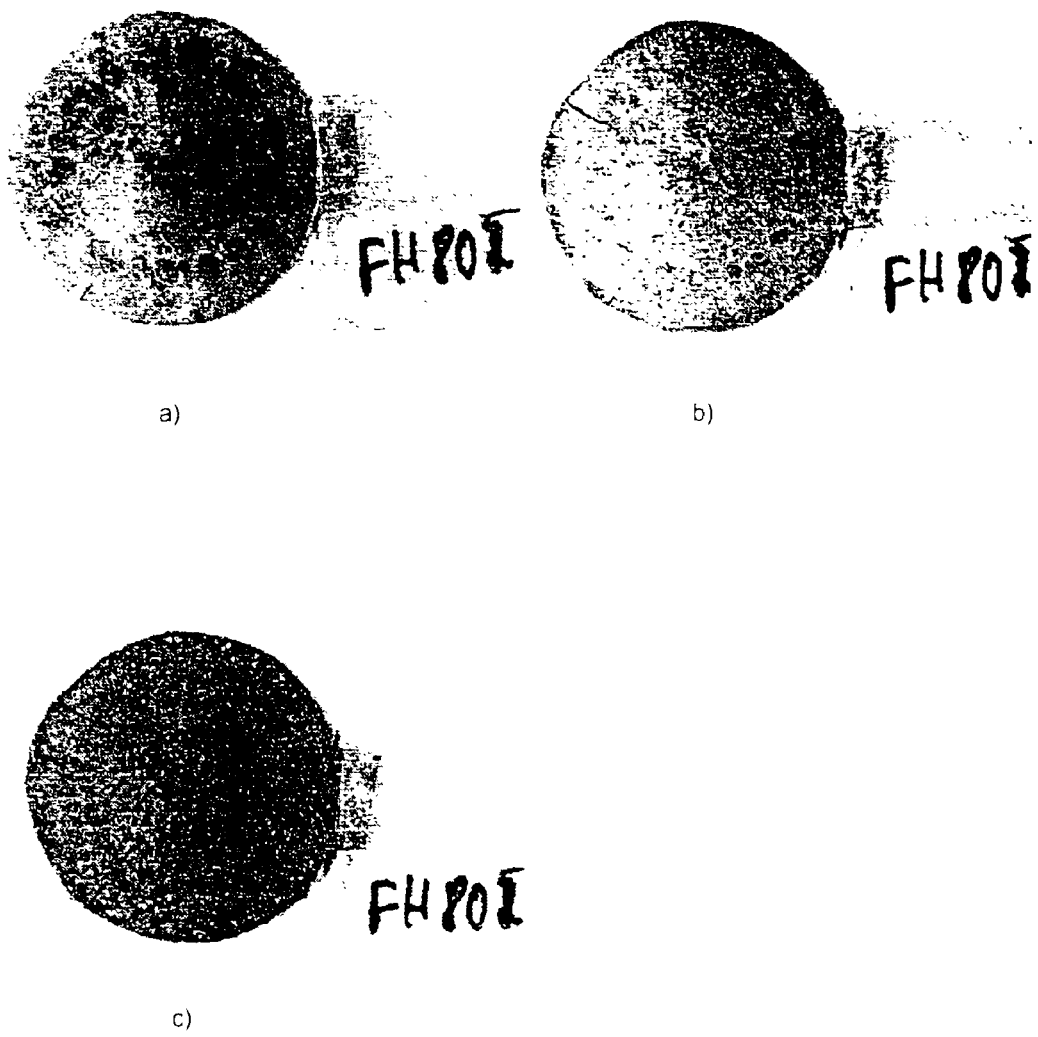
FIG. 39 As-solidified PA Mg-7.09 wt. % Sb splat showing increasing pitting (in contrast to PA Mg-2.46 wt. % Sb) in regions of uncontrolled fluid flow.
Figure 40:
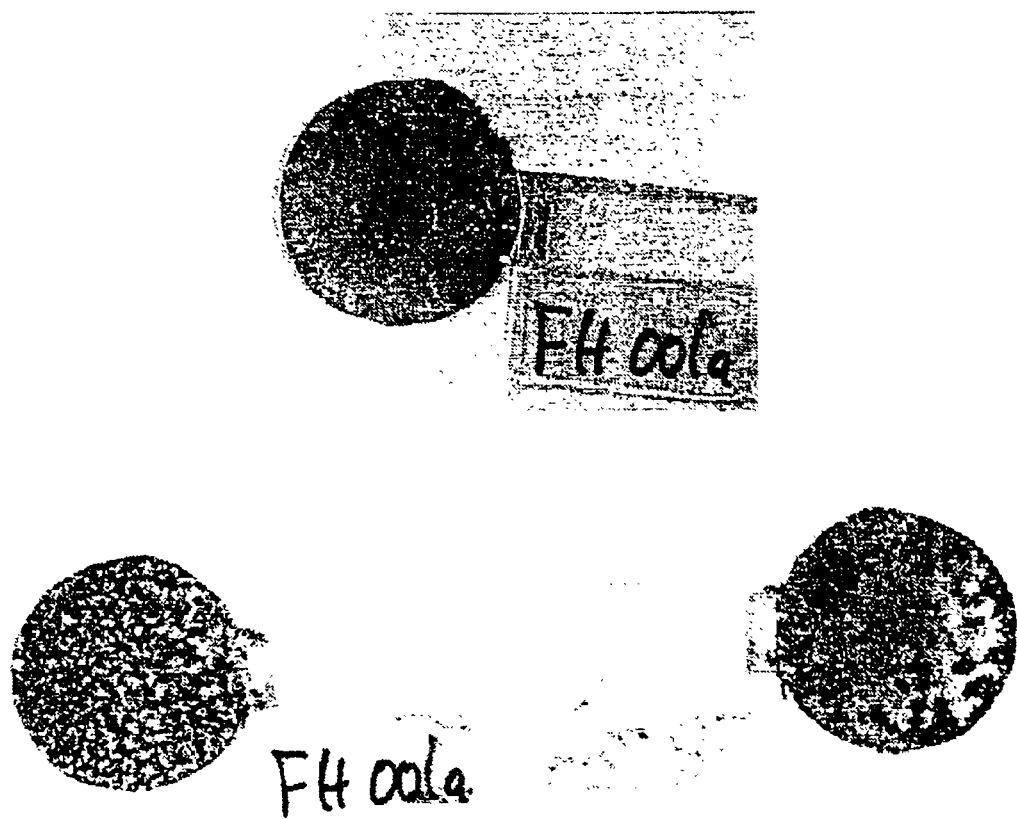
FIG. 40 PA Mg-3.5 wt. % Ca splat heat-treated for 1 h at 400° C. (top) prior to and (bottom) after 2 h immersion in 5 wt. % (0.3 $H_2O_2$)–1 wt. % NaCl aqueous solution with (left) dendritic chill-off zone and (right) featureless chill zone.
Figure 41:
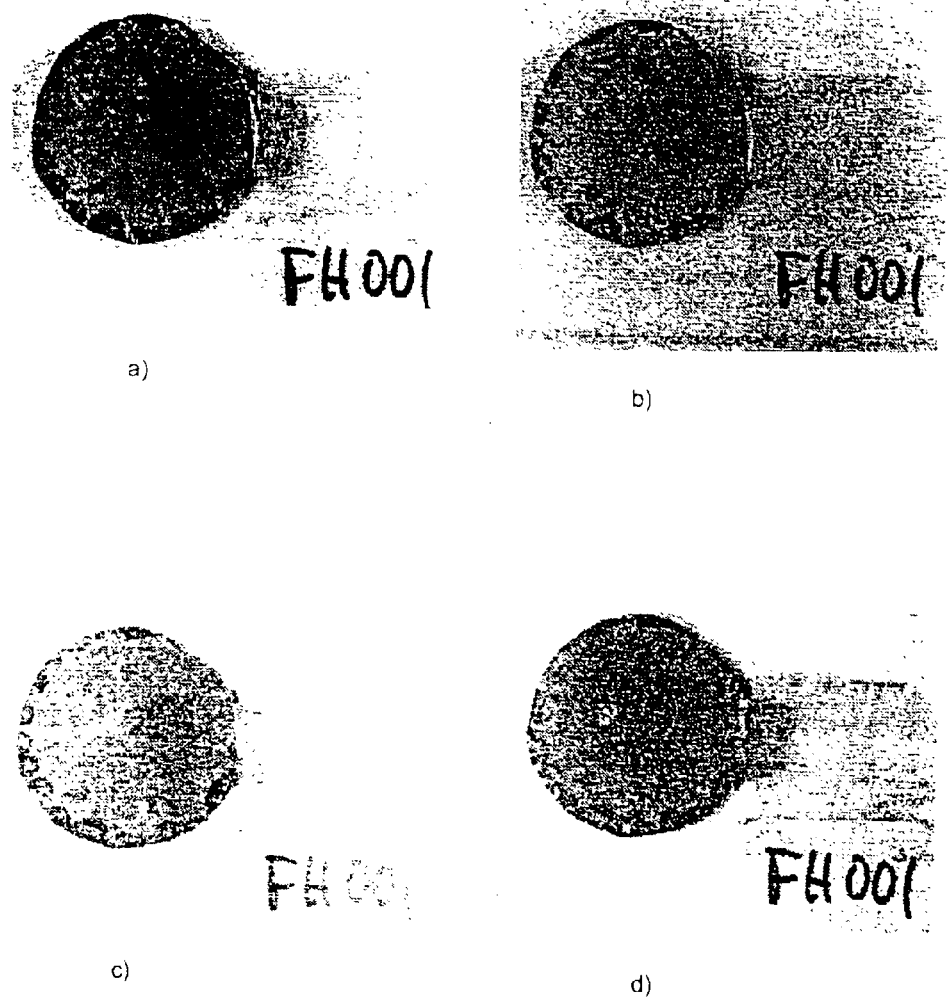
FIG. 41 PA Mg-2.0 wt. % Ca splat heat treated for 1 h at 400° C. with a) prior to and b) after 0.5, c) 1 and d) 3 h immersion in 5 wt. % (0.3 $H_2O_2$)–1 wt. % NaCl aqueous solution.
Figure 42:
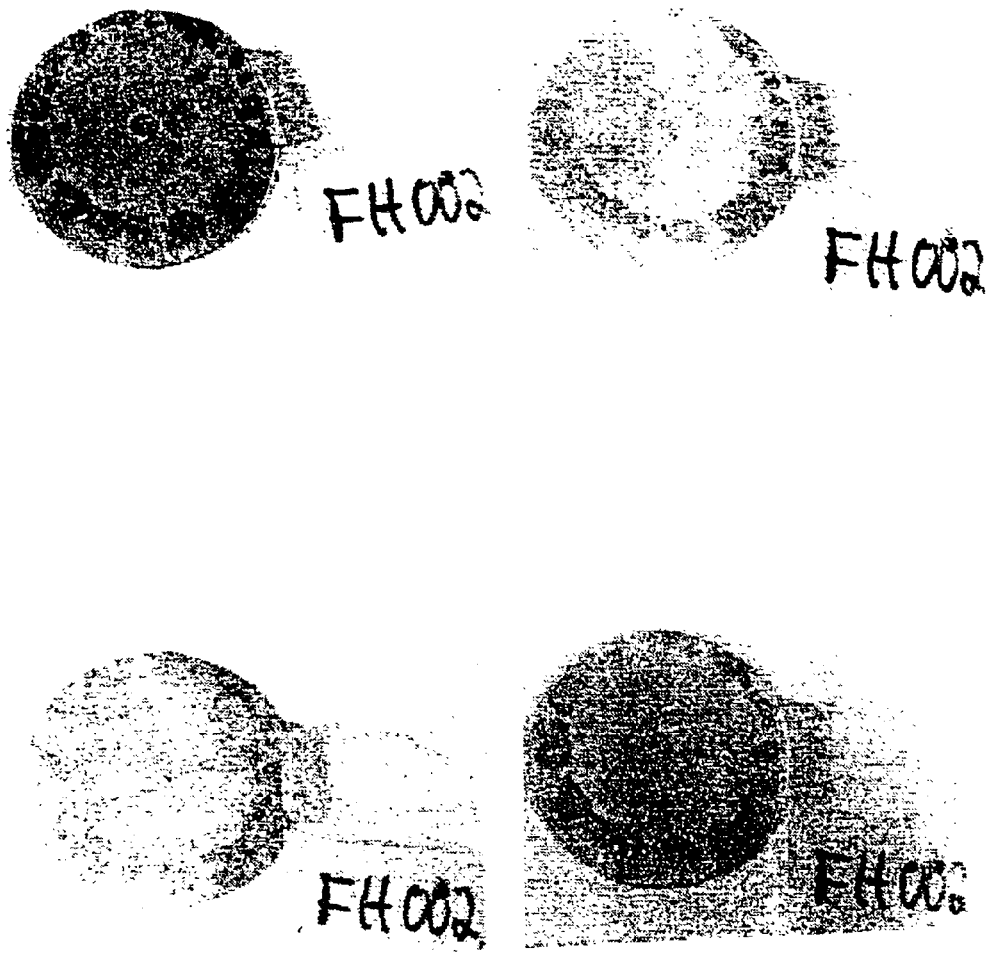
FIG. 42 PA Mg-5.0 wt. % Ca splat heat treated for 1 h at 400° C., here chill-side (featureless) zone without showing corrosive attack a) prior to and b) after 0.5, c) 1 and d) 3 h immersion in 5 wt. % (0.3 $H_2O_2$)–1 wt. % NaCl aqueous solution.
Figure 44:
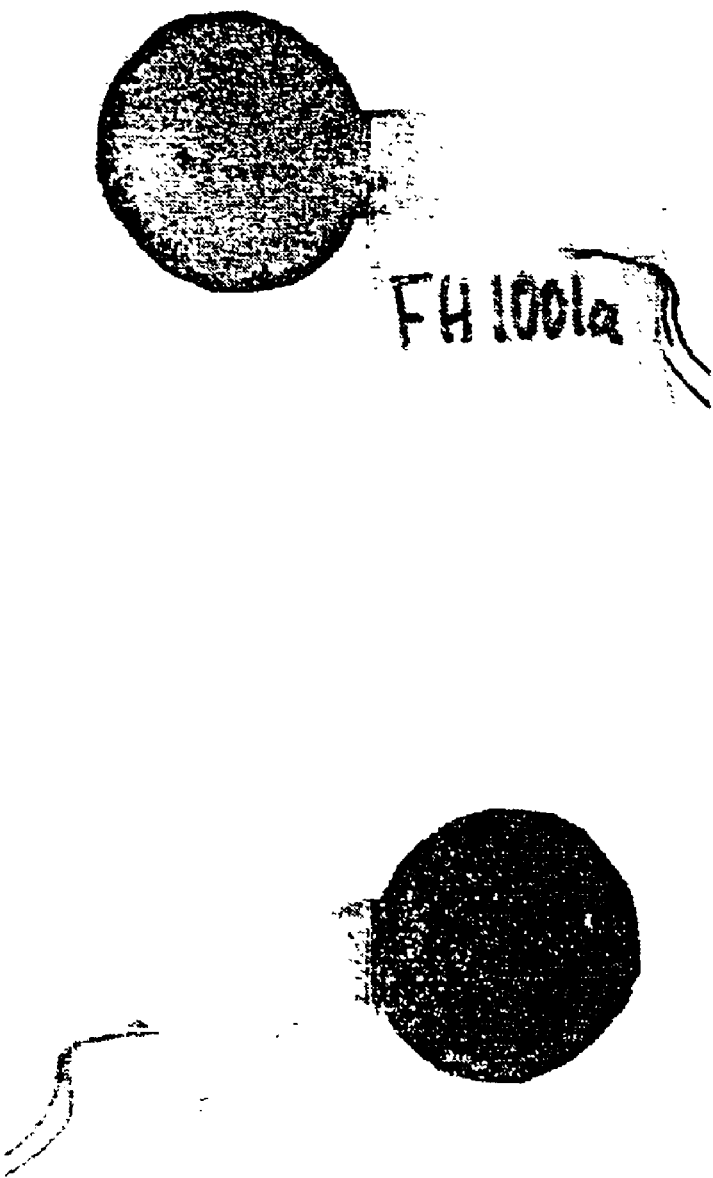
FIG. 44 PA Mg-4.23 wt. % Pd splat in as-splatted condition and immersed for 2 h in 5 wt. % (0.3 $H_2O_2$)–1 wt. % NaCl aqueous solution with (top) featureless chill-zone and (bottom) dendritic chill-off zone.
Figure 46:
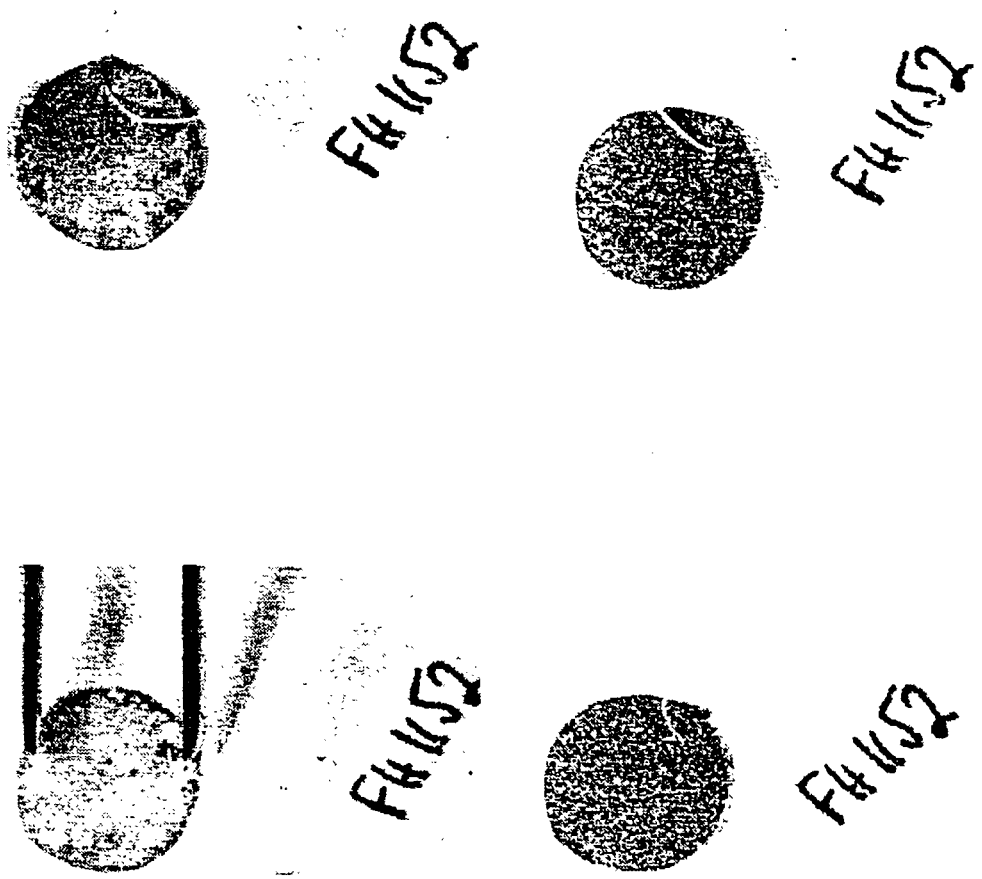
FIG. 46 PA Mg-14.19 wt. % Au splat heat-treated for 1 h at 400° C. after (top) 0.5 h and (bottom) 1 hour immersion in 5 wt. % (0.3 $H_2O_2$)–1 wt. % NaCl aqueous solution with (all left) featureless chill-zone microstructure and (all right) dendritic chill-off zone microstructure.
Figure 87:
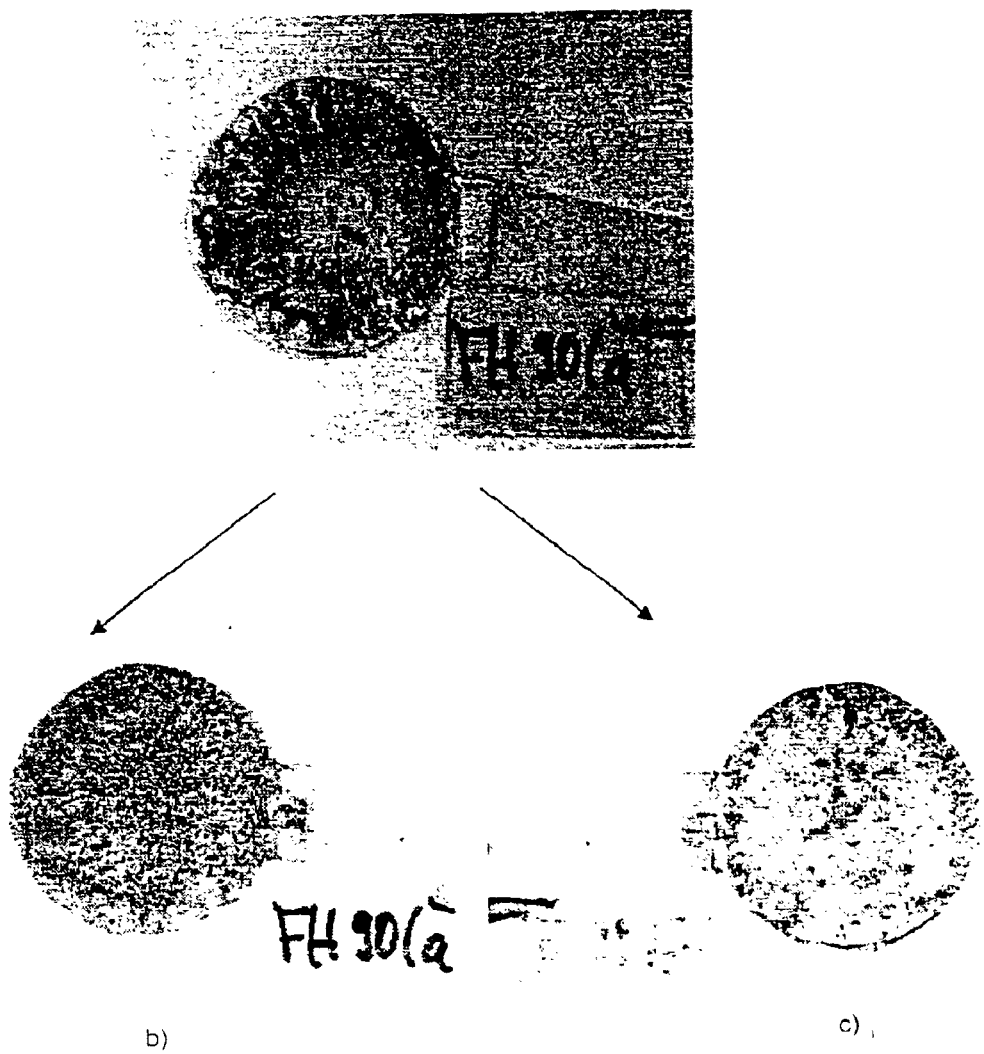
FIG. 87 As-solidified PA Mg-6.0 wt. % Mn splat a) prior to and b), c) after 2 h immersion in 5% (0.3 $H_2O_2$)–1% NaCl aqueous solution as to the modified Machu-test with a) and b) showing the side of the dendritic chill-off zone and c) that of the featureless chill-zone.

The impurity analysis of the Mg used for preparation of the alloys was 0.0034+/–0.003 wt. % Fe, 0.0005 wt. % Cu, 0.010 wt. % Si, <0.005 wt. % Al, 0.0004 wt. % Mn and 0.001 wt. % Ni. Alloy preparation did not increase the level of the more critical impurities Fe, Ni, Si and Cu, since pure Ta was used as crucible material. Despite the relatively high Fe-level, it was possible to discriminate the microstructural effects for PA Mg—Nd:
see FIG. 23 showing PA Mg-2.33 wt. % Nd splat with side of featureless chill-zone microstructure a) prior to and b) after 0.5, c) 1 and d) 3 hours immersion in 5 wt. % (0.3 $H_2O_2$)–1 wt. % NaCl aqueous solution, and PA Mg—Sm splats:
see FIG. 24 showing PA Mg-8.61 wt. % Sm splat in as-solidified condition a) prior to and b) after 0.5, c) 1 and d) 3 hours immersion in 5 wt. % (0.3 $H_2O_2$)–1 wt. % NaCl aqueous solution, here side of featureless chill-zone microstructure, with a particular strong advantage of the supersaturated segregation-free chill zone relative to the heat-treated so coarsened dendrite chill-off zone:
cf. FIG. 25 showing (Top) PA Mg-6.99 wt. % Nd splat and (bottom) PA Mg-8.61 wt. Sm splat heat-treated for 1 h at 400° C. then immersed for 3 h in 5 wt. % (0.3 $H_2O_2$)–1 wt. % NaCl aqueous solution, here side of chill-off zone of dendritic microstructure with strong black tarnish (thick layer of corrosion product, for Mg-Mn splats:

see FIGS. 26–30, where FIG. 26 with a PA Mg-4.0 wt. % Mn splat prior to immersion in 5 wt. % (0.3 $H_2O_2$)–1 wt. % NaCl aqueous solution, FIG. 27 showing PA Mg-4.0 wt. % Mn splat with (left row) chill-off and (right row) chill-zone after (top) 0.5 h, (center) 1.0 h and (bottom) 3.0 h immersion in 5 wt. % (0.3 $H_2O_2$)–1 wt. % NaCl aqueous solution, FIG. 28 exhibiting PA Mg-6.0 wt. % Mn splat, here made from high purity Mg-feedstock (i.e. <50 ppm Fe) with featureless chill-zone microstructure after (top) 0.5 h, (center) 1.0 h and (bottom) 3.0 h immersion in 5 wt. % (0.3 $H_2O_2$)–1 wt. % NaCl aqueous solution, showing slight tarnish, FIG. 29 PA Mg-6.0 wt. % Mn splat, here made from high purity Mg-feedstock, after heat treatment for 4 hours at 350° C. to assure precipitation of βMn from the supersaturated solid solution then developing black tarnish upon immersion as before (i.e. after a) 0, b) 0.5, c) 1 and d) 3 h immersion and FIG. 30 with PA Mg-8.0 wt. % Mn splat in a) as-solidified condition with P—Mn-dispersoids provoking local pits without destroying overall resistance to corrosive attack after b) 0.5, c) 1 and d) 3 h immersion, splat and FIG. 87 with as-solidified PA Mg-6.0 wt. % Mn splat a) prior to and b), c) after 2 h immersion in 5% (0.3 $H_2O_2$)–1% NaCl aqueous solution as to the modified Machu-test, wherein a) and b) showing the side of the dendritic chill-off zone and c) that of the featureless chill-zone—while the letter remained essentially unaffected, the chill-off side was obscured by pitting corrosion, see FIGS. 87b and p. 158 showing an increasingly and more uniform dispersion of second phases separated from the melt above 6 wt. % Mn (and which is consistent with what is expected from solidification kinetics) and the development of a black tarnish after heat treatment for 4 hours at 350° C. (see FIG. 29, i.e. a condition which was elsewhere identified (cf. N. I. Varich and B. N. Litvin, *Fiz. Met. Metallov.* 16, 1963, pp. 526–529) to assure the solid state precipitation of βMn from corresponding supersaturated cph-Mg-base solid solution, see below), for PA Mg—Si splats in the range from 0.5 to 5.0 wt. % Si:

FIGS. 31 to 35 (wherein FIG. 31 showing PA Mg-splats with (top) 0.5 wt. % Si, (center) 1.0 wt. % Si and (bottom) 5.0 wt. % Si in as-solidified condition prior to immersion, and FIG. 32 as for FIG. 31, but after 0.5 h immersion in 5 wt. % (0.3 $H_2O_2$)–1 wt. % NaCl aqueous solution showing increasing corrosive attack with increasing Si-content according to the volume fraction of $Mg_2Si$-phase separated from the melt in particular at the outer splat zone (with worse contact with the piston) compared to that of the central part of the splat, and FIG. 33 as for FIG. 32, here after 1 h immersion in 5 wt. % (0.3 $H_2O_2$)–1 wt. % NaCl aqueous solution. A particular good contact resulting in featureless surface zone for PA Mg-5 wt. % Si develops surprising corrosion resistance at splat center (see bottom, labeled with "FH703"), and FIG. 34 as for FIG. 33 here after 3 h immersion in 5 wt. % (0.3 $H_2O_2$)–1 wt. % NaCl aqueous solution showing surprising resistance to corrosive attack for major part of splat containing 0.5 wt. % Si (top) and for central part of splat containing 5.0 wt. % Si (bottom), and FIG. 35 showing PA Mg-splat with 0.5 wt. % Si (top) and 5.0 wt. % Si (bottom) after heat treatment for 1 h at 400° C. and (left row) prior to and (night row) after 3 h immersion (as before) showing entire breakdown of corresponding corrosion resistance. Supersaturation with Si of these materials did not exceed 0.5 wt. %. The breakdown is a result of coarsening of the $Mg_2Si$-phase either separated from the melt during solidification or from the solid during heat treatment.), with the same trends as for Mg—Mn, but with more detrimental effect of the $Mg_2Si$-type of solid state precipitates by heat treatment and melt-separated $Mg_2Si$-dispersoids than the elemental βMn, for PA Mg—Sb splats of which the result for two concentrations (2.46 and 7.09 wt. % Sb) are shown:

FIGS. 36 to 39 where FIG. 36 showing PA Mg-2.46 wt. % Sb splat in the as-solidified condition and prior to immersion (cf. FIG. 37; N.B. scale is in [mm]) and FIG. 37 with PA Mg-2.46 wt. % Sb splat, as-solidified condition, after (top) 0.5, (bottom left) 1.0 and (bottom right) 3.0 h immersion in 5 wt. % (0.3 $H_2O_2$)–1 wt. % NaCl aqueous solution, and FIG. 38 PA Mg-2.46 wt. % Sb splat, heat treated for 1 h at 400° C. a) prior to and b) after 0.5, c) 1.0 and d) 3.0 h immersion in 5 wt. % (0.3 $H_2O_2$)–1 wt. % NaCl aqueous solution showing the effect of solid state precipitation and/or coarsening of $Mg_3Sb_2$ second phases, i.e. rapid solidification vs. the as-solidified condition (cf. FIGS. 36 and 37) and FIG. 39 with PA Mg-7.09 wt. % Sb splat in as-solidified condition and embrittled by $Mg_3Sb_2$-dispersoids separated from the melt as indicated by cracks near rim and showing increasing pitting (in contrast to PA Mg-2.46 wt. % Sb) in regions of uncontrolled fluid flow and/or at splat rim after immersion as before, cf. FIG. 38, or heat-treated PA Mg-Ca splats with 2.0 to 5.0 wt. % Ca: FIGS. 40 to 42 where FIG. 40 showing PA Mg-3.5 wt. % Ca splat heat-treated for 1 h at 400° C. (top) prior to and (bottom) after 2 h immersion in 5 wt. % (0.3 $H_2O_2$)–1 wt. % NaCl aqueous solution with (bottom left) side of dendritic chill-off zone and (bottom right) side of featureless chill-zone in the as-splatted state, FIG. 41 showing PA Mg-2.0 wt. % Ca splat heat treated for 1 h at 400° C. with a) prior to and b) after 0.5, c) 1 and d) 3 h immersion in 5 wt. % (0.3 $H_2O_2$)–1 wt. % NaCl aqueous solution with black islands representing predendritic features in featureless chill-zone. No corrosion was observed at this side of the splat and FIG. 42 with PA Mg-5.0 wt. % Ca splat heat treated for 1 h at 400° C., here chill-side (featureless) zone without showing corrosive attack a) prior to and b) after 0.5, c) 1 and d) 3 h immersion in 5 wt. % (0.3 $H_2O_2$)–1 wt. % NaCl aqueous olution, for as-solidified and heat-treated PA-Mg—Sr: FIG. 43 showing PA Mg-1.5 wt. % Sr splat, as-solidified condition, (top) prior to and (bottom) after 2 h immersion in 5 wt. % (0.3 $H_2O_2$)–1 wt. % NaCl aqueous solution for (bottom left) featureless chill-zone microstructure and (bottom right) dendritic chill-off zone. Note the very low partition coefficient $k_0$ in the system Mg—Sr over Mg—Ca making it significantly more difficult to achieve substantial supersaturation of cph-Mg with Sr vs.

cph-Mg with Ca) and heat-treated PA Mg—Ba splats (not shown here), for PA Mg—Pd and PA Mg—Au splats: cf. FIGS. 44 to 46 where FIG. 44 showing PA Mg-4.23 wt. % Pd splat in as-splatted condition and immersed for 2 h in 5 wt. % (0.3 $H_2O_2$)–1 wt. % NaCl aqueous solution with (top) corrosive attack localized to splat rim on side of featureless chill-zone microstructure and (bottom) excessive corrosion (black tarnish) on the side of the dendritic chill-off zone, FIG. 45 with PA Mg-3.91 wt. % Au splat in as-solidified condition, here featureless chill-zone microstructure (top) prior to and (bottom) after 3 h immersion in 5 wt. % (0.3 $H_2O_2$)–1 wt. % NaCl aqueous solution showing localized corrosion at splat rim and FIG. 46 showing PA Mg-14.19 wt. % Au splat heat-treated for 1 h at 400° C. after (top) 0.5 h and (bottom) 1 hour immersion in 5 wt. % (0.3 $H_2O_2$)–1 wt. % NaCl aqueous solution with (all left) featureless chill-zone microstructure and (all right) dendritic chill-off zone microstructure, as well as for Mg—Y splats: FIG. 19 showing as-solidified PA Mg-15 and 20 wt. % yttrium splats, a) prior to immersion for 15 Y and b) and c) immersed for 3 h in 5% (0.3 $H_2O_2$)–1% NaCl aqueous solution as to the modified Machu-test (N.B. featureless columnar grains traversed the entire cross-sections of PA Mg-splats), where b) is 15 Y and c) is 20 Y in cph-Mg showing corrosive attack over the major fraction of corresponding surface splats. The immersion test of the extended solid solution of yttrium in αMg made by PA splat-cooling did not show the improvements in corrosion resistance over prior-art alloys as was obtained by the solid solution of rare earth metals in cph-Mg (FIG. 19). This is in agreement with the earlier observations made by polarization tests indicating that microsegregations (avoidable by PVD-methods, for example, see below) are particularly harmful in the system Mg—Y (cf. F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1; F. Hehmann, Rasch Erstarrte Magnesium-Mischkristalle und Ihr Umwandlungs- und Korrosionsverhalten, *Doctoral Thesis*, University of Stuttgart, published in Fortschrittberichte VDI', Reihe 5, No 155: Grund-und Werkstoffe', VDI-Verlag, Düsseldorf, F. R. G., January 1989).

The systems Mg—Ca, Mg—Sr and Mg—Ba provide a particular family of Mg-based alloys which is discussed in the chapter on n-conduction (see below). These elements do not provide sufficiently stable Mg-based ne-phases (amorphous Mg-10 wt. % Ca, for example, transformed at 110° C., see also the work by Mordike et al. on corresponding extended solid solution in cph-Mg, below). The particular role of the alkaline earth elements is that they are less noble than Mg on the one hand so providing an electron pressure on the MgO surface oxide film so a micro-cathodic protection within a size regime of solid state precipitates on the other. This is most effective directly after formation of such second phases from the solid state (cf. work by Pechiney, below), not from the liquid. That is, not the $Mg_2Ca$ phase is a problem triggering eventually corrosion in an Mg-matrix, but its size. When separated from the melt, the size is too large. If formed from the solid state, however, attention is required to avoid averaging of this particular type of second phases. The results for heat-treated and/or as-solidified splats of the systems Mg—Si, Mg—Sb and Mg—Mn showed that no such "size-window" for improved corrosion resistance of Mg exist when the precipitates contain more noble elements than Mg.

All results are consistent in that the homogeneous distribution of the solutes (and solvent Mg, a term which is extended here for non-equilibrium Mg-base phases as well) on an atomic length scale (that is the topological or spatial distribution of different atoms in the surface plane) is the universal pre-requisite for enhancement of the MgO surface film prior to allow individual elements to develop particular advantages with respect to particular environments including the passivation of Mg in environments with higher concentrations of $Cl^-$-ion (see "Hierarchy of Relevant Criteria", below). All results are also consistent in that larger levels of alloying the Mg-based matrix cannot be achieved by processing from the melt even if there was sufficient solubility in the melt as for the investigated systems. This was evident with the systematic decrease in corrosion resistance in the systems Mg—Si, Mg—Sb and Mg—Mn with increasing alloy concentration and the marked reduction of corrosion resistance afforded by a heat treatment and resulting solid state precipitates and/or coarsening of corresponding dispersoids in PA Mg—Si and Mg—Sb splats all evidencing that the homogeneous distribution of alloying elements on an atomic length scale is the universal pre-requisite for Mg-alloy passivation. If the PA-splats showed a distinct two-zone alloy microstructure as to FIGS. 8–10, corrosion on the (macroscopic) side of the featureless chill zone started from the rim of the splat (where the dendritic zone was co-exposed to the 5 wt. % $H_2O_2$–1 wt. % NaCl aqueous solution with the featureless zone due to the cut-off feathered edges) and continued to traverse the cross-section until eventually stopped from further expansion toward the supersaturated inner circle as was evident for PA Mg-5.0 wt. % Si splats (FIGS. 33 and 34). The question whether the enhanced alloying afforded by selected non-equilibrium techniques (see below) provides a passive MgO-based surface oxide film is related to the question whether the alloying addition supports or suppresses the tendency of the MgO-film to transform to the more vulnerable $Mg(OH)_2$-surface film. The Mg—Mn system, however, is at the borderline to the early transition metals which cannot be added by processing from the melt due to liquid immiscibility.

Vapor deposition is a very effective method to suppress microsegregations so to improve microstructural homogeneity. Vapor deposition is considered to result in cooling rates of the order of $10^{10}$ to $10^{12}$ K/s (L. Bianchi, *Journal of Metals* 5, 1991, pp. 45–47). More importantly, vapor deposition has the general advantage over liquid quenching that fragmentation occurs on the level of an individual atom where no latent heat evolving upon solidification can be dissipated back into the fragmented volume. This is indicated by a columnar featureless microstructure of the deposit indicating that a positive temperature gradient had occurred upon condensation, i.e. when the latent heat is directed toward the cooling substrate and the deposit has a lower temperature than the vapor arriving at the deposit surface (cf. J. A. Thornton, High Rate Thick Film Growth, *Ann. Rev. Mater. Sci.* 7, 1977, p. 214; W. Kurz and D. J. Fisher, *Fundamentals of Solidification*, Trans Tech Publications 1989, Switzerland, Germany, UK, USA, 3rd edition, 1989; N.B. equiaxed growth would indicate the reverse).

Vapor deposition incorporates two processing families, namely thermal evaporation and (magnetron) sputtering methods. The sources used for thermal evaporation include resistance, induction, electron beam and microwave heating as well as sublimation, laser beam and arc evaporation methods (R. Glang, *Handbook of Thin Film Technology*, eds. L. I. Maissel and R. Glang, McGraw Hill 1970, pp. 1–7). Another form of vapor deposition is the sputter removal of a certain number of atoms sputtered from the material per incident ion (W. D. Westwood, *MRS Bulletin* 12, 1988, pp. 46–52). Vapor deposition is therefore the ultimate solution of fragmentation via RS-processing without embracing any uncontrolled fluid flow and/or recalescence resulting in micro-segregations as upon liquid quenching even when the employed conditions of heat transfer were very extreme. A substantial increase in the limit of supersaturation can also be obtained by vapor deposition compared to liquid quenching. Maximum equilibrium solid solubility of Cr in fcc-Al, for example, was increased from 0.7 to about 2.5 wt. % Cr by using RSP, but to 10.7 wt. % Cr by employing PVD (R. L. Bickerdike et al., *Int. J. Rapid Solidification* (2), 1986, pp. 1–19, M. C. Connell and P. G. Partridge, *Acta metall.* 35 (8), 1987, pp. 1973–1980; b) pp. 1981–1993). The microstructure of binary PVD Al—Cr alloys was completely free of second phases.

The improvements in corrosion behavior reported by Bray et al. (D. J. Bray, R. W. Gardiner, B. W. Viney and H. M. Flower, Conf. Proc. *Magnesium Alloys and Their Applications*, DGM, Oberursel, FRG, 1992), pp. 159–166; D. J. Bray, R. W. Gardiner and B. W. Viney, GB-Patent 2,262,539 A, 23 Jun., 1993) on vapor deposited solid solutions of Ti in cph-Mg were reproduced by Hirota et al. (E. Hirota, H. Habazaki, A. Kawashima, K. Asami and K. Hasimoto, *Scientific Report A*38, 1 Mar., 1993, The University of Tohuko, Japan) via magnetron sputtering to obtain the extended solid solution of 8–47 Ti [at. %] in cph-Mg. Subsequent anodic polarization in 1 mol HCl aqueous solution resulted in Ti-cation- and corresponding $O_2$-anion enrichment and in $Mg^{2+}$-cation and $OH^-$-anion depletion of the surface oxide underlying the passivation in this electrolyte which was observed at potentials above the observed corrosion potentials at –0.68 (e.g. for Mg-47 Ti) with respect to the standard calomel electrode potential.

A series of alloyed vapor deposits of Mg-8 (1.5) Ce and Mg-4 (2.1) Ti [wt. % (at. %)] was prepared by vapor sputtering employing a deposition rate of about 50 μm/h. The deposition was intercepted when the deposits had reached a thickness of 250–300 μm. Initial tests were performed by continuous immersion of test coupons of size 60 mm*40 mm of the VD-alloys into the aqueous solution of the modified Machu-test containing 5% $H_2O_2$ (30 wt. %) and 1 wt. % NaCl at 27° C. Reference alloy AZ91 and vapor deposited Mg4 wt. % Ti was attacked uniformly over the entire surface (FIG. 47 showing test coupons of AZ91 and of vapor deposited Mg-4 wt. % Ti and Mg-7 wt. % Ce (both deposits here made at 60° C. with the Ti and Ce held in the cph-Mg solid solution) prior to (top, with bend contrast for Mg4 Ti) and after (bottom) 0.5 h immersion in 5% (0.3 $H_2O_2$)–1% NaCl aqueous solution as to the modified Machu-test. The porosity (which was absent at deposition at higher temperatures, e.g. >100° C.) leads to rapid attack of the VD-alloys and is at least as harmful as the microsegregations of corresponding melt processed alloys (see above), but the corrosive attack on Mg-7 Ce was less rapidly (75% of the exposed surface area) than on Mg-4 Ti (>90%), while reference alloy AZ91 corroded more rapidly (100%) than both VD alloys). When the substrate temperature was held at 60° C., the VD Mg-8 Ce alloy showed only very localized pitting corrosion embedding surface areas which were not attacked by the electrolyte (FIG. 47). The non-affected areas of the VD Mg-8 Ce alloy retained their metallic shiny glamour even after 2 hours immersion. Ce appeared as a more effective alloying element than Ti for passivation of magnesium alloys by alloying the cph-Mg solid solution so confirming the observations reported in (cf. F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1; F. Hehmann, Rasch Erstarrte Magnesium-Mischkristalle und Ihr Umwandlungs- und Korrosionsverhalten, *Doctoral Thesis*, University of Stuttgart, published in Fortschrittberichte VDI', Reihe 5, No 155: Grund-und Werkstoffe', VDI-Verlag, Düsseldorf, F. R. G., January 1989) compared to those in (D. J. Bray, R. W. Gardiner, B. W. Viney and H. M. Flower, *Conf. Proc. Magnesium Alloys and Their Applications*, DGM, Oberursel, FRG, 1992), pp. 159–166; D. J. Bray, R. W. Gardiner and B. W. Viney, GB-Patent 2,262,539 A, 23 Jun., 1993).

Pitting corrosion, however, was not observed for the featureless chill zone of PA-Mg—Ce splats under the conditions of the modified Machu-test. FIG. 48 shows the optical microstructure of transverse section of vapor deposited (top, 1000:1) and chill cast (bottom, 200:1) Mg-8 wt. % Ce alloy showing featureless columnar growth after vapor deposition and dendritic growth with two regimes of dendrite arm spacings after casting. After 60 sec chemical etching in 5% picral (plus 0.5% glacial acetic acid) the as-sputtered microstructure of Mg-8 Ce showed a featureless columnar grain structure without any response to indicate microsegregations over the entire cross-section of 250 mm, while the as-cast version responded instantly to chemical etching as for the dendritic chill-off zone of PA-splats. Comparison with previous work (cf. F. Hehmann, Rasch Erstarrte Magnesium-Mischkristalle und Ihr Umwandlungs- und Korrosionsv erhalten, *Doctoral Thesis*, University of Stuttgart, published in Fortschrittberichte VDI, Reihe 5, No 155: Grund-und Werkstoffe, VDI-Verlag, Düsseldorf, F. R. G., January 1989; F. Hehmann, F. Sommer and B. Predel, Extension of Solid Solubility in Magnesium by Rapid Solidification, *Mat. Sci. Engng. A*125 (2), 1990, pp. 249–265) of the lattice parameter 'a' and 'c' obtained by X-ray diffraction indicated that all Ce was tied up in the extended cph-Mg-base solid solution without the microsegregations present even after extreme liquid fragmentation and quenching.

The overall microstructural homogeneity of the embodimented alloys was improved substantially by vapor deposition using the sputtering method compared to solidification processing from the liquid phase. Sputtering leads to less porosity compared to thermal evaporation, but it embeds also the ions used for the bombarding of the target (S. M. Rossnagel and J. J. Cuomo, *MRS Bulletin* 12, 1988, pp. 40–45). The porosity in as-deposited alloys is a result of protuberances that grow upon condensation of the alloy vapor resulting in shadowing and pores that oxidize in vacuum and under subsequent exposure to normal atmosphere (R. W. Gardiner, U.S. Pat. No. 4,976,995, Dec. 11, 1990). The observed pitting corrosion has thus resulted from the porosity due to deposition of the alloys at 60° C. triggering artefacts equivalent or worse compared to microsegregations so to obscure the surface conditions in real life (cf. D. J. Bray, R. W. Gardiner, B. W. Viney and H. M. Flower, Conf. Proc. *Magnesium Alloys and Their Applications*, DGM, Oberursel, FRG, 1992, p. 163). The absence of porosity in as-deposited supersaturated cph-Mg-base solid solutions is therefore at least as important as the suppression of microsegregations to develop magnesium alloys with substantially improved surface passivity. It can be achieved by in-situ consolidation and/or by vapor deposition at elevated temperatures (S. M. Rossnagel and J. J. Cuomo, *MRS Bulletin* 12, 1988, pp. 40–45; R. W. Gardiner, U.S. Pat. No. 4,976,995, Dec. 11, 1990) which must not be as elevated to trigger disintegration of the supersaturated solid solution.

Obviously, the effect on corrosion behavior of both microsegregations and porosity form the crucial, but yet underestimated quality parameters of high performance passive magnesium alloys. The most important result obtained here is that microsegregations can be suppressed effectively by vapor deposition, since the growth normal of the metastable solid solution, i.e. the vector normal to the continuously advancing growth front by vapor deposition (as indicated for 8 wt. % Ce in cph-Mg) is practically unlimited.

2. Thermal Stability by Differential Scanning Calorimetry (DSC) of the Extended Solid Solution (TSSE) of Ligh Rare Earth Metals in cph-Mg The advantage over transmission electron microscopy (TEM) of DSC-analysis of rapidly solidified (RS) metastable phases is that it operates on a macroscopic scale and tells with certainty whether the investigated material represented the metastable phases concerned, while TEM is subjected to statistics of sampling and therefore never representative for a metastable RS-material that was subjected to recalescence. In PA-splat cooling, the sharp transition from featureless to dendritic microstructure results from recalescence which triggers a dramatic decrease of several orders of magnitude in front velocity compared to the initial velocity after traversing about 20 to 40 $\mu$m of the cross-section (cf. FIGS. 8–10 and F. Hehmann, Terminal Solid Solubility Extension in Magnesium by Rapid Solidification, Proc. 47*th Int. Magnesium Conference*, May 29–31, 1990, Cannes, Int. Mag. Association, VA, pp. 76–82; F. Hehmann and P. Tsakiropoulos, Prediction of Temperature Stable Aluminium Alloys Made by the Osprey Process (I): Supersaturation of Binary Eutectic Additions in aAl by Recalesced Free Adiabatic Growth, *Proc. First Int. Conf on Spray Forming*, eds. J. Wood et al., The Inst. of Metals, London, December 1990, page 16–1–16–15). Microstructural modeling (M. Müller, J. Wachter and F. Sommer, *Proc. Conf. Mg-Alloys and Their Applications*, eds. B. L. Mordike and F. Hehmann, DGM, Oberursel, October 1992, pp. 527–534) including external heat flow and dendritic and planar crystal growth showed that the width of extended solid solutions of various elements in cph-Mg is limited to some 20 $\mu$m by employing a heat transfer coefficient h=2–3000 [kW/(Km$^2$)]. This value is one of the highest obtainable values for quenching from the liquid phase. The predictions, however, are in good agreement with the observations of such microstructures (cf. F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1; F. Hehmann, F. Sommer and B. Predel, Extension of Solid Solubility in Magnesium by Rapid Solidification, *Mat. Sci. Engng.* A125 (2), 1990, pp. 249–265). The growth normal of supersaturated one phase microstructures obtained by liquid quenching is limited to some microns-even under relatively extreme heat transfer conditions. Note that the growth normal is the vector of solid growth perpendicular to the growth front of segregation-less or nearly segregation-free solidification. Fragmentation down to a droplet size of about 20 $\mu$m is therefore inevitable to avoid microsegregations which interfere with DSC-analysis of the supersaturated cph-Mg-base solid solution.

In order to examine the transformation behavior of the cph-Mg solid solution by DSC it was thus necessary to refer to the gun technique for quenching from the liquid phase (cf. P. Duwez and H. Willens, *TMS-AIME* 227, 1963, p. 362) and to vapor deposition. Both methods provide a high degree of fragmentation coupled with sufficient heat transfer required for a microstructure without substantial microsegregations. Otherwise, small thermal effects of the metastable proportion of the microstructure cannot be discriminated from those thermal effects arising upon heating from the re-dissolution in the solid state of the second phases forming due to recalescence upon and/or aging after solidification (cf. chapter "Natural Aging" below). The DSC-analyses shown in FIGS. 50–58 were done on a Dupont 910 analyser. The exothermal effects are plotted upwards in FIGS. 50–58.

The gun splats employed were of diameter <0.5 to 1.5 mm and of thickness <0.1 $\mu$m to 40 $\mu$m which represents a wide range of cooling rates from $10^5$ to $10^{10}$ K/s (P. Duwez and H. Willens, TMS-AIME 227, 1963, p. 362). A large majority of the population of droplets made by the gun-technique, i.e. >90% by weight, was of thickness <20 $\mu$m.

Figure 49:
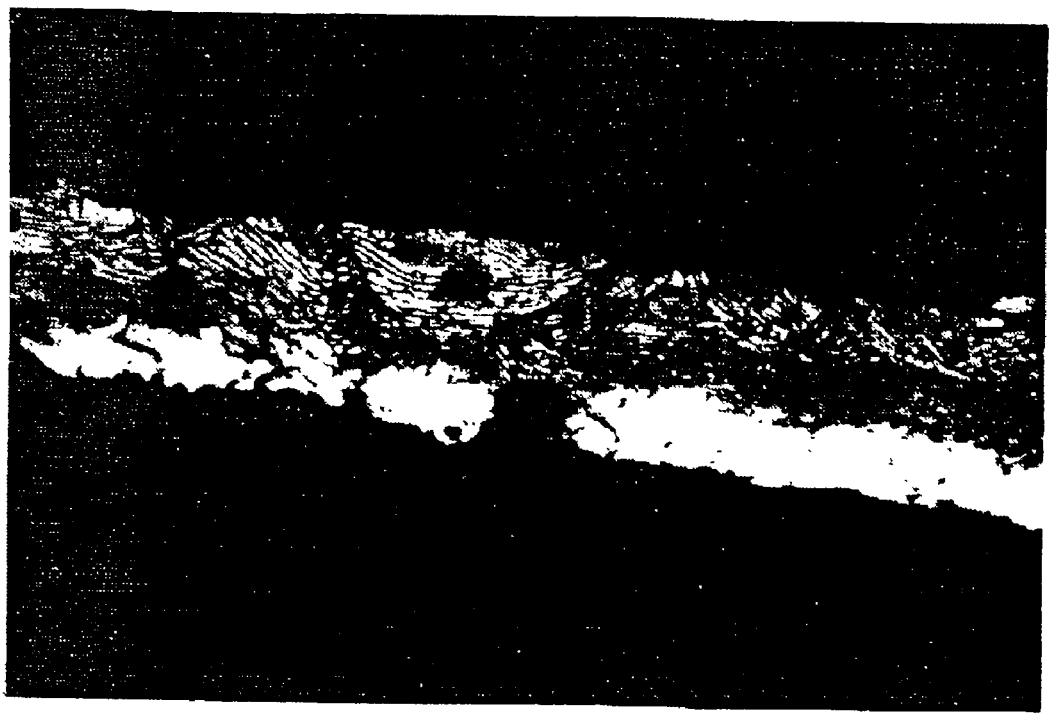
FIG. 49 Optical microstructure (1000:1) of transverse section of Mg-base gun splat containing 6.0 wt. % La.

The microstructure of gun splats indicated a transition from featureless growth to very fine banded cellular structure of cell size usually <1 $\mu$m (FIG. 49 showing optical microstructure (1000:1) of transverse section of Mg-base gun splat containing 6.0 wt. % La with featureless surface chill zone and banded cellular microstructure at the chill-off side of the splat. The degree of supersaturation of the banded microstructure is not very different compared to that of the featureless chill zone and is significantly larger compared to that of the dendritic chill-off zone of PA-splats). Banded microstructures are a result of velocity oscillations near the velocity for absolute stability (which is the front velocity for segregation-free growth). They are one evidence that growth in the cellular zone was not controlled by recalescence (M. Carrard, M. Gremaud, M. Zimmermann and W. Kurz, *Acta metall. mater.* 40 (5), 1992, pp. 983–996). Accordingly, the degree of supersaturation of gun-splats is relatively high compared to corresponding cell boundary segregations.

Figure 50:
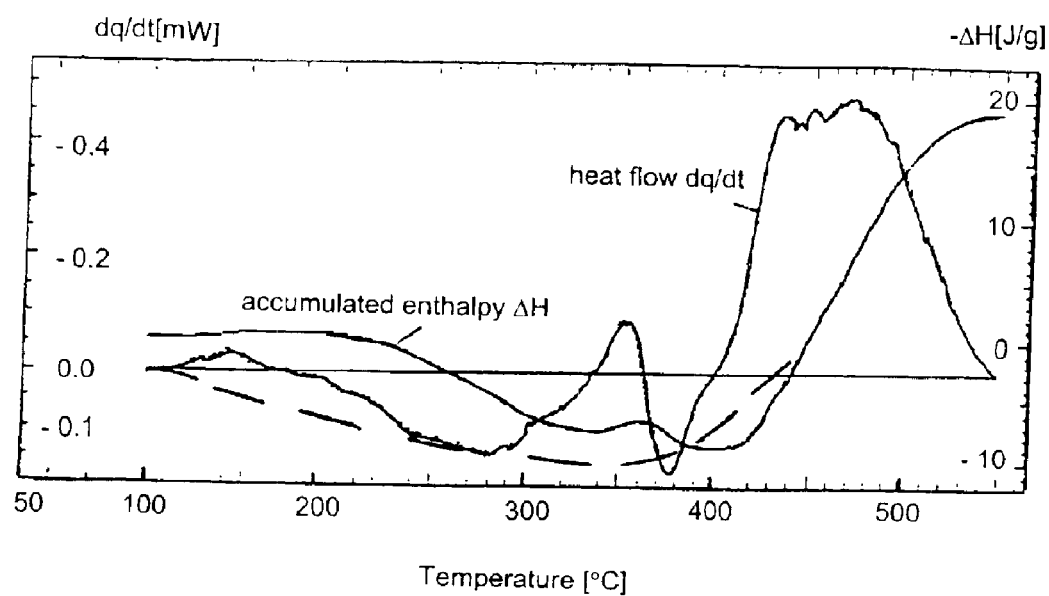
FIG. 50 Showing difference of heat flow between two successive differential scanning analyses (DSC) of gun splats of Mg-8 wt. % Ce alloy.
Figure 51:
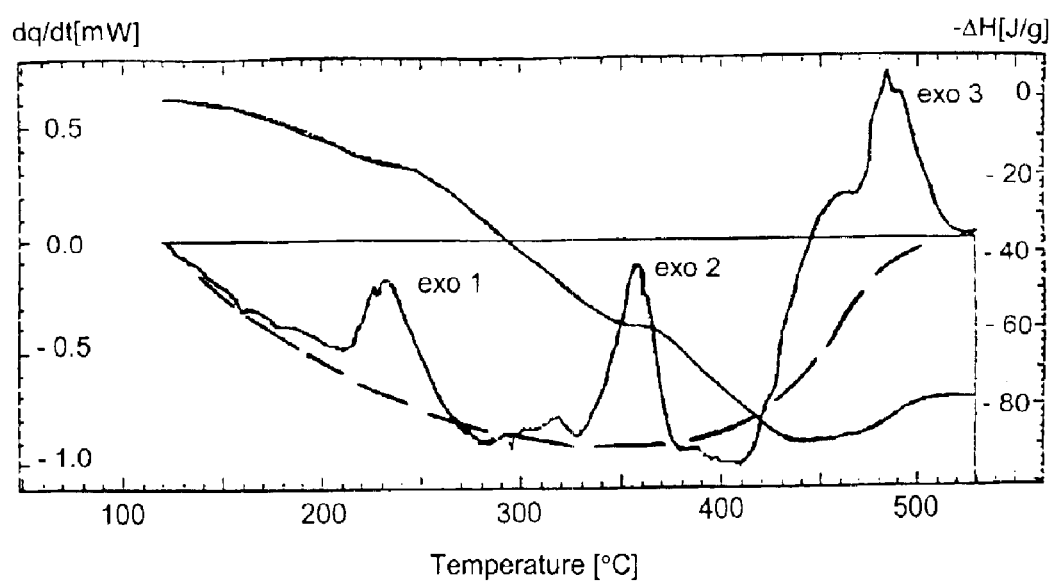
FIG. 51 As for FIG. 50, here with employing Ta-foils to getter oxygen traces in the nitrogen used to purge the cell of the DSC-apparatus.
Figure 52:
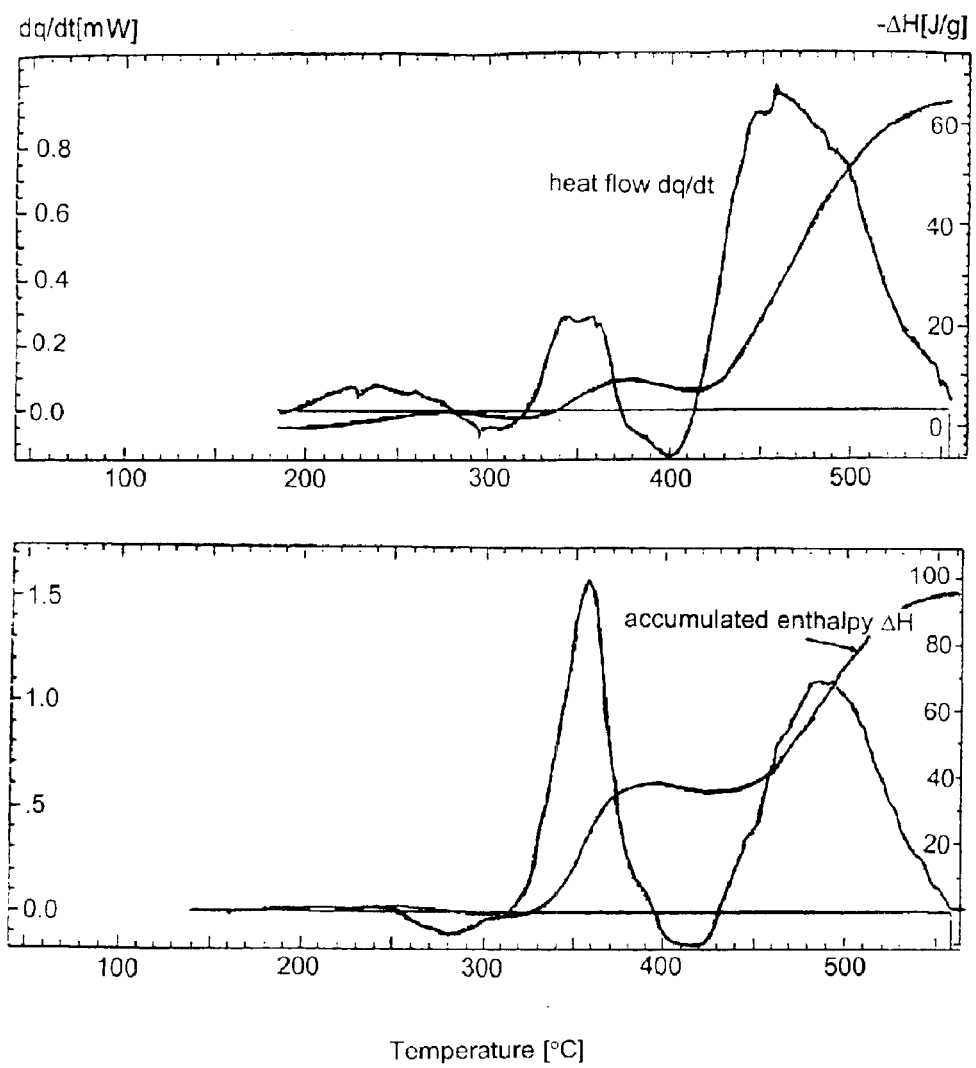
FIG. 52 As for FIG. 51, here gun splats of Mg-1 Nd (top) and Mg-1 La (bottom, nom. [wt. %]).

FIG. 50 shows three exothermal effects of gun splats of a Mg-8 Ce alloy (nominal [wt. %]) with regard to the baseline (dotted), i.e. a flat spectrum between 150° and 200° C., an exothermal peak at 350° C. and a relatively large and wide thermal effect between 400° and 500° C. They are from the difference of heat flow between two successive differential scanning analyses (DSC) of gun splats of Mg-8 wt. % Ce alloy at a heating rate 40 K/min and employing a mass of 2.23 mg. A non-linear baseline drift was superimposed to the analyses that was not corrected for and is indicated by the difference between zero-line and dashed line. Calibration and evaluation of the activation energy for transformation results in some 60° C. lower temperatures for isothermal transformation and growth temperatures (see below). The heat flow of exothermal effect no 3 was reduced when a tantalum foil was employed to getter residual oxygen in the SN argon used as a purge gas for the DSC-cell (FIG. 51 is as for FIG. 50, here employing Ta-foils to getter oxygen traces in the nitrogen used to purge the cell of the DSC-apparatus and evidently reducing the exothermal effect at temperatures above 400° C. at a heating rate of 40 K/min and employing a mass of 2.05 mg; N.B. gun splats form a relatively large surface area per unit volume of material exposed to the purge gas). The same sequence of these three exothermal effects was observed for Mg-gun splats of nominal composition 1 wt. % La and 1 wt. % Nd (FIG. 52 is as for FIG. 51, here with gun splats of Mg-1 Nd (top) and Mg-1 La (bottom, nominal [wt. %]) at a heating rate of 40 K/min and employing a mass of 2.07 (top) and 1.94 (bottom) mg). The sequence of exothermal transformation peaks was virtually independent on type of light rare earth solutes in the αMg solid solution.

A similar series of exothermal effects was observed on DSC-analysis of Mg—Y splats and ribbons including an exothermal spectrum no 1 at around 160° C. representing the formation of a bco-β" phase followed by an exothermal effect no 2 at around 260° C. representing the combined formation of a transgranular β'-phase and of the equilibrium β-phase at cell boundaries then followed by an exothermal effect no 3 for transgranular formation of equilibrium α+β at around 350° C. (F. Sommer, F. Hehmann and H. Jones, Transformation Behaviour of the Extended Solid Solution of Yttrium in Magnesium by Rapid Solidification; *J. Less Common Metals* 159, (1990), pp. 237–259). According to Karimzadeh (H. Karimzadeh, The Microstructure and Mechanical Properties of some Mg-Alloys Containing Yttrium and Heavy Rare Earth Metals, *PhD Thesis, University of Manchester*, October 1985), the transformation sequence of the supersaturated solid solution of conventionally cast Mg-3 wt. % Nd alloy, i.e. cph-Mg, was observed to follow upon isothermal aging:

|  | Mg—Nd | --> (Mg₃Nd) | --> Mg₃Nd | --> Mg₁₂Nd |
|---|---|---|---|---|
| cph-(α')Mg nucleation temperatures: | --> G.P. zones <175° C. | --> D019 β" 175°–200° C. | --> fcc-β' 200°–300° C. | --> bcc-β >300° C. |

Omori et al. reported (G. Omori, S. Matsuo and H. Asada, Precipitation process in Mg Ce-Alloys, *Trans JIM*, Vol. 16, 1975) the transformation sequence of the equilibrium solid solution of 1.3 wt. % Ce in cph-Mg to follow precipitation at 150° C. of intermediate phases at grain boundaries and dislocations followed by transgranular precipitation at 200° C. of intermediate phases which were found to be responsible for hardening the alloy and by formation of the equilibrium phases at temperatures above 250° C. Wei and Dunlop showed in more detail (L. Y. Wei and G. L. Dunlop, Conf. Proc. *Magnesium Alloys and Their Applications*, DGM, Oberursel, FRG, 1992, pp. 335–342) that the combined effect of RE-elements does not change the precipitation sequence of an Mg-1.3 wt. % misch-metal alloy compared to the sequence of the solid solution of elemental RE additions in cph-Mg after isothermal heat treatment for 3 h following:

boundaries, but also by compound-type of heavy earth nuclei that might have already formed in the melt and that did not dissolve during solution treatment.

Form and magnitude of the observed thermal effects are therefore largely dependent on the microstructure induced by the RS-method employed. A large concentration of dislocations, grain boundaries, microsegregations along these microstructural features and of HRE-nuclei would thus favor the exothermal reactions no 1 and 2 at lower temperatures at the expense of the reaction at above 300° C. and vice versa. In rapidly solidified Mg—Y alloys, for example, 11 microstructural evolutions were introduced by rapid quenching from the melt and which were identified to result in a distinct separation of transformation processes of cph-Mg at grain and cell boundaries below 300° C. (corresponding to about 20% of the overall transformation of cph-Mg) and in the interior of grains above 300° C. (corresponding to about

|  | Mg-RE | -> (Mg₃RE + Mg₁₂RE(1)) | -> Mg₁₂RE(2) | -> Mg₁₂RE(3) |
|---|---|---|---|---|
| cph-(α')Mg nucleation & growth for 3 h: | --> G.P. zones <150° C. | --> (fcc-β'(disl.) + bcc-β₁) 150°–200° C. | --> bcc-β₂ 250° C. | --> bcc-β₃ >300° C. | where:

$\beta_1$=hexagonal prism Mg₁₂RE—particles of height 35 nm*diameter 50 nm and considered to be responsible for age-hardening the alloy by obstruction of dislocations in the basal plane.

$\beta_2$=Mg₁₂RE—particles of irregular morphology stemming the transformation of fcc-β' at dislocations the β₂-phase.

$\beta_3$=Mg₁₂RE—particles of height 250 nm*length 100 nm.

For the commercial alloy WE43, the β'-phase was proposed (M. Ahmed, G. W. Lorimer, P. Lyon and R. Pilkington, Conf. Proc. *Magnesium Alloys and Their Applications*, DGM, Oberursel, FRG, 1992, pp. 301–308) to correspond to Mg₁₂NdY and the b-equilibrium phase to correspond to Mg₁₂Nd₂Y. In all cases, three distinct reactions were observed with increasing temperature involving age hardening by the intermediate and/or transgranular β", β'- and fine β-phases after formation and/or dissolution of GP-zones, but prior to formation of transgranular equilibrium phases. That is, that no hardening was observed by the formation of GP-zones at temperatures <150° C. and that hardening does not require the entire transformation of the passivating extended solid solution of light rare earth elements in αMg leaving ample freedom for alloy conversion of these microstructures into final product form. Furthermore, Wei and Dunlop considered (L. Y. Wei and G. L. Dunlop, Conf. Proc. *Magnesium Alloys and Their Applications*, DGM, Oberursel, FRG, 1992, pp. 335–342) that:

1. transgranular GP-zones dissolve rather than transform at the transition from temperatures <150° C. to temperatures above this threshold.
2. nucleation and growth of the fcc-β'- and the bcc-β₁-phase was not only promoted by dislocations, twin and grain 80% of the overall transformation of cph-Mg) resulting in two independent microstructural evolutions (cf. F. Sommer, F. Hehmann and H. Jones, Transformation Behavior of the Extended Solid Solution of Yttrium in Magnesium by Rapid Solidification, *J. Less Common Metals* 159, (1990), pp. 237–259).

Figure 53:
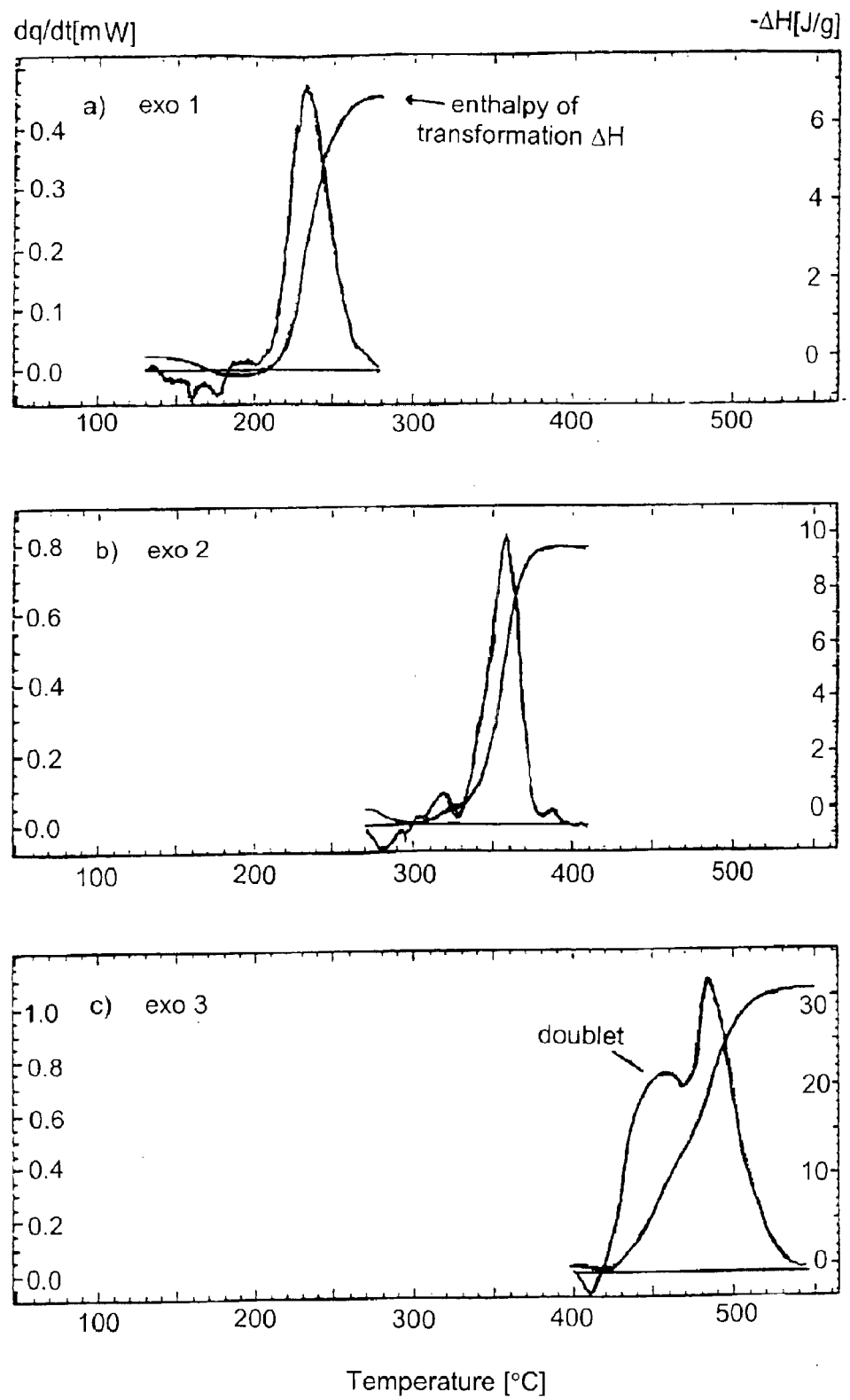
FIG. 53 Individual discrimination and subsequent evaluation to reduce the non-linear error of DSC-analysis of gun splats of Mg-8 wt. % Ce alloy.

The individual evaluation of the observed exothermal effects of Mg-8 Ce (nominal [wt. %]) yields about 7 J/g for exothermal effect no 1 (attributable to the formation of D019 β" and/or fcc-β'-Mg₃RE), about 10 J/g for exothermal effect no 2 (attributable to growth of β' and the formation of β at grain boundaries) and about 32 J/g for exothermal effect no 3 (attributable to formation and growth of equilibrium-β in the interior of the grains and cells; FIG. 53 showing individual discrimination and subsequent evaluation as to figure caption 50 to reduce the non-linear error of DSC-analysis of gun splats of Mg-8 wt. % Ce alloy resulting in an exothermal enthalpy of transformation of −6.9 (top), −9.8 (center) and −31.8 (bottom) J/g for exothermal effects no 1, 2 and 3 using a heating rate of 40 K/min and employing a sample mass of 3.04 mg). As for the extended solid solution of Y in αMg, the major transformation of the supersaturated solid solution of Ce in cph-Mg occurred at higher temperatures, here above or around 400° C. The enthalpy of transformation of exothermal effect no 2, δH(exo2), of the Mg—La samples, however, was observed to amount to 45 J/g compared to about 10 J/g for Mg—Ce and Mg—Nd gun-splats.

Figure 54:
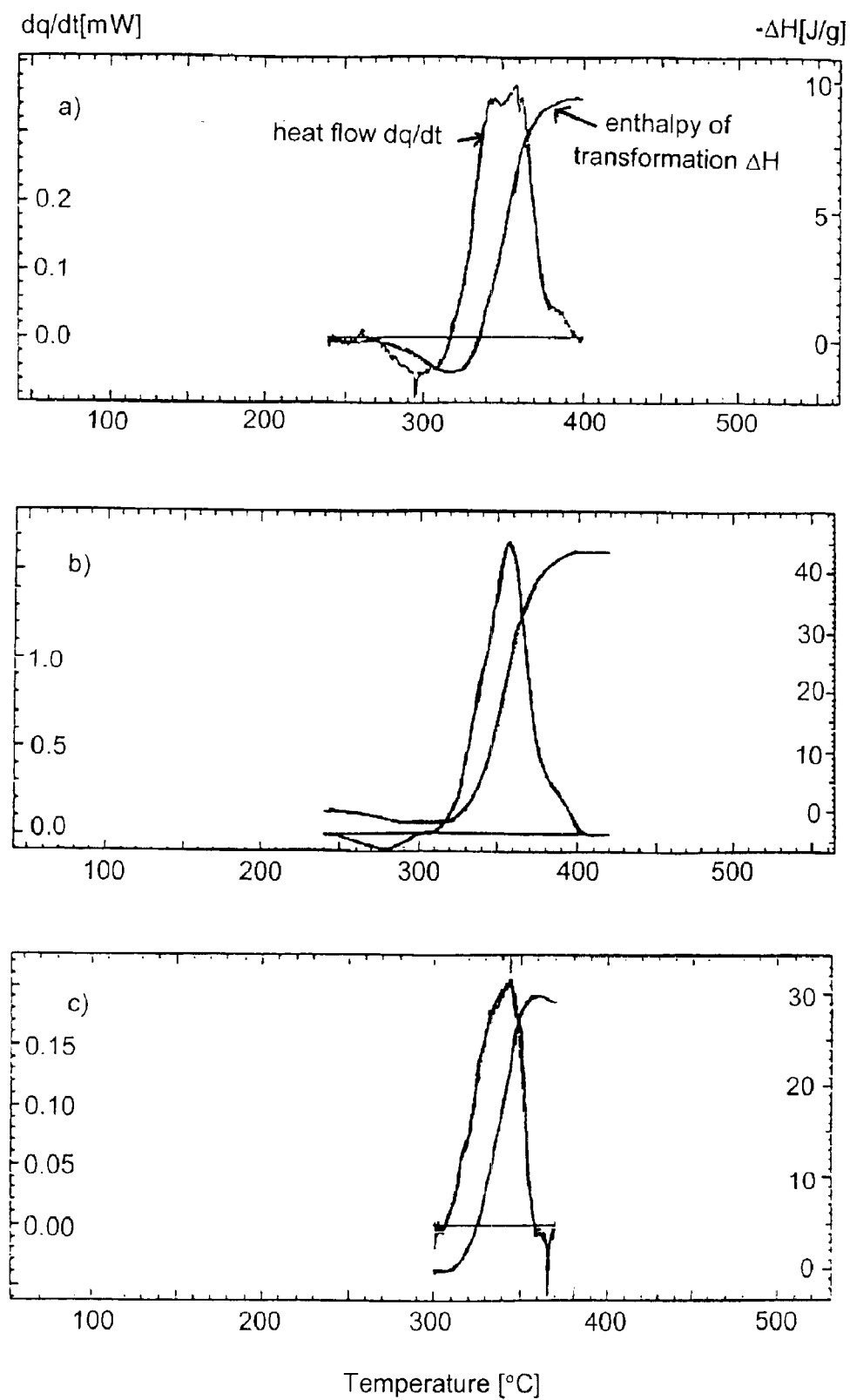
FIG. 54 Individual discrimination as to FIG. 53, here for the exothermal effect no 2 of Mg-base gun splats with 1 Nd (top) and 1 La (center and bottom) (nom. [wt. %]).

The observed peak temperature T of the exothermal effects no 2 was found at T=355°–358° C. for a heating rate of 40 K/min independent on the type of rare earth metal and concentration (FIG. 54 showing individual discrimination as to FIG. 53, here for the exothermal effect no 2 of Mg-base gun splats with 1 Nd (top) and 1 La (center and bottom)

(nominal [wt. %]) resulting in exothermal enthalpies of transformation of −9.7 (top), −45.0 (center) and −30.1 (bottom) J/g at a heating rate of 40 K/min (top and center) and 20 K/min (bottom)). The observation of a nearly constant peak temperature of the exothermal effect no 2 independent on light RE solute and concentration underlines that cell boundaries and resultant microsegregations control the exothermal reaction no 2 of the gun splats and that the volume fraction of microsegregations was particularly high for Mg—La gun splats. The Mg—La system was reported to develop more easily microsegregations compared to Mg—Sm splats of equivalent levels of alloying when made under constant conditions of quenching from the melt and this was coupled to a smaller cell size and a smaller width of the featureless chill zone of Mg—La splats compared to Mg-Sm splats (F. Hehmann, Rasch Erstarrte Magnesium-Mischkristalle und Ihr Umwandlungs-und Korrosionsverhalten, *Doctoral Thesis*, University of Stuttgart, published in Fortschrittberichte VDI, Reihe 5, No 155: Grund-und Werkstoffe, VDI-Verlag, Düsseldorf, F. R. G., January 1989; F. Hehmann, F. Sommer and H. Jones, Extension of Solid Solubility of Yttrium and Rare Earth Metals in Magnesium by Rapid Solidification, *Processing of Metals by Rapid Solidification*, eds. F. H. Froes and S. J. Savage, American Society for Metals, Metals Park, Ohio, 1987, pp. 379–398; F. Hehmann, F. Sommer and B. Predel, Extension of Solid Solubility in Magnesium by Rapid Solidification, *Mat. Sci. Engng.* A125 (2), 1990, pp. 249–265). The volume fraction of microsegregations separated from the melt and the volume fraction of precipitates subsequently formed upon solid state precipitation was observed to increase with increasing cell boundary area within the regime of cellular growth from the liquid phase (F. Sommer, F. Hehmann and H. Jones, Transformation Behaviour of the Extended Solid Solution of Yttrium in Magnesium by Rapid Solidification, *J. Less Common Metals* 159 (1990), pp. 237–259). Obviously, the scatter in cooling conditions upon gun splatting (see above) is of minor significance here compared to the solidification kinetics of the specific alloy systems concerned and which control the formation of the microstructure (cf. H. Jones, *Metallurgical Science and Technology* 7 (1) 1989, pp. 63–75; H. Jones, Mat. Sci. Engng. A137, 1991, pp. 77–85).

Figure 55:
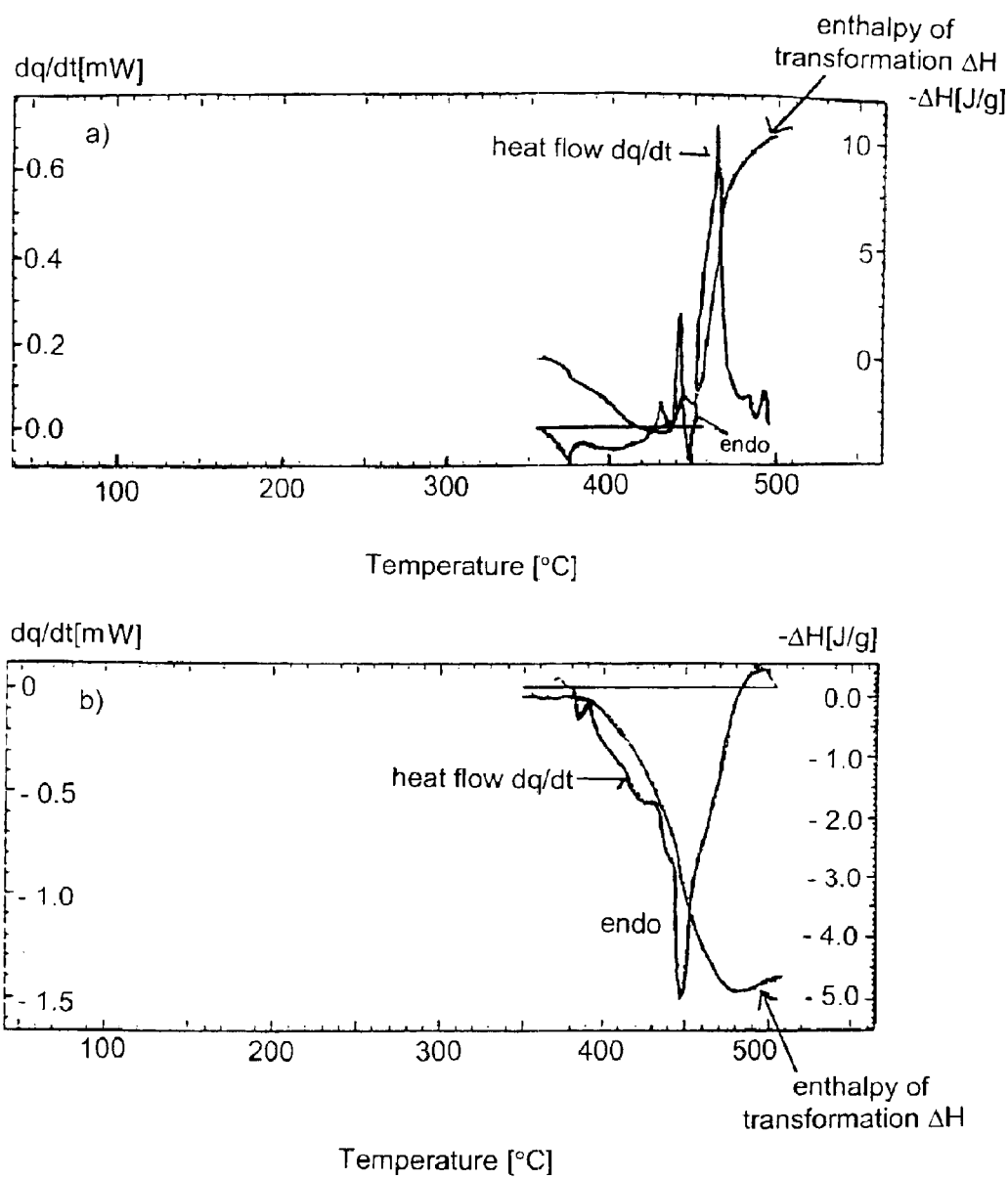
FIG. 55 Individual discrimination of exothermal effect no 3 of gun splatted (top) and vapor deposited (bottom) Mg-8 wt. % Ce.
Figure 56:
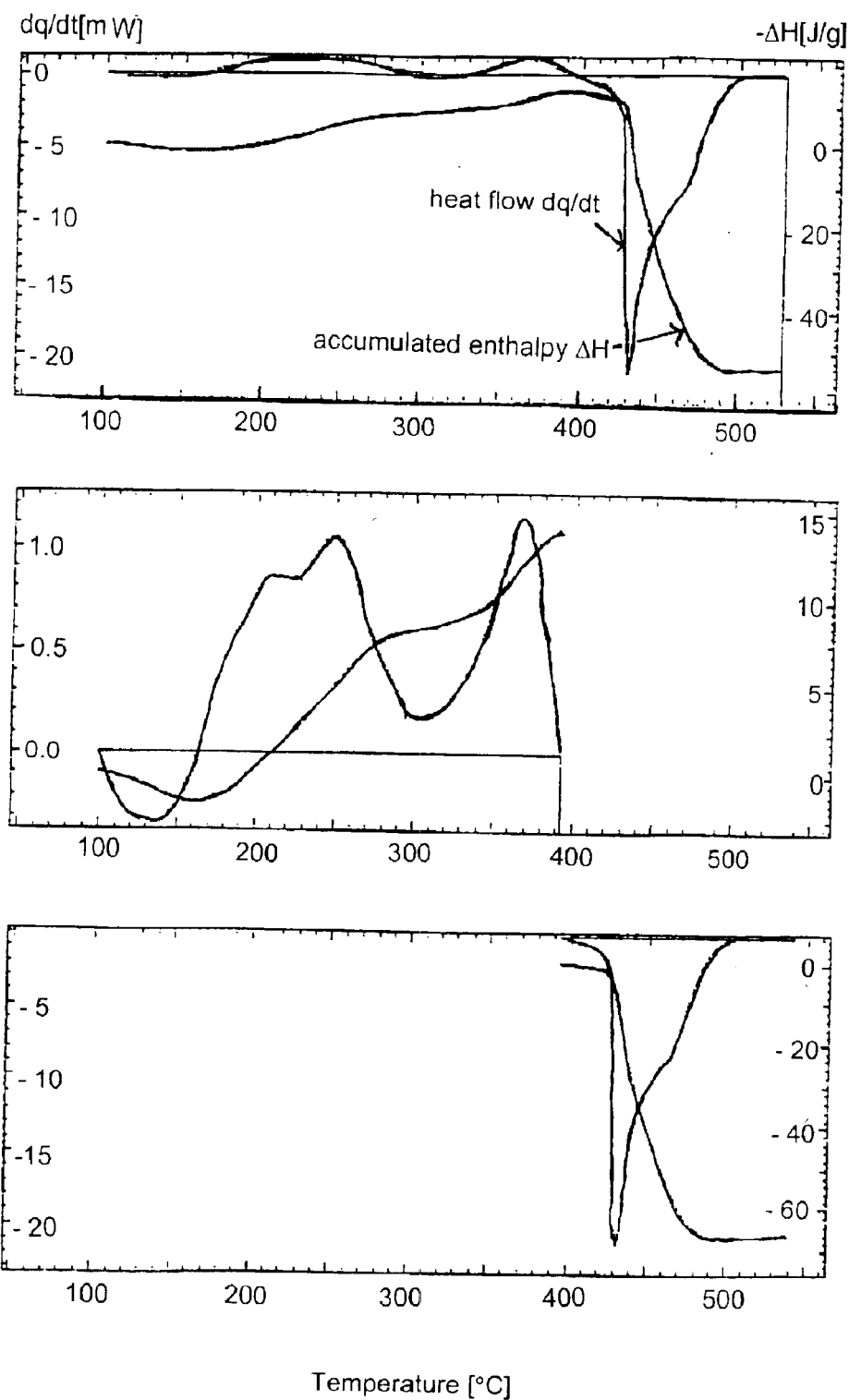
FIG. 56 DSC-analysis (top) including individual discrimination (center and bottom) of vapor deposited Mg-8 wt. % Ce alloy.

An anomalous doublet in exothermal no 3 was observed in Mg—Ce gun splats indicating that an endothermal reaction was superimposed to the exothermal phase transformation at above 400° C. (cf. FIG. 53c). This endothermal effect increased with increasing degree of fragmentation. FIG. 55a shows the result of the DSC-analysis of Mg-8 Ce gun splats of thickness below 2 μm and FIG. 55b shows the DSC analysis of vapor deposited Mg-8 Ce made at a relatively high substrate temperature (see FIG. 55 showing individual discrimination at a heating rate of 40 K/min of exothermal effect no 3 of gun splatted (top) and vapor deposited (bottom) Mg-8 wt. % Ce alloy showing "Umklapp" process in transformation behavior from exothermal (top, with superimposed endothermal effect) to endothermal transformation (bottom)) as the degree of fragmentation had increased prior to solidification (cf. also FIG. 53, bottom). The gun splats were of thickness <1 μm here, while thickness of the gun splats employed for the DSC-analysis in FIG. 23 was >1 μm) At a deposit temperature of 60° C., however, this endothermal effect dominates the transformation behavior of PVD Mg-8 Ce over the exothermal reactions at lower temperatures, which then became negligible (FIG. 56 showing DSC-analysis at a heating rate of 40 K/min (top) including individual discrimination (center and bottom) of vapor deposited Mg-8 wt. % Ce alloy resulting in an exothermal and endothermal enthalpy of transformation, respectively, of −15 (center) and +68.5 (bottom) J/g and showing the complete conversion of exo- to endothermal transformation at temperatures >400° C.).

Endothermal effects can only result from the transformation of an ordered into an disordered phase or from the dissolution of second phases. DSC-analyses (i.e. the word "previous" before DSC was deleted) of the solid solution of Mg—Sm and Mg—Gd alloys show relatively broad endothermal effects resulting from the dissolution at heating rates as high as 40 K/min of very fine (<<1 μm) second phase dispersions (cf. chapter "Natural Aging" below and endothermal effects in FIGS. 59 to 62).

These second phase dispersions were a result of separation from the melt due to insufficient initial undercooling and subsequent recalescence (as indicated by the increase in scale with increasing foil thickness of splats, for example) or they resulted from long term natural aging of the corresponding solid solutions (chapter "Natural Aging" below and endothermal effects in FIGS. 59 to 62).

The peak-shaped form and the magnitude of the large endothermal effect at above 400° C. observed upon DSC-analysis of vapor deposited Mg-8 Ce alloy corresponds to those transformation peaks which were frequently observed for metastable metallic matrix phases such as metallic glasses obtained by rapid quenching from the melt (F. Sommer, G. Bucher and B. Predel, *J. Physique* 41, 1980, pp. C8–563–566). They do not correspond to the less sharp effects observed upon dissolution of second phases. The high reproducibility of this endothermal effect by sampling from a plate of length 65 mm*width 90 mm and of thickness 300 μm combined with increasing evidence of this effect with increasing degree of fragmentation prior to solidification confirmed that corresponding material was not subjected to the often irreproducible effect on microstructure of recalescence. The endothermal effect appears therefore to be related to the transformation of a metastable one phase matrix of Ce in cph-Mg (see FIG. 64) of which the structural difference to solid solution remains to be identified.

Temperature calibration of the Duxont 910 analyser was done by employing the equation $$T=T'*m+b$$

where T=real temperature, T'=recorded temperature resulting in the following coefficients m and b for calibration as a function of heating rate H:

| [K/min] | m[/] | b[K] |
| --- | --- | --- |
| 20 | 1.0011 | −2 |
| 40 | 0.9905 | −4.5 |

The real endothermal peak temperature of the vapor deposited Mg-7.2 Ce alloy arrived at 414.5° C. for a heating rate H=20 K/min (n.b. T'=414.5° C.) and at 423° C. for a heating rate H=40 K/min (n.b. T'=431.5° C.) corresponding to an activation energy $E_A$ of 113 kJ/(mol K) and a quasi-isothermal transformation temperature at between 360° C. (H=0.1 K/min) to 382° C. (H=1 K/min) by using the Kissinger method (H. E. Kissinger, *J. Res. Nat. Bureau of Standards* 57 (4), 1956, p. 217). The real temperature of the exothermal peak No 2 of Mg-1 wt. % La splats made by the gun technique was 342.4° C. for H=20 K/min (N.B. T'=344° C.) and 350° C. for H=40 K/min (N.B. T'=358° C.) corresponding to an activation energy $E_A$ of 83.3 kJ/(mol K) and a quasi-isothermal transformation temperature at 292.6° C. (H=0.1 K/min) by using the Kissinger method.

Figure 58:
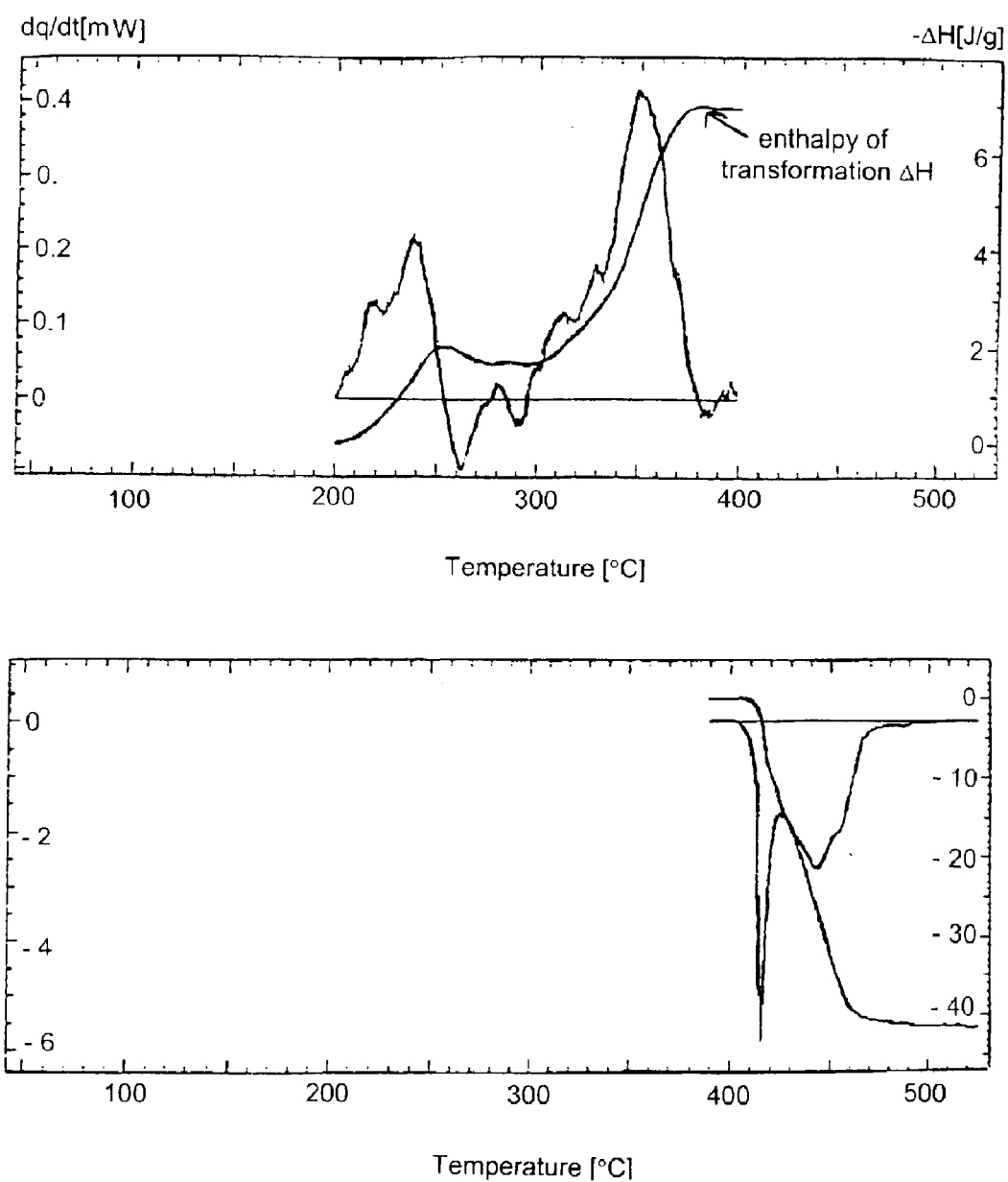
FIG. 58 Individual discrimination of the DSC-analysis shown in FIG. 57.

FIG. 56a shows an integral enthalpy of transformation of 54 J/g of PVD Mg-8 Ce in the temperature range between 100° and 540° C. The integral value is the sum of an exothermic evolution of −14 J/g between 100° and 393° C. and of the above discussed endothermal peak with an endothermal enthalpy of +68 J/g between 393° and 540° C. In terms of absolute values, the exothermic spectrum represents 20.6% of the integral value over a temperature interval of 293° C. or 0.7% per 10° C., while the endothermal effect represents 5.4% of the integral value per 10 K. It is evident that the endothermal effect at above 400° C. represents the transformation of metastable into the equilibrium phases. This transformation seems to be somewhat superimposed by an exothermal reaction immediately starting after the onset of the endothermal peak and increasingly separating the endothermal peak as the heating rate decreases (FIG. 57 is as for FIG. 56 (top), here using a) another sample to employ a heating rate of 40 K/min (top) and b) to employ a heating rate of 20 K/min (bottom), both analyses showing excellent reproducibility of the thermal effects shown in FIG. 56). The transformation sequence of the endothermally transforming phase obtainable with increasing degree of fragmentation such as vapor deposition seems to pass through the phases formed by liquid quenching (cf. FIGS. 57 and 55a). The observed fraction of partial exothermal to endothermal enthalpies of PVD Mg-8 Ce was fully reproducible independent on sampling and heating rate employed (FIG. 58 showing individual discrimination of the DSC-analysis shown in FIG. 57 (bottom) resulting in an exothermal enthalpy of transformation of −7.2 (top) and +42.8 (bottom) J/g for the exothermal effects no 1.2 and the endothermal effect at above 400° C.).

The vapor deposited solid solution of Ce in αMg was close-packed hexagonal (FIG. 64), but it represented a more ordered phase than the resultant equilibrium phases for which the change in entropy provides the driving force for transformation, since:

$$\Delta G < 0$$

so that $/\Delta H/ < /-T\Delta S/$ where ΔG: Gibbs free energy, the driving force for phase transformation, ΔH: the recorded enthalpy of transformation and ΔS: entropy of transformation non-recordable by DSC. The increasing departure from equilibrium appeared to increase the degree of ordering dramatically when fragmentation arrives at the level of individual atoms. The fragmentation down to the level of a single atom, however, appeared as a conditio sine qua non for the formation of a 100% or nearly 100% volume fraction of metastable MgRE phases upon change of matter, i.e. when the recalescence leads to segregation upon solidification and resulting in insufficient metastable volume fraction. The present observations are also not forthcoming from advanced solid state processing without change of matter such as mechanical alloying, which incorporates limitations upon purity and phase homogenization as is set by processing conditions and resultant shear stress imposed on dislocation movement resulting in a multi-phase and which makes it attractive to employ vapor deposition instead, if possible. The mechanical alloying/ball and/or bar milling route, however, provides promising results in the more immediate period of time (see below).

3. Natural Aging Behaviour

Figure 59:
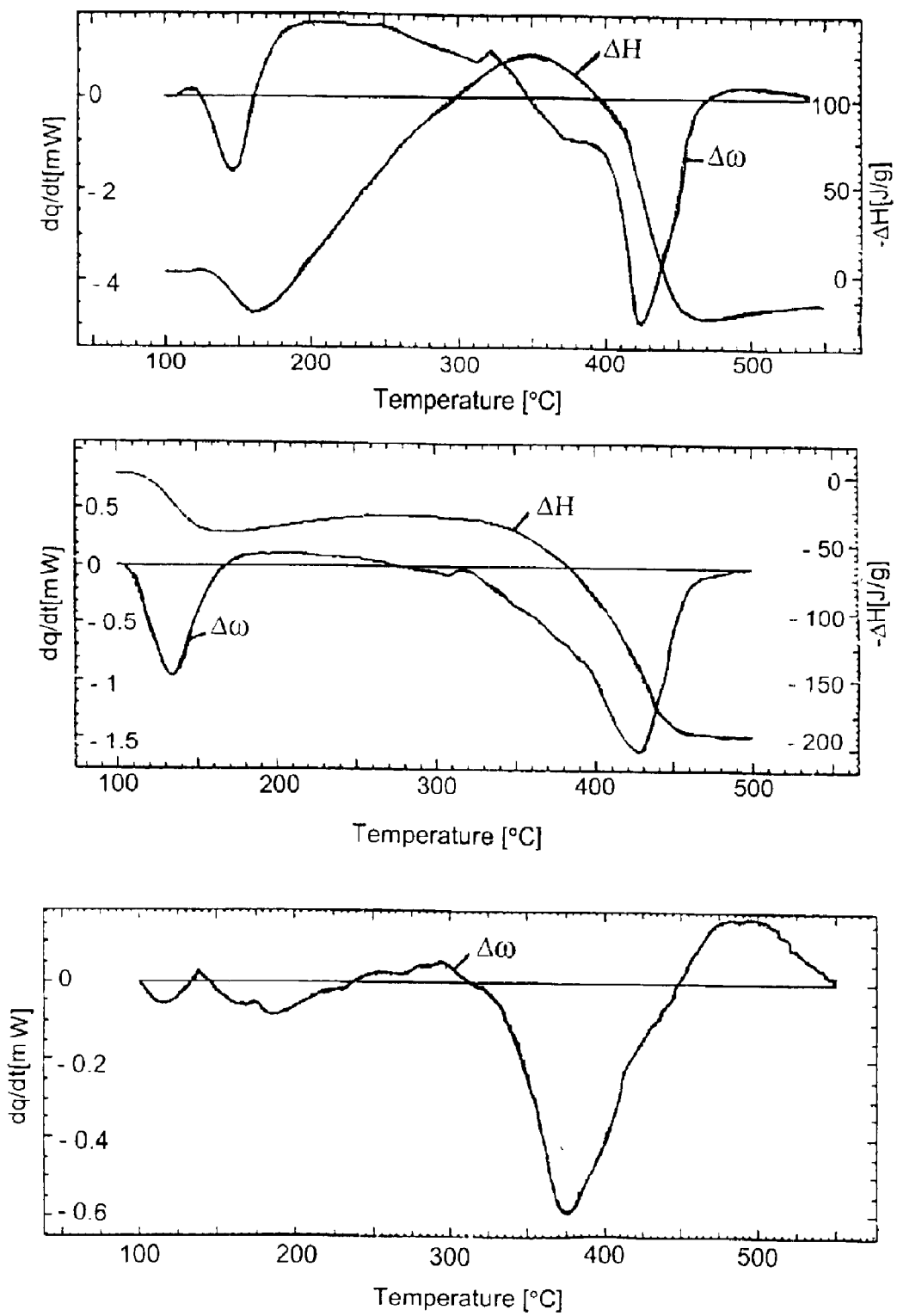
FIG. 59 Showing DSC-analyses on Mg—La splats aged for eight years at ambient temperatures with (top) rotating-wing (RW) Mg-3.9 wt. % La splats of thickness <20 μm, (center) Mg-6.8 wt. % La splats of thickness <20 μm and (bottom) Mg-4 wt. % La splats of thickness 140 μm.
Figure 60:
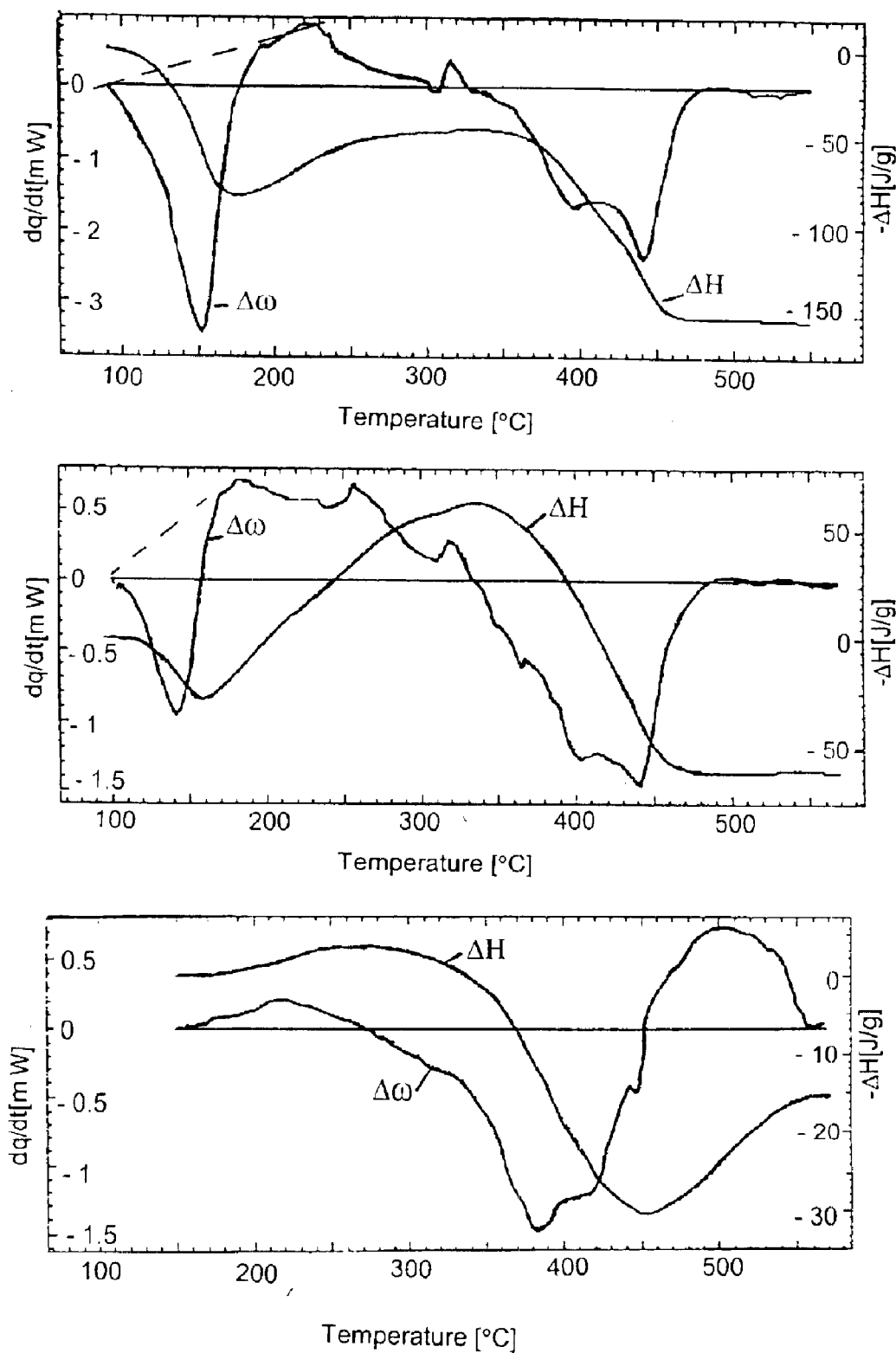
FIG. 60 As for FIG. 59, here for (top) rotating-wing (RW) Mg-3.65 wt. % Ce splats and (center) RW Mg-13.2 wt. % Ce splats and (bottom) Mg-4 wt. % Ce splat by piston-and-anvil splat cooling.
Figure 61:
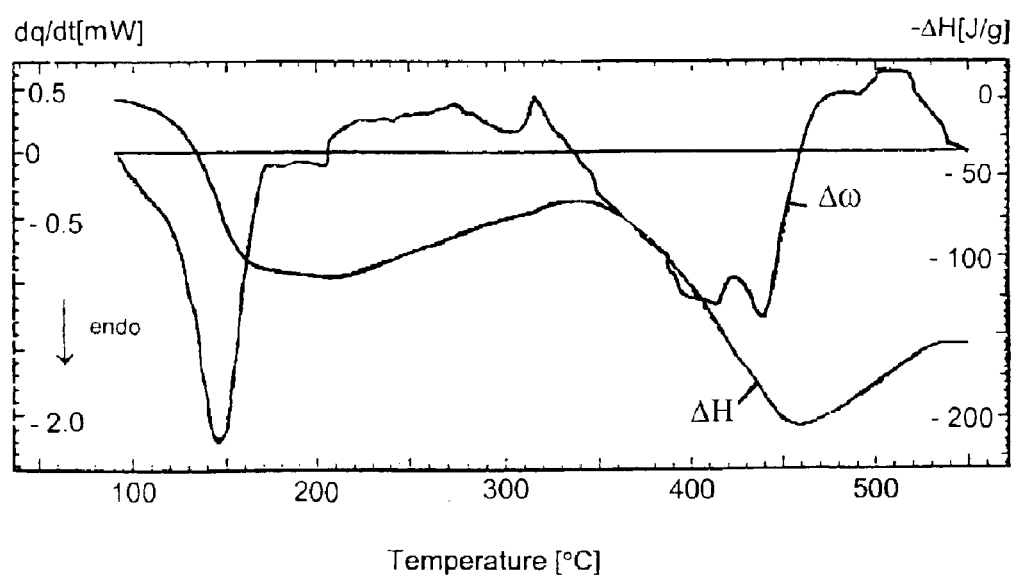
FIG. 61 Showing heat flow obtained by subtraction of DSC-analysis and subsequent in-situ baseline of RW Mg-7.5 wt. % Gd splats of thickness 30 μm aged for eight years at ambient temperature.
Figure 62:
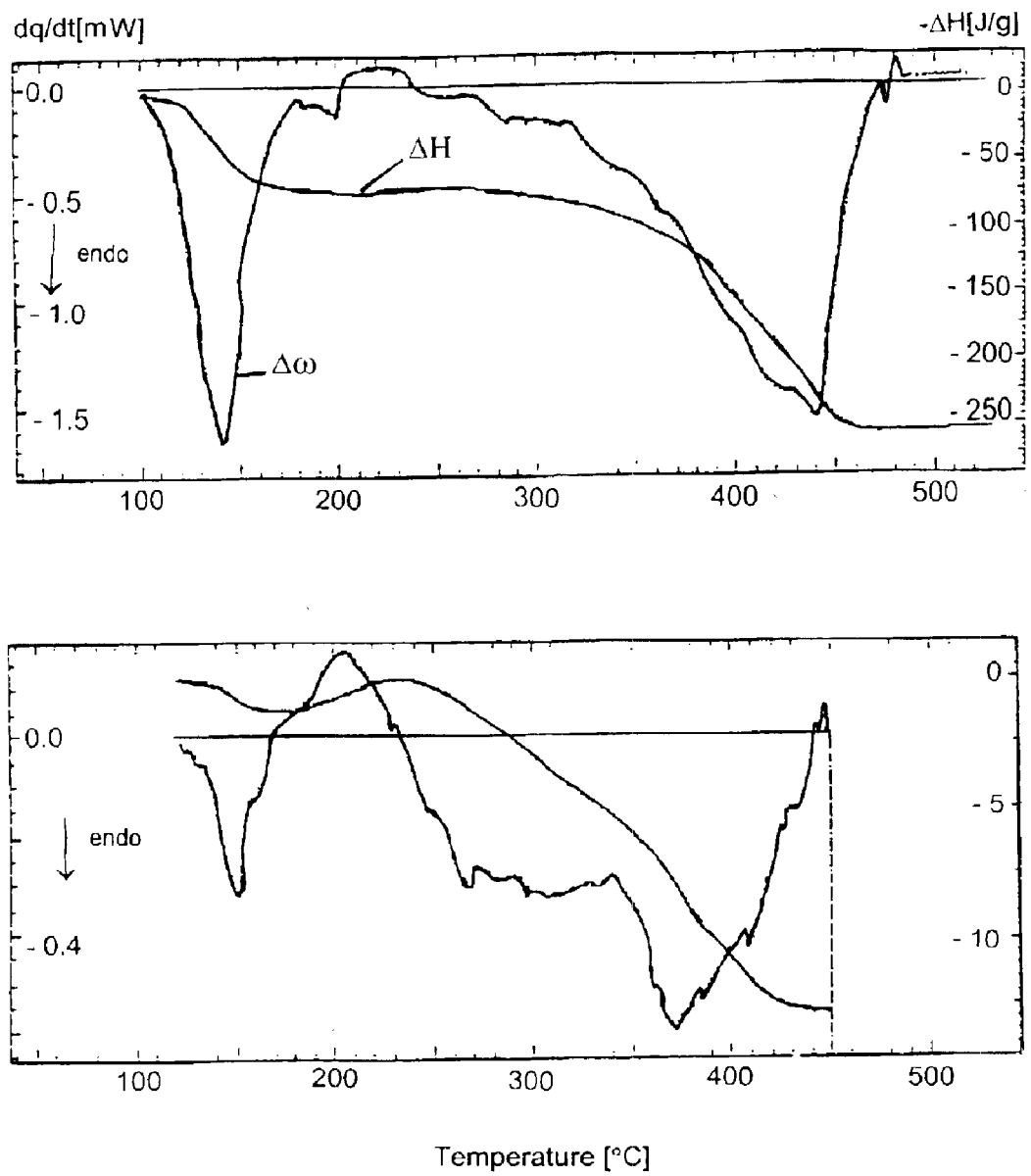
FIG. 62 As for FIG. 61, here RW Mg-splats with 17 wt. % Gd and thickness 30 μm (top) and for splats with approximately 8 wt. % Gd, but of thickness 200 μm.

After eight years of room temperature (natural) aging including temperature cycles from below zero Celsius to above 40° C. and humidity alterations from below 40% to above 90% splat cooled cph-Mg solid solutions supersaturated with La, Ce, Sm and Gd showed two endothermal effects at 120° to 150° C. and at between 350° to 450° C. (FIGS. 59 to 60 where FIG. 59 showing DSC-analyses (N.B. endothermal effects are pointing downwards, ΔW=power, ΔH=enthalpy per gram, i.e. effective enthalpy of transformation) on Mg—La splats aged for eight years at ambient temperatures with (top) rotating-wing (RW) Mg-3.9 wt. % La splats of thickness <20 μm, (center) Mg-6.8 wt. % La splats of thickness <20 μm and (bottom) Mg-4 wt. % La splats of thickness 140 μm, the latter without evidence for an endothermal effect at around 150° C. and FIG. 60 being as for FIG. 59, here for (top) rotating-wing (RW) Mg-3.65 wt. % Ce splats and (center) RW Mg-13.2 wt. % Ce splats and bottom) Mg-4 wt. % Ce splat by piston-and-anvil splat cooling). If not indicated otherwise, these splats were made by the rotating splat cooling technique (RW) which provides cooling rates of the order of $10^7$ to $10^9$ K/sec and a level of fragmentation allowing to form "splatted" cross-sections in the range of <1 to 50 μm. The RW splats investigated were all below 25 μm and their microstructure corresponded to the microstructure shown in FIG. 49. Endothermal effects can only result from the transformation of an ordered into an disordered phase or from the dissolution of second phases within the non-equilibrium and/or equilibrium solid solution or any other phase. The change in entropy provides the driving force in both cases. The second phases must be very fine (<1 μm) in order to be completely dissolved at heating rates as high as 40 K/min (cf. FIGS. 59 to 62 where FIG. 61 showing heat flow obtained by subtraction of DSC-analysis and subsequent in-situ baseline of RW Mg-7.5 wt. % Gd splats of thickness 30 μm aged for eight years at ambient temperature and resulting integration of corresponding enthalpy of transformation as before and FIG. 62 being as for FIG. 61, here for RW Mg-splats with 17 wt. % Gd and thickness 30 μm (top) and for splats with approximately 8 wt. % Gd, but of thickness 200 μm). The enthalpy of transformation of the endothermal effect no 1 at around 150° C increased with increasing levels of La and Gd, but a concentration effect on enthalpy was not evident for Mg—Ce splats:

| Alloy/Splat Thickness [wt. %]/[μm] | Heat of transformation of endothermal effect at 150° C. by using a heating rate H = 40 K/min | Corresponding Transformation Temperature |
|---|---|---|
| Mg - 3.9 La/<20 | > +30 J/gram | at about 145° C. |
| Mg - 6.8 La/<20 | > +40 J/gram | at about 130° C. |
| PA Mg - 4 La/140 | absent | |
| Mg - 3.65 Ce/<20 | > +85 J/gram | at about 150° C. |
| Mg - 13.2 Ce/<20 | > +50 J/gram | at about 140° C. |
| PA Mg - 4 Ce/140 | absent | |
| Mg - 4.6 Sm/20 | > +50 J/gram | at about 150° C. |
| Mg - 7.5 Gd/30 | 60 J/gram | at about 148° C. |
| Mg - 17.9 Gd/30 | 125 J/gram | at about 140° C. |
| PA Mg - 8 Gd/200 | about 3 J/gram | at about 150° C. |

Selected splat thickness had assured that the alloying elements were essentially tight up in solid solution when they were made almost ten years ago. The absence of an exothermal effect after this period of exposure to ambient temperature conditions suggest that the extended solid solutions have entirely transformed into an ordered (room temperature) phase of which the endothermal effect represents either the dissolution and/or transformation into more stable structural configurations finally transforming into the equilibrium microstructure at 420° C. as is shown by the (usually larger) second endothermal effect at around 350° to 400° C. The endothermal transformation effects were sharp i.e. forming "glass"-like peaks) at temperatures around 130°–150° C. They decreased with increasing alloying content suggesting the presence of a metastable intermediate phase in a more complex overall precipitation sequence.

Hehmann observed (F. Hehmann, Metastable Phase Transformation in Rapidly Solidified Magnesium-Base Mg—Al Alloys, *Acta Met. Mater.* 38, 1990, pp. 979–992) such endothermal effects after 7 and 12 months room temperature aging of the extended solid solution of Al in cph-Mg. These endothermal effects were identified (F. Hehmann, Metastable Phase Transformation in Rapidly Solidified Magnesium-Base Mg—Al Alloys, *Acta Met. Mater.* 38, 1990, pp. 979–992) to represent the transformation of an ordered γ'-superlattice preferentially forming at the boundaries of cells of size <<1 µm, i.e. of some 5 to 100 nm (FIG. 63 showing (Top) TEM-diffraction pattern and (bottom) DSC-analysis using various heating rates as shown in [K/s] for melt-spun Mg-23.4 wt. % Al ribbon after 12 months exposure to ambient temperatures. The endothermal transformation of the ordered room temperature phase is as strong as the transformation of the remaining supersaturated solid solution of aluminum in cph-Mg after these conditions of natural aging (see F. Hehmann, Metastable Phase Transformation in Rapidly Solidified Magnesium-Base Mg—Al Alloys, *Acta Met. Mater.* 38, 1990, pp.979–992)). The endothermal effect no 1 observed in the alloys embodimented in this invention, however, were not evident after such relatively short duration of natural aging. In aerospace applications, however, it is important to know the behavior of metastable alloys and phases over much longer periods. The endothermal effects were related to the transformation sequence of the metastable solid solution of La, Ce, Sm and Gd in cph-Mg and are therefore expected to universally occur in other systems such as Mg-early transition metal base alloys of which the major onset of phase transformation (equilibrium phase formation) occurs at even lower temperatures than in the Mg-early rare earth base alloys. Mg-based solid solutions containing rare earth elements were reported to form atomically thin layers of GP-(i.e. γ'-) type of precipitation zones (H. Karimzadeh, The Microstructure and Mechanical Properties of some Mg-Alloys Containing Yttrium and Heavy Rare Earth Metals, *PhD Thesis*, University of Manchester, October 1985). They might transform to (1) a more disordered and eventually more incoherent phase including the possibility of (2) dissolution within the metastable supersaturated Mg-based solid solutions for which the change in entropy provides the driving force for transformation and for which dislocations and grain boundaries as well as second phases separated during solidification (a problem which is better controlled by PVD) act as the preferred nucleation sites. The occurrence of the endothermal effect at around 150° C., however, requires homogeneity of the alloying additions on an atomic length scale of an disordered phase before, the largest length scale of which corresponding to the minimum length scale of the γ'-phase (i.e. 5 nm or so, see above).

It was interesting to note that a small endothermal effect at 150° C. was observed for Mg—Gd splats made by using the PA-technique, but not for PA-Mg-splats containing La or Ce (FIGS. 59 to 62) (N.B. the employed PA-technique is the most "clean" chill block technique concerning the featureless chill zone, but not for the entire splat cross-section). This is consistent with a $k_0$-value nearer to unity in the Mg—Gd system allowing for supersaturation during solidification from the, melt for relatively large cross-sections. The small heat of transformation of the first endothermal effect in PA-Mg—Gd shows in fact that other factors such as grain boundary concentration and/or coarsening of co-existing dispersoids/microsegregations have "eaten away" the GP-zone type of solid state phases on long term exposure to natural aging conditions. That is, the larger the (volume fraction of) uncontrolled second phases upon solidification including impurities (and this is to be generalized for corresponding alloys made by PVD-techniques), the larger the natural aging rate. This is consistent with the results for PA Mg—La and PA Mg—Ce splats of which the second endothermal effect obscured to discriminate the first one.

The first endothermal effect represented a phase transformation that can lead to grain boundary embrittlement and loss of strength due to a reduction in transgranular coherence. From the observations made herein it is now possible to derive an annealing treatment after forming, solutionizing and quenching operations that does not trigger an undesired transformation of phases forming upon natural aging. Any annealing treatment of the metastable supersaturated state should therefore be performed in the temperature range below the observed endothermal peak no 1 (i.e. at T<130° C.), while a GP-dissolution treatment (provided that other second phases including microsegregations are absent) at around 150° C. The magnitude of the second endothermal effect of the as-solidified, i.e. non-solution treated version of the claimed alloys increased with increased thickness of the traverse cross-section of the splats so with the volume fraction of second phases separated from the melt during solidification. It is concluded from these observations that actual time and temperature for solution treatments of the rapidly solidified (as-deposited) condition of the claimed alloys can be reduced to less than 1 hr at temperatures below 400° C. opening an avenue to retain the refined grain structure and strength increment in the final product.

The occurrence of distinct endothermal effects at temperatures between 120° to 150° C. which are related to the transformation of GP-zones formed after long-term natural aging, allow also for identification of the claimed optimum temperatures and the claimed optimum duration of the (i) forming procedures, (ii) intermediate heat- and homogenization- or solution-treatments between forming operations, (iii) aging conditions and (iv) annealing treatments for stress relief without undue damage to the protective surface film afforded by the elements enhancing the MgO-surface oxide. Temperature and time of annealing procedures and/or solution heat treatments can be markedly reduced compared to conventionally synthezised and/or processed light alloys due to their extremely fine microstructure resulting in an increase in surface area of second phases providing the increase in driving force for second phase dissolution. Any annealing treatment for stress relief of the supersaturated solid solutions should according to the invention not exceed temperatures of 140° C. for short term exposures of the order of 2 hrs or 110° C. for longer exposures in order to avoid that the transformations of the supersaturated solid solutions or of GP-zones, formed within the solid solutions, reduce corresponding passivating effect.

4. Intermediate Summary of the Invention on Thermal Stability

The results show that the transformation sequence of the extended solid solution of light RE elements in cph-Mg with a random, ordered or quasi-ordered distribution of the light RE atoms is the yet reported most thermally stable cph-Mg base solid solutions of an alloying addition in as-solidified (as-deposited) magnesium:

1. The transformation temperatures of MgRE alloys are at 30° to 60° C. higher temperatures than corresponding evolutions observed for RSP Mg—Y alloys (cf. F. Sommer, F. Hehmann and H. Jones, Transformation Behavior of the Extended Solid Solution of Yttrium in by Rapid Solidification, *J. Less Common Metals* 159, 1990, pp. 237–259).
2. The onset of the formation of equilibrium phases from the extended solid solution of light RE metals in cph-Mg occurs at some 90° to 120° C. higher temperatures than the transformation of the extended solid solution of manganese in cph-Mg (N. I. Varich and B. N. Litvin, *Fiz. Met. Metallov.* 16, 1963, pp. 526–529).
3. The optically columnar VD-microstructure without boundary evidencing the absence of any recalescence and microsegregations as obtained by vapor deposition appears to result in a further increment of thermal stability of extended solid solution with an equilibrium phase transformation peak dominating the overall transformation at an isotherm of some 360° C. This isotherm appears to be 150° to 180° C. thermally more stable than an hypothetical isothermal transformation temperature of the extended solid solution of Ti in cph-Mg which was also obtained by vapor deposition (cf. D. J. Bray, R. W. Gardiner and B. W. Viney, GB-Patent 2,262,539 A, 23 Jun. 1993).
4. In summary, the thermal stability of rare earth elements in the cph-Mg base solid solution is at least some 100° C. higher compared to that of the yet published transition metals.
5. From the viewpoint of the thermal stability of the final transformation of liquid and vapor processed solid solutions of light RE metals in cph-Mg it appears of secondary importance for subsequent consolidation and alloy conversion of the as-solidified material whether reaction is exo- or endotherm. By contrast, fine microsegregations in corresponding liquid quenched material appeared to render the material susceptible to aging at room temperature as indicated by a value of activation energy, $E_A$, of 83 kJ/(mol K) which is below the threshold of 100 kJ/(mol K) for aging processes at ambient (J. W. Christian, *The Theory of Transformation in Metals and Alloys*, Pergamon, New York, 2nd edition, 1975).
6. The magnitude of thermal effects and the ratio of the magnitude of these effects depends on the processing for the synthesis of the alloying elements rather than on the light RE metal employed (cf. FIGS. 50–54 vs. 56 to 58). The vapor deposition route was observed to microstructural evolutions at higher temperatures the expense of thermal effects at lower temperatures segregation-free microstructures of the extended solid solution of Ce and other light RE metals in cph-Mg compared to liquid processing so to preserve the homogeneity on an atomic length scale in the final product.
7. vapor deposition makes the extended solid solution of light ! RE elements in cph-Mg a very attractive material for corrosion demanding applications in which further transition metal (TM) additions can be added deliberately to strengthen the material upon alloy conversion by precipitation of these TM at significantly lower temperatures than required for formation of the equilibrium phases from the extended solid solution of RE metals in cph-Mg.

5. Commercialization

The wrought Mg alloy market is currently lingering on the 7000 T.P.A. level which is 2% of the overall Mg-market or 0.04% of the wrought Al alloy market. This situation is mainly related to the poor passivation characteristics of the available cast and wrought Mg alloys. In order to take advantage of the present invention for the development and commercialization of Mg-base alloys and products with passivating alloy surfaces it is necessary to:

(i) employ suitable conditions of alloy conversion including appropriate transformation temperatures in order retain the novel structure in the final product, (ii) enhance the mechanical properties such as via synergistic hardening effects of the employed alloying without break-down of the passivity of the surface film, and (iii) to use continuous production techniques to arrive at economically viable product forms.

6. Alloy Conversion of RSP Light Alloys

According to ASM handbooks (*ASM Metals Handbook, Properties of Magnesium Alloys*, Vol. 2, 9th edition, ASM Metals Park, 1979, Ohio, 44073-9989, USA; *ASM Metals Handbook, Forming and Forging*, Vol. 14, 9th edition, ASM Metals Park, 1979, Ohio, 44073-9989, USA, pp. 259–260), hot forming operations of commercial Mg-based alloys include extrusion at temperatures ranging from 360° to 440° C., rolling at temperatures between 420° to 500° C. and forging often within some 50° C. of the liquidus temperature of corresponding magnesium alloy. From the DSC-analyses it is evident that these conditions would destroy the supersaturated cph-Mg base solid solution and the resultant passivation effect due to the low equilibrium solid solubility of light RE metals in cph-Mg (cf. L. A. Carapella, Fundamental Alloying Nature of Magnesium, *Met. Progress* 48, August 1947, pp. 297–307; Phase Diagrams of Binary Magnesium Alloys, eds. A. A. Nayeb-Hashemi and J. B. Clark, ASM Materials Park, 1988, Ohio 44073-9989, USA). Emley had shown (E. F. Emley, *Principles of Magnesium Technology*, Pergamon Press, 1966), however, that a grain size of less than about 8 $\mu$m represents the threshold for increasing deformability and ductility of hexagonal magnesium, which is one factor required to reduce the forming temperature and/or to avoid failure upon extrusion, rolling and forging so to allow for higher productivity in terms of extrusion speed, metal yield and quality of the final product. The refined microstructure of RS Mg-alloys does not only increase hardness and strength (see below), it also allows for "cold" extrusion, rolling and forging at some 100° to 300° C. lower temperatures than applied to ingot processed magnesium alloys.

6.1 Microcrystalline Mg-alloys

This has been demonstrated by Isserow and Rizzitano as long as twenty years ago for micro-crystalline ZK60A (Mg-6.0 Zn-0.45 Zr, in [wt. %]) powders made by the rotating electrode process (REP) [51]. The spherical powder was kept under refrigeration before being extruded preferably at temperatures as low as 65° C. then water-quenched to avoid overaging and subsequently aged for 24 hours at 120° to 150° C. The strength increment of up to 427 MPa UTS (422 MPA tensile yield strength TYS) originated in a grain size of 1 to 10 $\mu$m. Though care must be exercised due to delamination along the fibred fracture paths (the size of intermetallic compounds were of size 0.1 $\mu$m), this fibred structure also doubled fracture time and impact energy in charpy specimen leading to consideration of REP-ZK60A for large body applications such as via rolling for sheet products in aerospace applications (S. Izzerow and J. Rizzitano, *Int. J. Powder Met. & Pow. Techn.* 10(3), 1974, pp. 217–225).

More recently, Das et al.(see 1.–4. below) and Nussbaum et al.(see 5. und 6. below) have demonstrated that the effect of microstructural refinement of Mg—Al—Zn-base alloys afforded by RSP resulted in excellent formability at temperatures as low as 150° C. making such alloys useful for near-net shape operations including rolling and forging. The increased freedom in processing conditions was largely dependent on fine intermetallic second phase dispersions to pin the growth of grain boundaries of RS Mg—Al—Zn base alloys upon alloy forming operations, since the RSP-refined microstructures are otherwise thermally very instable so to result in degradation of the resultant properties. Large grains would also result in failure such as by blistering, hot shortness and structural changes as often encountered upon extrusion, rolling and forging of ingot processed magnesium alloys.

The details of alloy conversion of microcrystalline RS Mg—Al—Zn base alloys include:

1. superplastic forming of consolidated alloy Mg-0-14Al-0-4Zn— and 0.2–3 X (X=Mn, Ce, Nd, Pr and yttrium; in [at. %]) comprising a microstructure of a solid solution phase of size 0.2 to 1.0 $\mu$m together with precipitates of Mg- and Al-containing intermetallic phases of size less than 0.1 $\mu$m using a forming rate ranging from 0.01 mm/sec to 0.21 mm/sec at 160° to 275° C. (S. K. Das, C. F. Chang and D. Raybould, U.S. Pat. No. 4,938,809, Jul. 3, 1990);

2. as for 1., but with the proviso that the sum of Al and Zn ranges from about 2 to 15 at. % and deforming corresponding consolidated alloy (preferably cylindrical) billet(s) by over 80% at temperatures ranging from 200° to 300° C. by employing a closed-die or an open-die forging to arrive at minimum UTS-values 378 MPa (D. Raybould, C. F. Chang and S. K. Das, U.S. Pat. No. 4,071,474, Dec. 10, 1991);

3. alloy(s) as for 1. and 2., but forming such alloy billet(s) into a rolling stock which is then preheated to temperatures ranging from 200° to 300° C. followed by rolling the heated stock at a rate of 25 to 100 rpm by adjusting the gaps of the preheated rolls of diameter 5" (5 inch, i.e. about 13 cm) so to reduce 2 to 25% per pass and to arrive sheet thickness 0.014 to 0.095" with minimum UTS-values 400 MPa (C. F. Chang and S. K. Das, U.S. Pat. 5,087,304, Feb. 11, 1992); for comparison, the strength values of conventional Mg-based alloy sheets at ambient temperature were reported by the ASM handbook (*ASM Metals Handbook, Properties of Magnesium Alloys*, Vol. 2, 9th edition, ASM Metals Park, 1979, Ohio, 44073-9989, USA) to range from 260 to 290 MPa UTS and from 140 to 220 MPa TYS at elongation values between 8 and 24%;

4. alloys and sheets as for 3., but forming such sheets into a complex shape by employing strain rates ranging from $10^{-1}$ to $10^{-2}$/sec at temperatures ranging from 275° to 300° C. eventually arriving at elongation values >300% and grain size up to 5 $\mu$m (C. F. Chang and S. K. Das, U.S. Pat. No. 5,129,960, Jul. 14, 1992);

5. extrusion of the alloy(s) Mg-2-11Al-0-12Zn- and 0–0.6Mn and 0–7Ca (in [wt. %]) comprising a microstructure of mean particle size less than 3 $\mu$m and a dispersion of intermetallic compounds of size less than 1 $\mu$m such as $Al_2Ca$ which delineate grain boundaries so to stabilize such microstructures against growth and coarsening by exposures for 24 h at 200° C. and allowing for extrusion at temperatures of 200° to 350° C. with an extrusion ratio of 10:1 to 40:1 (preferably 10:1 to 20:1) and a forward ram speed of 0.5 to 3 mm/sec (or 5 mm/sec with higher Ca contents) to result in rupture strength values of at least 290 to 320 MPa, the extrusion performed with melt spun ribbon either directly, after pre-compaction the ribbon to billets or after vacuum-degassing the ribbon (G. Regazzoni, G. Nussbaum and H. T. Gjestland, U.S. Pat. No. 4,997,622, Mar. 5, 1991);

6. thermal deformation including extrusion (J. F. Faure, G. Nussbaum and G. Regazzoni, EP-Patent 0 414 620, 27. 02.1991), drawing and forging or a combination of the two latter at between 200° and 350° C. of spray-deposited alloy(s) Mg-2–9Al-0-4Zn-0-1Mn-0.5–5Ca and 0–4RE (in [wt. %]), where RE is yttrium, Nd, Ce, La, Pr, mischmetal (MM) and mixtures thereof, the alloys comprising a homogeneous magnesium matrix of grain size 3 to 25 $\mu$m and intermetallic phase dispersions including $Mg_{17}Al_{12}$, $Al_2Ca$, $Mg_aRE_b$ and $Al_aRE_b$ of size <5 $\mu$m, the thermally deformed product then followed by selected solution treatments and temper hardening or by temper hardening only in order to arrive at fracture toughness values of 30 to 35 MPa $m^{0.5}$ at UTS-levels of 480 to 365 MPa (J. F. Faure, G. Nussbaum and G. Regazzoni, U.S. Pat. No. 5,073,207, Dec. 17, 1991).

It is interesting to note that only a deposition route has led to fracture toughness values of RSP-Mg alloys acceptable for aerospace applications. In RSP-deposition routes, the fragmentation is inverted in-situ so circumventing exposure of excessive surface area to oxygen and resultant oxide formation. Vapor deposition (VD) provides therefore also a perspective for crucial mechanical properties of Mg-base aerospace applications with satisfying surface passivity.

6.2 Nanocrystalline VD-Al Alloys

Rapidly solidified aluminum-base alloys made by melt-spinning, planar flow casting and gas atomization are usually consolidated (extruded etc.) at temperatures between 350° and 400° C. By contrast, vapor deposits of Al-2.8–6.3Cr and Al-2.5–6.1Cr-0.45–0.92Fe (in [at. %]) alloys of columnar grains of diameter 1 $\mu$m and of thickness 0.1 $\mu$m with the chromium entirely tied up in the fcc-Al solid solution and the iron to form $Al_7(CrFe)$ precipitates of size 3 to 5 nm (i.e. at least by a factor 10 finer than in Al-alloys made by RSP-methods from the liquid and which were preferentially formed at cell boundaries) were rolled at temperatures between 20° and 420° C. (M. C. McConnell and P. G. Partridge, Processing of Structural Metals by Rapid Solidification, eds. F. H. Froes and S. J. Savage, American Society for Metals, Metals Park, Ohio, 1987, pp. 143–153), preferably at between 190° or 250° and 290° C. (R. L. Bickerdike, D. Clark, G. Hughes, M. C. McConnell, W. N. Mair, P. G. Partridge and B. W. Viney, Int. *Conf. Rapidly Solidified Materials*, San Diego, ASM Metals Park, 1986, pp. 145–151) to produce sheet of thickness 1.6 to 1.7 mm with the highest ever reported strength levels of a crystalline engineering Al-alloy (UTS: 848 MPa at a fairly convenient ductility of 8%) followed by annealing treatments that affected the dislocation substructure only at temperatures where the solid solution of Cr in fcc-Al and the resultant properties were degraded (P. G. Partridge, *Processing of Structural Metals by Rapid Solidification*, eds. F. H. Froes and S. J. Savage, American Society for Metals, Metals Park, Ohio, 1987, pp. 155–162).

6.3 Nanocrystalline PVD Mg-Alloys

Microstructural refinement improves systematically the deformability of Mg- and Al-base alloys (see below) and this effect is more evident for Mg-alloys. Microcrystalline Mg-alloys provide the most superplastic light alloys and a larger reduction in forming temperatures than microcrystalline Al-alloys made by the same RSP-methods. Microcrystalline light alloys require a fine dispersion of second phases to suppress growth and coarsening of RSP-refined matrix grains upon alloy conversion into product or semi-finished product form. In nanocrystalline light alloys, however, the virtual absence of such particles facilitates the conversion of the microstructure into final product form. The degree of homogeneity obtained by the refinement on the nanostructural length scale allows to reduce more effectively the required forming temperatures and offers diffusion as the material parameter to take over the control of microstructural modifications upon alloy conversion into final product form. This is coherent with the requirements for alloy conversion of metastable Mg-alloy products with sufficient surface passivity as in the case of the extended solid solution of (light) RE metals in cph-Mg.

Mg-(light) RE metal base alloys offer an additional reduction in forming temperatures from the alloy chemistry point of view. Krishnamurthy et al. reported (S. Krishnamurthy, I. Weiss and F. H. Froes, *Key Engng. Mat.* 29–31, 1989, pp. 135–146; S. Krishnamurthy and Y. W. Kim, Magnesium Developments, *Proc. World Materials Congress*, September 1988, Chicago IMA, ASM International, pp. 11–16) on ultrasonic gas atomization (UGA) of Mg-3.2-Nd-1-Pr-1.5Mn [wt %] alloy and subsequent consolidation at lower temperatures compared to RS Mg—Al—Zn base alloys. Much better tensile strength at room temperature and improved corrosion resistance were achieved compared to the strongest ingot processed alloy ZK60, although this alloy did not contain any of the classical solid solution strengthening elements such as Al and Zn. Satisfying interparticle bonding without porosity was attained after degassing for 1 h at 250° C., preheating for 2 hrs at 250° C., hot-isostatic pressing for 6 h at 250° C. followed by preheating for 2 hrs at 250° C. and extrusion at reduction ratios between 12:1 and 20:1 (for 150° to 250° C.) or 8:1 (for 100° to 250° C.). The employed extrusion temperatures were thus lower for microcrystalline Mg-LRE base metals than for nanocrystalline VD Al-alloys (see above). No satisfying consolidation was possible for the UGA Mg-3.2 Nd-1.1 Pr-1.5 Mn alloy outside these conditions (cf. S. Izzerow and J. Rizzitano, *Int. J. Powder Met. & Pow, Techn.* 10 (3), 1974, pp. 217–225).

The advantages of an in-situ-consolidation-type of RSP-route such as vapor deposition over UGA, for example, are evident: VD does not impose the need for degassing or pressing so reducing the number of processing steps and improving the overall economics of VD-alloy conversion significantly compared to the more traditional Powder metallurgy routes. Vapor deposition offers all the advantages of spray deposition from the liquid phase with the additional advantage of the formation of metastable structures allowing for passive magnesium alloys.

Nanocrystalline Mg-LRE alloys with the LRE held in extended solid solution thus represent a philosophy that is different from previous avenues for the development and application of high performance light alloys. It is part of the invention that vapor deposited Mg-LRE based alloys are transformed into product form at temperatures where no detrimental effect on passivation occurs due to susceptibility to the formation of compound nuclei in the melt (cf. L. Y. Wei and G. L. Dunlop, Conf. Proc. *Magnesium Alloys and Their Applications*, DGM, Oberursel, FRG, 1992, pp. 335–342) and the resultant acceleration of solid state precipitation and hardening by exposure to natural and artificial aging conditions. It is therefore part of the invention to consolidate the claimed alloys at temperatures ranging from ambient (i.e. 15° C.) up to 370° C., preferably in the range from 50° to 200° C. and using extrusion ratios, for example, which range from 3:1 to 45:1.

7. Engineering Properties Including Damage Tolerance
7.1 Vapor Deposited Mg-(light) RE Binary Alloys Grain size refinement does not only accrue to the conversion of the extended solid solution of (light) RE metals in cph-Mg into wrought product forms without substantial loss in surface passivity. Grain refinement also entitles selected RSP-routes to result in superior mechanical properties via Hall-Petch grain boundary strengthening the (super-) saturated passive cph- and/or ne-Mg-alloy matrix without detrimental effect upon passivation by (enhanced) alloying. Intitial microhardness tests were performed on the two regimes of grains of size of the as-cast alloy Mg-8 Ce (cf. FIG. 48) as well as of corresponding vapor deposited version resulting in following Vicker's hardness numbers (VHN) as a function of grain size:

| Alloy | Size of Secondary Dendrite Cells [μm] | VHN | UTS [MPa] |
|---|---|---|---|
| Conventional Casting | 20–30 5–12 | 64.7 +/− 5.5 82.7 +/− 9.5 | 207 264 |
| PVD | (X-ray: 0.025) | 148.5 +/− 12.3 | 540 |

Figure 64:
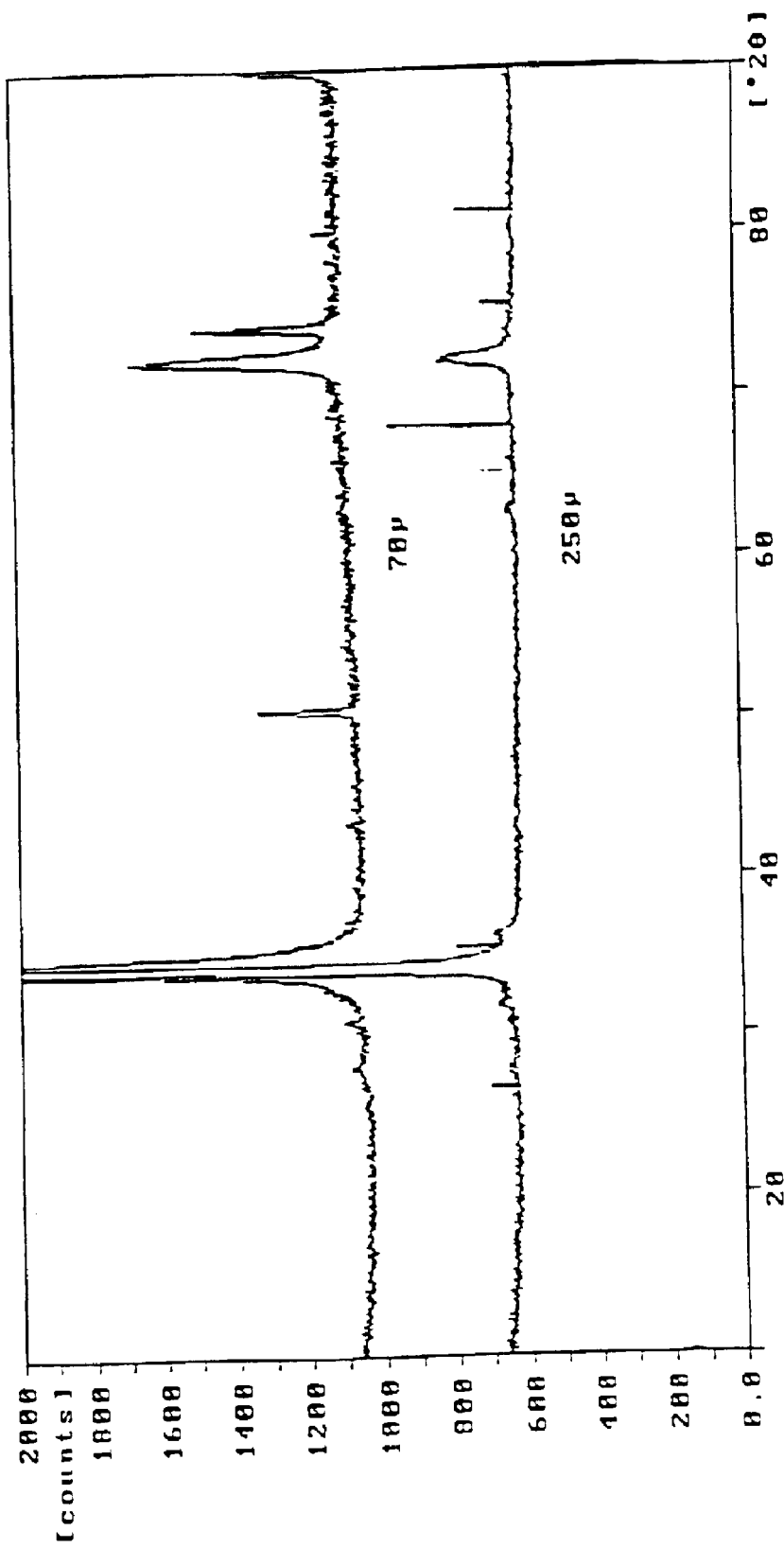
FIGS. 64 X-ray spectrum of the "endothermal" solid solution of 8 wt. % Ce in cph-Mg made by vapor deposition using the sputtering method (cf.
Figure 65:
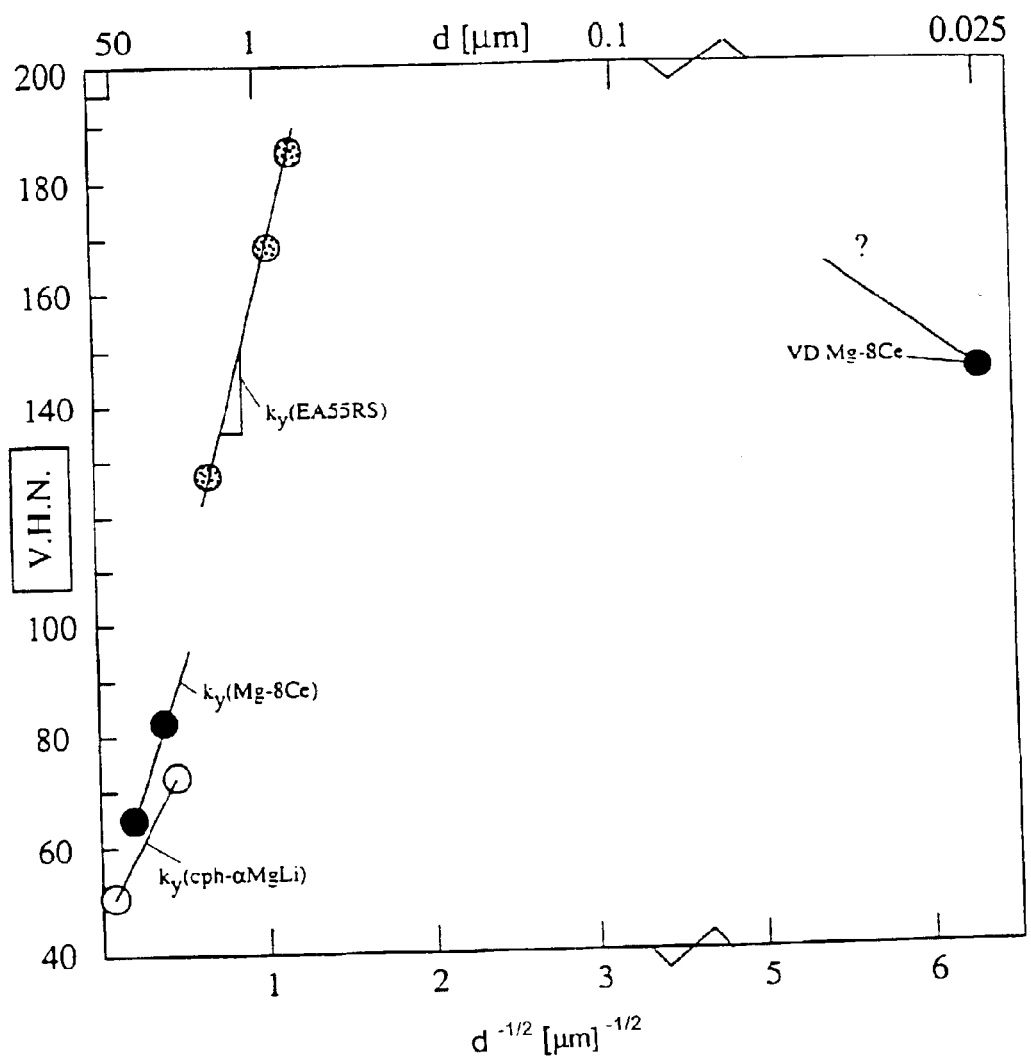
FIG. 65 Hall-Petch relationship for Vickers hardness numbers V. H. N. of Mg-8 wt. % Ce made by conventional casting and by vapor deposition and of cph-αMgLi alloys and of alloy EA55RS.

The nanocrystalline sub-cell structure of the vapor deposited material was derived from the full intensity mean half width (FMHW) of the (002) reflection shown in FIG. 64 which depicts an X-ray spectrum of the "endothermal" solid solution of 8 wt. % Ce in cph-Mg made by vapor deposition using the sputtering method (cf. FIGS. 56–58), here for two different deposits of thickness 70 and 250 $\mu$m (N.B. the mean half width of the (002)-reflection of the 70 $\mu$m-sample was used to estimated the cell size of the microstructure via the formula by Scherrer, see below). Under the assumption that no residual stresses were involved, the use of the Debye-Scherer formula $$d = k\, \lambda / \Delta(2\Theta)\, \cos\Theta$$

yields a subgrain size of 25 nm. The Hall-Petch proportionality constant $k_y$ of the two phase binary Mg-8 wt. % Ce casting alloy is in good agreement with that of other Mg-LRE based metals such as the rapidly solidified alloy EA55RS (see FIG. 65 showing Hall-Petch relation ship for Vickers hardness numbers V.H.N. of Mg-8 wt. % Ce made by conventional casting and by vapor deposition. For comparison, data of cph-αMgLi alloys and of alloy EA55RS are also included, cf. F. Hehmann, *METALL* 5, 1994, pp. 377–381. The slope of each relationship represents the Hall-Petch proportionality constant $k_y$). The results support the hypothesis that grain boundaries provide the rate controlling mechanism for plastic deformation of the Mg-(light) RE alloys when made by ingot processing. Significant deviation from this Hall-Petch relationship is indicated, however, by the results for the vapor deposited version of Mg-8Ce. Such deviation were frequently observed in nanocrystalline metals such as Ti and Pd owing to the fact that diffusion took over the rate controlling mechanism of plastic deformation (cf. J. R. Weertman and P. G. Sanders, *Proc. Int. Conf. Dislocation '93, Aussois*, March–April 1993, Trans Tech Publications Ltd, Aedermannsdorf, Switzerland).

According to T. Masumoto, A. Inoue, T. Sakuma and T. Shibata, U.S. Pat. No. 5,118,368, 1992, the coupling factor between ultimate tensile strength UTS and VHN for metastable magnesium-based phases ranges from 3.2 to 3.5 indicating quite a considerable strength value of the order of 540 MPa or more for the vapor deposited alloy Mg-8 wt. % Ce. This is a high value for a simple binary Mg-alloy and embraces encouraging significance for the further development. Vapor deposited binary Al—Cr alloys in which the Cr was entirely accommodated by the supersaturated αAl solid solution resulted in tensile yield strengths of 400 MPa. The addition of only 0.4-0.8 at. % Fe led to VD Al alloys with 4–6 at. % Cr in solid solution and the Fe forming precipitates of size some 3–5 nm. They are the best Al-engineering alloys ever reported with UTS values ranging from 635 to 818 MPa and values of elongation-to-fracture at between 6 and 10% (cf. R. L. Bickerdike et al., *Int. J. Rapid Solidification* (2), 1986, pp. 1–19; M. C. Connell and P. G. Partridge, *Acta metall.* 35 (8), 1987, pp. 1973–1980; b) pp. 1981–1993). The initial microstructure of VD Al—Cr—Fe alloys allowed for tailorability and an optimization of properties which rendered the resultant property profiles superior compared to all other metallic materials. The solid solution and the combined effect of dislocations and fine grain structure contributed to about 60% of the strengthening effect of these vapor deposited alloys (M. C. Connell and P. G. Partridge, *Acta metall* 35 (8), 1987, pp. 1973–1980; b) pp. 1981–1993). The solid state second phases obtained by subsequent thermomechanical processing of VD Al—Cr—Fe alloys are so fine that a maximum efficiency of strengthening mechanisms was achieved without reduction in toughness which is so important for aerospace applications (see above).

Evidently, these attributes accrue to the Mg—Ce system as well. Ce and the other light (and heavy) rare earth metals represent not only a very thermally stable solid solution in cph-Mg or any other metastable Mg-rich Mg-light RE phase as Cr does in fcc-Al especially when made via the PVD-route, they also represent an effective solid solution hardener so opening avenues for a promising development. Subsequent precipitation of selected alloying additions to the solid solution of light RE metals in cph-Mg via selected alloy forming operations should improve hardness, strength and the operative Hall-Petch proportionality constant $k_y$ (and the intercept $\Delta\sigma_0$ of the Hall-Petch-relationship) of corresponding wrought alloy products even further.

7.2 Improved Damage Tolerance by Processing for "Clean Grain Refinement" (Effect of Purified and Purification of Feedstock and Impurity Size)

As for other reactive materials, the properties and in particular the damage tolerance of Mg-and Al-based alloys depend on their impurity content. It shall be noted that spectacular failures occurred in aviation and automobile applications due to catastrophic corrosion of Mg-alloys after a while of use in service which resulted from microgalvanically active inclusions such as Fe-, Ni- and/or Cu-(containing) inclusions and/or second phases, for example. In their classical paper, Hanawaldt et al. have demonstrated (J. D. Hanawaldt, C. E. Nelson, J. A. Peloubet, *Trans AIME* 147 (1942), pp. 273–299) the particular tolerance limit of 0.017 wt. % Fe in the presence of Mn and of 0.005 wt. % Fe in the presence of Al in casting alloys above which catastrophic failure results upon immersion in salt-solution. Most critical (and relatively independent on deliberate alloying additions) was the Ni-content of Mg-castings with a maximum threshold as low as 0.001 wt. % Ni prior to a dramatic increase in the susceptibility to corrosion.

The world, however, has ignored and/or underestimated the significance of the "Hanawaldt"-thresholds for more than 40 years. Between the 1950s and 1980s it was common use to either employ a 2N8 (i.e. 99.8% purity by weight) feedstock for magnesium with certified trace analyses of individual maximum impurities (by weight) in the range of (Fachausschuss Nichteisenmetalle, *DNA*, 1961, p. 318; E. Bissig, Alcan Chemical Ltd., *Dow Magnesium Analysis Sheet*, 23 February, 1993):

0.002% Ni
0.05% Fe
0.02% Cu
0.01–0.04% Si
0.1% Mn
0.04% Al
0.05% others, balance Mg,
i.e. without providing any guarantee against "Hanawaldt"-type of critical impurity levels and resulting failure,—or the higher purity version of 3N—Mg-feedstock (99.90) of that period which represented a better alternative, but not a solution to the corrosion problem, since in particular the iron-content was still very critical (cf. Table 1, Part 1 and: Fachausschuss Nichteisenmetalle, DNA, 1961, p. 318; Societa Italiana Per II Magnesio (SAIM), 1987):
0.001% Ni
0.02–0.003% Fe
0.002–0.005% Cu
0.01% Si
0.01–0.05% Mn
1. % Al
0.01% others, balance Mg,
i.e. still without providing the guarantee required against "Hanawaldt"-type of corrosion failure. It was only relatively recently that the "Hanawaldt"-type of thresholds were sufficiently taken into account in the fabrication of engineering alloys such as AZ91 and other Mg—Al-based casting alloys (cf. Table 1, Part 2). Along with the introduction of high purity Mg-alloys, Closset and Dimayuga have shown (B. Closset and F. Dimayuga, *Proc. Conf Mg-Alloys and Their Applications*, 10–12 April, 1992, DGM, Oberursel, RFA, pp. 143–150) that the further reduction of critical impurities from 0.015 wt. % Cu and 0.004 wt. % Fe down to the level of 0.001 to 0.0015 wt. % Cu and Fe and a constant level of max. 0.001 wt. % Ni results in a further reduction of the annual corrosion rate of AZ91 alloy from 12 down to 3 mpy (cf. Table 1, Part 2). Such results are possible by using 3N8 Mg feedstock providing the following trace analysis of maximum impurity content (Johnson Matthey GmbH, Finest Inorganic Research Chemicals and Materials, *Handbook*, 1995/96, Karlsruhe, RFA):
Al 0.003%
Mn 0.0016%
Ni 0.0005%
Si 0.002%
Ca 0.001%
Cd<0.0001%
Zn 0.004%
Fe 0.0013%
Cu<0.0005%
Pb 0.001%
Sn<0.001%.

Other important impurity-thresholds in Mg include the Na-level which should be below 0.003 wt. % to avoid (grain boundary) embrittlement and the oxygen content in ingot processed Mg-alloys (i.e. with a grain size >201 μm) to avoid deterioration of fracture toughness, for example (E. F. Emley, *Principles of Magnesium Technology*, Pergamon Press, 1966). An analysis of sublimed grade ("SM") of magnesium feedstock resulted (F. Hehmann, *Consultancy Work*, Report to AFWAL, Wright-Patterson Air Force Base, 8 Nov. 1985) in:
0.004% Fe
0.004% Mn
0.002% Al
0.003% Si
<0.0005% Cu <0.0005% Ni
<0.0005% Na
<0.0005% Ca so 99.985 (4N) magnesium by weight. Mg-feedstock impurities are therefore a reference for further Mg-based alloy development. Mg-feedstock impurities represent the minimum contamination in Mg-alloy synthesis from/via condensed matter such as by casting methods, ball, bar and other milling techniques employing the solid state and PVD via (magnetron) sputtering methods on the one hand and they represent a maximum contamination in Mg-alloy synthesis by using thermal evaporation methods due to the involved distillation and resulting purification effect (see below).

The processing of Mg-alloys via/from condensed matter is unique in the sense that the impurity level of the feed stock is inevitably retained and/or increased in the final alloy and alloy product depending on the processing conditions employed. Feed stock and processing conditions must avoid critical levels of critical impurities with regard to novel Mg-alloys and Mg-alloy chemistry, which in return must retain the low density of magnesium. The impurity level of the feed-stock therefore determines and/or co-determines the final property profile, in particular the profile of the electro-chemical and/or corrosion properties. In order to develop superior Mg-alloys it is therefore not only necessary to choose a suitable feedstock, but also to retain the degree of purity supplied by way of the feedstock, i.e. to keep further contamination as low as possible. Therefore, it is inevitable to employ a number of pre-cautions:

7.2.1 Condensed Matter Processing and Sputtering 1. usage of a refractory metal such as Hf, V, Ta, Nb, Mo, W, Cr, Re, Zr (or a refractory metal based alloy, intermetallic, ceramic) as crucible material to avoid any reaction between Mg-melt and crucible. Mg-melts must not only avoid (contact with) iron-based crucibles (cf. above). In the case of an alloying additions such as (heavy) rare and alkaline earth metals such as (elemental) calcium, alumina, magnesia, zirconia, i.e. oxides cannot be used as crucible materials, either, since they are reduced by calcium, for example, and the resultant oxide products embedded in the Mg-matrix trigger local pitting of the Mg-alloy. Graphite must also be excluded due to the susceptibility of liquid magnesium to form Mg-carbides which are (as arc Al-based carbide) easily dissolvable in aqueous solutions. The most versatile, since shock-resistant crucible material was identified to be tantalum. It is therefore also very useful to employ Ta (or W) (-based alloys) as a material for the milling container and/or its surface layer of a defined (e.g. sputtered thickness) (e.g. 5 nm to several millimeter, e.g. 5 mm using PVD-, CVD and plating techniques) as well as for the milling projectiles/bodies (balls, bars etc.) and their surface layer of a defined thickness (e.g. 1 nm to e.g. 20% of corresponding overall cross-section).

2. inert gas atmosphere such as argon to protect the liquid at highest possible atmospheric pressure to minimize losses of the melt due to evaporation. Note that the use of a flux endangers contamination of the melt with Na, K, Cl etc.

7.2.2. Vapor Deposition using Thermal Evaporation Methods

Thermal evaporation of pure Mg-feedstock represents effectively a co-evaporation situation with respect to the involved impurities such as Fe, Ni, Cu, Si etc. which—due to their distinctively different vapor pressures compared to Mg—are overproportionally retained either in the liquid Mg-bath or the solid feedstock following the law by Hertz-Knudsen:

$$\Delta \Gamma^{[mol]} = \Delta(dN_v / A_v dt)$$

$$( = 2\pi m k_B T))^{-1/2} (\Delta p^* - p) \alpha_n$$

where $dN_v$=number of evaporated atoms per unit time, $A_v$=amount of evaporated surface employed, $p°$=saturation pressure of the element concerned, p=(static) pressure evaporation surface, $k_B$=Boltzmann's constant and $\alpha_n$=evaporation coefficient which depends upon surface conditions and which are depending on T and P in turn. The distillation effect does not replace the need to use Ta (-based) materials and/or coatings for the crucibles to protect the (molten) Mg-feedstock (e.g. as a Mg-bath) against Fe-contamination. Certain trace elements of the Mg-feedstock such as Na, K and Ca will be co-evaporated without (essential) distillation effect. Their impurity level has to be minimized in the very first Mg-feedstock employed. Others such as oxygen and carbon are easily introduced upon the thermal evaporation and/or sputtering due to the risk to absorb oxygen and/or carbon as a result of the fact that with evaporation a fragmentation level on a mono-atomic length scale so the highest surface-to-volume ratio of matter in nature is attained. Already the fabrication of Mg—Ca based casting alloys had led to a combination of 0.0021 to 0.0236 wt. % C due to the affinity of Ca with atmospheric carbon resulting in Ca-carbides at surface and in the bulk of corresponding slabs (F. Hehmann, *Consultancy Work*, Report to AFWAL, Wright-Patterson Air Force Base, 8 Nov. 1985).

The further Mg-alloy development may relax the conditions on the critical level of critical impurities in magnesium feed-stock, but it does not make the requirements on Mg-alloy purity redundant, since the majority of atoms in possible contact with the impurity atoms remains Mg-atoms. One of the prime objectives of micro-alloying by conventional processing is microstructural refinement to increasing strength, thermal stability of strength and deformability as well as to reduce micro-shrinkage of corresponding Mg-alloys. Many elements considered (cf. M. O. Pekgüleryluz and M. M. Avedesian, in: *Magnesium Alloys and Their Applications*, eds. M. L. Mordike and F. Hehmann, DGM Oberursel, FRG, 1992, pp. 213; M. O. Pekguleryüz, A. Luo, P. Vermetta and M. M. Avedesian, *Proc. 50$^{th}$ Int. Mg Conf.*, IMA, McLean, VA 22101, May 1993) for microalloying, however, are low melting point trace elements with the potential effect to recontaminate the recently established high purity ingot Mg-alloys by formation of microgalvanically active second phases. Moreover, micro-alloyed constituents have a tendency to be re-distributed on grain boundaries when processed by conventional casting methods as a result of partition coefficients below unity.

It was possible to improve the corrosion behavior of Mg—Al-Zn—base alloys instead by microstructural refinement down to the degree that was achieved by impurity reduction of Fe, Ni and Cu in ingot processed Mg—Al—Zn-based alloys, but without the need to recur to high purity standards. From earlier work it is known (F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1; F. Hehmann, F. Sommer and H. Jones, Extension of Solid Solubility of Yttrium and Rare Earth Metals in Magnesium by Rapid Solidification, *Processing of Structural Metals by Rapid Solidification*, eds. F. H. Froes and S. J. Savage, American Society for Metals, Metals Park, Ohio, 1987, pp. 379–398; F. Hehmann, F. Sommer and B. Predel, Extension of Solid Solubility in Magnesium by Rapid Solidification, *Mat. Sci. Engng. A*125 (2), 1990, pp. 249–265) that microstructural scale including porosity, grain size and size of second phases as well as choice of higher order additions for resultant type of solid state precipitates are crucial to improve the corrosion resistance of an advanced Mg-alloy. Cotton and Jones, for example, reported (J. D. Cotton and H. Jones, *J. Electrochem. Soc.* 136 (11), 1989, pp. 523C–527C; J. D. Cotton and H. Jones, *Int. J. Rapid Solidification* 6, 1991, p. 155) one to two orders of magnitude lower corrosion rates of RS Mg-15 wt. % Al splats over I/M AZ91 as a function of Fe-impurities and explained their results on the basis of (i) matrix ennoblement with Al (cf. FIG. 68 showing (top) Effect of Fe-content on the true weight loss—corrosion rate of rapidly solidified alloy Mg-1S wt. % Al (cubes) and of conventionally cast Mg-10 wt. % Al (diamonds) and (bottom) proposed mechanism of corrosion pit for a) conventionally cast Mg—Al alloy with large $Mg_{17}Al_{12}$ particles (not included here) and b) rapidly solidified microstructure with fine $Mg_{17}Al_{12}$-dispersion. CP: corrosion pit, SCP: spalled corrosion product, both modified upon RSP to PC (i.e. (reduced) pit (size) containing corrosion product and passivated precipitates) and (ii) a reduced rate of proton discharge around the (refined) Fe-inclusions. While conventional microalloying increases the susceptibility of high purity Mg-alloys to corrosion, RSP increases damage tolerance of non-high purity Mg alloys and would improve the corrosion resistance of high purity Mg alloys even further.

Figure 69:
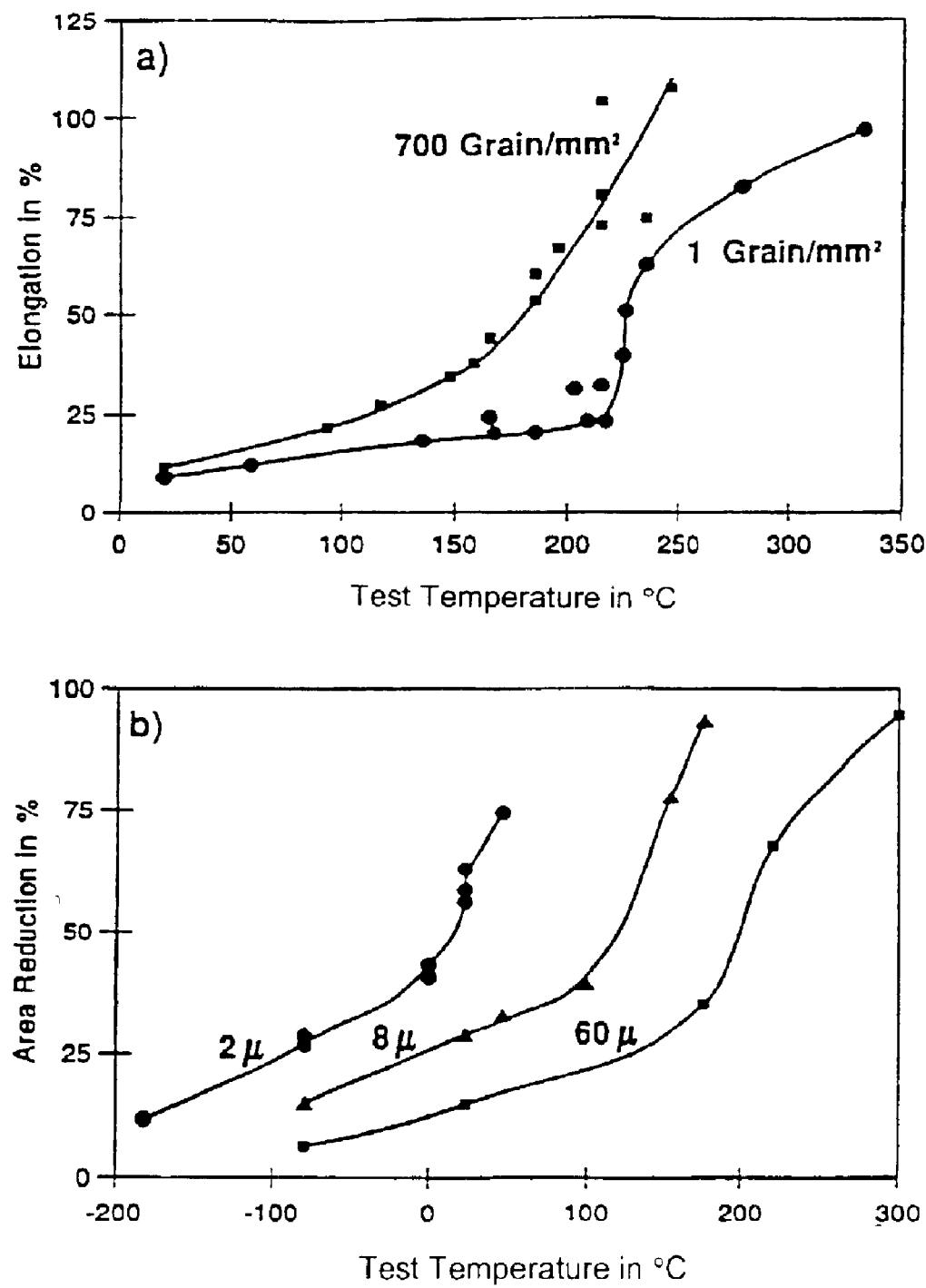
FIG. 69 a) Effect of grain size on temperature of ductility transition and on shape of transition curve and b) effect of gradual decrease of grain size on transition temperature for pure magnesium.

Under compressive loading and under tensile loading at hydrostatic pressures (HP) of 230 to 700 MPa RS AZ91 was found (D. Lahaie, J. D. Embury, M. M. Chadwick and G. T. Giray, *Scr. Metall. Mater.* 27 (2), 1992, pp. 139–142) to show macroscopic and localized shear bands without premature grain boundary fracture nor with any evidence by TEM of twinning. Grains were of size 1.2+/−0.5 $\mu$m being decorated by $Mg_{17}Al_{12}$-particles of size 0.1–0.3 $\mu$m. I/M AZ91 of grain size 8–15 $\mu$m, however, showed ample evidence of twinning under such conditions. The observed shape change and resulting microscopic strain of the 1 $\mu$m-grains were smaller than the imposed macroscopic strain. At room temperature using a strain rate $\epsilon=10^{-4}$ (D. Lahaie, J. D. Embury, M. M. Chadwick and G. T. Giray, *Scr. Metall. Maier.* 27 (2), 1992, pp. 139–142) true (engineering) strain to fracture of RS AZ91 increased from 0.1 (10.5%) (for HP=0 MPa) to up to 1.6 (400%) (for HP=700 MPa). Grain refinement down to about 1 $\mu$m was therefore considered to activate new deformation mechanisms allowing for grain boundary sliding and new flow processes at ambient temperature so substantially improving ductility of wrought Mg-alloys. Not only that these results confirm the ductility transition in the grain size regime of 5–10 m (FIG. 69 showing a) Effect of grain size on temperature of ductility transition and on shape of transition curve and b) effect of gradual decrease of grain size on transition temperature, both for pure magnesium. After E. F. Emley, *Principles of Magnesium Technology*, Pergamon Press, 1966) as was shown by Emley (E. F. Emley, *Principles of Magnesium Technology*, Pergamon Press, 1966) in 1966 for pure Mg (see below) and which is relatively independent on composition and alloy system. The results also suggest that such grain refinement is difficult to be achieved without recurs to the techniques according to the invention.

Figure 66:
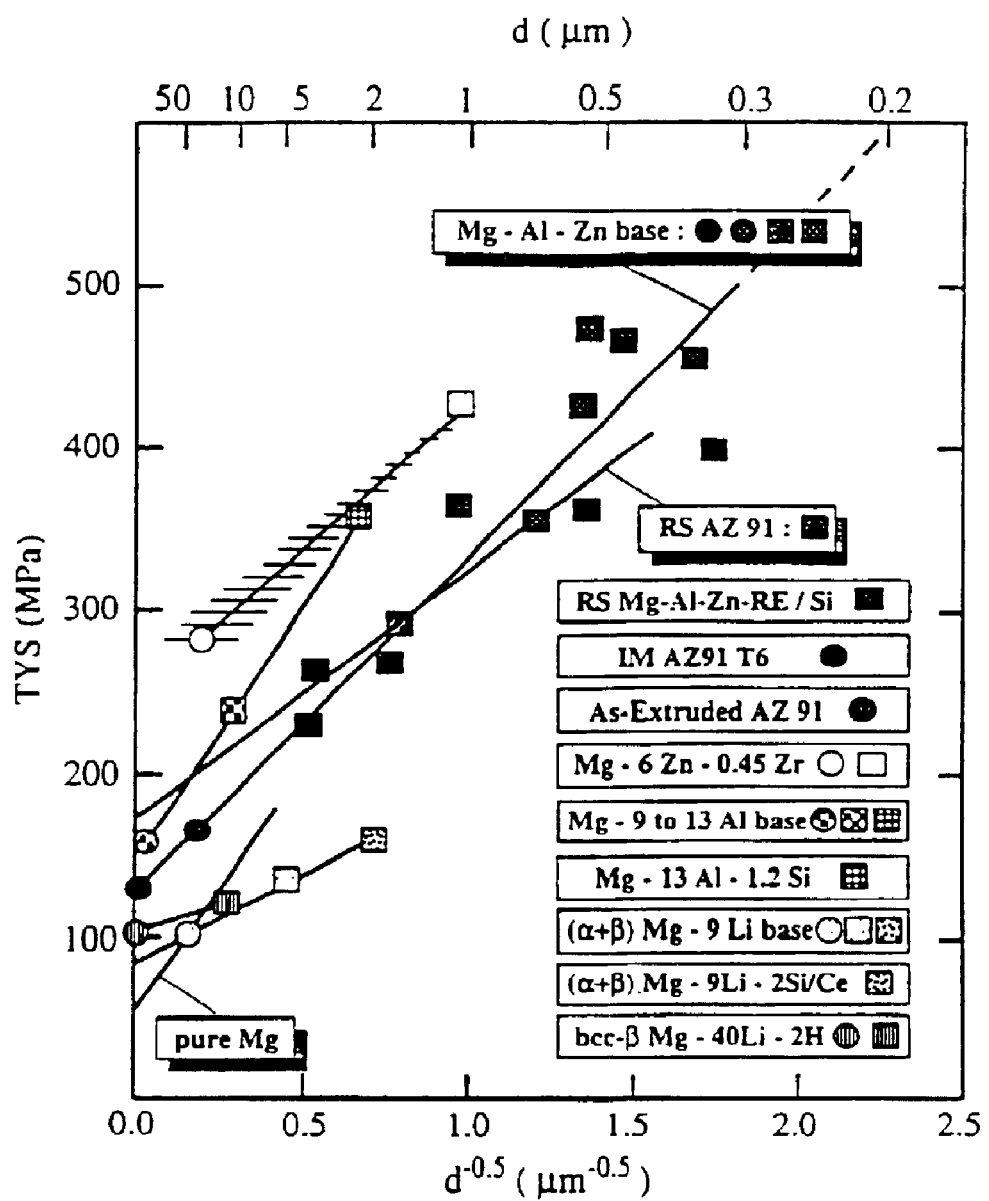
FIG. 66 Tensile yield strength $\sigma_y$ as a function of $d^{-0.5}$, with d=grain size for extruded Mg-alloys made by ingot processing (I/M, discs) and by rapid solidification processing (RSP, squares).

FIG. 66 shows tensile yield strength $\sigma_y$ as a function of $d^{-0.5}$, with d=grain size for extruded Mg-alloys made by ingot processing (I/M, discs) and by rapid solidification processing (RSP, squares). The Hall-Petch relationship for Mg—Al—Zn base alloys is from H. Jones, *Mater. Sci. Engng. A*137 (1991), pp. 77–85, that for Mg-10.9 Al after P. J. Meschter, *Met. Trans.* 18A (1987), pp. 347–350, for ZK60 after S. Isserow and J. Rizzitano, *Int. J. Powder Met. & Pow. Techn.* 10 (3) (1974), p. 217, that for ($\alpha+\beta$) Mg-9 Li based alloys after P. J. Meschter and J. E. O'Neal, *Met. Trans.* 15A, 1984, pp. 234–240 and P. J. Meschter, *Mc Donnel Douglas Research Laboratories*, priv. communication, 1986, that for bcc-$\beta$Mg-40Li-2H [at. %] after H. Haferkamp, Fr. -W. Bach, P. Bohling and C. Willems, "Advanced Aluminium and Magnesium Alloys", eds. T. Khan and G. Effenberg, ASM International Metals Park, Ohio, June 1990", pp. 829–836, and that for pure Mg from T. H. Courtney, *Mechanical Behavior of Materials*, Mc Graw Hill, 1990, p. 171. If not indicated otherwise, alloy composition is in [wt. %].

Figure 67:
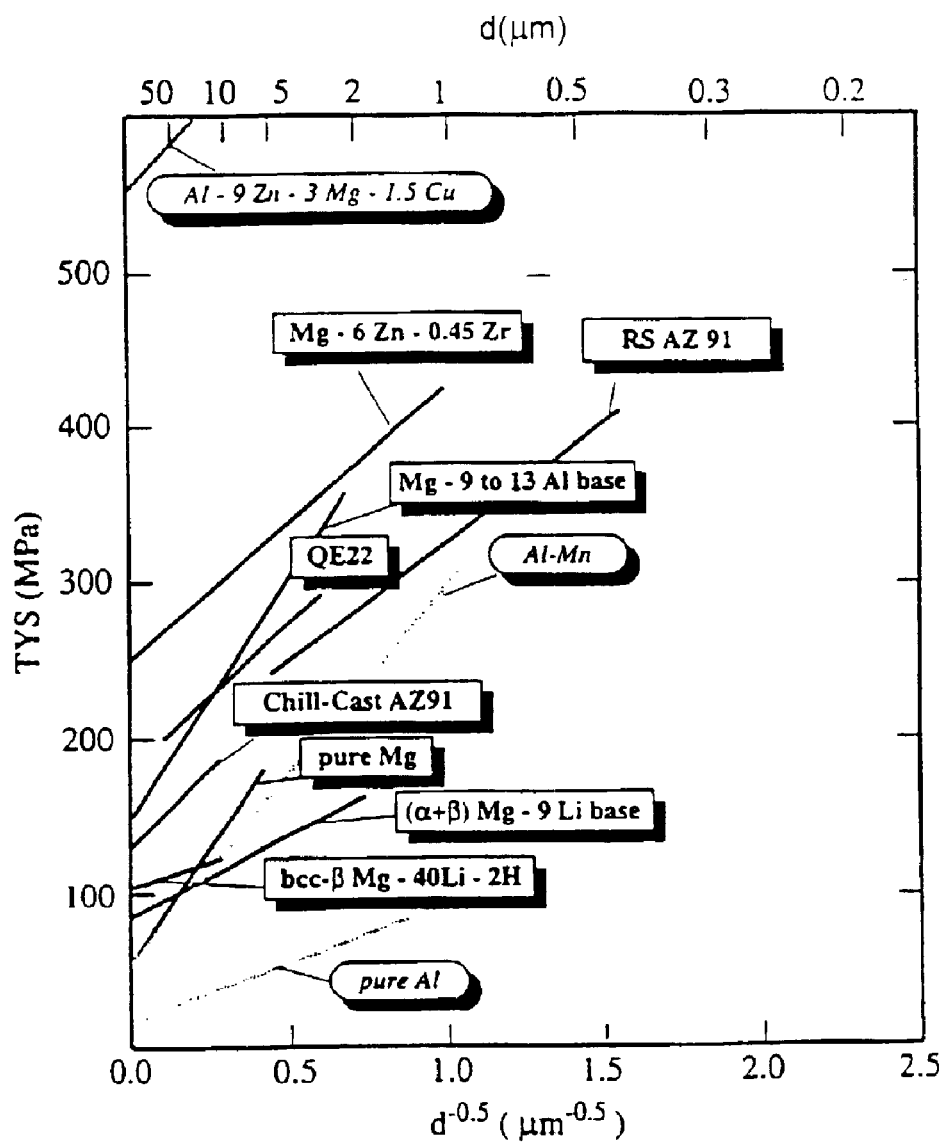
FIG. 67 Tensile yield strength $\sigma_y$ as a function of $d^{-0.5}$, with d=grain size for extruded Mg- and Al-alloys made by ingot processing and by rapid solidification processing.

FIG. 67 depicts the tensile yield strength $\sigma_y$ as a function of $d^{-0.5}$, with d=grain size for extruded Mg- and Al-alloys made by ingot processing and by rapid solidification processing, here without individual samples. Bold lines: $k_y$-values for Mg and Mg-alloys; dotted lines: $k_y$-values for Al and RSP-Al-alloys. Note that minimum grain size observed is represented by the end on the right hand side of each Hall-Petch relationship.

Microstructural refinement by rapid solidification method down to <1 $\mu$m does not only result in more effective grain refinement than micro-alloying by conventional means (10–30 $\mu$m, cf. FIGS. 66 and 67). Obviously, it also embraces the advantage of higher chemical homogeneity so avoiding undesirable and unpredictable microgalvanic and other detrimental effects than those introduced by conventional micro-alloying. This is particular relevant for non-equilibrium Mg- and Al-based alloys eventually consisting of a high grain boundary and/or dislocation density in which impurities (such as by micro-alloying may act as nuclei to trigger natural aging via GP-zones and other second phases (cf. above). The employed feed-stock therefore allows to discriminate beneficial from detrimental alloying and microstructural effects upon corrosion behavior and/or damage tolerance of non-equilibrium Mg- and Al-alloys so to surpass in the usual conclusion that the anode-to-cathodic surface area controls the observed results (cf. F. Hehmann, H. Jones, F. Sommer and R. G. J. Edyvean, Corrosion Inhibition in Magnesium-Aluminium Based Alloys Induced by Rapid Solidification Processing, *J. Mater. Sci.* 24, 1989, pp. 2369–2379).

The combined effect of impurity reduction and microstructural refinement should therefore render Mg-heavy rare earth metal alloys to candidates for a superior alternative to current established Mg-alloys for more demanding applications by replacing the thermally less stable Al and Zn in Mg—Al-base alloys including the rapidly solidified magnesium alloy EA55RS. This particular alloy development should allow for more corrosion resistant magnesium engineering alloys by casting routes so superceding current development for corrosion resistant cast and wrought magnesium alloys. The alloy compositions and the treatments for transforming such alloys into products where corrosion resistance and the stability and transformation behavior of the metastable state is of prime concern have yet not been explored. This concerns wrought products and thin-walled castings with a fine grain size and which are suitable for low temperature applications.

One of the consequences is that microstructural refinement is essential for advanced Mg-alloys processed via condensed matter for demanding aeronautical applications in order to provide satisfying damage tolerance. Apart from alloy compositions the following parameters are essential, i.e. grain size, size of precipitates and dispersoids, the degree of purity and the size of impurities and/or impurity phases. The combined effect of impurity control and/or reduction and microstructural refinement allows for superior corrosion resistance via condensed matter processing and in particular via thermal evaporation methods. Once a productive thermal evaporation process is established, vapor-deposited Mg-feedstock can be used for mechanical alloying without undermining economical viability of the final product.

strengthening mechanism. The compressive stress to fracture of RS AZ91 was found to amount to 650 to 750 MPa at T=77–273 K and a strain rate $\epsilon$ of $0.1\times10^{-3}$ s$^{-1}$. At room temperature using a strain rate $\epsilon=10^{-4}$ (D. Lahaie, J. D. Embury, M. M. Chadwick and G. T. Giray, Scr. Metall. Mater. 27 (2), 1992, pp. 139–142), tensile stress to fracture of RS AZ91 increased from 400 MPa (for HP=0 MPa) to up to >900 MPa (for HP=700 MPa), the latter corresponding to a value of E/70. The validity of such postulations can be examined by the response of the Hall-Petch proportionality constant $k_y$ on grain refinement. Pechiney established (G.

TABLE 1

Purity of Primary Mg Feedstock and of AZ91 Reference Alloy

Part 1: Primary Magnesium Ingot/Chemical composition in
(E, Bissig, Alcan) Chemical Ltd., Dow Magnesium Analysis Sheet,
Feb. 23, 1993) wt. %

|  | ASTM 9980A | Mg-1 | Mg-2 | Mg-3 |
|---|---|---|---|---|
| Aluminum, Max. |  |  |  | 0.003% |
| Copper, Max. | 0.02% | 0.02% | 0.02% | 0.004% |
| Iron, Max. |  |  | 0.05% | 0.04% |
| Lead, Max. | 0.01% | 0.01% | 0.01% | 0.005% |
| Manganese, Max. | 0.10% | 0.10% | 0.01% | 0.006% |
| Nickel, Max. | 0.001% | 0.001% | 0.001% | 0.001% |
| Silicon, Max. |  |  |  | 0.005% |
| Tin, Max. | 0.01% | 0.01% | 0.01% | 0.005% |
| Calcium, Max. |  | 0.0015% | 0.0015% | 0.0015% |
| Sodium, Max. |  | 0.003% | 0.003% | 0.003% |
| Boron, Max. |  |  |  | 0.00007% |
| Other Impurities (each maximum) | 0.05% | 0.05% | 0.05% | 0.01% |
| Magnesium by Difference (minimum) | 99.80% | 99.80% | 99.90% | 99.90% |
| Comments |  | Same As ASTM 9980A | Low Mn | Low Mn and Al |

Part 2 Chemical Specifications for AZ91 Casting Alloys

| Alloy | Cu % max | Ni % max | Fe % max | Mn % max | Designation |
|---|---|---|---|---|---|
| AZ91 A | 0, 10 | 0, 03 | (0, 3)* | 0, 13 | ASTM Die Cast |
| AZ91 B | 0, 35 | 0, 03 | (0, 3)* | 0, 13 | ASTM Die Cast |
| AZ91 C | 0, 10 | 0, 01 | (0, 3)* | 0, 13 | ASTM Gravity Cast |
| AZ91 D | 0, 015 | 0, 001 | 0, 004 | 0, 17 | ASTM HP Die Cast |
| AZ91 E | 0, 015 | 0, 001 | 0, 005 | 0, 17 | ASTM HP Gravity Cast |

Part 3 Annual Corrosion Rates of AZ91 as a Function of Impurity Content

| Alloy | Cu % max | Ni % max | Fe % max | Mn % min | Corrosion Rate (mils/y) |
|---|---|---|---|---|---|
| AZ91 D | 0, 015 | 0, 001 | 0, 00 | 0, 17 | 25 |
| AZ91 X* | 0, 003 | 0, 001 | 0, 004 | 0, 17 | 12 |
| AZ91 SX* | 0, 0024 | 0, 0010 | 0, 0024 | 0, 17 | 5 |
| AZ91 UX* | 0, 0010 | 0, 0010 | 0, 0015 | 0, 17 | 3 |

*Timminco Metals generic designation
*No. max. Fe is specified; included in others 7.3 Hall-Petch Strengthening of High Performance Light Alloys If intragranular grain boundary failure was suppressed via grain refinement, localized shear at stresses of the order of theoretical shear strength were considered (D. Lahaie, J. D. Embury, M. M. Chadwick and G. T. Giray, Scr. Metall. Mater. 27 (2), 1992, pp. 139–142) to become the limiting Nussbaum, P. Saintfort, G. Regazzoni and H. Gjestland, Scripta Met. 23 (1989), p. 1079) a Hall-Petch-type of relationship for yield strength TYS of the unmodified RS AZ91 composition as a function of grain size d following $$TYS = \sigma_o + k_y \cdot d^{-1/2}$$

with $s_0$=130 MPa and locking coefficient $k_y$=210 MPa mm$^{0.5}$. Jones suggested (H. Jones, *Mater. Sci. Engng. A*137 (1991), pp. 77–85) that the TYS-data for Si- and RE-containing RS Mg—Al—Zn based alloys developed by Allied Signal are in agreement with these values by Pechiney. In fact, the values by Allied indicated somewhat higher so and $k_y$-values (see FIGS. 66 to 72). Evidently, Si and RE act not only as the often quoted (cf. Project MAIE/0053/F: Rapid Solidification of Magnesium, *EURAM-BRITE Workshop*, 26–27 November 1990, Louvain-la-Neuve, Belgium) microstrutural stabilizers via formation of T-stable dispersoids to pin the motion of dislocation and grain boundaries upon consolidation of pulverized ribbons, flakes and droplets, but also as nuclei and catalysts for more effective grain refinement itself during both solidification and/or consolidation. The first and basic effect of such additions is thus to increase the boundary strengthening effect afforded by grain refinement upon the entire processing route cf. those alloys without such additions.

Figure 72:
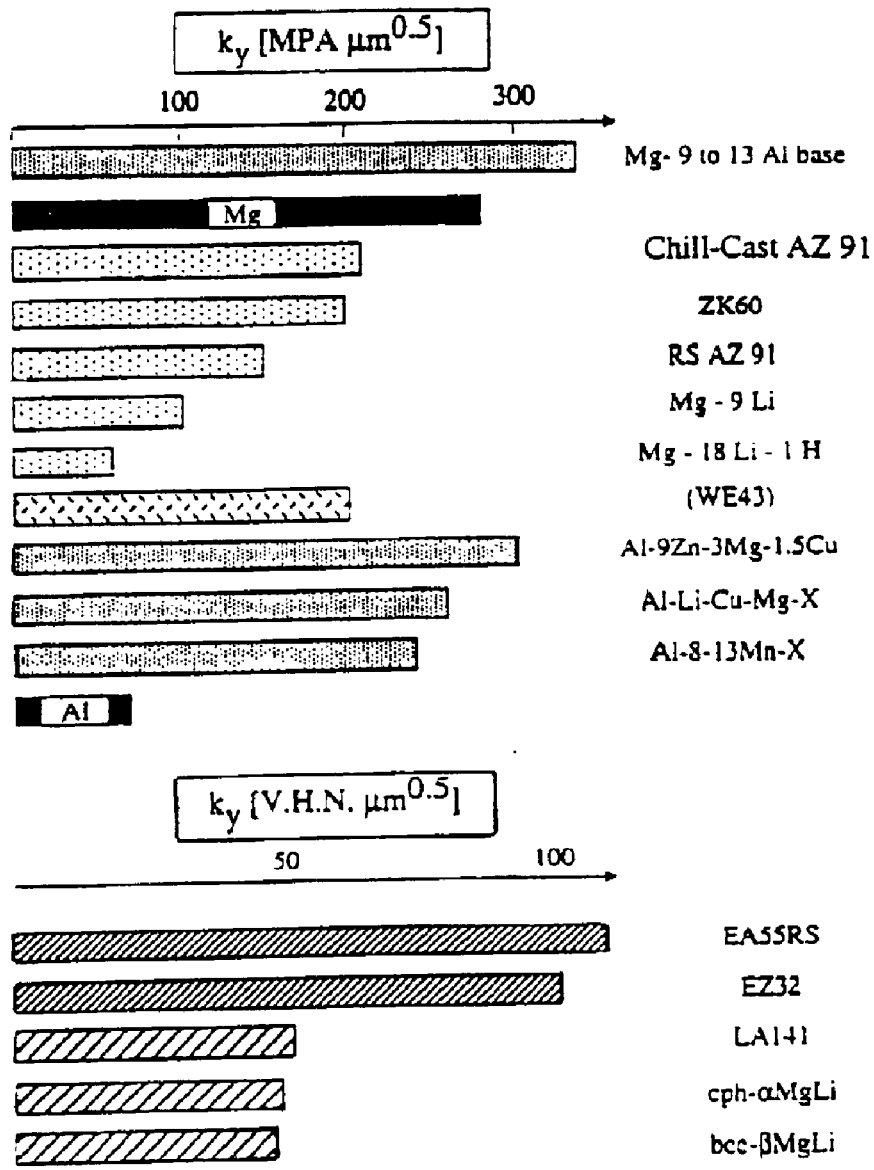
FIG. 72 Hall-Petch proportionality constants $k_y$ for light alloys based on Mg and Al and obtained from tensile tests (top) and microhardness data (down).

Already as long as twenty years ago, Isserow and Rizzitano reported (S. Isserow and J. Rizzitano, *Int. J. Powder Met. & Pow. Techn.* 10 (3) (1974), p. 217) on the effect on grain refinement of RS as one of the dominant factors to improve strength of ZK 60 alloy by "micro-quenching". Corresponding $k_y$-value was in the regime of that reported by Pechiney, while corresponding intercept $s_0$, however, appeared to be significantly higher than for Mg—Al—Zn alloys (FIGS. 66,67). A $k_y$-value of 185 MPa $\mu m^{0.5}$ is evident from the literature on Mg-alloy QE22 (cf. P. J. Vervoort and J. Duszczyk, *PM Aerospace Materials* 1991, Lausanne Switzerland, Nov. 4–6, 1991, MPR Publishing Services Ltd., Shrewsbury SY1 1HU, UK, 1992, paper No 30). Meschter reported (P. J. Meschter, *Met. Trans.* 18A (1987), pp. 347–350) a strength increment of 68 MPa for solution treated RS Mg-10.9 Al over ingot processed Mg-9 Al (wt. %) which was consistent with the grain size reduction from about 100 to 11 $\mu m$ (i.e. factor 10) assuming an Hall-Petch factor $k_y$ of 337 MPa $\mu m^{0.5}$. While the $k_y$-values for the above precipitation-hardened Mg—Al—Zn-based and ZK60 alloys are significantly lower compared to pure Mg (280 MPa $\mu m^{0.5}$, see FIGS. 66 and 67) (A. Cottrell, *An Introduction to Metallurgy*, 2$^{nd}$ edition, Edward Arnold Publishers, 1975, p. 398), the value for the monophase Mg—Al alloy is above that for pure Mg and conventional Mg alloys, i.e. 280 MPA $\mu m^{-0.5}$ (E. O. Hall, *Yield Point Phenomena in Metals and Alloys*, Plenum Press, New York, 1970). The data Meschter reported (P. J. Meschter, *Met. Trans.* 18A (1987), pp. 347–350) for multiphase RS Mg-13Al–1.2Si alloy are in excellent agreement with the values for binary Mg-10Al alloys as corresponding extrapolation to smaller grain sizes shows (FIGS. 66,67). Finally, the reported data for Mg—Li based alloys result in 100 MPa $\mu m^{0.5}$ for the ($\alpha+\beta$)-Mg-9 wt. % Li base alloys by Meschter and O'Neal (P. J. Meschter and J. E. O'Neal, *Met. Trans.* 15A, 1984, pp. 234–240; P. J. Meschter, *Mc Donnel Douglas Research Laboratories, priv. communication*, 1986) and in 58 MPa $\mu m^{0.5}$ for the bcc-$\beta$ Mg-40Li-2H (at. %) by Haferkamp et al. (H. Haferkamp, Fr. -W. Bach, P. Bohling and C. Willems, "*Advanced Aluminium and Magnesium Alloys*", eds. T. Khan and G. Effenberg, ASM International Metals Park, Ohio, June 1990, pp. 829–836) (FIGS. 66,67). These are the lowest $k_y$-data yet observed for an Mg-alloy resulting in softer alloys than pure Mg for a grain sizes below 40 to 50 $\mu m$. FIG. 72 shows Hall-Petch proportionality constants $k_y$ for light alloys based on Mg and Al and obtained from tensile tests (top) and microhardness data (down). While alloying of Al decreases the value of $k_y$ of pure Al, almost all of the reported alloying of Mg decreases the $k_y$-value of pure magnesium.

7.4 Mechanical Particulars: Mg vs. Al

Mg has attracted much attention to study the nature of ideal metallic or free electron bonding (G. V. Raynor, *The Physical Metallurgy of Magnesium and Its Alloys*, Pergamon Press, London, 1959). The free $3s^2$ valence electron structure excludes pure Mg per se from any covalent bonding phenomena resulting in the lowest average valence electron binding energies and the weakest interatomic cohesion of a structural metal (C. Kittel, *Introduction Into Solid State Physics*, 5$^{th}$ Edition, John Wiley & Sons Inc., New York, 1976). The additional covalent $3p^1$-bond of pure Al develops a larger modulus of elasticity E (71 GPa) and of shear K (26 GPa) and a larger specific modulus of elasticity E/$\rho$ (27 GPa cm$^3$/g) compared to Mg (E=45 GPa, K=17 GPa, E/$\rho$=25 GPa cm$^3$/g) (A. Cottrell, *An Introduction to Metallurgy*, 2$^{nd}$ edition, Edward Arnold Publishers, 1975, p. 398). The operative slip distance in Mg is as for Al, but the operative slip normal (that is the perpendicular distance between two adjacent slip planes) is about four times longer. Both the theoretical and the operative Peierls-Nabarro stress on the close-packed (0001)-plane of pure Mg are thus orders of magnitude lower than on the (111)-planes of pure Al. Perfect lattice dislocations in pure Mg and conventional Mg-alloys would have therefore a relatively wide strain field and a much higher mobility than in pure Al and Al-alloys. Despite of this higher mobility, however, pure Mg is moderately harder than pure Al resulting in 40 over 15 Brinell Hardness Numbers BHN(C. J. Smithells, *Metals Reference Book*, 2$^{nd}$ Edition, Interscience Publishers, 250 Fifth Avenue, New York 1, 1955; 6th edition, Buttersworth, London and Boston, 1983) and a Hall-Petch coefficient $k_y$ of 280 MPa $\mu m^{1/2}$ which is four times larger cf. that of pure Al (68 MPa $\mu m^{1/2}$) (T. H. Courtney, *Mechanical Behavior of Materials*, McGraw Hill, 1990, p. 171).

Figure 70:
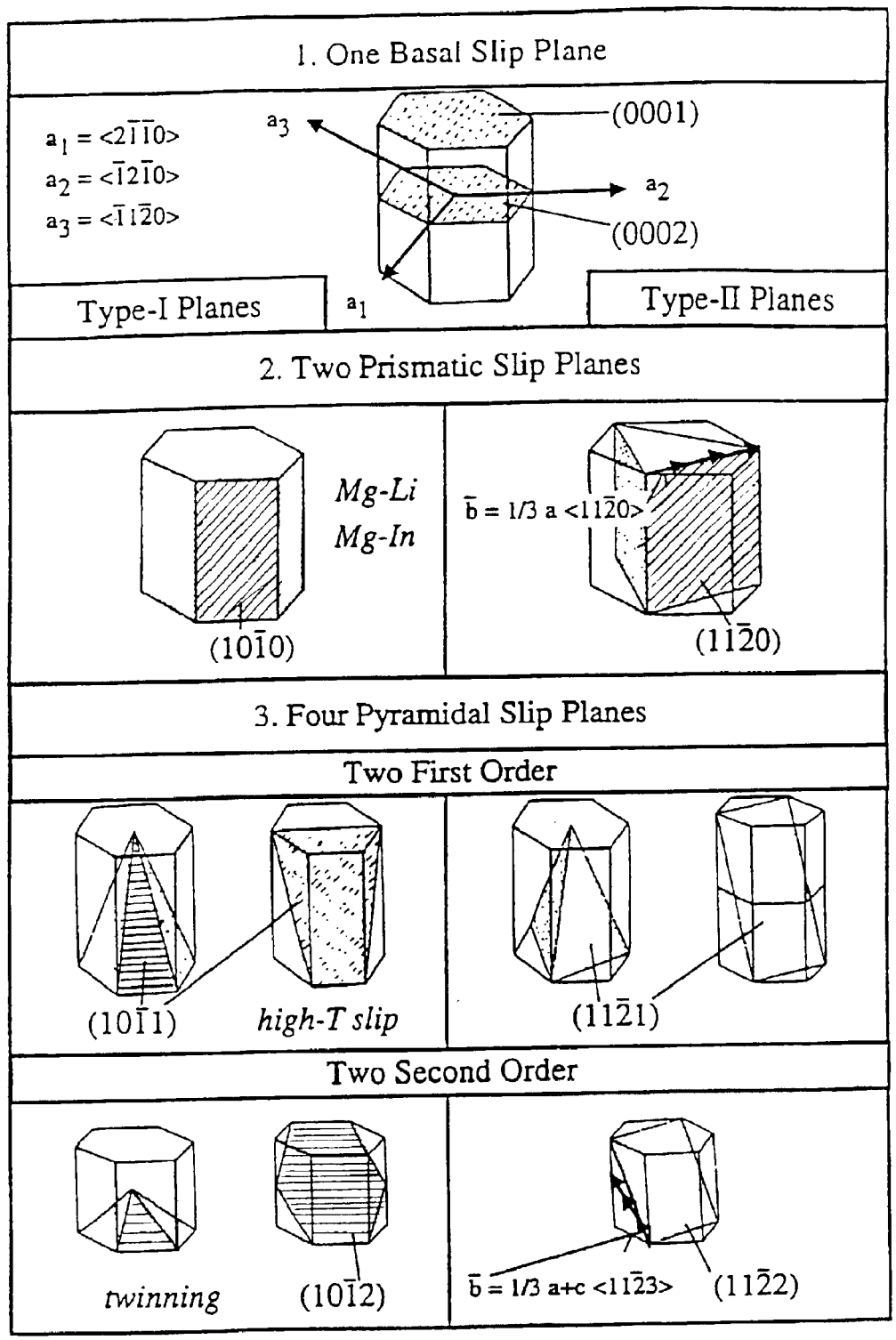
FIG. 70 Slip planes and slip directions of cph-magnesium in order of thermal activability above ambient temperature (italics: conditions for operative slip mode).

Below 498 K, plastic deformation of polycrystalline cph-Mg is limited to basal (0,0,0,1) <1,1,–2,0> slip and to pyramidal (1,0,–1,2)<1,0,–1> twinning (E. F. Emley, *Principles of Magnesium Technology*, Pergamon Press, 1966) (FIG. 70 showing slip planes and slip directions of cph magnesium in order of thermal activability above ambient temperature (italics: conditions for operative slip mode). After E. F. Emley, *Principles of Magnesium Technology*, Pergamon Press, 1966). The Mg-crystal has thus only 3 geometrical and 2 independent slip systems, while the Al-crystal has 12 (1,1,1)<1,–1,0> geometrical and 5 independent slip systems for general shape change (R. Von Mises, *Z. Angew. Math. Mech.* 8, 1928, p. 161). The maximum (polycrystal: mean) value of (cos $\phi$ cos $\lambda$) between slip orientation and tensile axis of Mg is therefore smaller than corresponding value for Al. Following Schmid's law ($\sigma_y$= $\tau_{crss}$/(cos $\phi$ cos $\lambda$)) shows that the relatively low (cos $\phi$ cos $\lambda$)-value is one reason (see above) for the larger hardness number and Hall-Petch coefficient of Mg cf. Al, but it is also one reason why polycrystalline Mg and its alloys do not develop macroscopic yielding and, instead, large stress concentrations at grain boundaries. Pure Mg and conventionally cast Mg-alloys thus present a tendency to embrittlement due to intergranular failure, but also localized transcrystalline fracture either along twinned regions in particular upon compression or along basal (0001) planes for very large grains (E. F. Emley, *Principles of Magnesium Technology*, Pergamon Press, 1966). Prismatic (1,0,–1,0)<1, 1,–2,0> slip planes are not active in pure Mg (FIG. 70). The addition of Li and In can activate such slip planes by using conventional casting methods (P. Bach, *PhD Thesis*, Nancy, 1969; R. Karney and G. Sachs, *Z. Phys.* 49 (1928), p. 480; F. E. Hauser, P. R. Landon and J. E. Dorn, *Trans. ASM* 50, 1958, p. 856). Activation of prismatic (1,0,-1,0)<1,1,-2,0> slip renders Mg-alloys more ductile at lower temperatures without the need to recurs to the required grain refinement as is affordable by rapid solidification. Unfortunately, however, such conventional alloys are associated with extremely low solid solution and cold hardening response as well as with poor corrosion resistance despite of their large solid solubility and this has already misled and thus frustrated a number of research programs for different motivations. Unless sufficient grain refinement was introduced to reduce back stresses and to enhance crystalline rotation via grain boundary gliding, however, deformation of structural Mg alloys at ambient show always a tendency to twinning (see below).

Obviously, grain refinement of Mg-alloys embrace a larger potential to improve strength and ductility as compared to Al-alloys and an interesting question is why this advantage has yet been left so untouched compared to the advantages of other materials. Furthermore: what degree of grain refinement substitutes for the missing independent slip system? Grain refinement is certainly one of the more important factors for the further development of Mg The comparison of modulus, operative slip normal vector and resultant Peierls-Nabarro stresses on the one hand with hardness and boundary strengthening capacity on the other indicates quite clearly that the mechanical behavior of Mg is dictated by preferred dislocation reactions as it is for other materials. Such dislocation reactions can take over the control of mechanical properties otherwise dictated by Peierls stresses, for example. If not, grain refinement of Mg would do the reverse and pure Mg would be softer than pure Al without showing better ductility.

7.5 Rate-Controlling Dislocation Reaction in cph-Mg

Figure 71:
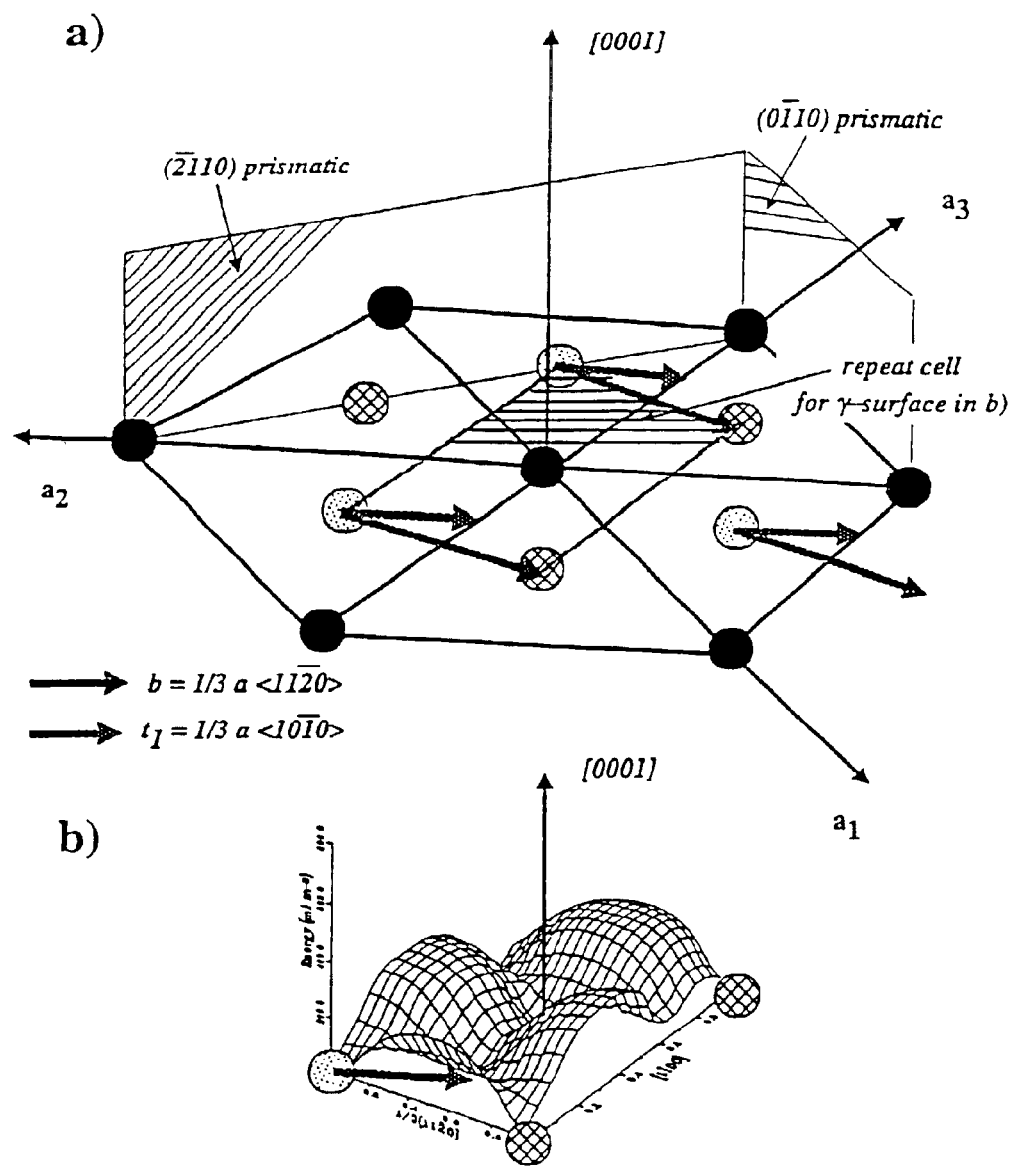
FIG. 71 Showing agreement between intrinsic fault vector $t_1$ a) as derived from linear elasticity and b) from multi-body potential calculations, here for the γ-surface repeat cell $1/3<11\bar{2}0><1\bar{1}00>$ of the basal plane of pure magnesium with Burgers vector b.

The scope of dislocation slip planes in the cph-lattice embraces basal, prismatic and first order pyramidal slip planes with Burgers vector 1/3 a <1,1,-2,0> and first and second order pyramidal systems with Burgers vector 1/3 (c+a)<1,1,-2,3> (FIG. 70). The 1/3 a <1,1,-2,0> vector is the shortest Burgers vector in the cph-lattice (cf. FIG. 71 showing agreement between intrinsic fault vector $t_1$ a) as derived from linear elasticity and b) from multibody potential calculations, here for the γ-surface repeat cell ⅓<11 2$\underline{0}$><1$\underline{1}$10> of the basal plane of pure magnesium with Burgers vector b, cf. V. Vitek and M. Igarshi, *Phil. Mag.* 63 A (5), 1991, pp. 1059–1075). Dark dotted arrow: $t_1$; bright dotted arrow: b; solid discs: (0001) atoms; dotted discs: e.g. (0002) atoms; double-hatched discs then (000$\underline{2}$) atoms, accordingly). The rate controlling mode for plastic deformation is therefore dictated by the lattice friction experienced by the structure of the core of the 1/3 a<1,1,-2,0> screw dislocation. Screw dislocations move slower than edge dislocations, since they are always present on two crystallographic planes and form sessile dislocation jogs upon propagation and intersection with other-screws (cf. N. K. Chen and R. B. Pond, *Trans. AIME* 194, 1952, p. 1085; W. G. Johnston and J. J. Gilman, *J. Appl. Phys.* 30, 1957, p. 121). The structure of the dislocation core tells with certainty whether (i) energy is to be gained upon dissociation of perfect dislocation movements into imperfect or partial dislocation movements which leaves a trace in the translational lattice, i.e. a stacking fault (SF) related to a given slip plane and (ii) whether sessile SF-components are involved. The operative slip mode of cph-metals is confined either to the basal plane (simple metals like Mg and Be) or to the prismatic plane (transition metals, see Table 2). The c/a-ratio does not control activation of prismatic slip as misleading literature tells (cf. Table 2). Any comparison of the mechanical properties of Mg-based alloys has therefore to be made on the basis of the structure of the core of the 1/3 a<1,1,-2,0> screw dislocation.

The basal dissociation of the 1/3 a<1,1,-2,0> screw dislocation (FIG. 70) follows (F. R. N. Nabarro, *Theory of Crystal Dislocations*, Clarendon Press, Oxford, 1967; J. P. Hirth and J. Lothe, *Theory of Dislocations*, Mc Graw Hill Book Co., New York, 1968):

1/3 a<1,1,-2,0>--->1/6 a<1,0,-1,0>+1/6 a<0,1,-1,0> and corresponds to a SF-energy $\gamma_b$ of the order of 10 mJ m$^{-2}$ (cf. V. Vitek and M. Igarshi, *Phil. Mag.* 63 A (5), 1991, pp. 1059–1075). The prismatic SF-energy $\gamma_p$ is about seven times larger underlying that no cross-slip occurs at ambient (see above). For comparison, the SF-energy $\gamma_{111}$ of unalloyed Al is even larger (e.g. 200 mJ m$^{-2}$, cf. G. E. Dieter, *Mechanical Metallurgy*, 3$^{rd}$ edition, McGraw Hill Int., Singapore, 1986, p. 137). The low basal stacking fault energy thus results (i) in a low number of operative slip modes, but it also allows for a larger dissociation of the rate-controlling 1/3 a <1,1,-2,0> basal screw than the corresponding screw in pure Al. The dissociated basal screw is a moderately harder transcrystalline obstacle for the motion of further dislocations allowing to pile-up more dislocations in pure Mg than in an hypothetical Al-crystal without activated cross-slip. This is the second factor contributing to the moderately higher values of hardness and $k_y$ and to intergranular embrittlement of pure Mg, though Peierls stresses are much lower than in pure Al. The cold working capacity of pure Mg is thus slightly better than that of pure Al. For reasons of crystal symmetry it was postulated (V. Vitek and M. Igarshi, *Phil. Mag.* 63 A (5), 1991, pp. 1059–1075), however, that any further dissociation such as by intersection with other dissociated dislocations cannot introduce sessile edge components into the basal plane. Basal stacking faults might always be glissile as is evidenced by the relatively low work hardening response of Mg-alloys compared to Al-alloys.

7.6 Effect of Grain Size and Thermal Activation on Deformation Modes

Mg shows a marked ductility transition when twin formation is suppressed by grain refinement and by pyramidal (1,0,-1,1)<1,1,-2,0> slip at temperatures at around 225° C. (FIG. 69) (E. F. Emley, *Principles of Magnesium Technology*, Pergamon Press, 1966). Twinning is an athermal shear deformation process involving mirrored movement of several atomic layers at small fault vectors thus reduce the large Peierls stresses associated with the large 1/3 (c+a)<1,1,-2,3> Burgers vector (FIG. 70). Any increase in the susceptibility to thermal activation would therefore render slip deformation modes more competitive and would decrease the likelihood of twinning. There are three factors to increase the susceptibility to thermal activation of slip (i) grain refinement reducing boundary back stresses so allowing easier accommodation of a) the overlap or void displacement between two adjacent grains (i.e. grain boundary sliding and/or rotation) as well as of b) the transcrystalline twinned volume, (ii) alloying elements with low melting points such as Li and (iii) increasing the temperature itself. It is thus kind of an adventure to attribute the enhanced deformability of Mg—Li alloys to twinning (K. Schemme, *Doctoral Thesis*, University of Bochum, 1993, p. 52). By contrast, twinning is frequently observed at high deformation rates such as under cyclic loading of conventionally processed Mg—Al based alloys (N. Attari, C. Robin and G. Aluvinage, *Advanced Aluminium and Magnesium Alloys*, eds. T. Khan and G. Effenberg, ASM International, June 1990, p. 837). Grain refinement of such alloys then results in significantly improved resistance to fatigue (cf. N. Attari, C. Robin and G. Aluvinage, Advanced Aluminium and Magnesium Alloys, eds. T. Khan and G. Effenberg, ASM International, June 1990, p. 837).

Grain refinement below a grain size of 8 μm of pure Mg reduces the ductility transition down to room temperature (FIG. 69). The critical resolved shear stress for pyramidal slip in Mg was found (J. F. Stohr and J. P. Poirier, Philos. Mag. 25, 1972, p. 1313) to peak at around 100° C. then followed by decreasing pyramidal crss toward higher temperatures. Alloying with Al and Zn slightly reduces the brittle-to-ductile transition temperature (e.g. AZM with peak at 212° C.) (E. F. Emley, Principles of Magnesium Technology, Pergamon Press, 1966). When both suitable alloying and grain size refinement come together, however, Mg alloys such as RS AZ 91 with a grain size of about 1 μm become superplastic even at room temperature (i.e. >1000%) (D. Lahaie, J. D. Embury, M. M. Chadwick and G. T. Giray, Scr. Metall. Mater. 27 (2), 1992, pp. 139–142). Novel micro-grained Mg-alloy compositions obtained by rapid solidification contain more T-stable dispersions impeding grain boundary sliding processes at lower temperatures. Their grain size is between 0.1 and 1 μm and they show a 400% superplasticity at around 548–573 K (S. K. Das, C. F. Chang, D. Raybould, J. F. King and S. Thistlethwaite, Proc. Conf. Mg-Alloys and Their Applications, eds. B. L. Mordike and F. Hehmann, DGM, Oberursel, October 1992, pp. 487–494) which is better than for any of the other light alloys.

7.7 Prismatic or Basal Slip? The Activation Issue for Polycrystalline Mg

The alternative and/or complementary method to enhance the deformability of Mg-alloys by non-equilibrium techniques is to trigger prismatic slip in the (eg.) cph-Mg-matrix (super-) saturated with selected elements. Prismatic slip in polycrystalline pure Mg has been observed at very low temperatures between –4 C. and –195° C. and at 260° C. (E. F. Emley, Principles of Magnesium Technology, Pergamon Press, 1966, p. 486/7). At temperatures around ambient prismatic slip was only evident in single crystals of pure Mg under preferred orientations of loading to avoid basal slip (A. Couret, D. Caillard, W. Püschl and G. Schoeck, Philos. Mag. A 63 (5), 1991, pp. 1045–1057). By contrast, conventional cast Mg—Li and Mg—In alloys show high room temperature ductility due to activation of prismatic slip. Mg—Li alloys show a decreasing axial ratio c/a with increasing Li-content, but Mg—In alloys do not (P. Bach, PhD Thesis, Nancy, 1969; R. Karney and G. Sachs, Z. Phys. 49 (1928), p. 480; F. E. Hauser, P. R. Landon and J. E. Dorn, Trans. ASM 50, 1958, p. 856). Be has the lowest axial ratio of all cph-metals (see Table 2), but it deforms by basal slip as Mg and does not exhibit any prismatic slip at room temperature in polycrystalline form (A. Couret, D. Caillard, W. Püschl and G. Schoeck, Philos. Mag. A 63 (5), 1991, pp. 1045–1057; B. Legrand, Dislocations 1984, eds. P. Veyssière, L. Kubin and J. Castaing, Colloque International du C.N.R.S., Edition du Centre National de la Recherche Scientifique, 15 Quai Anatole France, 75700 Paris; M. S. Duesburry, The Dislocation Core and Plasticity, Dislocation in Solids, Vol. 8: Basic Problems and Applications, ed. F. R. N. Nabarro, Elsevier Science Publishers, B. V., North-Holland, 1989). There is no point to believe that a simple metal like Be or the addition of a simple metal like Li to Mg enhances prismatic slip and deformability because of a lower c/a-ratio. Obviously, the geometrical ratio c/a is a phenomenon that correlates with slip activity for a given cph-metal within certain limits of alloying, but it does not provide any interpretation for the activation of prismatic slip and better deformability at all. However, the c/a-ratio is a widespread concept to mislead alloy selection and design criteria (cf. K. Schemme, Doctoral Thesis, University of Bochum, 1993, p. 52).

Legrand has shown (B. Legrand, Dislocations 1984, eds. P. Veyssière, L. Kubin and J.

TABLE 2

Glide Systems and Particulars of Close-Packed (cph) Metals. After B. Legrand (1984).

| cph-Element | Principal Glide Mode[1] | Secondary Glide Mode[1] | Value $R^{2)}$ | $\gamma_{min}$ [mJ/m$^2$]$^3$ and $\gamma_p/\gamma_b$ | Axial Ratio c/a |
|---|---|---|---|---|---|
| Cd | B | $\Pi_1,\Pi_2,P$ | 0.2 | 15/10.0 | 1.886 |
| Co | B | $\Pi_2$ | 0.2 | 45/5 | 1.624 |
| Zn | B | $\Pi_2,P$ | 0.25 | 35/6.0 | 1.856 |
| Mg | B | $\Pi_2,P$ | 0.25 | 30/4.2 | 1.624 |
| Be | B | $P,\Pi_2$ | 0.6 | 390/1.6 | 1.568 |
| Re | B/P | — | 0.9 | 540/1.1 | 1.615 |
| Tc | — | — | 1 | 440/0.94 | — |
| Tl | B/P | — | — | — | 1.598 |
| Ru | P | — | 1.7 | 520/0.59 | 1.582 |
| Os | — | — | 1.8 | 600/0.57 | — |
| Hf | P | $B,\Pi_2$ | 2.1 | 185/0.47 | 1.581 |
| Zr | P | $\Pi_1,B,\Pi_2$ | 2.3 | 150/0.44 | 1.593 |
| Ti | P | $\Pi_1,B,\Pi_2$ | 2.6 | 110/0.38 | 1.588 |
| Y | P | B | 3.5 | 60/0.29 | 1.571 |

[1] B = basal plane; P = prismatic plane; $\Pi_1$ and $\Pi_2$ are first and second order pyramidal planes, respectively.
[2] $R = (C_{66} * \gamma_b/C_{44} * \gamma_p)$, where $C_{ij}$ elasticity constants $C_{66}$ not equal $C_{44}$ for departure from ideal close packing and $\gamma_b$ and $\gamma_p$ are stacking fault energies in the basal and prismatic plane, respectively.
[3] If principal slip mode B, then $\gamma_{min} = \gamma_b$, otherwise $\gamma_{min} = \gamma_p$.

Figure 73:
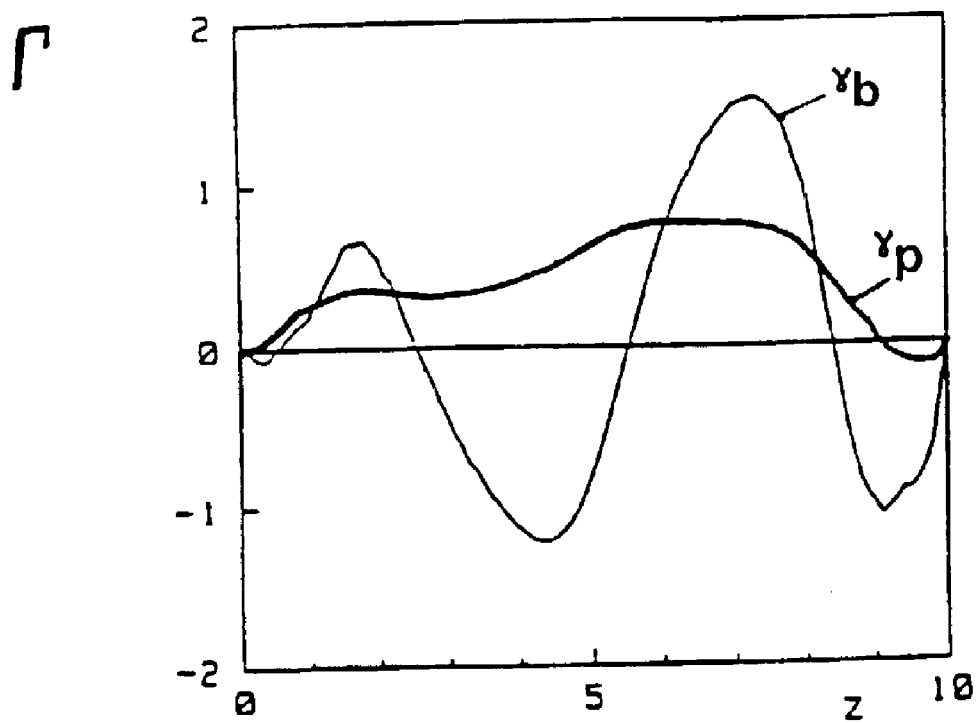
FIG. 73 Stacking fault energy Γ (in $[10^{-2}$ Ryd/at.]) of closed packed hexagonal crystal lattices in ($\gamma_b$) corresponding basal plane and in ($\gamma_p$) corresponding prismatic plane as a function of filled d-band states, Z.

Castaing, Colloque International du C.N.R.S., Edition du Centre National de la Recherche Scientifique, 15, Quai Anatole France, 75700 Paris) the consequences of orbit anisotropy on the ⅓ a<1,1,–2,0> core structure and the resultant principal glide mode. The principal slip plane of simple cph-metals like divalent Be, Mg, Zn and Cd is the closed packed basal plane due to the isotropy of corresponding valence electron structure. Easy prismatic slip is only evident for transition metals and yttrium so for rare earth metals (Table 2).The anisotropy of d-orbits is essential for activation of prismatic slip and it increases with decreasing degree of (filled) d-band states, Z suggesting that also f-orbits affect prismatic slip. The anisotropy results in two maxima in $\gamma_b$(TM) for Z of about 2 and 7 and in two minima in $\gamma_b$(TM) for Z of about 4 and 9 (see FIG. 73 showing stacking fault energy Γ (in [10$^{-2}$ Ryd/at.]) of closed packed hexagonal crystal lattices in ($\gamma_b$) corresponding basal plane and in ($\gamma_p$) corresponding prismatic plane as a function of filled d-band states, Z, showing $\gamma_p<\gamma_b$ for Z=1,2 and 6 to 8. From B. Legrand, in "Dislocations 1984", eds. P. Veyssière, L. Kubin and J. Castaing, Colloque International du C.N.R.S., Edition du Centre National de la Recherche Scientifique, 15 Quai Anatole France, 75700 Paris). Corresponding $\gamma_p$(TM)-values, however, are relatively constant (FIG. 73). The tendency for prismatic slip thus increases with decreasing ratio $\gamma_b/\gamma_p$ (Table 2). Incorporation of the ratio of the elasticity constants $C_{66}$ and $C_{44}$ completes the classification of cph-slip modes following:

$$R=(C_{66}*\gamma_b/C_{44}*\gamma_p).$$

(Table 2). The R-parameter is the only yet reported parameter to give a consistent interpretation of the principal, i.e. active slip mode in hexagonal materials. R is always <1 for divalent metals with operative basal slip, while it is >1 for transition metals for which prismatic slip is the principal mode of deformation (Table 2). R is (near) 1, however, when both basal and prismatic modes are active such as for Re. Re is in fact the most ductile cph-metal despite of its high Young's modulus and resultant high melting point while Be is not.

From Table 2 it is evident that early transition metals, yttrium (so also "early" (=light) rare earth metals) provide the electronic structure to induce prismatic slip in Mg via major so non-equilibrium alloying (e.g. via the role of mixtures or deviation from it to reduce the R-value of (cph-) Mg, the effect of the electronic structure on the ne-Mg-based matrix thereby being assured by the homogeneous distribution of the d-band early transition and early rare earth metals on an atomic length scale. This was confirmed by the PA-splats supersaturated with yttrium and rare earth metals which were very ductile on bending while those with Ca (made under same conditions also decreasing c/a in supersaturated Mg, see F. Hehmann, F. Sommer and H. Jones, Extension of Solid Solubility of Yttrium and Rare Earth Metals in Magnesium by Rapid Solidification, *Processing of Structural Metals by Rapid Solidification*, eds. F. H. Froes and S. J. Savage, American Society for Metals, Metals Park, Ohio, 1987, pp. 379–398, and chapter "Natural Aging" below and endothermal effects in FIGS. 59 to 62 were very brittle. That is, the elements enhancing passivation of Mg by alloying (see below) correspond to those elements useful to induce prismatic slip into Mg of cph-crystal structure or of a variant.

2. Alloy Selection for Superior VD Mg-base Higher Order Alloys with a Passive cph and/or Non-Equilibrium Metastable One-Phase or Nearly One-Phase Matrix Self-Healing in Air and Other Environments Any hardening of the extended solid solutions of (light) rare earth metals in cph-Mg and/or in any other metastable Mg-rich Mg-(light) RE matrix phase with either random, ordered or quasi-ordered distribution of the (light) RE atoms by second phase dispersions has to satisfy the following conditions:

1. the second phase dispersion must not destroy the self-healing passivating capacity of the surface oxide;
2. the nucleation and growth of second phases should therefore be controlled by solid state precipitation;
3. such solid state precipitates must form at distinctively lower temperatures than the temperatures at which corresponding metastable Mg-rich Mg-(light) RE phase transform into corresponding equilibrium phases. These limiting type of temperatures were identified to be at around 300° to 360° C. depending primarily on alloy synthesis employed (see above);
4. these precipitates should be essentially inert with the metastable Mg-rich Mg-(light) RE matrix phase from the point of view.

Two families of ternary additions distributed in a random, ordered or quasi-ordered way on the atomic length scale of corresponding metastable Mg-rich Mg-(light) RE matrix phases are selected here as the base for reinforcement at temperatures in the projected regime for alloy conversion without harmfully affecting the passivating film capacity of the claimed alloys.

8.1 Minor Additions of Simple and Transition Metals and Metalloids

One base ternary addition for the formation of the required reinforcement is aluminum. Aluminum was reported to form galvanically inert aluminides with the (light) RE metals and alkaline earth (AE) metals (F. Hehmann and H. Jones, Rapid Solidification of Magnesium Alloys: Recent Developments and Future Avenues, *Rapid Solidification Technology*, eds. T. S. Sudarshan and T. S. Srivatsan, Technomic Publishing Co., Inc., Lancaster, Basel, 1993, pp. 441–487). Their inertness is believed to origin in either suitable electrochemical potentials or in favorable surface film formation on $Al_xRE_y$ and $Al_xAE_y$-type of aluminides when co-exposed with the magnesium matrix to atmospheric conditions (cf. F. Hehmann and H. Jones, Rapid Solidification of Magnesium Alloys: Recent Developments and Future Avenues, *Rapid Solidification Technology*, eds. T. S. Sudarshan and T. S. Srivatsan, Technomic Publishing Co., Inc., Lancaster, Basel, 1993, pp. 441–487). Nussbaum et al. reported (G. Nussbaum, G. Reggazoni and H. Gjestland, *Science and Engineering of Light Metals, Proc. Int. Conf. "RASELM"*, JILM, Tokyo 1991, pp. 115–120) on the most corrosion and likewise heat resistant RS-Mg—Al—Zn based alloy by adding up to 6.5% Ca resulting in a fine dispersion of $Al_2Ca$ of size 0.05 µm. The formation of such aluminides does not adversely affect the corrosion resistance of magnesium alloys. Hehmann et al. have shown (F. Hehmann, S. Krishnamurthy, E. Robertson, A. G. Jackson, S. J. Savage and F. H. Froes, *Horizons of Powder Metallurgy, Part II*, Verlag Schmid, Freiburg 1986, pp. 1001–1008) that the addition of Ca can increase the corrosion resistance in other alloy systems such as in Mg—Cu—Ca alloys most probably due to a reduction in cathodic area. Das et al. (C. F. Chang, S. K. Das and D. Raybould, *Met. Powd. Rep.* 41, 1986, pp. 302–308) and Hehmann (F. Hehmann, R. G. J. Edyvean, H. Jones and F. Sommer, Effect of Rapid Solidification Processing on Corrodability of Magnesium Alloys, *Conf. Proc. PM Aerospace Materials '87*, eds. B. Williams and G. Dowson, Met. Powder Report Publishing Services, Shrewsbury, England, p. 46/1) demonstrated that the addition of the rare earth elements Ce, Nd, Pr etc. to RS Mg—Al—Zn-based alloys did not degrade the corrosion resistance compared to RS Mg—Al—Zn-based alloys without such additions, since the resultant dispersions of fine $Mg_xRE_y$ and/or $Al_xRE_y$ phases were found to be microgalvanically essentially inert with the cph-Mg-matrix. The alloys claimed herein are based on an reciprocal alloying strategy with regard to the RS Mg—Al—Zn-based alloys containing rare earth elements such as Ce, Nd, Pr, i.e. using light (or early) rare earth and transition metals (see below) as the major alloying element and adding Al, Ga etc. for precipitation-hardening instead.

In RS Mg—Al—Zn-based alloys, aluminum is the major solid solution hardening element of an otherwise non-passive overall Mg-alloy matrix, while the minor rare earth additions are primarily used for the formation of fine second phase dipersions to stabilize the refined matrix by delineating cell and grain boundaries upon alloy conversion and to increase the resultant strength at room temperature. The basis of this is that Al has a relatively large equilibrium solid solubility of 12 at. % in cph-Mg (*Phase Diagrams of Binary Magnesium Alloys*, eds. A. A. Nayeb-Hashemi and J. B. Clark, ASM Materials Park, 1988, Ohio 44073-9989, USA) and that the applied conditions of RSP are not sufficient to achieve a microstructure essentially consisting of an extended solid solution of the alloying additions in the cph-Mg matrix and which is essentially free of microsegregations.

In the claimed alloys, however, the (light) rare earth additions are only or primarily used as solid solution alloying elements to passivate and to strengthen the magnesium alloy matrix, while the aluminum (and alkaline earth and the other minor higher order additions, see below are primarily used for the formation of a (compared to more recent RSP light alloys) relatively moderate volume fraction of thermally stable solid state precipitates to improve the mechanical properties. In the claimed alloys, aluminum, alkaline earth and the other minor higher order additions provide an ideal instrument to reinforce the supersaturated solid solution of (light) RE metals in cph-Mg with the resulting second phase dispersion independent on grain size and the rate controlling plastic deformation mechanism concerned (see above).

The rare earth or alkaline earth aluminides provide also a useful alloying route for improved properties at elevated temperatures. Aluminides are thermally very stable leading to reduced stress relaxation at elevated temperatures and to improved resistance to secondary creep when finely distributed in the alloyed Mg-matrix. Nussbaum and co-workers reported (H. Gjestland, G. Nussbaum, G. Regazzoni, O. Lohne and O. Bauger, Mat. Sci. Engng. A134 (1991), pp. 1197–1200; O. Lohne, O. Bauger, H. Gjestland, G. Nussbaum and G. Regazzoni, *Science and Engineering of Light Metals, Proc. Int. Conf. "RASELM"*, JILM, Tokyo 1991, pp. 163–168) on a more detailed analysis of high temperature properties of RS and ingot processed AZ91 alloy. Under given conditions, both variants did not show any grain growth suggesting that creep controls the high temperature properties of AZ91. Under an applied stress of 50 MPa at 150° C., the RS-version (grain size: 1.5 μm) showed a 100fold higher secondary creep rate and an 150% higher stress relaxation compared to conventional AZ91 (grain size 12 μm).

The addition of 2.3 wt. % Ca to RS AZ91 showed the prime significance for high temperature properties of the combined effect of the overall microstructure and composition of Mg-alloys relative to the employed grain size alone: although RS AZ91+2.3 Ca had the smallest grain size (i.e. 0.6 μm) of the three variants so structurally providing the largest concentration of internal surface area or easy-diffusion paths, its secondary creep rate was 400 times smaller than for RS AZ91 and 5 times smaller than for ingot processed AZ91 (H. Gjestland, G. Nussbaum, G. Regazzoni, O. Lohne and O. Bauger, Mat. Sci. Engng. A134 (1991), pp. 1197–1200; O. Lohne, O. Bauger, H. Gjestland, G. Nussbaum and G. Regazzoni, *Science and Engineering of Light Metals, Proc. Int Conf. "RASELM"*, JILM, Tokyo 1991, pp. 163–168). Stress relaxation for 100 hrs at 150° C. was improved by 20% compared to ingot processed AZ91. The fine dispersion of $Al_2Ca$ of mean size 0.05 μm was observed both in trans- and in intragranular areas. The fine size rendered the $Al_2Ca$-phase therefore instrumental to pin the motion of dislocations and grain boundaries so suppressing both creep and grain boundary sliding even in the presence of relatively temperature-instable $Mg_{17}Al_{12}$-phases. Relatively high initial stress relaxation rates in both RS-versions indicated grain boundary sliding to control the begin of high temperature deformation before transgranular creep appeared to take over the rate-controlling mechanism. That is, that the otherwise diffusion controlled properties of the claimed alloys can be improved by a suitable size of corresponding aluminide and/or simple metal containing dispersion.

The feasibility of this higher order alloying approach, i.e. the reinforcement of passive Mg (light) RE based alloys with simple metal additions while the RE metal is essentially held in solid solution is largely supported by the transformation behavior of the extended solid solutions of corresponding elements such as Al and Ca in cph-Mg upon DSC-analysis. The transformation behavior of binary alloys is a valid reference for corresponding behavior in more complex alloys, since diffusion is the rate-controlling material parameter for the transformation process. Diffusion, however, is a local and kinetic microscopic process independent on macroscopic thermodynamic properties.

Hehmann reported (F. Hehmann, Metastable Phase Transformation in Rapidly Solidified Magnesium-Base Mg—Al Alloys, *Acta Met. Mater.* 38, 1990, pp. 979–992) that the (extended) solid solution of 9 to 23 at. % Al in cph-Mg is thermally relatively unstable leading to the formation of corresponding equilibrium phases at temperatures between 120° and 180° C., i.e. at some 200° C. lower temperatures than equilibrium phases would form from the extended solid solution of (light) RE elements in cph-Mg. This result was consistent with the observation in AZ91 (which is essentially a quaternary Mg—Al—Zn—Mn alloy) that creep strength increased with decreasing Al-content and resulting decrease of volume fraction of the relatively coarse (i.e. 0.5 μm-) $Mg_{17}Al_{12}$-grain boundary precipitates for a given grain size H. Cjestland, G. Nussbaum, G. Regazzoni, O. Lohne and O. Bauger, Mat. Sci. Engng. A134 (1991), pp. 1197–1200; O. Lohne, O. Bauger, H. Gjestland, G. Nussbaum and O. Regazzoni, *Science and Engineering of Light Metals, Proc. Int. Conf. "RASELM"*, JILM, Tokyo 1991—instead "as ref 68", pp. 163–168). Obviously, such particles are too large to pin the motion of dislocations and grain boundaries and increase the mobility of grain boundaries instead due to their low melting point.

P. Vostry et al. reported (P. Vostry, I. Stulikova, B. Smola, W. Riehemann and B. L. Mordike, *Mat. Sci. and Engng. A* 137, 1991, pp. 87–92) on the transformation of the extended solid solution of 1, 3 and 10 wt. % Ca cph-Mg to occur at temperatures $T_{transf}$ at between 160° C. (for 1 Ca) and 120° C. (for 10 Ca). These observations confirm the feasibility of the formation of fine $Al_2Ca$-type of precipitates from the extended solid solution of (light) RE element(s), Al and alkaline earth elements such as Ca in cph-Mg at temperatures where the passivity of cph-Mg due to the dissolved (light) RE metals remains unaffected by corresponding precipitation. The resultant precipitates may or may not incorporate further elements such as Mg and RE after the formula $(Al_aMg_b)_x(AE_cRE_d)_y$ and where suffix a, b, c, d, x, and y are stoichiometric variables (see O. S. Zarechnyuk and P. L. Kripyakevich, *Izv. Akad. Nauk SSSR. Met.* (4), 1967, p. 188; *Russ. Metall.* (4), 1967, p. 101 who reported on $Al_2(Ce,Mg)$ in the cph-Mg matrix. The advantage of such (complicated) compositions of solid state precipitates with regard to the need of microgalvanically inert second phase dispersions in passive cph-magnesium base alloys is that they provide a tailorable "buffering" effect. This "buffering" effect can be estimated in a first approach via the rule of mixtures applied to the galvanic potentials of the involved components.

The feasibility of precipitation of more complex aluminides in Mg-alloys is also supported by the existence of more complex silicides such as $Mg_2CeSi_2$ (cf. O. F. Zmy and E. I. Gladyshevsky, Kristallogrfiya 15 (5), 1970, p. 939; Sov. Phys. Crystallogr. 15 (5), 1970, p. 817). Silicides play a major role in conjunction with transition metals in advanced aluminum (see below). Borides provide similar opportunities with the advantage of even lower density compared to silicides of same stoichiometry (cf. R. C. Weast, *CRC Handbook of Chemistry and Physics*, 66th edition, 1985–1986). The affinity of elements and the resultant thermal stability of equilibrium phase dispersions is in fact decoupled from corresponding atomic mobility (diffusion)

in solid solution so from the thermal stability of corresponding extended solid solutions. Otherwise would the major transformation process of Ti in cph-Mg, for example, start at higher temperatures than that of Ce in cph-Mg etc., while aluminides such as $Al_2Ca$ solid state precipitates could not be a thermally stable phase in an Mg-alloy matrix. The inventions, however, show the reverse.

Other minor quantitities are zirconium and manganese to be added as quaternary additions to the extended solid solution(s) of (light) RE metals or (light) RE-based mischmetals (MM) in conjunction with ternary aluminum in cph-Mg. In their classical paper Busk and Leontis reported (R. S. Busk and T. E. Leontis, *Trans AIME* 188, 1950, pp. 297–306) that these alloying additions were instrumental to suppress the tendency to stress corrosion cracking and to improve extrudability of AZ-type of alloys via co-extrusion of blends of suitable pre-alloyed atomized powders rather than ingot. This was related to solid-state interdiffusion which resulted in "interference hardening" by the precipitation of finely dispersed, insoluble $Al_3Zr$— and/corn $Al_xMn_y$-type of compounds leading to the best thermal stability and strength improvements of up to 430 MPa reported in the 1950s as well as to applications such as support beams used for floor or built-in loading ramps of the C 133-transport plane involving 40% increase in compressive yield strength, for example.

Zinc was reported (I. J. Polmear, *Light Alloys—Metallurgy of the Light Metals*, Edward Arnold, 1980) to be embedded in Mg-RE-precipitates decorating the grain boundaries of Mg-alloy ZE63 with 5.3 Zn, 2.5 RE-mischmetall (MM) and 0.7 Zr (all in [wt. %]). This alloy shows better resistance to secondary creep at 150° C. than AZ91 and ZE41 T5, for example, due the absence of any low melting point second phases on the grain boundaries. Minor zinc additions may therefore be considered to trigger preferential grain boundary precipitation from the extended solid solution of (light) RE metals in cph-Mg without disintegration of corresponding supersaturation beyond the level of RE-additions required to complete volume fraction and stoichiometry of corresponding Mg-RE-Zn-precipitation.

The amount of aluminum and alkaline earth elements (required to reinforce the claimed alloys by the aforementioned solid state precipitates including RE- and AE-aluminides and corresponding silicides or borides) should be kept small to avoid that larger levels of the passivating (light) RE metals in cph-Mg are tight up in such dispersions. Under the maxim that none of these minor additions must unduly degrade the passivating capacity of the extended solid solution of (light) RE-metals in cph-Mg, a rule-of-thumb-formula for the amount of Al (in [at. %]), Al %, claimed herein is Al $\%=k_1*AE \%+k_2*xRE \%$ where x=excess fraction RE metal required to complete the volume fraction of precipitates of stoichiometry defined by parameters, $k_1$ and $k_2$. The alloys claimed herein should therefore contain between 0.2 and 10 wt. % aluminum and between 0 and 10 wt. % alkaline earth (AE) metals, preferably 0.5 and 4 wt. % aluminum and between 0.1 and 1.5 wt. % alkaline earth (AE) metals (Ca, Sr, Ba) held essentially in the extended solid solution of (light) RE elements in cph-Mg with a random, ordered or quasi-ordered distribution of the (light) RE atoms and/or the alkaline earth and the aluminum atoms in the as-deposited and/or as-solidified state.

8.2 Selection of Rare Earth Metals for Mg-Base Higher Order Alloy Compositions

The present invention embraces the potential for a "technology shock" for magnesium based alloys and products including a universe of new alloying possibilities by selected new methods of processing via synthesis and thermomechanical alloy conversion. It is therefore advisable to employ also established commercial alloys and techniques such as mechanical alloying (see below) in order to spur the realization of corresponding processing technologies.

8.2.1 Commerical "E"-type of Mg-alloys

"E" is the ASTM-designation for rare earth additions without yttrium ("W") to Mg-alloys. The commercial alloys claimed for processing by the new continuous production methods selected for extended solid solutions in cph-Mg are as following including approximate compositions):

| | Alloying addition: | | | | | | | | |
|---|---|---|---|---|---|---|---|---|---|
| Alloy | Al | Zn | Mn | Zr | Y | RE | AE | Ag | Si |
| WE54 | | | | 0.45 | 5.25 | 3.5[1] | | | |
| WE43 | | | | 0.4 | 4 | 3.5[2] | | | |
| ZE63 | | 5.3 | | 0.7 | | 2.5 | | | |
| ZE41 | | 4.0–4.2 | | 0.7 | | 1.2–1.3 | | | |
| EZ33 | | 2.5 | | 0.6 | | 3 | | | |
| EZ32 | | 2.2 | | 0.6 | | 2.7 | | | |
| AE41 | | | 3.9 | 0.01 | 0.35 | | | 0.64 | 0.1 |
| AE42 | | | 3.9 | 0.02 | 0.35 | | | 1.4 | 0.1 |
| QE22 | | | | 0.7 | | 2.1 | 2.5 | | |
| EQ21 | | | | 0.7 | | 2.1 | 1.3 | | |

[1] 1.5–2 Nd, 1.5–2HRE (heavy rare earth metals, i.e. other yttrics than yttrium)
[2] 2–2.5 Nd, 0.75–1HRE 8.2.2 Misch-Metals The misch-metals (MM) for structural magnesium alloys often quoted in the literature include "Ce"-misch-metal with approximately 49 Ce, 26 La, 19 Nd, 6 Pr or "Nd" mischmetal with 80 Nd, 16 Pr, 2Gd and 2 other RE (all in [wt. %]) (L. Y. Wei and G. L. Dunlop, *Proc. Conf. Mg-Alloys and Their Applications*, eds. B. L. Mordike and F. Hehmann, DGM, Oberursel, October 1992, pp. 335–342; E. F. Emley, *Principles of Magnesium Technology*, Pergamon Press, 1966). The use of a specific MM for structural magnesium is primarily dictated by price and availability considerations rather than by engineering properties related to a specific MM-composition. That is why patents for applications of misch-metals in magnesium alloys do usually not refer to the particular composition of the misch-metal to be used in magnesium nor do they specify the precise technological advantage of misch-metals over individual rare earth elements in order to justify the use of NM from an engineering point of view (cf. D. J. Bray, R. W. Gardiner and B. W. Viney, GB-Patent 2,262,539 A, 23 Jun. 1993). From the aforementioned studies and the present invention it is evident, however, that yttrium (which is a regular member of RE minerals) should not be used excessively for melt-processed magnesium alloys with the RE metals essentially held in solid solution. The costs for the required feedstock of RE metals for structural aerospace products based on passive Mg alloys will largely be compensated for by the return to be realized by the application itself.

RE metals are extracted from RE-oxide containing minerals and ores which represent mixtures of the oxide of virtually all or the majority of the available RE metals. The most common minerals include the following approximate composition of individual RE metals or RE groups:

| RE-content [wt. %] | La | Ce | Nd + Pr | yttrium | other yttrics (HRE) |
|---|---|---|---|---|---|
| Ore composite Monazite | 23 | 45 | 24 | 2.5 | 4.5 |
| Bastnaesite (yttrics incl yttrium) | | 32 | 49 | 17 | 2 |
| Long Wan | 3 | 1.5 | 5 | 62.5 | 28 |
| Xin Fong | 19 | 2 | 32 | 25 | 22 |
| Wan An | 8 | 1.5 | 8.5 | 49 | 33 |
| Xun Wu | 30 | 7 | 39 | 9 | 15 |
| Din Nan | 26 | 3 | 25 | 28 | 18 |

Selected extraction of preferred RE metals can change the composition of the final MM relative to the composition of the ore used for extraction. One of the cheapest method, however, is the extraction of all or a maximum of RE metals from an abundantly available RE ore without undue numbers of operations due to specific MM-selection criteria. The use of "light" RE metals for passive magnesium (see "Disclosure") exludes consideration of larger quantities of misch-metals stemming from and/or corresponding to the ore composition of Long Nan- and Wan An-type of RE-ores. Monazite- and Bastnaesite-type of ores are the most abundantly available and currently most used ores for the extraction of RE-metals and MM-metals. MM-metals of compositions stemming from and/or corresponding to the ore composition of Monazite-, Bastnaesite- and Xun Wu-type of RE-ores are therefore the most preferable misch-metals for use in passive magnesium alloys with the MM essentially held in extended solid solution of cph-Mg or corresponding structural derivatives.

8.3 Ti and Metalloids (Si, B, Sb)

The majority of transition metals and metalloids show very high vapor pressures and this is one reason why they do not or not readily alloy with magnesium via liquid processing. The only solution in this case is mechanical alloying and vapor deposition, the latter with the advantages discussed already on pages 44/45 and in chapter 12.3 below. If the alloying of magnesium with high melting transition metals and metalloids is possible via the liquid phase, galvanically active (micro-) segregations may result quite easily and exclude these elements from major additions to passive Mg alloys by processing from the melt.

A combination of essentially monophase Mg-(light) RE alloys with high melting transition and metalloid additions via vapor deposition is representative for the fundamental principle of advanced processing: While equilibrium microstructures and properties are dominated by the physical differences of individual alloying elements as to the Hume-Rothery rules, non-equilibrium microstructures and properties result from the cooperative performance of quite different constituents providing a yet entirely unexplored wealth of innovations.

1. The use of one or more transition metals alone in cph-Mg or the use of TM such as Ti as a ternary addition for precipitation hardening from the extended solid solution of (light) RE elements in cph-Mg with a random, ordered or quasi-ordered, but in any case essentially homogeneous distribution of the light RE and the Ti atoms includes the following disadvantages:

1.1. The equilibrium Ti-precipitates in the binary system Mg—Ti were elemental Ti (K. E. Bagnall, J. W. Steeds, P. G. Partridge and R. W. Gardiner, Proc. Int. Conf. Electron Microscopy, 17–22 Jul. 1994, Paris, Edition, Les Ulis, Vol. 2B, pp. 711–712) as Mg-precipitates were in Ti-base Ti—Mg alloys (G. H. Lu, K. E. Bagnall, C. M. Ward-Close, P. G. Partridge and J. W. Steeds, Proc. Int. Conf. Electron Microscopy, 17–22 Jul. 1994, Paris, Edition, Les Ulis, Vol. 2A, pp. 625–626). That is that no intermetallic phases form in the equilibrium binary phase diagram Mg—Ti (or Ti—Mg) (a dilemma which applies to other binary Mg-TM phase diagrams such as Mg—Mn) and that a relatively high level of alloying would be necessary to achieve sufficient age hardening response, for example, on either side of the (binary section of the) Mg—Ti phase diagram.

3. Mg-containing oxides were observed in VD Ti—Mg alloys and this was attributed to the oxygen diffusion in Ti (G. H. Lu, K. E. Bagnall, C. M. Ward-Close, P. G. Partridge and J. W. Steeds, Proc. Int. Conf. Electron Microscopy, 17 22 Jul. 1994, Paris, Edition, Les Ulis, Vol. 2B, pp. 625–626) so they will appear especially in high Ti Mg-base Mg—Ti alloys. Oxides, however, are known to degrade the properties of high performance Mg alloys and in particular their damage tolerance (F. Hehmann and H. Jones, Rapid Solidification of Magnesium Alloys: Recent Developments and Future Avenues, Rapid Solidification Technology, eds. T. S. Sudarshan and T. S. Srivatsan, Technomic Publishing Co., Inc., Lancaster, Basel, 1993, pp. 441–487).

2. The advantages of Ti as a minor alloying addition to the extended solid solution of (light) RE elements in cph-Mg with a random, ordered or quasi-ordered distribution of the light RE and the Ti atoms include the possibility for a deliberately manipulated precipitation route of Ti (-containing) precipitates from cph Mg-(light) RE metastable phases at temperatures around 200° C. upon alloy conversion, i.e. where Ti is partially) taken out of the solid solution for precipitation hardening, while the passivating effect of RE-metals in solid solution remains essentially unaffected, since:

2.1. Ti forms very stable solid state precipitates of pure Ti once they have formed at around 200° C. or so from the extended solid solution in cph-Mg. In VD Mg-17 wt. % Ti alloy exposed for 4 h to 500° C., for example, the observed size of the Ti-precipitates was 10–15 nm (K. E. Bagnall, J. W. Steeds, P. G. Partridge and R. W. Gardiner, Proc. Int. Conf. Electron Microscopy, 17–22 Jul. 1994, Paris, Edition Physiques, Les Ulis, Vol. 2B, pp. 711–712).

2.2. Ti-containing precipitates offer to act as hardening base via solid state precipitation at 200° C., since this precipitation reaction appears already as a major phase transformation upon DSC-analysis (cf. D. J. Bray, R. W. Gardiner and B. W. Viney, GB-Patent 2262539 A, 23 Jun., 1993) so the possibility to decouple this precipitation from nucleation of a major RE-containing precipitation process (cf. BRIEF SUMMARY OF THE INVENTION, pp. 10–12 above).

2.3. VD Mg—Ti alloys were reported (D. J. Bray, R. W. Gardiner and B. W. Viney, GB-Patent 2 262,539 A, 23 Jun., 1993) to retain their improved resistance to corrosion upon aging at temperatures up to 250° C. without any major degradation compared to the corrosion resistance before aging, i.e. Ti does not cause the disastrous effect on corrosion behavior as Fe does.

The alternative of Ti in an extended solid solution of cph-Mg is (i) to produce another non-equilibrium (e.g. a morph ous) Mg-Ti base matrix phase and/or (ii) to alloy Ti together with a Ti-affinity clement on top of an extended solid solution of rare earth elements in cph-Mg or any other Mg-base non-equilibrium phase in order for a more complex precipitation involving Ti. Prime candidate is aluminum largely known to result in the fascinating world of titanium aluminides which form currently one of the largest research activities in the world of materials. The addition of quaternary aluminum to ternary titanium (or vice versa) to the claimed metastable Mg-(light) RE alloys (see above) spurs the precipitation kinetics and leads to a doubled (via TiAl-type of precipitates) or even quadrupled volume fraction (via $Ti_3Al$ or $Al_3Ti$) compared to elemental Ti in VD Mg—Ti alloys via the affinity between titanium an aluminum.

These aluminides can be rendered more effective with regard to temperature stability and volume fraction by the addition of metalloids such as silicon, boron, germanium or antimony transforming corresponding aluminides in corresponding metalloid containing precipitates such as Al-rich silicides of the form $Al_{13}(Fe,V)_3Si$, the latter being known as the most temperature stable solid state precipitates ever reported for a high performance high temperature aluminum base alloy. The phase was achieved by the more extreme conditions of rapid solidification affordable by planar flow casting (PFC) (S. K. Das and F. H. Froes, *Rapidly Solidified Alloys*, edt. H. H, Liebermann, Marcel Dekker, Inc., New York, 1993, p. 339) resulting in simultaneous supersaturation of fcc-Al with the alloying additions Fe, V and Si and in separation from the melt of melt-spun —$Al_{13}(Fe,V)_3Si$. This phase is icosahedrally disordered of near spherical morphology and of size 20 to 100 nm decorating the boundaries of both grains and subgrains of size 0.5 to 2.0 $\mu m$ in Al—Fe—V—Si alloys (S. K. Das and F. H. Froes, *Rapidly Solidified Alloys*, edt. H. H. Liebermann, Marcel Dekker, Inc., New York, 1993, p. 339). The phase is of bcc crystal structure with lattice parameter 1.25 nm showing an (intermetallic) coarsening rate of $2.9*10^{-26}$ $m^3h^{-1}$ which is about 3 orders of magnitude smaller than for AlFe-phases, for example (cf. V. Radmilovic and G. Thomas, University of California, Berkeley, Calif., to be published). The phase leads to a nano-dispersion of round-shaped precipitates in the as-extruded condition (S. K. Pas and F. H. Froes, *Rapidly Solidified Alloys*, edt. H. H. Liebermann, Marcel Dekker, Inc., New York, 1993, p. 339) which is a particularly attractive morphology for mechanical properties such as plane strain fracture toughness, yield strength and Young's modulus which are all of prime interest for HT-sheet applications (P. S. Gilman and S. K. Das, Conf. Proc. PM Aerospace Materials '87, eds. B. Williams and G. Dowson, Met. Powder Report Publishing Services, Shrewsbury, England, p. 27.1).

For all of the Mg-alloys claimed herein, the iron (Fe) of the aluminides known from RSP-processing of advanced Al-alloys (such as for $Al_{20}Fe_5Ce$, $Al_{10}Fe_2Ce$, $Al_6Fe$ of size 100–300 nm and of $\Theta'Al_3Fe$ and also the relatively coarse equilibrium $Al_3Fe$ particles reported for advanced high temperature Al-alloys (cf. R. Ayer, L. M. Angers, R. R. Mueller, J. C. Scalon and C. F. Klein, *Metall. Trans.* 19A, 1988, p. 1645)) and of the known silicides may be replace by titanium (N.B. Ti evaporates also more easily than Fe). Instead of Fe or Ti, however, another transition metal such as Mn (and Cr) can be used for $Al_aTM_bSi_c$-type of silicides due to the relatively low temperature of a major onset of transformation of corresponding extended solid solution in cph-Mg (cf. D. J. Bray, R. W. Gardiner and B. W. Viney, GB-Patent 2,262,539 A, 23 Jun., 1993; N.J. Varich and B. N. Litvin, *Fiz. Met. Metallov.* 16, 1963, pp. 526–529) and/or their stabilizing (cf. D. Munsen, J. *Inst. Metals* 95, 1967, p. 217), but also ennobling and/or passivating effect on such intermetallics.

9. Binary, Ternary and Quaternary Extended Solid Solutions of Rare Earth-, Transition- and/or Simple Metals in cph-Mg However, the entity of the extended solid solutions of transition metals in cph-Mg is far from being explored yet. Shaw et al. reported (B. A. Shaw, T. R. Schrecengost, W. C. Moshier and R. G. Wendt, *Report AD—A* 253 923, Apr. 1, 1991, Mar. 31, 1992, Office of Naval Research, Arlington Va., 22217-5000) on the corrosion behavior of the extended solid solutions of 2.4–13.3 Cr, 0.9–2.4 Mo, 2.7–13.0 Ta and 1.0–7.4 tungsten (W) in cph-Mg-deposits of thickness of <2 $\mu m$ as well as for the ternary single phase (amorphous or crystalline) alloy $Mg_{67.8}Al_{15.5}W_{17.6}$ after deposition onto a graphite substrate, all of which made by magnetron sputter deposition. Pronounced passivation was observed for the extended solid solution of 2.7 ($\rho=2.14$ $g/cm^3$) to 8.2 ($\rho=3.1$ $g/cm^3$) at. % Ta in cph-Mg and for the metastable ternary MgAlW-alloy ($\rho=5.0$) with the first ever reported active-to-passive transition for an Mg-alloy similar to those observed for Cr-steels, for example. All transition metals employed were reported to increase the corrosion potential so ennoble corresponding Mg-alloys with increasing levels of alloying. At solute concentrations>2 at. %, however, Cr was observed to result in the highest rate of ennoblement followed by W.

The results by Shaw et al. (B. A. Shaw, T. R. Schrecengost, W. C. Moshier and R. G. Wendt, *Report AD—A* 253 923, Apr. 1, 1991, Mar. 31, 1992, Office of Naval Research, Arlington Va., 22217-5000) were confirmed by Hirota et al. who reported (E. Hirota, H. Habazaki, A. Kawashima, K. Asami and K. Hasimoto, *Scientific Report* A38, 1 Mar., 1993, The University of Tohuko, Japan) also on the corrosion behavior of the extended solid solution of 20–77 Zr, 14–72 Nb and 18–77 Ta [at. %] in cph-Mg. The anodic polarization in 1 mol HCl aqueous solution resulted systematically in TM-metal cation- and corresponding $O^{2-}$-anion enrichment and in $Mg^{2+}$-cation and $OH^{-1}$-anion depletion of the surface oxide and lead to passivation in this electrolyte at potentials above the observed corrosion potentials at –0.3 V for Mg-57Nb and –0.25 V for Mg-38 Ta, for example (all with respect to the standard calomel electrode potential and in [at. %]). The thickness of corresponding air-formed oxides was 2 nm, while that formed in the electrolyte not more than 4.5 nm. Annual corrosion rates for solute concentrations >40 at. % decreased from 30 $\mu m/yr$ for the Mg—Ti system down to as low as 1.5 $\mu m/yr$ for the Mg—Ta system (E. Hirota, H. Habazaki, A. Kawashima, K. Asami and K. Hasimoto, *Scientific Report* A38, 1 March, 1993, The University of Tohuko, Japan, cf. FIG. 74a, b, FIGS. 75 and 76).

Figure 74:
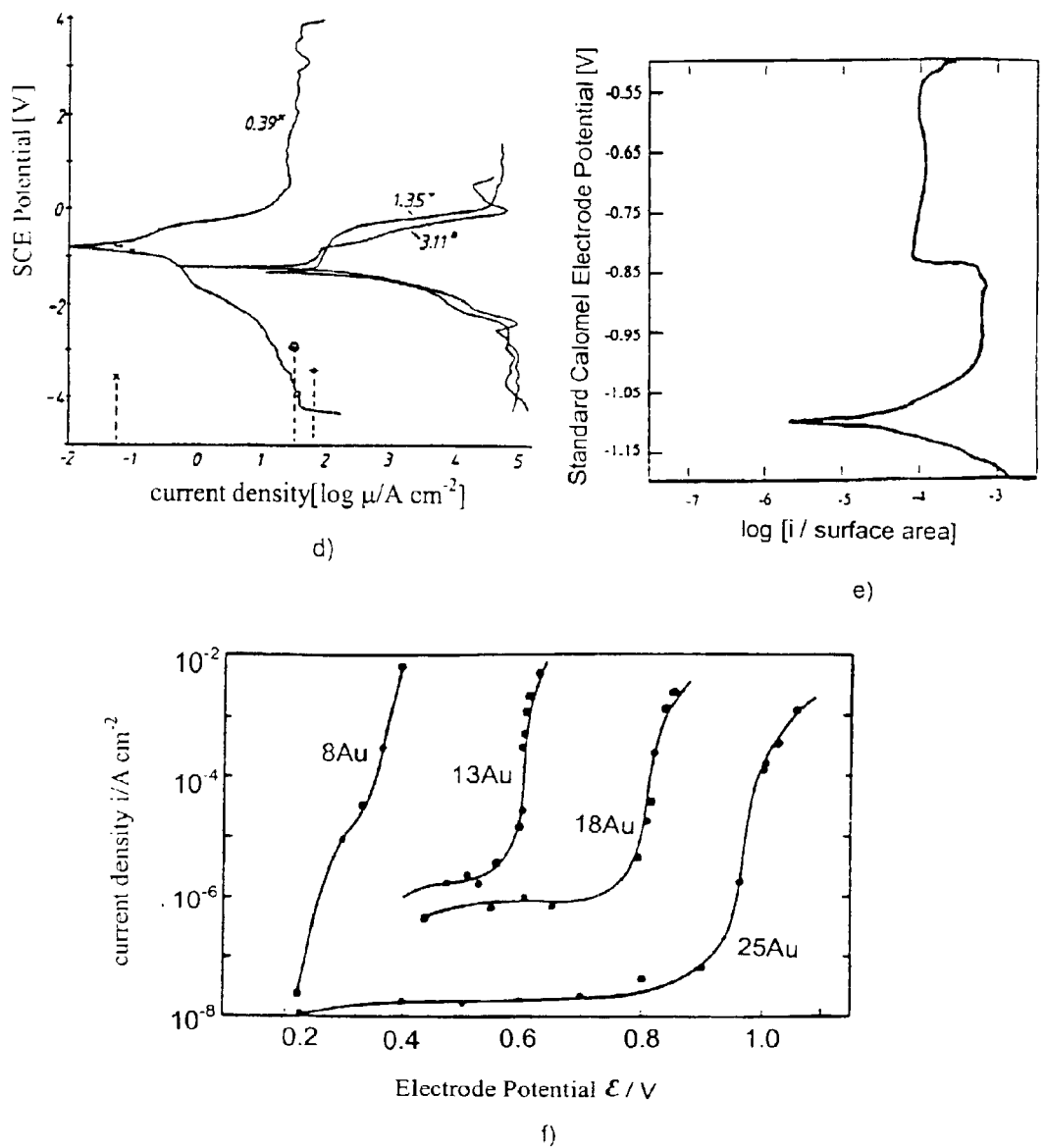
FIG. 74 Potentiodynamic polarization curves of (essentially) monophase Mg-alloys (a)–e)) and of f) Cu-based Cu—Au solid solutions with typical anodic polarization plateaus except for e) where an active-to-passive transition (as for Cr-steels) had occurred.
Figure 75:
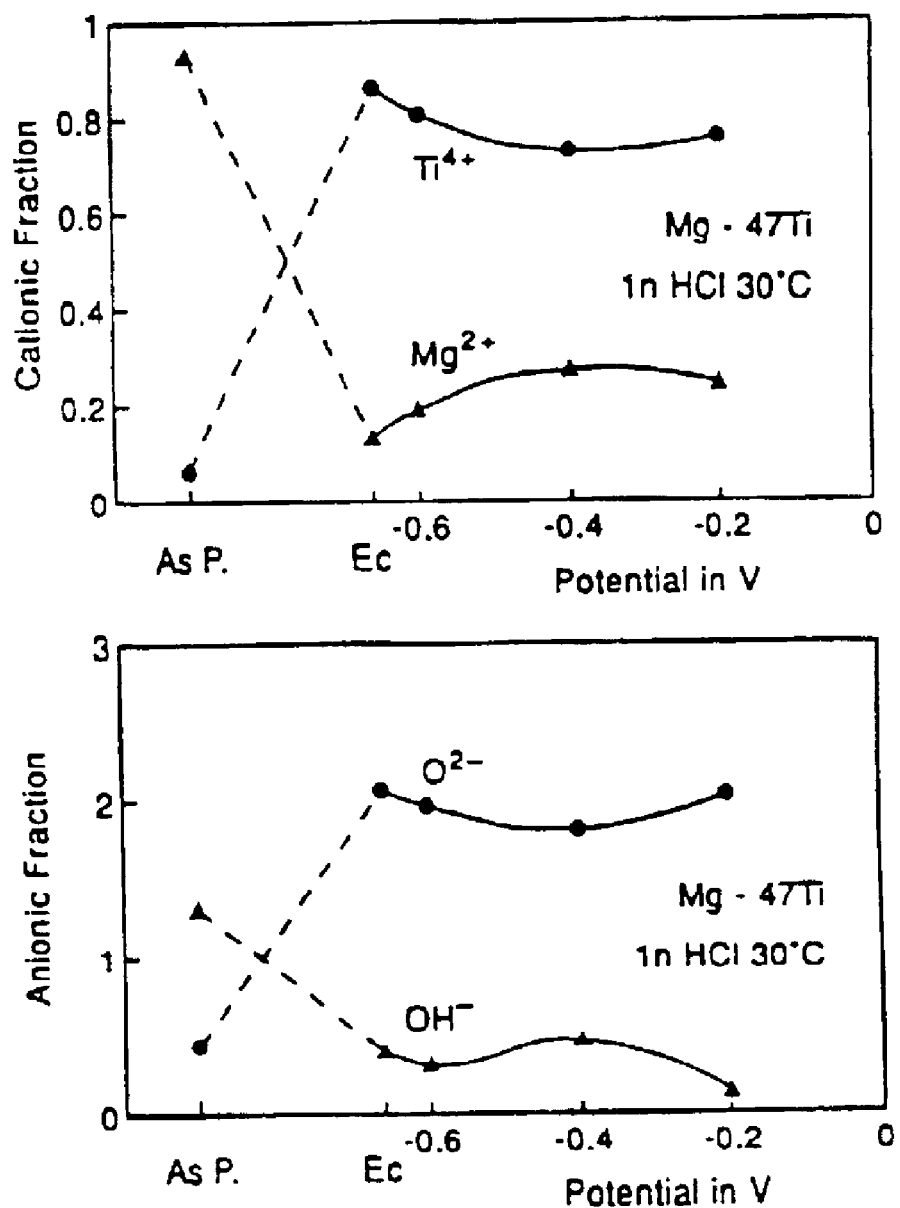
FIG. 75 Showing (top) cation and (bottom) anion fraction in the surface oxide of hypersaturated solid solutions of 47 at. % (63.6 wt. %) Ti and of 57 at. % (83.5 wt. %) Nb in cph-Mg.
Figure 75:
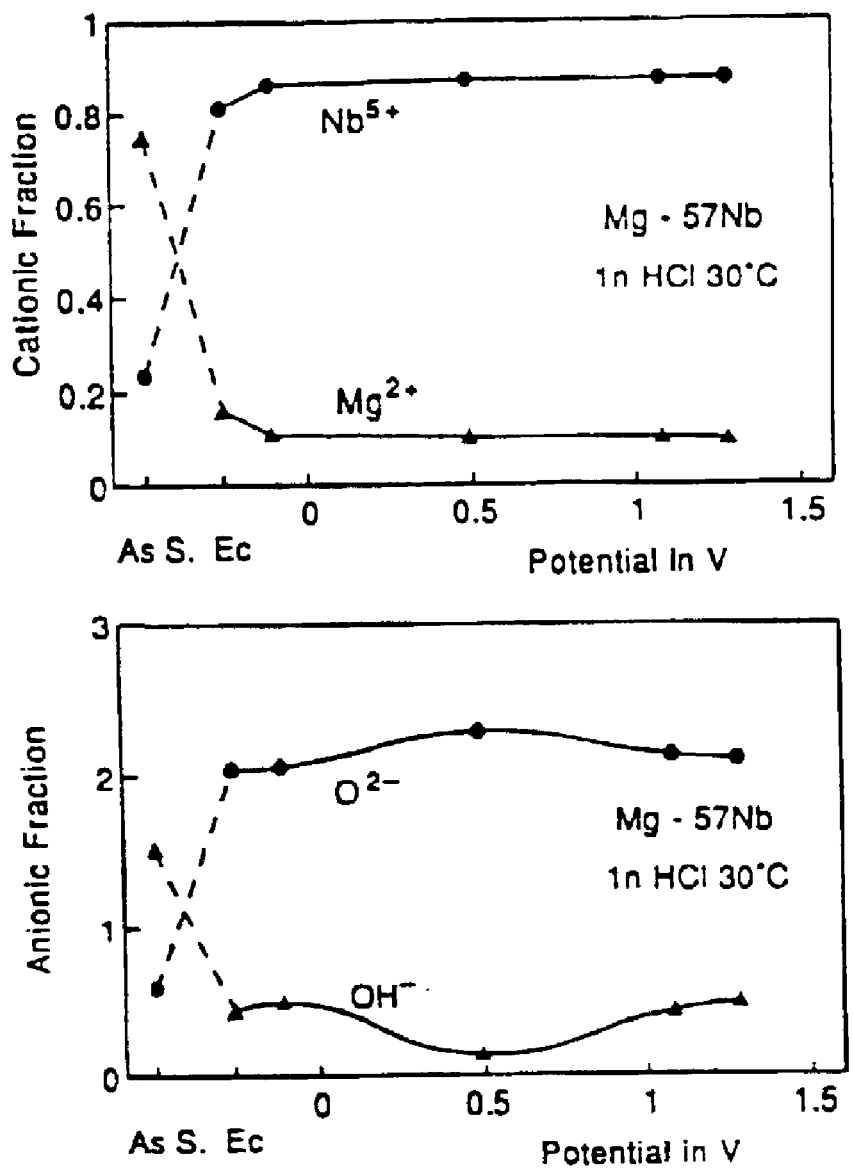
Figure 76:
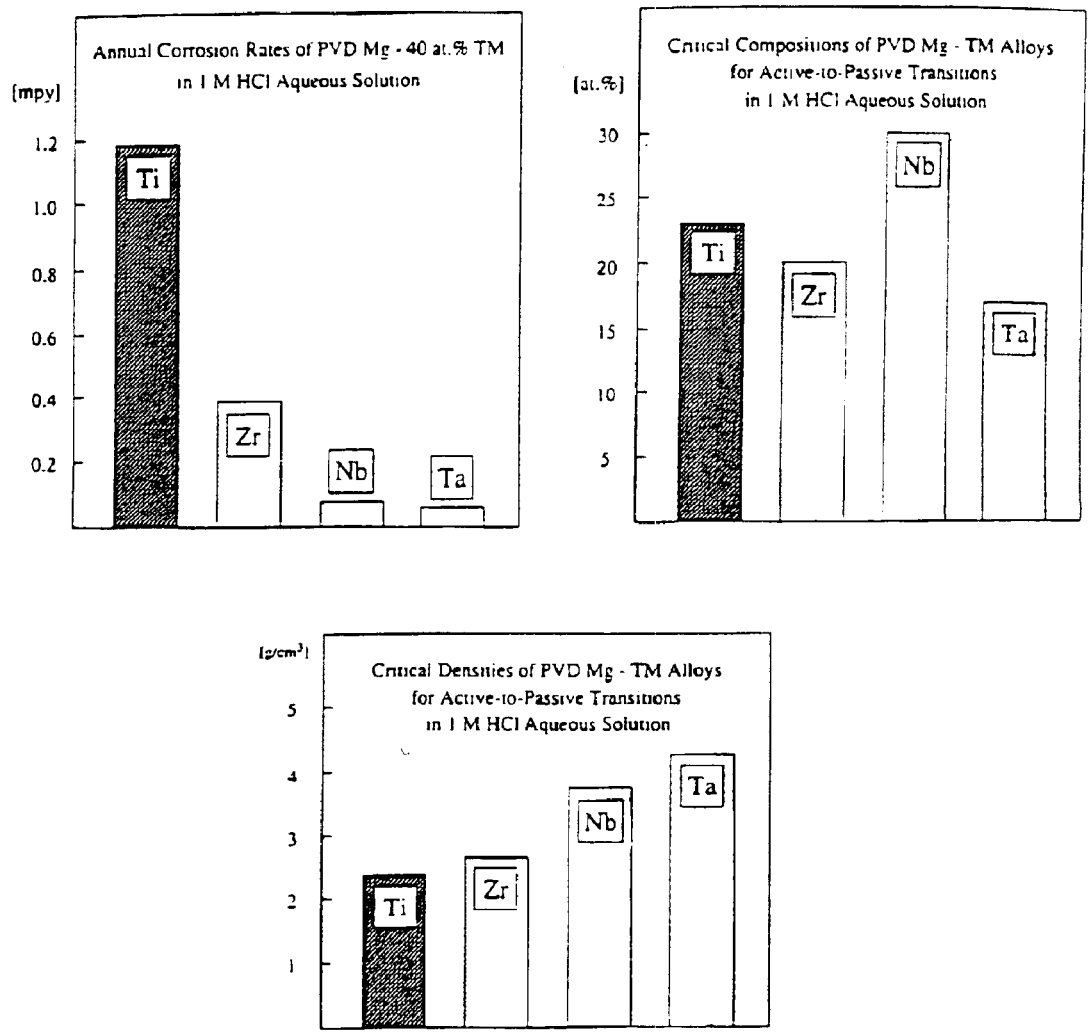
FIG. 76 Effect of composition and resulting density on corrosion behavior of characteristic Mg—TM alloys (TM= Ti, Zr, Nb and Ta) made by magnetron sputtering.

FIG. 74 shows potentiodynamic polarization curves of (a)–e)) (essentially) monophase Mg-alloys and of f) Cu-based Cu—Au solid solutions with typical anodic polarization plateaus except for e) where an active-to-passive transition (as for Cr-steels) had occurred. a,b: single phase solid solutions of (top) titanium and (bottom) zirconium in cph-magnesium made by magnetron sputtering and using a 1 mol NaCl electrolyte at pH=9 at 30° C. The effect of this electrolyte on the pure elements is also shown (E. Hirota, H. Habazaki, A. Kawashima, K. Asami and K. Hasimoto, *Scientific Report* A38, 1 March, 1993, The University of Tohuko, Japan). c: Potentiodynamic polarization of single phase solid solutions of 17.6 to 23.4 wt. % Al in cph-Mg made by melt-spinning and of chill-ast $Al_8Mg_5$-phase containing 62.3 wt. % Al in an relative aggressive electrolyte (aerated 0.001 mol NaCl solution of pH=4.9 at temperature of 25° C.) using a scan rate of 6 mV/s. The resultant anodic polarization features were not evident for corresponding two-phase casting materials. d: as for c), here using PA Mg-2.2 wt. % Ce (0.39 at. % Ce) splats and melt-spun ribbon containing 7.9 wt. % (1.35 at. %) and 18 wt. % (3.11 at. %) Ce. e: as for a), here sputtered Mg-15.5Al–17.6W (in [at. %], cf. B. A. Shaw, T. R. Schrecengost, W. C. Moshier and R. G. Wendt, *Report AD—A* 253 923, Apr. 1, 1991, Mar. 31, 1992, Office of Naval Research, Arlington Va., 22217-5000) in 1 mol NaCl aqueous solution. f: effect of Au (in [at. %]) upon anodic polarization during potentiodynamic polarization of various Cu—Au solid solutions in 0.1 mol $Na_2SO_4$/0.01 n $H_2SO_4$ aqueous solution. FIG. 75 shows (top) cation and (bottom) anion fraction in the surface oxide of hypersaturated solid solutions of 47 at. % (63.6 wt. %) Ti and of 57 at. % (83.5 wt. %) Nb in cph-Mg upon polarization as in FIGS. 74*a,b* (E. Hirota, H. Habazaki, A. Kawashima, K. Asami and K. Hasimoto, *Scientific Report A*38, 1 Mar., 1993, The University of Tohuko, Japan). FIG. 76 shows the effect of composition and resulting density on corrosion behavior of characteristic Mg-TM alloys (TM=Ti, Zr, Nb and Ta) made by magnetron sputtering then exposed to aqueous 1 mol HCl solution (E. Hirota, H. Habazaki, A. Kawashima, K. Asami and K. Hasimoto, *Scientific Report A*38, 1 Mar., 1993, The University of Tohuko, Japan).

On the basis of these observations it is then straightforward to see these improvements in the light of a universal consequence of passivating components in Mg as it was first shown by Hehmann et al. (F. Hehmann, H. Jones, F. Sommer and R. G. J. Edyvean, Corrosion Inhibition in Magnesium-Aluminium Based Alloys Induced by Rapid Solidification Processing, *J. Mater. Sci.* 24, 1989, pp. 2369–2379) for the extended solid solution of Al in cph-Mg and in more general predicted for the first time by Tamman already in 1919 (G. Tammann, *Die chemischen und galvanischen Eigenschaften von Mischkristallen und ihre Atomverteilung*, Leipzig, 1919), i.e. an homogeneous distribution of the alloying elements on an atomic length scale. On top of this first topological criterion (see below), the efficiency of light rare earth and/or early transition metals and/or metalloids to substantially enhance the corrosion behavior of magnesium alloys by passivation the Mg-alloy surface might result from their ability to a) form a variety of oxides of different stoichiometry without large changes in the enthalpy of formation (R. C. Weast, *CRC Handbook of Chemistry and Physics*, 66th edition, 1985–1986, cf. Tables 3 and 4);

b) to donate a relatively large number of electrons upon substitution of Mg-ions of the MgO surface oxide by $RE_2O_3$, $TM_2O_3$, $RE_xO_y$, $TM_xO_y$, $met_xO_y$ where x<y to the otherwise non-conductive MgO so providing a higher surface potential eventually rendering the alloy surface inert by an increase in electron concentration at the very top layer of the oxide repelling $O^{--}$-ions there so transforming the MgO into an n-conductor (cf. Tables 3–6) known to suppress the diffusion e.g. of magnesium to the surface (cf. E. Hirota, H. Habazaki, A. Kawashima, K. Asami and K. Hasimoto, *Scientific Report A*38, 1 Mar., 1993, The University of Tohuko, Japan).

It is evident that these criteria apply in magnesium particularly to the transition metals Ti, V, Cr and Mn as well as to the elements of the same sub-group of following periods of the atomic table and this is in full agreement with the present observations and the observations made by the British, American and Japanese laboratories. The supra-periodical coherency of these observations, however, was not obvious prior to the present invention. The relatively low vapor pressure of transition metals impose a general limitation for economically viable VD-processing compared to that with rare earth metals which provide a relatively large vapor pressure. Alloying additions such as vanadium, however, are known to provide at least six different oxide modifications (rare earth three to four) and V as well as Cr and Mn (see FIG. 87 and Table 4) are therefore very attractive alloying additions for passivation of the magnesium alloy surface (R. C. Weast, *CRC Handbook of Chemistry and Physics*, 66th edition, 1985–1986). The ability to form a variety of oxides can be explained by the ability of the element to provide different states of oxidation, but also on the basis of the flexibility to provide different proportions of ionic and covalent bonding with oxygen and this ability was considered to result in amorphous (A. G. Revesz and J. Kruger, *Passivity of Metals*, eds. R. P. Frankenthal and J. Kruger, Electrochemical Society, Princeton, N.J., 1978). Amorphous oxides can suppress diffusion topologically, since they usually do not develop or they reduce grain boundary diffusion paths, for example. In the present invention this ability to modify the Mg-oxide was demonstrated by the color that appears on the surface of the extended solid solution of Si (pink-to-blue shiny, see FIG. 1), Ge (green) and Sb (red-to-violet) in cph-Mg and this was observed for the first time for the extended solid solutions in cph-Mg and the color remained there even after eight years of exposure to normal atmosphere without forming a tarnish or other surface film products. The addition of TM with relatively high evaporation rates in conjunction with RE and simple metals such as aluminum as well as metalloids are therefore a very useful alloying supplement when held in solid solution of cph-Mg or a metastable structural variant of Mg which supplies the topological criterion to cover the Mg-alloy surface most homogeneously. Homogeneity on the atomic scale, however, is the most important criterion as evident from the invention and this is not surprising regarding the extreme position of magnesium in the electrochemical series.

10. Hierarchy of Relevant Criteria for Stainless Mg—Alloys via Single, i.e. One-Phase and/or Duplex Non-Equilibrium Mg-base Matrices The following alloy development criteria are relevant to complete (not to substitute) the high purity alloying concept to provide even better corrosion resistance and eventually relaxing the requirements on purity of Mg-alloys and feedstock as well as on the refinement of essentially inert and/or second phases being critical for the protection of the Mg-base bulk afforded by the surface film (see above). One of the most remarkable and widespread assumption is that the corrosion of Mg is controlled by the reaction

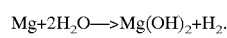

$Mg+2H_2O \longrightarrow Mg(OH)_2 + H_2$.

Figure 77:
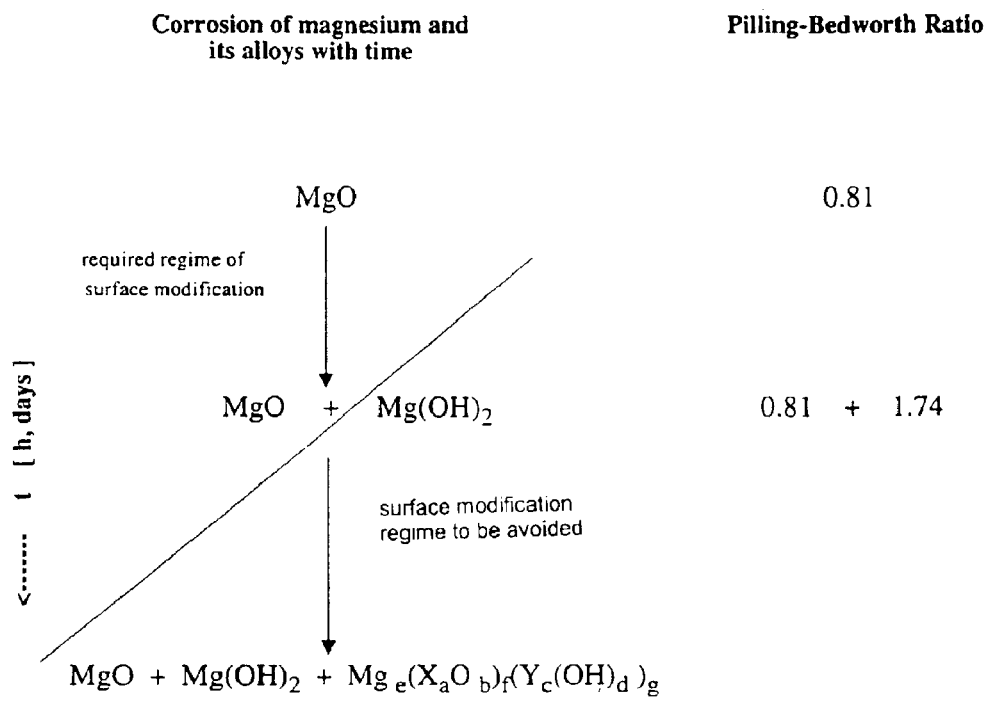
FIG. 77 Schematic of evolution of surface reaction products on conventionally processed Mg-based alloys indicating area of interest for development of corrosion resistant Mg-alloys by advanced processing (upper left MgO-domain).

(cf. A. L. Olsen, *Metall* 46(6), 1992, pp. 570–574; K. Bühler, *Metall* 44(8), 1990, pp. 748–753; G. L. Makar and J. Krüger, *International Mat. Rev.* 38(3), 1993, pp. 138–153). This assumption ignores the reality and is one example for the origins why the literature on the corrosion of Mg comprises a list of incoherent and undigested statements seducing to class room methodology on microgalvanic and other cells (cf. G. Neite, *Corrosion Behaviour of Magnesium*, in: G. Neite, K. Kubota, K. Higashi and F. Hehmann, *Mg-Based Alloys, Structure and Properties of Nonferrous Alloys*, ed. K. H. Matucha, Vol. 8 of Encyclopedia *Materials Science and Technology*, eds. R. W. Cahn, P. Haasen and E. J. Krämer, VCH Weinheim, P.O. Box 10 11 61, D-6940 Weinheim, RFA, October 1996). The assumption that pure Mg "corrodes" suggest the absence of a surface reaction and/or oxidation product on the Mg-(alloy) bulk prior to transforming into Mg-hydroxide. The same authors outline (cf. G. L. Makar and J. Krüger, *International Mat. Rev.* 38(3), 1993, pp. 138–153), however, that a magnesium oxide film forms at higher temperatures which (eventually) develops a Pilling-Bedworth ratio, i.e. a ratio of the molar volume of the surface oxide MgO to that of the substrate (bulk) metal Mg of $V_{MgO}/V_{Mg}=0.81$ without referring to the apparent contradiction. The MgO-oxide surface film is considered to be non-protective as a result of pores and fissures forming diffusion paths between metallic bulk and environment. In practice, however, Mg and its alloyed surfaces are always exposed to casting temperatures above 450° C. and/or vapor deposition and/or e.g. ball milling environments with more or less dry air before being exposed to humid environments (at lower temperatures). Therefore, the MgO-surface film forms first prior to other reaction products including Mg-base hydroxides frequently observed after exposure to humid environments. The Pilling-Bedworth ratio of the $Mg(OH)_2$ on pure Mg, however, is 1.73. The $Mg(OH)_2$-crystal has a layered rhombohedral structure providing easy basal cleavage so dissolution in acids ($pH_{crit}$, <8.5) all indicating the poor adherence forthcoming from the fissures forming under expansion a nd resulting micropressures so developing the problems similar to the MgO-film (which is subjected to microstresses under tension), but the other way around. One of the resulting misconceptions is to improve the corrosion behavior of Mg by suppressing the formation of MgO as the initial product in the reaction chain of Mg-based surface films (and if only in the interpretation) so to improve the properties of the $Mg(OH)_2$-based hydroxide rather than vice versa. The prime question is therefore (i) why and under what conditions transforms the MgO-film to the Mg-hydroxide and (ii) how can this transformation be replaced by a more efficient surface protection with the MgO as the basis (see schematic, FIG. 77 of evolution of surface reaction products on conventionally processed Mg-based alloys indicating area of interest for development of corrosion resistant Mg-alloys by advanced processing (upper left MgO-domain), while the rest is to be avoided. Penetration of hydroxyle-ions into MgO, for example, can result in oxide thickening without developing any protective surface product, cf. FIG. 80c).

10.1 The MgO—>$Mg(OH)_2$-Transformation

One of the reasons why attention is focussed on the modification and/or stabilization of the Mg-hydroxide $Mg(OH)_2$ rather than on that of the oxide MgO is the comparison of the free energy of formation of both species, i.e. ΔG for MgO is 136 kcal/gmol and ΔG for $Mg(OH)_2$ is 142.6 kcal/gmol leading to the conclusion that $Mg(OH)_2$ should form more easily since being thermodynamically more stable on a macroscopic scale. In fact, what is overlooked here is that the formation of $Mg(OH)_2$ requires a molecule of water the ΔG of which also enters the energy balance δΔG following:

|    | $MgO + H_2O$ | --> | $Mg(OH)_2{}^{XTL}$ | δΔG [kcal/gmol] |
|----|--------------|-----|---------------------|-----------------|
| ΔG | −136         |     | −142.6              | −6.6            |
| ΔG |              | −68.3 |                   | +61.7           |

How is this transformation of MgO into $Mg(OH)_2$ then nonetheless possible? Uniform formation of $Mg(OH)_2$ requires a humidity of a minimum of 80% without being sufficient, while it is possible locally already at 30% humidity. While the misleading comparison of ΔG of MgO and $Mg(OH)_2$ suggests a small driving force toward formation of the $Mg(OH)_2$ due to the negative difference of δΔG=−6.6 kcal/gmol, the reality is that, on an macroscopically homogeneous scale this reaction cannot occur as the balance with ΔG for water shows and resulting in a positive value of δΔG=61.7 kcal/gmol. The latter is confirmed by the observation reported in the Pourbaix-Atlas that dense MgO-plates are hardly attacked upon immersion in water, while MgO-powder dissolves rapidly in water (as a result of the increase in stored energy including a surface term here) and showing that the macroscopic energy balance is hardly the origin of the corrosion behavior of magnesium and its alloys and that contrary to widespread belief—$Mg(OH)_2$ does not necessarily destabilize MgO, but that microscopic factors including surface energy, concentration of $H_2O$, microgalvanic effects under the surface film, film-characteristics including microstresses under tension and/or pression as well as the formation of aeration cells forming local elements externally including oxygen gradients in the electrolyte, $\delta c_{O2}$, (cf. FIGS. 78 to 80). They are all contributing to an increase in ΔG on the left hand side of the above reaction so contributing to increase the driving force to a transformation of MgO to other products including $Mg(OH)_2$ instead. In fresh water, for example, Mg does not corrode. (Accumulation of) Water droplets on the surface of Mg, however, can provoke catastrophic corrosion effects showing the commonalty of the corrosion characteristics of Mg with those of iron and/or steels (cf. FIGS. 78 to 80 including the significance of local rather than macroscopic conditions).

Figure 78:
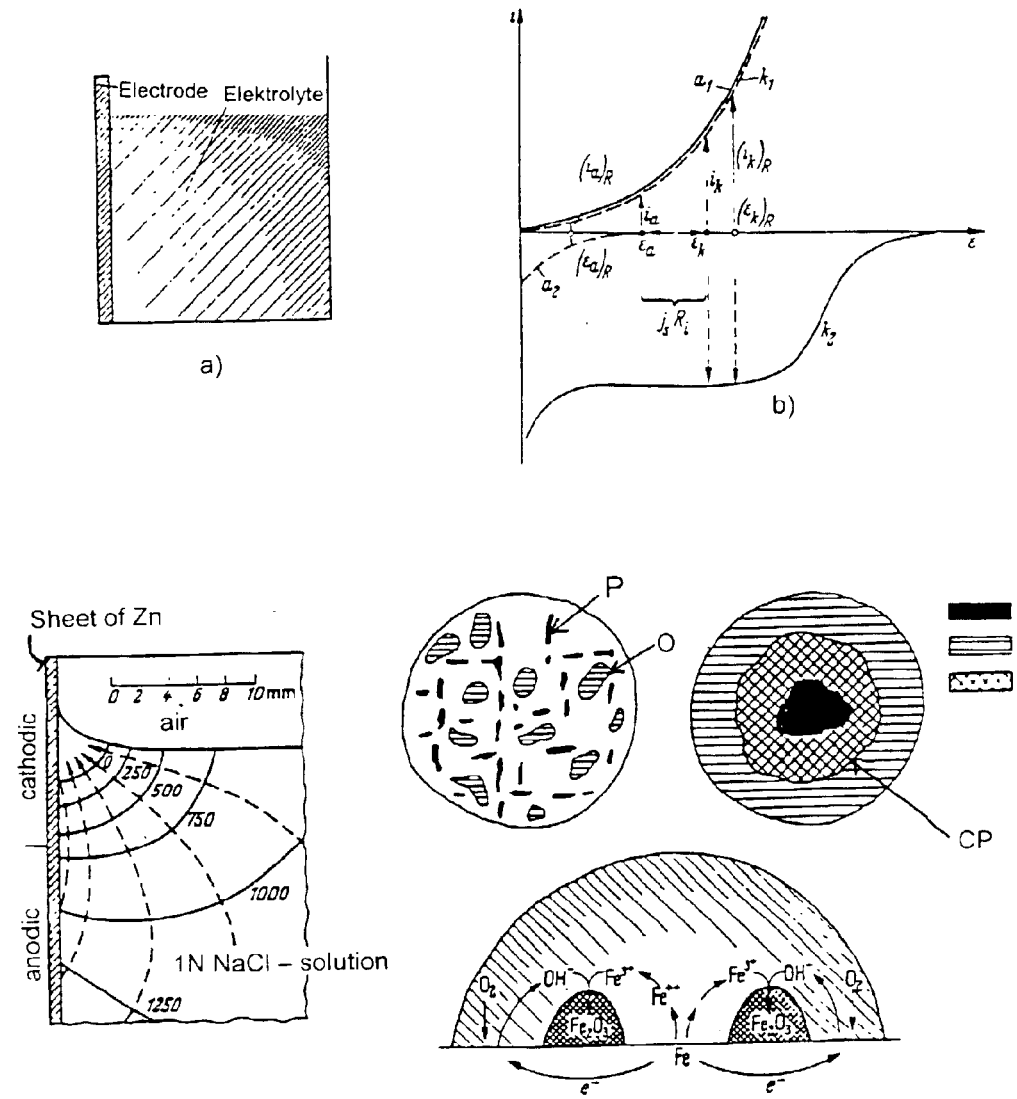
FIG. 78 Pitting corrosion is the most frequently observed form of corrosion of conventional Mg-alloys in real life with oxygen gradient (cf.
Figure 80:
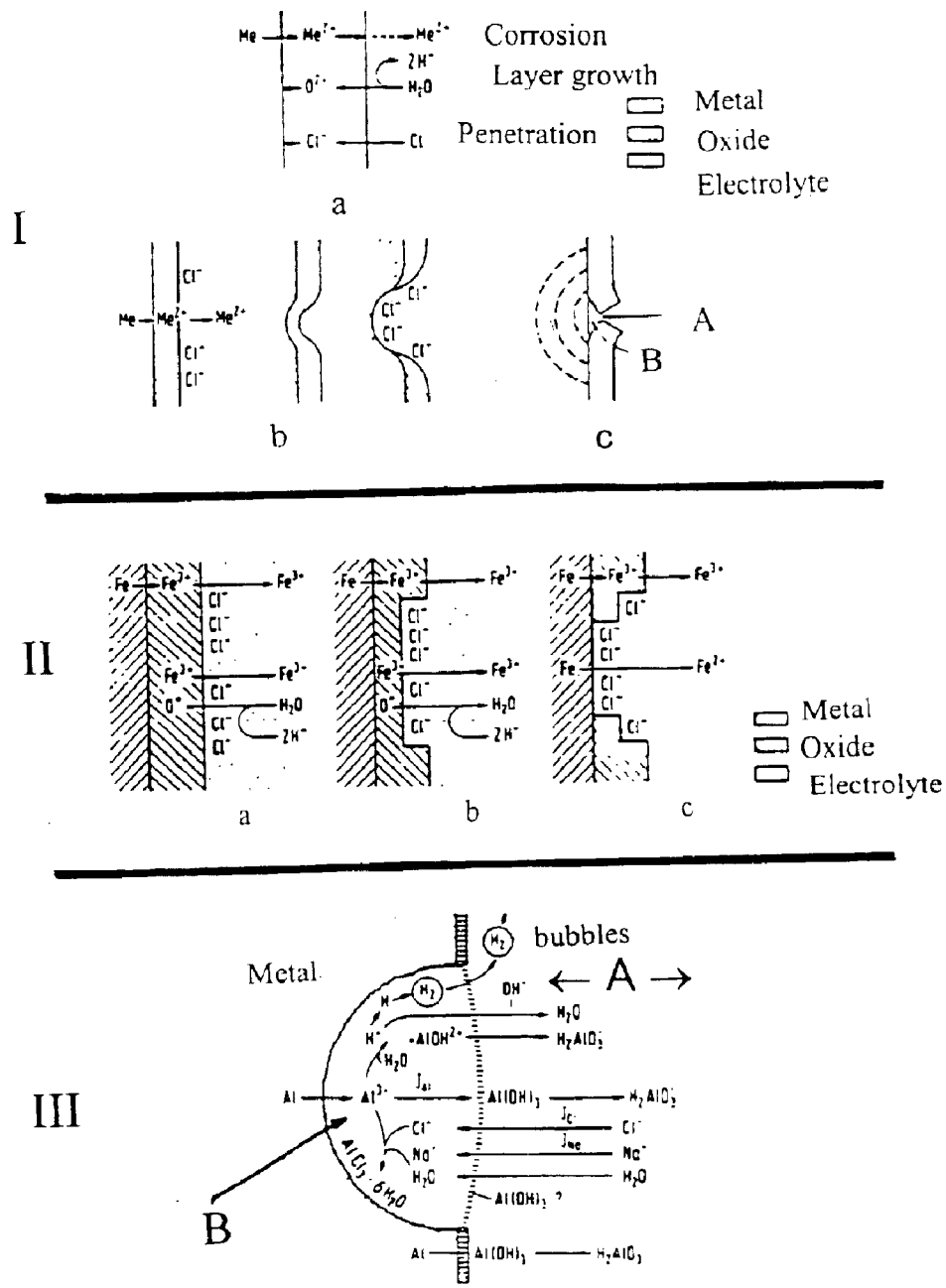
FIG. 80 Modeling of pit falls on I) metal surfaces resulting from a) penetration of anion ($Cl^-$) into metal oxide, b) island—adsorption of anions (Cl—) on passive oxides and c) fissuring of passive surface oxides.

FIG. 78 shows pitting corrosion is the most frequently observed form of corrosion of conventional Mg-alloys in real life. While it is common practice to attribute pitting corrosion to the microstructure including impurity inclusions of the Mg-alloy concerned, it is usually overlooked that an oxygen gradient (cf. FIG. 78a) is formed in front of the interface metal/electrolyte resulting in an increase in b) corrosion potential $(\epsilon_k)_R$ due to corresponding shift of the cathodic partial reaction from $a_2$ to $k_2$ (cf. FIG. 78b). FIG. 78a shows the stationary oxygen distribution with increasing distance from metal surface and decreasing distance from the surface of the electrolyte and FIG. 78c the resulting potential profile (solid lines) and current density lines (hatched lines) for a Zn-plate immersed in 1 N NaCl aqueous solution, the numbers in [mV] with 0-line as reference, i.e. the oxygen-rich part of the inter face (cf. O in FIG. 78d) is the more noble (cathodic) part equivalent to an Fe-inclusion, while corrosion occurs in the oxygen depleted part of the interface depending on the amount of oxygen diffusing to the cathodic part. As a result, a topologically coherent iron oxide surface film (FIG. 78d) transforms locally into pits (P) which are surrounded by $Fe_2O_3$ or other corrosion products (cf. CP) depending on the details of the environment (cf. FIG. 79) and which build up in the vicinity of the pit as a result of local oxygen gradients under a droplet, for example, forming an aeration cell (local element) on top of the metal surface according to FIG. 78c. That is, the resulting pit would also form when the microstructure was absolutely homogeneous (i.e. one phase (equilibrium) alloy microstructure) showing that the reduction of pit falls requires also modification of the metal oxide via other means (cf. text and H. Kaesche, *Die Korrosion der Metalle*, Springer Verlag Berlin, New York, 2nd edn., 1979). FIG. 79 shows (Top) Transformation of topologically coherent iron oxide film (A) into pitting and surrounding corrosion product $Fe(OH)_3$ (B: rust) building up around pit as a result of oxygen gradient in aeration cell (local element, i.e. C: electrolytic solution, D: diffusion and E: electrolytic transfer) on top of metal surface according to FIG. 78c(N.B. F: metallic shiny, G: tight layer of rust, H: loosely adherent rust). (Bottom) Corresponding result for rotating low alloyed steel disc exposed to 0.0003 mol $Na_2C_3$ saturated with CaCO$_3$ in air at T=20° C., ω=1 Hz (H. Kaesche, *Die Korrosion der Metalle*, Springer Verlag Berlin, New York, 2nd edn., 1979). FIG. 80 shows modeling of pit falls on I) metal surfaces resulting from a) penetration of anion (Cl$^-$) into metal oxide, b) island-adsorption of anions (Cl—) on passive oxides and c) fissuring of passive surface oxides where A: attack of electrolyte and B: competition of growth between surface oxide and surface chloride, on II) iron oxide resulting from local perforation of oxide in Cl$^-$-containing solution at medium value of pH according to Heusler and III) on aluminum oxide according to Kaesche, the latter showing Al-hydrolysis in NaCl-solution resulting from Cl$^-$ and H$_2$O-transport to and H$_2$-transport (bubbles) away from locally acidic pit fall (B, i.e. $\epsilon<E_{H2/H^+}$) despite overall $p_H>7$ (A, i.e. $\epsilon>E_{H2/H^+}$) more far away from pit (H. Kaesche, *Die Korrosion der Metalle*, Springer Verlag Berlin, New York, 2nd edn., 1979).

It is therefore not surprising that the actual of MgO to crystalline Mg(OH)$_2$ is frequently observed to be associated with the transformation to amorphous Mg(OH)$_2$-islands and/or precipitation via condensation of droplets in relatively low humidity, the amorphization increasing the entropy of transformation following $$\delta\Delta G = \delta\Delta H - T\delta\Delta S$$

i.e. nature mobilizes the excess term ΔS in view of corresponding low δΔH-balance and driving forces δΔG to finally arrive at the crystalline Mg(OH)$_2$—final product. It is therefore wrong to direct Mg alloy development toward modification and/or stabilization of amorphous Mg(OH)$_2$ rather than to avoid it totally, since once being formed, the transformation into crystalline Mg(OH)$_2$ becomes inevitable unless the hydroxide was washed away before:

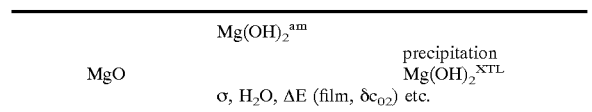

(where E=(local strain) energy here). A revision of the available thermodynamical data shows that also the transformation of MgO into amorphous Mg(OH)$_2$ (-precipitates, i.e. the most stable Mg(OH)$_2$-configuration) is thermodynamically, i.e. macroscopically not evident (cf. R. C. Weast, *CRC Handbook of Chemistry and Physics, 66th edition*, 1985–1986):

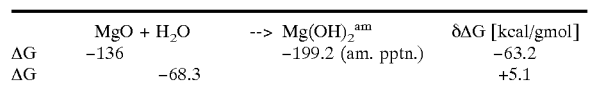

so requiring further (energy/enthalpy) contributions. For comparison, the reaction

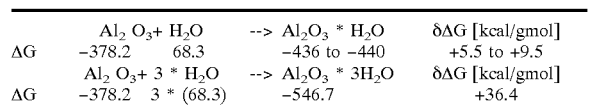

would require the same order of magnitude microscopic activation (energy) to occur. In practice, however, Al$_2$O$_3$ does not transform as easily into corresponding hydroxide as Mg does and this confirms that microscopic energy contributions are the rate-controlling energy criteria among the overall criteria controlling the transformation of MgO to Mg(OH)$_2$ or another hydroxide-derivative, for example.

It is also evident, however, that the beneficial effect of the very homogeneous distribution of rare earth elements on the corrosion behavior of Mg in a H$_2$O$_2$-based solution does not result from macroscopic energy criteria, since the free energy balance of the transformation of corresponding oxides into hydroxides, i.e. e.g.

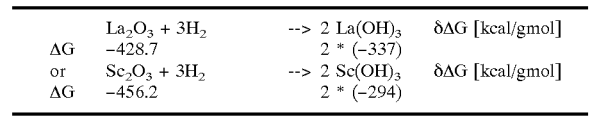

(as representatives which shall be sufficient here, cf. R. C. Weast, *CRC Handbook of Chemistry and Physics, 66th edition*, 1985–1986) i s not only very exothermic providing a potentially large driving force, it also increases the susceptibility of a mixture with MgO to excess-hydrogen at the surface as is easily available in H$_2$SO$_4$-, HCl- and/or HNO$_3$-based acid solutions (see 1.16 under 1st Embodiment). The same trend is given by the balance of corresponding crystal lattice energies (cf. R. C. Weast, *CRC Handbook of Chemistry and Physics, 66th edition*, 1985–1986). The involvement of rare earth elements in Mg-base surface oxides thus increases its macroscopic susceptibility to the transformation to a(n eventually mixed) hydroxide in more aggressive media providing a hydrogen-controlled reaction eventually leading to incorporation of anions such as SO$_4^{--}$, Cl$^-$ and (NO$_3$)$^{3-}$ in the surface film so increasing its vulnerability to corrosive attack.

Figure 81:
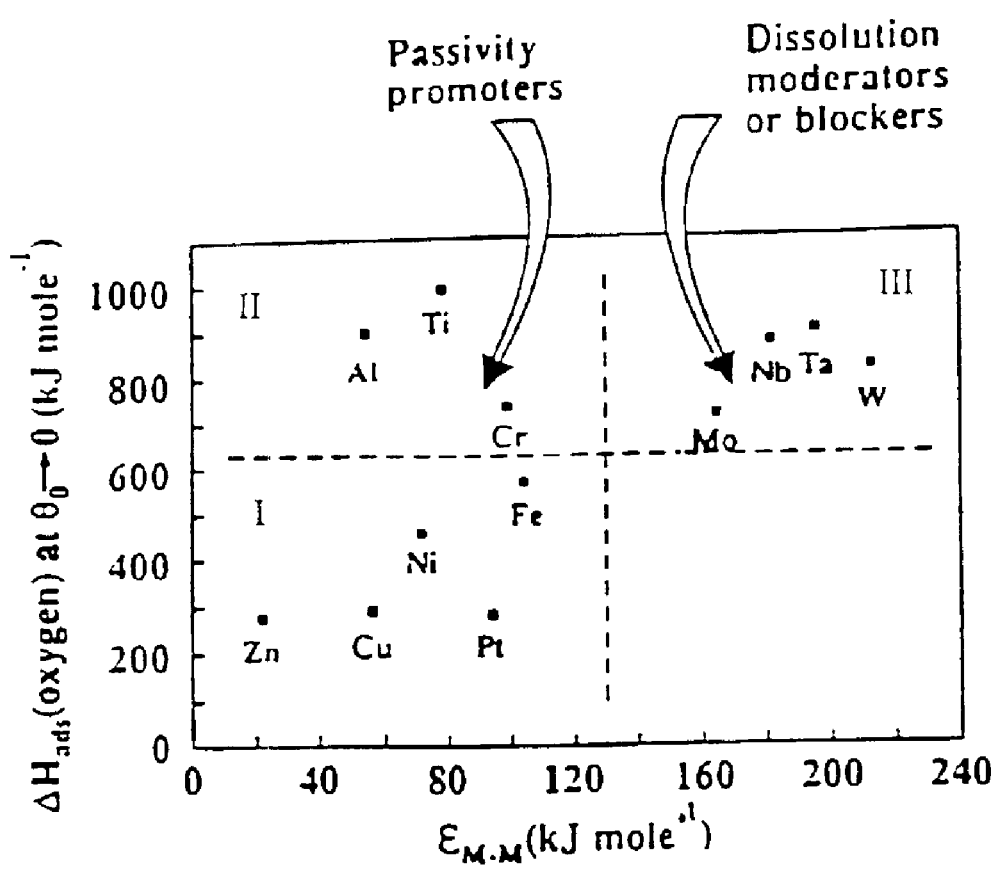
FIG. 81 Synergy between heat of oxygen adsorption and easiness of disruption of like-like metal bonds and resulting clustering I, II and III of non-passive metals (I), passivity enhancing (enhanced) metals (II) and retarding their solution/reaction with oxygen due to relatively large internal forces (III).

The oxides of transition metals and metalloids, however, do not transform (as easily as those of rare earth elements) into corresponding hydroxides. In fact, no hydroxides were reported for the following elements (cf. R. C. Weast, *CRC Handbook of Chemistry and Physics, 66th edition*, 1985–1986): Ce (an interesting CeCrO$_3$-oxide was reported instead), for Cr, Ge, Hf, Mh, Nb, Re, Rh, Si, Ta, Tc, Ti, W, V, yttrium, and Zr, all in full agreement with the observations by Hirota et al., see above). Most of the rare earth metals such as Gd, Dy, Pr, Ho etc. may absorb water instead (cf. reaction for aluminum and R. C. Weast, *CRC Handbook of Chemistry and Physics, 66th edition*, 1985–1986), while the late transition metals form systematically hydroxides, i.e. Co(OH)$_2$, Cu(OH)$_2$, Au(OH)$_3$, Mn(OH)$_2$, Ni(OH)$_2$, Os(OH)$_4$, Pd(OH)$_4$, Pt(OH)$_2$ and Zn(OH)$_2$, for example. The different behavior of the early and late transition metals was explained (P. Marcus, *Corosion Science* 36 (12), 1994, pp 2155–2158) on the basis of their different metal oxygen bond strength ΔH$_{ads}$ providing the energy for oxygen dissociation (O$_2$—>2O; δΔH(O$_2$):498 kJ/mol) prior to formation of oxide nuclei (FIG. 81 showing synergy between heat of oxygen adsorption and easiness of disruption of like—like metal bonds and resulting clustering I, II and III of non-passive metals (I), passivity enhancing (enhanced) metals (II) and retarding their solution/reaction with oxygen due to relatively large internal forces (III), respectively (P. Marcus, *Corosion Science* 36 (12), 1994, pp. 2155–2158)) being dictated by like-like metal bond strengths $\epsilon_{M-M}$ operating as nucleation barriers for oxide formation so (pure) metal passivation (FIG. 81). Passivity promoters are characterized by high ΔH$_{ads}$-low $\epsilon_{M-M}$-values. The synergistic effect of both criteria classifies passivation behavior of pure metals which provide per se a one-phase microstructure. The extrapolation of this classification to the corrosion problem of magnesium (i.e. the MgO—>Mg(OH)$_2$-transformation) shows (i) that Al and early transition metals are prime candidates for passivation of magnesium, (ii) why H$_2$O$_2$-based electrolytes as employed in the invention discriminate topological from chemical passivation effects (i.e. the use of H$_2$O$_2$ reduces and/or replaces $\Delta H_{ads}$(req) for O$_2$-dissociation catalytically and rendering Mg-alloys passive provided, that the surface film is topologically dense (see next chapter) and (iii) that percolation analysis according to which a chain of metal-oxides are formed without breaking metal-metal bonds is not sufficient to explain the passivation of magnesium. $\Delta H_{ads}$ is related to the metal-oxygen bond strength following $$\epsilon_{M\text{-}O} = 0.5[\Delta H_{ads}(\text{ox}) + \delta\Delta H(O_2)]$$

while $\epsilon_{M\text{-}O}$ is proportional to the lattice energy of the oxides (Table 3). Accordingly, all elements forming oxides with higher lattice energies than MgO provide improved O$_2$-dissociation and oxides with x<y for which a jump in lattice energies toward higher values is evident) are particular useful (Table 3). Also the oxides of Be and B are stable in view of the reactions:

|    | BeO | + | H$_2$O | → | Be(OH)$_2$ | $\delta\Delta G$ [kcal/gmol] |
|----|-----|---|--------|---|------------|-----|
| $\Delta G$ | −138.7 | | −68.3 | | −194.8 | +12.7 |
|    | B$_2$O$_3$ | + | 4* H$_2$O | → | 2* B(OH)$_4^-$ + O$_2$ | $\delta\Delta G$ [kcal/gmol] |
| $\Delta G$ | −285.3 | | 4*(−68.3) | | 2*(−231.56) | +95.38 | i.e. without significantly (Be) modifying the macroscopic energy balance when involved in MgO and/or without favoring (B) the formation of corresponding hydroxide (Be, B). The beneficial effect of a homogeneous distribution of rare earth elements including yttrium and/or scandium on solid Mg-based surfaces in other environments is evidently based on parameters which are different from macroscopic equilibrium conditions calling for an analysis of the microscopic and more local effect they have on MgO (and Al$_2$O$_3$) for example.

TABLE 3

Lattice Energies of Oxides (Highlighted (e.g. by flash), if larger than for MgO)

| Oxide cycle | Calculated lattice energy [kJmol$^{-1}$] | Literature source | Thermochemical lattice energy [kJmol$^{-1}$] |
|---|---|---|---|
| Li$_2$O | 2799 | Baughan (1959) | — |
| Na$_2$O | 2481 | Baughan (1959) | — |
| K$_2$O | 2238 | Baughan (1959) | — |
| Rb$_2$O | 2163 | Baughan (1959) | — |
| Cu$_2$O | 3273 | Mamulov (1961) | — |
| Ag$_2$O | 3002 | Mamulov (1961) | — |
| Tl$_2$O | 2659 | Mamulov (1961) | — |
| LiO$_2$ | (878) | D'Orazio, Wood (1965) | (872) |
| NaO2 | 799 | Yatsimirskiii (1959) | 796 |
| KO$_2$ | 741 | D'Orazio, Wood (1965) | 725 |
| RbO$_2$ | 706 | D'Orazio, Wood (1965) | 695 |
| CsO$_2$ | 679 | D'Orazio, Wood (1965) | 668 |
| Li$_2$O$_2$ | 2592 | Wood, D'Orazio (1965) | 256 |
| Na$_2$O$_2$ | 2309 | Wood, D'Orazio (1965) | 305 |
| K$_2$O$_2$ | 2114 | Wood, D'Orazio (1965) | 2078 |
| Rb$_2$O$_2$ | 2025 | Wood, D'Orazio (1965) | 2006 |
| Cs$_2$O$_2$ | 1948 | Wood, D'Orazio (1965) | 1861 |
| MgO$_2$ | 3356 | Wood, D'Orazio (1965) | 3526 |
| CaO$_2$ | 3144 | Wood, D'Orazio (1965) | 3133 |
| SrO$_2$ | 3037 | Wood, D'Orazio (1965) | 2849 |
| KO$_3$ | 697 | Wood, D'Orazio (1965) | — |
| BeO | 4293 | Huggins, Sakamato (1957) | 4443 |
| MgO | 3795 | Huggins, Sakamato (1957) | 3791 |
| CaO | 3414 | Huggins, Sakamato (1957) | 3401 |
| SrO | 3217 | Huggins, Sakamato (1957) | 3223 |
| BaO | 3029 | Huggins, Sakamato (1957) | 3054 |
| TiO | 3832 | Huggins, Sakamato (1957) | 3811 |
| VO | 3932 | Ladd, Lee (1961) | 3863 |
| MnO | 3724 | Ladd, Lee (1961) | 3745 |
| FeO | 3795 | Ladd, Lee (1961) | 3865 |
| CoO | 3837 | Ladd, Lee (1961) | 3910 |
| NiO | 3908 | Ladd, Lee (1961) | 4010 |
| PdO | 3736 | Ladd, Lee (1961) | — |
| CuO | 4135 | Mamulov (1961) | 4050 |
| ZnO | 4142 | Ladd, Lee (1961) | 3971 |
| CdO | 3806 | Ladd, Lee (1961) | — |
| HgO | 3907 | Ladd, Lee (1961) | — |
| GeO | 3919 | Ladd, Lee (1961) | — |
| SnO | 3652 | Ladd, Lee (1961) | — |
| PbO | 3520 | Ladd, Lee (1961) | — |
| Sc$_2$O$_3$ | 13557 | Gasharov, Sovers (1970) | 13708 |
| Y$_2$O$_3$ | 12705 | Gasharov, Sovers (1970) | — |
| La$_2$O$_3$ | 12452 | Johnson (1969) | — |
| Ce$_2$O$_3$ | 12661 | Johnson (1969) | — |
| Pr$_2$O$_3$ | 12703 | Johnson (1969) | — |
| Nd$_2$O$_3$ | 12736 | Johnson (1969) | — |
| Pm$_2$O$_3$ | 12811 | Johnson (1969) | — |
| Sm$_2$O$_3$ | 12878 | Johnson (1969) | — |
| Eu$_2$O$_3$ | 12945 | Johnson (1969) | — |
| Gd$_2$O$_3$ | 12996 | Johnson (1969) | — |
| Tb$_2$O$_3$ | 13071 | Johnson (1969) | — |
| Dy$_2$O$_3$ | 13138 | Johnson (1969) | — |
| Ho$_2$O$_3$ | 13180 | Johnson (1969) | — |
| Er$_2$O$_3$ | 13263 | Johnson (1969) | — |
| Tm$_2$O$_3$ | 13322 | Johnson (1969) | — |
| Yb$_2$O$_3$ | 13380 | Johnson (1969) | — |
| Lu$_2$O$_3$ | 13665 | Ladd, Lee (1961) | — |
| Ac$_2$O$_3$ | 12573 | Krestov, Krestova (1969) | — |
| Ti$_2$O$_3$ | — | — | 14149 |
| V$_2$O$_3$ | 15096 | Mamulov (1961) | 14520 |
| Cr$_2$O$_3$ | 15276 | Mamulov (1961) | 14957 |
| Mn$_2$O$_3$ | 15146 | Mamulov (1961) | 15035 |
| Fe$_2$O$_3$ | 14309 | Mamulov (1961) | 14774 |
| Al$_2$O$_3$ | 15916 | Yatsimirskiii (1961) | — |
| Ga$_2$O$_3$ | 15590 | Yatsimirskiii (1961) | 15220 |
| In$_2$O$_3$ | 13928 | Yatsimirskiii (1961) | — |
| Ti$_2$O$_3$ | 14702 | Mamulov (1961) | — |
| Pb$_2$O$_3$ | (14841) | Van Gool, Picken (1969) | — |
| CeO$_2$ | 9627 | VanBaur (1961) | — |
| ThO$_2$ | 10397 | Ladd, Lee (1961) | — |
| PaO$_2$ | 10573 | Ladd, Lee (1961) | — |
| VO$_2$ | 10644 | Ladd, Lee (1961) | — |
| NpO$_2$ | 10707 | Ladd, Lee (1961) | — |
| PuO$_2$ | 10786 | Ladd, Lee (1961) | — |
| AmO$_2$ | 10799 | Ladd, Lee (1961) | — |
| CmO$_2$ | 10832 | Ladd, Lee (1961) | — |
| TiO$_2$ | 12150 | Ladd, Lee (1961) | — |
| ZrO$_2$ | 11188 | Ladd, Lee (1961) | — |
| MoO$_2$ | 11648 | Ladd, Lee (1961) | — |
| MnO$_2$ | 12970 | Ladd, Lee (1961) | — |
| SiO$_2$ | 13125 | Ladd, Lee (1961) | — |
| GeO$_2$ | 12828 | Ladd, Lee (1961) | — |
| SnO$_2$ | 11807 | Ladd, Lee (1961) | — |
| PbO$_2$ | 11217 | — | — |

TABLE 4

Oxides Grouped according to their Tendency to form Hydroxides

TM forming oxides with small tendency to form hydroxides

| | |
|---|---|
| Ti | TiO, TiO$_2$, Ti$_2$O$_3$ |
| Zr | ZrO, ZrO$_2$, ZrO$_3$ |
| V | VO$_2$, V$_2$O$_3$, V$_2$O$_4$, V$_3$O$_5$, V$_4$O$_7$, V$_6$O$_{13}$ |
| Cr | Cr$_2$O$_3$, Cr$_2$O$_7$ |
| Hf | HfO, HfO$_2$ |
| Nb | Nb, NbO$_2$, Nb$_2$O$_5$ |
| Re | ReO$_2$, ReO$_3$ |
| Rh | RhO, RhO$_2$, Rh$_2$O$_3$ |
| Ta | TaO$_2$, Ta$_2$O$_5$ |
| (Mn | MnO, MnO$_2$, Mn$_2$O$_3$, Mn$_3$O$_4$) |

Others forming oxides with relatively small tendency to form hydroxides

| | |
|---|---|
| Ce | CeO, Ce$_2$O$_3$ |
| Sb | Sb$_2$O$_3$, Sb$_2$O$_4$, Sb$_2$O$_5$ |
| Be | BeO, BeO$_2$ |
| B | B$_2$O$_3$ |
| Ga | GaO, Ga$_2$O, Ga$_2$O$_3$ |
| Al | Al$_2$O$_3$ |
| Ge | GeO, GeO$_2$ |
| Si | SiO, SiO$_2$ |
| P | PO, P$_4$O$_6$, P$_4$O$_{10}$ |
| Sn | SnO, SnO$_2$ |

TM forming oxides with a tendency to form hydroxides

| | |
|---|---|
| Co | Co$_3$O$_4$ |
| Cu | CuO, Cu$_2$O |
| Au | AuO$_3{}^{3-}$ |
| Fe | FeO, Fe$_2$O$_3$, Fe$_3$O$_4$ |
| Ni | NiO, Ni$_2$O$_3$ |
| Os | OsO$_3$, OsO$_4$ |
| Pd | PdO |
| Pt | PtO$_2$, Pt$_3$O$_4$ |
| Ag | Ag$_2$O, Ag$_2$O$_3$ |
| Cd | CdO |

Others forming oxides with a tendency to form hydroxides or absorbing H$_2$O

| | |
|---|---|
| RE[1] | RE$_2$O$_3$ |
| Ba | BaO$_2$ |
| Ca | CaO$_2$, CaO, CaMgC$_2$O$_6$ |
| In | InO, In$_2$O$_3$ |
| Li | LiO, Li$_2$O, LiO$_2$ |
| Se | SeO, SeO$_2$ |
| Na | NaO, Na$_2$O, NAO$_2$ |
| S | SrO, Sr$_2$O, SrO |

[1] RE = rare earth, see Table 3

10.2 Topological Non-Permeability and Adherence of the Enhanced Mg-base Surface Oxide as the Basic (but not Sufficient, see above) Requirement for Passivation of Magnesium The advent of RSP evidenced significant drawbacks on the theory of the formation of self-healing passive alloy surface films. No consistent metallurgical relationship has yet been reported between composition, microstructure and crystal structure on the one hand and passivability of the alloy surface overlayer on the other. A consecutive (i.e. chronological so inverted hierarchical) order of pre-requisites for alloy passivation of non-passive metals (Fe, Mg) is given by (i) chemical, then (ii) physical criteria followed by (iii) topological considerations. Chemical conditions include adsorption of mono-molecular layers of O$^{2-}$ or OH$^-$-ions to tie up metallic valencies in the unfilled continuum of conducting bands as a necessary, but not sufficient pre-requisite no 1 for atmospheric growth of a surface oxide in order to retain the beneficial effect of many 3d- (i.e. TM-) or 4f-(i.e. RE-) elements, for example, on their own corrosion resistance or when alloyed to another, more easily corroding metal or alloy (cf. yttrium in thermal barrier coatings). Physical criteria (pre-requisite no 2) include a) the crystal or non-crystalline structure of the surface oxide (suppressing ionic diffusion paths such as for (metallic) anions or O$^{2-}$-cations so including (anodic) polarization prior to thermodynamic equilibrium with the environment; e.g. Al$_2$O$_3$, Cr$_2$O$_3$, disordered Fe$_3$O$_4$ in acids, (Fe$_2$O$_3$+Cr$_2$O$_3$)-spinell) and/or b) its e-conductivity (e.g. Al$_2$O$_3$ and TiO$_2$ are insulators so also suppressing cathodic partial reactions, while the oxides of Fe, Cr and Ni do not). Topological non-permeability of the resultant surface film is the last, but not least pre-requisite no 3 for passivation. If the oxide is a) free of diffusion paths/pores (e.g. Ti$_2$O$_3$, Cr$_2$O$_3$, Al$_2$O$_3$, (Fe$_2$O$_3$+Cr$_2$O$_3$)-spinells), it leads on to a thin (<10 nm) and metallically shiny passive film—>Definition of "passive"=orders of magnitude lower corrosion rates than expected being stable over a range of applied potentials) which can be reinforced by further anodizing (eg. Al, Ti; strictly speaking, no 3 a) does not require the exact knowledge on no 2). If the oxide is b) porous (i.e. semipermeable, eg. Fe$_2$O$_3$, Ti$_2$O$_3$, Mo-oxides, MgO), often a sponge-like tarnish is formed including complicated corrosion mechanisms that eventually stop the further attack after a while (e.g. Fe in SO$_2$-atmospheres, selective corrosion generating surface zones depleted with the less noble constituent (CuAu, CdMg and MgAl solid solutions) and eventually oxidized pores such as AgO on CuAg-solid solutions to result in a coherent surface film).

The literature on passivability of pure Fe, Cr, Ni, Ti and Al as well as on FeCr- and FeCrNi-steels concentrates on surface mechanisms and structures of the surface layer. Topological coherency or non-permeability of the surface oxide of conventionally processed "equilibrium" alloys has always been discussed as a result of the oxide itself or of its contact to the environment, for which a unique description with respect to the problem is given by the pK$_s$-value=-log K$_s$ where K$_s$=(H$_3$O$^{+)A-}$/HA with HA=acid, H$_3$O$^-$ and A$^-$ the resulting hydronium ion and corresponding anion. However, the passivating alloy surface film is a result of the (details of the) environment on the one reversible in that different (extended) solid solutions (provided, that no local elements such as pores and Fe-inclusions are rate-controlling) will react quite similar in different environments (acids). The invention has shown that the universal effect of a solid solution, amorphous or non-equilibrium crystalline phase with a homogeneous distribution of the alloying elements on an atomic length scale controls this behavior independent on alloy purity and environment, i.e. even when the tendency to destabilize the Mg (-based) surface oxide is increased. Such a universal effect was not discriminated before in the presence of Cl$^-$-ions for which the use of hydrogen peroxide (H$_2$O$_2$) was crucial (see above). As a result, any non-equilibrium Mg-based product retaining this atomic homogeneity for topologically dense and adherent oxide stabilization must be thermally stable and that is why the rare earth elements play an important role for passive Mg-alloys and products.

Current R&D thus tends to overlook the interface function of the passivating alloy surface film. The best example is that of stainless steel. The composition of the bulk (e.g. Cr or Ni) was the only metallurgical criterion reported in the literature, while the underlying microstructures were always taken for granted. FIG. 82 shows the equilibrium phase diagrams of a) binary system Fe—Cr including the effect of 0.6 wt. % carbon on γ-phase field extension (dotted line) and b) ternary T-xNi-cut for Fe-18 Cr alloys (cf. a)). Both diagrams show that monophase α-ferritic and γ-austenitic iron alloys (and steels) are largely alloyed with passivating Cr (and Ni in b)), while any two phase (α+γ-microstructure provides relatively small microgalvanic gradients due to a relatively high alloying level involved in both phases (A. G. Guy, *Metallkunde für Ingenieure*, Akad. Verlagsgesellschaft, Bad Soden am Taunus, 1978). The figure indicates that the equilibrium microstructure of stainless steels consists of mono- or two-phase matrices with large solid solubilities of either phase so no large microgalvanic gradients to be neutralized and withstood by the surface film. While passivity of Cr-containing stainless steels is based on the ferritic α-phase field extension, that of Cr/Ni-containing stainless steels is built upon the austenitic γ- and resultant martensitic phase field extension. The significant $Cr_2O_3$-enrichment of the $Fe_2O_3$-surface oxide at 12 to 13 wt. % Cr is considered of major importance, but it is in fact of secondary importance in view of the stainless steels already existing at below this compositional threshold (A. G. Guy, *Metallkunde für Ingenieure*, Akad. Verlagsgesellschaft, Bad Soden am Taunus, 1978). The effect of Cr in stainless steels is based on one-phase field extensions by equilibrium alloying exploring largely the allotropy of Fe. The resultant small microgalvanic microstructural effects leave formation, coherency and stability of the surface overlayer practically untouched.

The reason to overlook this important pre-requisite for alloy passivity is simple: the underlying microstructure of stainless steels is already attainable by equilibrium processing so nobody needs to bother about its conditions of formation. Overlooking this pre-requisite, however, can have fatal consequences on the further R&D aimed at passive alloys, in particular when the passive alloy bulk is not attainable by equilibrium processing. The opposite to Fe and its steels holds for Al and its alloys. While Fe is passivated by selected equilibrium alloying via exploring its allotropy, almost each equilibrium alloying of Al deteriorates the effect of the perfect passive film on high-purity Al due to the formation of galvanically active microstructural second phases destabilizing the $Al_2O_3$ surface film. In contrast to Ti, Al cannot take advantage of allotropy in order to maintain its passivity by one-phase field extension upon equilibrium alloying the underlying microstructure. For Mg base-metals, the consequences on R&D by ignoring microstructural effects on passivity are even worse, since pure Mg has no (i) allotropy or (ii) a perfect self-healing passive surface oxide film in the high-purity state or on any of its equilibrium-alloys and almost none of its all-liquid processed alloys. Furthermore, (iii) low solid solubility at thermodynamic equilibrium due to large electrochemical effects between Mg and many alloying elements makes the development of stainless mono-phase Mg-matrices impossible by using an equilibrium approach.

| Rank of Passivability of "Equilibrium" Alloys | | | |
|---|---|---|---|
| 1. Ti-base | 2. Al-base | 3. Fe-base | ... Mg-base |
| passive & allotropic base-metal | passive base-metal | allotropic base-metal | — |

All other approaches have failed to achieve a passive Mg-base material. Is it not surprising that equilibrium processing will never lead to stainless Mg-alloys. The impact of non-equilibrium processing illustrates the embarrassing dilemma of the absence of stainless Mg-alloys by other means. "Non-equilibrium processing to compensate for missing metallic passivity and allotropy, low melting point and strong electrochemical effects" is the name of the game and requires for the first time a self-consistent theory of corrosion relating microstructure and corrosion properties. The need for the development of stainless Mg requires more efficient non-equilibrium processing for one-phase alloy matrices with minimum galvanic gradients. The "one-phase"-microstructure allowing for coherent non-permeability of passivating oxides is crucial before structure and properties of surface oxides become effective. In the first place, this means that equilibrium processing is "out" in order for the development of stainless Mg and this is not surprising at all. Ultimate development goal no 1 is therefore an alloyed monophase matrix with least microgalvanic gradients in order to generate an alloyed MgO-surface film without permeability both on the atomic and microstructural scale.

Figure 83:
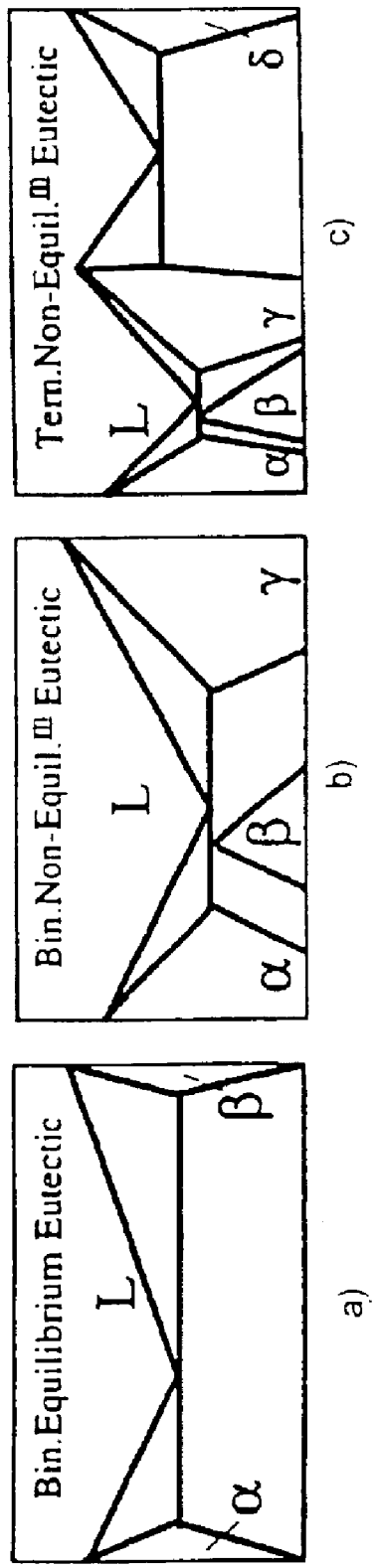
FIG. 83 Showing schematic of a) typical binary Mg-base equilibrium phase diagram with relatively large concentration gradient between α and β in corresponding two phase microstructures and b) reduced concentration gradient by non-equilibrium processing resulting from (i) occurrence of non-equilibrium β-phase at intermediate concentration and/or (ii) phase field extension of corresponding terminal phases a and/or γ.

Prime objective is the coherency of an MgO-base spinell and/or ad-mixture, not the existence of the spinell and/or ad-mixture itself, and sufficient resistance to passivate galvanic microstructural & surface layer gradients. The objective calls for terminal solid solubility extension (TSSE) of element X in monophase Mg-alloy matrices or any other non-equilibrium (ne) Mg-base phase in order to establish a new generation of Mg-alloys by non-equilibrium processing. One alternative is a dual-phase (α+β-) Mg-alloy matrix with extended solid solubility of B and A in (α+β)-Mg or a β-monophase Mg-alloy matrix as to the Cr/Ni-austenitic-type of stainless steels. Without undue increase in density, however, such microstructures are most obtainable by non-equilibrium crystalline and/or amorphous phase microstructures of higher order Mg-alloys (see FIG. 83 showing schematic of a) typical binary Mg-base equilibrium phase diagram with relatively large concentration gradient between α and β in corresponding two phase microstructures and b) reduced concentration gradient by non-equilibrium processing resulting from (i) occurrence of non-equilibrium β-phase at intermediate concentration and/ or (ii) phase field extension of corresponding terminal phases α and/or γ. Reduction of microstructural microgalvanic gradients due to non-equilibrium processing would be even more effective in ternary and higher order systems due to c) occurrence of intermediate (intermetallic) γ-phases already at equilibrium processing so reducing the concentration range of Mg-based phases of interest and resulting density increment).

10.3 Modification of the Pilling-Bedworth Ratio of Magnesium

The Pilling-Bedworth ratio is a topological criterion. Under the condition that the the microstructural details are sufficiently topologically dense (see above), it is then the Pilling-Bedworth ratio (see above) which takes over control of the topological permeability due to cracks and fissures (unlike chemical permeability due to diffusion through a (ordered or disordered) crystal) of the surface oxide. According to Pilling Bedworth (PB) the volume ratio of the MgO-surface-oxide -to- the Mg-bulk is 0.81. The reduction of the molar volume of the surface oxide relative to the Mg (alloy) bulk induces cracks, fissures etc. resulting in an increase in the surface energy, microstresses and topological inhomogeneity by opening up diffusion paths between environment on the one hand and crack tip (oxide) and adjacent metallic bulk on the other. This is the practical origin why an increasing concentration of moisture in air (i.e. >30%) and aeration cells (local exterior elements) such as droplets and condensed humidity including the resulting oxygen concentration gradients at the oxide surface, i.e. $\delta c_{O2}$ or $\delta c_O^2$- destroy the MgO-film and leading finally to the formation of non-protective $Mg(OH)_2$ or a derivative. It explains why passivation of Mg toward more aggressive media containing large(r) quantities of excess hydrogen such as for pH<7 requires in the first place a modification of the MgO-surface film in that the PB-ratio is increased toward a value of 1 and/or above this value up to a certain threshold (beyond which the effect of an increasing PB-ratio becomes counterproductive, cf. PB of Mg(OH)$_2$) via an homogeneous distribution of the oxide-modifying and/or -stabilizing element with a topologically homogeneous distribution on an atomic length scale, i.e. normal to the surface projected to the environment to allow to be accordingly homogeneously incorporated in the resulting modified oxide and for tight growth of the surface film as is given by the law by Tamman for oxide growth, i.e.

$$d=(2kt)^{0.5}$$

where k being a constant and d=film thickness, of which the PB is defined following $$V(Mg_a-X_b-Y_c-Z_d)_e-O_f/V_{Mg} ne \text{-->} 1.0$$

and/or >1.0 where ne=non-equilibrium and X, Y and Z (capital letters) ternary, quaternary and quinternary alloying addition where b to d are suffixes according to homogeneous and/or stoichiometric distribution of element X, Y and Z in the (cation- sub-) lattice of the (mixed/alloyed) MgO-base surface oxide of which the ratio of overall cation to (see page 168) anion is denoted by suffix "e" and "f" here.

Evidently, (early, cf. the following pages) transition metals and metalloids are most effective in increasing the PB-ratio and the electron concentration in MgO (Tables 5 and 6). The PB-ratio provides an excellent concept for more protective MgO/Mg ratios toward unity, since the PB of Mg is smaller than 1, the MgO is non-conductive and provides an NaCl-type of crystal which allows cations with higher oxidation states such (see next page).

TABLE 5
Oxidation States of the Elements
PERIODIC TABLE OF THE ELEMENTS

Key to Chart: Atomic Number → 50; Symbol → Sn; 1981 Atomic Weight → 118.69 ± 3; Oxidation States → +2, +4; Electron Configuration → 18-18-4

| Group | 1a | 2a | 3b | 4b | 5b | 6b | 7b | 8 | 8 | 8 | 1b | 2b | 3a | 4a | 5a | 6a | 7a | 0 | Orbit |
|---|---|---|---|---|---|---|---|---|---|---|---|---|---|---|---|---|---|---|---|
| | 1 H +1,−1 1.00794±7 1 | | | | | | | | | | | | | | | | | 2 He 0 4.00260 2 | K |
| | 3 Li +1 6.941±3 2-1 | 4 Be +2 9.01218 2-2 | | | | | | | | | | | 5 B +3 10.81 2-3 | 6 C +2,+4,−4 12.011 2-4 | 7 N +1,+2,+3,+4,+5,−2,−3 14.0067±1 2-5 | 8 O −2 15.9994±3 2-6 | 9 F −1 18.998403 2-7 | 10 Ne 0 20.179 2-8 | K-L |
| | 11 Na +1 22.98977 2-8-1 | 12 Mg +2 24.305 2-8-2 | | | | | | | | | | | 13 Al +3 26.98154 2-8-3 | 14 Si +2,+4,−4 28.0855±3 2-8-4 | 15 P +3,+5,−3 30.97376 2-8-5 | 16 S +4,+6,−2 32.06 2-8-6 | 17 Cl +1,+5,+7,−1 35.453 2-8-7 | 18 Ar 0 39.948 2-8-8 | K-L-M |
| | 19 K +1 39.0983 -8-8-1 | 20 Ca +2 40.08 -8-8-3 | 21 Sc +3 44.9559 -8-9-2 | 22 Ti +2,+3,+4 47.88±3 -8-10-2 | 23 V +2,+3,+4,+5 50.9415 -8-11-2 | 24 Cr +2,+3,+6 51.996 -8-13-1 | 25 Mn +2,+3,+4,+7 54.9380 -8-13-2 | 26 Fe +2,+3 55.847±3 -8-14-2 | 27 Co +2,+3 58.9332 -8-15-2 | 28 Ni +2,+3 58.69 -8-16-2 | 29 Cu +1,+2 63.546±3 -8-18-1 | 30 Zn +2 65.38 -8-18-2 | 31 Ga +3 69.72 -8-18-3 | 32 Ge +2,+4 72.59 -8-18-4 | 33 As +3,+5,−3 74.9216 -8-18-5 | 34 Se +4,+6,−2 78.96±3 -8-18-6 | 35 Br +1,+5,−1 79.904 -8-18-7 | 36 Kr 0 83.80 -8-18-8 | -L-M-N |
| | 37 Rb +1 85.4678±3 -18-8-1 | 38 Sr +2 87.62 -18-8-2 | 39 Y +3 88.9059 -18-9-2 | 40 Zr +4 91.22 -18-10-2 | 41 Nb +3,+5 92.9064 -18-12-1 | 42 Mo +6 95.94 -18-13-1 | 43 Tc +4,+6,+7 (98) -18-13-2 | 44 Ru +3 101.07±3 -18-15-1 | 45 Rh +3 102.9055 -18-16-1 | 46 Pd +2,+4 106.4 -18-18-0 | 47 Ag +1 107.8682±3 -18-18-1 | 48 Cd +2 112.41 -18-18-2 | 49 In +3 114.82 -18-18-3 | 50 Sn +2,+4 118.69±3 -18-18-4 | 51 Sb +3,+5,−3 121.71±3 -18-18-5 | 52 Te +4,+6,−2 127.60±3 -18-18-6 | 53 I +1,+5,+7,−1 126.9045 -18-18-7 | 54 Xe 0 131.29±3 -18-18-8 | -M-N-O |
| | 55 Cs +1 132.9054 -18-8-1 | 56 Ba +2 137.33 -18-8-2 | 57* La +3 138.9055±3 -18-9-2 | 72 Hf +4 178.49±3 -32-10-2 | 73 Ta +5 180.9479 -32-11-2 | 74 W +6 183.85±3 -32-12-2 | 75 Re +4,+6,+7 186.207 -32-13-2 | 76 Os +3,+4 190.2 -32-14-2 | 77 Ir +3,+4 192.22±3 -32-15-2 | 78 Pt +2,+4 195.08±3 -32-16-2 | 79 Au +1,+3 196.9665 -32-18-1 | 80 Hg +1,+2 200.59±3 -32-18-2 | 81 Tl +1,+3 204.383 -32-18-3 | 82 Pb +2,+4 207.2 -32-18-4 | 83 Bi +3,+5 208.9804 -32-18-5 | 84 Po +2,+4 (209) -32-18-6 | 85 At (210) -32-18-7 | 86 Rn 0 (222) -32-18-8 | -N-O-P |
| | 87 Fr +1 (223) -18-8-1 | 88 Ra +2 226.0254 -18-8-2 | 89** Ac +3 227.0482 -18-9-2 | 104 Rf (260) -32-10-2 | 105 Ha (260) -32-11-2 | 106 (263) -32-12-2 | | | | | | | | | | | | | O P Q |

*Lanthanides:

| 58 Ce +3,+4 140.12 -20-8-2 | 59 Pr +3 140.9077 -21-8-2 | 60 Nd +3 144.24±3 -22-8-2 | 61 Pm +3 (145) -23-8-2 | 62 Sm +2,+3 150.36±3 -24-8-2 | 63 Eu +2,+3 151.96 -25-8-2 | 64 Gd +3 157.25±3 -25-9-2 | 65 Tb +3,+4 158.9254 -27-8-2 | 66 Dy +3 162.50±3 -28-8-2 | 67 Ho +3 164.9304 -29-8-2 | 68 Er +3 167.26±3 -30-8-2 | 69 Tm +3 168.9342 -31-8-2 | 70 Yb +2,+3 173.04±3 -32-8-2 | 71 Lu +3 174.967 -32-9-2 |

N O P

**Actinides:

| 90 Th +4 232.0381 -18-10-2 | 91 Pa +4,+5 231.0359 -20-9-2 | 92 U +3,+4,+5,+6 238.0289 21-9-2 | 93 Np +3,+4,+5,+6 237.0482 -22-9-2 | 94 Pu +3,+4,+5,+6 (244) -24-8-2 | 95 Am +3,+4,+5,+6 (243) -25-8-2 | 96 Cm +3 (247) -25-9-2 | 97 Bk +3,+4 (247) -27-8-2 | 98 Cf +3 (251) -28-8-2 | 99 Es (252) -29-8-2 | 100 Fm (257) -30-8-2 | 101 Md +2,+3 (258) -31-8-2 | 102 No +2,+3 (259) -32-8-2 | 103 Lr +3 (260) -32-9-2 |

O P Q

Numbers in parentheses are mass numbers of most stable isotope of that element

TABLE 6

Pilling-Bedworth ratios of Pure Elements and Range
of Oxidation States (from B. Chalmers,
Phys. Metallurgy, Wiley & Sons, N.Y. 1959, pp. 445;
O. Kubachewski and B. E. Hopkins, Oxidation of Metals
and Alloys, Academic Press, N.Y., 1962; H. H. Uhlig
and B. W. Revie, Corrosion and Corrosion Control,
Wiley & Sons, N.Y. 1985, pp. 190, i.e. ref.
141–143, and Table 5)

| Element | PB-ratio | Range of Oxidation States |
|---|---|---|
| K | 0.45 | +1 |
| Li | 0.57 | +1 |
| Na | 0.57 | +1 |
| Mg | 0.81 | +2 |
| Cd | 1.21 | +2 |
| Ce | 1.23 | +3/+4 |
| Al | 1.28 | +3 |
| Pb | 1.40 | +2/+4 |
| Ni | 1.52 | +2/+3 |
| Ag | 1.59 | +1 |
| Pd | 1.60 | +2/+4 |
| Cu | 1.68 | +1/+2 |
| Fe | 1.77 | +3 |
| Mn | 1.79 | +2 to +7 |
| Ti* | 1.95 | +2 to +4 |
| Cr* | 1.99 | +2 to +6 |
| Co | 1.99 | +2/+3 |
| Si* | 2.27 | +2/+4 |
| Ta* | 2.33 | +5 |
| Sb | 2.35 | +3/+5 |
| Nb* | 2.61 | +3/+5 |
| V* | 3.18 | +2 to +5 |
| W* | 3.40 | +6 | as Al, Ti, Ce and the other early transition and rare earth elements (see Tables 3 to 6) to modify the MgO to an n-conductor (N.B. the oxygen cations in the oxides of Table 4 are characterized by a redoxation state of $O^{--}$). This was confirmed by the observations in that 1. the representatives of simple early transitions and early rare earth metals Al, Ti and Ce have all proven to passivate Mg provided that homogeneity on an atomic scale is given due to an non-equilibrium matrix phase.
2. Li (and K and Na) cannot improve the PB-ratio of Mg and this is consistent with the poor corrosion resistance of one- and two-phase equilibria α- and (α+β)-MgLi alloys despite their topologically homogenous (disordered) distribution of Li-atoms in αMg and βMg on an atomic length scale.
3. The elements with resistance to form hydroxides provide the most effective-tool to close microcracks and fissures in MgO due to very large PB-ratios $R_{PB}$ becoming effective in a first approach via the role of mixtures and/or deviations from it by following $$R_{PB}=[(1-\alpha x) V_{MgO}+\alpha x V(Me_aO_b)]/[V_{Mg}+\Delta V_{Mg}ne]$$

where $V_{MgO}$ and $V_{Mg}$ as previously and $V(Me_aO_b)$ the molar volume of the oxide of an alloying element, $\Delta V_{Mg}ne= V_{Mg}ne-V_{Mg}$ the difference of the molar volume of the ne-phase and pure Mg and α being a coefficient describing the deviation from the role of mixtures in a certain composition range of interest.

Ultra-high purity was one factor to reduce the corrosion rate of AZ91 alloy castings down to 3 mpy (see above). If the alloying elements were distributed homogeneously as is possible by PVD, PA-splat cooling etc. (without) sufficient thermal stability) the resulting PB-ratio would eventually increase toward 1.0 so providing a higher non-permeability of the surface oxide and relaxing the conditions for alloy purity to arrive at the same results. The $H_2O_2$-solution applied in the invention provided an excellent test bed to discriminate the effect of MgO-oxide modification when the formation of corresponding hydroxide cannot be excluded (presence of $Cl^-$-ions, possibility to absorb water).

Figure 85:
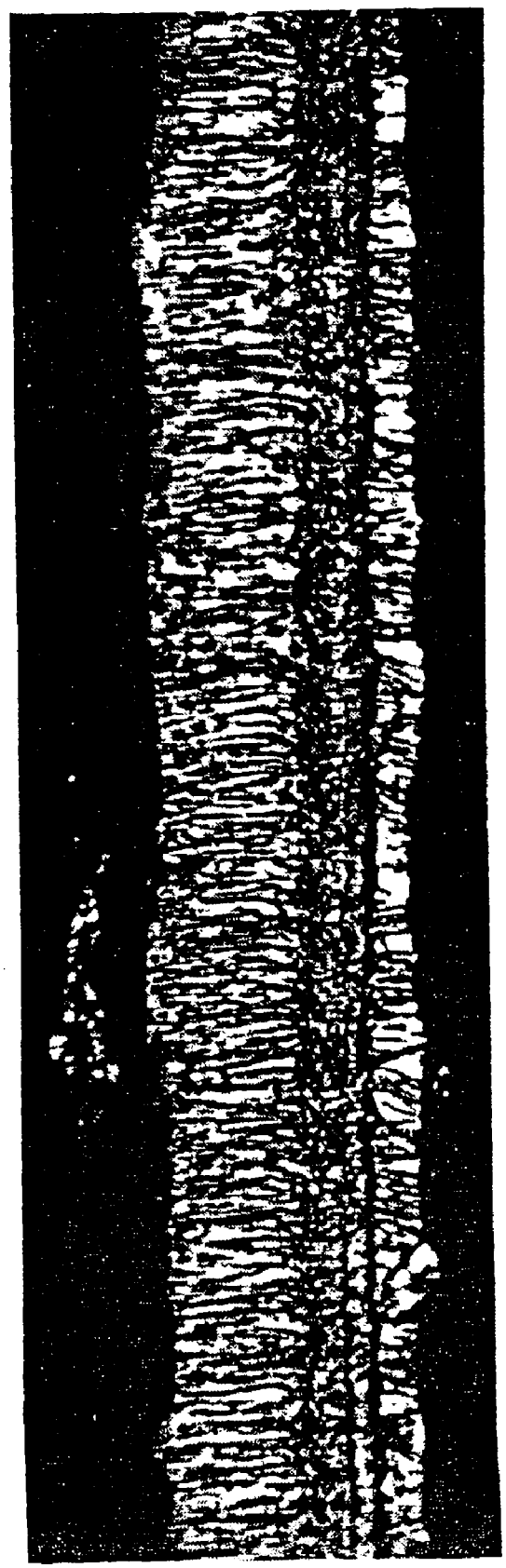
FIG. 85 Schematic showing effect of substitution of Mg and/or MgO in the surface film with higher valency-metal (here vanadium) and/or resulting oxide.

10.4 n-Conduction, Flexible Bonds, Amorphous Oxides The Pilling-Bedworth ratio is not the only microscopic=local criterion to accrue to passivation of (non-equilibrium) Mg-alloys. Its significance for equilibrium Mg-alloys stems from the non-conductivity of the NaCl-type of MgO-(surface) crystal. While the MgO-(surface) crystal is ideally non-conductive, the metallic Mg-bulk provides ideally free-electron conduction resulting in an increasing electrical field gradient with decreasing thickness of the MgO surface oxide film. Provided that a topological homogeneous surface oxide with PB-ratios around and/or above unity protects the metallic interior (i.e. without local elements outside, e.g. due to water droplets and/or inside due to noble second phases such as Fe-inclusions, for example), the substitution of Mg-atoms in the MgO-surface crystal lattice with alloying elements of valencies>2 (which is possible due to the stoichiometric NaCl-type of crystal structure) would reduce this gradient by an increasing electron concentration of excess-elements at the oxide surface, repelling $O^{--}$-ions there so reducing the (driving force for) diffusion of Mg-atoms to corresponding surface (cf. FIG. 85 ("84" was typing error) with schematic showing effect of substitution of Mg and/or Mg) in the surface film with higher valency-metal (here vanadium) and/or resulting oxide, i.e. introduction of n-conductance and reduced field gradients $\Delta\Psi/\Delta x$ for different PB-ratios indicating that both n-conductance and PB-ratios approaching 1 are complementary factors for passivation of bulk magnesium.) The ability to induce n-conduction is shown (table 4) by the smaller number of RE-, TM- and metalloid atoms compared to oxygen atoms per molecule (g*atom) of corresponding oxide, e.g. $TM_aO_b$ with a<b etc., since oxygen is (usually) divalent (in these oxides). Enhanced corrosion resistance by the introduction of n-electrons into the MgO-base surface film requires a topologically tight oxide with PB-ratio close(r) to or above unity, while the reduction of the electrical field gradient due to increasing $e^-$-concentration relaxes in turn the requirement for the topological tightness of this oxide so for PB-ratios versus optimum values.

Both factors are provided by the (combined) use of early transition, early (=light) rare earth metals (in particular Ce, see Table 3) and metalloids all providing high positive valencies (i.e. relatively large oxidation states so donation of electrons to the Mg(-based) surface oxide, cf. Tables 3 and 4), the rare earth elements with the advantage to provide high evaporation rate, the transition metals (,Ce) and metalloids with the supplementary advantage to suppress the (local) transformation of MgO to a hydroxide so enhancing the corrosion behavior of Mg in particular in more aggressive media (see above) as well as the particular advantage of the early transition metals (not readily alloyable to Mg due to liquid immiscibility) to provide a large number of oxides indicating high electron bond flexibility and/or susceptibility to substitute with Mg in the MgO-lattice. Khan and co-workers, for example, found that a mixture of Y, if and small amounts of Si provided superior protection against corrosive attack, where the small amount of Si was instrumental for a major improvement. From the hierarchy of parameters it is evident that the effect of rare earth metals to improve the corrosion resistance of Mg-alloys originates in microscopic parameters including the PB-ratio and/or an increased electron concentration in the MgO-surface oxide, both representing complementary rather than exclusive parameters (cf. Tables 3–6, as is with purity and the rest), while the overall δΔG-balance at the surface becomes more negative (less favorable) for protection in this alloy case. The hierarchy of instrumental parameters for passivation of magnesium thus suggests a combination of transition and rare earth metals as well as metalloids to be alloyed together to magnesium using PVD-methods and/or mechanical alloying. While productivity of the available production facilities is crucial for the selection of whether transition metals, rare earth metals and/or metalloids dominate the resulting alloy composition, the application (indoor or outdoor) decides over the more concrete level of individual alloying elements. Aviation, however, provides the largest readily available fuel saving potential by employing high performance Mg-alloys instead of conventionally processed aluminum alloys (FIGS. 141–144).

Alloy chemistry does not provide mobile anions and/or cations inside the alloy as is possible in an electrolyte in front of an alloy. Equivalent mobility inside the alloy (i.e. between microstructural cathodes and anodes) is only provided by electrons. However, impurities such as Ni and Fe do not act catastrophically ("though" being more noble than Mg) because they easily discharge $H^+$-ions, they act catastrophically because the MgO-surface oxide allows the Fe-agglomeration to create an electron underpressure (cloud) so electron suction driving positive $Mg^{++}$-atoms to the surface at a different site. This is only possible above a certain size (see Jones and Cotton, above). The opposite is with less noble elements (Ca, Sr, Ba) and resulting precipitates ($Mg_2Ca$) providing microgalvanic protection the other way around as was demonstrated in this invention by the improved resistance to corrosive attack of certain heat-treated Mg—Ca based splats after supersaturation of the cph-Mg matrix with an homogeneous distribution on an disordered atomic length scale. Surface precipitates with less noble corrosion and/or electrode potential than the (non-equilibrium) Mg-alloy matrix provide electrons to the Mg-based bulk increasing the free electron pressure onto the surface oxide. Again, this is only possible above a certain size. Already Newmann and co-workers have shown (W. H. Smyrl and J. Newmann, *J. Electrochem. Soc.* 123 (10), 1976, pp. 1423–1432) that for a given overall current density the distribution of current density on a conducting particle if a non-conducting matrix depends only on geometrical factors following $$I \pm I_{overall}/[2\pi(1-r^2/a^2)^{0.5}]$$

where r=particle radius and a=position on particle with regard to particle center.

Therefore microcathodic protection by $Al_2Ca$-type of surface precipitates is most effective once such precipitates have formed and becomes less effective with increasing size of the surface precipitates (see invention, above). With enhanced n-conduction of the MgO-based surface oxide the effect of (refined) Fe- (and Ni etc.) impurities including their distribution on an atomic length scale will change and the result will primarily depend on the question whether the MgO-based surface oxide is more stable over the competing $Mg(OH)_2$-derivative or not, all de-pending on segregation-free, but alloyed microstructure, overall alloy chemistry and environment. Fine-scale microcathodic protection may therefore neutralize the entire effect of impurities providing a useful supplement to stabilize surface oxide(s). "Microgalvanically" less noble (surface) precipitation (in the above sense) provides an ideal supplement to reduce the tendency of Mg-atoms to diffuse to the surface where $O^{--}$-ion are otherwise waiting for it including the case when this oxide provides n-conduction due to incorporation of elements such as Ti, Ce, Al and other (early transition and/or rare earth) metals belonging to their groups. The efficiency to contribute to n-conduction by microcathodic surface precipitation, however, depends on the freedom to modify the effect of an non-deliberately added alloying element such as Fe being prone to $H^+$-ion discharge rather than improving the MgO-oxide including content and size of the Fe (-inclusion). The efficiency increases with how the other factors of the hierarchy of relevant criteria (the latitude of which being enormously increased by alloy synthesis with fragmentation on an atomic length scale) allow it to do so.

11. Intermediate Alloy Summary

The significance of higher order extended solid solutions with regard to passivate the surface of magnesium alloys lets to claim the following groups of more complex Mg-alloys:

1. Mg-RE-plus alloying additions for (partial) precipitation in order to improve the Hall-Petch-relationship including proportionality constant $k_y$ and intercept $\Delta\sigma_0$ via selected conditions of thermo-mechanical processing:
   1.1. Mg-RE-Al
   1.2 Mg-RE-alkaline earth (Ca, Sr, Ba)
   1.3. Mg-RE-Zn
   1.4. Mg-RE-metalloids (Si, Ge, B, Sb etc.)
   1.5. Mg-RE-Al-alkaline earth (Ca, Sr, Ba), where Al=2 to 3*AE and AE<<RE
   1.6. Mg-RE-Al-metalloids
   1.7. Mg-RE-Al-transition metals (TM, eg. Zr, Mn), where Al=2 to 4*TM and TM<<RE
   1.8. As for 1.1. to 1.7., but using defined misch-metals instead of individual RE.
2. Commercial alloy compositions with and without the complementary additions to Mg-RE as to 1.1 to 1.8.
3. Mg-RE as for 1, but using
   3.1. Mg-RE-TM, where RE>TM
   3.2. Mg-RE-Al-TM as for 1.7, but using one or more individual TM
   3.3. Mg-RE-Al-TM-metalloid, where Al>TM>metalloid and TM represent one or more than one individual TM
   3.4. As for 3.1. to 3.3., but using defined misch-metals instead of individual RE.
4. As for 3.1 to 3.4., but keeping the higher order additions essentially in solid solution of cph-Mg.
5. Mg-TM based alloys with the transition metals held in the extended solid solution 5.1. Mg-TM-RE
   5.2. Mg-TM-Al
6. Mg-TM-TM
7. Mg-TM-TM-RE
8. Mg-TM-TM-Al
9. Mg-TM-Al-metalloids
10. Mg-TM-Al-AE
11. Mg-TM-Al-RE, where Al>RE and TM>>Al
6. Mg-metalloid based alloys with the metalloids held in extended solid solution. From mechanical alloying it is known that boron increases the crystallization temperature of amorphous $Fe_{75}Zr_{25}$ from 450° to 550° C. Evidently, metalloids in Mg-based ne-phases provide thermally very stable transformation temperatures so a basis to built up corresponding alloys. The selection of higher order additions to Mg-metalloid based ne-alloys can take advantage of the results obtained by mechanical alloying of Mg-10Ti-5B alloys (cf. below):
   6.1 Mg-met
   6.2 Mg-met-TM
   6.3 Mg-met-RE 6.4 Mg-met-TM-TM
6.5 Mg-met-TM-RE
6.6 Mg-met-TM-Al
6.7 Mg-met-TM—TM-RE
6.8 Mg-met-TM-RE-Al.

The more concrete compositions derived from the aforementioned observations are given in the $5^{th}$, $6^{th}$ and $9^{th}$ Embodiment.

12. Identification of Continuous Production Techniques

2. Principal

RSP renders useful elements in magnesium more effective via microstructures not obtainable by conventional means. The universal consequence of RSP is the increased microstructural homogeneity underlying all improvements achieved by advanced solidification methods to date. However, processing has yet not reached out to control this homogeneity on the atomic length scale including the absence of microsegregations and porosity which were both underestimated and/or ignored with regard to the need of the passivation of magnesium and its alloys. Microstructural control on the atomic length scale are possible by:

1. Marginal stability sustained by a large temperature gradient across the liquid-solid interface (cf. F. Hehmann and P. Tsakiropoulos, Microstructural Modelling of Lazer Glazing, Gas-Atomization and Spray Forming for the Development of Magnesium Alloys, Conf. Proc. Magnesium Alloys and Their Applications, DGM, Oberursel, October 1992)
2. Absolute stability sustained by very high front velocities (RSP) in combination with capillarity effects at the liquid-solid interface (cf. F. Hehmann, F. Sommer and B. Predel, Extension of Solid Solubility in Magnesium by Rapid Solidification, Mat. Sci. Engng. A125 (2), 1990, pp. 249–265)
3. Solute trapping achieved by both high front velocities and a relatively low liquid diffusivity due to increased viscosity etc. (cf. F. Hehmann, F. Sommer and B. Predel, Extension of Solid Solubility in Magnesium by Rapid Solidification, Mat. Sci. Engng. A125 (2), 1990, pp. 249–265)
4. Condensation of alloy vapors.

The laboratory-scale discontinuous methods used in the invention have shown the limitations for 2. and 3. with regard to continuous production of metastable phases, i.e. an ubiquitous inefficiency to suppress microsegregations unless the most extreme conditions available for fragmentation and heat extraction were applied. From microstructural modelling it is evident (see F. Hehmann and P. Tsakiropoulos, Microstructural Modelling of Lazer Glazing, Gas-Atomization and Spray Forming for the Development of Magnesium Alloys, Conf. Proc. Magnesium Alloys and Their Applications, DGM, Oberursel, October 1992) that principal 1. is impractical for the production of the desired microstructures due to the high required temperature gradient/low velocity of the growth fronts concerned.

Any control of microstructural homogeneity on an atomic length scale including the absence of microsegregations and porosity requires an outstanding degree of control over the applied non-equilibrium process in order to control the reproducibility of an extreme departure from equilibrium. The two principal axes to be explored are represented by (i) most effective heat extraction and by (ii) the highest possible degree of fragmentation and (iii) methods that couple improvements in both directions. Rapid solidification from the liquid requires to explore primarily the possibilities to increase heat extraction for a useful degree of fragmentation which is not explicitly and/or precisely predictable, while rapid solidification from the vapor phase incorporates already the ultimate degree of fragmentation so degrading heat extraction capacity to a question of secondary importance for the control of vapor technology. Vapor deposition is free of the constraints set by solidification kinetics of a liquid so immediately subjected to the available degree of productivity and quality of the processing method concerned. Both vapor deposition and mechanical alloying can be run semi-continuously or continuously depending on alloy quantity and/or productivity employed and/or required as well as on the applied processing principles and how these principles are rendered operational.

3. Liquid Processing at its Extrema 12.2.1 "Atomization"

Not only are conventional ingot metallurgy and casting methods, but also almost all (inert) gas atomization methods for the production of powders not potent to produce the required non-equilibrium microstructures of Mg-(light) RE-metal based alloys. Hehmann showed (F. Hehmann, Terminal Solid Solubility Extension in Magnesium by Rapid Solidification, Proc. 47th Int. Magnesium Conference, May 29–31, 1990, Cannes, Int. Mag. Association, VA, pp. 76–82) that the observed sharp microstructural transition from the supersaturated chill zone to dendritic growth at a cross-sectional thickness 30 out of 150 $\mu$m requires an initial undercooling of at least 150 K in order to result in 30% of recalesced partitionless growth and resultant supersaturation of the light rare earth elements La, Ce, Pr and Nd in cph-Mg.

Levi et al. have shown (O. Salas and C. G. Levi, Int. J. of Rapid Solidification 4, 1988, pp. 1–21), however, that initial undercoolings above 150 K are available by the electrohydrodynamic (EHD) atomization method. EHD-atomization is run continuously by a using a wire-type of feed-stock molten by a laser beam. The particle size distribution of EHD-atomized powders ranges from some nm to up to 100 $\mu$m. The available minimum of the upper level of the particle size distribution is about 5 $\mu$m (P. Tsakiropoulos, priv. communication, 21 Jul., 1994). Al—Fe alloy droplets were observed to require a degree of fragmentation down to 200 nm to yield 100% volume fraction supersaturated microstructure by partitionless solidification. The maximum of frequency of the particle size distribution was at around one micron. That is that this method would allow for about 20% overall volume fraction of partitionless growth (as for the PA-splats used in the invention) of Al—Fe base powders clearly showing that even the extreme conditions of EHD-processing are not sufficient in order to obtain a segregation-free overall microstructure in Al—Fe base powders.

As for Al-alloys (cf. O. Salas and C. G. Levi, Int. J. of Rapid Solidification 4, 1988, pp. 1–21), it was evident that the volume fraction of segregation and dendrites at the chill-off side of liquid-quenched Mg-base thin foils, ribbons and powders decreases primarily with increasing solid solubility at equilibrium and the resulting increase in partition coefficients $k_0(T)$ (cf. F. Hehmann, F. Sommer and H. Jones, Extension of Solid Solubility of Yttrium and Rare Earth Metals in Magnesium by Rapid Solidification, Processing of Structural Metals by Rapid Solidification, eds. F. H. Froes and S. J. Savage, American Society for Metals, Metals Park, Ohio, 1987, pp. 379–398; F. Hehmann, F. Sommer and B. Predel, Extension of Solid Solubility in Magnesium by Rapid Solidification, Mat. Sci. Engng. A125 (2), 1990, pp. 249–265; F. Hehmann and P. Tsakiropoulos, Microstructural Modelling of Lazer Glazing, Gas-Atomization and Spray Forming for the Development of Magnesium Alloys, Conf Proc. Magnesium Alloys and Their Applications, DGM, Oberursel, October 1992; F. Hehmann, Terminal Solid Solubility Extension in Magnesium by Rapid Solidification, *Proc. 47th Int. Magnesium Conference*, May 29–31, 1990, Cannes, Int. Mag. Association, VA, pp. 76–82; F. Sommer, F. Hehmann and H. Jones, Transformation Behaviour of the Extended Solid Solution of Yttrium in Magnesium by Rapid Solidification, *J. Less Common Metals* 159 (1990), pp. 237–259). Alloy systems like Mg—Nd and Mg—Sm (or corresponding misch-metals like a Nd-base MM), however, should be suitable candidates for partitionless growth in about 100% volume fraction of the overall powder, since there partition coefficients $k_0(T)$ are about one order of magnitude larger than for the Al—Fe system.

12.2.2 Melt Spinning and Planar Flow Casting

Melt spinning (MS) and planar flow casting (PFC) are continuous production methods of the chill-block type of liquid quenching methods. Their characteristics include a more effective heat extraction compared to gas atomization methods so allowing for wider cross-sections of partitionless growth or larger growth normals of metastable one-phase solidification structures (cf. BRIEF SUMMARY OF THE INVENTION) than obtainable by atomized powders solidifying in flight.

A discussion of the operative heat transfer coefficients h showed, however, that splat cooling techniques provide much larger h-values than MS-techniques (F. Sommer, J. Wachter, *J. Rapid Solidification* 3, 1988, pp. 223–236). It is therefore inevitable to identify the methods to maximize h for MS- and PFC techniques and to constrain fluid flow in such a way that the maximum growth normal is limited to the extend of the growth normal of the required metastable one-phase solidification structure. In free jet MS, no such constraints are imposed to the melt puddle between nozzle and rotating wheel (cf. M. J. Couper and P. F. Singer, Rapidly Solidified Aluminium Alloys for Advanced Engineering Applications, *Rapid Solidification Technology*, eds. T. S. Sudarshan and T. S. Srivatsan, Technomic Publishing Co., Inc., Lancaster, Basel, 1993, p. 274) and the thickness of the ribbon is to a large extend dictated by the employed wheel surface velocity. More extreme conditions of rapid solidification are affordable by PFC(S. K. Das, D. Raybould, R. L. Bye and C. F. Chang, U.S. Pat. No. 4,718,475, January 1988) including constraint melt puddles and improved control upon resultant ribbon dimensions (thickness and width). PFC is performed by using a rectangular slot orifice used as a casting nozzle in close proximity to the rotating chill wheel. A shroud allows a jet of inert gas to stabilize the shape of the molten pool of metal on the rotating chill block (S. K. Das, D. Raybould, R. L. Bye and C. F. Chang, U.S. Pat. No. 4,718,475, January 1988), while a scraper is used behind the melt puddle to reduce the gas film between liquid and wheel so improving contact and heat transfer. Furthermore, the melt puddle is confined to the gap left between planar orifice and chill so arriving at smaller thicknesses and larger widths of the resultant ribbons than is possible by free jet-casting or melt-spinning.

According to the invention, the metastable growth normal of the required extended solid solutions of (light) RE metals in cph-Mg by chill-block quenching methods is of the order of 20 $\mu$m (see above). It was therefore necessary to identify the processing conditions required to improve heat extraction and constraints imposed on the size of the melt puddle relative to the conditions usually applied to this processing family so to allow for metastable growth normals of the order of 20 $\mu$m. For comparison, Rohklin et al. reported (Rohklin, T. V. Dobatkina, I. G. Korol'kova and Yu. N. Grin, *Russ. Metall.* 5, (1991), p. 182–185) dendritic growth traversing the entire cross-section of melt-spun Mg—La ribbon without showing any supersaturated cph-Mg-base solid solution at all by employing an estimated cooling rate of $10^5$ K/s.

MgRE-ribbons of width 2 mm and of thickness 20 $\mu$m were made in an helium atmosphere at a wheel surface speed 4–5000 rpm*$\pi$d, where d=diameter 30 cm of a Cu-wheel of surface finish 1 $\mu$m to maximize heat extraction by the chill. Such conditions were considered to result in cooling rates of the order of $10^6$ K/s (K. Schild, *Doctoral Thesis*, University of Stuttgart, 1985; H. R. Hilzinger and S. Hock, *Proc. Conf. Metallic Glasses: Sciences and Technology*, Budapest, 1980, p. 71). The distance between nozzle orifice and rotating wheel surface was limited to 2 to 2.5 mm in order to simulate near-PFC-conditions. A columnar microstructure was found to traverse almost the entire cross-section of the resulting ribbons indicating that a positive temperature gradient was maintained when the solidification front traversed the cross-section of the ribbon as for the vapor deposits of this invention (cf. FIG. 84 vs. FIG. 48 (top), where FIG. 84 showing optical microstructure of melt-spun Mg-17.3 wt. % Ce ribbon showing columnar grains, here traversing a substantial part (i.e. about 75%) of the cross-section of thickness 20 $\mu$m and trapping a more equiaxed microstructure along the center line of the ribbon. Magnification: 1200:1). That is, that recalescence did not control the formation of the microstructure, though some second phases were found to delineate the columnar grains. Consequently, DSC-analysis of the transformation behavior of supersaturated cph-Mg-RE-ribbons was not interfered with endothermal dissolution effects stemming from a pronounced segregated dendritic zone and forming the major proportion of PA-splats, for example (see above).

Figure 86:
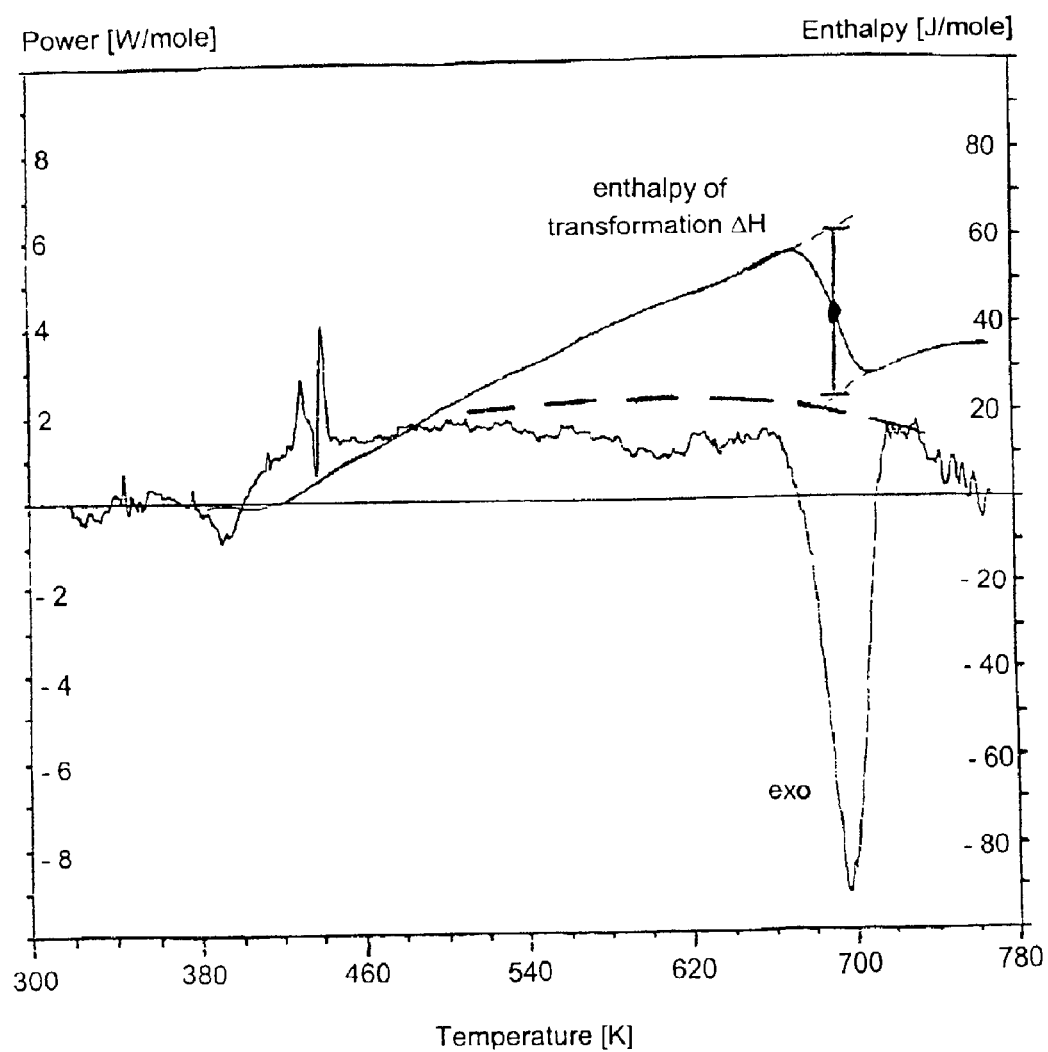
FIG. 86 Difference scan of two successive DSC-analyses of melt-spun Mg-17.3 wt. % Ce ribbon of thickness 20 $\mu$m showing exothermal peak effect at around 425° C. (698 K) and a relatively weak exothermal spectrum with respect to the baseline (dotted line).

Ribbons with larger levels of rare earth elements (i.e. >10 wt. %) exhibited a relatively large exothermal peak at around 400° C. depending on the heating rate employed. FIG. 86 shows an exothermal peak-effect of as-spun Mg-17 Ce alloy at 422° C. (note that the exothermal effects are plotted downwards in this particular case) by employing a heating rate of 40 K/min and using a Perkin-Elmer DSC 2. The enthalpy of transformation of this exothermal effect amounts to 400 J/mole. This of the order of magnitude of corresponding effects in the system Mg—Y where they represent the transformation of the supersaturated solid solution of yttrium in cph-Mg into the equilibrium phases cph-Mg and $Mg_{25}Y_4$ (F. Sommer, F. Hehmann and H. Jones, Transformation Behaviour of the Extended Solid Solution of Yttrium in Magnesium by Rapid Solidification, *J. Less Common Metals* 159 (1990), pp. 237–259). In rapidly solidified Mg—Y alloys relatively large exothermal effects were observed at 150° to 280° C. and they were identified to represent the formation of the hardening intermediate phase $\beta''$ and of $\beta'$ (cf. F. Sommer, F. Hehmann and H. Jones, Transformation Behaviour of the Extended Solid Solution of Yttrium in Magnesium by Rapid Solidification, *J. Less Common Metals* 159 (1990), pp. 237–259).

Melt-spun ribbons of Mg-(light) RE alloys, however, did not show such low temperature effects when made under the above conditions. As-spun Mg-17 wt. % Ce ribbon showed a rather flat exothermal spectrum instead as it was observed for vapor deposited Mg-RE alloys (see above) indicating a low transformation activity in this temperature range (FIG. 86). As for VD Mg-RE deposits of columnar microstructure, the major transformation of the supersaturated solid solution of RE (Ce) in cph-Mg occurred at temperatures>400° C. The absence of larger exothermal effects at and below 290° C. for the columnar microstructure of the melt spun ribbons shows the possibility of alloy conversion of the extended solid solution of (light) RE in cph-Mg continuous ribbons into the final product at this and lower temperatures and without the (further) formation of interfering intermediate and/or equilibrium phases.

Alloy compositions to be employed, however, should be kept simple and/or involving partitions coefficients near unity (i.e. =1) to avoid excessive formation of microsegregations increasing the alloys' susceptibility to natural aging processes.

12.2.3 Laser Beam Surface Melting

It is evident from more recent microstructural modeling (cf. F. Hehmann, F. Sommer and B. Predel, Extension of Solid Solubility in Magnesium by Rapid Solidification, *Mat. Sci. Engng.* A125 (2), 1990, pp. 249–265; F. Hehmann and P. Tsakiropoulos, Microstructural Modelling of Lazer Glazing, Gas-Atomization and Spray Forming for the Development of Magnesium Alloys, *Conf. Proc. Magnesium Alloys and Their Applications*, DGM, Oberursel, October 1992; F. Hehmann, Terminal Solid Solubility Extension in Magnesium by Rapid Solidification, Proc. *47th Int. Magnesium Conference*, May 29–31, 1990, Cannes, Int. Mag. Association, VA, pp. 76–82; M. Müller, J. Wachter and F. Sommer, *Proc. Conf. Mg-Alloys and Their Applications*, eds. B. L. Mordike and F. Hehmann, DGM, Oberursel, Oct. 1992, pp. 527–534; M. Carrard, M. Gremaud, M. Zimmermann and W. Kurz, *Acta metall. mater.* 40 (5), 1992, pp. 983–996) that the available fragmentation within the regime of liquid processing does not allow for growth of substantial volumes or volume fractions of the desired metastable one-phase cph-Mg base solid solutions even under extreme conditions of heat transfer. The required material is only available instead in form of thin layers due to the limitations imposed by recalescence, while the chill-off side even of finely divided volumes shows dendritic structures, especially when the operative partition coefficient is small (for eutectic phase diagrams, i.e. <<1) or very large (for peritectics, i.e. >>1).

An enhanced response to anodic polarization was reported for the solid solution of 2.7 wt. % Zr in cph-Mg made by laser cladding on pure magnesium and resulting in improved resistance to corrosion as compared to alloy AZ91B, for example, by employing a beam withdrawal speed of 6.35 mm/sec (R. Subramanian, S. Sircar and J. Mazumdar, *J. Mat. Sci.* 26, 1991, pp. 951–956). The advantage of laser or electron surface beam melting or traversing is that the solidification front velocity is directly coupled so controlled by the withdrawal speed (see W. Kurz and D. J. Fisher, *Fundamentals of Solidification*, Trans Tech Publications 1989, Switzerland, Germany, UK, USA, 3rd edition, 1989). In contrast to all other RSP-methods from the melt, laser surface processing does not involve a nucleation barrier so resulting in epitaxial growth of the (re-) molten layer on the solid underlayer. Systematical experimental work has resulted in microstructural selection diagrams showing (cf. H. Jones, *Metallurgical Science and Technology* 7 (1) 1989, pp. 63–75; H. Jones, *Mat. Sci. Engng* A137, 1991, pp. 77–85) that the velocity required for the formation of segregation-free solids (and solid surfaces) increases with decreasing partition coefficient for eutectic binary alloys such as Al—Cu, Al—Mn and Al—Fe and ranging from some mm/sec to up to 2 m/sec or more. Excellent agreement was also reported between predicted and actual velocities of the order of 2.5 to 3.2 m/s for the formation of an extended solid solution of strontium in cph-Mg by processing without nucleation barriers such as by using a laser technique (F. Hehmann, F. Sommer and H. Jones, Extension of Solid Solubility of Yttrium and Rare Earth Metals in Magnesium by Rapid Solidification, *Processing of Structural Metlas by Rapid Solidification*, eds. F. H. Froes and S. J. Savage, American Society for Metals, Metals Park, Ohio, 1987, pp. 379–398; F. Hehmann and P. Tsakiropoulos, Microstructural Modelling of Lazer Glazing, Gas-Atomization and Spray Forming for the Development of Magnesium Alloys, *Conf. Proc. Magnesium Alloys and Their Applications*, eds. B. L. Mordike and F. Hehmann, DGM, Oberursel, Oct. 1992). Also the mechanical properties can be improved by the formation of quasieutectic and/or banded (cf. R. K. H. Kalimullin and A. T. Berdnikov, *Zashch Met.* 22 (2), 1986, pp. 262–264; R. K. H. Kalimullin, V. V. Valuev and A. T. V. Bernikov, *Metalloved Term. Obrab. Met.* 9, 1986, pp. 39–40; R. K. H. Kalimullin, V. B. Spiridonov, A. T. Bernikov, A. A. Romanov and G. N. Pantikina, *Metalloved Tern. Obrab. Met.* 5,1988, pp. 18–24) microstructures which occur at sufficiently high levels of (complex) alloying or somewhat lower withdrawal speeds of the laser or electron beam. Kalimullin et. al. reported (P. Bach, *PhD Thesis*, Nancy, 1969; R. Karney and G. Sachs, *Z. Phys.* 49 (1928), p. 480; F. E. Hauser, P. R. Landon and J. E. Dorn, *Trans. ASM* 50, 1958, p. 856) laser surface treatment of Mg-8 Li-5 Al-4 Cd-1 Zn-0.4 Mn alloy [wt. %] (soviet designation MA21) to improve resistance to (i) creep and to (ii) corrosion (one order of magnitude in 3% NaCl solution) due to a fine quasi-eutectic surface structure. The microhardness of laser treated binary Mg-8Li alloy was found to increase by 40% over corresponding underlayer and by more than 600%, if prior-cladded with pure Al (K. Schemme, *Doctoral Thesis*, University of Bochum, 1993).

The readily available alloys to explore improved mechanical and corrosion properties by thin surface films of metastable microstructures according to the invention include laser or electron beam surface remelting or traversing of commercial alloys AE41, AE42, QE22, EQ21, ZE41, EZ33, EZ32, WE43, WE54, but also AM-, AS- and AZ-type of Mg-base engineering alloys, since Al (cf. F. Hehmann, H. Jones, F. Sommer and R. G. J. Edyvean, Corrosion Inhibition in Magnesium-Aluminium Based Alloys Induced by Rapid Solidification Processing, *J. Mater. Sci.* 24, 1989, pp. 2369–2379; G. Neite, K. Kubota, K. Higashi and F. Hehmann, *Mg-Based Alloys*, in: *Structure and Properties of Nonferrous Alloys*, ed. K. H. Matucha, Vol. 8 of Encyclopedia *Materials Science and Technology*, eds. R. W. Cahn, P. Haasen and E. J. Krämer, VCH Weinheim, P.O. Box 10 11 61, D-6940 Weinheim, RFA, October 1996) and Mn (see FIG. 87 showing as-solidified PA Mg-6.0 wt. % Mn splat a) prior to and b), c) after 2 h immersion in 5% ($0.3H_2O_2$)–1% NaCl aqueous solution as to the modified Machu-test with a) and b) showing the side of the dendritic chill-off zone and c) that of the featureless chill-zone. While the latter remained essentially unaffected, the chill-off side was obscured by pitting corrosion, see b)) were also found to improve surface passivity within certain microstructural limits. Particularly, the surfaces of the RE-metal containing Mg-base engineering alloys should be less susceptible to natural aging or even immune as compared to Mg—Li base alloys subjected to laser surface treatments (cf. E. F. Emley, *Principles of Magnesium Technology*, Pergamon Press, 1966; F. Hehmann, *METALL* 5, 1994, pp. 377–381).

They are also prime candidates for the extended solid solutions involving more than one alloying element with the possibility to form an active-to-passive transition as for VD MgAlW-alloys and for Cr-steels, for example (cf. page 117).

12.3 Vapor Deposition

From the invention it is evident that a segregation-free microstructure and not the choice of the alloying composition is the crucial factor to achieve a substantial improvement in the corrosion resistance of the Mg-alloy matrix including passivation of the MgO-surface oxide film. The effect of most attractive alloying elements was yet obscured, however, due to their immiscibility in liquid magnesium and due to unfavorable solidification kinetics. Both problems are interrelated with each other (i) via the need for processing without recalescence and (ii) via the dilemma that no process including solid state synthesis methods exists on earth which provides the required control and productivity. That is, both problems are faced with a strategic dilemma in order to arrive at outstanding light alloys the world is waiting for. Insofar it is evident from the invention that a productive method which decouples the synthesis of magnesium with light rare earth and/or early transition metals and/or metalloids from solidification kinetics including the partition coefficient $k_0$ would be the solution with regard to corrosion resistance of light alloys and superior strength, ductility and toughness. Alloy compositions can be more complicated then without restrictions imposed by partition coefficients far away from unity (i.e. $k_0(eut.) \ll 1 \ll k_0(per.)$) so to avoid excessive formation of microsegregations which increase the alloys' susceptibility to natural aging processes (L. Y. Wei and G. L. Dunlop, *Conf. Proc. Magnesium Alloys and Their Applications*, eds. B. L. Mordike and F. Hehmann, DGM, Oberursel, October 1992, pp. 335–342) and which are particularly damaging to passivity and/or damage tolerance of magnesium alloys. Vapor deposition integrates the 4 historical development philosophies for Mg-alloys in one alloy synthesis operation:

1. Highest possible quenching rates ($>10^{10}$ K/s) combined with Ultra-Homogeneity (UH), i.e. homogeneity on an atomic length scale due to condensation of monoatomic (or cascades of atoms of) metallic gases, which embrace an infinitely small heat of transformation (=sublimation or condensation). RSP-engineering alloys quenched from the liquid show not much more than a volume fraction of 20% UH in corresponding chill zone. A 100% UH-type of microstructure is the origin of superior=tailorable property profiles of PVD-Mg-alloys without which no sustainable wrought Mg-market can be established.
2. It opens a universe of new alloying possibilities ($>10^{100}$) including Li-equivalent ultra-light surface oxide-modificators such as Be and Bor. The ineffective use of expensive alloying constituents such as Ag, rare earth metals and yttrium, which were the final approach via conventional ingot metallurgy to make Mg competitive, can be replaced by a more efficient use of these and all other elements including those with restricted solubility in the solid state due to the formation of strong compounds suppressing equilibrium solubility (see above), but also in the liquid alloy phase due to the formation of large immiscibility gaps with more than twenty important elements such as Be, B, Ti, V, Cr etc.
3. Ultrapurity due to adaptability of the process to the partial vapor pressure of elements employed (and which represent a free-of-charge supplement vs. Conventional high purity technology). This renders total recycling possible and avoids simultaneously catastrophically acting impurities such as Fe & Ni which can destroy passivating surface films.
4. Items 2.–4. make laborious and expensive surface protection schemes (prone to cause dangerous and difficult-to-handle waste) redundant and reduces macrogalvanic corrosion more effectively than suggested by the difference in the actual Galvani-potentials concerned.

Therefore, vapor deposition is superior to chill-block quenching methods such as PFC. A productive, i.e. economically viable VD-method to produce controlled alloy compositions, however, has yet not been developed, although it could be immediately employed for more conventional, i.e. established E-type of Mg-alloys series where the use of RE-metals concentrates on improved elevated temperature properties via T-stable phases separated from melt and/or from the solid by precipitation. If these alloys were made by VD, however, an effective precipitation via the solid state alone and in underaged condition could be provided that is more stable due absence of nuclei triggering microstructural transformations at lower temperatures and simultaneously retaining sufficient passivation e.g. by extended solid solubility (cf. above).

Novel alloy compositions are currently the prime objective of VD-development instead without addressing the basic problems sufficiently including productivity, yield and quality of the resultant massive preforms. For magnesium, Bray et al. reported (D. J. Bray, R. W. Gardiner, B. W. Viney and H. M. Flower, *Conf. Proc. Magnesium Alloys and Their Applications*, DGM, Oberursel, FRG, 1992, pp. 159–166; D. J. Bray, R. W. Gardiner and B. W. Viney, GB-Patent 2,262, 539 A, 23 Jun., 1993) thermal evaporation by using an electron gun as the heating supply source for the high-melting component. This method is 1. an uncontrolled evaporation method driven by a relatively unproductive temperature gradient providing the driving force for the deposition of the vapor trajectories between evaporation surface and chilled substrate and/or deposit and resulting in 2. pan cake-shaped deposits and 3. relatively low yield of the deposited fraction compared to the overall evaporated vapor.

Both magnesium as the base metal and the (light) RE-metals have relatively low vapor pressures providing an attractive alloy chemistry for economically viable products by a vapor deposition method employing the relatively inexpensive sources of resistance and induction heating in conjunction with:

1. controlled evaporation and deposition characteristics including productivity due to a high vapor throughput, a continuous vapor throughput independent on the discrete charge per operative crucible and per operative substrate,
2. a high vapor yield and
3. a controlled geometry of the resultant deposit. so to replace Al and Zn in Mg—Al-base alloys including the rapidly solidified magnesium alloy EA55RS by passive magnesium engineering alloys and superceding current developments.

Part II of the Invention: New Vapor Deposition Process

Until today, no evaporation process has been developed for the production of economically viable materials from the vapor phase such as via vapor deposition, which (naturally) controls (large quantities of) vapor throughput including its physical state, i.e. concentration, temperature and pressure. What is invented here is a continuous vapor deposition process of which the driving force for gravity independent mass transport from evaporation source(s) to deposit(s) is provided by an external pumping system and of which the actual overall throughput Q, is controlled, for a given pumping speed S, by at least one heated, heatable and/or superheated (with respect to vapor temperature) interface (membrane) which separates (cf. schematic in FIG. 88):

a) two adjacent evaporation chambers n and (n+1) containing at least one individual evaporation source each or
b) an evaporation chamber n with at least one individual evaporation source and a mixing chamber (n+1) containing no or at least one individual evaporation source or
c) an evaporation chamber as under a) or b), but followed by a chamber providing a facility for the deposition of the vapor and which follows into the direction of vapor flow lines (vapor trajectories), allowing local driving forces to be controlled by vapor pressure, all of the solutions a) through c), however, employing interfaces (membranes) which are characterized as following:

a) the interface generating a profile of at least one discontinuous pressure gradient ($\Sigma^{N}_{i+1}(dP_i/dx_i)$), where N=n, n+1, n+2, n+3, . . . . n+k between the at least one evaporation source and/or the at least one substrate provided for vapor deposition of the alloyed and/or unalloyed (i.e. essentially pure elemental) vapor of the vapor deposited alloy of the required resultant, final overall composition, while the at least interface one interface is constructed in such a way that it takes over the function of a diaphragm used in nature for the osmosis (for analogy reasons, the term "osmosis" is used here (if not otherwise) for controlled separation of matter via means of a new class of membranes, the separation being driven by forced convection:--->Definition: osmosis is referred here to the selection and/or transfer of a controlled quantity of vapor mass and/or gaseous matter without selection of the components involved in the vapor and/or gas traversing the membrane. While classical osmosis is triggered by chemically different solutions being separated via a semipermeable diaphragm building up a chemical pressure against the pressure provided by the height of the solution, the new process is based upon forced convection resulting from the under pressure between adjacent vapor chambers being sufficient to overrun increasing temperatures) of liquids or in technology applied to the separation of chemical constituents, but here without the need for and/or without actual change of composition of the vapor (s) and used for the synthesis of metallic gases or vapors and the interface is being called diaphragm in the following, b) the diaphragm thereby actively providing and/or controlling a pressure gradient ($dp^0/dx$) across the interface separating two adjacent chambers, which is steeper (larger in amount) than the pressure gradients within the adjacent evaporation and/or deposition chambers so that either (in isolated cases such as for Mg) the vapor (over-)pressure of a preceeding (in the sense of the direction of the vapor flow, lines or trajectories) chamber and/or the vapor underpressure of the next following chamber acts as the specific driving force, i.e. the "osmotic" pressure being able to overrun without triggering condensation the effect of decreasing and/or increasing temperature (gradients) across the interface of diaphragms separating evaporation and deposition chambers without condensation by:

The principal idea is to separate at least one pair of adjacent chambers n and (n+1), i.e. designated by suffix "1" and "2" in the following, if not indicated otherwise, of temperatures $T_1$ and $T_2$ by employing a distinct temperature gradient which requires a steep and controlled pressure gradient across the interface separating both chambers, thereby the temperature gradient is either negative, i.e. the temperature increases with vapor flow so that $T_1<T_2$ or it is positive, i.e. the temperature decreases with vapor flow so that $T_1>T_2$, while the pressure gradient is always negative, i.e. $P_1>P_2$ on the understanding that the overall system is driven by a pumping system outside the evaporation and deposition system concerned, that is that the imposed overall pressure gradient is the controlling process variable no 1.

Figure 88:
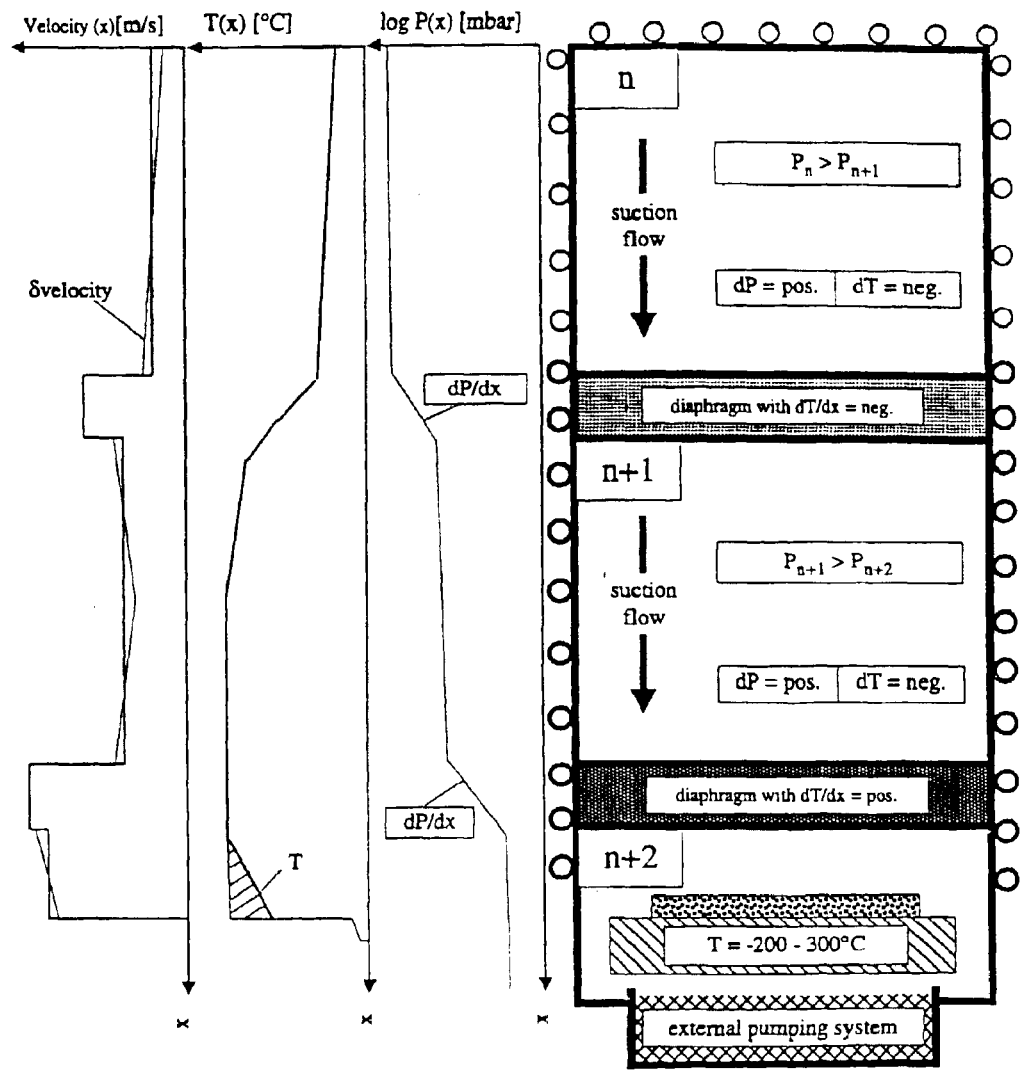
FIG. 88 Schematic of vapor deposition process controlled by suction flow via an external pumping system which generates elemental and alloyed vapor flows in chamber n and n+1 then driving the vapor toward a condenser (right hand side). For a given pumping speed S the actual throughput of vapor is controlled by the diaphragm.

FIG. 88 Schematic of vapor deposition process controlled by suction flow via an external pumping system which generates elemental and alloyed vapor flows in chamber n and n+1 then driving the vapor toward a condenser (right hand side). For a given pumping speed S the actual throughput of vapor is controlled by the diaphragm. The resultant processing pressure and temperature gradient across the interface of the diaphragms as well as the vapor velocity profile is shown schematically on the left hand side. The hatched area for the T-curve indicates the effect of radiation due to the positive temperature between chamber n+1 and n+2. The temperature in the "n"-unit to be used for the evaporation of magnesium and/or rare earth metals, for example, ranges e.g. from 600° to 2000° C., while the temperature in the "n+1"-unit to be used for the evaporation of rare earth and/or transition metals, for example, ranges e.g. from 1400° to 2800° C.

The overall process is subjected to the law(s) by Boyle-Mariotte following:

$$(p_1 * V_1)/T_1 = (p_2 * V_2)/T_2 \tag{1}$$

which becomes translated, according to the invention, into:

$$(p_n * V_n)/T_n = (p_{n+1} * V_{n+1})/T_{n+1} \tag{2}$$

Since any (pilot-) process is limited in scale, for a first approach it is assumed that $V_1$ $V_2$ so that process control is subjected to $$p_1/T_1 = p_2/T_2 \tag{3}$$

which becomes translated, according to the invention, into:

$$p_n/T_n = p_{n+1}/T_{n+1} \tag{4}$$

The more general driving force to control gaseous flow in the orifice(s) of the interface (membrane) which forms part of the overall diaphragm design and which overrides the effect of thermal gradients, is the static pressure difference between chamber 1 (or n) and chamber 2 (or n+1), i.e. $\Delta P(\Delta T)=k*(P_1-P_2)$, or $\Delta P_n(\Delta T_n)=k(\Delta T_n)*(P_n-P_{n+1})$, which is controlled by depression (underpressure) depending on pumping speed provided by the external pumping system and which should have the principal intake behind the deposition level of the deposition zone and/or suitable separation walls (see next PCT-application following this one), i.e. in a position where the vapor concerned cannot penetrate the pumping system. The more specific driving force (with regard to the question of positive or negative T-gradient) between the adjacent chambers is dictated by the difference of corresponding pressure-to-temperature ratios $$\Delta F(\Delta P_n, \Delta T^o{}_n) = k(\Delta P_n, \Delta T^o{}_n)*(P_n/T_n - P_{n+1}/T_{n+1}) \tag{5}$$

where $T_{n+1}$ corresponds to the evaporation temperature of the higher melting component and where the change of state of the gas/vapor involving a (in reality) polytrope (or ideally an adiabatic) gas transformation or change of state following:

$$T_n{}^\nu * P_n{}^{1-\nu} = T_{n+1}{}^\nu * P_{n+1}{}^{1-\nu} \tag{6}$$

where ν is the coefficient for the polytrope change of state of the gas or vapor with and κ=coefficient for adiabatic change of state (cf. P. Dobrinsky, G. Krakau and A. Vogel, *Physik für Ingenieure*, B. G. Teubner, Stuttgart, 4th edition, 1976., p. 145/6). As a result, a dynamic equilibrium is built up between the effect of suction due to macroscopic underpressure between adjacent vacuum chambers on the one hand and the local power interaction between the diaphragm and the vapor (gas) flow on the other, the latter including thermal power input due to heat transfer and/or mass separation and/or constitutional change upon interfacial mass transfer, friction and thermal power extraction by the diaphragm.

An attempt to establish such an interface was made by introducing a "resistor to flow" under F. Hehmann, F. W.

Hugo, F. Muller and M. Raschke, German patent application P 44 06 333 4. This "resistor to flow is formed as" (N.B. "formed as" is not the same than "consisting of") a "matrix of flow channels, which are" (i.e. the individual flow channels (which tunnel the vapor to the adjacent chamber in direction of vapor flow), not the matrix!) "distributed over a predominant fraction of the cross-section of the chimney of evaporation" (i.e. the projection of the x-dilation of the evaporation chamber onto the "resistance to flow") "in such a way that a monotonic decrease in pressure results between the evaporation zone and the at least one surface of condensation".

Figure 89:
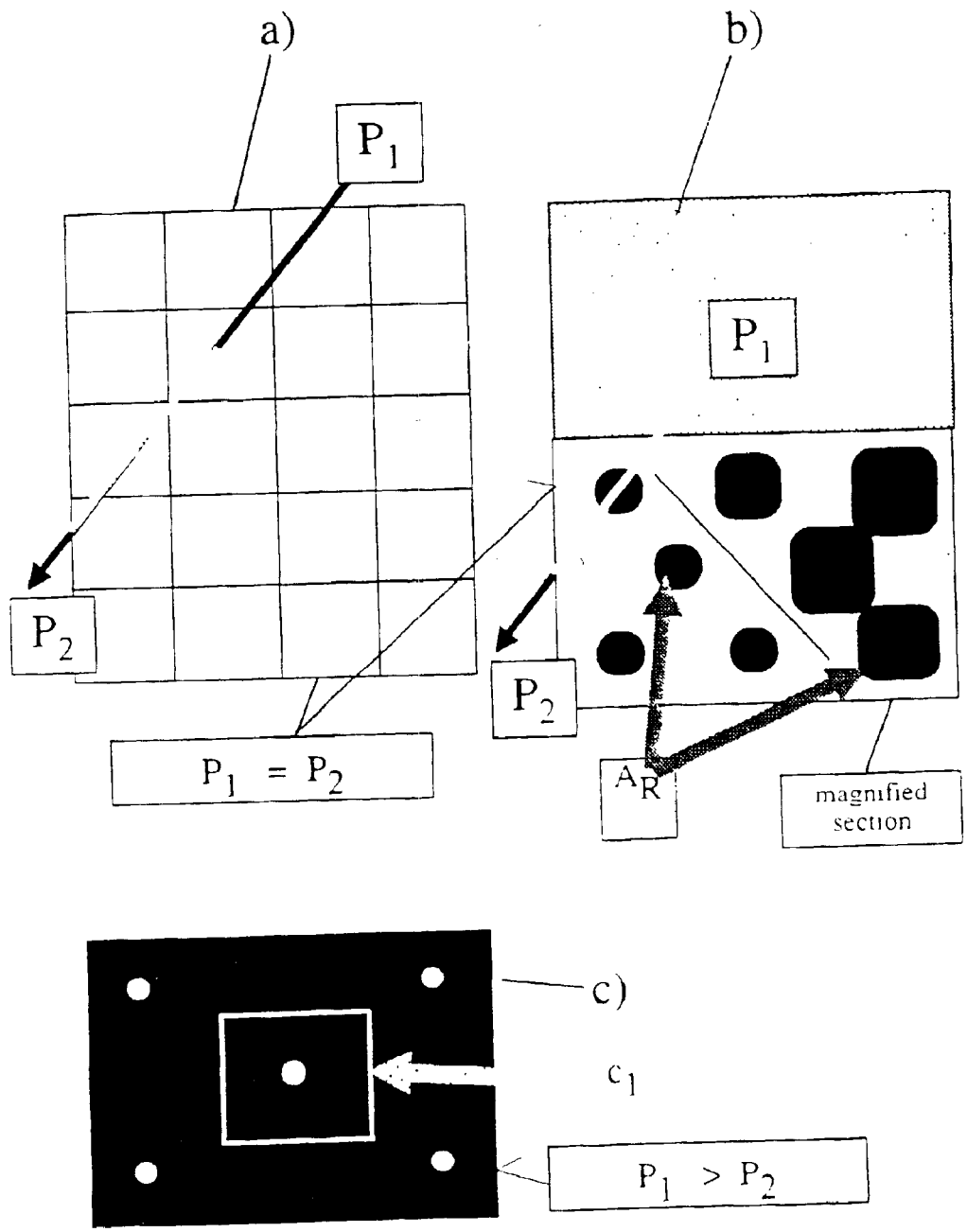
FIG. 89 a) x-projection of "Pen stocks" ("matrix of flow channels"), b) x-projection of a resistor to flow with a defined resistor surface area $A_R$, which is strictly speaking a parallel resistor to flow, and c) x-projection of (the "element" $c_1$ of) a diaphragm showing five vapor intakes forming a basic "element" of the diaphragm.
Figure 90:
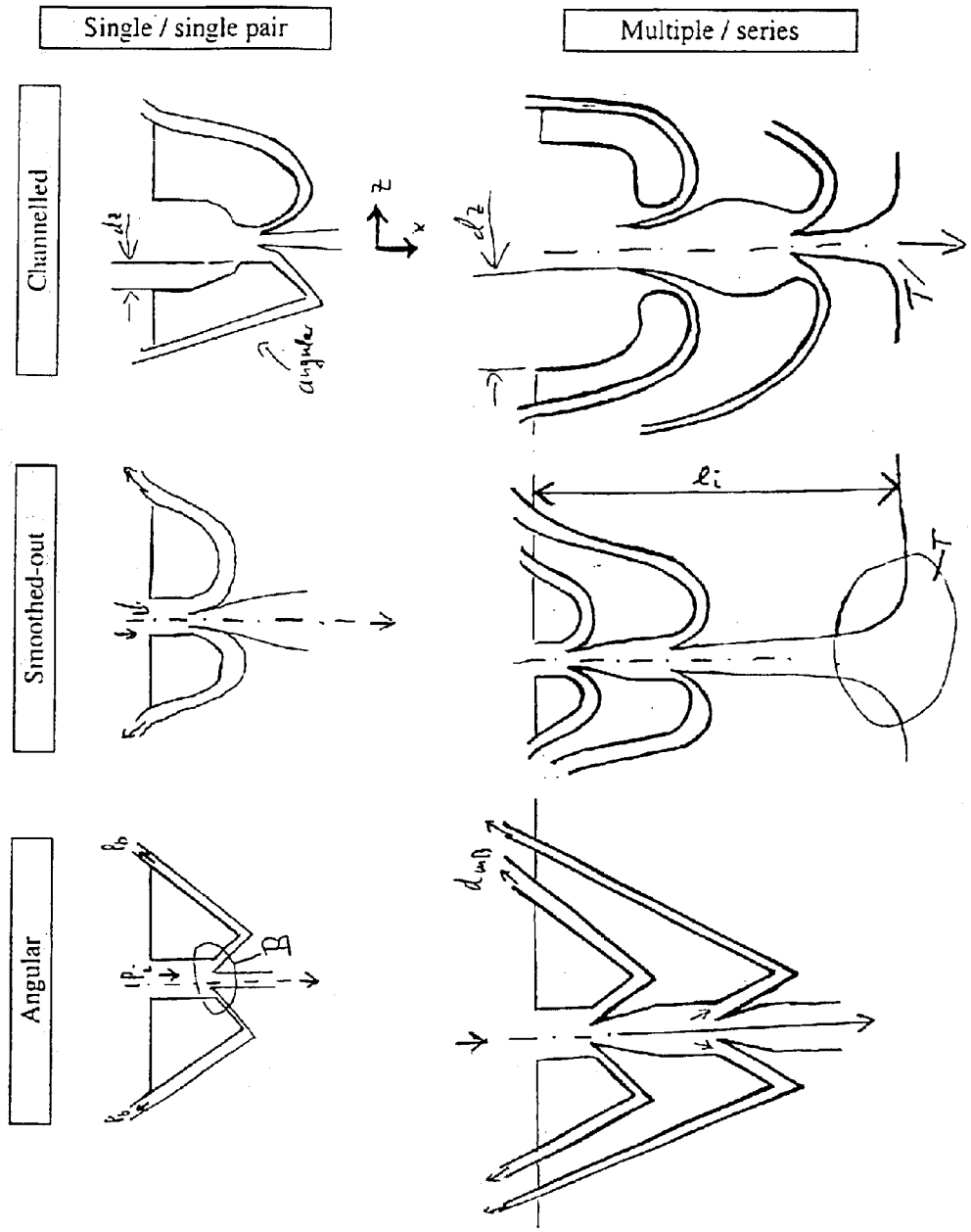
FIG. 90 Bifurcations (B) as a basic diaphragm element used to control suction flow (see arrows pointing out of diaphragm) in vapor deposition processing to manufacture high performance light metals and alloys with overall pressure at the intake, $p_i$, being larger than the pressure at the backstreaming outlets, $p_b$.
Figure 91:
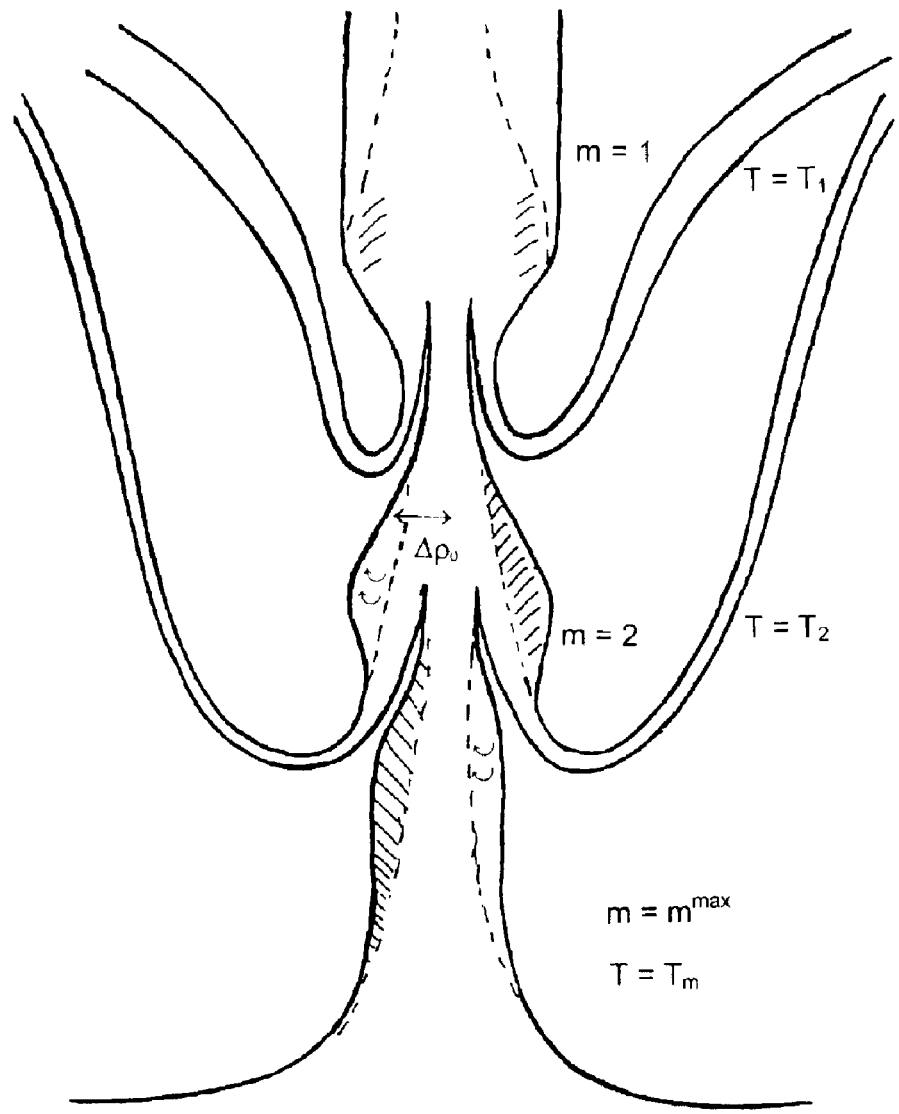
FIG. 91 As for FIG. 90, here confined (or channeled) multiple bifurcations (type "octopus"), the hatched areas indicating alternative volumes.
Figure 92:
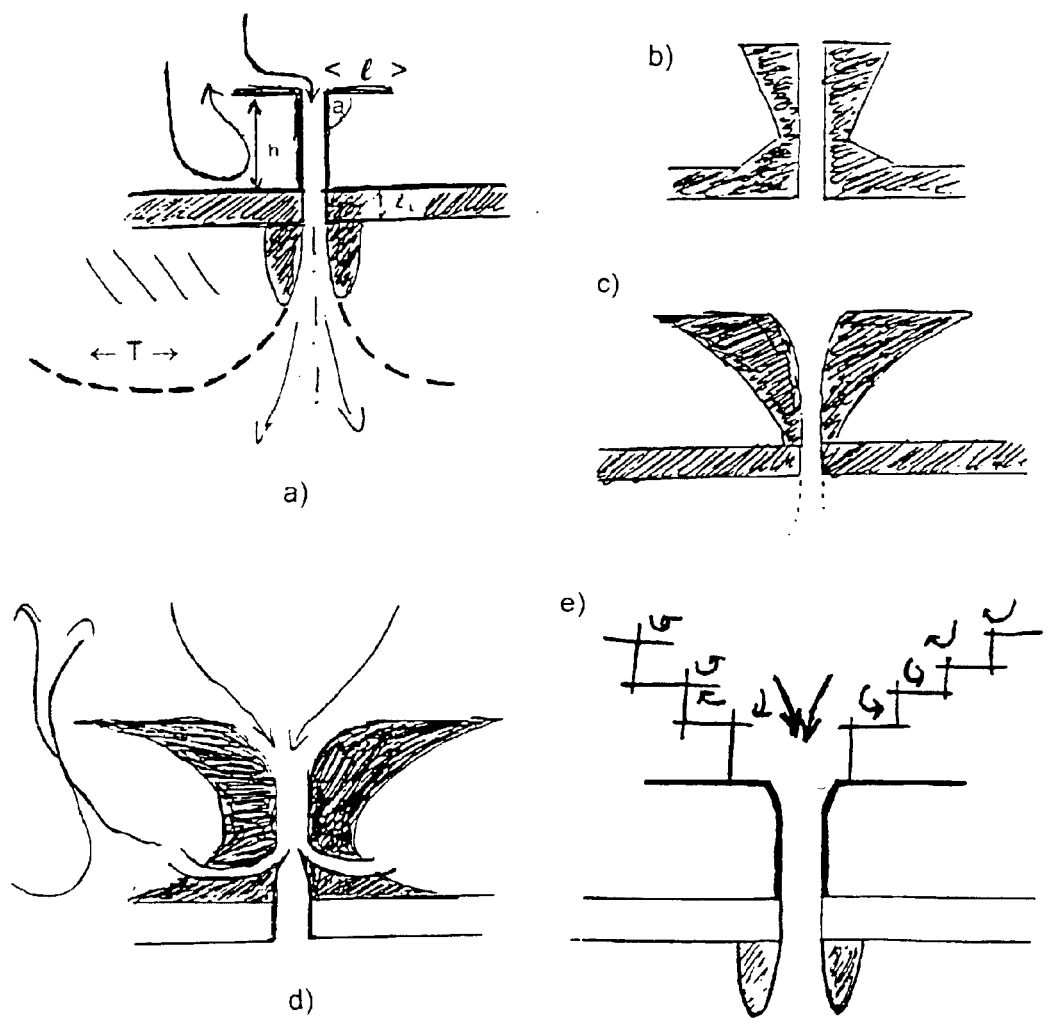
FIG. 92 Constructional elements and element combinations to generate a turbulent-to-laminar flow transition at the periphery of the interface per diaphragm element with a) most simple solution and b) to d) showing more massive control elements in front of the diaphragm.

In the more general description of the patent it was said that the matrix of flow channels "consists (!) preferably of a bunch of equidistant tubes and jets/nozzles, which result in a sort of 'clogging flow' covering at least the majority of the cross-section of flow" (this cross-section was not defined, but corresponds obviously to the projected surface area of the overall resistor to flow) and which was made responsible to avoid back-diffusion of the higher melting components. Under claims 14 to 18 the resistor to flow is defined as a "net or grid", "tubes with equidistant hollow spaces" of an "inner" (!) diameter of these hollow spaces which is claimed at most 20%, preferably 10% of the length of the tubes, L, and that these channels are preferably fabricated as a jet nozzle (which is not the same than a jet nozzle geometry). The figures and drawings of this patent suggest indeed that the resistor to flow concerned consists of "hollow spaces" rather than of a resistor or of an arrangement of individual flow resistors (cf. P. Dobrinsky, G. Krakau and A. Vogel, *Physik für Ingenieure*, B. G. Teubner, Stuttgart, 4th edition, 1976., p. 145/6; F. Hehmann, F. W. Hugo, F. Müller and M. Raschke, German patent application P 44 06 333 4). Hollow spaces appear as "pen stocks", for example (cf. drawings in F. Hehmann, F. W. Hugo, F. Müller and M. Raschke, German patent application P 44 06 333 4, p. 145/6 and in FIG. 89 showing a) x-projection of "Pen stocks" as to (F. Hehmann, F. W. Hugo, F. Müller and M. Raschke, German patent application P 44 06 333 4), i.e. a "matrix of flow channels", b) x-projection of a resistor to flow with a defined resistor surface area $A_R$, which is strictly speaking a parallel resistor to flow, and c) x-projection of (the "element" $c_1$ of) a diaphragm as to the invention with five vapor intakes here, each of them forming a basic "element" (cf. $c_1$) of the diaphragm. Only solution c) allows for a distinct pressure gradient dP/dx across the interface between chamber n and chamber n+1 as to FIGS. 90 to 94).

It must be resumed here:
1. A matrix of flow channels forms only the "conductance of flow", while the "resistor to flow" is made by individual elements or a network surrounding corresponding "flow channels" (FIG. 89). Obviously, the only resistance by patent application P 44 06 333 4 stems from the thickness or cross-section of the resistor to flow corresponding—according to the drawings—to the length the tubes, L, acting as the flow channels (P. Dobrinsky, G. Krakau and A. Vogel, *Physik für Ingenieure*, B. G. Teubner, Stuttgart, 4th edition, 1976, p. 145/6). This suggests, however, that the vapor is considered to be wet or at least half-way condensed to provide internal friction so providing laminar flow as to a (real) liquid. This is also suggested by the "clogging flow" (germ. "Pfropfströmung") quoted in the description of the patent application, but the "Pfropfstromung" is not claimed to be an explicit part of the process, though it is the only solution left for what was claimed under P 44 06 333 4.
2. The decrease in pressure between evaporation source and substrate/deposit is indeed monotonic, if there was only a resistance to flow and if only the matrix of the flow channels was defined, i.e. the specific conductance. The specific conductance is of secondary importance for a resistor to aero- and hydrodynamic flow, while a resistor to aerodynamic flow is not sufficient to control the aerodynamic flow of an ideal gas or a gas which is half-way condensed.
2. A resistor to (gaseous or vapor) flow does not generate the required steep and controlled pressure gradient across the interface between two adjacent chambers 1 and 2 (or n and n+1) unless condensation occurs at the orifice(s) of corresponding interface (cf. also Venturi-nozzle, F. Hehmann, F. W. Hugo, F. Müller and M. Raschke, German patent application P 44 06 333 4) or unless vapor velocity is limited by the speed of sound (n.b. a liquid is pushed by $P_1$ (or $P_n$), while a gas or a vapor is attracted by $P_2$ (or $P_{n+1}$) or, in both cases pushed or attracted by the gradient resulting from both $P_1$ and $P_2$ (see below), respectively.
3. A jet nozzle is an apparatus for an active increase of the overall pressure inside the flow channel (e.g. the by-pass) of a jet nozzle. The increase in pressure inside the flow channel of a resistor to flow, however, is produced in a "passive" way, since the driving force for vapor or gaseous flow is provided externally. In case of a continuous vapor deposition process, this driving force stems directly from a dynamic equilibrium between the adjacent chambers via the polytropic working function given in eq.n (6) and which is maintained by an external pumping system (see above).

The driving force ΔF (or ΔP, see above) controlling the local change of pressure in an individual flow channel so also the decrease in static pressure, $\Delta\pi_{o,s}$, and the increase in hydrodynamic pressure, $\frac{1}{2}\Delta(\rho(\upsilon)^2)_o$, inside an individual flow channel of the "resistor to flow", is proportional to the change of the overall pressure in corresponding flow channel following:

$$\Delta p_o^{overall}(T) = \Delta p_{o,s}(T) + \frac{1}{2}\Delta(\rho(\upsilon)^2)_o \qquad (7)$$

where $\Delta p_o^{overall}$=const. for T=const. and ρ and υ the density and velocity, respectively, of the elemental or pre-alloyed vapor or gas. The critical overall change of pressure $\Delta p_{o,crit}^{overall}$ without condensation can be increased by superheating the "resistor to flow" relative to $T_1$ and/or $T_2$ of the adjacent operating chambers, but this does not affect the limiting physics of a "resistor to flow" as an interface between two evaporating chambers designed to result in an alloy deposit of controlled microstructural homogeneity on the atomic length scale of at least two components with (very) different evaporation (or vapor saturation) pressure. The rearrangement of eq.n (7) following:

$$\Delta p_{o,s}(T) = -\frac{1}{2}\Delta(\rho(\upsilon)^2)_o + k(T) \qquad (8)$$

results in two limiting physics of the "resistor to flow" given by:
1. condensation as dictated by van der Waals' equation (cf. P. Dobrinsky, G. Krakau and A. Vogel, *Physik für Ingenieure*, B. G. Teubner, Stuttgart, 4th edition, 1976, p. 148) resulting in two limiting sub-cases:
   1.1. $p_{o,s}(T) < P_{crit}(T)$ due to $\rho_{Gas} \to \rho_{Liquid}$, where $P_{crit}(T)$ is/are the critical pressure(s) of condensation of a given isotherm T(p,V), where condensation occurs, for example, when the laminar flow of the gas is condensed into an orifice of size being too small or when turbulences arise behind the "resistor to flow", i.e. the interface (see below).
   1.2. Stop of the gas flow due to u=0, i.e. have clogging of orifice and of the "flow channel" due to 1.1 and process has to be interrupted eventually.

2. If case 1.1. and 1.2. can be avoided e.g. by superheating the "resistor to flow", then $/\Delta p_{o,s}(T)/$ is limited by the speed of sound, i.e. have only $\upsilon < \upsilon_{sound}$ available in order to
   2.1. decrease the static pressure inside the orifice
   2.2. manipulate $P_2$ as a function of pumping speed S via the pressure gradient $(dp^o/dx)$ across the "resistor to flow".

The limiting physics of a "resistor to flow" cast considerable doubt on the possibilities to maintain the continuity of the process claimed under P 44 06 333 4 as well as to control the process as a whole, since:

1. A decrease in (static) pressure in the orifice would require a definition of the "resistor to flow" in F. Hehmann, F. W. Hugo, F. Müller and M. Raschke, German patent application P 44 06 333 4, especially the coefficient of flow resistance, $C^F$, (i.e. for flow surrounding a deliberately shaped geometrical element) as well as the ratio of the surface area of the sum of the orifices of the flow channels, i.e. $\Sigma A_o$, relative to the surface area of the overall resistor, $A_R$. However, these parameters were not defined or claimed.
2. Even if there was a (local) decrease, $\Delta p_{o,s}(T)$, inside the orifice this decrease does not give any guarantee for a decrease $\Delta P(\Delta T)=k^*(P_1-P_2)^{11}$ corresponding to the sharp, gradient $(dp^o/dx)^{11}$ across the interface of a diaphragm,

[11] for clarity: dP/dx is the macroscopic pressure gradient across the interface at any given point, $\Delta P(\Delta T)=k^*(P_1-P_2)$ is the resultant, but not operative driving force for vapor flow and $(dp^o/dx)$ is equivalent to the local driving force at the flow channel which becomes operative due to the characteristics of the interface there including the engineering solutions claimed below) allowing for the required discontinuity in the overall profile of pressure along the x-component of the dimension of the overall process, i.e. between evaporation sources on the one side and substrate and deposits, respectively, on the other. Only this gradient $(dp^o/dx)$ across the interface allows for the required control of the evaporation of constituents of (very) different evaporation pressures. In F. Hehmann, F. W. Hugo, F. Müller and M. Raschke, German patent application P 44 06 333 4, however, claims that the "resistor to flow" should contain a "matrix of orifices" instead of a "matrix of resistors". Consequently, the resultant pressure gradient between evaporation sources and between deposit(s)/substrate(s) was claimed to be "monotonic" instead of "discontinuous". Such possibilities include the Venturi-type of jets, but then again it would be necessary to define the decrease in cross-section and/or surface area of outlet relative to intake and which was not done.

Therefore, the process claimed in F. Hehmann, F. W. Hugo, F. Muller and M. Raschke, German patent application P 44 06 333 4 is limited (in the case of absence of condensation) by the speed of sound leaving no manoeuvrability for an in-situ control other than condensation. Premature condensation between evaporation source and deposition level, however, is a contradiction to the fundamental requirement of the process itself which was claimed to be designed for economically viable products from the vapor phase so to explore the productivity of vapor deposition technology.

A process which is controlled by condensation or by the speed of sound or by both is not controlled by a "resistor to flow" which is the principal claim in F. Hehmann, F. W. Hugo, F. Müller and M. Raschke, German patent application P 44 06 333 4. The principal objective of a continuous vapor deposition process, however, is to avoid condensation other than on the substrate(s)/deposit(s), the latter particularly being a transformation from the vapor to the solid phase, i.e. any formation of a liquid phase must be avoided in the overall flow process in order to sufficient productivity and quality. Condensation and speed of sound are not patentable unless an engineering solution to control condensation and/or speed of sound was claimed. This is not evident from F. Hehmann, F. W. Hugo, F. Müller and M. Raschke, German patent application P 44 06 333 4, the application is thus not patentable.

The only solution to generate a pressure gradient $(dp^o/dx)$ according to the required gradient $\Delta P(\Delta T)=k^*(P_1-P_2)$ by using a "resistor to flow" would be case 1.1 of the limiting physics (p. 169). This was obviously meant to be, since vapor was shown to be evaporated "upwards", i.e. against the forces of gravity, but this was not explicitly defined or claimed and would require again the definition of an engineering solution. Any control of a continuous vapor deposition process involving interfaces to separate evaporation chambers should provide superheated vapor at rear of the interface, i.e. at the outlet to avoid condensation in the adjacent chamber resulting from turbulent flow (see below).

Possible solutions, however, include a membrane or diaphragm as claimed in this invention which provides a high coefficient $c_P$ in front of the "resistor to flow", i.e. at its intake to increase turbulent flow there even further, but it also requires a device allowing to collect condensed droplets when falling down so allowing for the re-use of material and rendering local condensation in front of the "resistor to flow" instrumental to a "mass filter" according to a diaphragm, but this was then not a characteristic of the "resistor to flow" itself and consequently it was not claimed and would be only readily applicable to alloy vapors of an alloy phase diagram without showing an immiscibility gap in the melt.

If condensation was a solution to the problem in patent application P 44 06 333 4, i.e. a method to generate a pressure gradient $(dp^o/dx)$ across the separating interface, it is very doubtful whether this process will work without further engineering solutions and, more importantly, whether it provides a good solution.

1. The Diaphragm: Principal Engineering Solution to Control Continuous Vapor Deposition The force of the "resistor to flow" in aero- and hydrodynamics is defined as (P. Dobrinsky, G. Krakau and A. Vogel, *Physik für Ingenieure*, B. G. Teubner, Stuttgart, 4 th edition, 1976):

$$F_F = F_P + \Sigma F_{Fr} \qquad (9)$$

where $F_F$: force of a resistor to flow occurring upon flow, i.e. at velocity $\upsilon$ beyond the critical velocity $\upsilon_{crit}$ $F_P$: force of a resistor to pressure $\Sigma F_{Fr}$: force of (internal) friction for laminar flow of a liquid in a cylindrical tube, i.e. $\Sigma(8\pi\eta l\upsilon)$ with $\eta$=coefficient of internal friction (dynamic viscosity), l=length of individual tube (flow channel) and $\upsilon$=mean velocity inside tube (channel); for gases, however, $\eta_{gas}$ is about 0, since laminar gas flow does not generate flow contact of the individual atoms, while turbulent flow should be minimized particularly behind the interface of the diaphragm, i.e. in chamber n+1, to avoid condensation there; therefore, $\Sigma F_{Fr}$=negligible (i.e. approaching 0), while:

$$F_P = c_P \tfrac{1}{2}(\rho(\upsilon)^2)A \qquad (10)$$

with:

$c_P$: coefficient of pressure resistance of the resistor to flow (or a diaphragm), which is different from the pressure resistance of an interface without flow channels. $c_P$ is a function of the mean velocity in front of a resistor or an individual resistor element as well as of the intensity of turbulences at rear of an resistor element and insofar $c_P$ is a function of the geometry of the resistor element(s) employed A: front surface of a resistor or an individual resistor element facing the approaching laminar flow.

Note that the hydrodynamic pressure, $\frac{1}{2}(\rho(\upsilon)^2)$, is preset by the pressure difference as to eq.ns (5) and (6) so by the required pressures of two adjacent chambers. That is why A and $c_P$ must be adjusted to the required alloy composition and productivity (i.e. the throughput $Q_\nu$). Since $\Sigma F_{Fx}=$ negligible (i.e. about 0) here, the coefficient of flow resistance (cf. above, i.e. for flow surrounding an element of given geometry), $c_f = c_P$ and eq.n (9) can be written as $$F_F = c_F \tfrac{1}{2}(\rho(\upsilon)^2) A \qquad (11).$$

Physically speaking, the resistor to flow transforms incoming laminar flow (and/or under vacuum also incoming molecular flow) into outgoing turbulent flow of a gas or a liquid by narrowing down the distribution of flow lines into the "hollow" space made available by the flow channels (P. Dobrinsky, G. Krakau and A. Vogel, *Physik für Ingenieure*, B. G. Teubner, Stuttgart, 4th edition, 1976). In fact, the continuous evaporation process needs an interface between two successive evaporation chambers with exactly the opposite characteristics compared to a resistor to flow claimed in (F. Hehmann, F. W. Hugo, F. Müller and M. Raschke, German patent application P 44 06 333 4): the incoming vapor (i.e. incoming from chamber 1 or n) is inevitably turbulent and/or undirected due to evaporation by thermal or magnetron sputtering methods and/or stirring actions resulting from the mixing zone (F. Hehmann, F. W. Hugo, F. Muller and M. Raschke, German patent application P 44 06 333 4) and must provide macroscopically (i.e. over the cross-section of the entire resistor to flow) a parabolic distribution in the density of flow lines, since the matrix of flow channels does not cover 100% of the resistor to flow according to patent application P 44 06 333 4. The outgoing vapor (i.e. outgoing toward the deposition chamber 2 or n+1), however, must achieve a maximum degree of laminar and/or molecular flow to avoid turbulences (which are the loci of forced atomic collisions, pressure increase and resulting nuclei for condensation) and to result in a uniform distribution (density) of flow lines there for a number of reasons including the risk of condensation in conjunction with incomplete adiabatic processing resulting in an undue local decrease of coefficient n of the polytropic change of state of corresponding vapor particularly for negative temperature gradients across the interface of the resistor to flow or insufficient adjustment/control of local pressure differences particularly for positive temperature gradients across the interface of the resistor to flow required to produce a uniform thickness of the resultant deposit. An interface which provides the opposite, of course, is no more a resistor to flow, but a diaphragm as is evaluated in the following.

The force of the resistor to an undefined type of flow is not only not important with regard to the required diaphragm, it also has to be kept as low as possible in order to minimize the resistance to undefined flow when the vapor crosses the interface of the required diaphragm. More particularly, turbulences in front of (not within) the diaphragm increase the pressure locally so increasing the local driving force for transfer of vapor from one into the following evaporation or deposition chamber. That is, the freedom in control variables is increased by turbulent flow in front of the interface and/or by a homogeneous flow line density of directional laminar and/or molecular flow behind the interface as is evaluated in the following. Insofar, what is needed here is a resistor to turbulent and/or undirected flow combined with a conductor for laminar and/or molecular flow to bridge dynamic equilibria of a polytropic change by sophisticated local control of the gaseous state of matter as is dictated by a sharp positive static pressure gradient required according to processed material and/or required productivity (i.e. decreasing static pressure in the direction of x-translation of vapor flow lines) and in order to override negative (increasing) and positive temperature gradients without condensation so solving the problem of process control of continuous vapor deposition. However, this is the opposite of the established definition of a resistor to flow (see P. Dobrinsky, G. Krakau and A. Vogel, *Physik für Ingenieure*, B. G. Teubner, Stuttgart, 4th edition, 1976) and a very interesting, since unorthodox and inverted problem with regard to classical aerodynamics.

Mathematically speaking, eq.n (11) does not apply anymore and eq.n (9) must be evaluated on the understanding that $F_F$ should be very small (not negligible), while $F_F$ is relatively large and a third term is to be introduced for the required diaphragm which compensates for the difference between the two former following:

$$F_v = F_F F_D \qquad (12)$$

where $F_D$ refers to any type of "mass filter" without compositional change (see below) including those arising from a "clogging flow" due to condensation at an interface that is designed to separate adjacent evaporation chambers. Eq.n (12) shows the physical meaning of what results into the sum of the required forces to control the process:

$$F_P = F_F + F_D \qquad (13)$$

where in particular $$F_D > F_P \qquad (14)$$

involving a change from the control of a "clogging"-type of process via the resistance to an undefined type of vapor flow to control via the forces of pressure differences which not only incorporate the forces of the invented diaphragm, but which are in particular dominated by them. What is $F_D$ physically ? And how does it physically relate to $F_F$?

A diaphragm is used to be defined by a (semi permeable and/or porous) wall separating (i.e. keeping separately, not filtering and/or not necessarily filtering !) two different substances or matters, which can be either a liquid mixture or a gas mixture, by allowing for a (directed) throughput from one into the adjacent substance, i.e. by a flow into one direction, a directional flow which corresponds to laminar flow in aero- and hydrodynamics and to laminar and/or molecular flow in our new process. The classical, membrane-controlled process is used to be called "osmosis" which represents an adjustment of the concentration of one-substance with respect to the other (which are at the same time kept apart by the membrane) via a flow of me an velocity being significantly smaller than without diaphragm. That is: a (usually aqueous) solution (e.g. water) is moved from a dilute state (e.g. pure water) into the more concentrated solution (e.g. polluted HCl takes water up to the top of a tree). The driving force to adjust the concentration accordingly, i.e. to fulfill its functional purpose is proportional to the local flow velocity and is called "osmotic pressure".

The driving force for the classical osmosis, i.e. the osmotic pressure of liquids and gases of different composition depends on the transmembranic pressure gradient $\Delta P(T, V)$ as well as on the concentration difference, $\Delta c$, across the (interface of the) membrane resulting in the osmotic pressure, $\Delta \pi(\Delta c)$, following $$\Delta F_{os} = \Delta P(T,V) - \Delta \pi(\Delta c).$$

(N.B. the interface of the diaphragm in the present invention is assumed to represent the shortest distance of separation of the two different substances which is not the same than the overall dimensions of the claimed individual elements of the diaphragms invented here, see below), i.e. the normal separating both mixtures. In the present process, however, there is no transmembranic "osmotic" barrier in the classical sense, since the exchange of gas and/or vapor is independent on concentration and subjected to an entirely different objective (i.e. not to the separation, but to the synthesis of matter and materials). Since the re is no control of transmembranic mass transfer by the chemistry of the vapor concerned, there is also no classical "osmotic" pressure. "Osmotic"-type of barriers are provided instead by an increasing temperature across the interface of the diaphragm, for example, i.e. a physical type of osmosis in which the variable vapor temperature is controlled by employing suction flow driven by underpressure, the final underpressure in the deposition unit being controlled by the pumping speed of the vacuum pumping system employed. Unlike for the process of gas permeation, for example (where $\delta\Delta P$ is triggered by fluctuations in front of the membrane), the overall pressure difference in the present vapor deposition process invented here so $\delta\Delta P$ is therefore not (apart from local exceptions including individual evaporation/vacuum chambers) controlled by a vapor pressure building up due to the (eg. vapor) pressure of the vapor sources in front of the diaphragm, but as a result of suction at least behind the last membrane prior to vapor deposition.

The resultant physical-type (i.e. independent on concentration of both adjacent mixtures for a given temperature) of osmosis of a gas or vapor, however, is only a function of pressure following (cf. P. Dobrinsky, G. Krakau and A. Vogel, *Physik für Ingenieure*, B. G. Teubner, Stuttgart, 4th edition, 1976, p. 97):

$$E = (dV/V\,dp) = 1/P \tag{15}$$

with E=expandability of the gas. This was derived from the law by Boyle-Mariotte following:

$$V\,dp = \text{const.}\,dm \tag{16}$$

where dm is assumed here to represent the mass exchanged per unit time over the interface of the diaphragm. In order to define a universal diaphragm that is independent on either an increasing temperature (i.e. a negative temperature gradient $-\Delta T$) or a decreasing temperature (positive temperature gradient $+\Delta T$) across the interface of the diaphragm, eq.n (16) has to be transformed to $$\text{const. } dm_D < (V\,dp)_D \tag{17}$$

Obviously, macroscopic control of vapor mass exchange between two evaporation chambers or an evaporation and a deposition chamber requires that the effectively released mass $$dm_D < dm \tag{18}$$

where dm represents the exchanged mass of a "resistor to flow", for example. $F_D$ is therefore proportional to corresponding difference, i.e. $F_D = k*(dm - dm_D)$.

That is, in order to control mass flow between two adjacent chambers even for increasing temperature, the effectively released mass $dm_D$ has to be decoupled kinetically from $dp = fn(S, \Delta T)$ without affecting (i) the proportionality between $dm$, and the velocity of vapor flow between both chambers or (i.e. (ii) is alternative) (ii) the wake effect of the pumping system. Instead of draining the evaporation sources by excessive acceleration (speed of sound) and bunching of vapor flow lines via Venturi-type of nozzles (including the "resistor to flow" made up by a matrix of flow channels directing the vapor toward the adjacent chamber) so eventually triggering condensation, a dynamic equilibrium of mass exchange is generated involving (see below) 1) expansion and 2) acceleration of a discrete mass of vapor dm, toward the substrate and growing deposits, but already within the diaphragm. Decoupling of the resulting vapor throughput $Q_v$ (in [W], [Pa*m$^3$/s], [Nm/s]) from pumping speed S, however, is per se an osmotic problem and requires the use of a membrane. The resultant physical-type of osmosis (essentially without chemical change) for vapor deposition takes advantage of macroscopic static pressures and resultant pressure gradients, microscopic hydrodynamic pressures, local vapor velocity and the momentum of the vapor to provide the required transmembranic change of state of matter and process control.

Due to the laminar and/or molecular flow inside a cylindrical flow channel between two adjacent vacuum chambers, separated by a membrane, eq.n (7) can be re-written as:

$$\Delta p_o^{overall}(T,S) = (p_1(T) - p_{o,s}(T)) + \tfrac{1}{2}(\rho_1 - \rho_{o,s})(\upsilon_1 - \upsilon_{o,s})^2 \tag{19}.$$

The continuously maintained static pressure drop between the two adjacent chambers requires that $p_o = P_2$. This cannot be achieved by laminar and/or molecular flow through an (undefined) matrix of flow channels even via Venturi-type of jet nozzles providing a reduction in throughput area. $\Delta p_o^{overall}(T,S)$ is given by the pumping speed of the system and the alloy to be processed, the term $p_1(T) - p_{o,s}(T)$ should be controlled in such a way that $p_o = P_2$ and $P_1$ and $\upsilon_1$ are also assumed to be preset by the system. The remaining variables are $\rho_{o,s}$ and $\upsilon_{o,s}$. One way to evaluate the transmembranic state of gas (flow) as a function of macroscopic conditions is:

$$1/2(\rho_1 - \rho_{o,s})(\upsilon_1 - \upsilon_{o,s})^2 = -(p_1(T) - p_{o,s}(T)) + const.$$
$$= p_{o,s}(T) - p_1(T) + const.$$
$$1/2(\rho_1\upsilon_1^2 - 2\rho_1\upsilon_1\upsilon_{o,s} + \rho_1\upsilon_{o,s}^2 - \rho_{o,s}\upsilon_1^2 + 2\rho_{o,s}\upsilon_1\upsilon_{o,s} - \rho_{o,s}\upsilon_{o,s}^2) =$$
$$p_{o,s}(T) + const.' - \kappa_1\upsilon_{o,s} + \kappa_2\upsilon_{o,s}^2 + \kappa_3\rho_{o,s} + \kappa_4\rho_{o,s}\upsilon_{o,s} - \rho_{o,s}\upsilon_{o,s}^2 =$$
$$p_{o,s}(T) + const.''$$

The transmembranic vapor and/or gas transfer, i.e. the throughput under the maxim of vapor deposition process control by means of a membrane, is thus controlled by the $P_1$-independent term $\rho_{o,s}\upsilon^2_{o,s}$, i.e. a decreasing static pressure inside an individual flow channel, $p_{o,s}(T)$, requires an increasing product (!) of density and velocity, $\rho_{o,s}\upsilon^2_{o,s}$ as a result of an increasing term $\upsilon^2_{o,s}$ and a decreasing density, $\rho_{o,s}$, (see term $k_3*\rho_{o,s}$) itself, of the traversing vapor. While the local density of the gas (flow) controls the reduction of static pressure locally, the velocity $\upsilon_o$ is required to compensate for this decrease by an increase in directional momentum of the (eventually mono-atomic) gas species. The decrease in density of traversing vapor inside the diaphragm is the most important parameter to be controlled in order to provide a universal diaphragm that is independent on either an increasing or decreasing temperature. Therefore, the design should allow for a substantial reduction in the density of flow lines within the diaphragm between intake and outlet while providing possibilities to accelerate them at the same time so relaxing the requirements for local density (pressure) reduction upon transmembranic vapor transfer.

Figure 93:
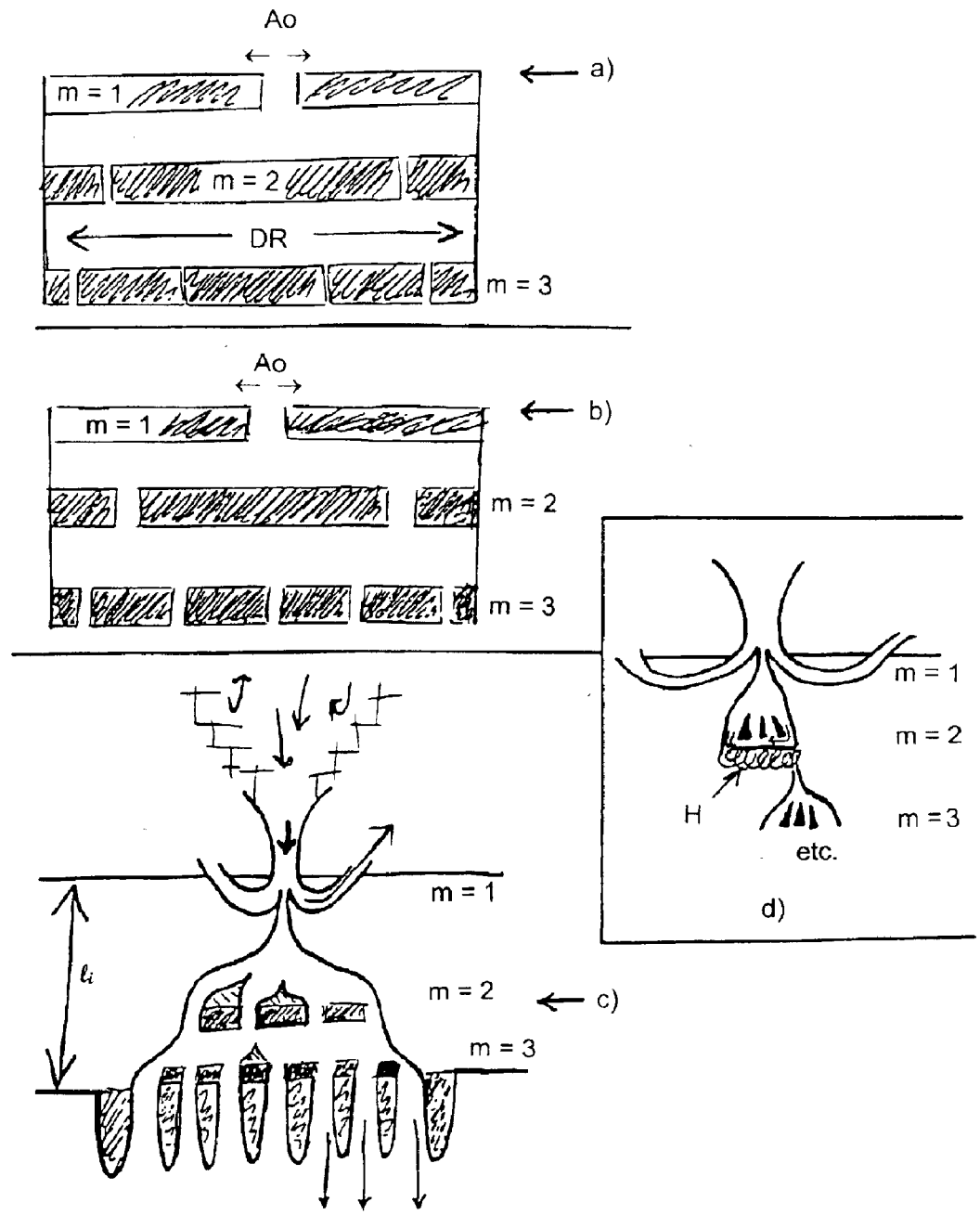
FIG. 93 A series of resistors, m, to vapor flow which can multiply the number of resistor elements per series thereby reducing the resistance to vapor flow per level m progressively where a) and b) showing the two basic solutions "$\Sigma A_{0.1} > \Sigma A_{0.2} > \Sigma A_{0.3}$" and "$\Sigma A_{0.1} < \Sigma A_{0.2} < \Sigma A_{0.3}$" including a "differential reservoir" DR in version c) and d) shows a heating spiral H to locally heat vapor flow.

As a result, the employed suction flow overruns the possibility of osmotic pressure gradients in their classical= chemical sense, i.e. there is essentially no difference in the chemical potential across the interface in the very vicinity of a transmembranic flux channel (or pore). This is, however, the working principle of the diffusion pump, but without premature condensation. The compositional gradient over the interface of a classical membrane for the separation of chemically different constituents/species is replaced by a local gradient in density and/or temperature. The locus of the characteristic boundary layer (in the classical sense) is thereby removed from the front of the interface to any transmembranic position between front face over centerline of the transverse cross-section (i.e. perpendicular to the local x-normal independent on whether the diaphragm has a curved surface or not) and/or up to the rear of the interface (see FIG. 88).

2. Engineering Solutions for the Diaphragm

The exchanged mass $dm_D$ is proportional to the magnitude of traversing laminar and/or molecular flow, while the turbulent fraction of traversing laminar and/or molecular flow is proportional to the (risk or probability of) condensation so composition fluctuations to take over control of vapor flow. The resulting consequences for an appropriate engineering solution include:

1. The turbulent fraction of traversing laminar and/or molecular flow has to be minimized by an appropriate engineering solution in any case.
2. A continuous increase in vapor temperature within the diaphragm should improve the control of the required (laminar and/or molecular) mass exchange for increasing temperatures.
3. Vapor acceleration should be coupled with superheat sufficient to compensate for vapor cooling resulting from radiation prior to atomic attachment at the deposit.

There are several engineering solutions available to provide a diaphragm for the synthesis of metallic vapors in a continuous vapor deposition process:

2.1 Single and Multiple (Series of Bifurcations as an Anti-Nozzle System (see FIG. 90 showing bifurcations (B) as a basic diaphragm element used to control suction flow (see arrows pointing out of diaphragm) in vapor deposition processing to manufacture high performance light metals and alloys. The elements may consist of a single, or a single pair or a multiple, i.e. a series of single or pairs of bifurcations, the bifurcations either constructed in an angular way, or in a smoothed-out way or angular confined or smoothed out confined-to-channeled, but for all cases the overall pressure at the intake, $p_i$, is larger than the pressure at the back-streaming outlets, $p_b$. diaphragms consisting of bifurcations represent a depth-type of mass-filter in analogy to membranes used to chemically separate a component from a mixture. N.B. e) and f) with trumpet-type (T) of vapor outlet to improve effect of suction on vapor flow as indicated by arrow°. $l_i$=length of interface of diaphragm).

Bifurcations represent the opposite of jet nozzles applied to gas atomization of liquids, for example, in order to maximize fragmentation. In vapor deposition, fragmentation is maximized by nature and requires control of condensation. The bifurcations are constructed in such a way that the pressure of each individual outlet for back-streaming vapor, $P_B$, is smaller than the pressure at the intake, $P_I$, i.e. $P_I > P_B$ so to allow for partial back-stream of a substantial fraction of dm, i.e. the difference $dm_B = dm - dm_D$ into any of the preceding chambers where the vapor comes from. The advantage of bifurcations: they provide an elegant basic solution without excessive turbulent flow inside the diaphragm and in conjunction with the use of flow line elements as outlet configuration at rear of the diaphragm or in conjunction with a trumpet-like outlet which again represents the opposite to the nozzle design used in gas-atomization, (see FIG. 91 which is as for FIG. 90, here showing confined (or channeled) multiple bifurcations (type "octopus"), the hatched areas indicating alternative volumes to create turbulences so providing a solution which overlaps with those in FIG. 93 including heating element s for a progressive temperature increase. *=$\Delta\rho_0$ used to generate ("internal") turbulences for a T-controlled expansion of transmembranic vapor flow,) and can involve angular and smoothed out single and multiple conducts with and without confined gaseous flow (e.g. to accelerate vapor velocity toward the deposit) arriving at the use of multiple octopus-like configurations (i.e. configurations including diffuser-to-jet nozzle transitions (FIG. 91).

2.2 Constructional Elements with Large and Small $c_F$-Values

The use of constructional elements with large $c_F$-values to generate turbulences at medium distance from the intake by simultaneously avoiding them directly at the orifice and at the outlet of the traversing flow channel so to create relatively large static pressure in front of the orifice of corresponding flow channel, i.e. away from the interface of the diaphragm as to FIG. 92, this FIG. 92 showing constructional elements (details) and element combinations to generate a turbulent-to-laminar flow transition at the periphery of the interface per diaphragm element. a) most simple solution for which the retained vapor mass per diaphragm element, $\Delta m_R$ is equal to the product "k*h" with k=a constant which is a function of length l, height h and angle $\alpha$. The $c_F$-value of the control element is large in front of and small behind the vapor intake and/or diaphragm (see text). *=transition to adjacent diaphragm element. b) to d) show more massive control elements in front of the diaphragm with d) indicating an "external", i.e. "sieve"-type of bifurcation (see letter "S"; T: transition to adjacentdiaphragm element), the turbulences, thereby reducing the laminar and/or molecular flow in any of the evaporation chambers n (or no 1), (n+2) or no 2 etc. so "filtering" directional flow down to a fraction compared to that without the use of corresponding constructional elements, of which the corresponding $c_F$-values ranging from 0.25 to 5, in particular between 1.1 and 3, the high er values thereby obtained by a combination of individual elements comprising rectangular and regular plates. The constructional elements and design configurations) to suppress turbulent flow at rear of the diaphragm as well as at the immediate intake area include trumpet-shaped in- and outlets of which the resulting coefficients of flow resistance, $c_F$, shall be not larger than 0.25.

2.3 Series of Successive Resistors to Flow

If the force of diaphragm, $F_D$, is large as to (a combination of) claimed solutions of 1) and 2), a relatively large internal, i.e. transmembranic resistor to flow, $F_F$, is affordable by the diaphragm (see eq. (14)). This is particularly useful for large P- and T-gradients to be achieved. In stead of a single matrix of flow tunnels (cf. F. Hehmann, F. W. Hugo, F. Müller and M. Raschke, German patent application P 44 06 333 4) which is not a very efficient resistor to flow according to a parallel electrical switch, a series of successive resistors to flow is orders of magnitude more efficient by superimposing various resistors to flow which can consist of a matrix of resistor elements which are arranged equidistantly between the flow channels or not and which embrace the following characteristics (cf. FIG. 93 showing a series of resistors, m, to vapor flow which can multiply the number of resistor elements per series thereby reducing the resistance to vapor flow per level m progressively toward chamber n+1. a) and b) showing the two basic solutions "$\Sigma A_{0.1} > \Sigma A_{0.2} > \Sigma A_{0.3}$" and "$\Sigma A_{0.1} < \Sigma A_{0.1} < \Sigma A_{0.3}$" including a "differential reservoir" $\Delta R$ to be extended in version c) by elements with large $c_F$-number in front of vapor intake and small $c_F$-number to direct vapor flow by reducing "internal" turbulent flow and turbulent flow at vapor outlet, d) shows a heating spiral H to locally heat vapor flow):

a) the overall resistance to flow increases with increasing number m of resistor levels employed (FIG. 93) and/or b) the local velocity of laminar and/or molecular vapor flow inside the flow channel, $v_o$, can be increased by reducing the relative orifice area (projection of available flow lines), i.e. the surface area fraction (ratio) of intake-to-resistor, $\Sigma A_o / \Sigma A_R$ decreases progressively with increasing numbers of resistor level m, and/or c) $v_o$ can be increased by keeping the relative orifice area $\Sigma A_o / \Sigma A_R$ constant, but increasing the temperature differentially at each discrete level of m, and/or d) $v_o$ can be increased by a combination of b) and c) and/or e) but $\rho_o$ has to be decreased at the same time, so must decouple the absolute amount of projected inlet-area from projected outlet area per resistor level and this can be done by e1) a progressive increase of the absolute surface area of the orifices of level m+1 with regard to that of level m and/or e2) the introduction of an increasing overall area $\Sigma A_o + \Sigma A_R$ and/or e3) the introduction of a differential volume in front of level m which acts as a differential vapor reservoir likewise allowing the vapor to adapt the required partial temperature increase and which may include heating serpentines here which are traversed by the vapor volume $dm_D$ or dm, and/or f) while all of the solutions 3a) to 3e) can be achieved with and without turbulences, the amount of required turbulent flow being optimized with regard to the required gradient dP/dx and dT/dx across the interface of the diaphragm by introducing flow line elements in front of the differential resistor elements or in front of part of the resistor elements of a selected fraction of m-levels as well as at rear of the final outlet level $m^{max}$.

2.4 Combination

Figure 94:
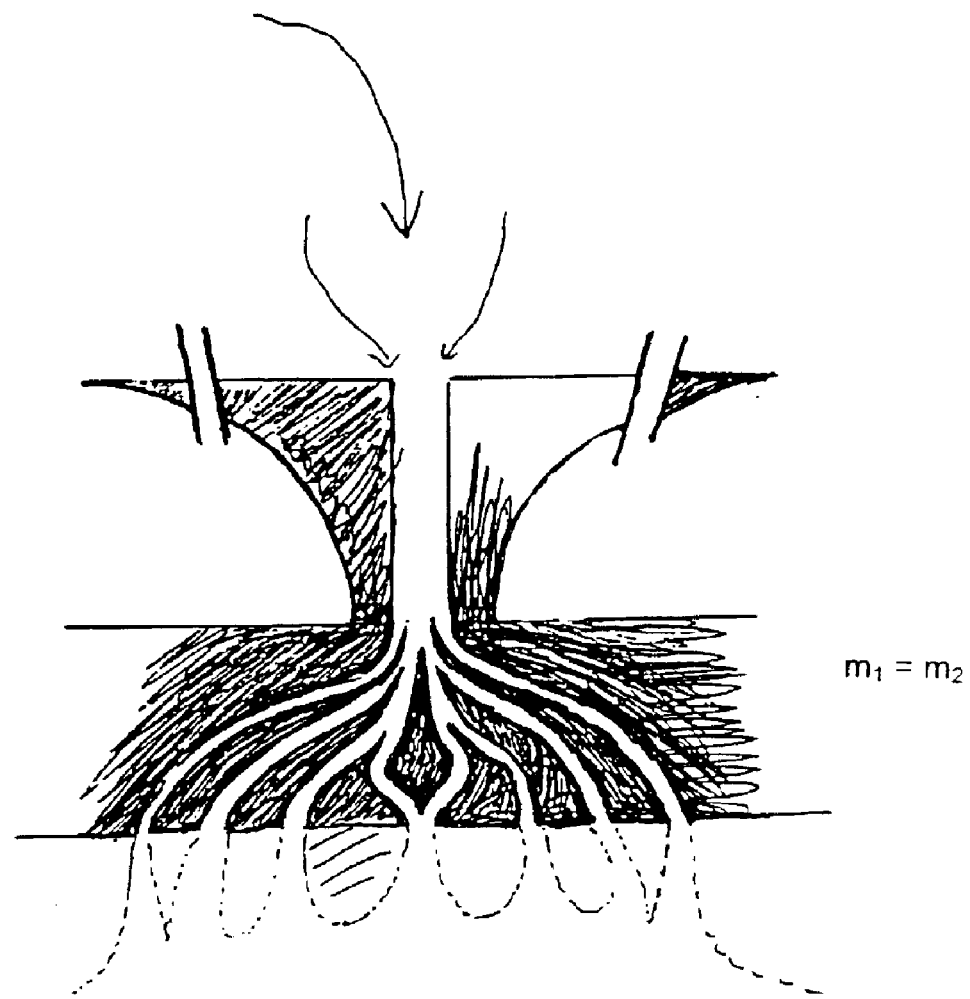
FIG. 94 For example, flow control elements with large $c_p$-number in front of vapor intake and small $c_p$-number at vapor outlet and a series resistor combined in such a way, that $m_1=m_2$ so not providing a differential reservoir.

Finally, any combination of the principal engineering solutions 1) to 3) as indicated in FIGS. 90 to 93 and resulting in overlapping simple or more complicated solutions as reproduced schematically in FIGS. 90 to 94 should provide a satisfying solution for the required engineering alloy composition at a given productivity. FIG. 94 shows, for example, flow control elements with large $c_F$-number in front of vapor intake and small $c_F$-number at vapor outlet and a series resistor combined in such a way, that $m_1=m_2$ so not providing a differential reservoir.

3. Maintenance of Driving Force Suction Flow

A comparison shows the hierarchy of functional levels patented so far:

| Rank | Functional Level | Patent by F. Hehmann, F. W. Hugo, F. Müller and M. Raschke, German patent application P 44 06 333 4 | This Patent |
|---|---|---|---|
| 1 | Driving Force for Productivity: Underpressure in Deposition Unit maintained by Vacuum Pumping System | no | yes |
| 2 | Maintenance of Driving Force (Form of Control of rank 1) | no | (see below) |
| 3 | Principal Engineering Solution to Realize the Maintenance of The Driving Force: Diaphragm | no | yes |
| 4 | Principal Membrane-Elements: e.g. bifurcations, Geometrical Elements at Rear with low $c_F$-values | no | yes |
| 5 | Secondary Membrane - Elements e.g. series resistors, whirley elements in front of diaphragm | no | yes |
| 6 | Controlling elements of rank 5: resistor surface and $c_F$-values | no | yes |
| 7 | Non-controlling elements for rank 5: e.g. length of straight tube sections, conductance | partial | partial |

In analogy to the movement of the melt extraction drum in the melt extraction process (cf. FIG. 16 in U.S. patent application Ser. No. 08/776,381) the movement of the surface of the growing deposit of the condenser and collector system has to provide the conditions for diaphragm controlled extraction of vapor throughput from the final evaporation and/or vapor mixing chamber, i.e. the final (alloyed) vapor reservoir on the one hand and the at least one deposition unit on the other in order to maintain the pressure gradient between both chambers (e.g. between the (n+1)- and the (n+2)-unit) which then controls and/or communicates with (the throughput of) all other units of the overall vapor deposition process by suction flow.

The operative vapor accommodation factors $\alpha_\tau$ on the deposit surface are a function of the vector sum (parallelogram) of the velocity of the vapor (trajectories) emerging from rear of the (final) diaphragm on the one hand and the velocity of the deposit surface on the other. In a first approach both velocity vectors are assumed to be constant. For molecular flow conditions it is then evident that the (perpendicular) distance h between rear surface of the final diaphragm and deposit surface opposite to the rear surface must not exceed a value which is a function of the mean free path MFP of the vapor concerned where $$MFP = kT/(2^{0.5} * \pi a^{2p})$$

with p=overall pressure in flow channel, a=diameter of atom or vaporized molecule concerned T=vapor or gas temperature and k and $\pi$=constants (Boltzmann and constant number 3.14, respectively). For both the laminar and molecular flow condition, the use of a rotating (circular) disc and/or deposition surface (cf. F. Hehmann, F. W. Hugo, F. Müller and M. Raschke, German patent application P 44 06 333 4) introduces a third component into the vector balance between final diaphragm and deposition surface and would require a definition of how the effect on accommodation factor of the change in deposit surface velocity with distance from the rotating axis (pivot) is controlled by transmembranic vapor momentum in order to achieve uniform conditions of vapor accommodation on the deposition surface. These details are part of an additional patent to be lied down within the next ten days after deposition of this patent.

The operative accommodation factor dictates the degree of decoupling of $Q_v(x)$ from pumping speed S and is a function of the volume fraction of vapor reaching the deposit surface as well as the (loss of) momentum of the vapor after passing through the final diaphragm prior to deposition. In the most simple case of a straight cylindrical flow channel, the balance of the momentum forces within the hypermembranic distance h (i.e. the distance h between (rear) surface of diaphragm and deposition front surface) depends (for a given vapor state in the preceding evaporation and/or mixing chamber) on the diameter $d_x$ of the cylindrical flow channel, since the further variables to control $h_{eff}$ (for a required= given $\alpha_r$), i.e. p, ρ, and v and the resultant nature of turbulent-free transmembranic vapor flow is directly controlled by d. That is, $h_{eff}$ is a function of $d_x$ unless a specific control of the transmembranic momentum was defined. The condition for laminar flow is $$(d_x/2)*MFP >> 1 \tag{1}$$

that for molecular flow is $$(d_x/2)*MFP << 1 \tag{2}$$

and for the transition between both regimes:

$$0.1(d_x/2)*MFP10 \tag{3}$$

from these relationships it is evident that the maximum hypermembranic distance, $h_{max}$, between (rear) surface of final diaphragm and (front of) deposition surface (and therefore the control of decoupling $Q_v(x)$ from $S_{req}$) is for laminar flow a function of $d_x$, for molecular flow a function of MFP and for mixed vapor flow through the final diaphragm a function of a dimensionless value, which varies by two orders of magnitude.

The use of the geometrical flow elements with low $c_F$-values suppress the formation of turbulence within the distance heft. Under this condition, the vapor stream is eventually deflected laterally by collision with atoms moving with vector-components into y- and z-direction and which are eventually controlled by the velocity and roughness of the deposit surface and by the density of protrusions on the deposit surface. The lateral deflection per atom increases with decreasing pressure (i.e. increasing underpressure for a given pressure gradient) in the vacuum chamber/-system accommodating the deposit and with decreasing distance $h_{eff}(F_0)$ where $F_0$=transmembranic vapor momentum. On the other hand, the number of collisions decreases with decreasing pressure/increasing underpressure in the final vacuum unit. Consequently, $$h_{eff}(F_O) < h_{max}(\alpha_{A,crit}) \tag{4}$$

where $h_{max}(\alpha_{A,crit})$ is a function of lateral deflection which allows impingement of a critical volume fraction $\alpha_{A,crit}$ of vapor stream on the deposition surface. Since $$\alpha_T = (E_v - E_r)/(E_v - E) = (T_v - T_r)/(T_{v-T}) \tag{5}$$

where
$E_v$=kinetic energy of atom impinging on substrate surface
$E_r$=energy of desorbed atom prior to achieve equilibrium with bulk underlayer
$E$=energy of desorbed atom after equilibrium with bulk underlayer was established, an atom is reflected from the deposition surface when $\alpha_T < 1$. For a given $\alpha_A$-value arriving at the deposition surface (for a moving substrate the corresponding level is the velocity layer building up in front of the surface, since the velocity of the substrate may under optimized conditions control the effective accommodation according to the melt extraction by the surface of the melt extraction drum, see above), the relative accommodation coefficient $\alpha_T(\alpha_A)$ decreases with decreasing $h_{eff}$ and increasing $\alpha_A$-values. For $\alpha_T=1$, $\alpha_T(\alpha_A)$ is directly proportional to $h_{eff}$. Therefore, $h_{eff}$ must not remain under a certain value $h_{min}(\alpha_{T,crit})$, at which $\alpha_T$ falls below a critical value $\alpha_{T,crit}$, i.e.

$$h_{min}(\alpha_{T,crit}) < h_{eff}(F_0) < h_{max}(\alpha_{A,crit}) \tag{6}$$

While condition (4) assures that $h_{eff}$ controls the vapor fraction impinging on the deposition surfaces, it is the difference $h_{max}(\alpha_{A,crit}) - h_{eff}(F_0)$ which controls $\alpha_T$ and hence the fraction of $Q_v(x)$ deposited on the surface, i.e. $Q_A$. Optimization of or versus $$\alpha_A(h) = \alpha_T(h) = 1 \tag{7}$$

allows for a large $\Delta h_{eff}$-range so maximum efficiency of the process. The ratio of both functions, i.e. $(\alpha_T/\alpha_A)(h)$ depends on dp/dx; dT/dx, $F_D$ (see above, i.e. the local manipulation of traversing vapor stream parameters p, ρ and v) and the lateral velocity and surface quality including roughness and temperature of the deposition surface. The $7^{th}$ embodiment shows the range of conditions for controlled vapor deposition, i.e. controlled and optimized yield Q(A) of $Q_v(x)$ of the invented process and therefore a controlled decoupling of $Q_v(x)$ and $S_{req}$ following $$Q(A) = \Delta P^* \cdot q(x)^* \cdot \alpha_A^* \alpha_T$$

with the resulting differential $$(\delta/\delta'x)^* Q(A) = Q(A) = \Delta P_1^{-*} q(x)^* \cdot [(\delta\alpha_T/\delta'x)\alpha_A^*(\delta\alpha_A/\delta'x)\alpha_T]$$

where $\delta'x = \delta x + h_{eff}(F^0)$ with $\delta x$=transmembranic cross-section, i.e. $\delta'x$ embraces $h_{eff}(F_0)$.

4. Engineering Solutions for the Overall Process

Figure 95:
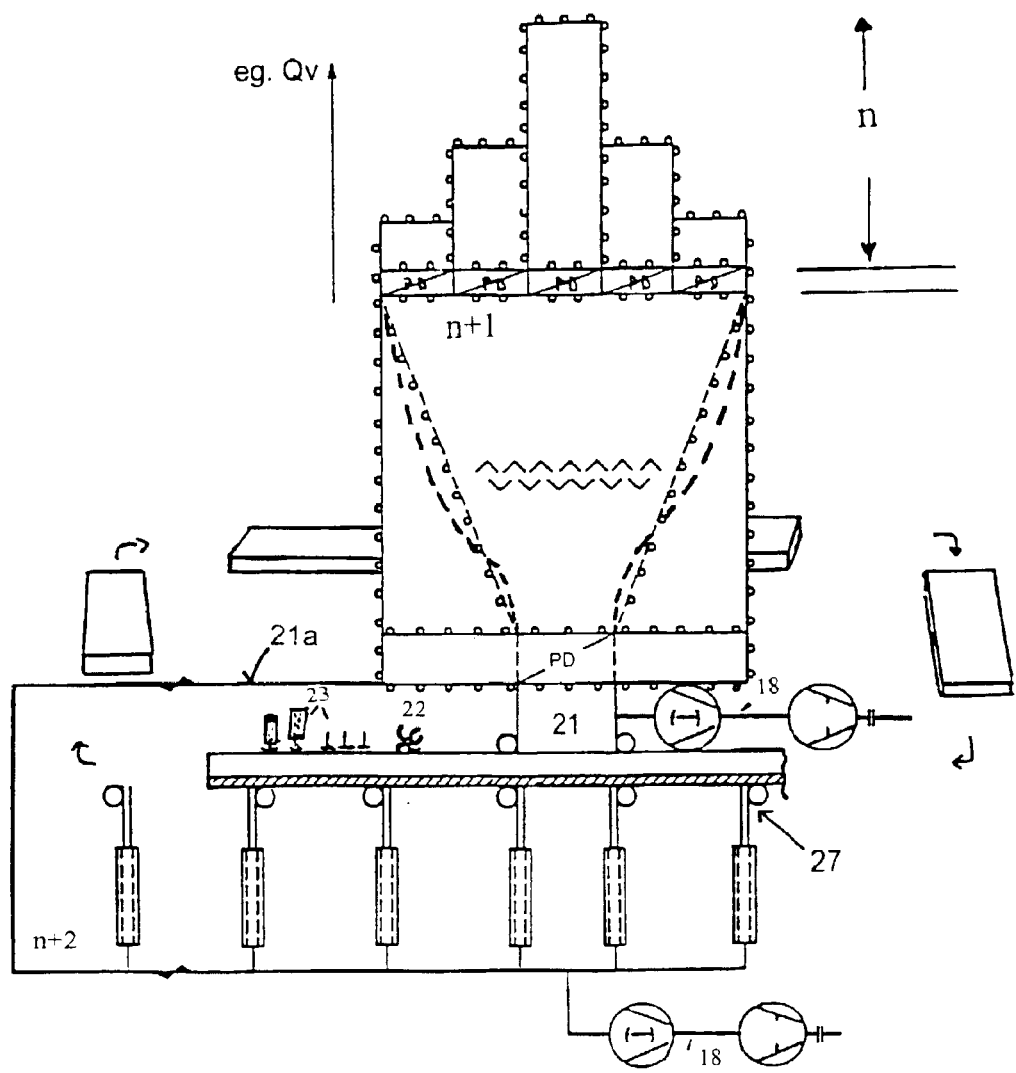
FIG. 95 As for FIG. 88, here with parallel arrangement of evaporation chambers in n-level (the height of which corresponding to the PD-controlled throughput $Q_v$ as is for elements with similar vapor pressures) followed by a mixing chamber eventually designed as a funnel or macroscopic Laval nozzle.
Figure 96:
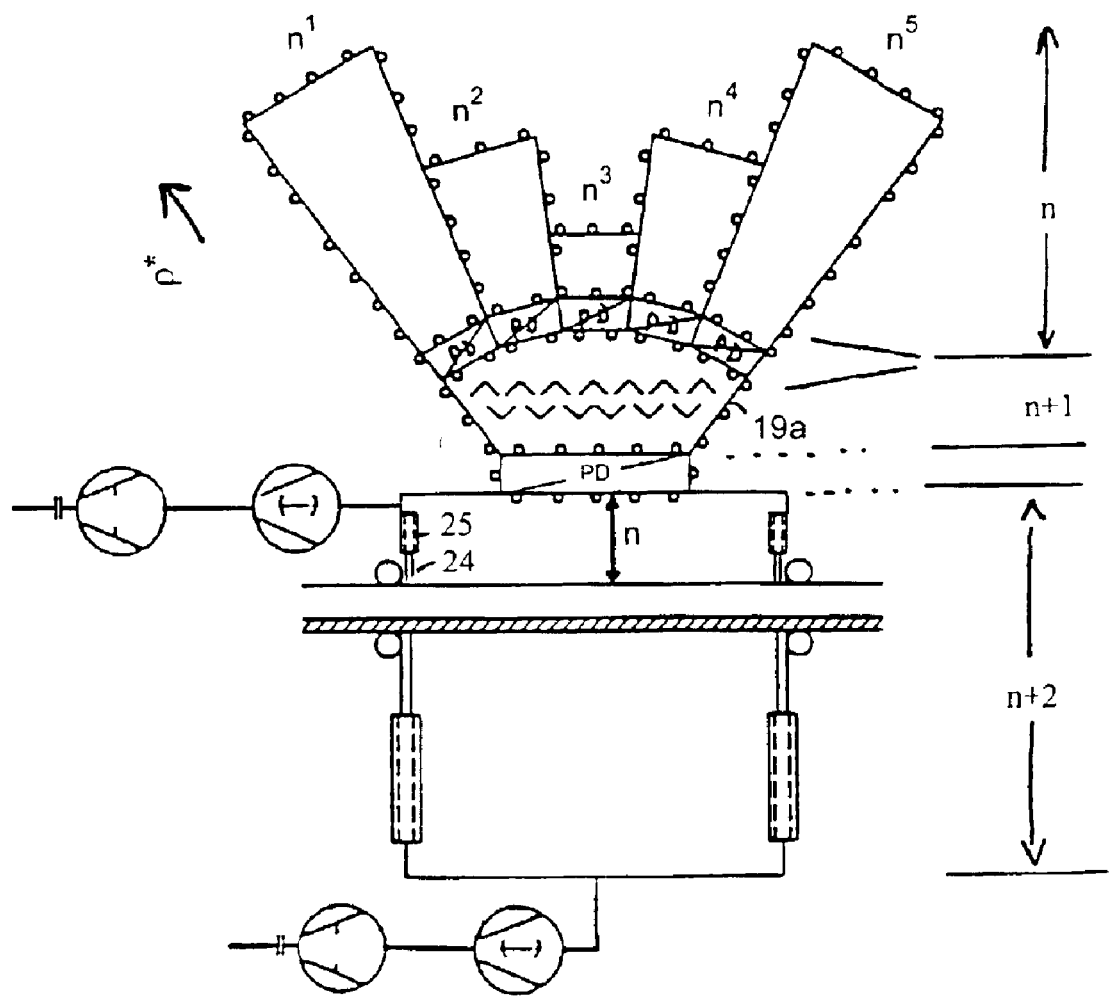
FIG. 96 "Parallel"-processing of evaporation in level "n" (the height of each evaporation chamber corresponding to the vapor pressure of corresponding element) in a porous membrane diaphragm (PD)—controlled and suction—and/or vapor pressure driven vapor deposition process, the evaporation chamber here arranged by way of a semi-circle around a mixing chamber (with baffle wall) in level (n+1).
Figure 97:
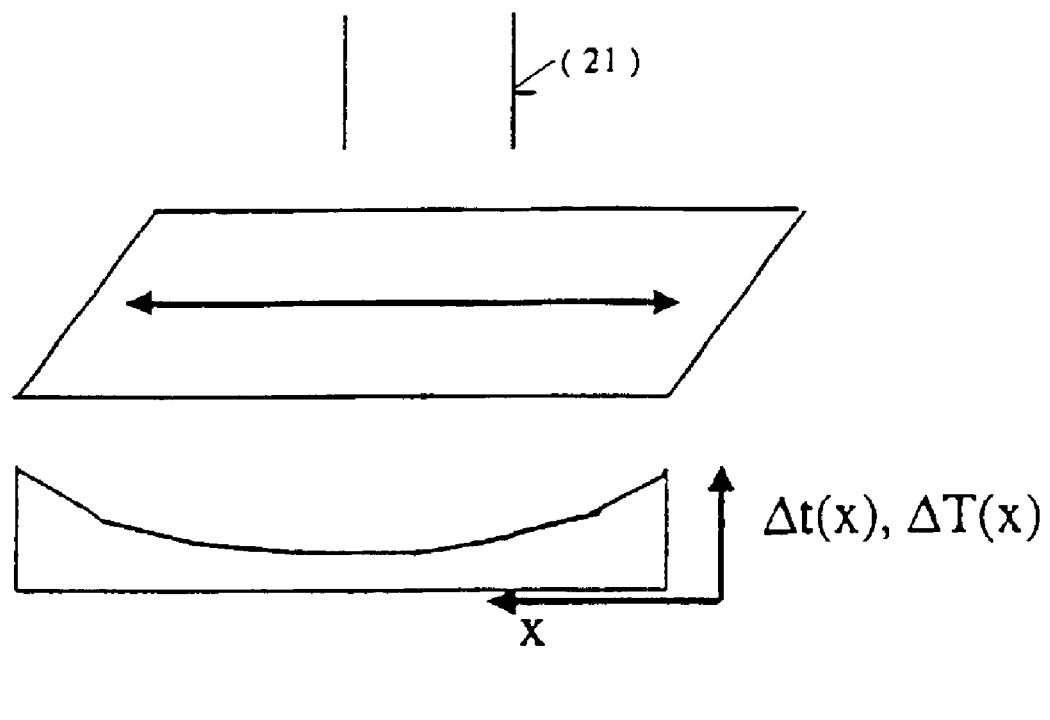
FIG. 97 Discontinuous temperature intervals $\Delta T=T_{max}-T_{min}$ in on deposit surface resulting from reciprocating movement of flat "plank"-collector passing a vapor deposition unit (21).

The best control of deposited vapor yield and/or the resulting efficiency per diaphragm element of a vapor deposition process overall driven by suction flow is given by a continuous batch process of plank collectors/condensers in the deposition level, the batch collector process thereby employing rectangular and flat condensers and resulting deposition surfaces, each of which partly covered by the overall diaphragm-outlet per pass (cf. FIGS. 95, 96 where FIG. 95 is as for FIG. 88, here with parallel arrangement of evaporation chambers in n-level (the height of which corresponding to the PD-controlled throughput $Q_v$ as is for elements with similar vapor pressures) followed by a mixing chamber eventually designed as a funnel or macroscopic Laval nozzle resulting in reduced cross-section of PD prior to vapor deposition in vapor deposition unit (21), the reduced PD-cross-section increasing freedom of transport of plank-condensers moving in a circuit batch process in level (n+2), where (22): micro-rolls, (23): pining-system, (21a): outer wall of vacuum unit outside the vapor deposition unit (21); (27): transport system with rolls of adjustable height, (18): vacuum pump system. PD=porous membrane "diaphragm" and FIG. 96 showing "parallel"-processing of evaporation in level "n" (the height of each evaporation chamber corresponding to the vapor pressure of corresponding element) in a porous membrane diaphragm (PD)-controlled and suction- and/or vapor pressure driven vapor deposition process, the evaporation chamber here arranged by way of a semi-circle around a mixing chamber (with baffle wall) in level (n+1) so that a major suction effect is transferred to chamber n³ in the center of the n-level. 24: movable separation wall; 25: flat hollow cylinder to accommodate (24).) and moving, in a given horizontal or vertical plane, either clockwise or anti-clockwise, i.e. in only one sense of the resulting circuit (cf. FIG. 97 showing discontinuous temperature intervals $\Delta T = T_{max} - T_{min}$ on deposit surface resulting from reciprocating movement of flat "plank"-collector passing a vapor deposition unit (21) $T_{max}$ is attained during vapor impingement on the deposition surface, while $T_{min}$ is attained in the last movement before the next following deposition pass. While a large absolute value of $T_{max}$ assures minimum porosity (i.e. prior to in-situ consolidation), $T_{max}$ may eventually exceed the transformation temperature of corresponding non-equilibrium alloy structure. Therefore, $\Delta T$ should be small, the control of which is best given by the condition $\delta\Delta T=0$.) and thereby describing a movement around the central axis of the overall deposition process (horizontal condenser plane) outside the range where the vapor is deposited, at least around the central axis of the deposition unit (which may be inclined at angle $0° < \delta_{dep} \leq 90°$ (cf. FIG. $_{98}$ showing the principle of continuous batch process using flat plank-collectors (PC): (top) showing "planar"-type of continuous process, i.e. condensers tilting (lateral) edge-on (le) by adapting (via tilt angle α) movement of velocity $V_{Kon}(2)$ which is larger than $V_{Kon}(1)$ during deposition pass (i.e. $V_{Kon}(1) < V_{Kon}(2)$), showing process principle $n_c^{min} = \frac{3}{2} n_d$, where $n_c^{min} =$ minimum number of condensers, $n_d$=corresponding number of diaphragms (PD) before deposition, while (bottom) showing "spatial"-type of continuous process with condensers tilting (front) face-on (ff) and requiring different planes (cf. tilt angle β) for the final diaphragm PD controlling the suction-driven overall VD-process.) with regard to final evaporation and/or mixing chamber and/or corresponding diaphragm.).

Compared to a reciprocating plank-collector, for example, the continuous batch process moving in one sense assures constant $\Delta T$-intervals between "exposure" to impinging vapor and outside, i.e. $\delta\Delta T=0$ (cf. FIG. 97). Compared to a (rotating-collector drum and collector disc, the continuous plank process provides uniformity and maximization of vapor accommodation factors due to constant deposition surface velocities and constant angles of impingement, i.e. minimization of components of different velocity vectors in the moment of atomic impact. The resultant deposit docs not explicitly provide curved surfaces so no need for pie-forming operations prior to conventional alloy conversion procedures into semi-finished and/or (final) product form. That is, the continuous batch process employing flat and rectangular (plate-(like)) collector(s)/condenser(s) provides the best conditions to control decoupling of throughput $Q_v(x)$ and underpressure in the final vacuum unit so near-net shape production (e.g. of sheet, plate etc.) at relatively high deposition rates, technically easy combinations of constructional variants of individual vacuum chambers and in particular the combination of one single and large final evaporation and/or mixing chamber with several individual, but communicating deposition units so a large variety of possibilities to control the overall process by fine tuning the involved parameters (transmembranic gradients of vacuum state, local deposit surface velocities etc., see above).

The technical details of the collector batch process are shown in FIGS. 96–103. According to FIGS. 96–103, the condensers and/or deposits are, accommodated by a vacuum chamber of the sections designated with (31) and (34), which move in (a) ring-like or (a) multi-angular (cf. 21a) vacuum chamber(s), the latter being positioned around a coaxial (hollow) shaft (13j) which accommodates a propulsion shaft (13i) for the transport of the overall collector system, the operation of transport thereby supported by pushing stamps (24), pushing and/or pulling jaws (25), claws (26) and other gripping devices as well as rolling tables (27). The hollow shafts are eventually accommodated in a coaxial tube (55) accommodating rotating/rotatable anti-friction bearings (56). The propulsion shaft (axle-tree) (13i) rotates around a rotation axis $A_R$ with an orientation which is independent on gravity vector g and being connected with the condensers by conducts for a chill medium, in particular a liquid such as nitrogen, water and/or oils, the conducts located concentrically in the internal cross-section of the tubes (not shown here). The chili-medium is distributed via a rotating distribution and collector (13d) to conduct it to the condensers and to return it to the refrigerating aggregate (13f).

Figure 99:
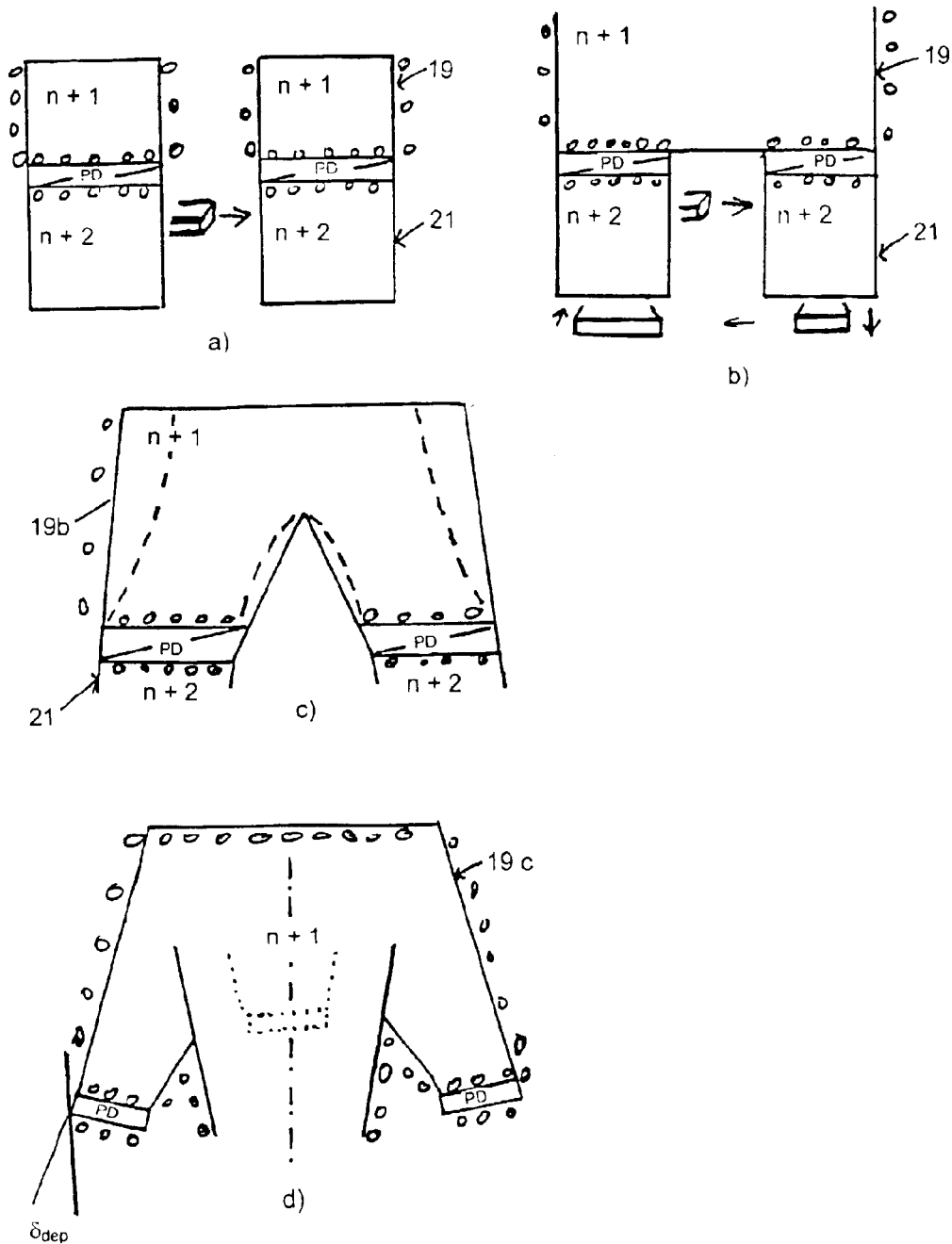
FIG. 99 Evolution of compact construction of suction-driven and PD-membrane controlled vapor deposition process (see a) to d)) for PC—condenser—circuit process providing $\delta\Delta T\rightarrow 0$ in deposition surface with a) each deposition unit (n+2) supplied with vapor from an individual mixing=and/or evaporation unit (n+1), and b)–d) common vapor source showing aerodynamic evolution of overall arrangement of process.

FIG. 99 shows the evolution of a compact construction of suction-driven and PD-membrane controlled vapor deposition process (see a) to d)) for PC-condenser-circuit process providing ($\delta\Delta T > 0$ in deposition surface with a) each deposition unit (n+2) supplied with vapor from an individual mixing- and/or evaporation unit (n+1), and b)–d) common vapor source showing aerodynamic evolution of overall arrangement of process providing increasingly decreasing macroscopic coefficients of pressure loss, ζ, (see US patent application Ser. No. 08/776,381).

Figure 101:
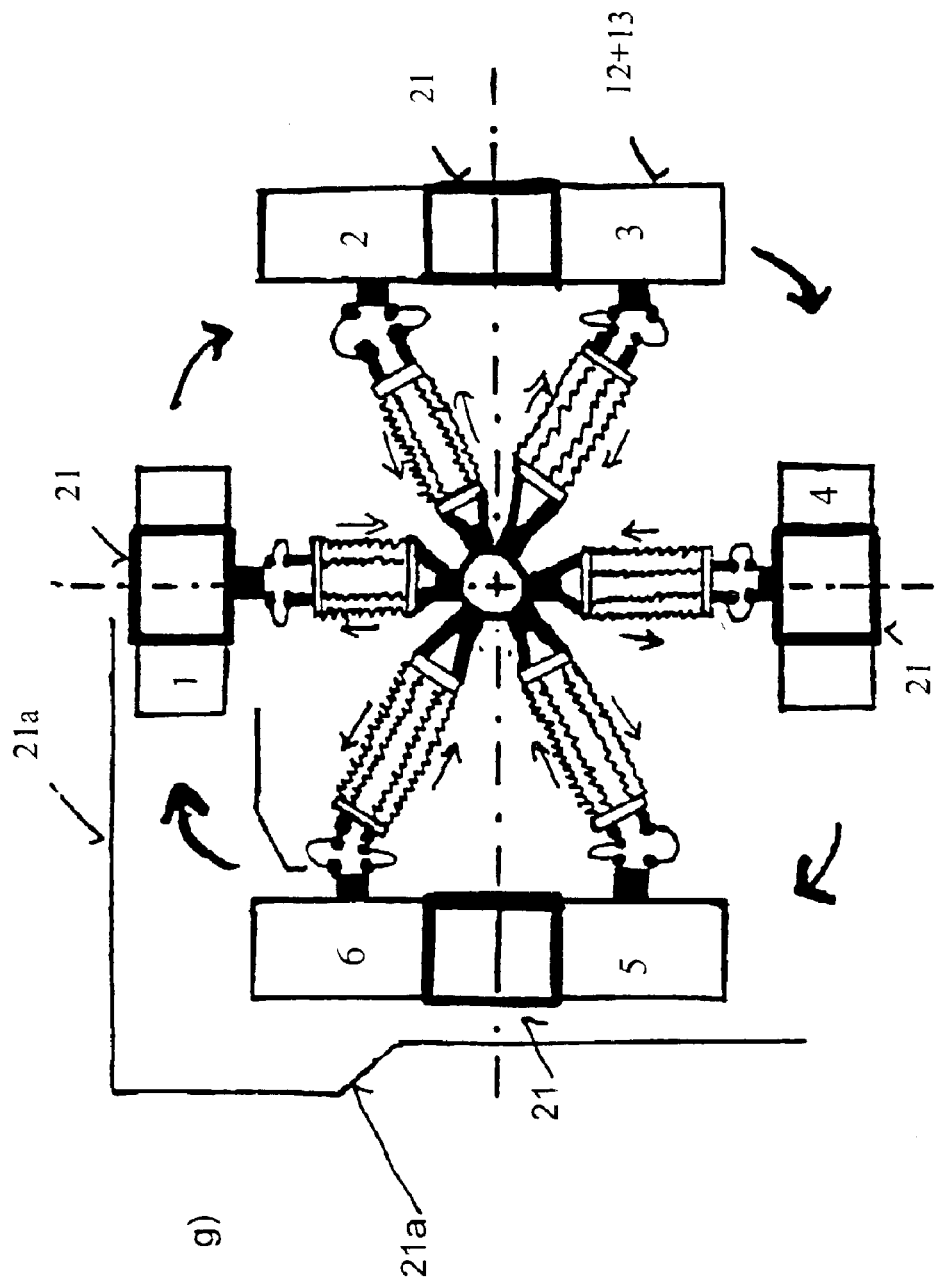
FIG. 101 As for FIG. 100, here including (21a): vacuum chamber extension to provide sufficient freedom of condenser movement between two successive deposition passes.

FIG. 100 depicts the "Top"-view, i.e. projection of "planar" condenser level from evaporation part of process following principle $n_c^{min} = \frac{3}{2} n_d$ with (top) $n_c^{min} = 6$ and (bottom) $n_c^{min} = 12$ (numbers in circles). (21): deposition chamber as before (i.e. top view of diaphragm); (12,13): condenser and corresponding deposit, respectively; (19d): wall of final mixing and/or evaporation chamber prior to diaphragm (see FIG. 101). (19): periphery of evaporation chamber more away from deposition/collector system. The process is g-independent. FIG. 101 is as for FIG. 100, here including further details such as (21a): vacuum chamber extension to provide sufficient freedom of condenser movement between two successive deposition passes (cf. also FIG. 102).

Figure 102:
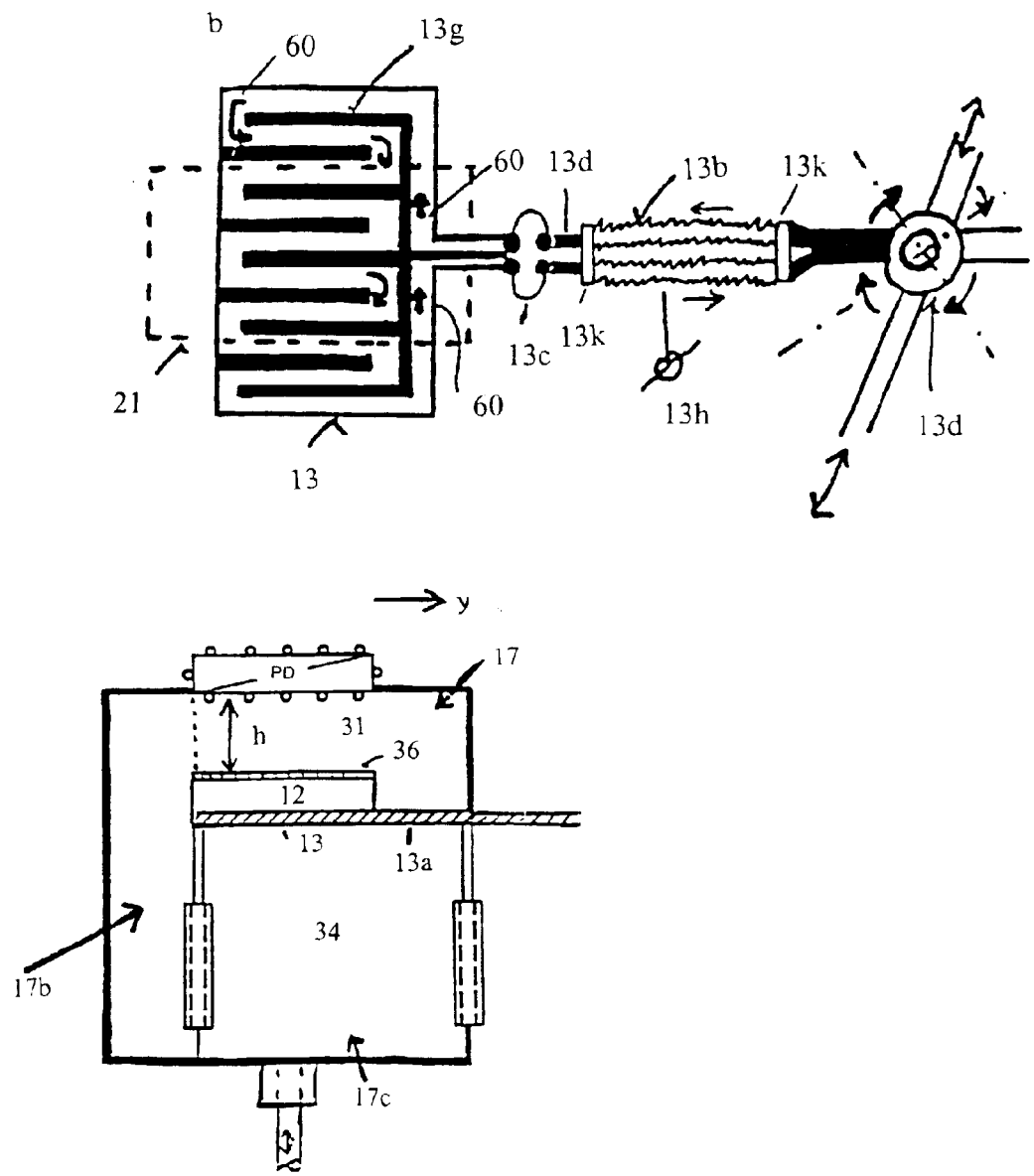
FIG. 102 Planar and vertical section of individual deposition unit as for FIGS. 96, 98 to 101 (top) with (13d) rotating distributor and collector of chill medium for (13) condenser (substrate) with (60) meander tunnel to conduct the chill medium in the condenser by using separation walls as to (13g) and (bottom) showing (31) upper and (34) lower part of vacuum chamber for deposition unit with (17): fix or movable, (17b): fix and (17c) movable separation wall between deposition unit and vacuum chamber.

In FIG. 102 a planar and vertical section of individual deposition unit is shown as for FIGS. 96, 98 to 101 (top) with (13d) rotating distributor and collector of chill medium for (13) condenser (substrate) with (60) meander tunnel to conduct the chill medium in the condenser by using separation walls as to (13g), the rotating distributor/collector being connected with the condenser (13) by (13c) a tube joint, (13a) rigid tubes, (13b) flexible (i.e. bendable and/or stretchable metallic) tubes connected with (13a) by means of a (13k) flange (gasket), the overall height/position of which being controlled by a micro-processing unit (13h), and (bottom) showing (31) upper and (34) lower part of vacuum chamber for deposition unit with (17): fix or movable, (17b): fix and (17c) movable separation wall between deposition unit and vacuum chamber for transport of the condenser with (12) in-situ consolidated deposit and (36) non-consolidated deposition layer.

Figure 103:
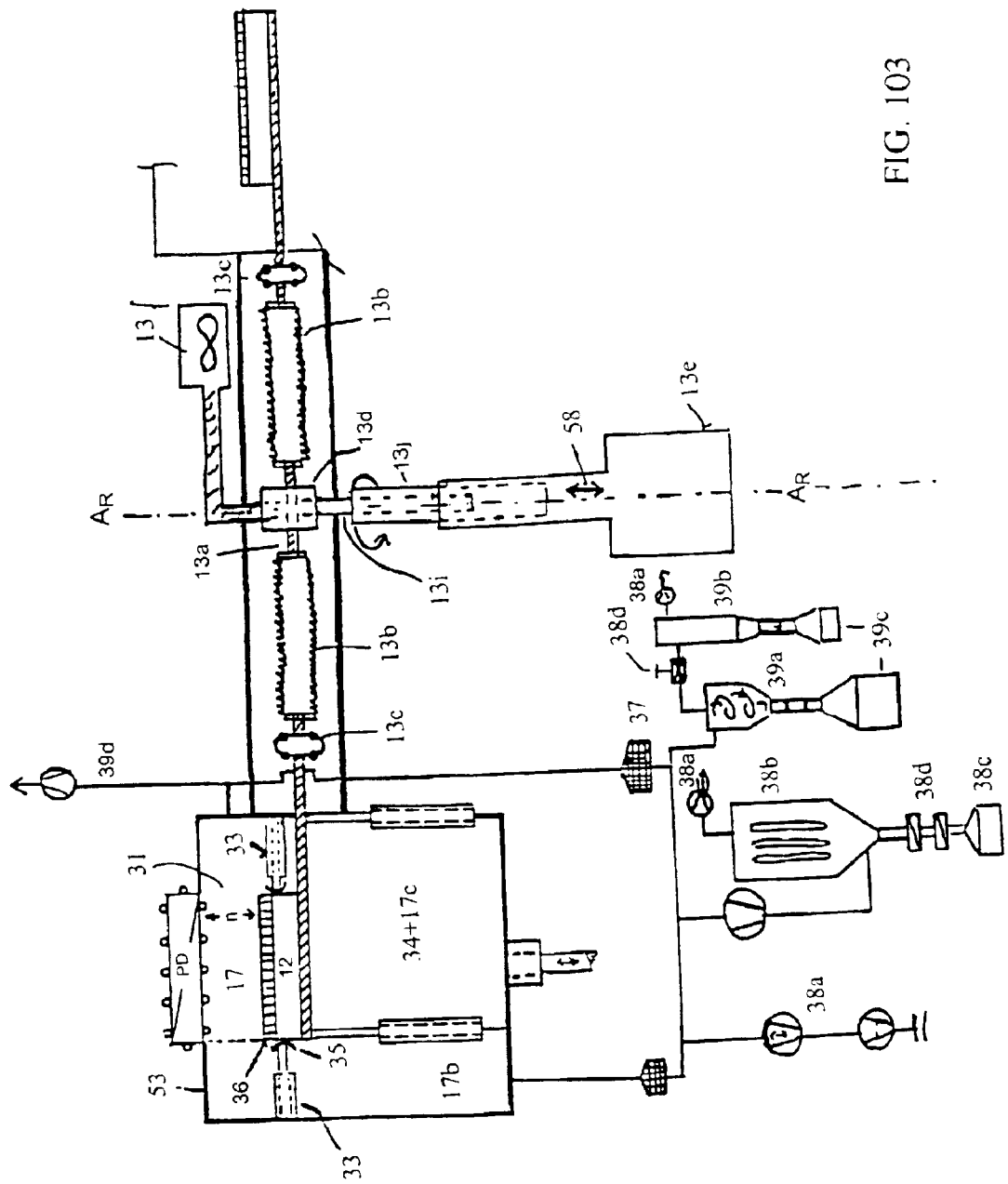
FIG. 103 Schematic including overall vertical cross-section of g-independent condenser-level of g-independent suction flow- or vapor pressure-driven vapor deposition plant of which the vapor throughput is controlled by a porous membrane PD.

FIG. 103 shows a schematic including overall vertical cross-section of g-independent condenser-level of g-independent suction flow- or vapor pressure-driven vapor deposition plant of which the vapor throughput is controlled by a porous membrane PD as for FIG. 102, here furthermore including: (33)=separation segment, (35)=scraper, (53)=top wall of vacuum chamber (deposition chamber), (13f)= cooling machine (refrigerating aggregate), (13i)=movable support bar, (13j)=tube accommodating support bar (13i), (13e)=motor drive for collector system, (58)=moving directions of (13i) and rest of collector system, (37)=barrier against flames, (38a)=vacuum pump system (e.g. including roots booster), (38b)=filter, (38c)=container/collecting tank for powder, (38d)=various valves, (39a)=cyclone, (39b)=gas purification/gas separation/gas washer=(39c) collecting container for powder, (39d)=pumping system with trap for residual vapors.

The condensers embrace chill tunnels being eventually arranged in form of a meander (rectangular condenser and disc and drum) and/or by a circular conducting sheet (disc type of condenser) allowing for optimized conductance efficiency and/or contact of the flow of the chill medium within the condenser (rectangular or disc) with the deposit (pre-form, layer, etc., see $1^{st}$ Embodiment). The bottom of (53) of the vacuum chamber(s) in the deposition level is adopted to the form of the vapor chimney, their transition from the evaporation- and/or mixing zone (cf. 19, 19b and 19c) toward the final diaphragm and the form of corresponding (final) diaphragm prior to deposition. Smaller and eventually pilot-plants with disc-type (circular) condenser(s) embrace a small concentric aperture in the vacuum chamber (51) for penetration of the hollow shaft (54). By contrast, the part (level) of the vacuum chamber (34) for the condensers-batch process comprises a slit-type and vacuum-tight, here not further described guide rail, in which the conductance for the supply of the condenser(s) with the chill medium moves by means of rotation around corresponding supply shaft. Accordingly, the entire distribution system for the chill medium including 13a to 13d and 13i is accommodated by one or two vacuum chamber(s) (cf. 13o) which increases, on the one hand, (dramatically) the overall volume of the vacuum chamber on the deposition/condenser level of the process, but makes on the other hand—the guide rail redundant. Both solutions combined so that the overall vacuum chamber system in the deposition level comprises several chambers, the resulting multiple vacuum chamber system with gradually decreasing vacuum pressures toward a) the deposition zone (21) (see also side view (31)), which is separated from b) the zone of in-situ consolidation (21a) by (eventually movable/moving) separation walls (17) and by (eventually movable/moving) separation segments (33) as well as from c) the lower part of the vacuum chamber (34) and finally from d) vacuum chamber (13o), which accommodates the supply system and conductance for the chill medium by providing a lowest possible vacuum chamber height and thereby either connecting the lower part of the vacuum chamber or being separated from them.

The large advantage of this condenser-batch circuit process is the application of constant lateral velocities $v_{Kon}$ of the deposition surface in contrast to the significantly varying surface velocities $\omega_{Kon}$ of a circular condenser. As a result, the process is controlled by constant $h_{eff}(F_0)$-values as a function of the y- and z-translation, i.e. the surface coordinates of the diaphragm, providing larger $\Delta h_{eff}$-ranges for the condition $\alpha_A = \alpha_T = 1$ and, accordingly, better controllable throughput and deposition powers $Q_v(x)$ and $Q_A$, respectively (see above).

5. Consequences/Conclusions

The claimed alloys were not only highly supersaturated, but they were also very ductile on bending as is indicated by the entire absence of second phases. Vapor deposition for supersaturated solid solutions of light rare earth metals and/or early transition metals and/or metalloids as well as selected simple metals in magnesium thus provides an outstanding avenue to develop passive magnesium alloys with a perspective for economically viable products.

Limited reproducibility of the resultant alloy composition has so far limited the productivity of vapor deposition. The diaphragm for the physical-type of gaseous osmoses by employing forced convection over the entire evaporation and vapor deposition process renders the reproducibility of alloy composition so final quality directly proportional to $dm=fn(dp)$ for S=constant so to the imposed pumping speed S and the resultant productivity of a given evaporation system. That is, an appropriate interface which is able to control $dm_D=fn(dp)$ increases alloy quality with increasing (imposed) pumping speed and productivity and this is the key point for vapor deposition technology to become industrialized. High productivity vapor deposition processes are applicable to the distillation of condensed matter including water, aqueous waste solutions including the more awkward cases involving poisonous constituents as well as for purification of metallic and other elemental species such as (commercially) pure magnesium, alkaline earth metals such as calcium, rare earth metals and aluminum, for example.

Vapor deposition is an "Umklapp" process of the fragmentation-growth normal issue in rapid solidification processing: the efficiency of non-equilibrium processing increases dramatically at the frontier of fragmentation on the atomic level and is given for granted by evaporation techniques. Front velocities are orders of magnitude larger than the sustainable growth velocity of the pre-form, plate, disc, layer, film, or whatever form of deposit. The more consequent methods to control vapor deposition processing therefore invert the principles used for rapid solidification from the melt: instead of control of fragmentation (which can never be done as good as by nature itself), vapor deposition requires rigorous control of condensation. The key of this control is the diaphragm which opens the commercial avenues into a new era of alloy synthesis and transformation. The ultimate barrier to succeed with rapid solidification is set by the competition between the degree of mass fragmentation and in-situ consolidation to form bulk components without the need to recur to powders. In-situ consolidation of a given non-equilibrium structure is limited by the effective scale of the growth normal which becomes practically identical with the growth normal of the deposit. Therefore, consideration of cooling rates and equilibrium thermodynamics have yet obstructed the view for the real potential of rapid solidification including in-situ consolidation to reverse fragmentation in a single operation. The era of rapid solidification is obliged to a major breakthrough. The productivity of optimum fragmentation and consolidation is directly coupled. Vapor deposition is the ultimate solution in materials science, since it involves atomic scale solidification paths so approaching zero-latent heat per discrete volume transformed, hence zero-recalescence and, as a universal consequence, practically unlimited scale of corresponding growth normals even for the largest possible departures from equilibrium.

The absence of recalescence not only allows for property jumps, it obliges to mass production of corresponding "super" materials. Vapor deposition is a continuous growth process along the normal to the solidification front, while rapid solidification from the melt is always a discontinuous process. Small children know the analogy: the chill effect of a condensed substance such as ether etc. on the skin does not disappear before the substance itself has disappeared.

As a result, thermal evaporation is inevitably linked with a distillation effect and this is given for granted as stainless steels by equilibrium ingot metallurgy. The invented process may therefore be considered as another form of "clean room" technology, a never underestimatable attribute in particular for those materials which are known to require demanding long term properties such as the resistance against fatigue, creep, damage tolerance and corrosion in weathered environments and which will improve phase selection by controlled nucleation in the future and which is a subject with particular importance for the production of semi-conductors such as porous silicon.

For reactive materials such as Mg, Al and Ti, alkaline and rare earth metals, for example, however, subsequent in-situ consolidation provides protection against contamination of the otherwise relatively unlimited surface area of the deposit and evaporated powder, respectively, by oxidization, inclusions due to processing etc. Therefore, any of the claimed process combinations of evaporation and/or mixing chamber units on the one hand and collector-containing units on the other transforms the materials property issue of advanced processing into a productivity-quality issue of advanced processing. The invented process configurations represent the most effective, i.e. the most productive and best quality fragmentation-consolidation configuration yet available independent on inherent materials parameters such as vapor pressure, specific heat, reactivity with $O_2$ etc.

The high-productivity evaporation is the inherent characteristic of the invented process and is independent on the vapor pressure of the elements jue to control of operating vapor pressures by means of diaprams. The univeral consequences of rapid solidification processing are dictated by the efficiency in materials fragmentation, chemical and structural homogeneity and subsequent consilidation. Evaporation and deposition of vaapor constitutes the ultimate level, since fragmentation so latent heat extraction arrives at the atomic length scale resulting in theoretically unlimited growth normal n per unit surface of metastable metallic alloyed and unalloyed phases. Therefore, evaporation and deposition of vapor represents a dramatic threshold (an "Umklapprozess") for the efficiency of advanced processing.

With the invented process it is now possible to explore and exploit this potential for the first time. Physically speaking, vapor deposition isolates the property-controlling alloy conversion step and reduces phase transformation during the change of the physical state down to an individual atom. Isolation during processing of the individual atom, however, provides the universal threshold compared to conventional materials and composites: the constituting forces between the components controlling material properties move from the never satisfying phase boundaries to the interatomic forces controlled by the electronic structure of the involved components in the translational lattice or amorphous structure thereby overrunning equilibrium thermodynamics. Characteristic length scales move from the micron-range into the Angstrom-range and this explain partly the technology jumps bound to come and which deviates from the rule of mixtures. The permutation possibilities of materials enhanced by conventional composite technology are thereby not limited, but increased even further. A material as simple as magnesium allows already $10^{36}$ completely new alloy systems and reaches more than $10^{100}$ new alloy systems when including established alloy chemistry. Refractory atoms supersaturated in solid Mg-base non-equilibrium structures allow to supercede any form of increase in Young's modulus via the rule of mixtures and this has strong implications for the entire industry. However, the chemical aspect has so far entirely obscured that the alloy-independent microstructure controls the rest of it. The historical superlatives bound to be realized with the present technology include:

Economically viable nano-crystalline materials

Economically viable massive parts via the vapor phase

Economically viable ultra-pure alloys

Economically viable high performance magnesium

Rapid increase of the diversity and availability of economically viable high performance structural and functional materials such as "solar silicon", in particular for light (and reactive) metals.

The innovative value and depth of the invention is reflected in the Technical Solutions at the end of this document. The entire absence of vapor deposition in the real world of alloy synthesis requires to explore conventional casting opportunities and justifies to employ solid state syntheses methods. However, nobody has yet forwarded a universally applicable method to patent materials and processes made by solid synthesis techniques. As for passivation magnesium alloys, the key to solve the problem of patenting ball milled (i.e. mechanically alloyed) (light) alloys in a unique way is to derive a hierarchy of operating variables which control the process. This is done in the third part of the invention (see below).

6. Casting Alloys Including Spray Forming

Kamado et al. reported (S. Kamado, Y. Kojima, Y. Negishi and S. Iwasawa, R. Ninomiya, *Light Metals Processing and Applications*, Quebec City, Quebec Canada, 29 Aug.–1 Sep. 1993, Canadian Institute of Mining, Metallurgy and Petroleum, Montreal, Quebec H3Z 3B8, Canada, 1993, pp. 849–858) on the effect of solution treatment and aging of Mg—Gd and Mg—Dy solid solutions in 3 wt. % NaCl aqueous solution. After aging at 200° C., the alloys showed the best improvements and this is consistent with the observations made in the present study with Mg-calcium splats, for example (see above) due to the more negative standard electrode potential of the alloying addition concerned. Kamado et al. did not report, however, on the effect of porosity of their alloys, though the alloys were in the as-cast (i.e. as-poured (microstructural) ingot-) shape without having been subjected to mechanical working by (hot or cold) forming operations. Furthermore, Kamado et al. did not report on the size of the employed melt, resultant ingot size including cross-section, slab thickness and resultant effect on microstructural scale, but they concluded instead that corrosion resistance increased with decreasing volume fraction of "eutectic compound". The comparison of the corrosion resistance of the as-cast vs. peak-aged Mg—Gd and Mg—Dy (based) alloys showed, however, that second phase separation from the ingot-processed melt is detrimental compared to corresponding solutionized and (peak-) aged condition in any case independent on whether the separated compound is "eutectic" in nature or not. A size effect on corrosion behavior was evident instead in that the as-cast microstructure with a grain size well above 100 $\mu$m (and resultant intra- and transgranular phase separated from the melt) appeared relatively coarse, while corresponding type of solid state precipitates in the peak-aged condition are inevitably 2 to 3 orders of magnitude smaller. Size effects of compounds on corrosion behavior were reported earlier for the Mg—Y system (cf. F. Hehmann, F. Sommer and H. Jones, Extension of Solid Solubility of Yttrium and Rare Earth Metals in Magnesium by Rapid Solidification, *Processing of Structural Metals by Rapid Soldification*, eds. F. H. Froes and S. J. Savage, American Society for Metals, Metals Park, Ohio, 1987, pp. 379–398). Kamado et al. did not separate the effect of individual alloying elements from the effect of impurities on resultant corrosion. It was interesting to see, however, that the work by Kamado et al. confirmed earlier work by the author in that yttrium kept in solid solution of Mg is not beneficial compared to precipitation of yttrium by way of fine $Mg_aY_b$-dispersoids such as obtainable upon "peak"-aging. Attractive casting alloys in view of the aforecited relevant criteria for stainless magnesium are offered by the quaternary Mg—Sc—Mn—Zr system eventually doped with aluminum and alkaline earth of the type [at. % Al]=2*[at. % Ca] to develop finely dispersed alkaline earth aluminides. Sc is light and may provide the surface characteristics of titanium in magnesium. On the other hand, Zr and Mn are peritectic systems as Mg—Sc without restricting the large solubility of Sc in cph-Mg at lower levels (see phase diagram review by Rohklin et al.). The unstable solid solution of Ca and Al provides the increment in corrosion resistance by microcathodic protection (see above) as is required for engineering alloys of the otherwise soft Mg—Sc solid solution. The decoupling of precipitation from the eventual effect of homogenous solute distribution on the Pilling-Bedworth ratio of the MgO-based oxide was yet not pursued by the Japanese collaborators.

It has been tried to introduce Al-base powders made from spray-formed (SF) billets for almost 10 years now, but major success is yet to be seen. A pilot production plant for the manufacturing of as-sprayed Al-sheets is currently being aimed at exploring this low cost/high volume route via optimized design and operating conditions of linear atomization systems. Reduced numbers of hot rolling steps combined with more effective use of feed stock of spray-formed Al-alloys were considered to result in a total cost saving of 13% over the conventional ingot casting and hot rolling route. Attractive combinations of yield strength (521 MPa in longitudinal direction), thermal stability of yield strength (400 MPa at 200° C.) and stress rupture resistance was recently reported for SF Al-6.2Cu-1.8Mn-0.4Mg-0.3Zr-0.3V-0.4Ag extrusions as well as for 2618-extrusions made from spray formed billets, but fracture toughness (e.g. 17 MPa m$^{0.5}$) for the former alloy was rather poor in the high strength condition. The alloys did not show susceptibility to stress corrosion cracking, however, and were considered for HT airframe applications and, after optimization, for strength and durability critical airframe components. Fracture toughness values >30 MPa m$^{0.5}$ were reported (D. J. Chellmann, T. D. Bayha, Q. Li and F. E. Wawner, Property Begaviour of High Temperature Spray Deposited Al—Cu—Mg—X Alloys, *Proc. Second Int. Conf on Spray Forming*, 13–15 Sep., 1993, ed. J. V. Wood, Woodhead Publishing Ltd., 1993, pp. 427–435, i.e. ref 160a instead 60) for SF Al-5Cu-0.5Mn at yield strength 430 MPa as well as for SF Al-10Zn-2Mg-1Cu-0.2Zr with 34 MPa m$^{0.5}$ at yield strength 560 MPa in the as-extruded condition, for example. From FIGS. 141 to 144 it is evident, however, that the driving force to employ advanced magnesium alloys instead of aluminum alloys is about four times larger provided, the corrosion problem was solved as to the present invention(s). Part III of the Invention: Ball, Bar and Rod Milling (Mechanical Alloying, Mechanical Grinding and/or Chemical (i.e. Reaction) Alloying) for Non-Equilibrium Phases
1. Limitations of the Mg Alloy Development by All-Liquid Processing and by Vapor Deposition The motivation to employ mechanical alloying to develop corrosion resistant Mg-alloys with improved modulus of elasticity stems from the limitations in the alloy synthesis set by processing from a) the liquid phase (which is mainly related to the constitution of the (available) Mg-based phase diagrams, i.e. the low solubility of useful elements in (i) the liquid excluding them from all-liquid synthesis and (ii) in the solid resulting in partition coefficients $k_0$ far from unity) and b) from the vapor phase which is mainly related to the absence of any relevant and economically viable VD-process to date (cf. F. Hehmann, High performance light alloys by rapid quenching, European patent application EP 94111991.9, Aug. 1, 1994). Furthermore, MA leads eventually to a nanocrystralline microstructure of equilibrium and/or non-equilibrium matrix phases and/or second phase dispersions so fulfilling in particular the three conditions for commercialization of non-equilibrium Mg-alloys (cf. p. 68 above). The segregations in the predendrites of FIGS. 8–10 triggering the corrosion in corresponding alloys are orders of magnitude larger than the limit for microstructural refinement set by shear stress occuring upon ball milling, for example (cf. p. 89 ff.).

The more sophisticated route of rapid solidification processing (RSP) of Mg—Al—Zn based alloys from the melt has arrived at the following advantages over conventionally processed Mg-alloys and the available Al-alloys (G. Neite, K. Kubota, K. Higashi and F. Hehmann, *Mg-Based Alloys*, in: *Structure and Properties of Nonferrous Alloys*, ed. K. H. Matucha, Vol. 8 of Encyclopedia *Materials Science and Technology*, eds. R. W. Cahn, P. Haasen and E. J. Krämer, VCH Weinheim, P.O. Box 10 11 61, D-6940 Weinheim, RFA, October 1996; F. Hehmann and F. H. Froes, Advances in light weight non-ferrous PM-metals, *Proc. Int. Conf. PM '94, Powder Metallurgy World Congress*, Vol. III, Les Editions de Physiques des Ulis, B. P. 112, F-91944 Les Ulis Cedex A, 1994, pp. 1591–1604):

1. An improvement of 40 to 60% in room temperature ultimate tensile strength (UTS) over conventional ingot processed Mg-alloys and the specific UTS of the strongest Al-alloys.
2. An increase in the ratio of compressive-to-tensile yield strength from 0.7 to a value of >1.1.
3. The resultant specific yield strengths of RSP Mg-base engineering alloys exceed those of I/M Mg- and Al-alloys by 52–98% in tension and 45–230% in compression.
4. The resultant values of elongation-to-fracture are within 5 and 15% for the as-extruded state and can be tailored to 22% by subsequent thermo-mechanical processing at the expense of moderate losses in strength. However, corresponding strength values are then still 150–200 MPa higher than for IUM Mg-alloys.
5. The atmospheric corrosion behavior of the RSP Mg-alloys is in the range of the new high purity and conventionally processed alloys AZ91 E and WE43 and the corrosion resistant Al-alloy 2014-T6. Corresponding corrosions are two orders of magnitude smaller than for those Mg-alloys that have caused spectacular failure in the 1950s to the 1970s.
6. RS Mg-base alloys show superior superplastic deformation behavior at temperatures above 100° C. as compared to other light alloys and doubled resistance to fatigue as a result of substantial grain refinement cf. ingot metallurgy.

Chill-block, i.e. rapidly quenched Mg—Al—Zn base alloys are therefore primarily designed for applications at ambient temperature and where compressive loading is of major concern, while galvanic problems and resistance to (long-term) atmospheric corrosion, fracture and fatigue may eventually be solved otherwise. It shall be noted that none of the research programs on RSP Mg—Li alloys have yet attained the specific strength levels of RS Mg—Al—Zn-base alloys. The specific strength formed prime motivation for RS Mg—Li research projects (cf. F. Hehmann, Research on MgLi and a specifically German consequence (in German), *METALL* 48 (5), 1994, p. 377–381).

Figure 104:
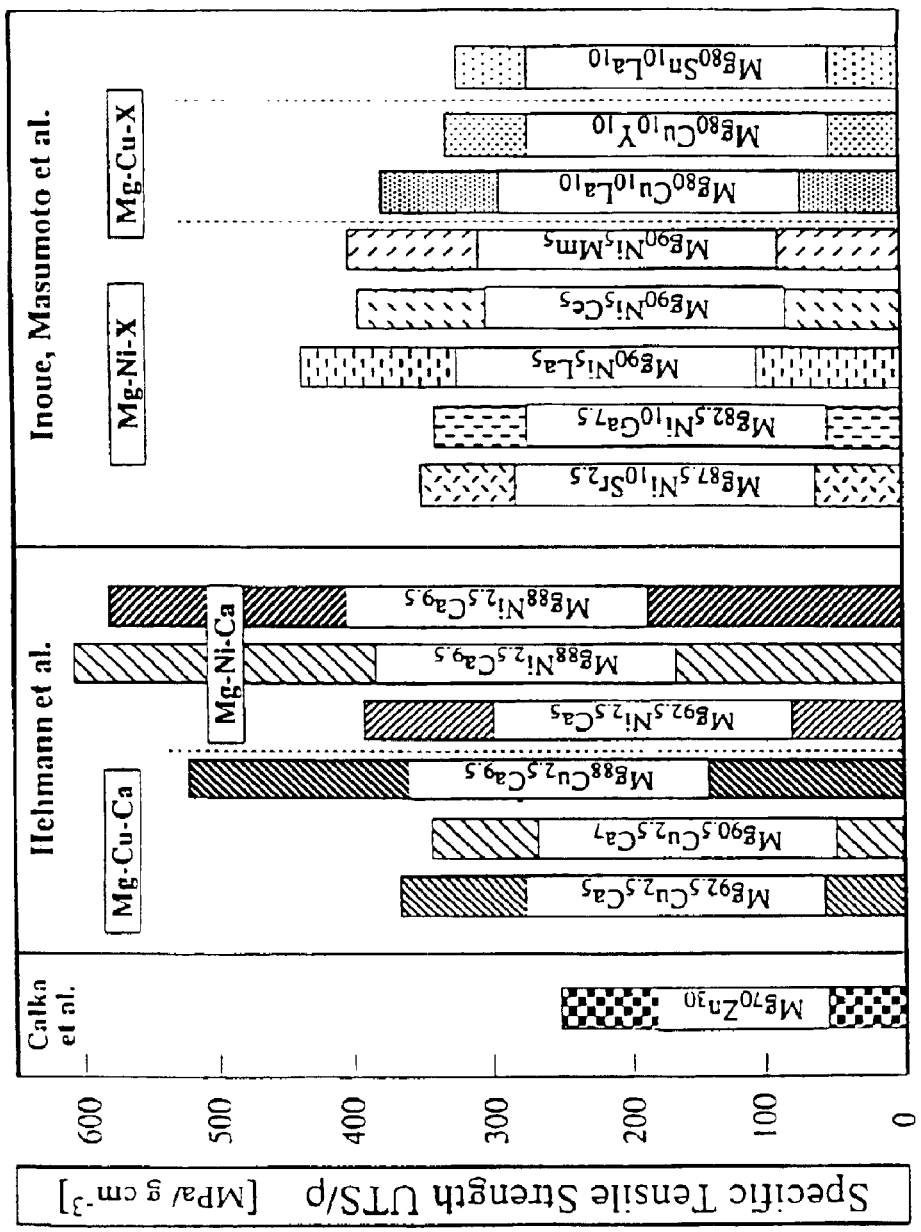
FIG. 104 Specific tensile strength values of amorphous Mg-alloys by rapid solidification processing (RSP) reported between 1977 and 1992.

Results from metastable non-equilibrium Mg-phases, however, were particularly promising at least in this respect, but they were not yet sufficient to solve the corrosion problem of magnesium. Hehmann and co-workers found exceptionally high hardness values in splat-cooled and partially amorphous Mg—Ni and Mg—Ce foils (F. Hehmann, Final report on *SUMAC Job No* 37401, The University of Sheffield, 29 Jun. 1985), which then led to the development of fully and partially amorphous Mg—Ni—Ca alloys with outstanding UTS-values of up to 1150 MPa or the highest specific stregth values ever reported for a metallic material (i.e. up to 600 MPa/g cm$^{-3}$, see FIG. 104 showing specific tensile strength values of amorphous Mg-alloys by rapid solidification processing (RSP) reported between 1977 and 1992. From G. Neite, K. Kubota, K.

Higashi and F. Hehmann, Mg-Based Alloys, in: *Structure and Properties of Nonferrous Alloys*, ed. K. H. Matucha, Vol. 8 of Encyclopedia *Materials Science and Technology*, eds. R. W. Cahn, P. Haasen and E. J. Krämer, VCH Weinheim, P.O. Box 10 11 61, D-6940 Weinheim, RFA, October 1996; see: F. Hehmann, S. Krishnamurthy, E. Robertson, A. G. Jackson, S. J. Savage and F. H. Froes, in *Horizons of Powder Metallurgy, Part II*, Verlag Schmid, Freiburg 1986, pp. 1001–1008; F. Hehmann, Final Report on *Contract F* 33615-84-*C*-5127, Task no 28 and 54, Wright-Patterson AFB, 15 Feb. 1986; F. Hehmann, S. Krishnamurthy, E. Robertson, S. J. Savage, F. H. Froes and USAF, U.S. Pat. No. 4,770,850, 13. September 1988.). Subsequent work by Inoue et al. (A. Inoue, U. Nakano, Y. Bizen, T. Masumoto and H. S. Chen, Jap. *J. Appl. Physics* 27 (6), 1988, pp. L944–L947; A. Inoue, K. Ohtera, K. Kita and T. Masumoto, Jap. *J. Appl. Physics* 27 (12), 1988, pp. L2248–L2251; A. Inoue, M. Kohinata, A. P. Tsai and T. Masumoto, *Mat. Trans JIM* 30 (5), 1989, pp. 378–381; A. Inoue, A. Kato, T. Zhang, S. G. Kim and T. Masumoto, *Mat. Trans JIM* 32 (7), 1991, pp. 609–616; K. Aikawa and K. Taketani, European Patent 0407964, 16. 01. 1991) and by Masumoto et al. (T. Masumoto, A. Inoue, T. Sakuma and T. Shibata, U.S. Pat. No. 5,118,368, Jun. 2, 1992) in similar ternary systems by adding Sr, Ga, La, Ce, misch-metal and Y to RS Mg—Ni and Mg—Cu base alloys led to UTS-values above 1000 MPa with a specific tensile strength of 436 MPa/g*cm$^{-3}$ for amorphous $Mg_{90}Ni_5La_5$ (cf. FIG. 104). The observed coupling factor $k_H$ for UTS=$k_H$* micro-hardness ranged from 3.3–3.7. Other features include (i) crystallization doublets at temperatures $T_x$ between 120° and 200° C. upon DSC indicating the high susceptibility to natural aging, (ii) pronounced glass transition temperatures as were evident for more thermally stable glasses with $T_x$>200° C., (iii) relatively large T-intervals of up to 60 K between the observed glass transition and crystallization temperatures and (iv) significant softening prior to crystallization at temperatures above 50° C. It is questionable whether these amorphous alloys will find applications in view of their low thermal stability, high susceptibility to corrosion after transformation into the heterogeneous phase mixture and/or higher densities relative to pure Mg (i.e. to some extend far above that of Al).

The development of metastable phases has since concentrated on amorphous Mg—Ni and Mg—Cu base alloys by chill-mold type of casting methods, for example, which was reported to be sufficient to yield amorphous cross-sections of critical thickness up to 4.0 mm in $Mg_{80}Y_{10}Cu_{10}$-(A. Inoue, A. Kato, T. Zhang, S. G. Kim and T. Masumoto, *Mat. Trans JIM* 32 (7), 1991, pp. 609–616) and 3.5 mm in amorphous $Mg_{65}Ni_{20}Nd_{15}$-alloys (Y. Li, H. A. Davies and H. Jones, *Proc. Conf. Magnesium Alloys and Their Application*, eds. B. L. Mordike and F. Hehmann, DGM, Oberursel, 1992, pp. 551–557). The structural state of the under-cooled liquid including (i) the large increase in viscosity with increasing undercooling as is given by the Vogel-Fulcher-type of viscosity and (ii) dissimilarity in short-range ordering of the liquid compared to corresponding equilibrium crystalline long-range orders have supported easy glass formation in these Mg-base systems (F. Sommer, a) priv; communication to F. Hehmann; b) on-going work by F. Sommer). Due to the large increase in viscosity, the growth models by Kurz and Trivedi (W. Kurz, B. Giovanola and R. Trivedi, *Acta metall.* 35, 1987, pp. 823; P. Lipton, W. Kurz and R. Trivedi, *Acta metall.* 35, 1987, pp. 957) showed a dramatic decrease with increasing levels of alloying to Mg in front velocity required to generate massive solidification (G. Neite, K. Kubota, K. Higashi and F. Hehmann, *Mg-Based Alloys*, in: *Structure and Properties of Nonferrous Alloys*, ed. K. H. Matucha, Vol. 8 of Encyclopedia *Materials Science and Technology*, eds. R. W. Cahn, P. Haasen and E. J. Krämer, VCH Weinheim, P.O. Box 10 11 61, D-6940 Weinheim, RFA, October 1996; W. J. Boettinger, L. Bendersky and J. G. Early, *Met. Trans.* 17*A*, 1986, pp. 781–790).

From an atomic point of view, the addition of refractory metals such as Ti, Nb, Ta, Mo, W, Zr, Cr, Mn, Hf etc. would not only increase the viscosity of the Mg-melt, but in particular the thermal stability, the modulus of elasticity and the resistance to corrosion of corresponding solid non-equilibrium Mg-phases due to the electronic structure and resultant high melting point of these TM, for example. Unfortunately, these TM are not soluble in liquid Mg above negligible alloying levels. While the above advantages no 1.

6. originate in the refined microstructure including temperature-stable intermetallic dispersions, mechanical alloying not only embraces such advantages as a universal consequence, but it also offers particular promising avenues for metastable Mg-base phases incorporating the above refractory metals for a cost-effective advantage over carbon-reinforced organic matrix composites (CFC) provided, that an hierarchization and quantification of corresponding universally applicable milling parameters can be identified (cf. below).

The major merit of RSP has been to show the limitations imposed by all-liquid processing on the properties of Mg-alloys. Choice and level of useful alloying to Mg are more restricted than for Al and steel and require concerted Mg-development programs which will have to be independent on traditional all-liquid processing for the metallic Mg-matrix (!). Together with minor relaxations of regulations for use of Mg in aerospace vapor- and solid state synthesis by VD- and MA-technologies will initialize an era of important use of Mg in aerospace and elsewhere (cf. R. Levoy and Chr. Mauhé, *report to the Sécrétariat Général de la Défense Nationale*, 51 Bld. de Latour-Maubourg, 75700 Paris, 31 January, 1992). Numerous applications as summarized in the 15$^{th}$ Embodiment are possible by non-equilibrium methods such as MA and VD (cf. F. Hehmann, Diversity and Innovations: Key to the Structural Magnesium Market, *JOM* 45 (11), 1993, p. 27–29). Prime barrier & challenge remain the absence of a self-healing passive surface film of current Mg-alloys that provides better corrosion resistance than high-purity magnesium as the reference coupled with improved modulus of elasticity. From the view-point of magnesium, this situation embraces strong similarities to that of steel-development more than hundred years ago and the prime question is how rapidly the "champion" based on Mg can be achieved.

2. Status of Mechanical Alloying of Light Alloys

The motivation to employ mechanical alloying as the alternative route toward improved corrosion resistance, elastic modulus and thermal stability of structural (non-equilibrium) Mg-alloys and to produce a more cost-effective material than CFC includes mechanical working of solid Mg-base mixtures by ball milling, mechanical grinding and/or chemical (i.e. reaction) alloying is to increase the latitude of (i) alloying elements, (ii) metastable matrix phases and (iii) microstructures of existing and novel alloys as to (i) and (ii). Mechanical alloying has the advantage to readily include alloying additions such as metalloids and transition (Zr, V, Ti, Nb, Ta, Mo, W, Hf etc.) and rare earth metals with high melting points to Mg. They were shown (see above) to be important elements in order to solve the corrosion problem of Mg-alloys likewise combined with the attractive mechanical properties reported for all-liquid processed metastable non-equilibrium phases (see above) when homogeneously distributed on an atomic length scale. The experimental and/or processing conditions to achieve metastable (non-equilibrium) phases are more readily available by mechanical alloying. Alloying elements with very low vapor pressures such as Ta and Mo as well as high-melting (and boiling) intermetallic compositions can be readily employed and embedded in metastable phases by mechanical alloying. Fabrication of relatively large MA powder quantities represents a particular advantage over current vapor deposition technology for massive components for which no productive and economically viable method has been developed to date. The up-scaling of a (pre-) industrial pilot plant for mechanical alloying of corrosion resistant (non-equilibrium) Mg-alloys involves less unknown parameters as compared to a condensation-free vapor deposition process of controlled productivity (cf. F. Hehmann, High performance light alloys by rapid quenching, European patent application EP 94111991.9, Aug. 1, 1994). However, the development of Mg alloys by mechanical alloying has been limited to date to isolated studies without achieving the development stage of Al-and Ti-based alloys.

Mechanical alloying (ball, bar and rod milling involving chemical reactions and/or grinding or not) helps in many ways to complete the solid parts of the equilibrium and non-equilibrium phase diagrams that are obscured to date due to liquid immiscibility excluding the production of corresponding alloys via the liquid state. Recent structural results include the extended solid solubilities of up to 6 at. % Mg in solid solution of $\alpha$Ti (R. Sundaresan and F. H. Froes, *Key Engng. Mater.* 29–31, 1989, p. 199) as well as glass formation ranges in binary and ternary Ti-systems that were expanded with regard to corresponding rapidly solidified Ti-alloys (H. Kimura, M. Kimura and F. Takada, *J. Less-Common Metals* 140, 1988, p. 113). Mechanical alloying of more dilute Ti-alloys containing 6 at. % Mg and 10 at. % Cu resulted in grains of size 6 to 15 nm (C. Suryanarayana and F. H. Froes, *J. Mater. Res.* 5, 1990, p. 1880; C. Suryanarayana, R. Sundaresan and F. H. Froes, in *Structural Applications of Mechanical Alloying*, eds. F. H. Froes and J. J. deBarbadillo, ASM International, p. 193). Microstructural refinement of the crystalline state was considered (E. Hellstern, H. J. Fecht, C. Garland and W. L. Johnson, in *Multicomponent Ultrafine Microstructure* eds. L. E. Mc Candish, D. E. Polk, R. W. Siegel and B. H. Kear, Mat. Res. Soc. Pittsburgh, Pa., Vol. 132, 1989, p. 137) to be limited by the shear stress imposed on dislocation movement. Amorphous $Ti_{42}Al_{58}$ made by sputtering transformed into crystalline grains of size 10 nm (H. Chang, H. J. Höfler, C. J. Altstetter and R. S. Averback, *Scripta Metall. Mater.* 25, 1991, p. 1161), while refinement of $Ti_{42}Al_{58}$ by MA without formation and devitrification of an amorphous precursor reached a grain size of 20 nm or so (J. H. Ahn, H. S. Chung, R. Watanabe and Y. H. Park, *Mater. Sci. Forum* 88–90, 1992, p. 347). Amorphous Ti-base phases were achieved after 9 h for Ti-10 Cu over 11 to 64 h for Ti-15 to 50 Ni, 17 h for Ti-15 to 50 Pd and 25 h for Ti-25 to 50 Si to up to 64 h for Ti-50 Co and Ti-50 Fe (all in [at. %]) (E. Gaffet, N. Malhouroux and M. Abdellaoui, J. All. Comp. 194, 1993, pp. 339–36).

Ball milling of Ti-based intermetallic phases by MA was possible, for example, either directly from elemental powders via (i) moderate milling conditions applied to Ti-58 at. % Al alloy (R. Watanabe, H. Hashimoto and Y. H. Park, in *Advances in Powder Metallurgy* 1991, compiled by L. F. Pease III and R. J. Sansoucy, MPIF Princeton, N.J., 1991, p. 119) and (ii) by chemical or reaction milling a mixture of $TiH_2+Al_3Ti$ (C. Suryanarayana, R. Sundaresan and F. H. Froes, *Mater. Sci. & Engng. A*150, 1988, p. 117):

$$4\,TiH_2+Al_3Ti \longrightarrow Ti_3Al+2\,TiAl+4H_2 \qquad (MA1)$$

for which the formation of TiAl provides the major driving force so corresponding volume fraction to increase to 95% on subsequent HIP'ing and indirectly via (iii) heat treatment of the extended solid solution of 24 to 33 wt. % Al in $\alpha$Ti or of an amorphous Ti-powder containing 50 to 55 at. % Al where the conditions of milling were more extreme than for (i) (A. Frefer, C. Suryanarayana and F. H. Froes, Conf. Proc. 7th World Titanium Conference, San Diego, Calif., TMS Warrendale, Pa. 1993, eds. F. H. Froes and I. Caplan, p. 933).

Figure 105:
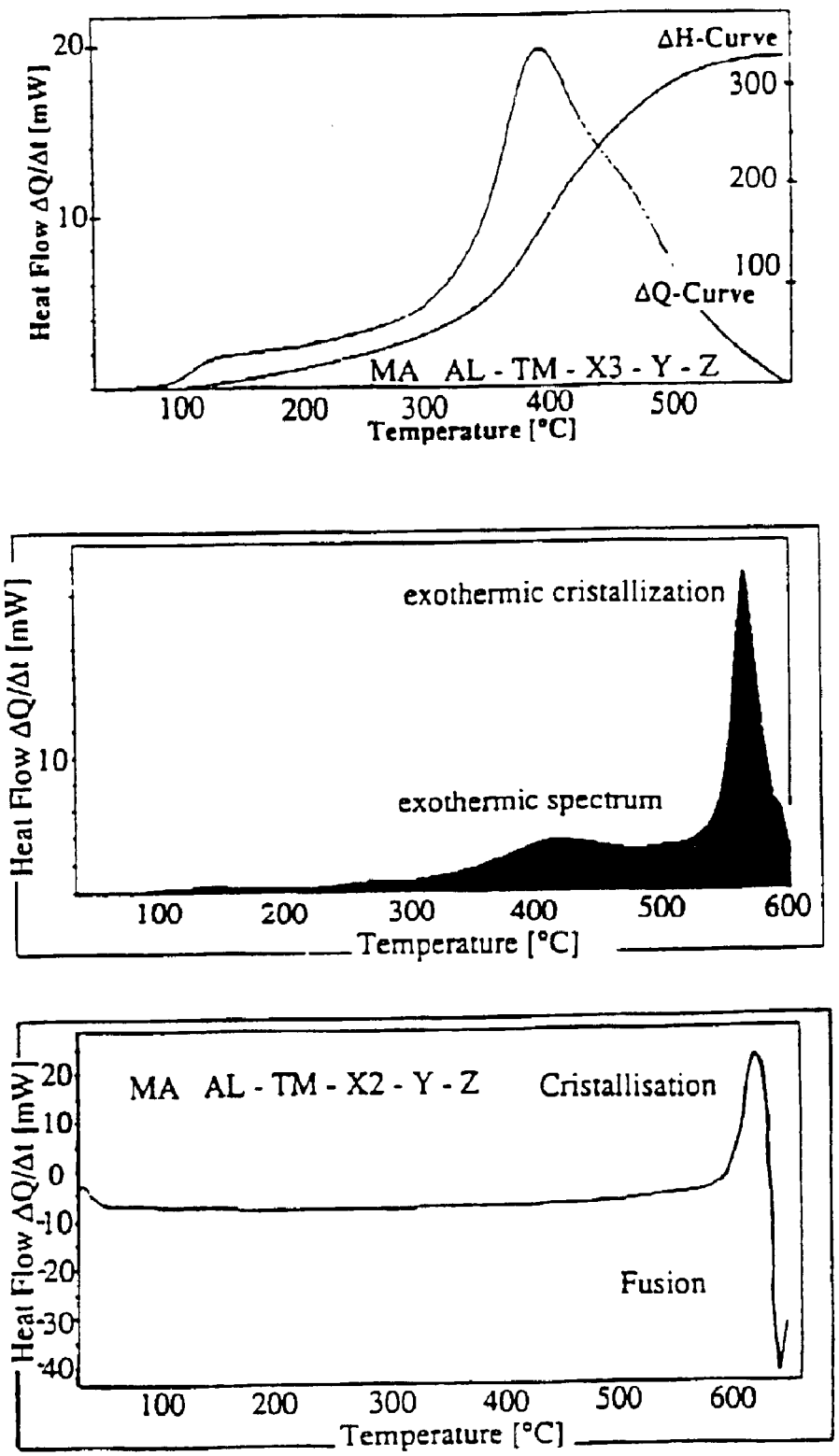
FIG. 105 Differential scanning calorimetry (DSC)—analyses of various Al-TM-based alloys (TM: transition metal) doped with ternary (X), quaternary (Y) and quinternary (Z) alloying additions after milling at various conditions.

Ball milling of Al-base alloys includes the development of an Al—Li—Mg—O—C alloy with fracture toughness $K_{1C}$, 45 MPa ml$^{0.5}$ at tensile yield strength 450 MPa and 100fold reduced corrosion rate cf. IM7075-T73 as well as MA Al—Ti alloys with ultimate tensile strength 500 to 550 MPa and 7 to 15% ductility at ambient (cf. C. M. Ward-Close, P. G. Partridge, P. Holdway and A. W. Bowen, *Conf Proc. 7th World Conf. Titanium Conference*, San Diego, Calif., eds. FD. H. Froes and I. Caplan, TMS Warrendale, Pa., 1993. p. 659). Complex amorphous MA Al-based alloys containing transition metals were reported to show crystallization temperatures as high as 600° C. (FIG. 105 showing differential scanning calorimetry (DSC)-analyses of various Al-TM-based alloys (TM: transition metal) doped with ternary (X), quaternary (Y) and quinternary (Z) alloying additions after milling at various conditions. From F. Hehmann, *Conf Proc. Advances in Production and Fabrication of Light Metals and Metal Matrix Composites*, eds. M. M. Avedesian et al., Canadian Institute of Mining, Metallurgy and Petroleum (CIMMP), Montreal, 1992, pp. 305). The as-extruded MA-material showed remarkable mechanical properties at room temperature (F. Hehmann, *Conf. Proc. Advances in Production and Fabrication of Light Metals and Metal Matrix Composites*, eds. M. M. Avedesian et al., Canadian Institute of Mining, Metallurgy and Petroleum (CIMMP), Montreal, 1992, pp. 305). Amorphous Al-base Al-transition metal phases were achieved after milling periods ranging from 23 h for more complex Al-base alloys (F. Hehmann, *Conf. Proc. Advances in Production and Fabrication of Light Metals and Metal Matrix Composites*, eds. M. M. Avedesian et al., Canadian Institute of Mining, Metallurgy and Petroleum (CIMMI), Montreal, 1992, pp. 305) over 15–40 h for amorphous Al-25 at. % Nb (Z. Peng, C. Suryanarayana and F. H. Froes, *Scr. Metall. Mater.* 27 (4), 1992, pp. 475–480), 60 h for amorphous Al-50 at. % Nb (M. S. El-Esksndarany, K. Aoki and K. Suzuki, *J. Less Common Met.* 167, 1990, pp. 113–118) and 180–450 h for amorphous Al-10 to 50 at. % Fe alloys and up to 300 h for amorphous Al—Ta alloys (M. S. El-Esksndarany, K. Aoki and K. Suzuki, *J. Less Common Met.* 167, 1990, pp. 113–118).

A frequently employed method for ball milling of engineering Al-based alloys is to add a carbon (-bearing) constituent as a lubricating agent to the precursor (pre-alloyed, e.g. powder) charge in order to facilitate a reaction effect and/or to increase the yield of the operation (cf. *Erzeugnisse der Pulvermetallurgie, company brochure, PEAK Werkstoff GmbH, Velbert RFA,* 1995, K. Hummert, V. Arnhold, G. Brockmann, *Proc. Conf PM Aerospace Materials,* 2–4 November, 1987, Lucerne, Powder Metals Report, Shrewsbury, England—nb. ref. 139 was deleted). It has been reported (V. Arnhold, K. Hummert and R. Schattevoy, *Conf. Proc. Materials by Powder Technoly,* PTM '93, edt. F. Aldinger, DGM, Oberursel, 1993—i.e. ref 198 instead 197) on Al-based alloys containing 0.5–4.0 wt. % C, 0.5 wt. % oxygen, 12–20 wt. % Si and eventually 5 wt. % Fe. These MA Al-based alloys do not contain the more expansive transition metals Ni, Cu, Cr, Ti, Zr and/or Ag and also no (equilibrium) solid solution hardening elements such as Mg and/or Zn. Oxygen in MA light alloy powders can either stem from the surface oxides of atomized and other (pre-alloyed) precursors and/or from the (inert) atmosphere employed upon milling and subsequent powder handling. Obviously, the relatively cheap alloying additions Si and Fe provide (i) a more effective and/or sufficient improvement of engineering properties by ball milling with carbon and oxygen/oxides as compared to employing spray forming and composites, for example, and/or (ii) the need and/or possibility to minimize the cost for the employed feed stock in conjunction with the available (productivity of) ball milling plants. However, all is not aluminum, that glitters.

Figure 106:
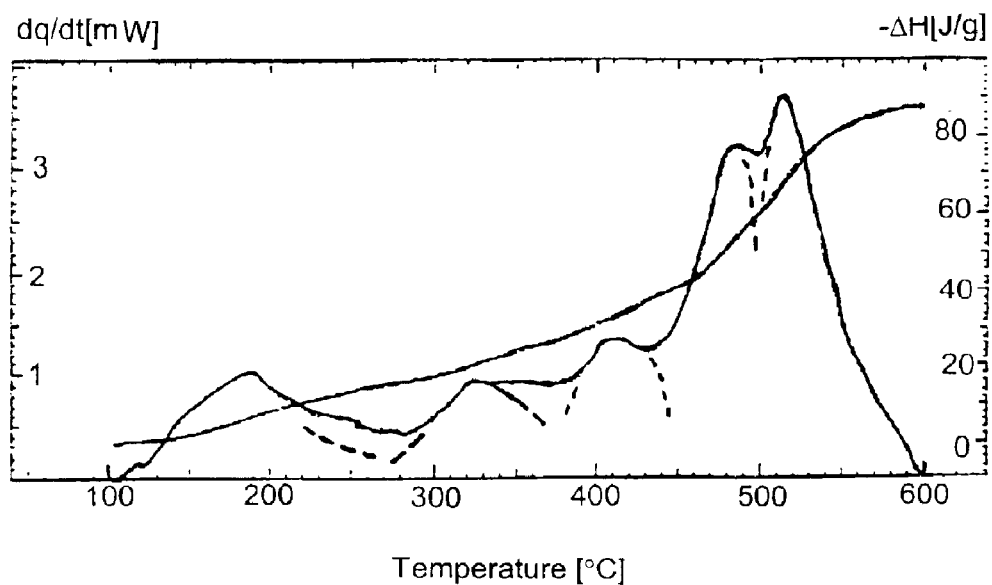
FIG. 106 DSC-analysis (scan 1 minus in-situ reference scan) of (WE54±9 wt. % $Al_2O_3$) ball milled for t=2 h at T=20° to 60° C. without lubricant (i.e. "dry").

The potential for metastable phase formation of Mg-based alloys has been demonstrated by (i) cold-rolling of alternating Mg—Ni multilayers (T. B. Ameur, A. R. Yavari and J. M. Barandiaran, *Mat. Sci. Engng. A*134, 1991, p. 1402) and by (ii) mechanical alloying of pre-alloyed crystalline Mg-30 at. % Zn (A. Calka and A. P. Radlinski, *Mat. Sci. Engng. A*118, 1989, pp. 131–135) and a mixture of elemental Mg—Al—Ca powders (L. E. Hazelton, U.S. Pat. No. 5,074,936, Dec. 24, 1991). More recently, Hehmann reported (F. Hehmann, *Conf. Proc. Advances in Production and Fabrication of Light Metals and Metal Matrix Composites,* eds. M. M. Avedesian et al., Canadian Institute of Mining, Metallurgy and Petroleum (CIMMP), Montreal, 1992, pp. 305) on a systematic study to achieve thermally stable non-equilibrium phases based on magnesium. Following the work on amorphous Al-based alloy with the highest ever reported crystallization temperature of 620° C. for an Al-base alloy (cf. F. Hehmann, *Conf. Proc. Advances in Production and Fabrication of Light Metals and Metal Matrix Composites,* eds. M. M. Avedesian et al., Canadian Institute of Mining, Metallurgy and Petroleum (CIMMP), Montreal, 1992, pp. 305), a partially amorphous WE54-base material was developed of which the crystallization peaks were reported (J. F. King and F. Hehmann, *Proc. Con. Magnesium Alloys and Their Applications,* eds. B. L. Mordike and F. Hehmann, DGM, Oberursel, 1992, p. 309) to extend to temperatures between 480° and 614° C. (FIG. 106 showing DSC-analysis (scan 1 minus in-situ reference scan) of (WE54+9 wt. % $Al_2O_3$) ball milled for t=2 h at T=20° to 60° C. without lubricant (i.e. "dry"). The actual (yet not published) milling variables were: $\Omega$=206 rpm +/−10% max.; $\omega_{abs}$=241 rpm +/−10% max.; R=12.5 cm; r=3.275 cm; $r_b$=0.50 cm; $\rho_b$=7.60 g/cm³; $n_b$=18 milling balls of $r_b$ and $\rho_b$ as above. The precursor charge employed was 6 g (WFS4) and 0.54 g $Al_2O_3$, i.e. $\Sigma m_{charge}$=6.54 g). The results were made possible after planetary ball milling a mixture of (WE54+3 to 9 wt. % $Al_2O_3$) to powders of particle size between 10 to 400 μm, while ball milling of WE54 doped with SiC was reported (J. F. King and F. Hehmann, *Proc. Conf. Magnesium Alloys and Their Applications,* eds. B. L. Mordike and F. Hehmann, DGM, Oberursel, 1992, p. 309) to show weaker and thermally less stable non-equilibrium phase formation. No exact milling conditions (milling time etc., see below) were published yet.

Initial strength values of corresponding as-extruded alloys were above 400 MPa at ambient with values of elongation-to-fracture between 3 and 8% and above 200 MPa at 250° C. (elongation values 50–60%) without having optimized any of the processing steps including thermomechanical processing (F. Hehmann, *Conf Proc. Advances in Production and Fabrication of Light Metals and Metal Matrix Composites,* eds. M. M. Avedesian et al., Canadian Institute of Mining, Metallurgy and Petroleum (CIMMP), Montreal, 1992, pp. 305). A dispersion of yet unidentified precipitates of size <1 μm was observed to suppress recrystallization upon extrusion at 380° C. It was suggested that exothermic in-situ reactions between the alloyed constituents allows for the formation of novel refractory dispersions with more than a doubled volume fraction compared to the non-milled blend of powders (F. Hehmann, *Conf. Proc. Advances in Production and Fabrication of Light Metals and Metal Matrix Composites,* eds. M. M. Avedesian et al., Canadian Institute of Mining, Metallurgy and Petroleum (CIMMP), Montreal, 1992, pp. 305). The possibilities to tailor the microstructure by internal reaction included dispersion strengthening by chemical phase transformation via an oxidation-redox-reaction of the form

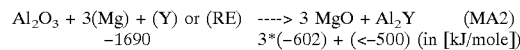

and resulting in a heat of reaction of −600 [kJ/mole]. Neglecting the heat of formation of the solid solution of Y in α-Mg, corresponding enthalpy of reaction is clearly exothermal. Activation of this reaction may increase with increasing degree of microstructural refinement, homogeneity and amorphization for a given alloy concentration and with increasing volume fraction of $Al_2O_3$ for a given set of experimental conditions as to the increase in heat flow of corresponding exothermal effects observed between 510° and 620° C. A very exothermic reaction of the type

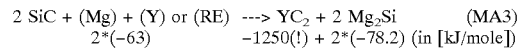

was also possible resulting in an enthalpy of reaction value of −1280 [kJ/mole]. Other reactions involving the use of a lubricating agent were not yet reported. The resultant Mg-alloys, however, represent a second generation of Mg-metal matrix composites, since they combine the nanometer length scale of the microstructure of ODS-alloys with the reinforcement of the first Mg-MMC's, but without corresponding interfacial problems.

By using a '$^R$pulverisette 5'-apparatus by Fritsch, FRG with 4 symmetrically arranged rotating cylindrical steel containers (i.e. vials) being double-rotating around their common pivot and around the pivot of each individual vial which were of external diameter 10 cm by height external 5 cm (see FIG. 107 showing vial and vial dimensions employed in the invention by using Fritsch's Pulverisette $5^R$) and Pulverisette $5^R$, Product brochure and Manual, Fritsch GmbH Laborgerätebau, Idar-Oberstein, RFA, priv. communication, May, 1995) and employing an alloy charge of not more than 8 g magnesium while the closing and re-opening the attritor containers was done in an Ar-glove box continuously flushed with 4N8 argon at 1 bar, it was possible to:

1. circumvent atomizing the precursor alloy (usually required to facilitate mechanical alloying (cf. V. Arnhold, K. Hummert and R. Schattevoy, *Conf. Proc. Materials by Powder Technology*, PTM '93, edt. F. Aldinger, DGM, Oberursel, 1993) by transforming (pre-alloyed) WE54 alloy chips and (bent) turnings machined from ingot bar directly into MA WE54 powder particles of size 80 to 500 μm which makes MA for non-equilibrium alloys even more attractive, but corresponding milling conditions including the employed chip size were not published yet.
2. increase the volume fraction and (irreversible) transformation temperature of an yet unidentified non-equilibrium matrix phase as well as the welding of resultant powder to the surface of the milling containers (vials, cf. FIGS. 106,107) by increasing rotational speed (often referred to as "milling intensity") of the apparatus so increasing the loss of powder and decreasing the yield with increasing milling speed by employing 3 to 9 wt. % $Al_2O_3$ of size 3 micron to the WE54 chips, but the exact milling conditions including milling time and/or milling intensity as a function weight ratio of balls-to-charge required for a given volume fraction amorphous were not reported yet.
3. increase the yield of a mechanically alloyed WE54-base powder doped with 3 micron $Al_2O_2$-and 3 micron SiC powders to up to 95 to 99% by either using a relatively low rota-tional speed without lubricant resulting in powder size 80–250 μm or by relatively high rotational speeds including the use of a lubricant (powder size 10–400 μm), thereby allowing for consolidation to a dispersion strengthened Mg-base matrix made from MA-powder without the need of degassing the powder, but no details on milling time and speed, type and quantity of lubricant and associated charge including the size of WE54-chips and number and size of milling balls were disclosed yet.

Provided, that substrate temperature (distribution) was controlled, the occurrence of non-equilibrium phases upon VD is given for granted due the absence of recalescence, but productivity depends on other factors (see above). Formation of non-equilibrium phases by mechanical alloying in particular with a homogenous distribution of the alloying elements on an atomic length scale, however, requires a relatively precise definition of the milling variables for the operator including a unique hierarchy of the parameters to be controlled. Chen et al. summarize (Y. Chen, R. LeHazif and G. Martin, *Solid St. Phen.* 23&24, 1992, Trans Tech Publications Ltd., Zürich, 1992, pp. 271–283) eight factors "known to affect the milling process":
1. milling equipment (e.g. attritor, planetary ball mill or vibrating mill)
2. "milling intensity" (velocity of the balls and resulting impact energy, frequency of impact and resulting impact power)
3. milling temperature (hot, cold etc.)
4. milling atmosphere (vacuum, Ar, air, $N_2$, control agent)
5. ball-to-powder (charge) weight ratio
6. filling fraction of the volume of the milling container
7. constitutive material of the milling device (WC, (type of) steel, ceramics) and
8. milling time.

It would be interesting to see what other authors have to publish in this respect (cf. C. R. Clark, C. Suryanarayana, F. H. Froes, *Int. Conf. Powder Metallurgical and Particulate Materials*, May 14–17, 1995, Seattle, Wash., MPIF-APMI).
3. Disclosure of the Invention: Qualitative and Quantitative Parameters (for the Operator) to Achieve the Required (Micro-) Structural Transformation into Non-equilibrium Mg-Alloys by Ball Milling Including MA It is the objective of this part of the invention to identify the required milling technique(s) and variables as well as the type of the initial precursor material required to produce fully or nearly fully non-equilibrium Mg-base matrix phases by MA within economically viable milling periods. However, no hierarchy of ball milling techniques, milling variables and precursor material has yet been established for the selection and production of (light) non-equilibrium phases of a given alloy system and in particular not for homogeneous non-equilibrium Mg-alloys rather than composite materials by ball milling.

3.1 Formability of (Homogeneous) Non-Equilibrium (ne-) Phases by Mechanical Alloying and/or Ball Milling Solid state amorphization (as well as the formation of other competing non-equilibrium phases, e.g. crystalline, quasi- and/or nanocrystalline and/or terminal solid solubility extension) by ball milling was considered until recently to depend on a negative heat of mixing of corresponding liquid, $\Delta H^{mix}$, and on a large difference in diffusivity of the involved constituents, $\Delta D$ (cf. R. B. Schwartz, *Mat. Sci. Engng.* 97, 1988, pp. 71–78; R. Brüning, Z. Altounian, J. O. Strom-Olsen and L. Schultz, Mat. Sci. Eng. 97, 1988, pp. 317–320). The coincidence of solid state amorphization by ball milling with amorphization by rapid quenching (RSP) from the liquid in the same alloy system was thought (cf. P. Nash and R. B. Schwartz, Acta metall. 36 (11), 1988, pp. 3047–3053; E. Hellstern and L. Schultz, *Metall* 41 (5), 1987) to prove the importance of macroscopic thermodynamics (free energy $\Delta G$) and the $\Delta H^{mix}$-criterion, while deviations and extension of the concentration range of amorphization of a given alloy system by ball milling compared to that by RSP was considered to show superior non-equilibrium phase formability by ball milling due to less effective kinetic barriers (e.g. $\Delta D$) as compared to RSP (e.g. freezing range).

The effect of ball milling to overrun barriers for non-equilibrium phase formation as preset by equilibrium alloy constitution is inherent to the process. Extension of an amorphous one-phase field was reported for TiAl-base alloys in the range from 45 to 65 wt. % Al, i.e. in the concentration range where rapid solidification such as by melt spinning does only allow for an amorphous phase at Al-levels >60 at. % (cf. L. Schultz, *Mat. Sci. Engng.* 97, 1988, pp. 15–23) due to unfavorable solidification kinetics at lower levels. A large number of non-equilibrium phases made of two transition metals (i.e. TM(1)–TM(2) where TM(1) is Cr, Mn, Fe, Co, Ni, Cu, Pd or Re, i.e. so-called "late" transition metals, and TM(2) is Zr, Ti, Nb or Hf, i.e. so-called "early" transition metals) was summarized (L. Schultz, *Mat. Sci. Engng.* 97, 1988, pp. 15–23). In 3d-systems with relatively small negative or positive $\Delta H^{mix}$-values (e.g. V—Ti, Cr—Zr, V—Zr, Fe—Nd), ball milling was believed to exclusively result in crystalline instead of amorphous alloys (E. Hellstern and L. Schultz, *Metall* 41 (5), 1987; L. Schultz, *Mat. Sci. Engng.* 97, 1988, pp. 15–23). $\Delta G$- and $\Delta D$-criteria have found widespread attention to predict more concentrated amorphous and non-equilibrium metallic materials, but they remained without practical benefit for non-equilibrium phase formation and selection by the operator. Consequently, a large proportion of the publications on ne-phases by ball milling is devoted to $\Delta G$-interpretations of the observed results without analysis of the applied parameters and operating variables. In the meantime, however, amorphous phases by ball milling were observed in systems with positive $\Delta H^{mix}$-values such as Cu—W, Cu—Ta, Cu—V, Si—Zn, Si—Sn (E. Gaffet, C. Louison, M. Harmelin and F. Faudot, Proc. 7th Int. Conf. on Rapidly Quenched Metals, Stockholm, 1990, in *Mat. Sci.*

*Engng. A* 134, 1991, pp. 1380–1384; C. H. Lee, T. Fukunaga and U. Mizutani, *Proc. 7th Int. Conf on Rapidly Quenched Metals*, Stockholm, 1990, in *Mater. Sci. Eng. A* 134, 1991, pp. 1410–1413; T. Fukunaga, M. Mori, K. Inoue and U. Mizutani, *7th Int. Conf. on Rapidly Quenched Metals*, Stockholm, 1990, in *Mat. Sci. Engng. A* 134, 1991, pp. 863–866; E. Gaffet and M. Harmelin, a) *Proc. Int. Conf. on Amorphization by Solid-State Reaction*, Grenoble, Feb. 21–23, 1990, in *J. Phys.* (Paris), *Colloq. C4, Suppl.* 14, 1990, T51, p. 139; b) *Proc. Conf. on Structural Applications of Mechanical Alloying*, Myrtle Beach, S. C., 1990, ASM, Metals Park, Ohio, 1990, p. 257) and with small differences AD such as V—Zr (A. W. Weeber and H. Bakker, *Z. Chem. Phys. N. F.* 157, 1988, p. 221) as well as in pure and allotted components involving a diamond crystal structure such as in Si, Ge, $Ge_xSi_{1-x}$ and GaAs (E. Gaffet and M. Harmelin, *J. Less-Common Met.* 157, 1990, p. 201; E. Gaffet, *Mat. Sci. Engng. A* 136, 1991, pp. 161–169; E. Gaffet, F. Faudot and M. Harmelin, a) *Mat. Sci. Engng. A* 149, 1991, pp. 85–94; b) *Mat. Sci. For.* 88–90, 1992, pp. 375–382; E. Gaffet and J. P. Gaspard, *J. Phys. Coll. Phys. C4, Suppl.* 14, 51, 1990, p. 205).

Obviously, ball milling can always lead to the formation of a non-equilibrium phase independent on alloy system and composition provided, that the milling conditions are correct. The prime question is: "What are the operating variables to increase and optimize the transformation rate, yield, purity and homogeneity of the as-milled powder product?" The driving forces for ne-phase formation by ball milling were yet related to alloy constitution and formability kinetics without incorporating the form in which the energy was supplied to the material. The energy for non-equilibrium phase transform ation by ball milling of the solid state is supplied by shock and friction. AG-related phase diagram calculations, however, are yet a function of temperature without incorporating, mechanical shock energy. Therefore, they can not supply more than supplementary aspects to explain non-equilibrium phase formation by ball milling. If they are applied to exclude the formation of a non-equilibrium phase, however, they provide a misleading analysis of the (operative=mechanically sensitive) driving forces for non-equilibrium phase formation via solid state synthesis by ball milling (cf. R. Bormann and R. Busch, *Proc. Conf. New Materials by Mechanical Alloying Techniques*, E. Arzt and L. Schultz, DGM, 1988, p. 73–78), since the maxim for phase transformation without change of the (macroscopic) state of matter is to avoid processing without (excessive) heating and without overriding the time required for the (milling) operation (see above).

Figure 108:
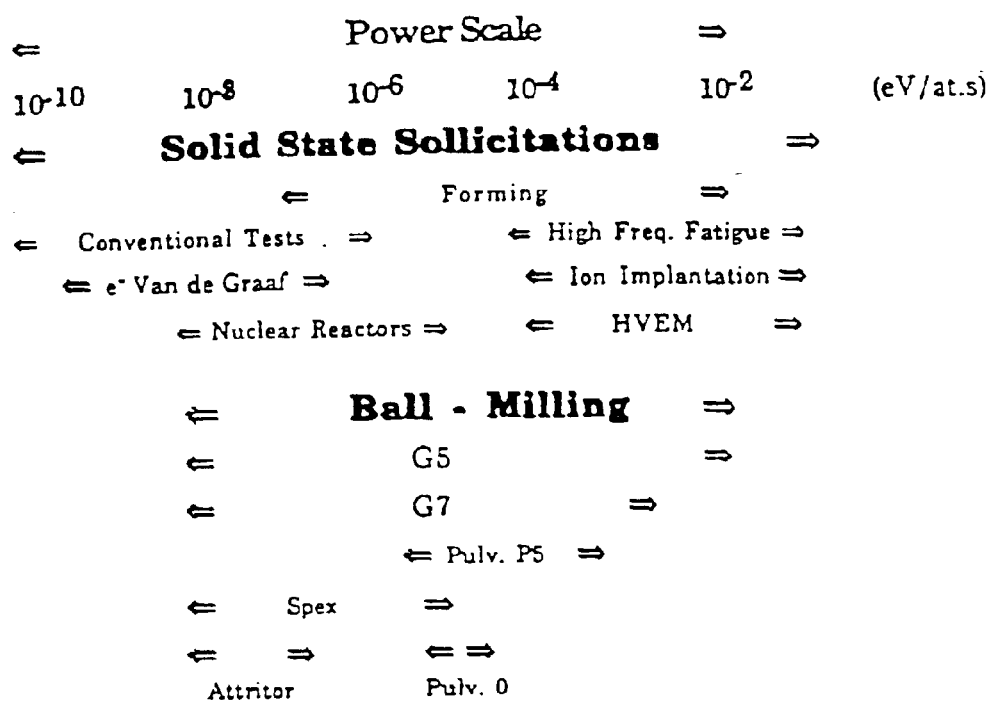
FIG. 108 Comparison of injected power by irradiation, mechanical and other forms of straining the solid state showing overlap of mechanical alloying with all forms of mechanical loading and irradiation on the [eV/at.s]-scale.

The main interpretations ne-phase formation by mechanical alloying are (cf. M. Abdellaoui, *Thèse de Doctorat de l'Université Paris VI*, submitted on 4 Jul., 1994):

1. Local melting in analogy to a rapid quench or anneal.
2. Effect of plastic deformation.
3. Thermal and athermal diffusion, the latter in analogy to the effect of irradiation (FIG. 108 with comparison of injected power by irradiation, mechanical and other forms of straining the solid state showing overlap of mechanical alloying with all forms of mechanical loading and irradiation on the [eV/at.s]-scale. N.B. the term "sollicitation" is taken from the French language eventually better translated into English language by the term "micro-stresses". From E. Gaffet, M. Abdellaoui and N. Malhouroux-Gaffet, *Mater. Trans JIM* 36 (2), 1995, pp. 196–207). According to Gaffet and coworkers (E. Gaffet and G. Martin, *Coll. Phys. C4, Suppl. N●* 14, 51, 1990, pp. 71–77; E. T. Brook-Levinson, A. A. Kolesnikov and I. V. Fine, *Mater. Sci. Forum* 88–90, 1992, pp. 113–120, see FIG. 126), the micro-stresses introduced by various ball milling techniques correspond to the same order of magnitude than the micro-stresses introduced by static and dynamic mechanical loading and irradiation by electrons, neutrons etc.
4. Chemical diffusion across (thin) multi-layers of different components A and B, being interpreted e.g. as a function of difference in diffusivity, AD, esp. In the non-equilibrium state.
5. Effect of nano-scale crystal (grain) refinement (lattice instability and amorphization resulting from decrease in grain size and expansion of corresponding lattice parameter).

All authors agree in that the increase in free energy of the ball milled material is a direct result of the increase in structural faults with milling time (energy storage in the form of atomic disorder) resulting in stabilization of the structure of a high temperature, disordered crystalline or amorphous phase(s) according to the degree of the resultant increase in energy. This phase competes with an increase in temperature (due to adiabatic deformation work, compression and/or shear all increasing corresponding $c_p$-value)- and the tendency, to (re-)transform to corresponding equilibrium phase(s) and/or to minimize its free energy via relaxation by diffusion. Many authors have attributed the increase in (stored) free energy to an increase in elastic energy (cf. H. Bakker and L. M. Di, *Mater. Sci. For.* 88–90, 1992, pp. 27–40; A. R. Yavari, and P. J. Desré, *Mater. Sci. For.* 88–90, 1992, pp. 43–50). An increase in elastic energy may occur upon static loading such as in tension, compression, torsion and shear, but ball milling represents a dynamic loading subjected to repeating impacts of an individual energy at a given impact frequency. Furthermore, the dynamic loading upon ball milling occurs in the moment of impact (which is of the order of $10^{-5}$ sec) and is orders of magnitude smaller than the period between two impacts. Therefore, ball milling is different from fatigue upon which dynamic loading occurs during the entire cycle between two amplitudes. Finally, the ability to absorb impact energy via shock and friction was related to a viscous resistance (cf. H. Hashimoto and R. Watanabe, *Mater. Trans. JIM* 31 (3), 1990, pp. 219–224; H. Hashimoto and R. Watanabe, *Mater. Sci. For.* 88–90, 1992, pp. 89–96), but no physical criteria were yet attributed to the viscous resistance.

Evidently, milling and constitutional variables for non-equilibrium phase formation by MA have yet been presented in a reductive rather than complementary way which would be the basis to create a universal hierarchy of corresponding parameters (cf. the $2^{nd}$ Embodiment). While selected shock power set by the operator and ball milling technique may eventually overrun constitutional barriers in order to result in a non-equilibrium phase as solute trapping would do upon rapid solidification, material parameters (such as the AD-criterion) and/or resultant (initial) materials selection remain rate-controlling and crucial for the economically viable products. Amorphous phase formation in systems without fast diffuser (e.g. Zr—V) is relatively rare, while it is relatively easy in the Ni—Ti and Fe—Zr system (which represents a combination of early and late transition metals with very different diffusivities) compared to glass formation in the Cr—V and Zr—V system with relatively similar diffusivities, all evidencing at least some significance of the AD-criterion. Progress was made, however, in the quantification of operating variables required for ne-phase formation and which are universally applicable from one ball mill to another.

3.2 Advantages of Planetary Ball Milling: Highest Degree and Latitude of Power Control for the Formation of Homogeneous Non-Equilibrium Phases A planetary ball mill consists of a (central) rotating holder (disc, table) upon which a defined number $N_{MV}$ of rotating milling containers (i.e. the (milling) vials, here denoted with suffix MV) are mounted bottom-on (Pulverisette $5^R$, Product brochure and Manual, Fritsch GmbH Laborgerätebau, Idar-Oberstein, RFA; priv. communication, May, 1995). The vials are usually mounted on the rotating table in such a way that the normal on the plane of the (orifice of the) opening of the vial to fill it with the corresponding (mixture of the) initial (i.e. precursor) material(s) and to remove the ball-milled end-product after a defined milling cycle $C_M$=fn (number of parameters, $N_P$) from the vial(s) is pointing upwards, in particular perpendicular to the plane in which the rotating table is moving. If the rotating table of the planetary ball mill rotates clock-wise, the vials rotate anti-clockwise and vice versa (for a schematic with (/indicating) tour vials, see FIG. 109 showing principal of planetary ball milling for (top) four vials rotating counter-clockwise while corresponding holder disc (large arrow circle) rotates clockwise and (bottom) horizontal cut of vial moving clockwise (V) with eight milling balls (of which two are in flight as indicated, see (F)) and milled powder during action as to schematic on top. A: movement of holder disc, here rotating anti-clockwise and B: centrifugal force). In commercially available planetary ball mills, the minimum number of vial holders per rotating holder disc is two, i.e. $N_{MV}$(min)=2. Hypothetically, however, $N_{MV}$(min)=1, since the weight of one vial can he outbalanced by an equivalent weight on the opposite side of the holder disc.

3.2.1 Control of Detachment and Kinetic Energy $E_K$ per Milling Ball

The milling balls inside the vial of a planetary ball mill either (i) roll or slide along the internal wall surface and/or (ii) they are ejected toward the opposite internal wall surface of the vial (cf. FIG. 109) and/or (iii) they undergo more complex movements at higher filling fractions of the vial volume. The (ii)-type of milling ball movement allows to explore the centrifugal forces provided by planetary ball milling which are in (commercially available planetary ball mills) up to twenty-five times larger than the force of gravitation (Pulverisette $5^R$, Product brochure and Manual, Fritsch GmbH Laborgerätebau, Idar-Oberstein, RFA; priv. communication, May, 1995). However, the (ii)-type of ball movement is only possible, if the centrifugal force created by the rotation of the holder disc is larger than the centrifugal force created by the rotation of the vial, i.e.

$$\Omega^2 R > \omega^2 r^* \quad (MA4)$$

where
1.0 $\Omega$ the rotation speed of the rotating holder disc (vial holder table) of given distance R for the at least one vial.
2. $R = O_D O_{MV}$, i.e. the separation distance between the center $O_D$ of the rotating holder disc and the center of the at least one rotating vial, $O_{MV}$, on the rotating disc on which the vial holders are fixed.
3. $\omega$ the rotation speed of the at least one vial of a given radius "r" mounted on the rotating holder disc.
4. "r" the internal vial radius and resultant effective radius $r^* = r - r_{b,i}$, with $r_{b,i}$=milling ball radius.

Figure 112:
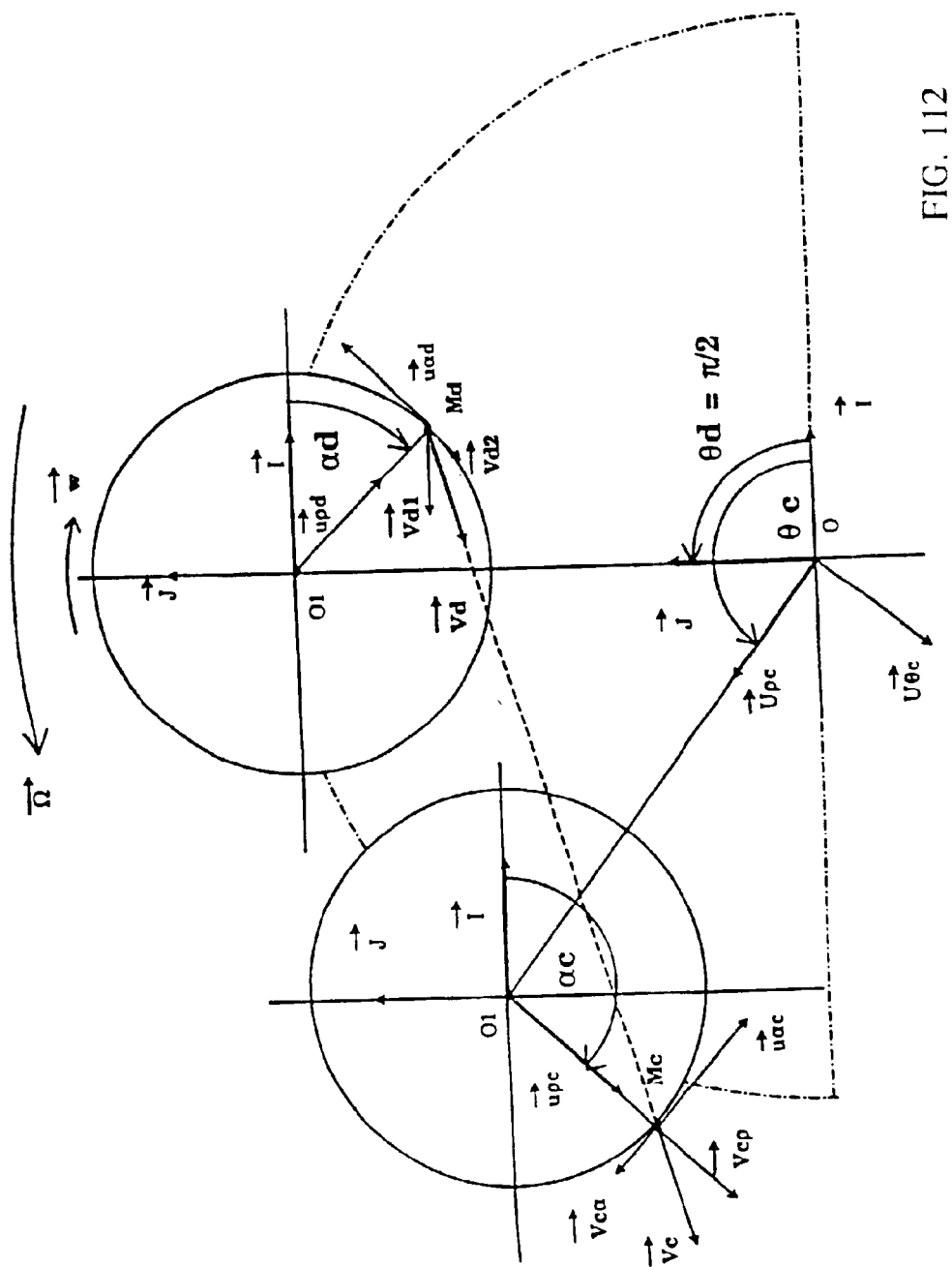
FIG. 112 (Arbitrary) Flight trajectory $M_dM_c$ (dashed line) between detachment $M_d$ and collision event $M_c$ of a milling ball during planetary ball milling and decomposition of corresponding velocities at $M_d$ and $M_c$.

For ($\omega^2 r^*/\Omega^2 R$)-ratios>1, however, planetary ball milling can result in rapid "caking" (build-up of material to the wall of the vials) and/or frustrates the operation due to absence of a milling effect (i.e. refinement of microstructure and/or fabrication of a powder, see below). The (ii)-type of movement allows to control a discrete value of kinetic energy (vector notation: $E_K$) per ball in flight (i.e. after detachment) following (cf. M. Abdellaoui and E. Gaffet, Acta metall mater. 43 (3), 1995, pp. 1087–1098 and FIG. 112 showing (arbitrary) flight trajectory $M_d M_c$ (dashed line) between detachment $M_d$ and collision event $M_c$ of a milling ball during planetary ball milling and decomposition of corresponding velocities at $M_d$ and $M_c$):

$$E_K = (m_b/2)*(V_d^2)[J/\text{impact}] \quad (MA5)$$

where $V_d$ is corresponding ball velocity given by (for mathematical details, see M. Abdellaoui and E. Gaffet, Acta metall. mater. 43 (3), 1995, pp. 1087–1098):

$$V_d = [-R\Omega + r^*\omega \sin(\alpha_d)]i - r^*\omega \cos(\alpha_d)j [m/s] \quad (MA6)$$

where $\sin(\alpha_d) = (-r^*\omega^*/R\Omega^2) = C$=detachment angle for movement (ii) resulting in the absolute value (which is independent on $\alpha_d = \omega t(\alpha)$, see eq. MA8), i.e.

$$E_K = (m_b/2)*[-R\Omega + r^*\omega *(-r^*\Omega^2/R\Omega^2)]^2 [J/\text{ball}] \quad (MA7).$$

Figure 110:
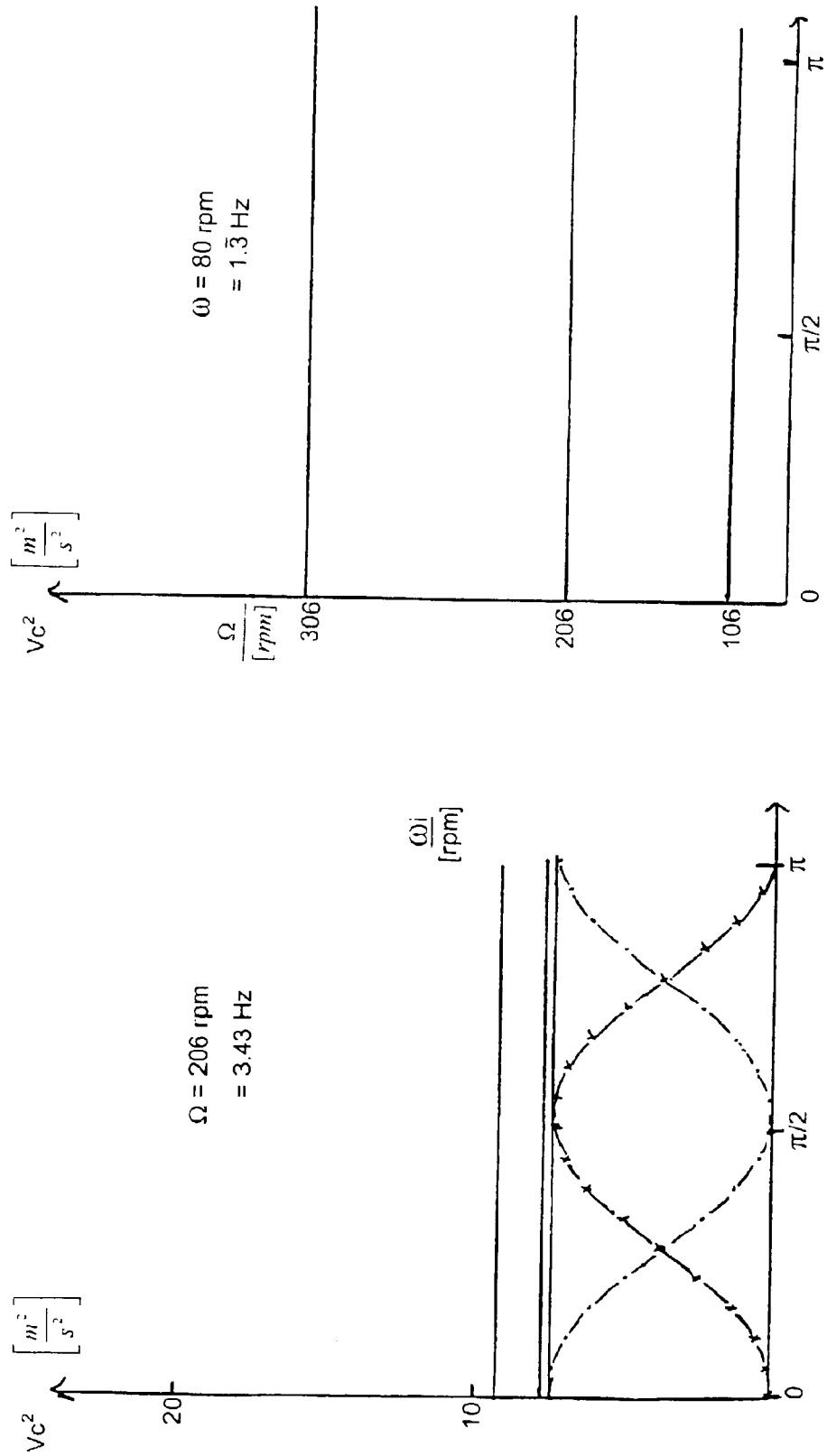
FIG. 110 Velocity (amplitudes, i.e. $V_c^2$) of (solid bars) absolute velocity of milling balls after detachment using a planetary ball mill with R=12.5 cm and r'=2.775 cm and (left hand side) three different ω-values (80, 180 and 280 rpm) at Ω=206 rpm and (right hand side) three different Ω-values (106, 206 and 306 rpm) at ω=80 rpm.

FIG. 110 shows the effect on the velocity amplitude of $V_d$ (i.e. under condition MA4) of vial rotation $\omega$ at a given disc rotation $\Omega$ and corresponding effect of disc rotation $\Omega$ at a given vial rotation $\omega$ by using a commercially available planetary ball mill (Pulverisette $5^R$, Product brochure and Manual, Fritsch GmbH Laborgerätebau, Idar-Oberstein, RFA; priv. communication, May, 1995) having R=12.5 cm and r*=2.775 cm. Velocity amplitudes (i.e. $V_c^2$) are for (solid horizontal lines) absolute velocity of milling balls after detachment using (left hand side) three different $\omega$-values (80, 180 and 280 rpm) at $\Omega$=206 rpm and (right hand side) three different $\Omega$-values (106, 206 and 306 rpm) at $\omega$=80 rpm. The RHS of FIG. 110 shows also the amplitudes of the normal (----, i.e. $V^2_{c,p}$) and tangential (x-x-x-x, i.e. $V^2_{c,a}$) impact velocities of a milling ball as a function of impact angle $\alpha$ assuming $\Omega$=206 rpm and $\omega$=80 rpm. Evidently, the increase in $\Omega$ is far more effective than the increase in $\omega$ in order to increase the amplitude of $V_d$, while the increase in $\omega$ is rapidly limited by criterion MA4, i.e. $(r^*\omega^2/R\Omega^2) < 1$.

FIG. 111 shows a more complete set of results using eq. MA7 with impact energy for mass of milling ball, $m_b$=14 g, as a function of disc-rotation velocities $\Omega$ at various vial rotation velocities $\omega$ as indicated for two planetary ball mills with R=13 (G5) and 7.5 cm (G7). Vial radius r=21 mm, radius of milling ball, $r_b$=7.5 mm. From M. Abdellaoui, Thèse de Doctorat de l'Université Paris VI, submitted on 4 Jul., 1994). Evidently, a large R-value (G5) relaxes the conditions required for rotation $\Omega$ (e.g. from 1 to 2) and/or $\omega$ (from position 3 to 4) in order to achieve the same or a much larger impact (kinetic) energy than by employing a relatively small R-value (G7). Furthermore, vial rotation velocity o) is only effective to control the $E_K$-value for planetary ball mills by using very small R-values (FIG. 111) (M. Abdellaoui, Thèse de Doctoral de l'Université Paris VI, submitted on 4 Jul., 1994).

3.2.2 Control of Effective Impact Power P*

As a result of the high centrifugal forces operating during the (ii)type of movement it is valid to assume that $V_d = V_c$ (velocity at collision, cf. FIG. 112) and the vector $E_K(V_d)$ being equal to the kinetic energy of the ball at impact, i.e. $E_c(V_c)$, where $$E_c(V_c) = E_c = K_a*(m_b/2)*[V_c]^2 [J/\text{ball}] \quad (MA7a)$$

and $K_a$ ranging from 0 for totally elastic to 1 for totally inelastic collision, that is that $E_c$ is roughly proportional to $\Omega^2$ and $\Omega^2 R$. Iasonna and Magini have shown experimentally that a small layer of powder on the internal vial surface is enough to attain $K_a$-values close to 1 (A. Iasonna and M.

Magini, *Mat. Transactions JIM* 36 (2), 1995, pp. 123–133). The actually occurring impact frequency per milling ball, f', is controlled by the flight time $t_1$ and the time $t_2$ during which the ball is attached to the vial surface after a first collision $$f'=1/(t(\alpha))=1/(t_1+t_2) \quad (MA8)$$

where $t_1$ is obtained numerically when the two conditions (cf. M. Abdellaoui and E. Gaffet, *Acta metall mater.* 43 (3), 1995, pp. 1087–1098):

$$[-R\Omega+r^*\omega C]t_1+r^*(1-C^2)^{1/2}=R\cos(\Theta)+r^*\cos(\alpha) \quad (MA9)$$

$$[-r^*\omega(1-C^2)^{1/2}]t_1+R+r^*C=R\sin(\Theta))+r^*\sin(\alpha) \quad (MA\ 10)$$

are satisfied, where $\Theta=\pi/2+\Omega t_1$ and detachment for $t_1=0$. The solution for flight time $t_1$ is obtained by scanning $\Delta\alpha$ (Abdellaoui and Gaffet propose (cf. M. Abdellaoui and E. Gaffet, *Acta metall. mater.* 43 (3), 1995, pp. 1087–1098) $\Delta\alpha=0.01°$) from 0 to $2\pi$ for a given $\Delta t_1$-increment. The solution of eq.s MA9 and 10 provides the flight time $t_1$ between detachment and collision (impact) of the milling ball with the internal vial surface and $\Theta_c$ (i.e. the position of impact of the milling ball with regard to the reference frame) and $\alpha_c$ (i.e. the position of impact in the vial). The two latter are then employed to calculate $t_2$ using:

$$t_2=[3\pi-(\Theta-\alpha_c)+\arccos(r^*\omega^2/R\Omega^2)]/(\Omega+\omega) \quad (MA11)$$

(cf. M. Abdellaoui and E. Gaffet, *Acta metall mater.* 43 (3), 1995, pp. 1087–1098). The number of collision events per vial and unit time with the vial surface (and/or material, cf. below), i.e. the frequency f of collision events per vial is sub-controlled by the number $n_b$ of the milling balls employed per vial, i.e.

$$f=f'^*\cdot n_b \quad (MA12).$$

FIG. 113 exhibits impact frequency of five milling balls as a function of disc rotation speed $\Omega$ at various vial rotation velocities to as indicated for planetary ball mills with R=7.5 (G7) and 13 cm (G5). The milling balls were of mass $m_b$=14 g and size (radius) $r_b$=7.5 mm; vial radius r=21 mm (M. Abdellaoui, *Thèse de Doctorat de l'Université Paris VI*, submitted on 4 Jul., 1994). FIG. 114 is as for FIG. 113, here with impact power as a function of disc rotation velocity $\Omega$ for planetary ball mills with R=13 (G5) and 7.5 (G7) cm (M. Abdellaoui, *Thèse de Doctorat de l'Université Paris VI*, submitted on 4 Jul., 1.994). FIGS. 113 and 114 show the numerical results of frequency f as a function of $\Omega$ and $\omega$ for $n_b$=5 and R=13 cm (G5), R=7.5 cm (G7) and r*=1.35 cm (M. Abdellaoui, *Thèse de Doctorat de l'Université Paris VI*, submitted on 4 Jul., 1994). Evidently, the vial rotation velocity $\omega$ (does not only affect $E_c$, see FIGS. 110 and 111, but it) is particularly relevant for frequency f' and f of the actual impacts of the milling ball(s) upon vial surface and/or material on the vial surface (FIG. 113) and the resulting impact power P' and P (in [W]), i.e.

$$P'=E_c^*f' \text{ and } P=E_c^*f \quad (MA13a,b)$$

(cf. FIG. 114). The vial rotation speed to provides a discrete impact frequency f' (f) for a given disc rotation speed $\Omega$ (and R at lower $\Omega$), i.e. f (f') is proportional to $\omega$ and relatively independent on R at higher values of $\Omega$ (FIG. 113). Iasonna and Magini have shown (A. Iasonna and M. Magini, *Mat. Transactions JIM* 36 (2), 1995, pp. 123–133) that f' obtained via eq.s MA9 and 10 is in excellent agreement with experimental observations for filling fractions of milling balls, $f_{nb}$<0.5, where $$f_{nb}=n_b/n_b(\max) \quad (MA14)$$

with $n_b(\max)$=maximum number per vial independent on size of milling balls and independent, on whether collision cascades instead of individual (ii)-type of ball movements occur (as is likely at higher velocities). Due to the effect of distance R on $E_c$, however, an increase in R from 7.5 to 13 cm results in an increase of impact power P by a factor of about 2 for $\Omega$=400 rpm to up to 3 for $\Omega$=500 rpm at a given vial rotation $\omega$=300 rpm (FIG. 114), for example. The effective mean impact frequency f' of events per unit mass or mole of initial material per vial is also controlled by the absolute weight of the initial (precursor) charge per vial, i.e.

$$f'=f/\Sigma m_{charge}[\text{Hz/gram}] \text{ and } f'=f/\Sigma n_{charge}[\text{Hz/mole}] \quad (MA15a,b)$$

providing a large range of discrete values of impact power, i.e.

$$P^*=E_c\cdot^*f^*[\text{W/gram}] \text{ and/or } [\text{W/mole}] \quad (MA16).$$

Figure 115:
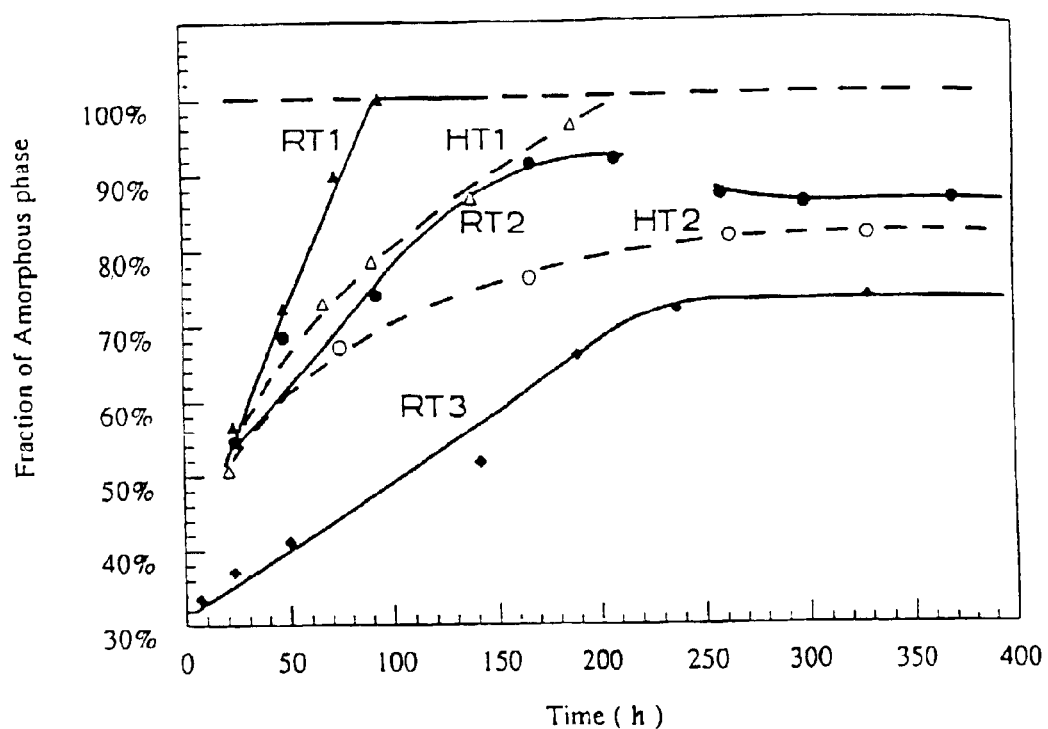
FIG. 115 Fraction amorphous of $Ni_{10}Zr_7$ alloy as a function of ball milling time using a vibrating ball mill with three milling "intensities" RT1 to RT3 at room temperature (solid symbols) and two milling intensities HT1 and HT2 at 200° C. (open symbols).

It is the effective mechanical impact power P* which has to match the required power $P_{req}(T,x)$ for non-equilibrium phase formation and which is imposed by the constitution of a given alloy system. The resulting control of a discrete and eventually very high P*-value (cf. next paragraph) makes planetary ball milling the most interesting ball milling technique for solid state synthesis of (in particular Mg-base) non-equilibrium phases which require an homogeneity on an atomic length scale to provide sufficient corrosion resistance (see above) and which incorporates powder and/or microstructural (second phase and/or grain) refinement afforded by alternative ball milling techniques (cf. next paragraph). The control of the transfer of impact power P into the ball-milled material is important, for example, for the volume fraction of non-equilibrium phase formation by (planetary) ball milling. Chen et al. reported (Y. Chen, R. LeHazif and G. Martin, *Solid St. Phen.* 23&24, 1992, Trans Tech Publications Ltd., Zürich, 1992, pp. 271–283) a minimum threshold in mechanical impact power P to be required in order to achieve the transformation of crystalline NiZr alloys into fully amorphous (i.e. 100 vol. % non-equilibrium) phase formation (see FIG. 115 and below, where FIG. 115 showing fraction amorphous of $Ni_{10}Zr$, alloy as a function of ball milling time using a vibrating ball mill with three milling "intensities" RT1 to R13 at room temperature (solid symbols) and two milling intensities HT1 and HT2 at 200° C. (open symbols) and showing that a) the amorphization rate increases with milling intensity and b) that milling intensity required for full amorphization requires to exceed a threshold (cf. RT3, N.B. milling "intensities" were: RT1>RT2>RT3 and HT1>HT2). The (steady state) amorphization rate was observed to increase with increasing shock power for a given milling temperature within the temperature range allowing for amorphization (cf. FIGS. 115 and 121).

3.2.3 Effect of Size, Material, Resulting Weight and Filling Fraction of Milling Balls Evidently, the ratio $\Sigma n_b/\Sigma m_{charge}$ is not a weight ratio and the ratio of weight of milling balls-to-$\Sigma m_{charge}$ is not a very useful parameter, since it allows for numerous unidentified materials and ball quantities to enter the milling process unless size, material (composition and resulting density) and resulting weight per milling ball were defined. The choice of size, material and resulting weight of (commercially available) milling balls is of secondary importance for the choice of R,$\Omega$,r* and $\omega$ in a planetary ball mill in order to obtain $P_{req}(T,x)$ for the non-equilibrium phase concerned (N.B. for a given $n_b$, the impact frequency f per vial and energy per impact $E_{K,s}$ and the resulting power (eq.MA 13a,b) are uniquely defined by $\omega$ and $\Omega$, cf. below), but is of prime significance with respect to alloy purity and affordable (type of) contamination of the ball-milled material such as the required non-equilibrium Mg-alloys, for example. The methods to avoid iron contaminations, for example, include to employ high $F_{c,B}/F_{c,f}$-ratios (cf. next section), lubricants (see below), for example, and a small number of WC-balls in WC-vials was also reported (R. S. Murthy, M. Mohan Rao and S. Ranganathan, *Acta metall. mater.* 43 (6), 1995, pp. 2443–2450) to reduce contaminations without entirely excluding such them.

Figure 116:
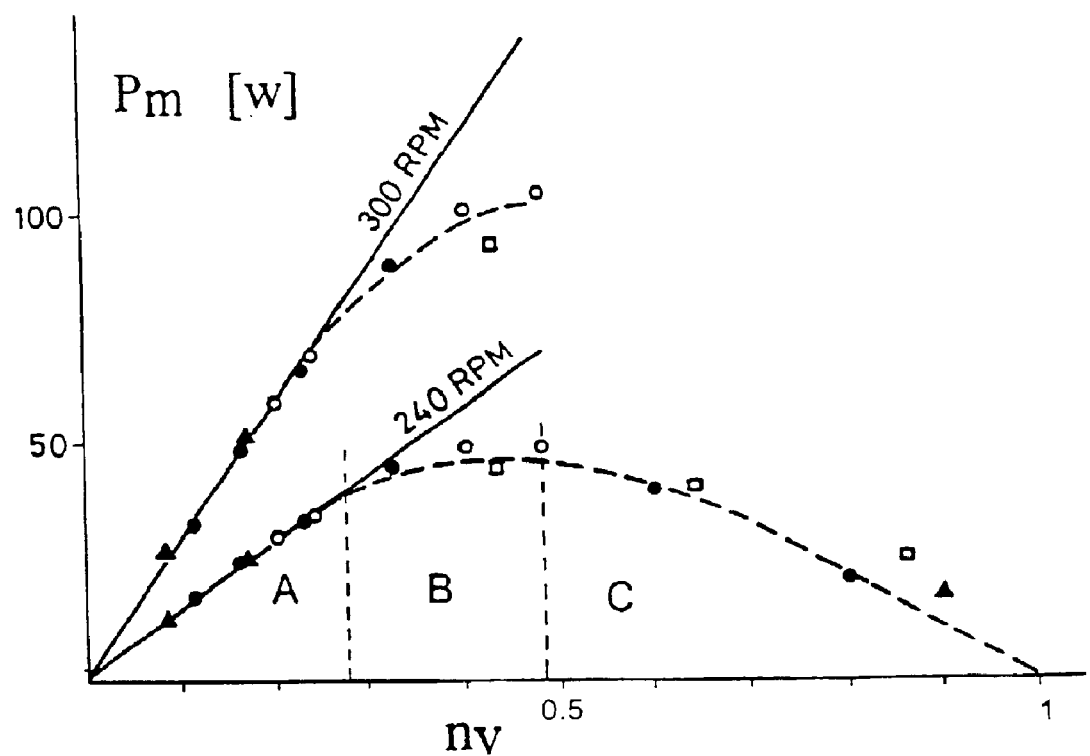
FIG. 116 Mechanical power absorption $P_m=P'_m-P°_m$ (where $P'_m$=for filled and $P°_m$=for empty vial) as a function of filling fraction $n_v=n_b/n_b(max)$ with $n_b$=actual and $n_b(max)$=maximum number of milling balls per vial.

The number $n_b$ of milling balls employed per milling container (vial) depends on the size of the milling container as $\Sigma m_{charge}$ does. $n_b$ is specified by the range of applicable and/or tolerable (with respect to contamination of end-product, and by commercially available) materials $\Delta\Sigma_k$ for a) milling containers and/or container surface (planetary: vial) and for b) milling balls resulting in specific weight $\rho_{b,j}$, by the radius $r_{b,i}$ and $(m_b)_{i,j}$=resulting absolute weight of an individual milling ball of resulting number $(n_b)_{i,j}$ or (e.g. the overall number of a mixture, i.e.) $\Sigma(\Sigma(n_b)_i)_j$ per milling container (vial). This notation is particularly important with respect to abrasion occurring upon ball milling and inevitably changing $r_{b,i}$ as a function of milling time. The materials of commercially available milling balls include $SiO_2$ (achate, density: 2.6 g/cm$^3$), "Syalon" (90% $Si_3N_4$, 3.24 g/cm$^3$), sintered corundum (99.7% $Al_2O_3$, 3.7 g/cm$^3$), tungsten carbide (96% WC +3% Co, 14.75 g/cm$^3$), hardened Cr-steel (7.85 g/cm$^3$), stainless Cr—Ni-steel (7.89 g/cm$^3$), Teflon with core of steel (3.0 g/cm$^3$) and 97% pure zirconia ($ZrO_2$, 5.7 g/cm$^3$) (Pulverisette 5$^R$, *Product brochure and Manual*, Fritsch GmbH Laborgerätebau, Idar-Oberstein, RFA; priv. communication, May, 1995). For a given $\rho_{b,j}$ and $r_{b,i}$, $(n_b)_{i,j}$ or $\Sigma(\Sigma(n_b)_i)_j$ are limited by $f_{nb}$(crit) above which the efficiency of power (transfer) decreases (FIG. 116 showing mechanical power absorption $P_m=P'_m-P^o_m$ (where $P'_m$= for filled and $P^o_m$=for empty vial) as a function of filling fraction $n_v=n_b/n_b(max)$ with $n_b$=actual and $n_b$(max)= maximum number of milling balls per vial at two disc rotation velocities $\Omega$, i.e. 240 and 300 rpm) and which is about 0.5 (cf. A. Iasonna and M. Magini, *Mat. Transactions JIM* 36 (2), 1995, pp. 123–133). The available size $r_{b,i}$ of these materials ranges from 5 over 10 and 15 to 20 mm.

Frequency f and $E_K$ are coupled by secondary parameters such as the specific weight $\rho_{b,j}$ and the size $r_{b,i}$ of milling balls defining both $(m_b)_{i,j}$ and $(n_b)_{i,j}$ at the same time. It was shown (A. Iasonna and M. Magini, *Mat. Transactions JIM* 36 (2), 1995, pp. 123–133) that the increase in rb, within the above range of ball sizes $\Sigma r_{b,k}$ increases the energy transfer $E_c$ and decreases frequency f showing that the same impact power can be transferred by different number of balls of different diameter. Therefore, the available parameter window $E_c$ vs. F* for non-equilibrium phase formation by planetary ball milling can be increased within certain limits independently on the ratio of $\omega/\Omega$ (see below), since impact frequency per vial can be controlled independently on impact energy by the number of milling balls per vial:

$$f^*=\Sigma\Sigma f^*_{i,j}=\Sigma\Sigma f^*(n_b)_{i,j}/\Sigma m_{charge} \text{ in [impact/(sec*gram)] or in [Hz/gram]} \quad (MA17).$$

Under the condition that ball weight does not affect ball velocity during the entire flight, a decrease in $E_c$ by decreasing $(m_b)_{i,j}$ can result in an increase of f, but the effect of fine-tuning $E_c$ and f by ball weight $(m_b)_{i,j}$ remain subjected to the control by $\Omega$ and $\omega$ for a given apparatus and R and size of vial and r all controlling impact energy per ball via:

$$\Sigma_c=\Sigma\Sigma E_{c,i,j}=\Sigma\Sigma(m_b)_{i,j}/2.*([-R\Omega+r^*\omega^*(-r\omega^2/R\omega^2)]^2) \text{ in [J/impact]} \quad (MA18).$$

Figure 117:
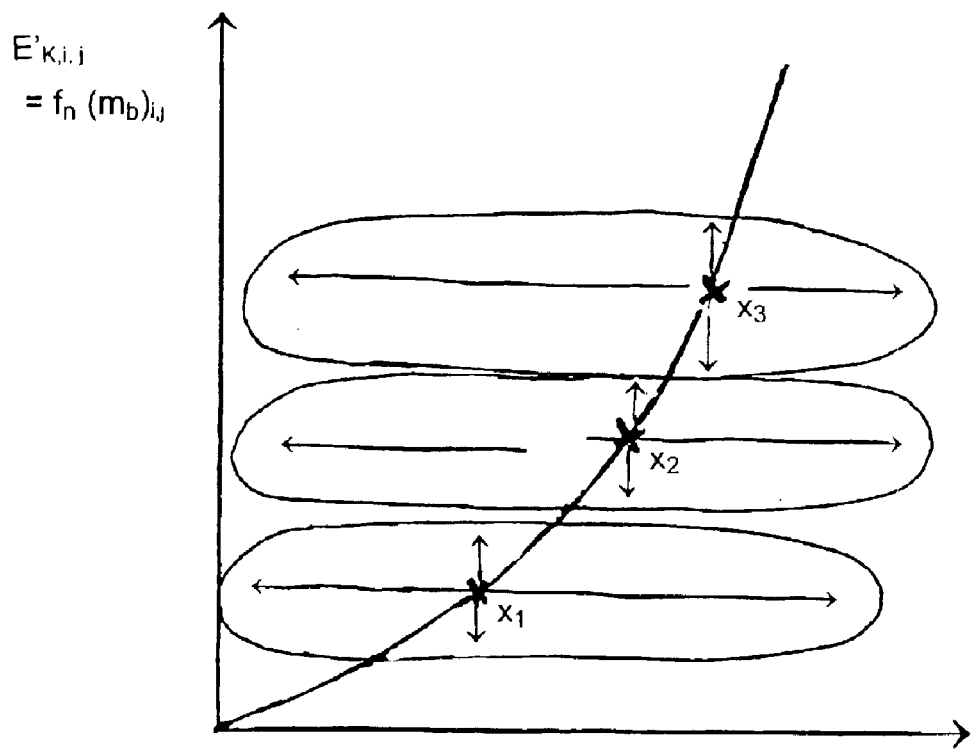
FIG. 117 Schematic showing qualitatively the relative freedom to manipulate impact energy and impact frequency with mass and number of milling balls per vial of planetary ball mill.

The freedom to manipulate $E_c$ per impact with the weight of the milling ball for a given $\Omega$ and $\omega$ is more restricted relative to manipulate the frequency with type and/or number of milling balls for a given $\Omega$ and $\omega$ of vials of industrial planetary ball mills yet to come with very large internal radii, since acceleration and resulting flight velocity $V_d$ of a billet can change due to the effect of gravity over long flight distances. The relative effect to increase the processing window $E_c$=fn(f*) by manipulation of number $(n_b)_{i,j}$ and/or weight of milling balls $(m_b)_{i,j}$ is reproduced graphically in FIG. 117 with schematic showing qualitatively the relative freedom to manipulate impact energy and impact frequency with mass and number of milling balls per vial of planetary ball mill, type II, of a given product $\omega^2 r$ and $\omega^2 R$ as indicated (i.e. $x_1$, $x_2$, $x_3$; cf. FIG. 119).

3.2.4 Decomposition of Discrete Kinetic Energy Value $E_c$ and Resulting Mode of Power Transfer: Control of Transfer Efficiency, Resulting Milling Time and Temperature for a given P*

The impact of the milling balls results in local elastic and plastic deformation of the material (i.e. vial, precursors and/or ne-phase) and friction. Under the assumptions that (i) no slip between milling ball and vial surface or material upon detachment and collision and. (ii) no collision between milling ball(s) and/or between milling balls and material during flight occurs and that (iii) the effect on velocity of weight of the milling ball is negligible, the discrete $E_c$-value decomposes into the following two components (cf. FIG. 112):

$$E_c=E_c(V_c)=(m_b/2)*((V_{c,\rho}^2+(V_{c,\alpha})^2)=E_{c,s}+E_{c,f} \text{ in [J/impact]} \quad (MA19)$$

where $V_{c,\rho}$ the normal velocity (which induces primarily deformation energy by shock) and $V_{c,\alpha}$ the tangential velocity (which induces primarily heat by friction). In order to calculate both relative velocities quantitatively, it is necessary to transform eq. MA6 from cartesian into the local tangential ($u_\alpha$) and perpendicular ($u_\rho$) components at impact by using $$u_\rho=\cos(\alpha)I+\sin(\alpha)J \text{ and } u_\alpha=-\sin(\alpha)I+\cos(\alpha)J \text{ resulting in}$$
$$I=\cos(\alpha)u_{\rho-\sin(\alpha)}u_\alpha \text{ and } J=\sin(\alpha)u_\rho+\cos(\alpha)u_\alpha \quad (MA20a,b).$$

The flight trajectory of a milling ball (cf. FIG. 112) obtained by sufficient rotational speed $\Omega$ at rotational distance $R_\Omega$ is defined by a relative movement in flight with regard to the holder disc (i.e. by vector $U_\rho$) and the vial (by vector $u_\rho$). Due to the (assumed) absence of the effect of gravitation, the relative movement of the milling ball lies in the two-dimensional plane of the rotating holder disc for the vials and is therefore completely defined by only two (and not three) components following:

$$U_\rho=\cos(\Theta)I+\sin(\Theta)J \text{ and } u_\rho=\cos(\alpha)I+\sin(\alpha)J$$

where $\Theta=\Omega t$ and $\alpha=-\omega t$, t=time (interval) of planetary ball milling passed by and I and J the reference vectors defining the plane of the holder disc. The vectors $U_\rho$ and $u_\rho$ provide a unique definition of the movement of milling balls relative to the movement of the apparatus and to the resultant effects they introduce into the initial (precursor) material including effective shock energy, frequency and power required per unit mass of non-equilibrium material.

Substitution of eq.s MA20a,b with eq. MA6 results in the normal and tangential velocities of a milling ball in the moment of impact at the surface of the vial of which the absolute values are defined as (for the details of the mathematical treatment, see M. Abdellaoui, *Thèse de Doctorat de l'Université Paris VI*, submitted on 4 Jul., 1994; M. Abdellaoui and E. Gaffet, *Acta metall. mater.* 43 (3), 1995, pp. 1087–1098):

$$V_{c,\rho}=[(-R\Omega+r^*\omega C)\cos(\alpha)-r^*\omega(1-C^2)^{0.5}\sin(\alpha)][m/s] \quad (MA21)$$

$$V_{c,\alpha}=[(-R\Omega+r^*\omega C)\sin(\alpha)+r^*\omega(1-C^2)^{0.5}\cos(\alpha)][m/s] \quad (MA22).$$

FIG. 110 shows the results for $V_{c,\rho}$ and $V_{c,\alpha}$ as a function of $\alpha=\omega t$ under the assumptions of R=12.5 cm, r*=2.775 cm, Ω=206 rpm (3.43 Hz), ω=80 rpm (1.3 Hz) resulting in C=$(-\omega^2 r^*)/\Omega^2 R$=−0.0335.

Figure 118:
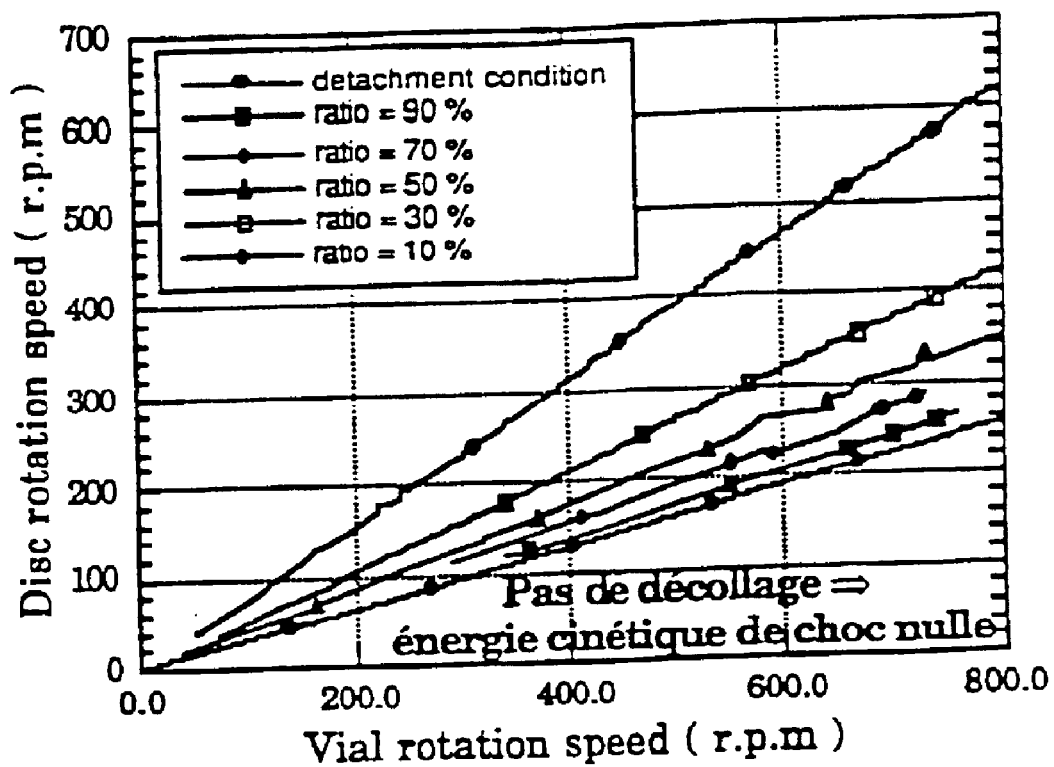
FIG. 118 Disc rotation Ω as a function of vial rotation velocity ω for planetary ball mill with R=13 cm.

The angle of impact, α, is obtained numerically via eq.s MA9 and 10. Subsequent substitution of eq.s MA21 and 22 with eq. MA19 results in corresponding (a) ratio of shock-to-function energy induced into the material, (b) corresponding fraction of shock and friction powers, and (in practice) the (c) resulting elastic and plastic deformation of the material and the (d) resulting local, mean and maximum temperature. FIG. 118 shows disc rotation Ω as a function of vial rotation velocity ω for planetary ball mill with R=13 cm and minimum disc rotation for ball detachment (lowest line with solid circles) and decreasing friction-to-shock energy with increasing slope of the straight lines according to the figures given in the insertion. From M. Abdellaoui, *Thèse de Doctorat de l'Université Paris VI*, submitted on 4 Jul., 1994. FIG. 118 shows a decreasing friction-to-shock energy ratio with increasing disc rotation velocity Ω for a given vial rotation velocity ω and R=13 cm and r*=1.35 cm. The possibilities to increase the ratio of $E_{c,s}$ over $E_{c,f}$ include the reduction of vial velocity ta for a given disc velocity Ω, but also to decrease the ratio $(\omega^2 r^*/\Omega^2 R)$ (cf. criterion MA4) by increasing R or decreasing r*. The angle α and the resulting Ω/ω-couples required for maximum shock energy and zero friction is obtained numerically by the derivatives $$dE_{c,s}/d\alpha = m_b\left[(-R\Omega + r^*\omega C)\cos(\alpha) - \right. \quad \text{(MA23)}$$
$$\left. r^*\omega(1-C^2)^{0.5}\sin(\alpha)\right] *$$
$$\left[-(-R\Omega + r^*\omega C)\sin(\alpha) - \right.$$
$$\left. r^*\omega(1-C^2)^{0.5}\cos(\alpha)\right]$$

$$dE_{c,f}/d\alpha = m_b\left[(-R\Omega + r^*\omega C)\cos(\alpha) - \right. \quad \text{(MA24)}$$
$$\left. r^*\omega(1-C^2)^{0.5}\sin(\alpha)\right] *$$
$$\left[-(-R\Omega + r^*\omega C)\sin(\alpha) - \right.$$
$$\left. r^*\omega(1-C^2)^{0.5}\cos(\alpha)\right]$$

Friction represents the work required for embedding a hard (and eventually brittle, see following paragraphs) precursor constituent such as a transition metal or a metalloid in magnesium e.g. at the beginning of the milling cycle, shock represents the work required for constitutional change including grain refinement and formation of (metastable) non-equilibrium phases.

In their classical paper Benjamin and Volin (J. S. Benjamin and T. E. Volin, *Met. Trans.* 5, 1974, p. 1929) reported on rive periods during mechanical alloying of a powder including (i) particle flattening resulting from plastic deformation, (ii) particle welding increasing mean particle size, while particle number decrease, (iii), formation of equiaxed particles when welding and fracturing rate is about equal, though the microstructure consists of a laminar alignment of the precursors, followed by (iv) more random welding including the formation of-laminar colonies and (v) the final refinement of microstructure and/or particles. Materials parameters promoting powder and/or alternating layer formation, i.e. the milling effect independent on size and shape of precursor include the operative engineering properties such as ductility or brittleness, hardness, and shock-resistance of the employed precursor material linking milling variables with the as-milled powder product. Provided, that the correct material for milling balls and/or (surface coating of the) vial(s) was selected, an increase in friction may be induced deliberately by relatively large ω/Ω-ratios (cf. FIGS. 118, 119 where FIG. 119 showing rotation velocity (top) as a function of presetting of Pulverisette $5^R$ of motor, holder disc (Ω) and vial(s) (absolute and relative to Ω) and (bottom) resulting coupling factor $k_{\Omega/\omega}$=1.17 for $\omega_{abs}$=fn(Ω), see Pulverisette $5^R$, *Product brochure and Manual*, Fritsch GmbH Laborgerätebau, Idar-Oberstein, RFA; priv. communication, May, 1995) at the beginning of the milling cycle during stage (i) to (iii) to enhance the repeated fracture and welding of (elemental and/or pre-alloyed) precursors (i.e. the welding-to-fracture cycle of clean interfaces generating alternating layers in the (sub-) micron range in time $t(me)_{req}$ prior to trigger non-equilibrium (ne, i.e. matrix and/or one-) phase formation in $t(ne)_{req}$ via mutual in-diffusion of the involved (elemental) components with an homogeneity on an atomic length scale), but also at the end of the milling cycle in order to explore in-situ heating for an increase in the formation rate of the corresponding non-equilibrium phase (cf. chapter 3.9 below), all resulting in the overall milling time required $$t_{req}=t(me)_{req}+t(ne)_{req}.$$

Friction has to be minimized, however, during the cycle for ne-phase formation, $t(ne)_{req}$ in order for (i) full exploitation of the power supplied by the machine and to maximize the efficiency of impact power for ne-phase formation following $$t(ne)_{re}=P_{req}(T,x)/E_{c,s,c}$$

where $E_{c,s,c}$ the shock energy cumulated during the milling operation, as well as for (ii) lowest possible contamination with Fe, for example (if contamination cannot be avoided otherwise such as by the choice of the milling ball material and vial, type of alloying additives, lubricants, etc., see below). Unless Ω and ω are chosen as such that $dE_{c,f}/d\alpha$=0 and $d^2E_{c,f}/d^2\alpha$=negative, $E_{c,f}$ friction, so grinding and thus heating is inevitably involved and T-control may eventually require a cooling system. Evidently, classical terms such as "mechanical grinding" (used for ball milling from one single type of pre-alloyed precursor to produce non-equilibrium alloys) and "mechanical alloying" (used for ball milling for an alloy by using different precursor components) are useless for the operator in order to arrive at homogeneous non-equilibrium phases, since it is evident that a precursor charge of various elemental components requires primarily friction (as indicated by the term grinding (N.B. a mixture of milling balls including two larger WC balls of radius ¼ inch (6 mm) was recommended (Fritsch GmbH Laborgerätebau, Idar-Oberstein, RFA, priv. communication, May, 1995) to improve the efficiency of milling power for sufficient grinding action) at the beginning before shock takes over rate-control for homogeneous transformation to the required (one-phase or essentially one phase) non-equilibrium structure and eventually including (chemical) reaction without the need for long range order atomic displacements. The choice of (i) and (refractory-) dispersion strengthened Mg-base alloy with an equilibrium Mg-base matrix phase or for (ii) a metastable Mg-base bulk alloy with a non-equilibrium and eventually very corrosion resistant matrix phase, i.e. the constitutional effect, and/or with a non-equilibrium microstructure involving at least one of both type of phases, is depending on the mode of impact power of a given precursor charge and no other technique gives such as freedom to control them than type I of PBM.

Accordingly, the operative $P_{req}$-thresholds required for homogeneous non-equilibrium phase formation by (planetary) ball milling may change with Ω and/or ω and resulting impact energy and/or frequency f', since the type of the transfer of $E_x$, i.e. the operative $E_{c,\alpha}/E_{c,f}$-ratio controls the local, mean and maximum temperatures all depending on the number of collision events per ball and unit time f' with the vial surface and/or the material to be milled, i.e. on time $t(\alpha)=t_1+t_2$ between two impacts. The injected power increase with increasing rotation velocities $\Omega$ and/or $\omega$ and make planetary ball milling a high power and eventually hot milling equipment (the heat of which controlled deliberately by $\omega=fn(\Omega,R,r^*)$ and/or cooling and/or additional artificial heating). For the fabrication of economically viable non-equilibrium Mg-alloys with superior corrosion resistance by planetary ball milling it is therefore inevitably to employ planetary ball mills in which $\Omega$ and $\omega$ are decoupled (see below).

3.2.5 Limited Control on $E_c$, f' and Power-Transfer by Commercial Planetary (Type-II) Ball Mills One important limiting parameter on the control of injected power by using commercially available (type-II of) planetary ball mills is their interdependence/proportionality of rotation velocity of the vial(s), $\omega$, to the rotation velocity of the holder disc, $\Omega$, following:

$$\omega = -k_{\Omega/\omega} * \Omega \quad (MA25)$$

where $k_{\Omega/\omega}$=const. coupling parameter, that is, the rotation velocity of the vial(s) increases (nearly or almost nearly) linearly with increasing rotation velocity of the holder disc so being preset by $\Omega$ (FIG. 119 and: Pulverisette $5^R$, *Product brochure and Manual*, Fritsch GmbH Laborgerätebau, Idar-Oberstein, RFA). In planetary ball mills for which $\Omega$ and $\omega$ are mechanically coupled (i.e. only one motor), a large impact power is thus inevitably linked with relatively high shock frequencies per milling ball eventually overrunning the required control of non-equilibrium phase formation and selection via the (ii)-type of milling ball movement by excessive friction resulting in unfavorable $E_{c,f}/E_{c,s}$-ratios, for example (cf. straight line for $k_{\Omega/\omega}$ of planetary II-type planetary ball milling in FIG. 119 as well as corresponding line in FIGS. 119, 120 where FIG. 120 is as for FIGS. 111, 113 and 114, here for Pulverisette $5^R$, showing that for PBM, type II, the relationships shrink down to one graph (line) as a result of the coupling factor $k_{\Omega/\omega}$ (here –1.15) and showing also the effect of vial radius r in the range of 2.1 (small) to 3.3 (large) cm by using milling balls of size $r_b$=7.5 mm, $\rho_b$=7.92 g/cm$^3$ resulting in $m_b$=14 g. Evidently, the effect of vial radius r on impact power is very small in the lower 0-regime. From E. Gaffet, M. Abdellaoui and N. Malhourouroux-Gaffet, *Mater. Trans JIM* 36 (2), 1995, pp. 196–207, see FIG. 108 instead "(Fig. MA5)").

Furthermore, the (ii)-type of milling ball movement in commercially available planetary ball mills is limited (last, but not least due to the detachment condition, see above) to relatively small radii R so "r" of the vial and consequently, it was yet impossible to apply this technique to a larger production volume of homogeneous non-equilibrium phases. Type-II of ball mills therefore allow for limited control on the $E_{c,s}/E_{c,f}$-ratio so on P*(T) and milling time and resulting cumulative energy required, i.e.

$$E_{c,c}=P^*(T)^*t_{req}(MA\ 26).$$

Therefore, impact frequency f per vial (for a given $\omega$ and/or given $\Omega$ so for a given impact energy $E_c$) of a commercially available planetary ball mill is controlled entirely by the number of milling balls, $n_b$ (cf. eq. MA 12). At $n_b=n_b$(crit) where $n_{crit}=fn\ (f_{nb})$, however, an increase in filling fraction of the vials with milling balls and/or material results in undue friction so heating.

3.2.6 Results by Planetary Ball Mills with $\omega$ Decoupled from $\Omega$ (Type-I)

It was only very recently that a thorough control of rotation speed $\Omega$, $\omega$ and T independent from each other as well as the effect of separation distance R on impact energy and impact frequency required for ne-phase formability was employed more systematically. Gaffet et al. reported (M. Abdellaoui and E. Gaffet, *Acta metall. mater.* 43 (3), 1995, pp. 1087–1098; E. Gaffet and L. Yousfi, *Mat. Sci. Forum* 88–90, 1992, pp. 51–58; E. Gaffet, *Mat. Sci. Engng.* A132, 1991, pp. 181–193) the formation of amorphous $Ni_{10}Zr$, at room temperature to require 48 h by employing an upper $\Omega$-threshold at 600 rpm and a lower $\Omega$-borderline at 500 rpm employing R=7.5 cm or by using $\Omega$=380–410 rpm for R=13 cm resulting in $\omega_{req}$ ranging from about 50 (127) rpm to 360 rpm by using r*=1.35 cm in both cases (FIGS. 121, 122). FIG. 121 shows an $\Omega$-$\omega$-T window for amorphous $Ni_{10}Zr$, by planetary ball milling with R=7.5 cm of crystalline $N_{10}Zr_7$ intermetallic phase. Solid symbols represent fully amorphous $Ni_{10}Zr_7$, semi-solid symbols represent partially amorphous $Ni_{10}Zr_7$. From (E. Gaffet and L. Yousfi, *Mat. Sci. Forum* 88–90, 1992, pp. 51–58). FIG. 122 is as for FIG. 121, here including data from planetary ball mill with R=13 cm, all at ambient temperature. Solid symbols: fully amorphous, open symbols: partially amorphous, squares: R=7.5 cm, circles: R=13 cm. From M. Abdellaoui and E. Gaffet, *Acta metall mater.* 43 (3), 1995, pp. 1087–1098.

The resulting $E_c$-and f*-values required for amorphization by the two planetary ball mills were quite different (FIG. 122,123 where FIG. 123 Kinetic impact energy and impact frequency, the latter per five milling balls, as a function of disc velocity $\Omega$ for vial rotation 150 (1), 250 (2) and 350 (3) rpm of planetary ball mills with R=7.5 (G7) and 13 cm (G5) showing corresponding windows for amorphization of $Ni_{10}Zr_7$. r=2.1 cm, $r_b$=7.5 mm, $m_b$=14 g. From M. Abdellaoui and E. Gaffet, *Acta metall. mater.* 43 (3), 1995, pp. 1087–1098) showing that neither the impact energy nor the frequency controlled solid state ne-phase formation (FIG. 123) and that only the product of both, i.e. the resulting impact power P*(T) controls the formation of the non-equilibrium amorphous phase (FIG. 124 showing impact power as a function of disc velocity $\Omega$ for vial velocities ranging from 150 (1) over 250 (2), 350 (3), 500 (4) and 600 rpm (5) of planetary ball mills with R=13 (G5) and 7.5 cm (G7). Data points a to e for G5 and a' to d' for G7 represent fully amorphous $Ni_{10}Zr_7$, corresponding open squares and circles representing partially amorphous/crystalline $Ni_{10}Zr_7$-alloy. $n_b$=5, $r_b$=7.5 mm; $m_b$=14 g. From M. Abdellaoui and E. Gaffet, *Acta metall. mater.* 43 (3), 1995, pp. 1087–1098).

At the lower $\Omega$-bound, amorphization was considered to be limited by insufficient impact (=activation) power (or energy) for ne-phase formation below which only partial amorphization and/or microstructural refinement was possible, while amorphization at the higher $\Omega$- and the higher $\omega$-bound was considered to be limited by excessive power input resulting in excessive (local) heating (E. Gaffet, F. Faudot and M. Harmelin, a) *Mat. Sci. Engng.* A149, 1991, pp. 85–94; b) *Mat. Sci. For.* 88–90, 1992, pp. 375–382; E. Gaffet and G. Martin, *Coll. Phys.* C4, *Suppl.* N● 14, 51, 1990, pp. 71–77). The interpretation is supported by similar observations by other authors (cf. J. Eckert, L. Schultz, E. Hellstern and K. Urbain, *J. Appl. Phys.* 64, 1988, pp. 3224) and by the shrinking size of the $\Omega/\omega$-window for amorphization of $Ni_{11}Zr_9$ alloy at higher vial (i.e. macroscopic) milling temperatures before disappearing completely at milling temperatures above 300° C. Within the actual parameter window for amorphization, however, the rate to induce structural defects arrives at a steady state at which the impact energy is consumed by atomic movements to form and (after completion of phase transformation) to move within a structurally homogeneous ne-phase (M. Abdellaoui and E. Gaffet, *Acta metall. mater.* 43 (3), 1995, pp. 1087–1098).

Table 7 summarizes the quantitative milling conditions employed by Gaffet and co-workers on non-equilibrium phase formation by planetary ball milling of $Ni_{11}Zr_9$ and other metallic systems and materials, (ii) the resultant windows $\Delta P_{req}$ as well as (iii) the resulting cumulative impact energy $E_{c,c}$=fn(P,t). The employed impact energies $E_c$ range from (0.07 to 0.25 J/impact (by assuming $K_a$ =1), the employed frequencies were between 24 and 130 Hz, and the resulting impact powers were from 0.3 to 2.2 W/g resulting (by employing milling times between 40 and 480 h) in cumulative energies ranging from 0.05 to 1.0 GJ/g. N.B. where such high energies are consumed it is evident that the materials of milling body and container must be compatible with the end-product, in particular for aeronautical applications. The special merits of the work by Gaffet et al. were to show (cf. Table 7):

12. That the supra-technological milling variables controlling ball, bar and/or rod milling are (i) injected milling power and (ii) the ratio of shock-to-friction which uniquely define the operating conditions to control the non-equilibrium state of a given (precursor) material. The control of these parameters allows to overrun "frontiers" such as $\Delta H^{mix}$-criterion etc. until recently being considered to limit non-equilibrium phase formation by solid state synthesis such as ball milling including mechanical alloying (cf. amorphous Cu—W, Si (E. Gaffet and M. Harmelin, *J. Less-Common Met.* 157,1990, p. 201) and Ge).
13. For planetary ball milling, a separate and quantitative control on two process parameters, i.e. (i) disc rotation frequency $\Omega$ for a given R, $m_b$ and resulting $E_c$ and (ii) vial rotation velocity $\omega$ for a given r* and $n_b$ and the resulting impact frequency f for a given alloy charge, all at a given milling temperature as well as the milling temperature itself allow to control the absolute value and the nature of the required power-input for ne-phase formation, P*(T,x).
3. For the first time, a quantitative effect of R and $\Omega_{req}$ for non-equilibrium phase formation was reported following approximately the equation $(\Omega^2 R)_1 = (\Omega^2 R)_2$.
4. The advantage of planetary ball mills to offer the largest latitude of P(T) and of control on P(T) and on corresponding nature of P(T), i.e. the ratio of shock-to friction power as compared to competing ball milling technologies such as vibrating or horizontal or attritor ball mills all being associated with undue levels of friction (cf. next paragraph).

It was interesting to note that there was no significant effect of ball milling conditions—within the employed range of parameters—on the critical values of the destabilization of the diamond structure of pure Ge (and Si, not shown in Table 7) which were reported (E. Gaffet, *Mat. Sci. Engng.* A136, 1991, pp. 161–169) to result from a refinement of the crystallite and a resulting expansion of the crystal lattice parameter. It was also interesting to note that amorphization of Cu—W alloys (which are characterized by a positive heat of mixing up to 35.5 kJ/mole, see A. R. Miedema, *Philips Tech. Rev.* 36(8), 1976, p. 217) require relatively high milling times and resulting cumulative energies and this appears to be consistent with equivalent Al-base systems such as Al—Nb (see above). In contrast, the system NiZr does not only allow for relatively short milling times and resulting cumulative impact energies, but also for a relatively large $\Delta P$-window ranging from 400 to 820 mW/g (cf. Table 7, FIG. 124 and M. Abdellaoui and E. Gaffet, *J. All. Compounds* 209, 1994, pp. 351–361). This may be related to a relatively large negative heat of mixing, $\Delta H^{mix}$ of the system Ni—Zr, since although the $\Delta H^{mix}$-criterion may not serve as a criterion to exclude amorphous and/or non-equilibrium phase formation (see above), it may serve as a reference for ne-phase formation rate and for the extension of the $\Delta P$-window for non-equilibrium phase formation by ball milling and corresponding $P_{req}$(T,x)-domain provided by nature.

Low $\Delta H^{mix}$-values were considered to favor extended solid solutions over amorphous phases upon non-equilibrium (matrix) phase formation by mechanical alloying (cf. above and L. Schultz, *Mat. Sci. Engng.* 97, 1988, pp. 15–23). Low $\Delta H^{mix}$-values, however, are a universal consequence for terminal compositions which is consistent with the requirement to retain the low density of Mg in the disclosed Mg-alloys made by non-equilibrium processing such as by vapor deposition and ball milling. Both technologies overrun the constitution of the alloy system preset by macroscopic thermodynamics independently on whether reactive constituents such as Al and/or Mg are involved and independently on relatively large (negative and low positive) $\Delta H^{mix}$-values for concentrated alloy compositions (such as $Mg_{50}X_{50}$, A. R. Miedema, *Philips Tech Rev.* 36(8), 1976, p.217; R. Hultgren, P. D. Desai, D. T. Hawkins, M. Gleiser and K. K. Kelly, *Selected Value of the Thermodynamic Properties of Binary Alloys*, ASM Metals, Ohio, 1973). For ball milling including mechanical alloying and/or mechanical grinding and/or chemical reaction milling, however, the required time to produce the more relevant microstructural control for passivation of corresponding Mg-base alloy due to homogenization of the involved alloying elements on an atomic length scale and degree of suppression and resulting tailoring by subsequent thermo-mechanical processing of second phase dispersions appears to be well covered by the $E_c$-, f-, P*- and $E_{c,c}$-values required for the systems summarized in Table 7.

TABLE 7

Quantitative Conditions for Non-Equilibrium Phase Formation Type-I of Planetary Ball Milling (PBM)

| System | NE-Phase [wt. %] (if not indicated otherwise) | R [mm] | $\Omega$ rpm | r*/$r_b$ [mm] | $\omega$ rpm | $m_b$ [g] | $n_b$ | $m_{charge}$ [g] | t [h] | Atmosph. | $E_c$ [J/impact] | f [Hz] | p [W/g] | $E_{c,c}$ [GJ/10 g] |
|---|---|---|---|---|---|---|---|---|---|---|---|---|---|---|
| Ni—Zr | amorph. (at.) | 75 | 500– | 13.5/ | 50– | 14 | 5 | 10 | 40– | static | 0.11– | 30– | 0.3– | 0.48– |
| | $Ni_{10}Zr_7$ | | 600 | 7.5 | 360 | | | | 48 | Ar | 0.16 | 55 | 0.9 | 1.52 |
| | amorph. (at.) | 132 | 380– | 13.5/ | 50– | 14 | 5 | 10 | 48 | static | 0.194– | 24– | 0.5– | 0.8– |
| | $Ni_{10}Zr_7$ | | 410 | 7.5 | 360 | | | | | Ar | 0.227 | 41 | 1.0 | 1.45 |

TABLE 7-continued

Quantitative Conditions for Non-Equilibrium Phase Formation Type-I of Planetary Ball Milling (PBM)

| System | NE-Phase [wt. %] (if not indicated otherwise) | R [mm] | Ω rpm | r*/r_b [mm] | ω rpm | m_b [g] | n_b | m_charge [g] | t [h] | Atmosph. — | E_c [J/impact] | f [Hz] | p [W/g] | E_{c,c} [GJ/10 g] |
|---|---|---|---|---|---|---|---|---|---|---|---|---|---|---|
| Cu—Fe | TSSE of 27 Cu in Fe 65 Fe in Cu | 132 | 305 | 13.5/7.5 | 675 | 14 | 5 | 10 | 240 | Air + 1 ml ethanol | 0.16 | 60 | 1.0 | 8.3 |
| Cu—W | part. am. Cu—30–100 W and TSSE of 5–25 W in Cu part. am. Si—Ge: | 120 | 340 | 13.5/7.5 | 765 | 14 | 5 | 10 | 140–180 | static Ar | 0.2 | 69 | 1.4 | 7–9 |
| Ge—Si | Si—52.2 Ge Si—35 Ge | 120 | 200 | 13.5/7.5 | 450 | 14 | 5 | 10 | — | static Ar | 0.07 | 44–69 | 0.3 | — |
|  |  | 120 | 340 | 13.5/7.5 | 765 | 14 | 5 | 10 | — | static Ar | 0.2 |  | 1.4 | — |
| Ge | amorph. Ge | 75 | 700 | 13.5/7.5 | 1400 | 14 | 5 | 10 | 96 | static Ar | 0.25 | 130 | 2.2 | 10.4 |
|  |  | 120 | 340 | 13.5/7.5 | 765 | 14 | 5 | 10 | 72 | static Ar | 0.20 | 70 | 1.4 | 3.6 |
|  |  | 120 | 200 | 13.5/7.5 | 450 | 14 | 5 | 10 | 150 | static Ar | 0.07 | 42 | 0.3 | 1.6 |
| Fe—Si | TSSE of 16 Si in Fe | 120 | 340 | 13.5/7.5 | 765 | 14 | 5 | 10 | 168 | static Ar | 0.2 | 70 | 1.4 | 8.5 |
|  | part. am. Fe—26–36 Si | 75 | 600–700 | 13.5/7.5 | 250 | 14 | 5 | 10 | 168 | static Ar | 0.17–0.18 | 47–52 | 0.8–0.9 | 4.8–5.7 |
| Si—B | amorph. Si—0 to 90 B | 120 | 200 | 13.5/7.5 | 450 | 14 | 5 | 10 | 233–480 | static Ar | 0.07 | 44 | 0.3 | 2.6–5.4 |
| Si—C | amorph. Si—30 to 70 C | 120 | 200 | 13.5/7.5 | 450 | 14 | 5 | 10 | — | static Ar | 0.07 | 44 | 0.3 | — |

NE: non-equilibrium,
part. am.: partially amorphous,
at.: atomic ratio,
TSSE: terminal solid solubility extension,
other symbols: see text to Table 7: References per Alloy System Ni—Zr:
M. Abdellaoui and E. Gaffet, *Acta metall mater.* 43 (3), 1995, pp. 1087–1098; E. Gaffet and L. Yousfi, *Mat. Sci. Forum* 88–90, 1992, pp. 51–58; E. Gaffet, *Mat. Sci. Engng.* A132, 1991, pp. 181–193.
Cu—Fe:
E. Gaffet, M. Harmelin and F. Faudot, *J. Appl. and Comp.* 194, 1993, pp. 23–30.
Cu—W:
E. Gaffet, C. Louison, M. Harmelin and F. Faudot, *Proc. 7th Int. Conf. on Rapidly Quenched Metals*, Stockholm, 1990, *Mat. Sci. Engng.* A134, 1991, pp. 1380–1384.
Ge—Si:
E. Gaffet, F. Faudot and M. Harmelin, a) *Mat. Sci. Engng.* A149, 1991, pp. 85–94; b) *Mat. Sci. For.* 88–90, 1992, pp. 375–382.
Ge:
E. Gaffet, *Mat. Sci. Engng.* A136, 1991, pp. 161–169.
Fe—Si:189. E. Gaffet, N. Malhouroux and M. Abdellaoui, *J. All. Comp.* 194, 1993, pp. 339–361.
Si—B and Si—C:
E. Gaffet, P. Marco, M. Fedoroff and J. C. Rochaud, *Mat. Sci. For.,* 88–90, 1992, pp. 383–390.

The separate control of ω independent on Ω of planetary ball mills leaves particular possibilities for the operator to control $E_c$ and f* in order to enhance non-equilibrium phase formability by the operator:

1 to provide high activation energies for ne-phase formation even for milling quantities without excessive power and/or friction input (i.e. gravitational forces be overcome over large flight distances at relatively low impact frequencies (and local temperatures) per milling ball independent on whether the milling container is chilled or not (N.B. excessive power inputs were shown (E. Gaffet and L. Yousfi, *Mat. Sci. Forum* 88–90, 1992, pp. 51–58) to stabilize an inhomogeneous matrix without the possibility to return to the homogeneous ne-phase during the milling operation). Planetary ball mills with ω decoupled from Ω provides a more efficient use of impact power and non-equilibrium phase formation by the operator than all other types of the existing ball milling techniques.

2. more efficient milling histories from initial charge to the non-equilibrium powder end-product including the in-situ change (i.e. during the milling operation without interruption of the milling procedure and/or exposure of the material to a different atmosphere) of $f_c$ without $E_c$ and vice versa.

The available impact power of planetary ball mills is uncritical for formation of homogeneous ne-phases such as corrosion resistant non-equilibrium magnesium alloys, but the available technology is not sufficient to allow the required control for the production of economically viable quantities (cf. next chapter).

3.3 Degree of Control and Latitude of Shock Power vs. Productivity: Comparison and Hierarchization of Ball Milling Techniques for ne-Phase Formation Tables 8 and 9 show a comparison of the characteristics of the main milling techniques. Type-I (and -II) of planetary ball milling provide impact powers covering the power regime of all other ball milling techniques. This includes (i)

control of a discrete value of kinetic energy $E_c$ per collision between milling ball and internal vial surface, which is proportional to $\Omega^2$ for a holder disc of given R so being controlled by the product $\Omega^2 R$ and (ii) to provide this control over a large range of $\Omega$-values and impact frequencies resulting in a large range of discretely controlled mechanical shock powers with (iii) a controlled degree of friction to be transferred from the at least one milling ball per vial (after detachment from the internal vial surface) upon collision with the ball-milled material at the (opposite side of the) internal vial surface (cf. FIG. 109) thereby allowing power levels to trigger atomic jumps as in an irradiation process (E. Gaffet and G. Martin, *Coll. Phys. C4, Suppl. No* 14, 51, 1990, pp. 71–77). The control of a discrete $E_c$-value over a wide range of impact powers makes planetary ball milling a superior ball milling technique for non-equilibrium phase formation which incorporates microstructural (second phase and grain) refinement afforded by the other types of ball milling such as attrition or vibrating ball mills in which (i) the control and/or (ii) range of the, available shock energy and resulting shock power(s) is substantially smaller compared to the operating shock energy in a planetary ball mill (cf. Y. Chen, R. LeHazif and G. Martin, *Solid St. Phen.* 23&24, 1992, Trans Tech Publications Ltd., Zürich, 1992, pp. 271–283; M. Abdellaoui and E. Gaffet, *Acta metall. mater.* 43 (3), 1995, pp. 1087–1098).

Vibrating ball mills are divided in "cold", low power frame grinders (e.g. Pulverisette O) and in "hot", high energy mills (e.g. SPEX), the latter with a vibrating frequency of about 20 Hz and about half the impact energies of planetary ball mills due to smaller milling balls employed (Table 8). The frame of the frame grinder including the grinding stock is moved vertically up and down (by an electromagnetic coil) against a single grinding ball of diameter 30–70 mm of which the big mass allows for plastic strain at low impact velocities (cf. Y. Chen, R. LeHazif and G. Martin, *Solid St. Phen.* 23&24, 1992, Trans Tech Publications Ltd., Zürich, 1992, pp. 271–283). FIGS. 127 and 128 show a schematic of three versions of the high energy vibrating mills including one, two and three degrees of freedom in ball movement directionality, where in FIG. 127 a) 1-dim, b) 2-dim and c) 3-dim model with MV=mill vial, MOV=mode of vibration, B=milling ball(s) and in FIG. 128 with MC=mill container and UW=unbalanced weight (see H. Hashimoto and R. Watanabe, *Mater. Trans. JIM* 31 (3), 1990, pp. 219–224).

The impact frequency in high energy vibrating mills increases naturally with increasing weight ratio of milling balls (of given size)-to-(alloy) powder charge, but it was shown (M. Bolart, D. Brenet, F. Moret, CEREM, *Laboratoire de Génie des Matériaux, CENG,* 85X–38041, Grenoble, Cedex) that the impact between two colliding balls entrap less powder volume (height) than between a single milling ball and the wall of a milling container showing a significant disadvantage compared to planetary ball milling due to a lower efficiency of the ball/wall collisions compared to ball/ball collisions and which is directly related to the high filling fraction $f_{nb}$ usually encountered in vibrating ball-mills. In the 1D-version, the energy is transferred into the powder only by shock, but in the 2D- and 3D-version friction is involved in the transformation of impact energy. The energy absorbed by the powder (alloy) is assumed to increase with increasing coefficient of viscosity of the powder, but no clear physical meaning has yet been attributed to this coefficient (cf. H. Hashimoto and R. Watanabe, *Mater. Trans. JIM* 31 (3), 1990, pp. 219–224; H. Hashimoto and R. Watanabe, *Mater. Sci. For.* 88–90, 1992, pp. 89–96).

Attrition ball milling (horizontal or vertical), often referred to as "high energy" ball milling, involves the rotation of stirring arms (impellers) at relatively high rotation frequencies $\Omega_A$ through a stationary vertical or horizontal tank filled with balls and material (powder), the vertical tank accommodating a vertical shaft, the horizontal technique accommodating a horizontally rotating shaft (FIGS. 125 and 126 showing in FIG. 125 a), d) side- and b), c) front-view of horizontal attritor technique with a) low and b) high filling fraction of corresponding milling container and c), d) corresponding rotor alone (from H. Zoz, *Mat. Sci. For.* 179–181, 1995, pp. 419–424) and in FIG. 126 with a schematic of vertical attritor ball mill (after E. T. Brook-Levinson, A. A. Kolesnikov and I. V. Fine, *Mater. Sci. Forum* 88–90, 1992, pp. 113–120). The stirring action of the impellers triggers—for a given $\Omega_A$-value—a range of relatively low impact velocities of relatively small balls actually resulting in a range of contrary to popular belief—very low impact powers at relatively high impact frequencies and mean tank temperatures (in fact, an energy form that is inevitably discernable) due to the friction that results primarily from the rotation of the billets, i.e. attrition ball milling is always confronted with a relatively high wear problem independent on the material used for impellers, balls, tank and their coatings. Commercial attritors provide rotation frequencies $\Omega_A$ in the range of 30–700 rpm for tanks of diameters up to about 1 m and filling volumes up to 1100 l (for larger volumes, $\Omega_A$<100 rpm) (*Technische Informationen FT0008,* Netzsch Feinmahltechnik GmbH, Selb, RFA, 1992). The high impact frequencies at relatively low, kinetic energies make attritor ball milling attractive for relatively fast refinement of precursors and/or microstructures, but the absence of the control of a discrete kinetic energy (due to the range of operative impeller arm distances $R_A$) and the relatively low values of kinetic energy provided by attritors exclude them from the controlled formation of non-equilibrium phases unless the alloy concerned provides a large $E_c$-window at relatively low $E_c$-levels with regard to the shock energies occurring at a given impeller frequency $\Omega_A$. The so-called "high energy"-type of attrition ball milling does not allow a precise control of shock power and of the rate of structural faults, mechanical working, local deformation and resulting non-equilibrium phase formation induced into the initial precursor material as well as eventual reduction of yield due to "caking" by external milling variables set by the operator. A recently up-dated horizontal attrition ball milling technique was considered (H. Zoz, *Mat. Sci. For.* 179–181, 1995, pp. 419–424) to significantly (i) increase the impact energy and (ii) to decrease the variation in energy employed and (iii) to eliminate the problems relative to gravity in a vertical attritors (i.e. dead zones, density gradients in resultant powder material employed). Unlike for planetary and the classical type of horizontal ball milling (see below), however, this attritor variant is not sufficient to solve the relatively inefficient cooling associated with attritor ball milling as a result of the poor contact of the ball-milled product with the container wall.

TABLE 8

Characteristics I of laboratory mills.
From Y. Chen, R. LeHazif and G. Martin, Solid St. Phen.
23&24, 1992, Trans Tech Publications Ltd., Zürich,
1992, pp. 271–283.

|  | Attritor | Planetary mill | Vibration mill | |
|---|---|---|---|---|
|  |  |  | Pulv. O | SPEX |
| Nbr of ball | >1000 | 5–12 | 1 | 4–10 |
| Diameter of ball (mm) | 2–10 | 10–20 | 20–70 | ~10 |
| Movement of ball | roll | roll + shock | shock | shock |
| Velocity of ball $(ms)^{-1}$ | $0$–$0.8^{(a)}$ | $2.5$–$4.^{(b)}$ | $0.14$–$0.24^{(f)}$ | $<3.9^{(a)}$ |
| Kinetic energy $(10^{-2}$ J ball$^{-1})$ | <1 | 1–40 | 0.3–3 | <12 |
| Frequency of shock (Hz) | $>1000^{(h)}$ | $\sim 100^{(h)}$ | $15$–$50^{(f)}$ | $200^{(d)}$ |
| Power (W/g/ball) | <0.001 | 0.01–0.8 | 0.005–0.14 | <0.24 |
| Mean Temperature of vial (° C.) | $150^{(e)}$ | $50$–$120^{(b)}$ | $<35^{(c)}$ | $60^{(g)}$ |
| Peak Temperature ΔT Max (° C.) | <1* | $287^{(b)}$ | <1* | 170* |
| $T_{max}$ (° C.) | 150 | 300 | 35 | 230 |
| Atmosphere | GAS | GAS | GAS VACUUM | GAS | ref. in Y. Chen, R. LeHazif and G. Martin, Solid St. Phen, 23&24, 1992, Trans Tech Publications Ltd., Zürich, 1992, pp. 271–283: [a][36], [b][48], [c][39], [d][35], [e][26], [f][21], [g][32], [h][49], *calculated by the authors using Schwarz' formula [34].

TABLE 9

Characteristics II of laboratory mills with documented and calculated values of the kinetic energy, the shock frequency and the shock power for the different ball mills with * from M. Abdellaoui and E. Gaffet, Acta metall. mater. 43 (3), 1995, pp. 1087–1098.

|  | Vibratory mills | | | Planetary ball mills | | |
|---|---|---|---|---|---|---|
|  | Attritor | Pulv. O | SPEX | Pulv. P5 | G7 | G5 |
| Velocity of balls (m/s) | 0–0.8 | 0.14–0.24 | <3.9 | 2.5–4 | 0.24–6.58* | 0.28–11.24* |
| Kinetic energy (10–3 J/hit) | <10 | 3–30 | <120 | 10–400 | 0.4–303.2* | 0.53–884* |
| Shock frequency (Hz) | >1000 | 15–50 | 200 | ~100 | 5.0–92.4* | 4.5–90.7* |
| Power (W/g/ball) | <0.001 | 0.005–0.14 | <0.24 | 0.01–08 | 0–0.56* | 0–1.604* |

Horizontal ball mills used for industrial milling of composite-type of dispersion-strengthened materials consists of diameters D=2R=1 to 2 m. accommodating typically 1 ton of powder and up to 106 milling balls corresponding to about 10 tons (E. Gaffet, N. Malhouroux-Gaffet, M. Abdellaoui and A. Malchère, *Révue de Métallurgie/CIT—Science et Génie des Matériaux*, 1994; G. B. Schaffer and P. G. McCormick, *Mater. For.* 16, 1992, p. 91). Wall detachment of the milling balls from the internal container wall (cf. FIG. 129 with schematic after E. Gaffet, N. Malhouroux-Gaffet, M. Abdellaoui and A. Malchère, *Révue de Métallurgie/CIT—Science et Génie des Matériaux*, 1994 of horizontal ball mills) occurs at rotating velocities of the cylinder w, for which $$\omega^2 R < g \qquad (MA27)$$

with g=acceleration by gravity allowing for $\omega_{max}$=0.7 to 0.5 Hz followed by a parabolic trajectory of the ball before impact at velocities (cf. D. R. Maurice and T. H. Courtney, *Metall. Trans.* 21A, 1990, pp. 289–303)

$$v_h = 2(gR)^{0.5} \qquad (MA28)$$

of values 4.4 to 6.3 m/s all of which at D=2R=1 to 2 m. The velocity of milling balls in horizontal ball mills, $v_h$, consists of a tangential component $v_t = \omega R = (gR)^{0.5}$ and of a normal component $v_g = (2gz)$ with z=normal component of parabolic flight trajectory (cf. D. R. Maurice and T. H. Courtney, *Metall. Trans.* 21A, 1990, pp. 289–303). The frequency of impacts per ball to the powder is of the order of ω resulting in relatively low impact powers even for high weights per milling ball (e.g. $(m_b)_{i,j}$=50 g gives 0.9 J/impact at $v_h$=6.3 m/s or 0.9 MJ per (above) cylinder (conditions) so (maximum) impact powers in the range below 0.45 W/g, i.e. not enough for most of the ne-phases shown in Table 7. Horizontal ball milling has attracted the attention of so-called "low energy" ball milling. Evidently, this term is as useless as the term "high energy" attrition ball milling (unless the conditions (for the operator) were defined more precisely). Horizontal ball mills with their easily obtained large container volumes are limited to ne-phase formation in systems requiring relatively low impact powers (<0.5 W/g) instead. Also milling bars can be used in horizontal ball mills to increase impact surface so milling efficiency per unit volume of milling body (M. Abdellaoui, *Thèse de Doctorat de l'Université Paris VI*, submitted on 4 Jul., 1994).

Ball milling by vibrating, attrition and gravity ball mills thus represent three technologies in which non-equilibrium phase formation leave uncontrolled volume fractions of initial material and/or non-equilibrium phases due to uncontrolled and/or small impact frequencies and/or energies resulting in all cases in a limited freedom in the choice of operational variables, the resulting impact power for and control on non-equilibrium phase selection and formation.

The absence of a categorical need for more substantial property improvements via phase selection by ball milling (as is offered by non-equilibrium phase formation for Mg-base alloys) and reductive tutelage upon the operating factors controlling non-equilibrium (matrix) phase formation of a given material or group of materials by ball milling have obstructed the view for a systematic control on non-equilibrium phase selection by ball milling (cf. the above reported milling times for non-equilibrium phase formation of Ti- and Al-base alloys) to date, i.e. after 20 years of world-wide ball milling. Until recently no appreciation was given to the significance of shock power controlling occurrence and formation rate of non-equilibrium (matrix) phases of a given material (see above). The natural acceleration of a milling ball by gravitation was considered instead to provide an inherent advantage for ball milling of advanced light alloys with refined and novel microstructures and/or phase selection. However, ball milling by gravitational-type of acceleration of milling balls imposes an inherent limitation on the available shock power scale and the selection and fabrication of non-equilibrium phases by solid state synthesis (see above).

The most important limiting parameter with regard to commercialization of planetary ball mills and corresponding products is the distance R. R is of prime importance for the further up-scaling toward industrialization of planetary ball milling for non-equilibrium (matrix phase) alloys such as those based on magnesium The potential volume to be accommodated by the overall apparatus, the resulting freedom in filling fraction and overall weight of charge with regard to centrifugal forces sustainable by the holder disc and the maximum impact energy $E_c^{max}$ for a given $\Omega^{max}$ all increase with increasing R. Today, R=const. for a given holder disc (table) of a given planetary ball mill, i.e. R may only vary from one type of a planetary ball mill and/or corresponding laboratory and/or supplier to another, but planetary ball mills yet to come may provide facilities to vary R for a given disc as depending on the required impact powers $P_{req}$ to be introduced into the material. $\Omega$ and $\omega$ remain the major independent milling variables of a given planetary ball mill to control the selection of non-equilibrium phases and this remains true even if planetary ball mills with flexible and/or relatively large R-values become available to accommodate larger milling containers and milling volumes at a given filling fraction for industrialization and commercialization of planetary ball milling technology and resulting materials. The industrialization and commercialization of planetary ball milling for non-equilibrium phases and/or alloys requires the definition and minimization of the applicable scale of $\Omega$ and $\omega$ due to the operating forces and limitations set by the available materials and assembling techniques and the resulting costs for planetary ball mills.

The advantages and disadvantages of ball milling techniques regarding the fabrication of non-equilibrium alloys and the need to control a discrete value in shock power and resulting processing windows results in the following hierarchy of preference:

1. Planetary ball milling with $\omega$ decoupled from $\Omega$ (Planetary I-type) embracing practically unlimited control of $\omega$ and/or $\Omega$ and the resultant scale of shock energy $E_K$, shock frequency f and shock power P* so providing higher shock-to-friction ratios and incorporating all the advantages of other ball milling techniques for the fabrication of non-equilibrium phases, matrix phases and alloys, but vial volumes are yet limited to <200 ml (cf. E. Gaffet, F. Faudot and M. Harmelin, a) *Mat. Sci. Engng.* A149, 1991, pp. 85–94; b) *Mat. Sci. For.* 88–90, 1992, pp. 375–382).

2. Planetary ball milling with $\omega$ coupled to $\Omega$ (Planetary II providing sub-control of f and P* for a given $\Omega$ and $\omega$ by $(n_b)_{i,j}$ or $\Sigma(\Sigma(n)_i)_j$ and $\Sigma m_{charge}$ alone, but available volume limited to 500 ml/vial (Pulverisette $5^R$, Product brochure and Manual, Fritsch GmbH Laborgerätebau, Idar-Oberstein, RFA; priv. communication, May, 1995.

3. Vibration ball milling with f-control by $\omega$ and $(n_b)_{i,j}$ or $\Sigma(\Sigma(n_b)_i)_j$ and $\Sigma m_{charge}$, but the resulting filling fraction $f_{nb}$ limits the available $\Delta E_c$-and shock power range $\Delta P$ (cf. Table 8 vs. 7) The resulting possibilities for (control of the volume fraction $f_v^{ne}$ of) non-equilibrium matrix phase formation, resulting milling time $t_{req}$ and formation rate are thus limited, but the available container volumes are of pilot or larger scale (H. Hashimoto and R. Watanabe, *Mater. Sci. For.* 88–90, 1992, pp. 89–96).

4. Attrition or attritor ball milling provides a large range of impact energies $\Delta E_c$ which are discretely uncontrolled for a given rotation velocity of corresponding attrition and/or stirring arms. The available volumes of milling containers are up to 1100 l (cf. *Technische Informationen FT0008*, Netzsch Feinmahltechnik GmbH, Selb, RFA, 1992; H. Zoz, *Mat. Sci. For.* 179–181, 1995, pp. 419–424).

5. Horizontal ball mills with vertical rotation planes have limited range (and control) of f, f*, $E_c$, therefore limited range and control on P and the resultant fabrication of non-equilibrium matrix phases and alloys so being primarily used for the refinement of advanced alloys. Practically no limitations in container volume (cf. E. Gaffet, N. Malhouroux-Gaffet, M. Abdellaoui and A. Malchère, Révue de Métallurgie/CIT—Science et Génie des Matériaux, 1994; G. B. Schaffer and P. G. McCormick, *Mater. For.* 16, 1992, p. 91; D. R. Maurice and T. H. Courtney, *Metall. Trans.* 21A, 1990, pp. 289–303).

3.4 Machined Mg-based Chips and Turnings Co-Milled with Hard and Eventually Brittle Precursor Constituents under Dry and Wet Conditions This hierarchy was taken into account in the present invention. The characteristics of the applied apparatus (i.e. a Pulverisette $5^R$) included the distance R=12.5 cm, vial radius r=3.275 cm, coupling parameter $k_{\Omega/\omega}$=1.17 (cf. FIG. 119, 120) and $n_b$(max)=124 for the employed steel balls (cf. Table 10). Particular attention was given to the effect of the (initial) alloy charge required to obtain non-equilibrium Mg-alloys and microstructure. The actual details employed to achieve the metastable WE54 base MA—Mg alloy (which represented a relatively difficult case, see below) serve to provide the more specific milling conditions required to develop non-equilibrium Mg-base matrix alloys including extended solid solutions, amorphous and non-equilibrium crystalline, quasi- and/or nanocrystalline Mg-base phases by ball milling.

Since MA of light alloys is usually starting off from atomized powders (cf. V. Arnhold, K. Hummert and R. Schattevoy, *Conf Proc. Materials by Powder Technology*, PTM '93, edt. F. Aldinger, DGM, Oberursel, 1993), prime question to start the investigation was: "Under what conditions can the powder atomization step be left out (in view of the additional increment on cost and surface-to-volume ratio so contamination with oxygen it confers on the overall processing route and material), i.e. can machined (pre-alloyed, in particular dilute) Mg-base chips and (bent) turnings directly be transformed to the required MA-powders?". Therefore, the selection of the initial (precursor) material is particularly important and allows to provide the information whether the initial (precursor) material can be homogenized fine enough (often interpreted as alternating (sub-) micron layers as the preliminary condition) to trigger (in a reasonable time scale) an homogeneous phase transformation for an even more homogeneous non-equilibrium matrix phase by MA.

As-cast ingot material of pure magnesium and of the magnesium alloy WE54 was used as a test bed to narrow down the required milling parameters. They were machined to chips and/or turnings of size of the order of 1 to 10 mm prior to ball milling the employed (pre-alloyed) and turnings of size of the order of 1 to 10 mm prior to ball milling the employed (pre-alloyed) and elemental milling charge (FIGS. 130 a–f showing machined WE54 chips and turnings directly employed upon ball milling with $Al_2O_3$, SiC, BN and $Al_3Ti$). For further details, see Table 10, below. A 2 hour-milling cycle was usually employed to compare the results obtained by MA of Mg with the published results on other metallic materials. Under these conditions, ball milling at a wide range of rotational milling speed, milling time and/or weight ratios of milling balls-to-machined chips of pure Mg and of WE54-ingot did not result in the formation of a mechanically alloyed powder (i.e. a milling effect, see over-next section) when adding a) sub-micron graphite powder and/or graphite lumps and/or b) (liquid) hexane (i.e. $C_6H_{14}$) or c) neither graphite nor hexane, (N.B. graphite and e.g. ethyl acetate are frequently employed for mechanical alloying of Al-base alloys (L. Froyen, L. Delaey, X. P. Niu, P. LeBrun and C. Peytour, *Journal of Metals* 3, 1990, pp. 1&19). The use of a carbon-bearing constituent represents also a risk of formation of Mg(-base) carbides ($Mg_2C$/$Mg_2C_3$) known to be easily washed away by aqueous solutions such as water via reactions similar to (cf. *Kirk-Othmer, Encyclopedia of Chemical Technologies, 3rd edition, Vol.* 8, John Wiley & Sons, N.Y., Chichester, Brisbane, Toronto, pp. 478–535, in particular p. 481 and p. 507):

$$CaC_2 + 2H_2O \longrightarrow C_2H_2 + Ca(OH)_2 \Delta H^{rea} - 130 \text{ kJ/mole} \quad (MA28a)$$

so eventually deteriorating quite significantly the corrosion resistance of the resultant MA Mg-alloys and obscuring the beneficial effects of corresponding non-equilibrium phase, while the use of an alcohol embraces the double-risk for formation of carbides and oxides and/or hydroxides due to the (—OH) subgroup of the $CH_3$—$CH_2OH$ molecules involved in alcohols. The addition of ethanol to ball milled Cu—Fe alloys was reported (E. Gaffet, M. Harmelin and F. Faudot, *J. Appl. and Comp.* 194, 1993, pp. 23–30) to result in $Fe_3O_4$- and $Fe_3C$-dispersions representing an hardening advantage in that case. More particular, the addition of ethanol (i) reduced and suppressed the sticking of powder to the milling ball and/or vial wall surfaces, (ii) to reduce the contamination of the MA-powder product from abrasion of milling ball and vial surfaces due to reduction of corresponding friction (coefficient) by a factor of >2.5 for Cu-20 wt. % Fe to >25 for Cu-40 wt. % Fe and (iii) improved the homogeneity of non-equilibrium Cu-base Cu—Fe-phases (E. Gaffet, M. Harmelin and F. Faudot, *J. Appl. and Comp.* 194, 1993, pp. 23–30).

WE54 is a commercially established and ductile Mg-alloy composition and therefore a representative base in order to develop an extended solid solution or another non-equilibrium phase without undue increase in density due to mechanical (and/or chemical) alloying by ball milling, for example. Unlike for mechanical alloying of aluminum, for which carbon or a derivative is not only used as a lubricant, but also in order to form a controlled volume fraction of carbides to improve their thermal stability, it is therefore more critical to use a carbon-bearing lubricant for MA of Mg-alloys and (if a milling effect was to be obtained from machined pure Mg- and/or dilute Mg-alloy chips and/or turnings) eventually inevitable to exclude graphite and/or hexane from the milling operation unless selected precursors were added instead reducing "caking" and improving homogenization.

A powder production (i.e. a milling effect) was obtained instead by the addition of hard and eventually brittle powder precursor constituents such as 3-micron BN, SiC, $Al_3Ti$ and $Al_2O_3$-reinforcements (called "alloying additives" in the following) to the machined Mg- and WE54-chips and turnings prior to the milling operation. The results

TABLE 10

Employed Initial Charges and Milling Variables

| | Variables | Alloys | | | | | |
|---|---|---|---|---|---|---|---|
| | | 1<br>FIG. 106 | 2<br>FIG. 131 | 3 | 4 | 5 | 6 |
| I. Selection of Initial Charge for End-Product | | | | | | | |
| 1. | (Pre-alloyed) Base of Initial Charge in absolute quantities [g and cm³] | WE54<br>6/— | WE54<br>4.5/— | WE54<br>4.5/2.5 | WE54<br>6/— | WE54<br>8/— | WE54<br>8/— |
| 2.1 | Form of (Pre-alloyed) Base of Initial Charge (for machined chips/turnings: diameter or width [mm] * length [mm]) | FIG. 130c<br>5*5–6 | FIG. 130d<br>25*10 | FIG. 130a<br><1*5 | FIG. 130b<br>5*5–10 | FIG. 130e<br>5*5–6 | FIG. 130f<br>20–30*8–12 |
| 2.2 | Alloying Additive I [g] and [wt. %] (absolute and relative quantity) | 0.54/9.0<br>$Al_2O_3$ | 0.113/2.5<br>$Al_2O_3$ | 0.13/2.8<br>$Al_2O_3$ | 0.18/3.0<br>$Al_2O_3$ | 0.24/3.0<br>SiC | 0.24/3.0<br>SiC |
| 2.3 | Form of Alloying Additive I | 3 µm-powder | → | → | → | → | → |
| 3. | Atmosphere[1]) of Milling Container (Static or purged/inert gas vacuum) | 5 N Ar<br>static/1 bar | →<br>→ | →<br>→ | →<br>→ | →<br>→ | →<br>→ |
| 4.1 | Lubricating Additive I (in absolute [ml] and relative wt. %] quantity) | none<br>n.a. | none<br>n.a. | none<br>n.a. | hexane<br>1.0/11.6 | none<br>n.a. | hexane<br>0.5/5.0 |
| 4.2 | Purity of Lubricating Additive I | n.a. | n.a. | n.a. | >95% | n.a. | >95% |
| II. Selection of Apparatus | | | | | | | |
| 5. | Volume of Milling Container | [l] 0.133 | → | → | → | → | → |
| 6. | Ball Milling Technique | Planetary II | → | → | → | → | → |
| 7.1 | Separation Distance R'-R | [m] 0.125 | → | → | → | → | → |
| 7.2 | Range $\Omega^{min}$–$\Omega^{max}$ ($\Delta\Omega$) | [rpm] 80–360 | → | → | → | → | → |
| 7.3 | Range $\omega^{min}$–$\omega^{max}$ ($\Delta\omega$) | [-rpm] 179–716 | → | → | → | → | → |
| 7.4 | T-control or Range $T^{min}$–$T^{max}$ | [° C.] none | → | → | → | → | → |

TABLE 10-continued

Employed Initial Charges and Milling Variables

| | Variables | Alloys 1 FIG. 106 | 2 FIG. 131 | 3 | 4 | 5 | 6 |
|---|---|---|---|---|---|---|---|
| 7.5 | Coupling parameter ($k_{\Omega\omega}$) | 1.17 | → | → | → | → | → |
| 8. | Material of Milling Container | Fe—13 Cr—0.4 Mn—0.3 C [wt. %] | → | → | → | → | → |
| 9. | Material of Milling Balls | Fe—6 Cr base [wt. %] | → | → | → | → | → |
| 10. | Radius of Milling Container r [mm] | 32.75 | → | → | → | → | → |
| III. | Selection of First Order Milling Variables | | | | | | |
| 11. | $\Omega$ [rpm ± 10%] | 206 | 206 | 168 | 264 | 160 | 293 |
| 12. | $\omega$ [-rpm ± 10%] | 241 | 241 | 197 | 310 | 187 | 343 |
| 13. | T [° C.] | 22° to 70° | → | → | → | → | → |
| 2 | Selection of Second Order Milling Variables | | | | | | |
| 14. | i/j | 1/1 | → | → | → | → | → |
| 15.1 | $\rho_{b,1}$ | [g/cm$^3$] 7.60 | → | → | → | → | → |
| 16.1 | $r_{b,1}$ | [mm] 5.0 | → | → | → | → | → |
| 17.1 | $(m_b)_{1,1}$ | [g] 3.98 | → | → | → | → | → |
| 18.1 | $(n_b)_{1,1}$ | 18 | 10 | 10 | 18 | 17 | 18 |
| 19. | $f_{nb}$ [%] | 14.5 | 8.1 | 8.1 | 14.5 | 13.7 | 14.5 |
| 20. | $\Sigma m_{change} = \Sigma m_{alloy} + \Sigma m_{(alloy.additives)}$ [g] | 6.54 | 4.61 | 4.63 | 6.18 | 8.24 | 8.24 |
| 21 | Ratio $\Sigma(\Sigma m_b)_i)_j/\Sigma m_{change}$ | 10.95 | 8.63 | 8.63 | 11.59 | 8.21 | 8.694 |
| V. | Results | | | | | | |
| 22. | $E_c$ (for $K_a = 1$) [mJ/impact] | 17 | 17 | 10 | 26 | 10 | 45 |
| 23. | f/f* [Hz]/[Hz/gram] | 97/ | 54/11.7 | 40/8.64 | 115/18.6 | 61/7.4 | 126/15.3 |
| 24. | P*(T) [W/g] | 0.26 | 0.20 | 0.09 | 0.48 | 0.07 | 0.69 |
| 25. | Powder Yield $f_v^y$ | 0.5 | 0.2 | 0.9 | 0.98 | 0.95 | 0.99 |
| 26. | Mean powder size [μm] | — | — | 200 | 95% < 315 | 170 | 100 |
| 27. | Volume fraction non-equilibrium phase $f_v^{re}$ | 0.5 | 0.6 | <0.1 | none | <0.1 | none |
| 28. | $T_{transf}$ of ne-phase [° C.] | 500 | 613 | (600) | n.a. | (<300) | n.a. |
| 29. | $t_{req}$ ($f_v^y$, $f_v^{re}$) [h] | 2 | → | → | → | → | → |

4. Various authors recommend the use of teflon or indium rings to seal the milling container (vial). However, no effect was discovered over the use of conventional 0-rings.

showed that the use of at least one of the hard and eventually brittle precursor constituents BN, SiC and $Al_2O_3$ instead of a classical lubricant such as graphite or hexane was inevitable to obtain a "milling effect", i.e. a mechanically alloyed (overall) powder from machined Mg- and WE54-chips and turnings. A high temperature metastable phase (see above) was obtained after ball milling for only 2 hrs, when 3-micron $Al_2O_3$ was added to the machined WE54-chips without the addition of a lubricant (FIGS. 106 and 131 where FIG. 131 showing (top) X-ray diffraction of as-received Mg-alloy WE54 (ingot) and (center) DSC-analysis with transformation peak at 613° C. and (bottom) corresponding X-ray diffraction of (WE54+2.5 wt. % $Al_2O_3$) ball-milled for 2 h at 20° to 70° C. without lubricant (i.e. "dry"). Note that peak-intensities of as-milled (WE54+2.5 wt. % $Al_2O_3$)-powder amounted to 30 to 50% of the peak-intensities of as-received WE54 ingot. Milling variables: see Table 10, Alloy 2). However, the milling operation with $Al_2O_3$ and without lubricant led to substantial welding and smearing of the alloy charge to both the (interior) surface of the vials and to the surface of the milling balls when employing $\Omega$>190 rpm. As for the ball-milled Cu-base Cu—Fe alloys (cf. E. Gaffet, M. Harmelin and F. Faudot, J. Appl. and Comp. 194, 1993, pp. 23–30), the welding and smearing of the resultant alloy to vial and milling ball surface was reduced by the addition of a lubricant, here hexane, but in a relatively large quantity (i.e. 5–12 wt. %). This addition reduced and/or suppressed the formation of the high temperature non-equilibrium metastable phase within a 2 hour milling interval.

The details of the milling variables to obtain a milling effect with a yield of 95 to 99% or a non-equilibrium phase of about 60 vol. % after 2 hrs of ball milling are shown in Table 10. The results on ball milling (WE54+$Al_2O_3$) are consistent with rapid amorphization in a P*-window around 0.20–0.26 W/g employing dry milling conditions. This P*-window appears relatively narrow at a lower level compared to the P*-window for amorphization of $Ni_{10}Zr_9$ suggesting the fabrication of Mg-base ne-phases by other ball milling techniques (see above). The evolution of heat of transformation (which is related to the volume fraction of corresponding non-equilibrium phase) with milling time represents a non-linear phenomenon (cf. FIGS. 115 and 132 a–c and Y. Chen, R. LeHazif and G. Martin, Solid St. Phen. 23&24, 1992, Trans Tech Publications Ltd., Zürich, 1992, pp. 271–283). FIG. 132 shows a non-linear structural evolution with time as shown by a), c) enthalpy of transformation (crystallization) of a) amorphous $Zr_{80}Fe_{20}$, c) amorphous $NiTi_2$ with $\Delta H_x^{MG}$ made from crystalline intermetallic $NiTi_2$ (precursor with atomic configuration relatively close to amorphous $NiTi_2$) and with $\Delta H_x^{MA}$ made from elemental (Ni+2 Ti) powder mixture (atomic configuration relatively far from amorphous $NiTi_2$) and b) X-ray intensities of amorphous $Zr_{50}Fe_{50}$ after different ball milling times. From R. B. Schwartz, Mat. Sci. Engng. 97, 1988, pp. 71–78; L. Schultz, Mat. Sci. Engng. 97, 1988, pp. 15–23. Weeber et al. recorded (A. W. Weeber, H. Bakker, H. J. M. Heijligers and G. F. Bastin, Europhys. Lett. 3, 1987, p.1261) the crystallization enthalpy $\Delta H_x$ of ball-milled $Fe_{20}Zr_{50}$ as a function of ball milling time showing saturation of the increase in $\Delta H_x$ after about 30 hours (FIG. 132 a). The results were confirmed by the entire absence of (crystalline) hkl-reflections for as-milled $Fe_{50}Zr_{50}$ after ball milling times>16 hours (FIG. 132 b). It was concluded that amorphization in the latter occurred after 4 to 16 hrs of ball milling after an average layer thickness of about 100 nm of crystalline Fe and Zr had formed. Similar results were reported on MA of elemental (Ni and 2 Ti) and after mechanical grinding of crystalline $NiTi_2$ intermetallic alloy for the formation of amorphous $NiTi_2$ alloy (cf. FIG. 132 c and R. B. Schwartz, Mat. Sci. Engng. 97, 1988, pp. 71–78).

If the reduction in X-ray peak intensity is associated with increasing irreversible exothermal effects on differential scanning calorimetry (DSC), the reduction in X-ray intensity can be considered proportional to the reduction of corresponding (equilibrium) crystalline phases. FIG. 133 provides the evolution of volume fraction $f_v^{ne}$ non-equilibrium (WE54–2.5 wt. % $Al_2O_3$) phase as a function of ball milling time employed (for further details, cf. FIG. 131) for low yield ($f_v^y$<0.5) at dry milling conditions (upper curve) and high yield ($f_v^y$ about 1), but low $f_v^{ne}$ (bottom curve) including the use of "excessive" quantities of hexane resulting in $t_{req}$=about 8 hours for $f_v^{ne}$=1.0 at low yield and $t_{req}$>>10 hours for $f_v^{ne}$=1.0 at high yield $f_v^y$. Note that straight line for $f_v^{ne}$=1.0 represents an overall volume fraction $\Sigma f_v = f_v^y * f_v^{ne}$= 0.3*0.95=about 0.29 of resulting non-equilibrium powder. FIG. 133 shows a non-linear extrapolation of the volume fraction metastable phase estimated from the reduction in corresponding X-ray peak intensity according to FIG. 131. The extrapolation results in an estimated milling time required of about 8 h for the formation of 100% or nearly 100% volume fraction of corresponding metastable phase obtained by MA of WE54-chips and turnings by using (hard) $Al_2O_3$-alloying additions at a low yield (<50%) due to "caking". Evidently, the addition of $Al_2O_3$ promotes the ne-phase formation of dilute Mg-base alloys by ball milling. One possibility to interpret these results is the large negative heat of formation of $Al_2O_3$ among the more common reinforcements, i.e.

SiC: –64.4% J/mole
$Mg_2Si$: –78.2 kJ/mole
$Al_2Y$: –500 kJ/mole (i.e. >/–500/kJ/mole)
MgO: –597.5 to –602.5 kJ/mole
$A_2O_3$: –1663.5 to –1690 kJ/mole eventually providing a shorter milling cycle from "3" to "2" than is possible from "1" to "2" in FIG. 134 (which shows schematic free-energy diagram with elemental components A (eg. Mg) and B (eg. TM, met, RE) and an intermetallic or ceramic compound C showing macroscopic ease by the addition of C to introduce non-equilibrium terminal phase (from position 3 to 2) rather than without (from position 1 to 2) provided, that a milling effect was attained without (excessive) "caking" before (cf. FIG. 135 showing variation of grain size as a function of milling time in mechanically alloyed γ-TiAl alloys (as to Al-content given in [at. %]). Any homogenization on an atomic length scale as during part "b" of the above milling cycles would require the milling effect during "a" and also that no (excessive) "caking would occuring during both (i.e. "a" and "b"). From A. Frefer, C. Suryanarayana and F. H. Froes, Conf. Proc. 7th World Titanium Conference, San Diego, Calif., TMS Warrendale, Pa. 1993, eds. F. H. Froes and I. Caplan, p. 933). It shall be noted that during the 2 h milling cycle the temperature of the vials was measured to have increased to up to 70° C. depending on the number of milling balls and the rotational speed employed.

From Table 10 it is evident that the addition of hexane increases yield, but also milling time required to achieve a given volume fraction non-equilibrium Mg-base phase structure provided, that the (hard and/or brittle) $Al_2O_3$-precursor powder of size 3 micron was added to the machined Mg-base chips. According to the extrapolation shown in FIG. 133, a milling time of >>10 h would be required to obtain a fully non-equilibrium phase of (about) 100% yield made from machined WE54-chips and turnings plus 3 wt. % $Al_2O_3$ powder of size 3 micron. It appeared that the lubricant reacted with yttrium following $C_6H_{14}+3Y\text{---}>3YC_2+7H_2$ (MA29)

and/or the rare earth metals and eventually suppressed the formation of the non-equilibrium phase due to the very negative value in the enthalpy of formation $\Delta H^{for}$ of $YC_2$ (cf. eq.s MA2 and MA3) when WE54 was ball-milled with hexane resulting in a reaction enthalpy $\Delta H^{rea}$ which is about 3580 kJ/mole more negative than without hexane and eventually leading to a dealloying effect on the Mg-matrix with yttrium (N.B. the $\Delta H^{for}$-value of hexane is 170 kJ/mol). The development of non-equilibrium Mg-alloys without excessive "caking", minimized contamination and inhomogeneities (cf. R. B. Schwartz, Mat. Sci. Engng. 97, 1988, pp. 71–78), high powder yield and alloy performance on the one hand and sufficient volume fraction and formation rate of corresponding ne-phase, i.e. without (excessive) formation of carbides (and/or (hydro-) oxides) and milling time required for ne-formation on the other require:

1. smaller fractions of friction-to-shock energy as forthcoming from the coupling factor $k_{\Omega/\omega}$ and resulting high vial velocities ω (see above),
2. a sophisticated choice of precursor constituents to avoid competition from competing phase formation (see above), and
3. the use of small(er) quantities (fractions) of lubricants such as hexane.

3.5 Hard and Brittle "Alloying Additives" to Reduce $t(me)_{req}$

The addition of a hard and eventually brittle precursor constituent was shown to be crucial to obtain a ball-milled Mg-base powder from machined precursors within a reasonable milling period (i.e. <2 h) independent on whether a lubricant (hexane) was added or not making it necessary to address the effect the engineering properties of selected elemental and/or compound based "alloying additives". The addition of at least one hard and brittle precursor was shown to substantially reduce the milling time required for formation of Mg-base ne-phase and/or suitable powder by ball milling, since they rapidly provided a dynamic equilibrium between welding and fracture (or shear) when ductile Mg-base alloy chips were employed. The hard and relatively brittle g-TiAl alloys, for example, showed a rapid refinement in microstructural length scale down to 40 nm or so (and which corresponds to the formation of alternating layers) after MA for $t(me)_{req}$<2 h (cf. FIG. 135 and (A. Frefer, C. Suryanarayana and F. H. Froes, Conf. Proc. 7th World Titanium Conference, San Diego, Calif., TMS Warrendale, Pa. 1993, eds. F. H. Froes and I. Caplan, p. 933, J. S. Benjamin and T. E. Volin, Met. Trans. 5, 1974, p. 1929). This is in agreement with the invention that the addition of $Al_2O_3$ results in a significant volume fraction of non-equilibrium WE54-base phase formation after 2 hrs of planetary ball milling, i.e. when using ductile precursors.

The use of Mg-powders instead of machined chips to obtain high-performance Mg-alloys including materials for hydrogen storage (see below) by ball milling is also possible, but it provides a number of disadvantages. Dilute Mg-alloys such as Mg-TM based systems (TM=Ti, V, Zr, Cr, Mn, Nb, Mo, Ta, Hf etc., and also B and Be, all with almost complete immiscibility in liquid Mg) and the Mg-met based systems (where met=Si, Ge, Sb etc. with their very low solubility in the equilibrium solid cph-Mg), for example, do not or merely possess the possibility for pre-alloying from or power thresholds and time-constraints set by amortization of equipment and affordable acquisition costs. Table 10a below shows the alloys used in the studying of alloying kinetics depicted in FIG. 136.

TABLE 10a

Properties of starting materials used in study of alloying kinetics

| Alloy | 0 | | 1 | | 2 | | 3 | | 4 | |
|---|---|---|---|---|---|---|---|---|---|---|
| Property | A | B | A | B | A | B | A | B | A | B |
| Tensile Strength (MPA) | 275 | 580 | 306 | 550 | 336 | 519 | 367 | 489 | 397 | 458 |
| Fracture Strain | 0.37 | 0.48 | 0.38 | 0.47 | 0.39 | 0.46 | 0.40 | 0.45 | 0.41 | 0.44 |
| $K_{1C}$ (MN/m$^{3/2}$) | 85 | 95 | 86 | 94 | 87 | 93 | 88 | 92 | 89 | 91 |
| $H_{V0}$ (KG$_p$/mm$^2$) | 54 | 153 | 64 | 143 | 74 | 133 | 84 | 123 | 94 | 113 |
| K (MPa) | 275 | 140 | 262 | 154 | 248 | 167 | 235 | 181 | 221 | 194 |
| N | 0.42 | 0.50 | 0.43 | 0.49 | 0.43 | 0.48 | 0.45 | 0.47 | 0.45 | 0.46 |

Notes:
Simulation done for CR = 10. Material "A" had modulus of 170 GPa; Material B had modulus of 200 GPa. K and n are constitutive equation parameters.

the liquid to provide a one phase field at equilibrium so pre-alloyed topological, i.e. atomic structural and/or microstructural configurations to minimize $t(ne)_{req}$ for the required non-equilibrium, Mg-base powder end-product. As elemental powder, magnesium and many other alloying additions such as V are either not easily commercially available, prone to absorb intolerable oxygen levels and/or very toxic (upon inhalation, for example). It is therefore very attractive to start the milling procedure from machined (if possible, pre-alloyed) chips and turnings instead of employing corresponding powders and to extend this approach to ductile alloying elements such as V and/or Zr or very pure Ti (and, if a (major) TM-alloying component(s) such as Ta is shock-resistant and/or—for a given set of milling variables—not hard and/or brittle enough) by adding a hard and brittle (third) alloying additive such as $Al_2O_3$ instead of using (e.g. impure) elemental V, Zr etc. Alternatives include co-milling with BN due to the boron, with SiC due to the silicon and with $Al_2O_3$ and/or $Ti_xAl_y$ and/or $Al_3Ti$ due to the aluminum and/or Ti (cf. previous chapters).

Masumoto et al. have recently taken up (T. Tsuri, A. P. Tsai, A. Inoue and T. Masumoto, Science Reports of the Research Institutes, *Tohoku Universities Series A—Physics Chemistry and Metallurgy* 41 (1), 1995, pp. 69–75) the advantage to employ a compound-element mixture including aluminum and monoclinic $Al_{13}Co_4$ or aluminum and orthorhombic $Al_{11}Mn_4$-powders in order to obtain amorphous $Al_{85}Co_{15}$ and amorphous $Al_{85}Mn_{15}$ which were embodimented not being obtainable by using corresponding elemental precursors alone. More detailed observations by Courtney and co-workers have shown (T. H. Courtney, *Mat. Transactions JIM* 36 (2), 1995, pp. 110–122) that ductile-brittle precursor mixtures are more effective for powder particle refinement so reduced welding by ball milling at higher ball velocities (cf. FIG. 136 showing powder particle size after eight effective impacts as a function of impact velocity of the alloys shown in the Table on top. Alloy 4 with the largest difference in hardness of precursor constituents develops the smallest powder size in the milling ball velocity regime of>3.5 ms$^{-1}$ as is typical for planetary ball milling. From T. H. Courtney, *Mat. Transactions JIM* 36 (2), 1995, pp. 110–122). The higher velocity-regime, however, is the required avenue for the economical viable fabrication of non-equilibrium phase resulting from activation energy and/

The addition of hard, eventually brittle refractory compounds with elements likewise contributing to the passivation of the resulting Mg-alloy surface accelerates the overall formation of the envisaged non-equilibrium phase formation due fracture of the more ductile precursor constituents such as pure and/or pre-alloyed Mg and to suppress excessive welding (i.e. "caking") at the same time, i.e. to accelerate the formation of alternating layers and the start of more global interdiffusion and metastable phase formation in particular. The homogenization of the initial chips, turnings, precursor powders etc. is directly related to the formation rate of powder particles of final composition before the local configuration of the initial precursors, i.e. before structural faults introduced by shock power start to control the rate (and yield) of non-equilibrium (e.g. Mg-based) phase formation during $t(ne)_{req}$. Oxides such as $Al_2O_3$, carbides such as SiC, nitrides such as BN and aluminides such as $Al_3Ti$, have evidenced their ability to introduce the "milling effect" and to reduce the time required to start (interdiffusion-controlled) Mg-base phase formation (i.e. within less than 2 hrs in the case of WE54-chips and -turnings together with $Al_2O_3$). Therefore, an "alloying additive" has to play two roles upon MA for non-equilibrium (matrix and/or one-) phase Mg-base (and other) alloys:

1. facilitating fracture and welding on a sub-micron scale to reduce the time required to trigger the onset for non-equilibrium phase formation as is induced by shock-assisted and structural fault enhanced interdiffusion without loss of material by "caking".
2. thereby being "consumed", i.e. alloyed "away" and eventually (co-) passivating the Mg-base (non-equilibrium) matrix phase.

Ductile precursors such as pure Mg and/or terminal Mg-alloys such as WE and/or ductile and shock-resistant passivating components such as Ta or V do not fulfill requirement no 1 for an "alloying additive" and remain simple precursor (initial) materials. Most of the passivating components are likewise hard and brittle providing an ideal basis for requirement no 1, i.e. to fracture terminal so ductile Mg-base precursor constituents without the need to employ (larger quantities of eventually contaminating) lubricants.

Mechanical alloying and/or ball milling of (terminal, i.e.) Mg-based precursors together with a brittle "alloying additive" instead of using classical lubricants (alone) reduces the required milling time to generate alternating layers in the (sub-) micron range prior to trigger mutual (thermal and athermal) interdiffusion of the involved components so circumventing the particular drawback set by the available equilibrium constitution of Mg-alloys (cf. above) and the resultant need to employ elemental and/or Mg-free precursors with an eventually very different chemistry and crystal structure instead of pre-alloyed precursors better corresponding to chemistry and structure of an homogeneous non-equilibrium Mg-base end-product. Choice and level of the "alloying additive" in order to rapidly obtain the "milling effect" without "caking" belong to the prime parameters for the development of economically viable Mg-base engineering alloys by ball milling. The conditions (milling variables and selected precursors) for Mg-base powder production by ball milling without "caking" on the surface of vials and milling balls of the resultant (dilute) Mg-alloys by starting from machined (pre-alloyed) Mg-base chips and turnings as well as from atomized Mg-base powders, all without undue increase in density due to (mechanical) alloying in order to produce equilibrium and non-equilibrium Mg-base alloys with superior engineering properties, are given in Technical Solution no 2.

3.6 Attributes of Alloying Additions to Reduce $t(ne)_{req}$

While the selection of the "alloying additive (i.e. the chemistry and/or (crystal) structure) did not (appear to) affect by very much the resultant "milling effect" (i.e. the production of powder due to alternating layer formation by (interparticle) welding and fracture without substantial "caking"), the choice of the "alloying additive" significantly affected the rate of non-equilibrium phase formation. $Al_2O_3$ was found to be more effective in this respect for ball milling of pre-alloyed WE54-chips (and turnings) than BN and SiC. $Al_2O_3$ appears to be an attractive "alloying additive" to corrosion-resistant non-equilibrium Mg-alloys containing alloying elements with an incompletely occupied electron shell such as transition metals (eg. Ti, Ta, V, Nb, Mo, Hf, Cr, Mn, etc.) and rare earth metals (see previous chapter), i.e. to reduce the milling time required for (a given volume fraction of) non-equilibrium phase formation by acceleration of a constitutional change for the matrix phase after the milling effect, i.e. after alternating layers and the start of more general interdiffusion had occurred, since $Al_2O_3$ appears to be very effective in order to trigger Mg-base ne-phase transformation (cf. chapter 3.3 of this PART III of the invention).

Mg is a generally attractive candidate for non-equilibrium phase formation by ball milling in this particular aspect, since it provides a relatively high (self-) diffusivity due to a high lattice vibration (literally, Mg has a "blown-up" atomic volume relative to its atomic core charge and weight) and thus relatively high resultant $\Delta D$-values with many of the more useful alloying additions for corrosion resistant Mg-alloys, in particular with TM and metalloids due to their high melting points (cf. Table 11). The temperature range in which diffusivity data for TM and metalloids were recorded, however, were usually significantly higher than the melting point of pure Mg. $\Delta D = D_T(Mg) - D_T(X)$ is therefore only obtainable from more universal empirical relationships for diffusion in solids such as $$D_T = 2.3 * 10^{-7} \exp[-Q_D/RT][m/s^2] \qquad (MA\ 30)$$

where $Q_D = 17.7\ T_m$, $T_m$ the melting point of the component concerned and T=service or milling temperature, eg. ambient (all in [K], cf. S. Mayer, *Dipl. Thesis*, University of Stuttgart, 1985). Therefore, the difference in melting point is sufficient to assess the effect of alloying additions on rate-control for Mg-TM and/or Mg-met based ne-phase formation by ball milling (cf. Table 11).

The melting point of an element is also proportional to mechanical properties such as hardness and modulus of elasticity, for example (A. Cottrell, *An Introduction to Metallurgy*, 2nd Edition, Edward Arnold Ltd, 41 Beford Squares, London WC1B 3DQ, 1975; C. Kittels, *Introduction into Solid State Physics*, 5th edition, John Wiley & Sons Inc., 1976, New York). The elastic modulus represents a pure mechanical, i.e. athermal contribution to the power required for propagation of mechanical shock waves, i.e. (cf. P. Dobrinsky, G. Krakau and A. Vogel, *Physik für Ingenieure*, B. G. Teubner, Stuttgart, 4th edition, 1976):

$$P(E) = \tfrac{1}{2} CA \rho (\omega_E)^2 s^2 \qquad (MA31)$$

where C=phase velocity of the mechanical wave following:

$$C = (E/\rho)^{0.5} \qquad (MA32)$$

A=propagation front surface, $\rho$=density and $\omega_g$ and s the frequency and amplitude of

TABLE 11

Selected Properties at Ambient Temperature of Early Transition Metals and Metalloids for Mechanical Alloying of Mg-Alloys
(from C. J. Smithells, Metals Reference Book, 2nd Edition, Interscience Publishers, 250 Fifth Avenue, New York 1, 1955; 6th edition, Buttersworth, London and Boston, 1983, Johnson Matthey GmbH, Finest Inorganic Research Chemicals and Materials, Handbook, 1995/96, Karlsruhe, RFA and R. C. Weast, CRC Handbook of Chemistry and Physics, 66th edition, 1985–1986).

| Metal | $\rho$ [g/cm$^3$] | Hardness[1] | Ductility[3] [% gl.] | Young's Modulus E [Gpa] | E/$\rho$ [Gpa/[g/cm$^3$] | $T_m$ [° C.] | $T_m$ [° C.] |
|---|---|---|---|---|---|---|---|
| Mg | 1.74 | 35–45 B[2] 2.0 M | ductile | 45 | 25.9 | 650 | — |
| αTi | 4.51 | 60 V | ductile | 112 | 24.8 | 1668 | 746 |
| V | 6.11 | — | very ductile | 138 | 22.6 | 1900 | 724 |
| Cr | 7.19 | 9.0 M | brittle | 248 | 34.5 | 1875 | 709 |
| Mn | 7.43 | 5.0 M | brittle | — | — | 1245 | 678 |
| αZr | 6.51 | 110–170 V | 18 | 93 | 14.3 | 1852 | 715 |
| Nb | 8.57 | 200 V | 2 | 103 | 12.0 | 2468 | 719 |
| Mo | 10.22 | 250 B | 1–5 | 293 | 28.7 | 2610 | 710 |
| Hf | 13.1 | 152 V | ductile | 40 | 10.7 | 2222 | 686 |
| Ta | 16.6 | 150–200 B | 1–2 | 188 | 11.3 | 2966 | 690 |
| W | 9.3 | 488 B | 1 | 360 | 18.7 | 3387 | 691 |
| Re | 21.0 | — | 24 A | 468 | 22.3 | 3180 | 684 |
| Be | 1.85 | 106–130 V | 0–3 | 300 | 162.2 | 1283 | — |
| B | 2.34 | 9.3 M | brittle | — | — | 2100 | 1302 |
| Si | 2.33 | 7.0 M | brittle | — | — | 1410 | 984 |

TABLE 11-continued

Selected Properties at Ambient Temperature of Early Transition Metals and Metalloids
for Mechanical Alloying of Mg-Alloys
(from C. J. Smithells, Metals Reference Book, 2nd Edition, Interscience Publishers, 250 Fifth
Avenue, New York 1, 1955; 6th edition, Buttersworth, London and Boston, 1983, Johnson Matthey
GmbH, Finest Inorganic Research Chemicals and Materials, Handbook, 1995/96, Karlsruhe, RFA
and R. C. Weast, CRC Handbook of Chemistry and Physics, 66th edition, 1985–1986).

| Metal | $\rho$ [g/cm$^3$] | Hardness[1] | Ductility[3] [% gl.] | Young's Modulus E [Gpa] | E/$\rho$ [Gpa/[g/cm$^3$] | $T_m$ [° C.] | $T_m$ [° C.] |
|---|---|---|---|---|---|---|---|
| Ge | 5.32(?) | — | brittle | — | — | 937 | 671 |

[1]B: Brinell hardness, V: Vickers hardness, M: Mohs hardness; data are for commercially pure metals, if not indicated otherwise.
[2]extruded bar
[3]in "hard" condition, if not indicated otherwise; A: annealed the mechanical shock wave. In analogy to the ΔD-criterion, differences in elastic modulus provide a local driving force for homogenization of the mechanical impact power provided by ball milling so another, but important and consistent criterion regarding previous constitutional material parameters to promote the formation rate of Mg-based over other nc-phases following $$\Delta P(E) = (E\rho(X))^{0.5} - (E\rho(Mg))^{0.5} \qquad (MA33)$$

Ball milling of Mg-based precursors with TM- and/or met-based precursors should therefore result relatively rapidly in corrosion resistant ne-phases with high modulus and/or strength as a result of the rule of mixtures at least. That is, that the attributes to rate-control ne-phase formability tend to coincide with the requirements for attractive engineering properties in the particular case of ball-milling for selected Mg-based ne-phases, and are primarily dependent on the involved constituents and less dependent on concentration.

An increase in crystallization temperature $T_x$ of amorphous Fe$_{75}$Zr$_{25}$ of around 100° C. by the addition of 15 wt. % boron was reported, for example (cf. L. Schultz, *Mat. Sci. Engng.* 97, 1988, pp. 15–23). The effect of boron was considered to enhance vacancy-based interdiffusion of boron into amorphous FeZr-layers during milling and in particular after milling during heat treatment for 2 hrs at 550° C. There is no evident obstacle why the hard boron material should not produce similar effects such as an increase in the transformation temperature of non-equilibrium Mg—Zr and other Mg-TM alloys, for example, which would then, in return, allow for higher milling temperatures and shorter milling times required. A universally applicable criterion to predict the maximum milling temperature for ne-phase formation by ball milling is (in a first approach) the Kauzmann criterion (W. Kauzmann, *Chem. Reviews* 42, 1948, pp. 219–256) to predict the alloy glass temperature $T_g$, i.e.

$$T_{transf} = k_{transf} * T_g = k_{transf} * (0.22-0.25\, T_m) \qquad (MA34)$$

where $k_{transf}$ is an empirical constant to quantify the effect of phase selection by the system.

The DSC-analysis of ball-milled Mg-10 wt. % Ti doped with 5 wt. % brittle boron lumps of size of some mm results in fact in a significant shift of the onset of the irreversible exothermic transformation temperature from some 240° C. to (for a heating rate of 40 K/min) as high as 550° C. (FIG. 137 showing evolution of non-equilibrium phase and yield of ball-milled Mg-10Ti-5B [wt. %] with increasing (ratio of) shock power (-to-friction) as controlled by increasing disc holder rotation Ω, here from 180 to 456 rpm. Employed milling conditions: R=13 cm, r=33 cm, $r_b$=7.5 mm, thus r*=25.5 mm, ω=200 rpm, $m_b$=14 g (steel); $n_b$=5; employed form of Mg: machined chips, that of Ti: sponge and that of B: broken lumps (coarse); dry milling conditions, resulting in exothermal doublet at around 600° C.) and was directly followed by an endothermal melting above this transformation (FIG. 137). That is, ball milling of Mg—Ti with boron results in a non-equilibrium Mg-base phase with the same very high transformation temperature as ball milling of WE54 with Al$_2$O$_3$. The conditions employed were R=13 cm, r=3.3 cm, $r_b$=0.75 cm, $m_b$=14 g, $n_b$=5, ω=200 rpm and t=12 h. The only variable was Ω with 180, 260, 380 and 456 rpm resulting in a ball-milled end-product which was not tight up by "caking" of 1, 30, 80 and 80–90 volume %, respectively, and in a gradually increasing magnitude of the exothermal effect around 600° C. That is, for a given milling time (i.e. here of 12 hours) both the magnitude of the irreversible high temperature exothermal effect and yield of the resultant ball-milled end-product are directly coupled to each other and decreased with decreasing ratio of the employed shock-to-friction ratio (FIG. 137). It is concluded that ball milling of the relatively dilute terminal so ductile Mg-based alloys containing passivating components such as light/early rare earth and/or transition metals and/or metalloids require either:

1. to perform the milling operation at a relatively high absolute value of shock energy and resultant power and/or
2. to employ a relatively high ratio of shock-to-friction to avoid excessive "caking" and/or retardation/delay in non equilibrium phase formation and/or
3. to decrease the size of the brittle precursor (e.g. use of B- or BN-powder instead) and/or to increase the volume fraction of any type of brittle alloying addition such as B, BN, Al$_2$O$_3$ etc. to reduce (excessive) welding and/or "caking" during the milling operation and to increase the freedom to increase factors 1. and 2., for example, so increasing non-equilibrium phase formation rate at high yield and/or the yield itself. That is, the requirements for phase stability and productivity are directly interrelated and/or equivalent within a certain regime of selected precursor mixtures and corresponding operating variables as summarized in the 2$^{nd}$ Embodiment.

Evidently, not only hardness, modulus of elasticity and interdiffusivity, but also the onset of non-equilibrium phase transformation are atomic properties and in some cases, as for metalloids such as boron, all related to the (mean) melting (and boiling) point of the involved alloying elements making the embodimented combinations of selected transition metals and metalloids attractive candidates for non-equilibrium processing of thermally stable Mg-based ne-phases with high modulus and corrosion resistance. A mixture of Mg—Ta—Ti—Mo and/or Mg—V—Cr (or other higher order Mg-TM-TM-TM alloy combinations) relaxes the choice and quantity of alloying and/or lubricant additions, since alloying elements such as Cr and Mo are brittle, while the addition of a metalloid such as Si and/or SiC (and/or B and/or BN, $Al_2O_3$ etc.) enhances not only the brittle-to-ductile fraction when employed in conjunction with ductile Mg-base precursors, but in particular the specific modulus. Evidently, the combination of these elements provide ideal combinations of alloying additions to accelerate the formation of non-equilibrium Mg-base alloys by MA due to their very different ductility, melting points and elastic modulus.

3.7 Use of Lubricants

Classical lubricants (carbon, alcohols) appear only ineffective to increase yield of terminal Mg-base alloys in combination with hard and eventual brittle "alloying additives". The quantity of the lubricants such as hexane is to be minimized with regard to the eventually resulting formation of micro-galvanically active dispersions such as carbides or other reactants in the as-milled powder and their affordable volume fraction with regard to the level of alloying additive and/or milling time employed. If the resulting dispersion is micro-galvanically inert, a controlled and eventually moderate addition of lubricants such as hexane (or silane) allows to tailor in-situ-wise corresponding as-milled microstructure which is to be explored further on subsequent consolidation and forming operations.

The combination of "alloying" and "lubricating" additives has to energetically allow for the formation of the required non-equilibrium Mg-base alloy. Reaction milling of aluminum base alloys involves the controlled addition of oxides and/or oxygen and/or the addition of carbon-bearing lubricating to be directly converted into an Al-base oxide or carbide dispersion (cf. L. Froyen, L. Delaey, X. P. Niu, P. LeBrun and C. Peytour, *Journal of Metals* 3, 1990, pp. 16–19) and represents a quite straightforward approach for which it is sufficient to employ less sophisticated ball milling techniques such as horizontal ball mills. In the redoxation milling for equilibrium and non-equilibrium Mg-base alloys, however, "alloying" and "lubricating" additives are consumed (away) by a redox-reaction induced by the milling operation in order to trigger a non-equilibrium Mg-matrix phase transformation instead. An hexane/TM part of Mg-base precursor mixtures shows significantly smaller (partial) heats of reactions, $\Delta H^{rea}$, due to substantially lower $\Delta H^{for}$-values for the formation of corresponding carbides than hexane with rare earth and/or yttrium so increasing the probability of alternative reactions including the formation of a (disordered) homogeneous non-equilibrium Mg-base one-phase matrix induced by shock energy (here with $d\Delta H^{rea} = \Delta H^{for}(TM_aC_b) - \Delta H^{for}(C_6H_{14})$, in [kJ/mole]) in following order (*Interactive Lit. Res.*, ONERA, 1992):

$C_6H_{14}+6Zr \rightarrow 6ZrC+7H_2 -1030$ (MA35)

$C_6H_{14}+6Ti \rightarrow 6TiC+7H_2 -935$ $C_6H_{14}+6Nb \rightarrow 6NbC+7H_2 -663$ $C_6H_{14}+6V \rightarrow 3V_2C+7H_2 (>-300)$ $C_6H_{14}+23Cr \rightarrow Cr_{23}C_6+7H_2 -158$ $C_6H_{14}+14Cr \rightarrow 2Cr_7C_3+7H_2 -150$ $C_6H_{14}+12Mo \rightarrow 6Mo_2C+7H_2 -103$ $C_6H_{14}+9Cr \rightarrow 3Cr_3C_2+7H_2 -85$ $C_6H_{14}+6W \rightarrow 6WC+7H_2 -72$ $C_6H_{14}+6Mo \rightarrow 6MoC+7H_2 +11.0$ $C_6H_{14}+12W \rightarrow 6W_2C+7H_2 +11.6$ $C_6H_{14}+18Mn \rightarrow 6Mn_3C+7H_2 +142.4$ The use and involvement of an initial TM-compound (with negative $\Delta H^{for}$) instead of elemental TM and/or the additional use of a ceramic compound (negative $\Delta H^{for}$) would increase non-equilibrium phase formability due to reduced (macroscopic) enthalpy (less driving force) for carbide formation (cf. e.g. MA29), since corresponding left hand side of the reaction would be more stable if (a controlled quantity of) hexane was employed as a lubricant and the $d\Delta H^{rea}$-balance would shift to more positive values so increasing the (constitutional) window for formation of a non-equilibrium Mg-base matrix phase with decreasing heat of formation of the potential carbide (here with Mn least disturbing in this respect). Among the common reinforcements, $Al_2O_3$ provides the largest destabilization effect on the reaction (less than 1 mole $Al_2O_3$ compensates for the tendency of 1 mole hexane to form Zr-carbides).

However, Mg (-Zr based) alloys are known to undergo self-degassing via the formation of hydrides such as $ZrH_2$ (I. J. Polmear, *Light Alloys*, Edition Edward Arnold Ltd, 41 Beford Squares, London WC1B 3DQ, 1980). Self-degassing is therefore also possible in other Mg-transition, Mg-rare earth and eventually Mg-metalloid based metals. The formation of hydrides (and/or related short-range orders) increases the exothermic nature of eq. MA35-type of reaction:

$C_6H_{14}+13Zr \rightarrow 6ZrC+7ZrH_2$ (MA36)

and would therefore energetically support the tendency for ne-phase formation by ball milling, since the system Mg—Zr—ZrC—$ZrH_2$ represents effectively a pseudo-quaternary system with two compounds reducing dramatically corresponding free energy according to the situation shown in FIG. 134. On a microscopic scale, the ne-phase formation is supported kinetically by a tendency to form short range orders (SRO) dissimilar from the crystal. structure of an equilibrium phase of same composition following $x$Mg+$C_6H_{14}$+13Zr→SRO($x$Mg+$y$6ZrC+$z$7ZrH$_2$)+(1−$y$)Zrc+ (1−$z$)ZrH$_2$ (MA36a)

and which may act as a nuclei for an homogeneous ne-matrix phase eventually involving interstitial atoms such as hydrogen and/or carbon homogeneously distributed on an atomic length scale or not. The Zr in eq. MA36 is representative for other TM and metalloids (cf. Table 11). The tendency to support ne-phase formation via SROs has been observed in other Mg-based systems such as Mg—Ni (E. Nassif, P. Lamparter, W. Sperl and S. Steeb, *Z. Naturforsch.* 38a, 1983, pp. 142–148; S. Falch, P. Lamparter and S. Steeb, *Z. Naturforsch.* 39a, 1984, pp. 1175–1183) and was considered to be inducable by hydrogen in compounds such as C15 Laves phases (K. Aoki, X -G. Li and T. Masumoto, *Acta Met. Mater.* 40 (1992), pp. 1717–172). The corrosion properties of the final ball-milled Mg-alloys is further improved by replacing hydrocarbons with silanes (eg. $SiH_4$) to entirely circumvent the formation of carbides including corresponding SRO, but this would require special safety precautions to prepare and handle the involved products.

The potential of silanes and/or hydrocarbons such as those of the $C_nH_{n+2}$-series to induce ne-phases with an homogeneous distribution of alloying additions on an atomic length scale, i.e. on the constitutional side is reduced by the introduction of slip so efficiency of the mechanically introduced impact power. One way to increase the operative efficiency of a ball mill for ne-phase formation of a given "wet" alloy charge is to maximize the ratio of shock-tofriction energy as is possible in particular by using planetary ball mills (see previous chapters). If hard and/or eventually brittle "alloying additives" are involved in the wet alloy precursor charge, the use of selected "lubricating additives" relax the milling conditions allow ing for more extreme mechanical impact power cycles such as at the beginning of the operation to improve powder quality (control of powder size and corresponding frequency distribution, cf. F. Hehmann, *Conf. Proc. Advances in Production and Fabrication of Light Metals and Metal Matrix Composites*, eds. M. M. Avedesian et al., Canadian Institute of Mining, Metallurgy and Petroleum (CIMMP), Montreal, 1992, pp. 305; J. F. King and F. Hehmann, *Proc. Conf. Magnesium Alloys and Their Applications*, eds. B. L. Mordike and F. Hehmann, DGM, Oberursel, 1992, p. 309) with out reducing the formation of metastable phases for a given yield of powder. If hydro-carbon(s) is/are employed, the milling operations should ensure to complete both (i) the redoxation reaction of the hydrocarbon(s) or similar lubricants including self-degassing via transition and/or rare earth and/or metalloid metals and/or (ii) to let the (excess) hydrogen and/or hydrocarbon essentially escape from the material before finishing the milling operation so allowing for consolidation operations without the need for degassing the (pre-compacted) powder (cf. F. Hehmann, *Conf. Proc. Advances in Production and Fabrication of Light Metals and Metal Matrix Composites*, eds. M. M. Avedesian et al., Canadian Institute of Mining, Metallurgy and Petroleum (CIMMP), Montreal, 1992, pp. 305; J. F. King and F. Hehmann, *Proc. Conf. Magnesium Alloys and Their Applications*, eds. B. L. Mordike and F. Hehmann, DGM, Oberursel, 1992, p. 309).

3.8 Choice of Milling Atmosphere and Further Ball-Milled Materials

The repeated exposure of fresh, rough and highly activated metallic interfaces to atmospheric gases renders ball milled materials, in particular reactive metals for aerospace applications such as Al, Ti and Mg very sensitive to absorb atmospheric gases such as oxygen and nitrogen (Y. Chen, R. LeHazif and G. Martin, *Solid St. Phen.* 23&24, 1992, Trans Tech Publications Ltd., Zürich, 1992, pp. 271–283). It is therefore straightforward to employ inert and very pure protective atmospheres of helium, argon, hydrogen, krypton, neon, and/or xenon, for example, and/or a vacuum in the milling container concerned prior to start the milling operation.

By contrast, reactive milling in an oxygen and/or nitrogen or carbonized atmosphere is deliberately used for the fabrication of nitrides such as TiN, ZrN, BN, $Mo_2N$, $Si_3N_4$, AlN, $Cu_3N$ and/or $W_2N$, for example, but is also extendable to the fabrication of oxides and carbides including $SiO_2$, $ZrO_2$, $Ta_xC_y$ etc. which will then serve as a base material to fabricate temperature stable and thermally resistant diaphragms for controlled vapor deposition processes as to the invention (see above) (Y. Chen, R. LeHazif and G. Martin, *Solid St. Phen.* 23&24, 1992, Trans Tech Publications Ltd., Zürich, 1992, pp. 271–283). These materials are homogeneous, since the chemical reaction can continue in the interior of the material, while the reaction rate is enhanced by high milling powers, the increase in milling temperature and the quantity of gas supplied to the milling container as all is possible via planetary ball milling, for example.

The advantages to provide high rates of defect formation makes planetary ball milling also very interesting to fabricate more economically more effective hydrogen storage materials. Terziecva et al., for example, reported (M. Terziecva, M. Khrussanova, P. Peshev and D. Radev, *Int. J. Hydrogen Energy*, 20(1), 1995, pp. 53–58) on an improvement of hydrogen storage capacitiy, hydriding and dehydriding kinetics of mixtures of magnesium and a $LaNi_5$ type of $MM'_5$ alloy where M is a misch-metal consisting of La, Ce, Pr and Nd and M' is nickel with Al, Co and Mn impurities, the $MM'_5$ content at levels of 30 wt. % or so, after planetary ball milling by using milling balls of mass 12 grams or so. From the invention it is evident that the mass of the milling ball is of secondary importance relative to the discussed hierarchy of parameters controlling the rate of the introduction of structural defects including ne-phase formation and/or the milling effect, i.e. the injected impact power and not the mass of milling balls is controlling hydrogen storage capacity and fabrication of Mg-based materials made by ball milling. Recent development, however, concentrated on the effect of Ni-concentration in ball-milled Mg-alloys and the effect of catalysts such as Pd to improve the hydrogen storage characteristics of ball-milled Mg-base alloys (M. Y. Song, *Int. J. Hydrogen Energy* 20(3), 1995, pp. 221–227; L. Zaluski, A. Zaluska, P. Tessier, J. O. Strom-Olsen and R. Schultz, *J. All. Comp.* 217, 1995, pp. 295–300). From this invention, however, it is evident that the micro-structural refinement and the increase of structural defects to increase the hydrogen storage capacity of such materials does not require very large $P^*$ and $E_{c,c}$-values, but that the hydrogen storage capacity increases with increasing $P^*$ and $E_{c,c}$-values. This aspect is taken into account in the $2^{nd}$ Embodiment.

3.9 In-Situ and Post-Milling Annealing, Milling Alternatives

Post-milling isothermal annealing for 24 h at 500° C. of initial alloy Si-33.3 at. % Fe consisting of a mixture of elemental iron, silicon, FeSi, crystalline a-$FeSi_2$ plus an amorphous phase in the as-milled state was reported (E. Gaffet, N. Malhouroux and M. Abdellaoui, *J. All. Comp.* 194, 1993, pp. 339–361) to increase the volume fraction of the amorphous phase at the expense of the (elemental) crystalline phases with decreasing grain size. Similar mechanically activated annealing and/or solid state diffusion processing was observed in $MoSi_2$ and $WSi_2$ (E. Gaffet, M. Abdellaoui, and N. Malhouroroux-Gaffet, Mater. Trans JIM 36 (2), 1995, pp. 196–207, see FIG. 108 instead "(Fig. MA5)"). Ball.milled Al—Fe base alloys (L. Froyen, L. Delaey, X. P. Niu, P. LeBrun and C. Peytour, *Journal of Metals* 3, 1990, pp. 16–19) were subjected to a first milling cycle of 8 h using a weight ratio of ball-to-alloy precursor charge of 10:1, the ball-milled Al—Fe base alloys consisting of an solid solution supersaturated with Fe (and/or Mn), which decomposed during subsequent annealing into metastable $Al_6Fe$ (at 320° C.) or equilibrium $Al_{13}Fe_4$ (at 400° C.) of size up to 40 µm followed by a second milling cycle of 6–8 h in order to enhance homogeneity and microstructural refinement of the resulting second phase intermetallic dispersion of size 0.1 to 0.6 µm with grain size 0.1 to 0.5 µm (FIG. 138 showing flow chart with single (sMA) and double (dMA) mechanical alloying route, the latter including two distinct milling cycles before and after an heat treatment during which non-equilibrium phase formation and/or homogenization of corresponding microstructure is enhanced due to the structural defects accommodated by the material during the first milling cycle (MA1). From R. V. Raman, S. V. Rele, S. Poland, J. Lasalvia, M. A. Meyers and A. R. Niiler, *Journal of Metals*, March 1995, pp. 23–25).

The invented Mg-TM-met alloys provide excellent candidates for homogenization by in- and ex-situ (post-milling) heat treatments in order to take non-dissolved constituents into (crystalline or amorphous) solid solution, i.e. either during and/or after a controlled milling cycle due to the above AD- and AE-criteria compensating for the positive heat of mixing as forth-coming from the large immiscibility gaps of the Mg-alloy systems for passive surface oxides and providing a barrier to economically viable processing (that is, that unlike (elemental) precursor mixtures increase $t(me)_{req}$ and the tendency to form like-like atomic pairs (A—A and B—B etc.) so $t(ne)_{req}$ for the formation of ne-phases with an homogeneity on an atomic length scale compared to pre-alloyed precursors with corresponding improved topological similarity). When solid state synthesis of different elements is controlled by interdiffusion of the constituents involved in the alloy charge, acceleration of interdiffusion would then be achieved by a controlled temperature and/or heating cycle after and/or during the milling operation provided, that at least one of the precursor constituents of the employed mixture of precursor powder and/or machined chips and/or turnings is brittle enough and sufficiently available in order to avoid "caking".

Ball-milled Mg-base ne-phases require lower annealing temperatures for homogenization after a first milling cycle than those applied to develop dispersion strengthened Al-base alloys (see $2^{nd}$ Embodiment). In-situ annealing is particular possible by PBM due to its unlimited latitude to control the ratio of the injected friction-to-shock power. Also the carbide and/or hydride (and/or corresponding SRO) formation (and destabilization) is best controlled externally by planetary ball mills with $\Omega$ decoupled from $\omega$ which allows for deliberate milling cycles including selected change of P* and friction-to-shock ratios and supported by homogenization treatments including in-situ and post-milling annealing to relax defect concentrations and eventually expelling hydrogen so to suppress formation of hydrides, if necessary. Planetary type I of ball milling is the most flexible ball milling technique so allowing, due to the decoupling of $\omega$ from $\Omega$, to employ more often, eventually shorter more effective and more variable in-situ annealing, i.e. T/t-cycles (FIG. 139 showing in-situ annealing cycle achieved by employing increased friction-to-shock and an in-situ cooling system of a planetary type I- of ball mill with milling time including hysteresis (-----) stemming from corresponding heat flow) than by external annealing cycles proposed by L. Froyen, L. Delaey, X. P. Niu, P. LeBrun and C. Peytour, Journal of Metals 3, 1990, pp. 16–19.

3.10 Powder Processing

This paragraph deals with the consolidation of ball milled Mg- and/or Al-base base and other ball milled powders including diaphragm-materials which are accessible by ball milling techniques. Ball milled materials were generally observed to provide (surface) activated so better densification characteristics (reduced consolidation temperatures and pressures) than powders from other processes (E. Gaffet, M. Abdellaoui and N. Malhourouroux-Gaffet, Mater. Trans JIM 36 (2), 1995, pp. 196–207, see FIG. 108. The resultant redox-reaction process for the invented Mg-alloys then incorporates all current evolutions in the development of advanced light alloys by ball milling (cf. V. Arnhold, K. Hummert and R. Schattevoy, Conf. Proc. Materials by Powder Technology, PTM '93, edt. F. Aldinger, DGM, Oberursel, 1993):

no degassing required or if (a reduced need for) degassing, need XS-alloying to compensate for the dealloying effect by carbide formation and to avoid formation of light alloy carbides due to their susceptibility to (aqueous) corrosion.

no residual hydrogen, i.e. removal of (liquid) hexane or $H_2$ during or by evaporation in vacuum for e.g. 0.5 h at temperatures up to 480° C. depending on transformation temperature (cf. F. Hehmann, Conf. Proc. Advances in Production and Fabrication of Light Metals and Metal Matrix Composites, eds. M. M. Avedesian et al., Canadian Institute of Mining, Metallurgy and Petroleum (CIMMP), Montreal, 1992, pp. 305; J. F. King and F. Hehmann, Proc. Conf. "Magnesium Alloys and Their Application", eds. B. L. Mordike and F. Hehmann, DGM, Oberursel, 1992, p. 309).

hot pressing at around $T=T_{transf}-30°$ C. (R. B. Schwartz, priv. communication, June 1990)

can employ low extrusion ratios (better avoiding localized melting, eventually localized formation of (eventually embrittling) shear bands large cross-sections of as-extruded products possible direct powder forging possible (cf. V. Arnhold, K. Hummert and R. Schattevoy, Conf. Proc. Materials by Powder Technology, PTM '93, edt. F. Aldinger, DGM, Oberursel, 1993).

(one-step) explosive and/or shock (self-propagating) consolidation methods to better conserve the ne-structure in the final product (R. B. Schwartz, Mat. Sci. Engng. 97, 1988, pp. 71–78), a method being particular useful for consolidation of nanocrystalline intermetallics (Ti—Al, Fe—Al, Nb—Al), nanostructured $SiC_xN_y$ powders, non-equilibrium $Cu_{1-x}Ta_x$ alloys, nanocrystalline oxide materials such as $TiO_2$, $SrTiO_3$, $KNbO_3$, dense $MoSi_2$, TiNi, $TiB_2$, TiC, $Si_3Ni_4$, TiC, TiN, $TiO_2$, TiC—MgO composites, $CrO_2$, $CrB_2$, for example (R. V. Raman, S. V. Rele, S. Poland, J. Lasalvia, M. A. Meyers and A. R. Niiler, Journal of Metals, March 1995, pp. 23–25), VC, $Fe_3C$, $Al_2O_3$, SiC, $Ta_2C$, $B_4C$, $Cr_3C_2$, SiAlON and Cr-base, Nb-base, Ta-base, Mo-base and W-base alloys.

SPEX mill powders, for example, were observed to be smaller with a more refined microstructure so also harder than those by attritor ball milling (cf. D. R. Maurice and T. H. Courtney, Metall. Trans. 21A, 1990, pp. 289–303) and requiring higher consolidation (e.g. HIPing) temperatures for a given consolidation pressure and/or time or vice versa, but they are all amenable to successful consolidation by metal powder injection molding providing parts of high complexity and accuracy at low costs, a method which is particular useful for ball milled powders exhibiting good sintering characteristics in combination with binders that hold the particles in place for mass transfer during molding, the binder thereby acting as a flow and carrier agent with good wetting capability, progressive decomposition during debinding and non-toxicity, all of which at temperature between 150° and 600° C. or so (thermal debinding) to be enhanced by contact with porous materials to promote capillary flow, by solvent to dissolve the binder and by catalytic extraction in which the binder is rapidly hydrolyzed to corresponding monomer so finally leading to homogeneous microstructures and density affording superior engineering properties compared to conventional press-and-sinter products and allowing a wide range of geometric options including undercuts, tapered surfaces and cross holes (see $15^{th}$ Embodiment). FIG. 140 shows cross-sections of projectiles used for "ball"-milling in the present invention, here with configurations providing particular effective impact energy transfer from projectile to the milled precursor and/or powder material. The surface of the projectiles consists of a discontinuous profile of curved and/or non-curved (i.e. flat) sections arranged to (T) quasi-triangle (here with two curvatures C1 and C2), (O) quaternary (square), (P) pentagonal, (H) hexagonal, (O) octagonal etc. cross-sections, the curved surface sections eventually embracing different curvatures per projectile (cf. T2) and/or partially (c) curved and (nc) non-curved (cf. O) surfaces.

3.11 Conclusions

Each ball mill and/or ball milling operation provides the possibility of different milling conditions as was shown above. The injected impact power, eventually dividing in shock and friction, is the universally applicable parameter to control ne-phase formation independent on the ball milling technique employed and independent on and likewise instructive for the operator. The disclosed empirical data and empirically proven relationships show the scope of the processing variables and their operating regime required to achieve the structural changes for corrosion resistant non-equilibrium Mg-alloys and other light alloys by ball milling including the fully transformed meta stable state such as a Mg-base amorphous and/or non-equilibrium crystalline matrix free or essentially free of second phase dispersions which are eventually harmful to the corrosion resistance of the corresponding alloy. Under the maxim of MA for non-equilibrium and corrosion resistant Mg-base phase formation, the prime parameters to optimize powder yield (i.e. to avoid "caking") and subsequent powder MA-Mg-base consolidation and forming operation are:

1. the hard and/or brittle-to-ductile precursor ratio (by) weight and/or by volume) and/or
2. the rotational milling speed(s) and impact energies and/or
3. the filling fraction of milling balls and/or precursor charge and resulting effective impact powers and/or
4. the resulting ratio of friction-to-shock energy
5. the type and quantity of lubricating agent eventually required and/or
6. the resultant milling time and cumulative impact energy required.

The $2^{nd}$ Embodiment is a consequence of the observations made in this invention and includes a summary of the combinations of brittle elemental (Cr, Mo, . . . Si, B, Be) on the one hand and ductile elemental (V, Ta, Zr, cf. Table 11) refractory additions on the other. Hardness, brittleness and their effect on the operative interdiffusivity in the terminal MA Mg-base alloy by using selected elemental and compound-type of "alloying additives" represent prime selection criteria to reduce the welding part of the milling cycles so $t_{req}$ for interesting non-equilibrium Mg-base matrix phases by ball milling.

The time intervals required to achieve the relevant constitutional effects are dictated by economics, while the large $\Delta D$- and $\Delta E$-values of the Mg-systems concerned provide a useful criterion to compensate for the relative small contribution to the overall driving force preset by the (terminal) $\Delta H^{mix}$-values. In conjunction with a hard and eventually brittle precursor elemental and/or compound "alloying additive" as well as a lubricant in the initial ball milling charge and the controlled addition of impact power to the initial precursor charge it is possible to reduce the milling periods required to achieve the structural ne-state to between 0.2 and 250 hours, in particular o between 0.3 and 40 hours.

4. Joining Techniques for Non-Equilibrium Alloys

Unlike for Mg-casting alloys, most of the non-equilibrium alloys made by vapor deposition and mechanical alloying cannot be joined by liquid metal methods such as (arc, gas metal etc.) welding and/or brazing, since it would destroy the non-equilibrium (micro-) structure so favoring mechanical joints (rivets, screws, bolts, self-clinching devices, HT-interference fits) and adhesive bonding methods (rubber and/or epoxy base resin, ethoxyline resin, phenol-base materials) including their advantages (established design, versatility, large choice of adhesive and strengths, no stress concentrations, good fatigue strength, no water penetration) and disadvantages (risk of galvanic corrosion, limited shear strength, laborious operations) (R. S. Busk, *Magnesium Product Design*, Marcel Dekker Inc., New York, 1988). The materials for mechanical joints are made from the same or similar VD- and/or ball milled Mg-base materials themselves providing like-like joints, since they will provide sufficient strength, notch-impact sensitivity and fatigue resistance due to the high microstructural homogeneity so replacing dissimilar metals such as steels and likewise being fabricated as relatively cheap by-products, allowing for relatively cheap mechanical joint procedures and adhesive bonding methods, reduced waste deposal and recycling problems. Evolving methods in solid state joining useful for non-equilibrium Mg-base alloys include diffusion bonding (at low T and/or pressures as high as >10 MPa as was applied to high strength Al7475, to AlLi alloys 8090 and 2091, cf. (H. E. Friedrich, *Journal of Metals*, February 1995, pp. 33–35)), inertia and linear friction welding for high quality welds (as eg. for Al—Fe—Ce, Al—Fe—Mo—V and Al—Fe—V—Si alloys) and joints (as eg. for SiC-particulate reinforced Al—Fe—Si—V such as A18009 and A16061-T6 tubing with 10 vol. % $Al_2O_3$ (W. A. Baeslack and F. H. Froes, Journal of Metals, March 1995, pp. 13–15)).

The galvanic corrosion and joining problem is further reduced by thermal spraying (e.g. on top of dissimilar metals and/or passive Mg-components and Mg-joints all coping with like-unlike mechanical joints), employing high purity joint surfaces, appropriate design including adhesive intralayers, cleaning, degreasing, thin coatings including anodizing (the affordable shear in the coating increases with decreasing coating thickness), pickling and priming (eg. with chromate and dichromate), if not replacible by other means.

16. Overall Balance: a First Approach

The economical and ecological significance of the impact of the new generation of Mg-alloys (and to a lesser extend of the new Al-base alloys) is summarized in a first approach in FIGS. 141 to 144. As time goes by, a tremendous potential is left out as is indicated by the decline of Mg-applications in the aeronautical domain. With the realization of the processing methods selected in this invention it will be possible to provide a pivot in this evolution.

FIG. 141 shows a universal diagram to employ economical and ecological balances on investments in advanced magnesium and Al—Li alloys (densities as indicated in [$g/cm^3$]) to replace high strength conventional Al-7000 type of alloy in civil aeronautic applications. MEW: maximum empty ("dry") weight (i.e. aircraft weight without payload). [1] Tonnage required to replace Al-7000 alloy. Note that a 10% increment in Mg-mass was employed to correct for specific strength (i.e. Al Li- to -Mg (or MgLi)-volume ratio 1:1.1), other properties assumed as equivalent to Al-7000 alloy. [2] 1 kg kerosene: DM 0.38 or $ 0.24. AEAP: Airbus-Equivalent Acquisition Price (in [Mio $]). $\Delta$=Revenue on $ 10 Mio investment in AlLi. Note: the effect of snowball-factors, the return from rate of interests and rate of inflation of kerosene, the pay-back of replaced conventional Al-7000 type of alloy and possible $CO_2$-taxation has to be added to the scale on the right hand side of the diagram. FIG. 142 shows a universal diagram to employ economical and ecological balances on investments in advanced magnesium and Al—Li alloys to replace high-strength conventional Al-7000 type of alloy in aeronautical applications. MEW: maximum ("dry") weight (i.e. aircraft weight without payload). [1]

AEMI: Airbus-Equivalent Maximum Investment allowed to replace Al-7000 alloy with revenue equivalent to that obtainable by Al—Li. [2] AEMR: Airbus-Equivalent Maximum Revenue (including a return of $ 30 per kg Al-7000 alloy replaced, but without including taxation on $CO_2$) obtainable with acquisition investments equivalent to the price of Al—Li. Remainder is as for FIG. 141. FIG. 143 shows the effect of magnesium on life-time fuel savings and resultant reduction of fuel costs and $CO_2$-emission. [1] Savings relative to life-time investment in fuel. FIG. 144 shows a summary of different structural magnesium based products reported in 1966 (left column) and in the period from 1981–1992 (right). x: Deep See Diving Suit. For details, see F. Hehmann, Diversity and Innovations: Key to the Structural Magnesium Market, *JOM* 45 (11), 1993, p. 27–29.

FURTHER PREFERRED EMBODIMENTS INCLUDE THE FOLLOWING EMBODIMENTS $1^{st}$ embodiment. Pure magnesium or pure calcium or pure aluminum or pure Sr or pure Ba or pure rare earth metals La, Ce, Nd, Pr, Sm or Eu or pure gallium or pure (and porous !) silicon or any kind of water and/or aqueous solution or a magnesium based alloy in terms of any type a massive preform including flat and/or bent rectangular and/or round- and/or irregular shaped deposits including sheet- and/or disc form and/or plate- and/or disc-like forms and/or products, a deposited layer and/or a deposited thin film made by vapor deposition methods and techniques to result in as-deposited cross-sections (perpendicular, i.e. normal to the deposition contact surface) in the range from 20 nm to 800 mm, in particular in cross-sections from 0.5 $\mu$m to 100 mm, the Mg-alloys containing:

rare earth metals:

0.1 to 30% La by weight, in particular between 0.2 and 14 wt. % La, or 0.1 to 30% Ce by weight, in particular between 0.2 and 16 wt. % Ce, or 0.1 to 30% Pr by weight, in particular between 0.3 and 18 wt. % Pr, or 0.1 to 32% Nd by weight, in particular between 0.3 and 20 wt. % Nd, or 0.1 to 35% Sm by weight, in particular between 0.2 and 20 wt. % Sm, or 0.2 to 35% misch-metal by weight, in particular between 0.3 and 25 wt. % misch-metal, the misch-metal thereby in particular of compositions stemming from and/or corresponding to the ore composition of Monazite-, Bastnaesite- and Xun Wu-type of RE-ores, but in any case being dominated by corresponding compounds of La, Ce, Nd and Pr and, as a misch-metal, containing 5–97% La by weight, 5–97% Ce by weight and 5–98% (Nd+Pr) by weight, balance other rare earth metals such as Gd and Tb, but also Y, and the sum of (La, Ce, Nd and Pr) totaling 40–100% by weight, in particular 80–99% by weight, or 0.2 to 30% Y (and Eu) by weight, in particular between 0.5 and 7 wt. % Y (and Eu), or 0.1 to 30% Sc by weight, in particular between 0.2 and 20 wt. % Sc, or 0.1 to 15 at. % Gd in cph-Mg, in particular 0.5 to 6 at. % Gd in cph-Mg, and/or 0.1 to 15 at. % Dy in cph-Mg, in particular 0.5 to 7 at. % Dy in cph-Mg, and/or 0.1 to 10 at. % Ho in cph-Mg, in particular 0.5 to 7 at. % Ho in cph-Mg, and/or simple metals:

0.2 to 15% Al by weight, in particular between 4 and 12 wt. % Al, or 0.2 to 15% Ga by weight, in particular between 4 and 12 wt. % Ga, or transition metals:

0.1 to 30% Mn by weight, in particular between 0.2 and 18 wt. % Mn, or 0.1 to 30% Zr by weight, in particular between 0.2 and 16 wt. % Zr, or 0.1 to 40% Ti by weight, in particular between 0.2 and 25 wt. % Ti, or 0.1 to 20% Re by weight, in particular between 0.2 and 16 wt. % Re, or 0.1 to 30% Hf by weight, in particular between 0.2 and 16 wt. % Hf, or 0.1 to 25% Ta by weight, in particular between 0.2 and 10 wt. % Ta, or 0.1 to 25% W by weight, in particular between 0.2 to 20 wt. % W, or 0.1 to 20% Mo by weight, in particular between 0.2 and 15 wt. % Mo, or 0.1 to 25% Nb by weight, in particular between 0.3 and 17 wt. % Nb, or 0.1 to 30% Cr by weight, in particular between 0.2 and 18 wt. % Cr, or 0.1 to 40% V by weight, in particular between 0.2 and 25 wt. % V, or metalloids:

0.1 to 35% B by weight, in particular between 0.5 to 15 wt. % B, or 0.1 to 35% Be by weight, in particular between 0.5 to 15 wt. % Be, or 4. to 20% Si by weight, in particular between 0.5 to 12 wt. % Si, or 0.1 to 15% Sb by weight, in particular between 0.5 to 10 wt. % Sb, or 0.1 to 15% Ge by weight, in particular between 0.5 to 10 wt. % Ge 1.1 an Mg-alloy according to embodiment 1., characterized further in that 1.1.1 the lanthanum, cerium, praesodymium, neodymium, samarium, europium, gadolinium and/or yttrium and/or the other heavy rare earth elements stemming from the misch-metals, the scandium or aluminum or gallium, the manganese or zirconium, titanium, rhenium, hafnium, tantalum, molybdenum, niobium, chromium, tungsten or vanadium or the boron, beryllium, silicon, antimony or germanium or dysprosium, gadolinium or holmium are or is substantially held in solid solution in the as-deposited state, corresponding solid solution being either (except for Ti) cph-Mg or (including Ti) any other metastable crystalline and/or amorphous phase and/or 1.1.2 an Mg-alloy according to one or more of embodiment 1. and 1.1.1, but also including cph-Mg-Ti alloys with up to 50 wt. % Ti and characterized further by an homogeneous distribution of the solute atom (alloying additions) on an atomic length scale and/or 1.1.3 an Mg-alloy alloy according to one or more of embodiment 1. to 1.1.2, characterized further by an homogeneous distribution of the solute atom (alloying additions) on an atomic length scale with a distance between the like-like alloying atoms (i.e. B—B, C—C etc.) ranging from a minimum value of 1 to a maximum value of 10 atomic and/or ionic spacings of the alloying atom, and/or 1.1.4 an Mg-alloy according to embodiment 1.1.3, characterized further by an homogeneous distribution of the solute atom (alloying additions) on an atomic length scale with a distance between the like-like alloying atoms (i.e. B—B, C—C etc.) of a maximum value of up to 498 atomic spacings of the alloying atoms, and/or 1.1.5 an Mg-alloy according to one or more of embodiment 1 to 1.1.4, characterized further by an average length scale of the (homogeneous) distribution of a given number of matrix atoms, N, which is given by $(N*d_A*c_A/2+N*d_a*c_B/2)$ of atoms, where $c_A$, $c_B$ and $d_A$, $d_B$=concentration and atomic and/or ionic spacing, respectively, of corresponding base metal A (e.g. Mg or Al) and solute B (C for ternary alloys, see following embodiments for which the average length scale were given by $(N*d_A*A/3+N*d_a*B/3+N*d_c*C/3)$ etc.) and/or 1.1.6 an Mg-alloy according to one or more of embodiment of 1 to 1.1.5, characterized further by an homogeneous solute distribution in the solid being either in an disordered and/or in an ordered atomic arrangement and/or 1.1.7 an Mg-alloy according to one or more off embodiment of 1 to 1.1.6, characterized further in that the number of like-like alloying atoms entitled to cluster without catastrophic effect on corrosion resistance ranges from 2 to 420, in particular from 3 to 20, and/or 1.1.8 an Mg-alloy according to one or more of embodiment of 1 to 1.1.7, characterized further in that these clusters have formed by natural aging constituting trans- and/or intraboundary elemental B-type of second phases and/or trans- and/or intraboundary superlattices (i.e. ordered and coherent phases) and/or trans- and/or interboundary equilibrium and/or non-equilibrium semicoherent and/or incoherent second phases and/or 1.1.9 an Mg-alloy according to one or more of embodiment of 1 to 1.1.8, characterized further in that the involvement of the at least one ordered phase requires a number of atomic and/or ionic B—B pairs per unit cell given by $N_{B-B}=(N*Z/2)*p(1-p)$, where (1-p)=fraction of B-atoms on a-site (which is the regular site of an A-atom in corresponding superlattice), Z=coordination number of atoms in corresponding superlattice and p=number of B-atoms on b-sites, N=number of atoms per unit cell of ordered (i.e. superlattice) structure with p ranging from 0.5 to 1.0 and resulting $N_{B-B}$ ranging from 0.5 to 400, in particular from 1 to 200, and/or 2. a material according to one or more of embodiment 1. to 1.1.9, characterized further in that the materials being evaporated by using thermal evaporation methods including induction and/or resistance heating and melting and/or arc and/or electron beam heating and melting methods and/or microwave heating and/or melting methods and/or corresponding heating and sublimation methods and/or plasma and/or magnetron sputtering techniques, and/or 1.3 a material according to one or more of embodiment 1. to 1.2, characterized further in that the power input into any of the condensed phases involved in the process ranging from 0.1 to 300 W per cm² evaporation and/or sputtering surface, in particular from 0.5 to 50 W per cm² evaporation and/or sputtering surface and/or 1.4 a material according to one or more of embodiment 1. to 1.3, characterized further in that Mg, Ca and Ga is evaporated at vacuum pressures in the range of 1 to 0.001 bar, in particular at 0.1 to 0.01 bar, the rare earth elements, Sr and Ba being evaporated at vacuum pressures in the range from 1 to 0.001 bar, in particular at 0.1 to 0.005 bar, the transition metals and metalloids being evaporated at vacuum pressures in the range from 0.1 to 0.0001 bar, in particular at vacuum pressures in the range from 0.1 to 0.001 bar and the aluminum being evaporated at vacuum pressures in the range of 1 to 0.001 bar, in particular at 0.1 to 0.005 bar and/or 1.5 a material according to one or more of embodiment 1. to 1.4, characterized further in that the Mg and Ga is evaporated at surface temperatures in the range of −50° to 1200° C., in particular at 200° to 900° C., the rare earth elements being evaporated at surface temperatures in the range from −20° to 1800° C., in particular at 2000 to 1500° C., the transition metals and metalloids being evaporated at surface temperatures in the range from −20° C. to 4000° C., in particular at surface temperatures in the range from 300° to 3200° C. and the aluminum being evaporated at surface temperatures in the range of −20° to 2000° C., in particular at 200° to 1900° C. and/or 1.6 a material according to one or more of embodiment 1. to 1.5, characterized further in that the material is deposited at a substrate temperature held at between −2000 and 500° C., in particular between −10° and 200° C. to control phase stability and/or porosity, and/or 1.7 a material according to one or more of embodiment 1. to 1.6, characterized further in that the driving force for mass transport between evaporation source and deposition surface of the element (alloy solvent and/or solutes and/or alloy constituents of corresponding equilibrium and non-equilibrium Mg-alloy or purified pure metal) is provided by the vapor pressure of at least one of the constituents concerned and/or the temperature difference providing condensation and resulting underpressure in the very next vicinity of the deposition surface where the vapor collapses into a condensed phase, either in the moment of adsorption and/or immediately before, so allowing the vapor pressure to control the above overall mass transport and/or 1.8 a material according to one or more of embodiment 1. to 1.7, characterized further in that the material is consolidated in-situ in vacuum during the deposition process after deposition of a differential layer of a thickness of at least two atomic monolayers and/or cold-isostatically pressed (CIPed) at pressures in both cases ranging from 50–1200 MPa, in particular ranging from 250–700 MPa, the in-situ consolidation technique being either micro-hammering, and/or a pining technique and/or rolling, and/or a micro-rolling technique and/or a micro-forging technique and/or a micro-swaging technique and/or 1.9 a material according to one or more of embodiment 1 to 1.8, characterized further in that the in-situ consolidated state is characterized by a porosity of 0.005 to 5 vol. %, in particular by a porosity of 0.01 to 1 vol. % and/or 1.10 an Mg-alloy according to one or more of embodiment 1. to 1.9, characterized further in that the magnesium used for the feedstock of the vapor-deposited Mg-alloy is (made) from commercially pure Mg including/and/or purity grade 2N5 to 5N (i.e. 99.5 to 99.999) and/or 1.11 an Mg-alloy according to one or more of embodiment 1. to 1.10, characterized further in that the magnesium used for the feedstock of the vapor-deposited Mg-alloy was made from commercially pure Mg and which is characterized by an impurity level by weight % of 0.001–0.1 Al, 0.0001–0.2 Mn, 0.0001–0.001 Ni, 0.0005–0.1 Si, 0.0005–0.005 Ca, 0.0001–0.005 Cd, 0.001–0.01 Zn, 0.0001–0.06 Fe, 0.0001–0.05 Cu, 0.0005–0.01 Pb, 0.0005–0.1 Sn, 0.0005–0.02 Na, 0.00002–0.1 B, 0.0001–0.1 Co, 0.0001–0.1 C, the remaining trace elements being less than 0.1 wt. % and/or 1.12 an Mg-alloy according to one or more of embodiment 1. to 1.9, characterized further in that the magnesium used for the feedstock of the vapor-deposited Mg-alloy was made from at least one-time vapor-deposited so at least one-time distilled and purified commercially pure Mg including/and/or purity grade 2N5 to 6N (i.e. 99.5 to 99.9999) and/or 1.13 an Mg-alloy according to one or more of embodiment 1. to 1.12, characterized further in that the magnesium used for the feedstock of the vapor-deposited Mg-alloy was made from at least one-time vapor-deposited so distilled and purified commercially pure Mg and which is characterized by an impurity level by weight %:0.001–0.1 Al, 0.0001–0.1 Mn, 0.0001–0.002 Ni, 0.0005–0.05 Si, 0.0005–0.005 Ca, 0.0001–0.005 Cd, 0.001–0.01 Zn, 0.0001–0.05 Fe, 0.0001–0.04 Cu, 0.0005–0.01 Pb, 0.0005–0.1 Sn, 0.0005–0.02 Na, 0.00002–0.004 B, 0.0001–0.05 Co, 0.0001–0.1 C, the remaining trace elements being less than 0.1 wt. % and/or 1.14 an Mg-alloy according to one or more of embodiment 1. to 1.13, characterized further in that a major and/or minor part of the alloying element is taken into solid solution by an annealing and/or solid solution heat treatment, in particular by an annealing and/or solution heat treatment at temperatures between 80° and 600° C. and/or 1.15 an Mg-alloy according to embodiment 1.14, characterized in that the annealing and/or solid solution heat treatment is employed after a thermo-mechanical treatment and/or hot forming operation and/or 1.16 an Mg-alloy according to one or more of embodiment 1. to 1.15, characterized further in that the Mg-alloy shows a better corrosion resistance than commercially pure Mg and/or high purity commercial alloy AZ91 and/or at least one of the other established commercial high purity Mg-base alloys (e.g. high purity AM- and/or AS-series), all being made by casting techniques, in particular in an environment characterized by dry and/or humid air with 0.1% to 100% moisture and/or an aqueous solution (and/or humid air) covering the surface of the Mg-alloys either coherently (in that case either standing still and/or flowing) and/or in form of a spray (very fine condensed humidity) and/or droplets all containing at least 0.001 g/mol of at least one of the following acids HA and resulting conjugated base $A^-$ known to provide the corresponding pKs-values as given in parenthesis (i.e. HA/base $A^-$ (pKs)): $HClO_4/ClO_4^-(-9)$, $HCl/Cl^-(-6)$, $H_2SO_4/HSO_4^-(-3)$, $H_3O^+/H_2O(1.74)$, $HNO_3/NO_3^-(-1.32)$, $HClO_3/ClO_3^-(0)$, $HSO_4^-/SO_4^{2-}(1.92)$, $H_2SO_3/HSO_3^-(1.96)$, $H_3PO_4/H_2PO_4^-(1.96)$, $[Fe(H_2O)_6]^{3+}/[Fe(OH)(H_2O)_5)]^{2+}(2.2)$, $HF/F^-(3.14)$, $HCOOH/HCOO^-(3.7)$, $CH_3COOH/CH_3COO^-(4.76)$, $[Al(H_2O)_6]^{3+}/[Al(OH)(H_2O)_5]^{2+}(4.9)$, $H_2CO_3/HCO_3^-(6.46)$, $H_2S/HS^-(7.06)$, $HSO_3^-/SO^{3--}(7.2)$, $H2PO_4/HPO_4^{2-}(7.21)$,$HClO/ClO^-(7.25)$, $NH_4^+/NH_3(9.21)$, $HCN/CN^-(9.4)$, $[Zn(H_2O)_6]^{2+}/[Zn(OH)(H_2O)_5]^+(9.66)$, $HCO_3^-/CO_3^{2-}(10.40)$, $H_2O_2/HO_2^-(11.62)$, $HPO_4^{2-}/PO_4^{3-}(12.32)$, $HS^-/S^{--}(12.9)$, $H_2O/OH^-(15.74)$, $OH^-/O^{--}(24)$ and/or 1.17 an Mg-alloy according to one or more of embodiment 1. to 1.15, characterized further in that the Mg-alloy shows a better corrosion resistance than the commercial high purity AZ91 alloy in an environment containing any other acid/anion combination as given in embodiment 1.16 and which is characterized by a pKs-value ranging from –12 to +24, in particular from –9 to +16 and/or 1.18 a material according to one or more of embodiment 1. to 1.17, characterized further in that the as-deposited and/or in-situ consolidated state is characterized by a microstructure consisting of grains, cells and/or sub-cells of which the dimensions are <10 μm in at least one dimension of the three translational directions x,y and z, and/or 1.19 a material according to one or more of embodiments 1. to 1.18, characterized by a grain (high angle boundary) and/or cell (low angle boundary) size in the range from 3 to 100 nm, in particular in the range from 5 to 50 nm and/or 1.20 a material according to one or more of embodiments 1. to 1.18, characterized by a grain and/or cell size in the range from 50 to 800 nm, in particular in the range from 60 to 500 nm and/or 1.21 a material according to one or more of embodiments 1. to 1.18, characterized by a grain and/or cell size in the range from 0.5 to 20 μm, in particular in the range from 0.6 to 10 μm and/or 1.22 an Mg-alloy according to one or more of embodiments 1. to 1.21, characterized by a volume fraction of second phases separated from vapor condensation and/or subsequent solid state precipitation during vapor deposition and/or in-situ consolidation ranging from 0.01 vol. %–20 vol. % of the volume fraction corresponding to the equilibrium volume fraction of corresponding alloys, in particular ranging from 0.05 vol. %–10 vol. % of the volume fraction corresponding to the equilibrium volume fraction of corresponding alloys and/or.

1.23 an Mg-alloy according to one or more of embodiments 1. to 1.22, characterized by an intra- and/or transgranular intermetallic and/or elemental and/or equilibrium and/or non equilibrium alloy phase of a one-dimensional length scale (circumference, diameter, maximum 1-dim extension) in the range from 1 to 50 nm, in particular in the range from 2 to 35 nm and/or 1.24 an Mg-alloy according to embodiment 1.23, characterized by an intra- and/or transgranular second and/or ternary and/or quaternary etc. phase (see 1.23) in the range from 0.02 to 15.0 μm in particular in the range from 0.1 to 1.0 μm and/or 1.25 an Mg-alloy according to one or more of embodiments 1. to 1.24, characterized by virtual absence of porosity due to a thermo-mechanical treatment and/or forming operation according to embodiment to 1.15 and/or 1.26 an Mg-alloy according to one or more of embodiments 1. to 1.25, characterized by a maximum porosity after the final forming operation ranging from 0.001 to 5 vol. %, in particular from 0.01 to 3 vol. %, and/or 1.27 an Mg-alloy according to one or more of embodiments 1. to 1.26, characterized by a maximum pore size after the final forming operation ranging from 0.001 to 10 μm, in particular from 0.005 to 5 μm, and/or 1.28 an Mg-alloy according to one or more of embodiments 1. to 1.27, characterized by a content of the impurities Fe, Ni, Cu, Co, Na, K, C, Cd, Zn, Pb, Sn, B and Si, the two latter except for the alloys to which it is deliberately alloyed and $O_2$ ranging from a factor of 0.1 to 10 compared to those levels currently accepted in the established high purity AZ- and AM-type of magnesium alloys made by casting from the liquid state, in particular ranging from a factor 0.2 to 5 of the levels of Fe, Ni, Cu, Co, Na, K, C, Cd, Zn, Pb, Sn, B and Si, and $O_2$ usually accepted in the established high-purity AZ- and AM-type of magnesium alloys and/or 1.29 an Mg-alloy according to one or more of embodiments 1. to 1.28, characterized by an impurity level (by weight %) of 1.29.1 0.00005 to 0.001 Ni and/or
1.29.2 0.00005 to 0.05 Cu and/or
1.29.3 0.00005 to 0.06 Fe and/or
1.29.4 0.00005 to 0.1 Co and/or
1.29.5 0.00005 to 0.1 Si (except for PVD Mg—Si alloys) and/or
1.29.6 0.00005 to 0.1 B (except for PVD Mg—B alloys) and/or
1.29.7 0.00005 to 0.1 Al (except for PVD Mg—Al alloys) and/or
1.29.8 0.00005 to 0.2 Mn (except for PVD Mg—Mn alloys) and/or
1.29.9 0.00005 to 0.02 Na and/or
1.29.10 0.00005 to 0.005 Ca and/or
1.29.11 0.00005 to 0.02 K and/or
1.29.12 0.00005 to 0.5 C and/or
1.29.13 0.00005 to 0.005 Cd and/or
1.29.14 0.00005 to 0.01' Zn and/or
1.29.15 0.00005 to 0.01 Pb and/or
1.29.16 0.00005 to 0.1 Sn and/or
1.29.17 0.0001 to 2.0 O (oxygen) and/or
1.30 an Mg-alloy according to one or more of embodiments 1. to 1.29, characterized by a level of Fe, Ni, Cu, Co, Na, K, C, Cd, Zn, Pb, Sn, B and Si which is not increased further by evaporation and/or vapor transport and/or deposition and/or in-situ consolidation compared to the employed feed stock due to the use of inert refractory metal, alloy and/or intermetallic phases in contact with condensed alloy constituents (e.g. as crucible material), and in particular due to the use of tantalum (-based) materials, and/or
1.31 an Mg-alloy according to one or more of embodiments 1. to 1.30, characterized by a level of $O_2$ which is not increased further by the vapor deposition process compared to the oxygen level of the feed stock, in particular not more than by a factor of 5 due to the use of an inert gas atmosphere (in particular argon and/or nitrogen), high quality sealing and/or a getter vapor to purge the equipment prior to start the vapor deposition process and/or
1.32 an Mg-alloy according to one or more of embodiments 1., to 1.31, characterized by a size of an impurity inclusion (containing Fe, Ni, Cu, Co, Na, K, C, Cd, Zn, Pb, Sn, B, Si and oxides etc., cf. embodiment 1.28–1.31) with a one-dimensional length scale (circumference, diameter, maximum 1-dim extension) in the range of 1–50 nm, in particular in the range from 2 to 35 nm and/or
1.33 an Mg-alloy according to embodiment 1.32, characterized by a size of an impurity inclusion in the range from 0.04 to 5.0 μm, in particular in the range from 0.5 to 1.0 μm.

2nd Embodiment. A magnesium based alloy made by a solid state synthezising technique, in particular by ball and/or bar and/or rod milling via a mechanical alloying and/or chemical (reactive) alloying and mechanical grinding technique and/or cycles (sequences), the magnesium (based) alloy containing: at least one of the following rare earth metals (RE) and/or yttrium and/or scandium, i.e.

0.1 to 40% La by weight, in particular between 0.2 and 14 wt. % La, and/or
0.1 to 40% Ce by weight, in particular between 0.2 and 16 wt. % Ce, and/or
5. to 40% Pr by weight, in particular between 0.3 and 18 wt. % Pr, and/or
0.1 to 40% Nd by weight, in particular between 0.3 and 20 wt. % Nd, and/or
0.1 to 40% Sm by weight, in particular between 0.2 and 20 wt. % Sm, and/or
0.2 to 40% Y (and Eu) by weight, in particular between 0.5 and 7 wt. % Y (and Eu), and/or
0.2 to 40% misch-metal by weight, in particular between 0.3 and 25 wt. % misch-metal, the misch-metal thereby in particular of compositions stemming from and/or corresponding to the ore composition of Monazite-, Bastnaesite- and Xun Wu-type of RE-ores, but in any case being dominated by corresponding compounds of La, Ce, Nd and Pr and, as a misch-metal, containing
5–97% La by weight,
5–97% Ce by weight and
5–98% (Nd+Pr) balance other rare earth metals such as Gd, Dy etc. through Tb, but also Y, and the sum of (La, Ce, Nd and Pr) totaling 40–100% by weight, in particular 80–99% by weight, and/or
0.1 to 20 Sc by weight in cph-Mg, in particular 0.5 to 15.0 wt. % Sc in cph-Mg, and/or
0.1 to 15 at. % Gd in cph-Mg, in particular 0.5 to 6 at. % Gd in cph-Mg, and/or
0.1 to 15 at. % Dy in cph-Mg, in particular 0.5 to 7 at. % Dy in cph-Mg, and/or
0.1 to 10 at. % Ho in cph-Mg, in particular 0.5 to 7 at. % Ho in cph-Mg, and/or at least one of the following simple (i.e. simple electron structure) metals, i.e.:
0.2 to 20% Al by weight, in particular between 4 and 12 wt. % Al, and/or
6. to 25% Ga by weight, in particular between 4 and 16 wt. % Ga, and/or at least one of the following transition metals (TM), i.e.:
2.01 to 30% Mn by weight, in particular between 0.2 and 18 wt. % Mn, and/or
0.1 to 60% Ni by weight, in particular between 0.2 and 55 wt. % Ni, and/or
0.1 to 20% Pd by weight, in particular between 0.2 and 15 wt. % Pd, and/or
0.1 to 30% Zr by weight, in particular between 0.2 and 16 wt. % Zr, and/or
0.1 to 20% Ta by weight, in particular between 0.2 and 10 wt. % Ta, and/or
0.1 to 20% Mo by weight, in particular between 0.2 and 15 wt. % Mo, and/or
0.1 to 25% Nb by weight, in particular between 0.3 and 17 wt. % Nb, and/or
0.1 to 30% Cr by weight, in particular between 0.2 and 18 wt. % Cr, and/or
0.1 to 40% V by weight, in particular between 0.2 and 25 wt. % V, and/or
0.1 to 40% Ti by weight, in particular between 0.2 and 25 wt. % Ti, and/or
0.1 to 40% W by weight, in particular between 0.2 and 25 wt. % W, and/or
0.1 to 35% Hf by weight, in particular between 0.2 and 20 wt. % Hf, and/or
at least one of the following metalloids (met) and/or beryllium, i.e.:
0.1 to 30% B by weight, in particular between 0.2 to 20 wt. % B, and/or
0.1 to 30% Si by weight, in particular between 0.2 to 20 wt. % Si, and/or
0.1 to 25% Sb by weight, in particular between 0.2 to 10 wt. % Sb, and/or
0.1 to 25% Ge by weight, in particular between 0.2 to 10 wt. % Ge and/or
0.1 to 30% Be by weight, in particular between 0.5 to 10 wt. % Be, and/or an aluminum based alloy made by a solid state syntheziseng technique, in particular by ball milling via a mechanical alloying and/or chemical (reactive) alloying and mechanical grinding technique and/or cycles (sequences), the aluminum (based) alloy containing:
0.1 to 20% Fe by weight, in particular between 0.2 to 20 wt. % Fe and/or
0.0 to 15% Ce by weight, in particular between 0.2 to 12 wt. % Ce and/or
0.0 to 15% Mo by weight, in particular between 0.2 to 12 wt. % Mo and/or
0.0 to 40% V by weight, in particular between 0.2 to 30 wt. % V and/or
0.0 to 15% Si by weight, in particular between 0.2 to 12 wt. % Si and/or
0.0 to 15% Cr by weight, in particular between 0.2 to 12 wt. % Cr and/or
0.0 to 30% Zr by weight, in particular between 0.2 to 25 wt. % Zr and/or
0.0 to 15% B by weight, in particular between 0.2 to 10 wt. % B and/or
0.0 to 15% Mn by weight, in particular between 0.2 to 10 wt. % Mn and/or
0.0 to 50% Ti by weight, in particular between 0.2 to 40 wt. % Ti and/or
0.0 to 20% Hf by weight, in particular between 0.2 to 15 wt. % Hf and/or
0.0 to 30% Ta by weight, in particular between 0.2 to 25 wt. % Ta and/or
0.0 to 20% W by weight, in particular between 0.2 to 15 wt. % W and/or
0.0 to 30% Nb by weight, in particular between 0.2 to 25 wt. % Nb,
the aforementioned alloys characterized in that in each case the density of 2.8 g/cm$^3$ is not exceeded and that the balance is made up by the impurities (for particular cases cf. below) and Mg and/or Al and:
2.1 the Mg- and/or Al-alloy according to embodiment 2 characterized further in that
   2.1.1 the Mg- and/or Al-alloy was synthezised and/or ground and/or reacted by using elemental (commercially pure) and/or vapor distilled, purified and then deposited and eventually comminuted and/or pre-alloyed atomized, ground and/or ball-milled synthesized to powders and/or machined chips and/or turnings and/or (broken) lumps to be ball-milled powders with powder size in the range from 0.05 $\mu$m to 500 $\mu$m, in particular to powder-sizes ranging from 0.5 $\mu$m to 400 $\mu$m and/or
   2.1.2 an Mg-alloy according to one or more of embodiments 2. to 2.1.1, characterized further in that the pre-alloyed precursors are Mg-containing alloys with 0.1 to 99.9 wt. % Mg and/or
   2.1.3 an Al-alloy according to one or more of embodiments 2. to 2.1.2, characterized further in that the pre-alloyed precursors are Al-containing alloys with 0.1 to 99.9 wt. % Al and/or
   2.1.4 an Mg- and/or Al-alloy according to one or more of embodiments 2. to 2.1.3, characterized further in that the precursor powder or vapor distilled and -deposited Mg-base feed-stock, in particular the Mg- and/or Al- and/or RE- and/or Ga-containing powder(s) is (are) made by gas-atomizing using an inert atmosphere, in particular 5N and/or 4.8 argon and/or helium and/or nitrogen and/or eventually containing a deliberately added content of passivating oxygen containing 0.000005 to 5 wt. % O$_2$, in particular 0.00001 to 3 wt. % O$_2$ and/or 2.2 an Mg- or Al-alloy according to one or more of embodiments 2. to 2.1.4, but by using at least one very hard (>80 V.H.N.) and eventually brittle precursor constituent, the hard precursor constituent either consisting of
   2.2.1 at least one hard and eventually brittle elemental addition such as Mo, Cr, Si etc. and/or
   2.2.2 at least one hard and brittle elemental addition such as Mo, i.e. the brittle state thereby achieved by:
      2.2.2.1 the crystallography and/or large grains combined with employing the elemental addition at temperatures between −200° to 300° C., in particular at ambient or lower temperatures down to liquid nitrogen or so (−200° C.) and/or
      2.2.2.2 hydrogenization of the precursor solute and/or
      2.2.2.3 enrichment of the solute precursor with (dissolved) oxygen, nitrogen or any other gaseous constituent dissolvable as an interstitial element in the crystal lattice of the precursor solute and/or
   2.2.3 at least one hard and brittle intermetallic phase and/or alloy and/or
   2.2.4 at least one brittle intermetallic phase and/or alloy of the following compositional configurations (suffices a to f in atomic %):
      2.2.4.1 TM(1)$_a$TM(2)$_b$TM(3)$_c$TM(4)$_d$TM(5)$_e$TM(6)$_f$, a=1–99, b=1–99, c=0–20,d=0–10,e=0–10,f=0–5 and/or
      2.2.4.2 RE(1)$_a$RE(2)$_b$RE(3)$_c$RE(4)$_d$RE(5)$_e$RE(6)$_f$, a=1–99, b=1–99, c=0–20,d=0–10,e=0–10,f=0–5 and/or
      2.2.4.3 TM(1)$_a$RE(1)$_b$TM(2)$_c$RE(2)$_d$TM(3)$_e$RE(3)$_f$, a=1–99, b=1–99, c=0–50, d=0–50, e=0–20, f=0–20 and/or
      2.2.4.4 TM(1)$_a$RE(1)$_b$met(1)$_c$TM(2)$_d$RE(2)$_e$met(2)$_f$, a=1–99, b=1–99, c=1–99,d=0–50,e=0–50,f=0–50 and/or
      2.2.4.5 TM(1)$_a$RE(1)$_b$met(1)$_c$TM(2)$_d$RE(2)$_e$met(2)$_f$, a=1–99, b=0–99, c=1–99, d=0–50, e=0–50, f=0–50 and/or
      2.2.4.6 TM(1)$_a$RE(1)$_b$met(1)$_c$TM(2)$_d$RE(2)$_e$met(2)$_f$, a=0–99, b=1–99, c=1–99,d=0–50,e=0–50,f=0–50 and/or
      2.2.4.7 TM(1)$_a$RE(1)$_b$Al(1)$_c$TM(2)$_d$RE(2)$_e$met(1)$_f$, a=1–99, b=1–99, c=1–99,d=0–50,e=0–50,f=0–50 and/or
      2.2.4.8 TM(1)$_a$RE(1)$_b$Al(1)$_c$TM(2)$_d$RE(2)$_e$met(1)$_f$, a=0–99, b=1–99, c=1–99,d=0–50,e=0–50,f=0–50 and/or
      2.2.4.9 TM(1)$_a$RE(1)$_b$Al(1)$_c$TM(2)$_d$RE(2)$_e$met(1)$_f$, a=1–99, 0=1–99, c=1–99,d=0–50,e=0–50,f=0–50 and/or
      2.2.4.10 Mg(1)$_a$TM(2)$_b$TM(3)$_c$RE(4)$_d$RE(5)$_e$met(6)$_f$, a=1–99, b=1–99, c=0–20,d=0–10,e=0–10,f=0–5 and/or
      2.2.4.11 Mg(1)$_a$met(2)$_b$TM(3)$_c$TM(4)$_d$RE(5)$_e$met(6)$_f$, a=1–99, b=1–99, c=0–20,d=0–10,e=0–10,f=0–5 and/or
      2.2.4.12 Mg(1)$_a$RE(2)$_b$SM(3)$_c$TM(4)$_d$AE(5)$_e$met(6)$_f$, a=1–99, b=0–99, c=1–99, d=0–10, e=0–10, f=0–5 and/or 2.2.4.13 Mg(1)$_a$RE(2)$_b$SM(3)$_c$TM(4)$_d$AE(5)$_e$met(6)$_f$, a=1–99, b=0–99, c=0–99, d=0–10, e=1–99, f=0–5 and/or where TM are the transition metals of embodiment 2, RE the rare earth metals and yttrium and scandium in embodiment 2 and "met" the metalloids and Be in embodiment 2. and SM=simple metals such as Al, Ga, Hg, Zn and AE=alkaline earth metals (Ca, Sr, Ba) and/or
   2.2.5 an intermetallic phase or alloy according to embodiment 2.2.4, but enhanced further for the use in the mechanical alloying technique for the preparation of passive magnesium by at least one of the methods under 2.2.2 and/or 2.2.6 at least one oxide, nitride, boride, silicide, carbide (under the condition that the carbon is tight up by another TM- or RE-based carbide), aluminide and/or 2.2.7 at least one of the following nitrides, borides, suicides, carbides (under the condition that the carbon is tight up by another TM- or RE-based carbide), oxides, aluminides:

WC, $Ta_xC_y$ (eg. $Ta_2C$), SiC, VC, $B_4C$, $Cr_3C_2$, TiC, BN, TiN, $TiB_2$, MgO, ZrO, BeO, $Al_2O_3$, $TM_aB_b$, TiAl, $TM_aAl_b$, (Ti—Al, Fe—Al, Nb—Al), $SiC_xN_y$ (powders), $TM_{1-x}Ta_x$ alloys, $TiO_2$, $SrTiO_3$, $KNbO_3$, $MoSi_2$, TiNi, $TiB_2$, TiC, $Si_3Ni_4$, TiC, TiN, TiC—MgO composites, $CrO_2$, $CrB_2$, VC, $Al_2O_3$, SiC, SiAlON and Cr-base, Zr-base Nb-base, Ta-base, Hf-base, V-base, Ti-base, Mo-base and W-base alloys and/or 2.2.8 an Mg- and/or Al-alloy according to one or more of embodiments 2. to 2.27, characterized in that the weight ratio of hard and eventually brittle precursors to a ductile precursor ranges from 0.01 to 60 wt. %, in particular from 0.05 to 30 wt. % and/or 2.2.9 an Mg- and/or Al-alloy according to one or more of embodiments 2. to 2.28, characterized in that at least one of the ductile precursor is pure Mg and/or a terminal Mg-alloy and/or Mg-base alloying containing more than 50 at. % Mg and/or 2.2.10 an Mg- and Al-alloy according to embodiment 2.2.8 and/or 2.2.9, characterized in that the ductile precursor is represented by at least one of the constituents shown in Table 11 characterized as "ductile" and/or with elongation-to-fracture >1%, and/or any of the intermetallic compounds of embodiment 2.2.4 with an elongation-to-fracture >1%, and/or 2.3 an Mg- or Al-alloy according to one or more of embodiments 2., 2.1 to 2.2.10, characterized further in 2.3.1 that a substantial amount of at least one of the solutes of the alloying addition is held in the cph-solid solution or in any other metastable crystalline, quasi- and/or nano-crystalline or amorphous magnesium-based matrix phase, i.e. essentially in an homogeneous distribution of the alloying elements on an atomic length scale independent on the structure of the non-equilibrium (i.e. ne-) phase and/or 2.3.2 that the (micro-) structure consists of at least one of the characteristics given in embodiment 1.1 to 1.1.9 and/or 2.4 an Mg- or Al-alloy of a given (initial) alloy concentration according to one or more of embodiments 2., 2.1 to 2.3, characterized in that Mg- or Al-alloy is ball-milled by at least one of the following operating conditions and/or processing parameters:

2.4.1 an Mg- or Al-alloy according to one or more of embodiments 2., 2.1 to 2.3, made by ball-milling and milling with at least one (horizontally, vertically or oblique to gravity g operating) straight bar and/or rod, the cross-section of the balls and bar(s) either round (cf. FIG. 140) and/or rectangular and/or multifaceted and or irregular shaped and/or with irregular shaped impact bodies, and/or 2.4.2 an Mg- or Al-alloy according to one or more of embodiments 2., 2.1 to 2.4.1, by employing a horizontal and/or vertical and/or oblique vibrating milling technique and/or attritor milling technique with horizontally, vertically or oblique operating milling impellers or shafts and/or planetary ball milling technique with and without coupled rotation (velocity) of the relatively large holder disc and the relatively small milling containers (vials) and/or a corresponding tumbling ball milling technique and/or horizontal ball milling in the temperature range from −200° C. to the Kauzmann temperature for glass transition+(0 to 200K) and/or 2.4.3 an Mg- or Al-alloy according to one or more of embodiments 2., 2.1 to 2.4.2, characterized in that it is synthezised by planetary ball milling employing $\omega^2 r^*/\Omega^2 R$-ratios in the range from 0.01 to 1.5, in particular from 0.1 to 1.0 and/or 2.4.4 an Mg- or Al-alloy according to embodiment 2.4.3, characterized in that the employed planetary ball mill is characterized by a coupling factor $k_{106/\omega}$ in the range from 0.05 to 4.0, in particular from 0.2 to 1.5 and/or 2.4.5 an Mg- or Al-alloy according to one or more of embodiments 2., 2.1 to 2.4.4, characterized in that the milling operation is carried out with an effective impact power P* in the range of 0.02 to 2000 W/g, in particular in the range 0.05 to 500 W/g and/or 2.4.6 an Mg- or Al-alloy according to one or more of embodiments 2., 2.1 to 2.4.5, characterized in that the effective impact energy of milling balls employed ranges from 0.01 to 100 J/impact, in particular from 0.02 to 50 J/impact and/or 2.4.7 an Mg- or Al-alloy according to one or more of embodiments 2., 2.1 to 2.4.6, characterized in that the employed impact frequency of milling balls and/or milling bars employed ranges from 0.2 to 140 Hz, in particular from 0.5 to 80 Hz and/or 2.4.8 an Mg- or Al-alloy according to one or more of embodiments 2., 2.1 to 2.4.7, characterized in that the ratio of friction-to-shock power of the overall impact power employed ranges from 0.01 to 100%, in particular from 1.0 to 98% and/or 2.4.9 an Mg- or Al-alloy according to one or more of embodiments 2., 2.1 to 2.4.8 characterized in that milling cycles with minimized ratios of friction-to-shock powers are employed as a function of milling time in order to minimize friction and/or heating and/or caking and/or the milling time required to obtain a given volume fraction of corresponding non-equilibrium (i.e. ne-) Mg- or Al-base matrix phase, and/or 2.4.10 an Mg- or Al-alloy according to one or more of embodiments 2., 2.1 to 2.4.9, characterized in that the milling cycles with high ratios of shock-to-friction powers in the range from 50 to 100%, in particular from 80 to 100% are employed at any time during the overall milling cycle, the temperature thereby ranging up to temperatures characterized by the Kauzmann criterion for glass transition+(0 to 200° C.) limiting the upper milling temperature while the lowest temperature is −200° C. which is employed by an appropriate chill system and/or 2.4.11 an Mg-and Al-alloy according to one or more of embodiments 2., 2.1 to 2.4.10, characterized in that the overall milling period required to achieve the structural ne-state ranges from between 0.2 to 250 hours, in particular to between 0.3 to 40 hours depending on the tolerable volume fraction of second phases and/or dispersions in the as-milled state of the milled (powder) end-product and/or 2.4.12 an Mg-and Al-alloy according to one or more of embodiments 2., 2.1 to 2.4.11, characterized further in that during the first 0 to 15 h, in particular during the first 0 to 2 h at least one milling cycle is employed with a ratio in friction-to-shock power ranging from 40 to 100%, in particular from 50 to 95%, the milling operation thereby eventually chilled by a cooling system, and/or 2.4.13 an Mg-and Al-alloy according to one or more of embodiments 2., 2.1 to 2.4.12, characterized in that the employed planetary and/or horizontal and/or attritor and/or vibrating ball mill (container) is characterized by a distance and/or milling container radius $R(R_A)$ in the range from 0.05 to 4 m, in particular from 0.075 to 2 m and/or 2.4.14 an Mg-and Al-alloy according to one or more of embodiments 2., 2.1 to 2.4.13, characterized in that the employed radius of the milling container (vial) of the planetary ball mill ranges from 0.01 to 2 m, in particular from 0.02 to 1.0 m, and/or 2.4.15 an Mg-and Al-alloy according to one or more of embodiments 2., 2.1 to 2.4.14, characterized in that the rotational speed of the large holder disc of the planetary ball mill as is characterized by distance R, i.e. $\Omega$, ranges from 10 to 1000 rpm, in particular from 15 to 1000 rpm, and/or 2.4.16 an Mg-and Al-alloy according to embodiment 2.4.15, characterized in that the rotational speed of the milling container (vial) as characterized by the vial radius r, i.e. $\omega$, ranges from 10 to 1500 rpm, in particular from 15 to 1000 rpm, and/or 2.4.17 an Mg-and Al-alloy according to one or more of embodiments 2., 2.1 to 2.4.16, characterized in that the milling operation was performed by using a lubricating agent in particular an hydrocarbon of the series $C_nH_{2n+2}$ such as hexan(e) and/or a silan-type of lubricant such as $SiH_4$, ethine $(C_2H_2)$, and/or ethylen $(C_2H_4)$, and/or $C_3H_6$ and/or metallo-hydrogens of one or more of the alloying additions of embodiment 2.4 including phosphine $(PH_3)$ and/or 2.4.18 an Mg-and Al-alloy according to one or more of embodiments 2., 2.1 to 2.4.17, characterized in that the milling operation was performed by using a lubricating agent, in particular an alcohol such as methanol, ethanol, amylalcohols, glycols, glycerine, phenols, aldehydes, ketons, in particular Grignard-type of reaction products such as primary, secondary and tertiary alcohols and/or light oils and/or silicon oils and/or graphite and/or 2.4.19 an Mg-and Al-alloy according to one or more of embodiments 2., 2.1 to 2.4.18,characterized in that the quantity of the lubricating agent ranges from 0.001 to 15 wt. %, in particular from 0.01 to 8 wt. % relative to the initial precursor charge and/or 2.4.20 an Mg-and Al-alloy according to one or more of embodiments 2., 2.1 to 2.4.19, characterized in that the filling fraction $f_{nb}$ of the (at least one) milling container (vial) of planetary ball mills with milling balls and that of horizontal ball mills ranges from 0.01 to 0.7, in particular from 0.02 to 0.5, and/or that of attritor and vibrating ball mills from 0.3 to 1.0, in particular from 0.5 to 0.95 and/or 2.4.21 an Mg-and Al-alloy according to one or more of embodiments 2., 2.1 to 2.4.20, characterized in that
2.4.21.1 the individual and/or average radius of the employed milling balls and milling bars and/or rods including attritor impellers ranges from 2 to 60 mm, in particular from 3 to 300 mm, and/or
2.4.21.2 in that the geometry of the cross-section of the employed milling balls and milling bars is characterized by one of the geometrical elements and/or similar derivatives shown in FIG. 140 and/or 2.4.22 an Mg-and Al-alloy according to one or more of embodiments 2., 2.1 to 2.4.21, characterized in that the individual and average density of the milling balls and milling bars (rods) including attritor impellers ranges from 1.85 to 21.0 $g/cm^3$, in particular from 2.6 to 17 $g/cm^3$ including those materials to be introduced into Mg- and Al-alloys as an alloying element by being consumed away via friction and abrasion, for example, 2.4.23 an Mg-and Al-alloy according to one or more of embodiments 2., 2.1 to 2.4.22, characterized in that the massive bulk of the milling balls and/or milling bars and/or rods including attritor impellers, (irregular) and/or milling bodies and/or a (PVD- and/or CVD-) coating on the milling balls, bars and/or rods including attritor impellers and/or (irregular) milling bodies consists of at least one of the following materials, i.e. $SiO_2$, "Syalon" (90% $Si_3N_4$), sintered corundum (99.7% $Al_2O_3$), tungsten carbide 96% WC+3% Co), hardened Cr-steel, stainless Cr—Ni-steel, Teflon with core of steel and 97% pure zirconia $(ZrO_2)$, ZrC, TiC, NbC, $V_2C$, $Cr_{23}C_6$, $Cr_7C_3$, $Mo_2C$, $Cr_3C_2$, WC, MoC, $W_2C$, $Mn_3C$, intermetallics (Ti—Al, Fe—Al, Nb—Al), $SiC_xN_y$, non-equilibrium $Cu_{1-x}Ta_x$ alloys, (nanocrystalline) oxides such as $TiO_2$, $SrTiO_3$, $KNbO_3$, dense $MoSi_2$, TiNi, $TiB_2$, TiC, $Si_3Ni_4$, TiC, TiN, $TiO_2$, TiC—MgO composites, $CrO_2$, $CrB_2$, VC, Fe3C, $Al_2O_3$, SiC, SiA-lON and Cr-base and/or bearing, Nb-base and/or bearing, Ta-base and/or bearing, Ti-base and/or bearing, Zr-base and/or bearing and/or W-base and/or bearing intermetallics and/or corresponding alloys or any other material based on those shown in Table 11 such as BN, TaC, $Ta_xC_y$, WC, $W_xC_y$, as well as (and/or) TiCN, AlN, $Ni_xB_y$, nitrided Fe—Al-alloys and/or steels and/or stainless steels, and/or 2.4.24 an Mg-and Al-alloy according to one or more of embodiments 2., 2.1 to 2.4.23, characterized in that the surface (coating(s)) and/or the (massive) interior of the wall(s) of the employed milling containers (vial(s)) consist(s) of at least one of the materials embodimented in embodiment 2.4.23, and/or 2.4.25 an Mg-and Al-alloy according to one or more of embodiments 2., 2.1 to 2.4.24, characterized in that the individual and/or average mass of the milling balls ranges from 0.15 to 11000 g, in particular from 1 to 50 g and/or 2.4.26 an Mg-and Al-alloy according to one or more of embodiments 2., 2.1 to 2.4.25, characterized in that the ratio of the mass of the milling balls to the mass of the (initial precursor) charge ranges from 2:1 to 40:1, in particular from 5:1 to 15:1 and/or 2.4.27 an Mg-and Al-alloy according to one or more of embodiments 2., 2.1 to 2.4.26, characterized in that the milling operation is carried out without artificial heating system and/or 2.4.28 an Mg-and Al-alloy according to one or more of embodiments 2., 2.1 to 2.4.27, characterized in that the milling operation is assisted by an artificial heating (such as via a Joule-effective system) and/or 2.4.29 an Mg-and Al-alloy according to one or more of embodiments 2., 2.1 to 2.4.28, characterized in that the milling operation comprises at least one milling cycle with in-situ heating via large ratios of friction-to-shock power of the overall impact power and/or via artificial heating such as via a Joule-effective system and/or 2.4.30 an Mg-and Al-alloy according to one or more of embodiments 2., 2.1 to 2.4.29, characterized in that the employed heating rate of the mean temperature of corresponding milling container during a heating cycle according to embodiment 2.4.29 ranges from 0.1 to 80 K/min, in particular from 0.2 to 40 K/min, the lower temperature in the range between −200K and ambient temperature, the higher temperature in the range between −50° C. and the Kauzmann temperature for glass transition plus (0 to 200° C.) and that the at least one milling cycle at higher temperatures lasting for 0.1 to 40 hours, in particular for 0.2 to 10 hours and/or 2.4.31 an Mg-and Al-alloy according to one or more of embodiments 2., 2.1 to 2.4.30, characterized in that the employed cooling rate of the mean temperature of corresponding milling container after a heating cycle according to embodiment 2.4.29 and for milling at temperatures lower than ambient ranges from 0.1 to 80 K/min, in particular from 0.2 to 40 K/min, the lower temperature in the range between −200K and ambient temperature, and that the at least one milling cycle at lower temperatures lasting for 0.1 to 100 hours, in particular for 0.2 to 10 hours and/or 2.4.32 an Mg-and Al-alloy according to one or more of embodiments 2., 2.1 to 2.4.31, characterized in that a (separate) annealing treatment without (in-situ) ball milling is employed, in particular the annealing treatments performed for 0.5 to 16 hours at temperatures in the range from 150° to 550° C. at any time during and/or after the entire milling operation and/or 2.4.33 an Mg- or Al-alloy according to one or more of embodiments 2., 2.1 to 2.4.32, characterized in that a solution heat treatment at temperatures as to embodiment 1.14 is applied and/or 2.4.34 an Mg- or Al-alloy according to one or more of embodiments 2., 2.1 to 2.4.33, characterized in that a thermomechanical treatment is employed, the thermo-mechanical treatment being a combination of a solution treatment as to embodiment 2.4.33 and an extrusion and/or a forging and/or a drawing and/or a superplastic forming operation as to embodiment 12 is employed and/or 2.5 an Mg- and/or Al-alloy according to one or more of embodiments 2., 2.1 to 2.4.34, characterized by a (cph- or a metastable crystalline, quasi- and/or nanocrystalline and/or amorphous) matrix grain and/or cell size in the range from 0.02 to 50 µm, in particular in the range from 0.1 to 10 µm and/or 2.6 an Mg- and/or Al-alloy according to one or more of embodiments 2., 2.1 to 2.5, characterized by a (cph- or a metastable crystalline, quasi- and/or nanocrystalline and/or amorphous) matrix grain and/or cell size in the range from 0.01 to 15 µm, in particular in the range from 0.03 to 3.0 um and/or 2.7 an Mg- and/or Al-alloy according to one or more of embodiments 2., 2.1 to 2.6, characterized by a volume fraction of intermetallics of the type $Mg_a(TM)_b(RE)_c(met)_d(SM)_e$ where TM, RE, met and SM are defined according to embodiment 2.2.4, and a=0–99, b=0–99, c=0–99, d=0–99 and e=0–99 and/or at least one of the elemental β-solutes, the volume fraction ranging from 0.01 vol. %–30 vol. %, in particular from 0.05 vol. %–20 vol. % and/or 2.8 an Mg- and/or Al-alloy according to one or more of embodiments 2., 2.1 to 2.7, characterized by an intra- and/or transgranular intermetallic phase with a one-dimensional length scale (circumference, diameter, maximum 1-dim extension) in the range of 0.1–30 µm, in particular in the range from 0.5 to 15 µm, and/or 2.9 an Mg- and/or Al-alloy according to one or more of embodiments 2., 2.1 to 2.7, characterized by an intra- and/or transgranular intermetallic phase with a one dimensional length scale (circumference, diameter, maximum 1-dim extension) in the range of 0.02–3 µm, in particular in the range from 0.03 to 1 µm, and/or 2.10 an Mg-and/or Al-alloy according to one or more of embodiments 2., 2.1 to 2.7, characterized by an intra- and/or transgranular intermetallic or metastable (crystalline, quasi-crystalline and/or amorphous) phase with a one-dimensional length scale (see 2.9) in the range of 0.01–0.1 µm, in particular in the range from 0.015 to 0.08 µm, and/or 2.11 an Mg- and/or Al-alloy according to one or more of embodiments 2., 2.1 to 2.10, characterized by a virtual absence of porosity and/or 2.12 an Mg- and/or Al-alloy according to one or more of embodiments 2., 2.1 to 2.11, characterized by a virtual absence of porosity after a thermo-mechanical treatment as to 2.4.3 and/or 2.13 an Mg- and/or Al-alloy according to one or more of embodiments 2., 2.1 to 2.12, characterized by a maximum porosity after the final forming operation ranging from 0.001 to 3 vol. %, in particular ranging from 0.01 to 0.5 vol. %, and/or 2.14 an Mg- and/or Al-alloy according to one or more of embodiments 2., 2.1 to 2.12, characterized by a maximum pore size after the final forming operation ranging from 0.05 to 25 µm, in particular ranging from 0.08 to 5 µm, and/or 2.15 an Mg- and/or Al alloy according to one or more of embodiments 2., 2.1 to 2.12, characterized by a maximum pore size after the final forming operation ranging from 0.01 to 10 µm, in particular ranging from 0.02 to 1 µm, and/or 2.16 an Mg- and/or Al-alloy according to one or more of embodiments 2., 2.1 to 2.15, characterized by a content of impurities Fe, Ni, Cu, Si, Na and $O_2$ ranging from a factor of 0.1 to 10 compared to those levels currently accepted in the established high purity AZ- and AM-type of magnesium alloys made by casting from the liquid state, in particular, ranging from a factor 0.2 to 5 of the levels of Fe, Ni, Cu, Si, Na and $O_2$ usually accepted in the established high-purity AZ- and AM-type of magnesium alloys and/or 2.17 an Mg- and/or Al-alloy according to one or more of embodiments 2., 2.1 to 2.16, characterized by an impurity level (by weight %) introduced by feed-stock and/or processing amounting to with a minimum level as given in embodiment 1.29, but characterized further by a maximum impurity level of 0.01 Ni and/or 0.1 Cu and/or 0.1 Fe, in particular 0.05 Fe and/or 0.2 Co and/or 0.2 Si and/or 0.2 B and/or 0.02 Na and/or 0.1 Ca and/or 0.1 K and/or 3.0 C and/or 0.1 Cd and/or 0.1 Zn and/or 0.1 Pb an/or 0.1 Sn and/or 3.0 O (oxygen), in particular 0.05 to 2.0 oxygen and/or 2.18 an Mg- and/or Al-alloy according to one or more of embodiments 2., 2.1 to 2.17, characterized by a level of Ni, Cu, Fe, Co, Si, Na and/or Pb which is not substantially increased further by the milling operation compared to the feed stock due to the use of a shock- and/or wear-resistant and/or particularly hardened steel, refractory metal and/or refractory alloy and/or intermetallic phase as ball mill container material and/or ball mill container inner wall material and/or milling ball material, in particular tantalum, and/or 2.19 an Mg- and/or Al-alloy according to one or more of embodiments 2., 2.1 to 2.18, characterized by an impurity (Fe, Cu, Ni, Si, Co etc., cf. embodiment 2.17) inclusion size with a one-dimensional length scale (circumference, diameter, maximum 1-dim extension) in the range from 0.02–5 µm, in particular in the range from 0.05 to 1 µm and/or 2.20 an Mg- and/or Al-alloy according to one or more of embodiments 2., 2.1 to 2.18, characterized by an impurity (Fe, Cu, Ni, Si, Co etc., cf. embodiment 2.17) with a one-dimensional length scale (see embodiment 2.19) in the range of 0.01–0.5 µm, in particular in the range from 0.02 to 0.3 µm and/or 2.21 an Mg- and/or Al-alloy according to one or more of embodiments 2., 2.1 to 2.20, characterized by a level of $O_2$ which is not excessively increased further by the milling and/or powder handling operation compared to the feed stock due to the use of an inert gas atmosphere such as argon and/or nitrogen, in particular of an argon and/or nitrogen atmosphere of purity 4N8 and/or 5N, in order to protect the mechanically alloyed powder during the milling operation (which is performed at temperatures between −200° C. and 300° C., in particular at between −50° to 140° C.) in the milling cylinder and during opening/exposure of the powder to another (inert gas) atmosphere during preparation of hot and/or cold forming operations and during these operations themselves, the inert gas atmosphere used to protect the mechanically alloyed Mg-alloy powder against excessive oxidation and thereby being eventually purged continuously through a hot getter material such as a Cu- and/or Ta-grid to avoid even better oxidation and resulting oxide dispersions and/or fibre-type of oxides and/or oxidation layers in the final (eventually very fine) powders and/or product from mechanically alloyed powders, and/or 2.22 an Mg- and/or Al-alloy according to one or more of embodiments 2., 2.1 to 2.21, characterized by containing MgO and oxides involving alloying constituents (both e.g. as an impurity inclusion) with a one-dimensional length scale (see embodiment 2.19) in the range of 0.01–5 µm, in particular in the range from 0.02 to 0.5 µm and/or 2.23 an Mg- and/or Al-alloy according to one or more of embodiments 2., 2.1 to 2.22, characterized by a level of $O_2$ which is increased in a controlled manner to an oxygen content of up to 3 wt. % due to the controlled use of an inert gas atmosphere (in particular argon and/or nitrogen) eventually doped deliberately with oxygen to protect and/or reinforce the (as-)milled powder particles and/or 2.24 an Mg- and/or Al-alloy according to one or more of embodiments 2., 2.1 to 2.23, characterized by containing MgO-particles and oxides involving at least one alloying constituents, both type of oxides e.g. as an impurity inclusion with a one-dimensional length scale (see embodiment 2.19) in the range of 0.01–5 µm, in particular in the range from 0.02 to 0.5 µm.

3$^{rd}$ embodiment A magnesium based alloy containing an element belonging to the "yttrics" (except of yttrium itself) with 0.1 wt. % solute to corresponding levels of approximately maximum equilibrium solid solubility, i.e.:

12. to 20 wt. % Sc in cph-Mg, in particular 0.5 to 15.0 wt. % Sc in cph-Mg, balance impurities, or 0.1 to 7 wt. % Sm in cph-Mg, in particular 0.5 to 5.5 wt. % Sm in cph-Mg, balance impurities, or 12.1 to 5 at. % Gd in cph-Mg, in particular 0.5 to 4.53 at. % Gd in cph-Mg, balance impurities, or 0.1 to 7 at. % Dy in cph-Mg, in particular 0.5 to 6.0 at. % Dy in cph-Mg, balance impurities, or 0.1 to 6 at. % Ho in cph-Mg, in particular 0.5 to 5.44 at. % Ho in cph-Mg, balance impurities, or 0.1 to 7 at. % Tm in cph-Mg, in particular 0.5 to 6.3 at. % Tm in cph-Mg, balance impurities, or 0.1 to 8 at. % Er in cph-Mg, in particular 0.5 to 6.9 at. % Er in cph-Mg, balance impurities, or 0.1 to 9 at. % Lu in cph-Mg, in particular 0.5 to 8.5 at. % Lu in cph-Mg, balance impurities, or 0.1 to 6 at. % Tb in cph-Mg, in particular 0.5 to 4.6 at. % Tb in cph-Mg, balance impurities, or transition metals with a at least some liquid and solid solubility in Mg and at the same time known to improve the corrosion resistance of magnesium and/or magnesium alloys, i.e.

0.1 to 2.5 wt. % Zr in cph-Mg, in particular 0.5 to 2.0 wt. % Zr in cph-Mg, balance impurities, or 0.1 to 3.0 wt. % Mn in cph-Mg, in particular 0.5 to 2.2 wt. % Mn in cph-Mg, balance impurities, the aforementioned alloys characterized in that:

3.1 they are made from the liquid state by casting and/or thin-strip casting and/or thin-wall and/or pressure-die casting and/or spray forming (spray deposition) and/or rapid solidification and/or atomization to optimize the grain boundary strengthening effect, for example, so to result in cross-sections in the range from 200 nm to 500 mm, in particular in cross-sections from 1 µm to 50 mm and/or laser glazing (surface re-melting) and/or 3.2 an Mg-alloy according to one or more of embodiments 3. to 3.1, characterized further in that the alloying additions to cph-magnesium is substantially held in the equilibrium or non-equilibrium solid solution of cph-magnesium and/or 3.3 an Mg-alloy according to one or more of embodiments 3. to 3.2, the alloying additions are held in solid solution and characterized further in that corresponding microstructure was attained 3.3.1 in the as-solidified state due favorable solidification kinetics, i.e. equilibrium partition coefficients $k_0$ relatively (compared to the other Mg binary systems) close to unity where $k_0$ is the ratio of liquidus-to-solidus concentration of a given (initial) alloy concentration $c_0$, and/or 3.3.2 after a solution heat treatment at temperatures at or in the vicinity of corresponding eutectic or peritectic temperatures including tolerance limits due to experimental error in phase diagram assessment and/or scale effect of microstructure on the characteristic temperatures, i.e. for the:

Mg—Sc alloys at 0.7 to 0.99*983+/−3 K, in particular at 0.8 to 0.95*983+/−3 K or Mg—Sm alloys at 0.7 to 1.05*815+/−3 K, in particular at 0.8 to 1.03*815+/−3 K or Mg—Gd alloys at 0.7 to 1.05*819+/−3 K, in particular at 0.8 to 1.03*819+/−3 K or Mg—Dy alloys at 0.7 to 1.05*823+/−4 K, in particular at 0.8 to 1.03*823+/−4 K or Mg—Ho alloys at 0.7 to 1.05*838+/−4 K, in particular at 0.8 to 1.03*838+/−4 K or Mg—Tm alloys at 0.7 to 1.05*858+/−4 K, in particular at 0.8 to 1.03*858+/−4 K or Mg—Er alloys at 0.7 to 1.0*857+/−4 K, in particular at 0.8 to 1.03*857+/−4 K or Mg—Lu alloys at 0.7 to 1.0*889+/−4 K, in particular at 0.8 to 1.03*889+/−4 K or Mg—Tb alloys at 0.7 to 1.05*832+/−4 K, in particular at 0.8 to 1.03*832+/−4 K or Mg—Zr alloys at 0.7 to 0.99*973 K, in particular at 0.8 to 0.95*973 K or Mg—Mn alloys at 0.7 to 0.99*971 K, in particular at 0.8 to 0.95*971 K and/or 3.3.3 after a thermo-mechanical treatment and/or hot forming operation at temperatures according to the solutionizing heat treatment regime in 3.3.2 and/or 3.4 an Mg-alloy according to one or more of embodiments 3., 3.1 to 3.3.3, characterized by a (cph-matrix) grain size in the range from 3 to 250 μm, in particular in the range from 5 to 50 μm and/or 3.5 an Mg-alloy according to one or more of embodiments 3. to 3.4, characterized by a (cph-matrix) grain (high angle boundary) and/or cell (low angle boundary) size in the range from 0.2 to 10 μm, in particular in the range from 0.5 to 8 μm and/or 3.6 an Mg-alloy according to one or more of embodiments 3. to 3.5, characterized by a volume fraction of intermetallics of the type $Mg_a(yttrics)_b$ or elemental βZr or βMn ranging from 0.01 vol. %–20 vol. % of the volume fraction corresponding to the equilibrium volume fraction of corresponding alloys, in particular ranging from 0.05 vol. %–10 vol. % of the volume fraction corresponding to the equilibrium volume fraction of corresponding alloys where "a" ranging from 5 to 25 and "b" ranging from 1 to 6 and/or 3.7 an Mg-alloy according to one or more of embodiments 3. to 3.6, characterized by an intra- and/or transgranular intermetallic phase of a one-dimensional length scale (circumference, diameter, maximum 1-dim extension) in the range from 1 to 50 μm, in particular in the range from 2 to 35 μm and/or 3.8 an Mg-alloy according to one or more of embodiments 3. to 3.7, characterized by an intra and/or transgranular intermetallic phase of a one-dimensional length scale (see embodiment 3.7) in the range from 0.01 to 8.0 μm, in particular in the range from 0.1 to 1.0 μm and/or 3.9 an Mg-alloy according to one or more of embodiments 3. to 3.8, characterized by virtual absence of porosity and/or 3.10 an Mg-alloy according to one or more of embodiments 3. to 3.9, characterized by virtual absence of porosity due to a thermo-mechanical treatment as to 3.3.3 and/or 3.11 an Mg-alloy according to one or more of embodiments 3. to 3.10, characterized by a maximum porosity after pressure die-casting or after the final forming operation ranging from 0.05 to 3 vol. %, in particular from 0.5 to 2 vol. %, and/or 3.12 an Mg-alloy according to one or more of embodiments 3. to 3.11, characterized by a maximum pore size after pressure-die-casting or after the final forming operation ranging from 0.05 to 10 μm, in particular from 0.1 to 5 μm, and/or 3.13 an Mg-alloy according to one or more of embodiments 3. to 3.12, characterized by a content of impurities Fe, Ni, Cu, Si, Na and $O_2$ ranging from a factor of 0.1 to 10 compared to those levels currently accepted in the established high purity AZ- and AM-type of magnesium alloys made by casting from the liquid state, in particular ranging from a factor 0.2 to 5 of the levels of Fe, Ni, Cu, Si, Na and 0 usually accepted in the established high-purity AZ- and AM-type of magnesium alloys and/or 3.14 an Mg-alloy according to one or more of embodiments 3. to 3.13, but characterized by an impurity level (by weight %) as for embodiment 1.29 and/or 3.15 an Mg-alloy according to one or more of embodiments 3. to 3.14, characterized by a level of Fe, Ni, Cu, Co, Na, K, C, Cd, Zn, Pb, Sn, B and Si which is not increased further by the melting operation compared to the employed feed stock due to the use of inert refractory metal, alloy and/or intermetallic phases in contact with condensed alloy constituents (e.g. as crucible material), and in particular due to the use of tantalum (-based) materials, and/or 3.16 an Mg-alloy according to one or more of embodiments 3. to 3.15, characterized by a level of $O_2$ which is essentially not increased further by the melting operation compared to the oxygen level of the feed stock, in particular not more than by a factor of 5 due to the use of an inert gas atmosphere (in particular argon and/or nitrogen), high quality sealing and/or a getter vapor to purge the equipment prior to start the vapor deposition process and/or 3.17 an Mg-alloy according to one or more of embodiments 1. to 3.16, characterized by a size of an impurity inclusion (containing Fe, Ni, Cu, Co, Na, K, C, Cd, Zn, Pb, Sn, B, Si and oxides etc., -cf. embodiment 1.28–1.31) with a one-dimensional length scale (circumference, diameter, maximum 1-dim extension) in the range of 1–50 μm, in particular in the range from 2 to 35 μm and/or 3.18 an Mg-alloy according to embodiment 3.17, characterized by a size of an impurity inclusion in the range from 0.04 to 5.0 μm, in particular in the range from 0.05 to 2.0 μm or in particular in the range from 0.1 to 1.0 μm and/or 3.19 an Mg-based alloy according to one or more of the embodiments 3. to 3.18 characterized in that the alloy further contains ternary and/or higher order alloying elements, i.e.

up to 5 wt. % lanthalum (La), in particular 0.1 to 2.0 wt. % La and/or up to 5 wt. % cerium (Ce), in particular 0.1 to 2.0 wt. % Ce and/or up to 5 wt. % praesodynium (Pr), in particular 0.1 to 2.0 wt. % Pr and/or up to 5 wt. % neodymium (Nd), in particular 0.1 to 2.0 wt. % Nd and/or up to 5 wt. % light rare earth misch-metal (LRE-MM), in particular 0.1 to 2.0 wt. % LRE-MM, the misch-metal thereby in particular of compositions stemming from and/or corresponding to the ore composition of Monazite-, Bastnaesite- and Xun Wu-type of RE-ores, but in any case being dominated by corresponding compounds of La, Ce, Nd and Pr and, as a misch-metal, containing 5–97% La by weight, 5–97% Ce by weight and 5–98% (Nd+Pr) by weight, balance other rare earth metals such as Gd and Tb, but also Y, and the sum of (La, Ce, Nd and Pr) totaling 40–100% by weight, in particular 80–99% by weight, and/or up to 8 wt. % aluminum (Al), in particular 0.2 to 5.0 wt. % Al and/or up to 5 wt. % alkaline earth metal (AE) and up to 8 wt. % aluminum (Al), in particular 0.5 to 4.0 wt. % AE and 1 to 5 wt. % Al and/or up to 5 wt. % alkaline earth metal (AE) and up to 8 wt. % gallium (Ga), in particular 0.5 to 4.0 wt. % AE and 1 to 5 wt. % Ga and/or up to 5 wt. % calcium (Ca) and up to 8 wt. % aluminum (Al), in particular 0.1 to 4.0 wt. % Ca and 0.3 to 5 wt. % Al and/or up to 5 wt. % strontium (Sr) and up to 8 wt. % aluminum (Al), in particular 0.1 to 4.0 wt. % Sr and 0.3 to 5 wt. % Al and/or up to 5 wt. % barium (Ba) and up to 8 wt. % aluminum (Al), in particular 0.1 to 4.0 wt. % Ba and 0.3 to 5 wt. % Al and/or up to 5 wt. % calcium (Ca) and up to 8 wt. % gallium (Ga), in particular 0.1 to 4.0 wt. % Ca and 0.3 to 5 wt. % Ga and/or up to 5 wt. % strontium (Sr) and up to 8 wt. % gallium (Ga), in particular 0.1 to 4.0 wt. % Sr and 0.3 to 5 wt. % Ga and/or up to 5 wt. % barium (Ba) and up to 8 wt. % gallium (Ga), in particular 0.1 to 4.0 wt. % Ba and 0.3 to 5 wt. % Ga and/or up to 5 wt. % zinc (Zn), in particular 0.5 to 4.0 wt. % Zn for the Mg-"yttrics"-based alloys of embodiment 1, also and/or up to 5 wt. % manganese (Mn), in particular 0.1 to 2.0 wt. % Mn and/or up to 2 wt. % zirconium (Zr), in particular 0.1 to 1.8 wt. % Zr.

$4^{th}$ Embodiment. A Mg-based alloy according to one or more of the embodiments 1. to 2.24 characterized in that the alloy further contains ternary and/or higher order alloying elements, i.e. within which the individual proportional limits by weight are as following:

4.1 metastable (non-equilibrium) Mg-base matrix phases including the (extended) solid solutions of rare earth metals and MM in Mg according to one or more of the embodiments 1. to 2.24, but also containing ternary and higher order alloying additions such as (if comma between elements, read "and/or" for embodiments 4.1 to 4.7):

a)—0.1 to 16 wt. % Al, in particular 0.5 to 6 wt. % Al, and b)—0.0 to 8 wt. % Ca, Sr and/or Ba, in particular 0.2 to 3 wt. % Ca, Sr and/or Ba, and/or c)—0.0 to 4 wt. % Zn, In, Sn and/or Pb in particular 0.2 to 2 wt. % Zn, In, Sn and/or Pb and/or d)—0.0 to 10 wt. % Si, Ge, B, Be and/or Sb, in particular 0.2 to 5 wt. % Si, Ge, B, Be an/or Sb and/or e)—0.0 to 12 wt. % V, Ti, Zr, Mn, Cr, Nb, Mo, Hf, Re, W and/or Ta, in particular 0.2 to 6 wt. % V, Ti, Zr, Mn, Cr, Nb, Mo, Hf, Re, W and/or Ta, balance magnesium and impurities, aimed at a partial transformation to very fine dispersions of precipitates (in particular <100 nm) after the final alloy conversion and/or forming operation via synergistic formation from a combination of higher order alloying additions and resulting metastable (non-equilibrium) Mg-base matrix phases possible between sub-groups a) to e), in particular an alloy containing 0.2 to 14 wt. % MM, Ce, La, Pr, Nd, Sm, Gd, Dy, Ho and/or Er according to one or more of the embodiments 1. to 2.24, and of 0.5 to 8 wt. % Al and of 0.1 to 4 wt. % Ca, Sr and/or Ba, and of 0.2 to 10 wt. % V, Ti, Zr, Mn, Cr, Nb, Mo, Hf, Re, W and/or Ta, balance magnesium and impurities, the alloys in any case not exceeding a density of 2.7 g/cm$^3$, and/or:

4.2 metastable (non-equilibrium) Mg-base matrix phases including the (extended) solid solutions of rare earth metals and MM in Mg according to one or more of the embodiments 1. to 2.24, but also containing ternary and higher order alloying additions such as:

a)—0.1 to 30 wt. % V, Ti, Zr, Mn, Cr, Nb, Mo, Hf, Re, W and/or Ta in particular 0.3 to 15 wt. % V, Ti, Zr, Mn, Cr, Nb, Mo, Hf, Re, W and/or Ta or b)—as for a) but allowing for a combination of two or three of these transition metals with a common alloying level ranging from 0.3 to 30 wt. % and/or coexisting, at least substantially co-existing with the rare earth elements in extended solid solution or c)—as for a) or b), but also containing up to 15% Al by weight and/or d)—in particular an alloy with 0.0 to 12 wt. % MM as defined under embodiment 2, Ce, La, Pr, Nd, Sm, Gd, Dy, Ho and/or Er and of 0.1 to 8 wt. % Al and of 0.05 to 8 wt. % of transition metals as defined under a) of this 4.2-group of alloys, or e)—as for a) through d), but also containing 0.1 to 4 wt. % Si, Ge, B, Be and/or Sb balance magnesium and impurities, the alloys in any case not exceeding a density of 2.7 g/cm$^3$ to produce higher order metastable (non-equilibrium) Mg-base phases including extended solid solutions plus fine dispersions of precipitates (in particular <100 nm) after the final alloy conversion and/or forming operation via synergistic formation from a combination of higher order alloying additions to Mg as is possible between sub-groups a) to e), in particular an alloy containing 0.0 to 10 wt. % Ce, La, Pr, Nd and/or Sm and of 0.0 to 8 wt. % V, Ti, Zr, Mn, Cr, Nb, Mo, Hf, Re, W and/or Ta balance magnesium and impurities, and/or f)—keeping any of the higher order additions possible from a combination of subgroups a) to e) in the metastable, essentially one-phase matrix including the (extended) solid solution of cph-Mg, or 4.3 a metastable Mg-TM base matrix alloy including non-equilibrium crystalline, quasi- and/or nano-crystalline and/or amorphous Mg-base matrix phases according to one or more of the embodiments 1. to 2.24, but also containing ternary and higher order alloying additions such as:

a)—0.2 to 15 wt. % Ce, La, Nd, Sm, Pr, Y and/or MM b)—0.0 to 10 wt. % Al, and/or c)—0.0 to 15 wt. % Si, Ge, B, Sb and/or Be and/or d)—0.0 to 8 wt. % Ca, Sr and/or Ba, balance magnesium and impurities, the alloys in any case not exceeding a density of 2.7 g/cm$^3$, to produce higher order metastable (non-equilibrium) Mg-base phases including extended solid solutions plus fine dispersions of precipitates (in particular <100 nm) after the final alloy conversion and/or forming operation via synergistic formation from a combination of higher order alloying additions to Mg and being embedded in and co-existing with metastable (non-equilibrium) Mg-base phases resulting from an alloy combination of sub-groups a) to d) of this 4.3-group of alloys, in particular an alloy containing 0.2 to 15 wt. % V, Ti, Zr, Mn, Cr, Nb, Mo, Hf, Re, W and/or Ta as defined under one or more of the embodiments 1. to 2.24, and also containing 0.5 to 6 wt. % Ce, Nd, La, Sm, Y and/or MM and 0.0 to 4 wt. % Al, and 0.0 to 3 wt. % Si, Ge, B, and/or Sb and/or 0.0 to 2 wt. % Ca, Sr and/or Ba, balance magnesium and impurities, and/or e)—keeping any of the higher order additions possible from a combination of subgroups a) to d) essentially in (extended) solid solution of cph-Mg or any other metastable non-equilibrium Mg-base phase in the final product, and/or:

4.4 a metastable Mg-metalloid (and/or Be and/or B) base alloy including non-equilibrium crystalline, quasi- and/or nano-crystalline and/or amorphous phases according to one or more of the embodiments 1. to 2.24, but also containing ternary and higher order alloying additions such as:

a)—0.2 to 25 wt. % Ce, La, Nd, Sm, Pr, Y and/or MM and
b)—0.1 to 20 wt. % V, Ti, Zr, Mn, Cr, Nb, Mo, Hf, Re, W and/or Ta
c)—0.0 to 10 wt. % Al, and/or
d)—0.0 to 8 wt. % Ca, Sr and/or Ba,
balance magnesium and impurities, the alloys in any case not exceeding a density of 2.7 g/cm³ to produce higher order metastable (non-equilibrium) Mg-base phases including extended solid solutions plus fine dispersions of precipitates (in particular <100 nm) after the final alloy conversion and/or forming operation via synergistic formation from a combination of higher order alloying additions to Mg and which are embedded in metastable (non-equilibrium) phases resulting from an alloy combination of sub-groups a) to d) of this 4.4-group of alloys, in particular an alloy containing 0.1 to 20 wt. % B and/or Si and/or Si and 0.2 to 15 wt. % V, Ti, Zr, Mn, Cr, Nb, Mo, Hf, Re, W and/or Ta as defined under one or more of the embodiments 1. to 2.24, and also containing 0.0 to 6 wt. % Ce, Nd, La, Sm, Y and/or MM and 0.0 to 4 wt. % Al, and 0.0 to 3 wt. % Si, Ge, B, and/or Sb and/or 0.1 to 2 wt. % Ca, Sr and/or Ba,
balance magnesium and impurities, and/or
e)—keeping any of the higher order additions possible from a combination of subgroups a) to d) essentially in solid solution of cph-Mg, and/or 4.5 a metastable Mg-metalloid (and/or Be and/or B) base alloy including non-equilibrium crystalline, quasi- and/or nano-crystalline and/or amorphous phases according to one or more of the embodiments 1. to 2.24, but also containing ternary and higher order alloying additions such as:

a)—0.1 to 20 wt. % V, Ti, Zr, Mn, Cr, Nb, Mo, Hf, Re, W and/or Ta
b)—0.0 to 15 wt. % Ce, La, Nd, Sm, Pr, Y and/or MM and
c)—0.0 to 10 wt. % Al, and/or
d)—0.0 to 8 wt. % Ca, Sr and/or Ba,
balance magnesium and impurities,
the alloys in any case not exceeding a density of 2.7 g/cm³ to produce higher order, metastable (non-equilibrium) Mg-base phases including extended solid solutions plus fine dispersions of precipitates (in particular <100 nm) after the final alloy conversion and/or forming operation via synergistic formation from a combination of higher order alloying additions to Mg and which are embedded in metastable (non-equilibrium) phases resulting from an alloy combination of sub-groups a) to d) of this 4.4-group of alloys, in particular an alloy containing 0.1 to 20 wt. % B and/or Si and/or Si and 0.2 to 15 wt. % V, Ti, Zr, Mn, Cr, Nb, Mo, Hf, Re, W and/or Ta as defined under one or more of the embodiments 1. to 2.24, and also containing 0.0 to 6 wt. % Ce, Nd, La, Sm, Y and/or MM and 0.0 to 4 wt. % Al, and 0.0 to 3 wt. % Si, Ge, B, and/or Sb and/or 0.1 to 2 wt. % Ca, Sr and/or Ba,
balance magnesium and impurities, and/or
e)—keeping any of the higher order additions possible from a combination of subgroups a) to d) essentially in solid solution of cph-Mg, and/or:

4.6 a metastable Mg- and/or Al-base early transition metal base alloy including non-equilibrium crystalline, quasi- and/or nano-crystalline and/or amorphous phases according to one or more of the embodiments 1. to 2.24, but also containing ternary and higher order alloying additions such as:

a)—0.1 to 20 wt. % Si, B, Be and/or Ge
b)—0.0 to 15.0 wt. % of a second and/or ternary transition metal according to embodiment 1 and/or 2, thereby all elements essentially held in the non-equilibrium Mg-base matrix phase, and/or 4.7 an Mg-alloy as to the following commercial Mg engineering alloy compositions: WE54, WE43, ZE63, ZE41, EZ33, EZ32, AE41, AE42, QE22, EQ21, AZ91D/E, AZ61A/B, AZ31A/B, AM20, AM50, AM60 or any other AM-base alloy as well as AS41 and AS42 including those made from high- and ultra-high purity feedstock (eg. X-, SX- and UX-series), these alloys in particular being made by mechanical alloying in such a way that either a substantial or a minor fraction of the alloying additions is held in solid solution of cph-Mg or in any other resultant metastable structural (Mg-based) non-equilibrium matrix phase, thereby either without or with complementary alloying additions to these alloys, the alloying additions being either ternary and quaternary additions according to embodiments 4.1 to 4.6, or
with an increased content of the alloying additions present in the commercial alloy, the increase in alloying additions thereby corresponding to a factor ranging from 0.1 to 10 relative to the level in corresponding commercially established alloy composition,
in any case the alloy not exceeding a density of 2.7 g/cm³, and/or the processing and/or quality of which correspond(s) to one or more of embodiments 1. to 2.24.

5$^{th}$ embodiment. A gravity-independent vapor deposition process of which the driving force for the overall mass transport from evaporation source(s) to deposit(s) is provided by underpressure in successive levels of vacuum chambers which are eventually arranged in parallel, the (under-) pressure in the vacuum chamber(s) for deposition being maintained by an external pumping system resulting in a rate-controlling suction-type of vapor flow between evaporation sources and deposition surface of the evaporation unit and of which the actual throughput $Q_v$ for a given pumping speed S is controlled by at least one heatable porous membrane (diaphragm) for vapor flow, the (membrane) diaphragm in particular heated by induction and/or resistance heating, and the evaporation sources being activated by thermal evaporation (resistance, induction, electron beam and/or microwave heating and/or sublimation, laser beam and/or arc evaporation methods) and/or magnetron sputtering methods and used to separate a) two adjacent evaporation chambers n and (n+1) containing at least one individual evaporation source each or
b) an evaporation chamber n with at least one individual evaporation source and a mixing chamber (n+1) containing no or at least one individual evaporation source or
c) an evaporation chamber as under a) or b), but followed by a chamber providing a facility for the deposition of the vapor and which follows into the direction of vapor flow lines (vapor trajectories) and/or 5.1 a vapor deposition process according to embodiment 5, characterized further in that the vapor transport from individual evaporation chambers (e.g. to the mixing chamber) is driven by the vapor pressure of corresponding element(s) and/or 5.2 a vapor deposition process according to one or more of embodiment 5 and 5.1, the vapor deposition process characterized further in that a local pressure gradient dP/dx across the shortest separation length dx between two adjacent chambers of the evaporation process is generated, the magnitude of the local pressure gradient dP/dx in x-direction across the diaphragm being different, in particular larger in amount than the pressure gradients in adjacent vacuum chambers of the process resulting in a discontinuous pressure gradient profile between the evaporation source(s) and the substrate(s) used for deposition of the resultant alloy vapor and/or 5.3 a vapor deposition process according to one or more of embodiments 5 to 5.2, the vapor deposition process characterized further in that the local pressure gradient dP/dx provides the local driving force to allow a controlled fraction of the incoming vapor to be transferred into the next chamber following in the direction of the vapor condensation, i.e. deposition unit for both negative and positive temperature gradients across the diaphragm, the amount of the T-gradients ranging from 0° to 3000° C. between evaporation and/or mixing and/or vapor deposition chamber and/or 5.4 a vapor deposition process according to one or more of embodiments 5 to 5.3, the vapor deposition process characterized further in that the specific traversing vapor volume is locally heated up and/or expanded and/or accelerated without compositional change, and/or 5.5 a vapor deposition process according to one or more of embodiments 5 to 5.4, the vapor deposition process characterized further in that the diaphragm contains at least one orifice(s) at the vapor intake and/or outlet of the flow channel(s) being symmetrically and/or asymmetrically arranged around the x-normal of intake and/or outlet surface and/or the central y-/z-plane plane of the diaphragm which may, the x-normal being collinear or not with the center line of the adjacent evaporation and deposition chambers, the vapor flow resisting elements may form a matrix of equidistant or non-equidistant surfaces of equivalent or different surface area between the orifices at the intake and/or at the outlet of the diaphragm, and/or 5.6 a vapor deposition process according to one or more of embodiments 5 to 5.5, the vapor deposition process characterized further in that the diaphragm intake provides a ratio in surface area between the orifice surface(s) $(\Sigma)A_O$, and the surface around and/or between the orifice(s) $A_R$, acting as a resistor to flow, i.e. $(\Sigma A_O/A_R)$ *100%, ranging from 0.0001% to 99.5% relative to the overall (cross-sectional) surface of the diaphragm facing the incoming vapor flow, but in particular between 0.01 and 30% and including further engineering solutions to control condensation at and in the very and immediate vicinity of the diaphragm as well as away from the diaphragm and/or 5.7 a vapor deposition process according to one or more of embodiments 5 to 5.6, the vapor deposition process characterized further in that the bulk of the diaphragm is made from commercial steel and/or superalloys and/or one or more of the materials embodimented under embodiment 2.4.23 and/or 5.8 a vapor deposition process according to one or more of embodiments 5 to 5.7, the vapor deposition process characterized further in that the surface of the diaphragm bulk is coated by a PVD- and/or CVD-coating of one or more of the materials under embodiment 2.4.23.

$6^{th}$ embodiment. A vapor deposition process with a diaphragm according to embodiments 5. to 5.8, the diaphragm characterized further by individual diaphragm elements with at least one single and/or multiple bifurcation used as an anti-nozzle system (FIG. 90), the bifurcations being constructed in such a way that the individual backstreaming pressure, $P_B$, is smaller than the pressure at corresponding intake, $P_I$, i.e. $P_I > P_B$ so to allow for partial backstreamed vapor mass $dm_B$ into the chamber n (or 1) where the vapor comes from, the bifurcations providing a solution for minimum turbulent flow inside the diaphragm and in conjunction with flow line elements at immediate intake area and as outlet configuration at rear of the diaphragm or in conjunction with trumpet-like nozzle geometries contrasting their use in gas-atomization and involving angular and smoothed out single and multiple bifurcations and resultant conducts arriving at single or multiple octopus-like configurations (FIG. 91), the angle δ between transmembranic flow channel and the flow for the backstreaming vapor at the bifurcations thereby ranging from 1 to 150°, in particular from 2° to 90° and/or 6.1 a vapor deposition process with a diaphragm according to one or more of embodiments 5. to 6., the diaphragm characterized further by constructional elements (profiles) to reduce laminar flow and to generate turbulent flow at a defined distance h in front of the vapor intake, the elements to generate turbulent flow providing coefficients of flow resistance, $c_F$, for flow surrounding a profile ranging from 0.25 to 5, in particular between 1.1 and 3, the higher values thereby obtained by a combination of comprising filigree as well as relatively massive elements (FIG. 92) comprising rectangular and irregular plates, the $c_F$-value eventually increasing up to values of 50 for very small Reynolds numbers involved and/or 6.2 a vapor deposition process with a diaphragm according to one or more of embodiments 5. to 6.1, the diaphragm characterized further by constructional flow line elements (profiles) and design configurations to suppress turbulent flow at rear of the diaphragm as well as at the immediate intake area including trumpet-shaped in- and outlets and of which the resulting coefficients of flow resistance, $c_F$, being not larger than 0.3, in particular below 0.1, and/or 6.3 a vapor deposition process with a diaphragm according to one or more of embodiments 5. to 6.2, the diaphragm characterized further by a series of successive resistor-to-flow levels to surmount very large P- and T-gradients and which are represented by at least two levels of (a matrix of) resistor to flow ("levels" was deleted here) according to a series electrical switch, each level thereby containing at least one transmembranic flow channel, the resultant matrix of resistor elements being arranged equidistantly between the flow channels or not, the resultant diaphragm element embracing one or more of the following characteristics:

a number m of resistor levels, where 100>m>1 and/or a decreasing, constant or increasing relative orifice area with increasing level m, i.e. $(\Sigma A_O/\Sigma A_R)_m > (\Sigma A_O/\Sigma A_R)_{m+1}$ or $(\Sigma A_O/\Sigma A_R)_m = (\Sigma A_O/\Sigma A_R)_{m+1}$ or $(\Sigma A_O/\Sigma A_R)_m < (\Sigma A_O/\Sigma A_R)_{m+1}$ and/or a nearly constant or a differentially increasing temperature with each discrete level of m and/or a decreasing, constant or increasing orifice area with increasing level m, i.e. $(\Sigma A_O)_m > (\Sigma A_O)_{m+1}$ or $(\Sigma A_O)_m = (\Sigma A_O)_{m+1}$ or $(\Sigma A_O)_m < (\Sigma A_O)_{m+1}$ and/or a decreasing, constant or increasing absolute surface area with increasing level m, i.e. $(\Sigma A_O + \Sigma A_R)_m > (\Sigma A_O + \Sigma A_R)_{m+1}$ or $(\Sigma A_O + \Sigma A_R)_m = (\Sigma A_O + \Sigma A_R)_{m+1}$ or $(\Sigma A_O + \Sigma A_R)_m < (\Sigma A_O + \Sigma A_R)_{m+1}$ and/or a differential volume in front of level m which acts as a differential vapor reservoir likewise allowing the vapor to adapt the required partial temperature increase and which may include heating serpentines here to be traversed by the vapor volume released by the diaphragm, dm, or dm, or not, and/or flow line elements as under embodiment 6.2, but with coefficients of flow resistance, $c_F$, not larger than 1.0, employed in front of the differential resistor elements or in front of part of the resistor elements of a selected fraction of m-levels as well as at rear of the final outlet level $m_{max}$ in order to optimize turbulent with regard to traversing laminar flow or not and/or 6.4. a vapor deposition process with a diaphragm according to one or more of embodiments 5. to 6.3, the diaphragm characterized further by apertures to adjust the individual intake area $A_O$ so local vapor flow and resultant magnitude of local vapor throughput per orifice at any location in the flow channel, in particular at the front face toward the incoming vapor flow, and/or 6.5 a vapor deposition process with a diaphragm according to one or more of embodiments 5. to 6.4, the diaphragm characterized further by transmembranic flow channels involving diffuser-jet nozzle transitions with continuous expansion and contraction of corresponding cross-sections and/or 6.6 a vapor deposition process with a diaphragm according to embodiment 6.5, the diaphragm characterized further by transmembranic flow channels involving diffuser- and/or jet nozzle transitions with discontinuous expansion and contraction of corresponding cross-sections and/or 6.7 a vapor deposition process with a diaphragm according to one or more of embodiments 5. to 6.6, the diaphragm characterized further by continuous diffuser and/or Laval-jet-nozzle type of outlets and/or 6.8 a vapor deposition process with a diaphragm according to one or more of embodiments 5. to 6.7, the diaphragm characterized further by continuous supersonic jet-nozzle outlets and/or 6.9 a vapor deposition process with a diaphragm according to one or more of embodiments 5. to 6.8, the diaphragm characterized further by diffuser- and jet-nozzle angles between the central axis of the diffuser or jet nozzle and the external peripheral wall ranging from 0° to 30°, in particular from 0.5° to 15° resulting in any combination of possible solutions as shown in FIG. 94.

$7^{th}$ Embodiment A vapor deposition process according to one or more of embodiments 5. to 6.9, the vapor deposition process characterized further in that the deposition unit comprises a continuous (batch) circuit process of at least one individual collector or of at least two individual flat plank condensers moving in one sense of the circuit process and/or 7.1 a vapor deposition process according to one or more of embodiments 5. to 7., the vapor deposition process characterized further in that the (e.g. plank) collector/condenser provides a rectangular surface (projection) normal to the last diaphragm before vapor deposition and/or 7.2 a vapor deposition process according to one or more of embodiments 5. to 7.1, the vapor deposition process characterized further in that a condenser disc and/or at least one condenser with curved edges providing curved deposit edges is employed and/or 7.3 a vapor deposition process according to one or more of embodiments 5. to 7.2, the vapor deposition process characterized further in that a drum and/or at least one condenser with curved deposition surfaces (surface planes) is employed and/or 7.4 a vapor deposition process according to one or more of embodiments 5. to 7.3, the vapor deposition process characterized further in that the at least one individual condenser surface rotates in a given (horizontal, vertical or oblique to gravity g) plane with the lateral edges tilting (i.e. edge-on) around the central axis of the overall evaporation unit and/or 7.5 a vapor deposition process according to embodiment 7.4, the vapor deposition process characterized further in that the condenser surfaces embraces a tilt angle $\delta_{dep}$ with the central rotation axis of the condenser unit, the tilt angle ranging from $0° < \delta_{dep}$ 90° and/or 7.6 a vapor deposition process according to one or more of embodiments 5. to 7.3, the vapor deposition process characterized further in that the at least one individual condenser (lateral) edge rotates in a given (horizontal, vertical or oblique to gravity g) plane with the at least one deposition surface moving in different surface planes per vapor deposition pass by tilting front-face-on around the central axis of the overall deposition unit and/or 7.7 a vapor deposition process according to embodiment 7.6, the vapor deposition process characterized further in that a tilt angle $\delta_{dep}$ between surface plan and central axis of the overall deposition unit is employed, the tilt angle ranging from $0° < \delta_{dep}$ 90° and/or 7.8 a vapor deposition process according to one or more of embodiments 5. to 7.7, the vapor deposition process characterized further in that a constant ΔT-interval is employed on the deposit surface at a given deposit surface position (x,y,z) between exposure to vapor impingement and a given transport position of the deposit outside the exposure and/or 7.9 a vapor deposition process according to one or more of embodiments 5. to 7.8, the vapor deposition process characterized further in that the δΔT-deviation of a given deposit surface position (x,y,z) between exposure to vapor impingement and a given transport position outside the exposure ranges from 0.2 to 40K, in particular from 0.3 to 10 K, and/or 7.10 a vapor deposition process according to one or more of embodiments 5. to 7.9, the vapor deposition process characterized further by a constant lateral velocity $v_{Kon}$ and/or $\omega_{Kon}$ on the entire deposition surface during exposure of the deposition surface to vapor impingement and/or 7.11 a vapor deposition process according to one or more of embodiments 5. to 7.10, the vapor deposition process characterized further by controlled $\Delta v_{Kon}$-and/or $\Delta \omega_{Kon}$-intervals of the deposition surface between exposure to vapor impingement of a given condenser and/or deposition surface position (x,y,z) and/or 7.12 a vapor deposition process according to one or more of embodiments 5. to 7.11, the vapor deposition process characterized further in that the at least one individual condenser is supplied with a (liquid) chill medium via a rotating disc distributor and/or disc collector and/or 7.13 a vapor deposition process according to one or more of embodiments 5. to 7.12, the vapor deposition process characterized further in that at least 1, in particular 1 to 20 independent meanders per condenser are employed and/or 7.14 a vapor deposition process according to one or more of embodiments 5. to 7.13, the vapor deposition process characterized further in that the number of individual deposition units, $n_d$, with one diaphragm per final mixing chamber ranges from 1 to 100, in particular from 2 to 32 and/or 7.15 a vapor deposition process according to one or more of embodiments 5. to 7.14, the vapor deposition process characterized further minimum ratio of the number of individual condensers, $n_c$, to individual diaphragms, $n_d$, prior to deposition is given by the relationship $n_c=1.5*n_d$ and/or 7.16 a vapor deposition process according to one or more of embodiments 5. to 7.15, the vapor deposition process characterized further in that the lateral velocity of the condenser ranges from $10^{-3}$ cm/sec to 2 m/sec, in particular from $10^{-2}$ cm/sec to 50 cm/sec and/or 7.17 a vapor deposition process according to one or more of embodiments 5. to 7.16, the vapor deposition process characterized further in that the absolute pressure in the condensation/vapor deposition unit ranges from $10^{-6}$ to $7*10^{-1}$ bar, in particular from $10^{-4}$ to $10^{-2}$ bar and/or 7.18 a vapor deposition process according to one or more of embodiments 5. to 7.17, the vapor deposition process characterized further in that the effective hypermembranic distance $h_{eff}$ between (rear) surface of the final diaphragm traversed by the vapor flow/stream/trajectories and the deposition surface ranges from 0.2 to 100 cm, in particular from 0.5 to 20 cm, and/or 7.19 a vapor deposition process according to one or more of embodiments 5. to 7.18, the diaphragm employed characterized further by a diameter $d_z$ of the transmembranic flow channel at the x-level of rear outlet surface ranging from 0.05 to 100 cm, in particular from 0.08 to 30 cm and/or 7.20 a vapor deposition process according to one or more of embodiments 5. to 7.19, the vapor deposition process characterized further in that the surface ratio of diaphragm to individual (plank) condenser (projection to the diaphragm) ranges from 0.05 to 0.8 (i.e. 5 to 80%), in particular from 0.1 to 0.3 (i.e. 10 to 30%) and/or 7.21 a vapor deposition process according to one or more of embodiments 5. to 7.20, the vapor deposition process characterized further in that the rectangular plank collector dimensions range from length 0.2 to 4 m by width 0.05 to 2 m, in particular from length 0.3 to 2 m by width 0.1 to 1 m, and/or 7.22 a vapor deposition process according to one or more of embodiments 5. to 7.21, the vapor deposition process characterized further in that the radius of the disc or drum condenser (collector) ranges from 7 to 400 cm, in particular from 12 to 250 cm and/or 7.23 a vapor deposition process according to one or more of embodiments 5. to 7.22, the vapor deposition process characterized further in that the condenser (surface) is kept at a (constant) temperature in the temperature regime between $-200°$ to $+400°$ C.$\pm 20°$ C., in particular at a (constant) temperature at between $-190$ to $+350°\pm 20°$ C., and/or 7.24 a vapor deposition process according to one or more of embodiments 5. to 7.23, the vapor deposition process characterized further in that the relative surface roughness $\Delta=k/h_{eff}$ of the (in-situ consolidated) deposit prior to exposure to vapor impingement with k=mean height of surface protrusion (asperity) ranges from 0.000001 to 0.2, in particular from 0.001 to 0.1, and/or 7.25 a vapor deposition process according to one or more of embodiments 5. to 7.24, the vapor deposition process characterized further in that the fraction of vapor throughput reaching the deposit surface velocity boundary layer prior to accommodation, $\alpha_A$, ranges from 0.5 to 1.0, in particular from 0.7 to 0.95, and/or 7.26 a vapor deposition process according to one or more of embodiments 5. to 7.25, the vapor deposition process characterized further in that the fraction of vapor throughput having reached the deposit surface velocity boundary layer prior to accommodation, $\alpha_A$, and then being accommodated there, i.e. $\alpha_T(\alpha_A)$, ranges from 0.4 to 1.0, in particular from 0.5 to 0.95 and/or 7.27 a vapor deposition process according to one or more of embodiments 5. to 7.26, the vapor deposition process characterized further in that the overall mass transport is driven by the vapor pressure of the element with the highest vapor saturation pressure.

$8^{th}$ embodiment. A magnesium or aluminum based alloy according to one or more of embodiments 1. to 2.24 and embodiments 4. to 4.7 and made by vapor deposition techniques, but also including the extended solid solution of 0.1 to 95% Ti by weight, in particular between 0.2 and 60 wt. % Ti, and including them for embodiment 4.3, and/or furthermore a subgroup f) of alloys of embodiment 4.3, in that a combination of two or three of corresponding transition metals of group 3 are possible with a common alloying level ranging from 0.3 to 30 wt. % and coexisting either in extended solid solution of cph-Mg or any other metastable non-equilibrium Mg-base alloy or being partially dispersed in corresponding microstructure in terms of very fine intermetallic compounds, all of these alloys made by vapor deposition involving one or more of the processes and/or process solutions possible by using diaphragms according to one or more of embodiments 5 to 7.27, in order to control corresponding vapor synthesis and deposition for high reproducibility and productivity including yield and quality of the final as-deposited preform of these more complex higher order VD-Mg alloy systems, thereby the specific vapor deposition techniques being those suitable for mass production by employing suction-type of overall driven mass transport using suitable diaphragms as to at least one of the possibilities given under embodiments 5 and 6 and which allow to master and to control macroscopically and microscopically large vapor fluxes and the resultant throughput such as is possible by nature due to the high vapor pressure of magnesium metal as the base, of co-evaporated or separately evaporated light rare earth elements Mg-LRE due to their relatively low evaporation pressures as well as of metals known to be very different from magnesium such as early transition metals, metalloids, but also aluminum and other simple metals, and therefore never been alloyed to magnesium, at least not in a larger quantity, and these diaphragms allowing all these elements to join the magnesium or aluminum base vapor in one or more mixing chambers, the entire evaporation being finally driven by an overall pressure gradient which is superimposed over the entire system by a pumping system located externally without interfering with the overall vapor between its origin, the evaporation sources and its destination, the at least one substrate and/or deposit surface on top of the substrate, thereby at least employing accommodation factors $\alpha_T(\alpha_A)$ and corresponding deposited/condensed yield ranging from 0.1 to 1.0, in particular from 0.3 to 0.8.

$9^{th}$ embodiment A magnesium based alloy made by melt spinning techniques including twin-roller quenching and planar flow casting and containing 0.1 to 25% La by weight, in particular between 0.2 and 14 wt. % La, or 0.1 to 25% Ce by weight, in particular between 0.2 and 16 wt. % Ce, or 0.1 to 25% Pr by weight, in particular between 0.3 and 18 wt. % Pr, or 0.1 to 28% Nd by weight, in particular between 0.3 and 20 wt. % Nd, or 0.1 to 30% Sm by weight, in particular between 0.2 and 20 wt. % Sm, or 0.2 to 14% Y (and Eu) by weight, in particular between 0.5 and 7 wt. % Y (and Eu), or 0.2 to 30% misch-metal by weight, in particular between 0.3 and 25 wt. % misch-metal, the misch-metal thereby in particular of compositions stemming from and/or corresponding to the ore composition of Monazite-, Bastnaesite- and Xun Wu-type of RE-ores, but in any case being dominated by corresponding compounds of La, Ce, Nd and Pr and, as a misch-metal, containing 5–97% La by weight, 5–97% Ce by weight and 5–98% (Nd+Pr) balance other rare earth metals such as Gd and Th, but also Y, and the sum of (La, Ce, Nd and Pr) totaling 40–100% by weight, in particular 80–99% by weight, or 0.2 to 15% Al by weight, in particular between 4 and 12 wt. % Al, or 0.1 to 10% Mn by weight, in particular between 0.2 and 8 wt. % Mn, or 0.1 to 5% Zr by weight, in particular between 0.2 and 3 wt. % Zr, and thereby employing in all cases an inert atmosphere to protect molten feed stock, solidification operation and resultant ribbon, the inert gas in particular being commercially available helium or a mixture of helium with other suitable and inert gases, and/or a chill of highly conductive material such as (a) copper wheel(s) at a surface speed of at least 3.5 km/min, in particular at a surface speed of 5 to 7 km/min, and/or and in particular for PFC-type of RS-processing employing a controlled distance between corresponding orifice for molten alloy supply and rotating chill to produce a constraint melt puddle between feed stock supply and rotating chill, and/or the distance between orifice and chill smaller than 4 mm, in particular smaller than 2 mm, and/or a scraper to reduce the inert gas film between liquid and resultant solidified ribbon and the chill, in order to obtain a microstructural state within which the lanthanum, cerium, praesodymium, neodymium, samarium, europium, gadolinium and/or yttrium and/or the other heavy rare earth elements stemming from the employed misch-metal, the aluminum, manganese or zirconium are or is substantially held in solid solution in the as-solidified state, corresponding solid solution being either cph-Mg or any other metastable crystalline or amorphous phase, the microstructure consisting of grains, cells and/or sub-cells of which the dimensions are <10 $\mu$m in at least one dimension of the three translational directions x,y and z, which are in particular columnar featureless and/or a microstructure that was formed by a completely partitionless mode of solidification from the melt, corresponding binary alloys may contain minor higher order alloying additions in case of the binary extended solid solution alloys with La, Ce, Nd, Pr, Sm, Y(and Eu) or MM (as defined above):

a)–0.1 to 15 wt. % Al, in particular 0.5 to 6 wt. % Al, b)–0.0 to 8 wt. % Ca, Sr or Ba, in particular 0.2 to 3 wt. % Ca, Sr or Ba, c)–0.0 to 4 wt. % Zn, in particular 0.2 to 2 wt. % Zn, d)–0.0 to 6 wt. % Si, Ge, B, Sb, in particular 0.2 to 3 wt. % Si, Ge, B, Sb, e)–0.0 to 6 wt. % Zr, Mn, in particular 0.2 to 3 wt. % Zr, Mn, balance magnesium and impurities, or the binary extended solid solutions of Mn or Zr containing group a) to d) of these higher order additions, balance magnesium and impurities, all of which aimed at fine dispersions of precipitates synergistically formed from any of the combinations of higher order alloying additions possible between sub-groups a) to e) or to d), in particular an alloy containing 0.2 to 10 wt. % Ce, La, Pr, Nd or Sm and of 0.5 to 3 wt. % Al and of 0.1 to 1 wt. % Ca, Sr or Ba, balance magnesium and impurities, by employing any of the alloy conversion routes embodimented under embodiment no 12, item 1a), 2a), 3a) and 4) to 7).

$10^{th}$ embodiment. A magnesium based alloy made by atomization methods, in particular by electro-hydrodynamic (EHD) atomization and containing the binary alloying additions according to embodiment 9, thereby adjusting processing conditions to produce powders with a frequency maximum in particle size distribution at particle sizes below 5 $\mu$m, in particular at particle sizes below 1 $\mu$m, and a maximum particle size not exceeding 10 to 15 $\mu$m, in particular not exceeding 5 $\mu$m, in order to employ chill conditions and resulting liquid undercoolings which allow to hold the binary alloying additions essentially in the cph-Mg solid solution or in any other metastable crystalline or amorphous phase in the advent of growth likely to be controlled by recalescence, in case of gas atomization employing an inert atomizing gas, the atomizing gas in particular helium or a mixture of helium with another inert gas, in any case employing an inert atmosphere to protect atomization, resultant powders and subsequent powder handling, these binary extended solid solutions may contain the higher order alloying additions as to embodiment no 8, but preferably a lower level of higher order alloying additions, in particular 50% of those embodimented under embodiment no 8, balance magnesium and impurities, all of the higher order additions aimed at fine dispersions of precipitates synergistically formed from any of the combinations of higher order alloying additions possible between sub-groups a) to e) or to d) in embodiment 8, in particular an alloy containing 0.2 to 10 wt. % Ce, La, Pr, Nd or Sm and of 0.5 to 3 wt. % Al and of 0.1 to 1 wt. % Ca, Sr or Ba, followed by employing the alloy conversion routes embodimented by embodiment 11 and 12, but without comminution, as well as those routes following embodiment no 12.7.

$11^{th}$ Embodiment Methods of producing a Mg- or Al-base alloy according to one or more of embodiments 1. to 4.7 and embodiments 8. to 10., the alloys made by ingot-and/or pressure die-casting methods and/or by vapor deposition, melt spinning, EHD-atomization and mechanical alloying/ball and/or bar and/or rod milling techniques, then making products including extruded bars and rods, fabrication of forging, (rolling to) sheets, plates, foils and (e.g. drawing to) tubes and wires, the fabrication of theses products eventually including. (pre-) treating and/or (pre-) compaction methods such as degassing at temperatures up to 500° C., and/or the residual "free" hydrogen not exceeding levels of 2000 ppm, in particular 1 ppm preheating, hot (isostatic) pressing, in particular at 60° to 550° C., cold (isostatic) pressing at pressures between 50 and 1400 MPa, direct powder forging, explosive and/or shock consolidation, and metal powder injection molding providing parts of high complexity and accuracy at low costs, including progressive decomposition during debinding at temperatures between 150° and 600° C. allowing a wide range of geometric options including undercuts, tapered surfaces and cross holes (see embodiment no 15).

12$^{th}$ embodiment Methods of producing a magnesium or aluminum based alloy according to one or more of embodiments 1. to 2.24 and embodiments 4. to 4.7 embodiments 8. to 10. and resultant (e.g. near-net shape) products according to embodiment 15.1 and/or embodiment 15.2, the methods are further characterized by employing at least one of the following alloy conversion routes:

12.1 extrusion of corresponding powders and/or in-situ-consolidated and/or CIPed and/or HIPed preforms, layers etc. and/or alloys:

a)—for Mg-rare earth metal and/or—misch-metal according and/or—Sc and/or—Y based solid solutions and corresponding higher order alloy systems according to embodiments 4.1,4.2 and 4.6 employing preheating cycles of 0.2 to 10 h at 350° to 450° C., the extrusion at reduction ratios between 3:1 and 45:1 at extrusion temperatures of 15° to 400° C., in particular at reduction ratios between 8:1 to 22:1 using extrusion temperatures of 50° to 250° C., the affordable ram speeds embodimented herein ranging from 0.001 to 15 mm/sec, in particular from 0.01 to 4 mm/sec, then followed by at least one heat treatment at temperatures between 60° to 300° C., in particular at between 80° and 280° C. for stress relieve and/or selected precipitation and/or (selected) dissolution of GP-zones and/or precipitates and other second phases without (substantially) reducing the passivating effect originating in corresponding extended solid solution of rare earth elements in cph-Mg or any other non-equilibrium Mg-base matrix phase, or not followed by such an heat treatment, b)—for Mg- or Al-transition metal based solid solutions and higher order Mg-TM-TM—TM and Al-based alloy systems as well as for higher order solid solutions with rare earth and transition metals and corresponding higher order alloy systems as well as for Mg-metalloid (Si, Ge, B, Sb, Be) based solid solutions with and without RE and TM according to embodiments 4.3 to 4.6, employing the extrusion at reduction ratios between 3:1 and 45:1 at extrusion temperatures of 15° to 500° C., in particular at reduction ratios between 8:1 to 22:1 at extrusion temperatures of 50° to 320° C., all after pre-heating for 0.1 to 10 h in corresponding temperature ranges, the affordable ram speeds embodimented herein ranging from 0.001 to 15 mm/sec, in particular from 0.01 to 4 mm/sec, then followed by at least one heat treatment at temperatures between 60° to 400° C., in particular at between 80° and 280° C. for stress relieve and/or selected precipitation and/or (selected) dissolution of GP-zones and/or precipitates and other second phases without (substantially) reducing the passivating effect originating in corresponding extended solid solution of the transition and/or rare earth metals and/or metalloid elements in cph-Mg, fcc-Al or any other non-equilibrium Mg-base or Al-base matrix phase, or not followed by such an heat treatment, and/or 12.2 rolling of corresponding powders and/or in-situ-consolidated and/or CIPed and/or HIPed preforms, layers etc. and/or alloys:

a)—for alloy groups as to item 12.1a of this embodiment no 12, but forming corresponding alloy pre-form or billet into a rolling stock which is then preheated for 0.1 to 10 h to temperatures ranging from 90° to 520° C. followed by rolling the heated stock at a rolling speed at the surface of the employed rolls, which ranges from 0.05 to 100 m/min, thereby adjusting the gaps of the rolls so to reduce thickness by 0.5 to 80% per pass and to arrive at sheet and plate thickness 0.1 to 10 mm, performed at temperatures ranging from 100° to 500° C., in particular at temperatures between 130° and 500° C., using no or at least one additional heat treatment between the required rolling passes, the rolling passes thereby involving a fixed or a variable thickness reduction ratio depending on the number of prior-rolling passes employed, then followed by an heat treatment at temperatures between 60° to 400° C., in particular at between 80° and 280° C. for stress relieve and/or selected precipitation and/or (selected) dissolution of GP-zones and/or precipitates and other second phases without (substantially) reducing the passivating effect originating in corresponding extended solid solution of rare earth elements, MM and Sc in cph-Mg any other non-equilibrium Mg-base matrix phase, or not followed by such an heat treatment, b)—for alloy groups as to item 12.1b of this embodiment no 12, but forming corresponding alloy pre-form or billet into a rolling stock which is then preheated for 0.1 to 10 h to temperatures ranging from 70° to 520° C. followed by rolling the heated stock at a rolling speed at the surface of the employed rolls, which ranges from 0.05 to 100 m/min, thereby adjusting the gaps of the rolls so to reduce thickness by 0.5 to 80% per pass and to arrive at sheet and plate thickness 0.1 to 10 mm, performed at temperatures ranging from 50° to 450° C., in particular at temperatures between 110° and 500° C., using no or at least one additional heat treatment between the required rolling passes, the rolling passes thereby involving a fixed or a variable thickness reduction ratio depending on the number of prior-rolling passes employed, then followed by an annealing treatment at temperatures between 60° to 400° C., in particular at between 80° and 280° C. for stress relieve and/or selected precipitation and/or (selected) dissolution of GP-zones and/or precipitates and other second phases without (substantially) reducing the passivating effect originating in corresponding extended solid solution of the transition and/or rare earth metals and/or metalloid elements in cph-Mg, fcc-Al or any other non-equilibrium Mg-base or Al-base matrix phase, or not followed by such an heat treatment, and/or 12.3 forging operations of corresponding powders and/or in-situ-consolidated and/or CIPed and/or HIPed and/or (extruded) preforms, layers etc. and/or alloys:

a)—for alloy groups as to item 12.1a of this embodiment no 12, the forging performed at temperatures ranging from 50° to 520° C. eventually after pre-heating for 0.1 to 10 h at corresponding temperatures, the forging in particular at temperatures between 170° and 450° C., thereby deforming corresponding consolidated alloy (in particular cylindrical) preform or billet by at least 10–50% or by more than 50% by employing a closed-die or an open-die forging method, then followed by an heat treatment at temperatures between 60° to 400° C., in particular at between 80° and 280° C. for stress relieve and/or selected precipitation and/or (selected) dissolution of GP-zones and/or precipitates and other second phases without (substantially) reducing the passivating effect originating in corresponding extended solid solution of rare earth elements, MM and Sc in cph-Mg any other non-equilibrium Mg-base matrix phase, or not followed by such an heat treatment, b)—for alloy groups as to item 12.1b of this embodiment no 12, the forging performed at temperatures ranging from 50° to 520° C. eventually after pre-heating for 0.1 to 10 h at corresponding temperatures, the forging in particular at temperatures between 150° and 450° C., thereby deforming corresponding consolidated alloy (in particular cylindrical) preform or billet by at least 10–50% or by more than 50% by employing a closed-die or an open-die forging method, then followed by an annealing treatment at temperatures between 60° to 400° C., in particular at between 80° and 280° C. for stress relieve and/or selected precipitation and/or (selected) dissolution of GP-zones and/or precipitates and other second phases without (substantially) reducing the passivating effect originating in corresponding extended solid solution of the transition and/or rare earth metals and/or metalloid elements in cph-Mg, fcc-Al or any other non-equilibrium Mg-base or Al-base matrix phase, or not followed by such an heat treatment, and/or 12.4 drawing, deep drawing including direct and reverse redrawing, bending, and stretch forming of corresponding as-mechanically alloyed, as-extruded or as-rolled alloy products of the a)- or b)-type of Mg-base or Al-base non-equilibrium matrix phase alloy (cf. embodiment 12.1a) and embodiment 12.1b)) and at temperatures in the temperature ranges given for extrusion of the alloy of embodiments 12.1a or 12.1b of this embodiment no 12, and/or 12.5 superplastic forming of as-CIPed and/or as-HIPed (cf. embodiment 11) and/or as-extruded and/or as-rolled alloy products of the a)- or b)-type of Mg-base or Al-base non-equilibrium matrix phase alloy (cf. embodiment 12.1a) or 12.1b)) into simple and complex shapes by employing strain rates ranging from $8*10^{-1}$ to $10^{-5}$/sec at temperatures ranging from 20° to 450° C., in particular at temperatures ranging from 100° to 350° C. employing strain rates ranging from $10^{-1}$ to $10^{-3}$/sec, and/or 12.6 mixing the (eventually from consolidated preforms comminuted) powder with suitable reinforcement including particulates, short and long fibers and/or whiskers according to at least one of the compounds of embodiments 2., 2.2.6 and/or 2.2.7, and/or a variant, in particular after a refinement by using a ball milling technique to particle sizes in the range of 0.2 to 5 μm, or no such mixing, then degassing for 0.5 to 10 hrs at temperatures ranging from 180° to 450° C. and/or or no such degassing, and/or preheating for 0.5 to 6 hrs at temperatures in the range from 200° to 450° C., and/or hot-isostatic pressing for 1 to 6 h at 100° to 450° C. and/or preheating for 1 to 4 hrs up to the temperatures required in one or more of embodiments 12.1 to 12.5 followed by an alloy conversion as is given by any combination of the embodiments under embodiment 12.1 to 12.5 and 12.7 of corresponding a)- or b)type of Mg-base extended solid solution alloy and/or 12.7 after any one of the alloy conversion routes given under item 12.1 to 12.6 of this embodiment no 12 followed by directly quenching the said product form after finishing the forming operations in oil or water at temperatures ranging from 10° to 90° C. or by cooling in air, and then by a) either a final annealing treatment for 1 to 100 hrs at 60° to 150° C., in particular for 1 to 5 hrs at 80–100° C., or b) by an artificial aging treatment for 1 to 1000 hrs, in particular for 1 to 300 hrs at temperatures between 130° and 350° C., or c) no further treatment and/or d) an annealing treatment after application of corresponding alloy product at any time using the conditions as given under a)- and/or b)-type of methods of this embodiment no 12.

13$^{th}$ Embodiment. A magnesium alloy according to embodiments 3. to 3.19 and/or a Mg-based product according to embodiment 15.1, corresponding processing is characterized further by holding the as-cast alloy for 0.5 h to 1000 hrs at temperatures as to embodiment 3.3.2, to solutionize intermetallic and/or second phases separated from the melt during casting and/or solidification, or no such solution heat treatment, then followed by either no further treatment or an artificial aging treatment at temperatures between 140 to 400° C., in particular at between 150° C. and 280° C. for 0.25 to 1000 hrs and/or quenching the said product form in oil or water at temperatures ranging from 10° to 90° C., in particular from 20° to 80° C., and/or quenching in air and/or in all (three) cases followed by a final annealing treatment for 0.1 to 10 hrs at 60° to 120° C., in particular for 1 to 5 hrs at 80° to 100° C., the final annealing treatment to be repeated at any time during the life time of corresponding component in service in order to dissolve grain boundary phases and/or residual stresses accumulated by any loading and/or microstructural evolution or by no further treatment and/or 13.1 a magnesium alloy according to embodiments 3. to 3.19 and/or 13 and/or a Mg-based product according to embodiment 15.1, corresponding processing is characterized further by holding the as cast alloy during a solution heat treatment for 0.25 h to 1000 hrs at temperatures as to embodiment 3.3.2, where the passivating component (cf. embodiment 3. to 3.19) and/or a substantial part of the ternary and/or higher order alloying addition is taken again and/or held in solid solution, or no such solution heat treatment, then followed by either no forming operation and/or extrusion at 280° to 550° C., in particular at 350° to 480° C. using an extrusion ratio of 10:1 to 40:1, in particular of 12:1 to 25:1, and/or either rolling at 360° to 560° C., in particular at 390° to 480° C. using no or at least one additional heat treatment between the required rolling passes, or forging operations at 360° to 560° C., in particular at 380° to 480° C. using at least one additional heat treatment between the required forging operations, or no rolling or forging operation after extrusion, then followed either by directly quenching the said product form in oil or water at temperatures ranging from 10° to 90° C., in particular from 20° to 80° C. and/or in air and/or or by a second solution treatment for 0.1 h to 300 hrs at temperatures as to embodiment 3.3.2, and then quenching the said product form in oil or water at temperatures ranging from 10° to 90° C., in particular from 20° to 80° C. and/or in air and/or followed by an artificial aging treatment at temperatures between 140 to 400° C., in particular at between 150° C. and 280° C. for 0.25 to 1000 hrs and/or in all (three) cases followed by 7. a final annealing treatment for 0.1 to 10 hrs at 60° to 120° C., in particular for 1 to 5 hrs at 80° to 100° C., the final annealing treatment to be repeated at any time during the life time of corresponding component in service in order to dissolve grain boundary phases and/or residual stresses accumulated by any loading and/or microstructural evolution or by no further treatment, and/or 13.2 a magnesium alloy according to one or more of embodiments 3. to 3.19, 13. and 13.1 and/or a Mg-based product according to embodiment 15.1, corresponding processing is characterized further by a maximum level of solutes according to embodiment 3. to 3.19 multiplied by a factor of 1.5, the methods employed are characterized by fragmentation of the melt including solidification at intermediate and at relatively high growth rates as obtainable by (inert) gas atomization including spray forming and/or spray deposition techniques, especially those methods using a linear atomizer concepts, i.e. a linearly extended cross-over for atomization with improved productivity, as well as continuous chill-block quenching techniques such as planar flow casting, melt-spinning and twin-roller quenching and/or characterized by laser alloy surface re-melting with and without at least one of the additions of a passivating component as to embodiments 3. to 3.19, in order to produce a micrograined microstructure and large boundary strengthening effects, eventually associated with large solid solution strengthening and, in any case, with an enhanced passivating effect and a reduced time for solution heat treatments of the said (rapidly) solidified surface and/or microstructure as compared to corresponding as-cast structure obtained by conventional casting techniques according to embodiment 15, and (for embodiment 15.2-type of products) alloy conversion into products such as extrusion into bars and rods, fabrication of forgings, (e.g. rolling to) sheets, plates, foils, and (e.g. drawing to) tubes and wires and/or 13.3 a magnesium alloy according to one or more of embodiments 3. to 3.19 and 13 to 13.2 and/or a Mg-based product according to embodiments 15.1 and/or 15.2, corresponding processing is characterized further by holding the as-solidified alloy during a solution heat treatment for 0.25 h to 1000 hrs at temperatures as to embodiment 3.3.2, where the passivating component and/or a substantial part of the ternary and/or higher order alloying addition (embodiments 3. to 3.19) is taken again and/or held in solid solution, or no such solution heat treatment, then followed by either comminution to flake-like powder in case of chill-block quenched foils, and/or by degassing for 0.5 to 10 hrs at temperatures ranging from 200° to 420° C., and/or by preheating for 0.5 to 4 hrs at 200° to 350° C., and/or by hot-isostatic pressing for 1 to 6 h at 200° to 500° C. followed by preheating for 1 to 4 hrs at 200° to 400° C., and/(or no comminution etc., but the as-solidified or as solutionized alloy directly)—extruded at 100° to 550° C., in particular at 280° to 480° C. using an extrusion ratio of 8:1 to 40:1, in particular of 10:1 to 25:1 at higher extrusion temperatures (i.e. 150°–550° C.), and/or a solutionizing treatment for up to 10 hrs at 340° to 500° C., in particular at 3800 to 450° C. in which the alloying elements are substantially held and/or taken again into solid solution, and/or followed by either rolling at 220° to 560° C., in particular at 390° to 480° C. using no or at least one additional heat treatment between the required rolling passes, or forging operations at 200° to 560° C., in particular at 250° to 450° C. using at least one additional heat treatment between the required forging operations, or no rolling or forging operation after extrusion, and/or followed by directly quenching the said product form in oil or water at temperatures ranging from 10° to 90° C., in particular from 20° to 80° C. and/or in air and/or by a second solution treatment for 0.1 h to 300 hrs at temperatures as to embodiment 3.3.2, and then quenching the said product form in oil or water at temperatures ranging from 10° to 90° C., in particular from 20° to 80° C. and/or in air and/or followed by an artificial aging treatment at temperatures between 140 to 400° C., in particular at between 150° C. and 280° C. for 0.25 to 1000 hrs and/or in any case of the preceding processing alternatives followed by a final annealing treatment for 0.1 to 10 hrs at 60° to 120° C., in particular for 1 to 5 hrs at 80° to 100° C., the final annealing treatment to be repeated at any time during the life time of corresponding component in service in order to dissolve grain boundary phases and/or residual stresses accumulated by any loading and/or microstructural evolution or by no further treatment and/or 13.4 a magnesium alloy according to one or more of embodiments 3. to 3.19 and 13 to 13.3 and/or a Mg-based product according to embodiment 15.1 and/or 15.2, corresponding processing is characterized further by thin strip casting including fragmentation of the alloy melt such as by spray deposition techniques according to embodiment 13.2 and without fragmentation of the alloy melt to result in cross-sections ranging from 0.1 to 10 mm, in particular between 0.2 and 5 mm to achieve sufficient boundary strengthening effect without the need to recur to fragmentation and subsequent consolidation methods as under embodiment 13.3 but with a reduced time for solution heat treatments of the said product and/or microstructure in the as-solidified state as compared to corresponding as-cast microstructure and products obtained by conventional casting methods (embodiment 15.2) and the products are characterized further by fabrication (e.g. rolling) to sheets, plates, foils and (e.g. drawing to) tubes and wires and/or 13.5 a magnesium alloy according to one or more of embodiments 3. to 3.19 and 13 to 13.3 and/or a Mg-based product according to embodiment 15.1 and/or 15.2, corresponding processing is characterized further by holding the as-cast alloy during a solution heat treatment for 0.25 h to 1000 hrs at temperatures as to 3.3.2, where the passivating component and/or a substantial part of the ternary and/or higher order alloying addition is taken again and/or held in solid solution, or no such solution heat treatment, and/or followed by rolling at 200° to 560° C., in particular at 250° to 500° C. using no or at least one additional heat treatment between the required rolling passes, and/or by either directly quenching the said product form in oil or water at temperatures ranging from 10° to 90° C., in particular from 20° to 80° C. and/or in air and/or by a second solution treatment for 0.1 h to 300 hrs at temperatures as to embodiment 3.3.2, and then quenching the said product form in oil or water at temperatures ranging from 10° to 90° C., in particular from 20° to 80° C. and/or in air and/or quenching the said product form in oil or water at temperatures ranging from 10° to 90° C., in particular from 20° to 80° C. and/or in air after the second solution heat treatment and/or followed by an artificial aging treatment at temperatures between 140° to 400° C., in particular at between 150° C. and 280° C. for 0.25 to 1000 hrs and/or in any of the preceding processing alternatives followed by a final annealing treatment for 0.1 to 10 hrs at 60° to 120° C., in particular for 1 to 5 hrs at 80° to 100° C., the final annealing treatment to be repeated at any time during the life time of corresponding component in service in order to dissolve grain boundary phases and/or residual stresses accumulated by any loading and/or microstructural evolution or by no further treatment.

14$^{th}$ Embodiment 14 A magnesium or aluminum based alloy and/or corresponding (semi-finished) product according to one or more of embodiments 1 to 13.5, the alloy and/or (semi-finished) product characterized further by being joined with like-like Mg-base or Al-base joints made by PVD and/or ball and/or bar and/or rod milling techniques, the mechanical joints being rivets, screws, bolts, self-clinching devices, HT-interference fits) and/or by adhesive bonding methods using rubber and/or epoxy base resin, ethoxyline resin, phenolic base materials) and/or by diffusion bonding (at pressures as high as 30 MPa) and/or by inertia and linear friction welding for high quality welds and joints and/or by thermal spraying (e.g. on top of dissimilar metals and/or passive Mg-components and Mg-joints all coping with like-unlike mechanical joints, and/or by employing high purity joint surfaces and/or adhesive intralayers, and/or cleaning, degreasing, thin coatings including anodizing, pickling and priming (e.g. with chromate and dichromate).

15$^{th}$ Embodiment Methods of producing a magnesium or aluminum based alloy according to one or more of the embodiments 1. to 14., the methods and resultant products are characterized further (in particular) by 15.1 a) pressure die-casting and/or thin-wall casting a magnesium based alloy according to one or more of embodiments 1. to 14., to wall thickness in the range of 0.2 to 20 mm, in particular in the range of 0.5 to 10 mm, the resultant products used in surface and airborne transport systems such as automobiles and air-crafts, in particular used in trains and/or for aeronautical (space and aerospace) components and/or applications which exposed to weathered conditions and also for computer applications and/or those where the alloy is exposed to oil (base environments), for example, and/or (if comma, read "and/or"):

b) the resultant products including aircraft seats such as for passengers, pilots including pilot ejection seats, seats for navigators, seat and panels and joints for applications in automobiles, trains and/or air-crafts, signalers, first, second and economy class, all of which eventually to be combined with wrought product forms such as tubular components, and/or seat-frames, (aeronautic) instruments and panels, window frames, doors and/or door frames such as for wheel cases, engine access, bomb bays, passenger cells, cockpit canopies and/or windscreen, undercarriage legs, large and/or small wheels including nose wheels, flanges, reeling, pulleys, furthermore brakes and/or brake components, fittings and/or partitions, oxygen bottle brackets, high precision mating components, rotor components such as stubs and/or rotor heads, welded frame structures including radio crate and/or reeling support structures, leading and/or tailing edges, top and/or bottom tips, nacelle upper cowl panels, and/or elevators, wing and/or stabilizer components such as spinners, jet pods, elevator trim tab, aft of spar, wing castings, waffle understructures and/or anti-icing components, for example, and/or housings (clutch, crankcase, gearbox, transmission, lock and pump housings, for example), covers (e.g. engine block, engine peripheral and chassis covers) and supporting components (e.g. sub-frame, suspension and bracket parts) and/or 15.2 a) ingot casting methods for a magnesium or aluminum based alloy and/or product according to one or more of embodiments 1. to 14., including extrusion to bars and rods, fabrication of forging, sheets, plates and foils as well as products by drawing, the resultant products used in surface and airborne transport systems such as automobiles and aircraft, in particular used in trains and/or for aeronautical (space and aerospace) components and/or applications which exposed to weathered conditions and also for computer applications and/or those where the alloy is exposed to oil (based environments), for example, and/or (if comma, read "and/or"):

the resultant products including large structural components, beam floorings, press forging, intercostal components, door sheets such as for wheel cases, engine access, bomb bays, passenger cells, cockpit canopies and/or windscreen, undercarriage legs, large and/or small wheels including nose wheels, flanges, reeling, pulleys, furthermore brakes and/or brake components, tubes, fittings and/or partitions, oxygen bottle brackets, armament attachment plates, high precision mating components, rotor components such as stubs and/or rotor heads, tanks, components for welded frame structures including radio crate and/or reeling support structures, support profiles in missiles, launchers, satellites, and/or probes, instruments for space, fuselage skins including monocoque structures, fairing skins including those for gear cases, nacelles, doors, wing and/or stabilizer skins including those for monocoque structures, leading and/or tailing edges, top and/or bottom tips, nacelle upper cowl panels, and/or elevators, wing and/or stabilizer components such as spinners, jet pods, elevator trim tab, aft of spar, wing castings, tail unit components such as rudder trim tab, rudder, aileron leading edge, fin trailing and/or dorsal fin skin, inner sheet (and) waffle understructures, anti-icing components, air-ducting and/or inner door skins, for example, and/or any equivalent application in automobiles, trains, missiles, rockets and/or satellites.

16$^{th}$ embodiment. Laser or electron surface beam (re-) melting or traversing of a) the commercial Mg-alloys WE54, WE43, ZE63, ZE41, EZ33, EZ32, AE41, AE42, QE22, EQ21, AZ91D/E, AZ61A/B, AZ31A/B, AM20, AM50, AM60 or any other AM-base alloy, AS41, AS42, and EARS-type of Mg-base alloys including corresponding high purity variants (e.g. AE42X1, AM50XI etc.), EA55RS, EA65RS and resulting products (cf. embodiment 15) and/or of b) a novel Mg- and/or Al-alloy and product with compositions as given by one or more of embodiments no 1 to 4 and made by either (i) conventional casting or by (ii) advanced processing according to one or more of embodiments no 1 through no 15 of this patent application, in particular corresponding automobile, train, ballistic and satellite applications and/or by (iii) any other advanced method of processing, balance magnesium and impurities, but only the surface microstructure is modified here by employing a laser or electron surface beam withdrawal speed ranging from 0.5 mm/sec to up to 6 m/sec, in particular a withdrawal speed ranging from 1 cm up to 4 m/sec, depending on the alloy employed, in order to obtain a microstructural surface layer with substantial and/or a minor fraction of the alloying elements to be held in the Mg- or Al-base solid solution or in any other resultant metastable structural variant in the surface layer of alloys of bulk compositions given in item a) and b) of this embodiment no 16, and/or adding complementary (excess) elements to the surface of one or more of these alloys so to change the surface composition with regard to corresponding bulk composition given under item a) and b) of this embodiment no 16 or not, the complementary element(s) and level(s) to be added being either:

c)—(high purity) Al, Ti, Zr, Mn, Cr, Nb, Mo, Hf, Re, W and/or Ta to result in surface layers with alloying levels from 0.1 to 100%, and/or Si, Ge, B, Sb to result in surface layers with Si-, Ge-, B- and Sb-levels from 0.1 to 100% and/or Zn, Zr, Mn, Ag, Cu, Ni to result in surface layers with Zn-, Zr-, Mn-, Ag-, Cu- and Ni-levels from 0.1 to 100% for the alloys given under item a) and b) of this embodiment no 16, and/or being d)—the binary alloying elements embodimented under one or more of embodiment no 2, 3, 4 and/or 9 which are employed to produce an Mg- or Al-base extended solid solution or any other Mg- or Al-base non-equilibrium matrix phase alloy at the surface and in the bulk of the alloy, but here added only to the surface for the alloys given under item a) of this embodiment no 16 and to the surface of established (e.g. LA141) and novel Mg—Li-based alloys, and to result in surface layers with levels from 0.1 to 100% of these binary elements and in any of the possibilities embodimented under c) and d) of this embodiment no 16, the surface excess alloying addition(s) being added by alloying (<100%) and/or cladding (100%) to the surface via laser or electron beam surface (re-) melting or traversing, the purpose of which is a surface layer with at least a substantial part of the added and/or prior-bulk surface elements forming a monophase microstructure with minimum microgalvanic activity and maximum surface oxide passivity or a fine dispersion of precipitates synergistically formed from any of the combinations of the surface additions under item c) and d) to the bulk alloys under item a) and the surface additions under item c) to the bulk alloys under item b), but tailored as by a heat treatment embodimented under items 1a) and 1b) of embodiment no 12 so that the passivated Mg-base matrix phases as embodimented under embodiment no 9 can form and co-exist with theses surface precipitates, the resultant surface microstructures being in any case obtained by employing a laser or electron surface beam withdrawal speed ranging from 0.5 mm/sec to up to 6 m/sec, in particular a withdrawal speed ranging from 1 cm up to 4 m/sec, depending on the alloy employed.

What is claimed is:

1. A magnesium-based alloy made by a chill-block casting technique, said magnesium-based alloy comprising a porosity-free microstructure and at least one alloying element or alloying addition in a solid solution and said chill-block casting technique being selected from the group consisting of continuous chill block casting, thin-strip casting, twin-roller quenching, thin-wall casting, pressure die casting to a wall thickness less than 20 mm, planar flow casting and melt spinning, wherein said porosity-free microstructure comprises a homogeneous distribution of at least one solute atom of the at least one alloying element or alloying addition and a maximum content of critical impurities by weight of 0.0005% Ni, 0.0013% Fe and 0.0005% Cu and no corrosion-rate controlling Fe inclusion, and wherein said porosity-free microstructure is in an as-solidified state or after an alloy conversion selected from the group consisting of one or more of the following:

a thermo-mechanical treatment or rolling or superplastic forming, a hot forming operation or hot pressing, a forging or an extrusion, a communition to flakes or powder and a forging or an extrusion, a cold pressing or a cold isostatic pressing, a solution or homogenisation heat treatment, a thermo-mechanical treatment or a hot forming operation at temperatures according to a solution heat treatment, a quenching of a resulting product form, and an annealing treatment.

2. The magnesium-based alloy according to claim 1, wherein said porosity-free microstructure comprises in said as-solidified state further one or more of the following:

A. a micrograined microstructure;

B. a micrograined microstructure comprising grains, cells or subcells, wherein the grains, cells or subcells have one or more dimensions <10 μm;

C. a micrograined microstructure comprising a columnar featureless or partition-less growth;

D. a planar or columnar featureless or partitionless growth without a segregation; or;

E. a micrograined microstructure comprising grains, cells or subcells, wherein the grains, cells or subcells have one or more dimensions <10 μm and a columnar featureless or partitionless growth.

3. The magnesium-based alloy according to claim 1, wherein said chill-block casting or quenching technique comprises one or more of the following:

A. employing a a Mg feedstock of purity grade 3N8 or greater which comprises a maximum content by weight of 0.0005% Ni, 0.0013% Fe, 0.0005% Cu and 0.005% Na;

B. casting under an inert atmosphere in order to protect a molten feedstock, a solidification operation or a resulting product or to maximize a heat extraction by a chill-block, wherein the inert atmosphere is selected from the group consisting of an inert-gas, a helium, an argon, a nitrogen, a mixture of helium with another inert gas, a hydrogen, a krypton, a neon, a xenon and a vacuum;

C. casting into using an inert crucible material, wherein the inert crucible material is selected from the group consisting of a refractory metal, a tantalum-based material, a tantalum-based alloy, a refractory alloy and a refractory intermetallic phase;

D. using an inert refractory metal, an inert refractory alloy, an inert intermetallic phase, a tantalum material or a tantalum-based alloy for contact with a condensed constituent of said magnesium alloy during a melting operation; or E. employing a highly conductive chill-block material.

4. The magnesium-based alloy according to claims 1 or 3, wherein said continuous chill-block casting or quenching, said thin strip casting, said twin roller quenching, said planar flow casting and said melt spinning comprises one or more of the following:

A. employing a constrained fluid flow of a magnesium alloy melt to a chill-block for limitation of an extension of a solidification structure or a resulting dimension, thickness or width of an as-solidified product;

B. employing a constrained melt puddle of a magnesium alloy melt to a chill-block for limitation or control of a resulting dimension, thickness or width of an as-solidified product;

C. using a controlled distance between a casting nozzle and a chill-block;

D. using a rectangular slot orifice as a casting nozzle in proximity to a chill-block;

E. using a scraper to reduce an inert gas film or to improve contact and heat transfer between a rotating chill-block and a resulting as-solidified product; or F. employing a controlled surface speed of a chill-block.

5. The magnesium-based alloy according to claim 3, wherein said highly conductive chill-block material includes Cu.

6. The magnesium-based alloy according to claim 1, wherein the magnesium-based alloy comprises further one or more of the following:

A. an as-solidified cross-section of a thickness in the range from 200 nm to 500 mm;

B. an as-solidified cross-section of a thickness in the range from 1 $\mu$m to 50 mm;

C. an as-cast wall thickness in the range from 0.2 to 20 mm; or

D. an as-cast wall thickness in the range from 0.5 to 10 mm.

7. A magnesium-based alloy made by a spray forming technique, said magnesium-based alloy comprising a porosity-free microstructure and at least one alloying element or alloying addition in a solid solution and said spray forming technique being selected from the group consisting of spray deposition and spray deposition using a linear atomizer concept, wherein said porosity-free microstructure comprises a homogeneous distribution of at least one solute atom of the at least one alloying element or alloying addition and a maximum content of critical impurities by weight of 0.0005% Ni, 0.0013% Fe and 0.0005% Cu and no corrosion-rate controlling Fe inclusion, and wherein said porosity-free microstructure after an alloy conversion selected from the group consisting of one or more of the following:

a thermo-mechanical treatment or rolling or superplastic forming, a hot forming operation or hot pressing or hot isostatic pressing, a forging or an extrusion, a communition to flakes or powder and a forging or an extrusion, a cold pressing or a cold isostatic pressing, a solution or homogenization heat treatment, a thermo-mechanical treatment or a hot forming operation at temperatures according to a solution heat treatment, a quenching of a resulting product form, and
an annealing treatment wherein said spray forming employs a Mg feedstock of purity grade 3N8 or greater which comprises a maximum content by weight of 0.0005% Ni, 0.0013% Fe, 0.0005% Cu and 0.005% Na and an inert atmosphere in order to protect a molten feedstock, a solidification operation or a resulting product, wherein the inert atmosphere is selected from the group consisting of an inert gas, helium, argon, nitrogen, a mixture of helium with another inert gas, hydrogen, krypton, neon, xenon and a vacuum.

8. The magnesium-based alloy according to claims 1 or 7, wherein said porosity-free microstructure comprises further one or more of the following:

A. no corrosion-rate controlling pore;
B. no pore having a pore size greater than a value in the range from 0.05 to 10 μm after a final forming operation;
C. a close-packed-hexagonal alloy matrix;
D. a grain size in the range from 0.5 to 8 μm;
E. a grain size in the range from 0.2 to 10 μm;
F. a grain having a high angle boundary and a size in the range from 0.5 to 8 μm;
G. a grain having a high angle boundary and a size in the range from 0.2 to 10;
H. a grain size in the range from 5 to 50 μm;
I. a grain size in the range from 3 to 250 μm;
J. a cell having a low angle boundary;
K. a microstructure without microalloyed constituents on grain boundaries;
L. a supersaturated microstructure;
M. a one-phase microstructure;
N. a supersaturated one-phase microstructure; or
O. a majority of atoms in contact with impurity atoms being magnesium.

9. The magnesium-based alloy according to claims 1 or 7, wherein said alloy conversion comprises one or more of the following:

A. said thermo-mechanical treatment or said hot forming operation at a temperature in vicinity of a eutectic or peritectic temperature;
B. said rolling at a rolling speed at roll surface ranging from 0.05 to 100 m/min;
C. said rolling at a rolling temperature of a rolling stock in a range from 100° to 500° C. or from 360° to 560° C. or from 390° to 480° C. or from 220° to 560° C. or from 200° to 560° C. or from 250° to 500° C.;
D. said superplastic forming at a strain rate in the range from $8\times10^{-1}$ to $10^{-5}$/sec or from $10^{-1}$ to $10^{-3}$/sec;
E. said hot pressing at a temperature in the range from 60° to 550° C. after a degassing treatment or comprising hot isostatic pressing for 1 to 6 hours at a temperature in the range from 100° to 450° C.;
F. said forging selected from a closed-die forging method and an open-die forging methods;
G. said forging at a forging temperature of a forging in a range from 50° to 520° C. or from 170° to 450° C. or from 360° to 560° C. or from 380° to 480° C. or from 200° to 560° C. or from 25° to 450° C.;
H. said cold pressing or said cold isostatic pressing comprising pressing at a pressure in the range from 50 to 1400 MPa;
I. said solution or homogenization heat treatment being employed before or after or before and after said rolling or said forging or between rolling passes;
J. said thermo-mechanical treatment or said hot forming operation at temperatures according to said solution heat treatment, wherein said solution heat treatment is for a period in the range from 0.25 to 1000 hours at a temperature in vicinity of a eutectic or peritectic temperature;
K. said quenching of said resulting product form comprising quenching said resulting product form in oil or water at a temperature in the range from 10° to 90° C.; or
L. said annealing treatment is for a period in the range from 0.1 to 10 hours at a temperature in the range from 60° to 120° C. or for a period in the range from 1 to 5 hours at a temperature in the range from 80° to 100° C.

10. The magnesium-based alloy according to claims 1 or 7, wherein the magnesium-based alloy comprises one or more of the following:

A. a concentration of the at least one alloying element or alloying addition within an equilibrium solid solubility range of close-packed-hexagonal magnesium;
B. a concentration of the at least one alloying element or alloying addition within the 1.5 fold amount of an equilibrium solid solubility range of close-packed-hexagonal magnesium;
C. a high purity commercial alloy concentration selected from the group consisting of AZ-magnesium alloy series, AM-magnesium alloy series and AS-magnesium alloy series; or
D. a high purity commercial alloy concentration selected from the group consisting of AZ9I, AZ61, AZ31, AM2O, AMSO, AM6O, AS41, AS42, ASH, AE42, WB43, WES4, ZE63, ZE41, EZ33 and EZ32.

11. The magnesium-based alloy according to claims 1 or 7, wherein the at least one alloying element or alloying addition for said continuous chill block casting, said twin-roller quenching, said rapid solidification, said planar flow casting and said melt spinning is selected from the group consisting of:

0.1 to 25% by weight of La,
0.1 to 25% by weight of Ce,
0.1 to 25% by weight of Pr,
0.1 to 28% by weight of Nd,
0.1 to 30% by weight of Sm,
0.2 to 14% by weight of Y,
0.2 to 14% by weight of Y and Eu,
0.2 to 30% by weight of a light rare earth misch-metal,
0.2 to 15% by weight of Al,
0.1 to 10% by weight of Mn, and
0.1 to 5% by weight of Zr.

12. The magnesium-based alloy according to claims 1 or 7, wherein the at least one alloying element or alloying addition for said thin-wall casting, said pressure die casting to a wall thickness <20 mm and said rapid solidification being selected from the group consisting of:

0.1 to 20% by weight of Sc,
0.1 to 7% by weight of Sm,
0.1 to 5% by weight of Gd,
0.1 to 7% by weight of Dy,
0.1 to 6% by weight of Ho,
0.1 to 7% by weight of Tm, 0.1 to 8% by weight of Er,
0.1 to 9% by weight of Lu,
0.1 to 6% by weight of Th,
0.1 to 2.5% by weight of Zr, and
0.1 to 3.0% by weight of Mn.

13. The magnesium-based alloy according to claims 1 or 7, wherein the magnesium-based alloy comprises one or more of the following ternary or higher order alloying elements:

A. 0.1 to 5 wt. % La;
B. 0.1 to 5 wt. % Ce;
C. 0.1 to 5 wt. % Pr;
D. 0.1 to 5 wt. % Nd;
E. 0.1 to 5 wt. % light rare earth misch-metal;
F. 0.1 to 8 wt. % Al;
G. 0.1 to S wt. % alkaline earth metal and 0.1 to 8 wt. % Al;
H. 0.1 to 5 wt. % alkaline earth metal and 0.1 to 8 wt. % Ga;
I. 0.1 to 5 wt. % calcium and 0.1 to 8 wt. % Al;
J. 0.1 to 5 wt. % strontium and 0.1 to 8 wt. % Al;
K. 0.1 to 5 wt. % barium and 0.1 to 8 wt. % Al;
L. 0.1 to 5 wt. % calcium and 0.1 to 8 wt. % Ga;
M. 0.1 to 5 wt. % strontium and 0.1 to 8 wt. % Ga;
N. 0.1 to 5 wt. % barium and 0.1 to 8 wt. % Ga;
O. 0.1 to S wt. % Zn for a Mg-"yttric"-containing alloy;
P. 0.1 to 5 wt. % M; or
Q. 0.1 to 2 wt. % Zr.

* * * * *